US012185625B2

(12) United States Patent
Hatakeyama et al.

(10) Patent No.: US 12,185,625 B2
(45) Date of Patent: Dec. 31, 2024

(54) ORGANIC ELECTROLUMINESCENCE ELEMENT, DISPLAY DEVICE, AND LIGHTING DEVICE

(71) Applicants: KWANSEI GAKUIN EDUCATIONAL FOUNDATION, Nishinomiya (JP); SK Materials JNC Co., Ltd., Hwaseong-si (KR)

(72) Inventors: Takuji Hatakeyama, Sanda (JP); Yasuhiro Kondo, Ichihara (JP); Ryosuke Kawasumi, Ichihara (JP)

(73) Assignees: KWANSEI GAKUIN EDUCATIONAL FOUNDATION, Nishinomiya (JP); SK MATERIALS JNC CO., LTD., Hwaseong-si (KR)

( * ) Notice: Subject to any disclaimer, the term of this patent is extended or adjusted under 35 U.S.C. 154(b) by 782 days.

(21) Appl. No.: 17/294,600

(22) PCT Filed: Nov. 14, 2019

(86) PCT No.: PCT/JP2019/044774
§ 371 (c)(1),
(2) Date: May 17, 2021

(87) PCT Pub. No.: WO2020/101001
PCT Pub. Date: May 22, 2020

(65) Prior Publication Data

US 2021/0351364 A1 Nov. 11, 2021

Related U.S. Application Data

(60) Provisional application No. 62/767,811, filed on Nov. 15, 2018.

(51) Int. Cl.
*H01L 51/50* (2006.01)
*H10K 85/00* (2023.01)
(Continued)

(52) U.S. Cl.
CPC ......... *H10K 85/6574* (2023.02); *H10K 85/00* (2023.02); *H10K 85/322* (2023.02);
(Continued)

(58) Field of Classification Search
None
See application file for complete search history.

(56) References Cited

U.S. PATENT DOCUMENTS

2015/0236274 A1 8/2015 Hatakeyama et al.
2016/0190478 A1 6/2016 Adachi et al.
(Continued)

FOREIGN PATENT DOCUMENTS

CN 105431439 A 3/2016
CN 106467553 A 3/2017
(Continued)

OTHER PUBLICATIONS

Uoyama et al., "Highly efficient organic light-emitting diodes from delayed fluorescence", Nature, 2012, 492, 234-238.
(Continued)

*Primary Examiner* — Gregory D Clark
(74) *Attorney, Agent, or Firm* — FISHERBROYLES, LLP; Roger L. Browdy; James E. Mrose

(57) ABSTRACT

An organic electroluminescent device having a light-emitting layer, wherein the light-emitting layer contains a host compound having a boron atom and an oxygen atom in the molecule as a first component, a thermally assisting delayed fluorescent material such that the energy difference ΔEST between the excited singlet energy level and the excited triplet energy level is 0.20 eV or less as a second component, and a fluorescent material as a third component, and has a high light emission efficiency.

13 Claims, 1 Drawing Sheet

(51) Int. Cl.

| | |
|---|---|
| ***H10K 85/30*** | (2023.01) |
| ***H10K 85/60*** | (2023.01) |
| *H10K 50/11* | (2023.01) |
| *H10K 101/10* | (2023.01) |

(52) U.S. Cl.

CPC ......... *H10K 85/6572* (2023.02); *H10K 50/11* (2023.02); *H10K 2101/10* (2023.02)

(56) References Cited

U.S. PATENT DOCUMENTS

| | | | | |
|---|---|---|---|---|
| 2019/0013478 | A1* | 1/2019 | Iijima | H10K 85/636 |
| 2019/0081249 | A1 | 3/2019 | Saito et al. | |

FOREIGN PATENT DOCUMENTS

| | | | |
|---|---|---|---|
| CN | 106966955 | A | 7/2017 |
| CN | 108701771 | A | 10/2018 |
| EP | 3109253 | A1 | 12/2016 |
| JP | 5669163 | B1 | 2/2015 |
| WO | 2015/102118 | A1 | 7/2015 |
| WO | 2016/143624 | A1 | 9/2016 |
| WO | 2017/018326 | A1 | 2/2017 |
| WO | 2017/092508 | A1 | 6/2017 |
| WO | 2017/146192 | A1 | 8/2017 |
| WO | 2018/095394 | A1 | 5/2018 |
| WO | 2018/181188 | A1 | 10/2018 |
| WO | 2019/151204 | A1 | 8/2019 |
| WO | 2019/198699 | A1 | 10/2019 |

OTHER PUBLICATIONS

International Search Report and Written Opinion for PCT/JP2019/044774 dated Dec. 17, 2019.

Japanese version of International Preliminary Report on Patentability of Chapter I for PCT/JP2019/044774 dated May 27, 2021, with English translation.

Hosokai et al., "Evidence and mechanism of efficient thermally activated delayed fluorescence promoted by delocalized excited states", Science Advances, 2017, vol. 3, e1603282.

Yoshida, et al., "Electron affinities of organic materials used for organic light emitting diodes: A low-energy inverse photoemission study", Organic Electronics, 2015, vol. 20, p. 24-30.

Hirai, et al., "One Step Borylation of 1,3-Diaryloxybenzenes Towards Efficient Materials for Organic Light-Emitting Diodes", Angewandte Chemie, International Edition, 2015, vol. 54, p. 13581-13585.

* cited by examiner

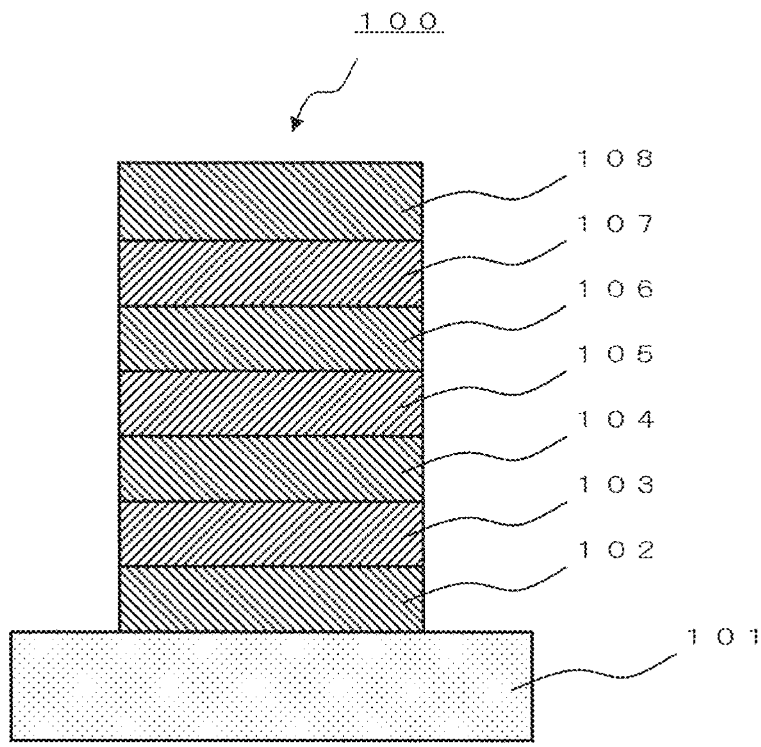
100
108
107
106
105
104
103
102
101

ORGANIC ELECTROLUMINESCENCE ELEMENT, DISPLAY DEVICE, AND LIGHTING DEVICE

TECHNICAL FIELD

The present invention relates to an organic electroluminescent device containing, in the light-emitting layer thereof, three components of a host compound, a thermal activation type delayed fluorescent material, and a fluorescent material, and to a display device and a lighting device equipped with the organic electroluminescent device.

BACKGROUND ART

Heretofore, a display device using an electroluminescent light-emitting device enables power-saving and thinning, and is variously studied, and further, an organic electroluminescent device (organic EL device) using an organic material can be readily lightened and large-sized and is therefore actively investigated. In particular, for development of an organic material having a light-emitting characteristic of emitting a blue color, one of light's three primary colors, as well as development of an organic material having a charge transport performance for holes and electrons, various studies have heretofore been actively made irrespective of high-molecular compounds and low-molecular compounds.

An organic EL device has a structure that contains a pair of electrodes of an anode and a cathode, and one or multiple layers containing an organic compound arranged between the pair of electrodes. The organic compound-containing layer includes a light-emitting layer, and a charge transport/injection layer that transport or inject charges such as holes or electrons, and various types of organic materials suitable for these layers have been developed.

The light-emitting mechanism of an organic EL device is principally grouped into two, fluorescence emission using light emission from an excited singlet state, and phosphorescence emission using light emission from an excited triplet state. A general fluorescent light-emitting material has a low exciton utilization efficiency, about 25%; and even though using triplet-triplet fusion (TTF) or triplet-triplet annihilation (TTA), the exciton utilization efficiency is only 62.5%. On the other hand, a phosphorescent material may have an exciton utilization efficiency that reaches 100% as the case may be, but can hardly realize deep blue light emission and, in addition, another problem thereof is that the color purity is low since the width of the light emission spectrum thereof is broad.

Given the situation, Chihaya Adachi, a professor of Kyushu University proposed a thermally assisting delayed fluorescence (TADF) mechanism (see NPL 1). A TADF compound is a compound that absorbs thermal energy to cause reverse intersystem crossing from an excited triplet state to an excited singlet state, and emits fluorescence (delayed fluorescence) via radiative deactivation from the excited singlet state. Utilizing the TADF compound of the type, energy of a triplet exciton can also be effectively utilized for fluorescence emission, and accordingly, the exciton utilization efficiency for light emission has reached 100%. A TADF compound gives a broad emission spectrum having a low color purity owing to the structure thereof, but the speed of reverse intersystem crossing thereof is extremely high.

Focusing on the advantages, an organic light-emitting device (TAF device: TADF Assisting Fluorescent Device) that utilizes a TADF compound as an assisting dopant (AD) has been proposed (see PTL 1). A TAF device uses three components of a host compound, a TADF compound (assisting dopant) and a fluorescent material, in which, via reverse intersystem crossing at the TADF compound, excited triplet energy is converted to excited singlet energy and transferred to the fluorescent material. Accordingly, as a result, the excited triplet energy is efficiently utilized for light emission from the fluorescent material to attain a high light emission efficiency and, in addition, the fluorescent material can realize light emission at a high color purity.

CITATION LIST

Patent Literature

PTL 1: JP 5669163

Non-Patent Literature

NPL 1: Highly efficient organic light-emitting diodes from delayed fluorescence, Nature 492, 234-238

SUMMARY OF INVENTION

Technical Problem

As described above, an organic light-emitting device (TAF device) using a TADF compound as an assisting dopant has been proposed. However, as a result that the present inventors investigated the performance of the three components used in the already-known TAF device and the light emission efficiency of the device, it has been revealed that the charge mobility in the light-emitting layer and the effect of triplet exciton confinement in the TADF compound molecule are insufficient and there is still room for further improvement in light emission efficiency.

Given the situation and for the purpose of solving the problems in the prior art, the present inventors have made further studies for providing an organic light-emitting device capable of attaining a higher light emission efficiency, utilizing such a TADF compound.

Solution to Problem

The present inventors have made assiduous studies for solving the above-mentioned problems, and as a result, have reached a finding that, using a compound having a boron atom and an oxygen atom in the molecule as a three-component host compound composed of a host compound, a thermally assisting delayed fluorescent material and a fluorescent material, a light emission efficiency can be remarkably improved as compared with a system using an already-known host compound such as mCBP (see Examples given hereinunder). The present invention has been proposed on the basis of the foregoing finding, and specifically has the following constitution.

[1] An organic electroluminescent device having a light-emitting layer, wherein the light-emitting layer contains a host compound having a boron atom and an oxygen atom in the molecule as a first component, a thermally assisting delayed fluorescent material such that the energy difference ΔEST between the excited singlet energy level and the excited triplet energy level is 0.20 eV or less as a second component, and a fluorescent material as a third component.

[2] The organic electroluminescent device according to [1], wherein the light-emitting layer contains, as the first component, at least one type of a compound represented by any of the following formulae (i), (ii) and (iii):

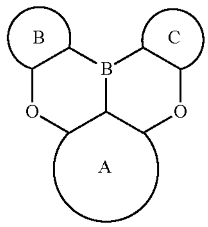

(i)

wherein:

the ring A, the ring B and the ring C each are independently an aryl ring or a heteroaryl ring, and at least one hydrogen in these rings may be substituted, and at least one hydrogen in the compound or the structure represented by the formula (i) may be substituted with a cyano, a halogen or a deuterium;

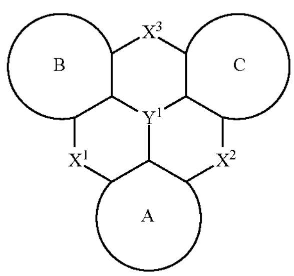

(ii)

wherein:

the ring A, the ring B and the ring C each are independently an aryl ring or a heteroaryl ring, and at least one hydrogen in these rings may be substituted, $Y^1$ is B, $X^1$, $X^2$ and $X^3$ each are independently >O, >N—R, >$CR_2$, or >S, at least two of $X^1$ to $X^3$ are >O, R in N—R and R in >$CR_2$ each are an optionally substituted aryl, an optionally substituted heteroaryl, or an alkyl, R in >N—R may bond to at least one of the ring A, the ring B and the ring C via a linking group or a single bond, and at least one hydrogen in the compound or the structure represented by the formula (ii) may be substituted with a cyano, a halogen or a deuterium;

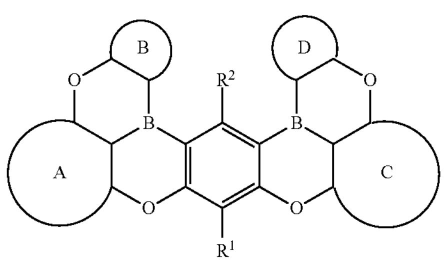

(iii)

wherein:

the ring A, the ring B, the ring C and the ring D each are independently an aryl ring or a heteroaryl ring, and at least one hydrogen in these rings may be substituted, $R_1$ and $R^2$ each are independently a hydrogen, an alkyl having a carbon number of 1 to 6, an aryl having a carbon number of 6 to 12, a heteroaryl having a carbon number of 2 to 15, a diarylamino (where the aryl has a carbon number of 6 to 12), a diheteroarylamino (where the heteroaryl has a carbon number of 2 to 15), or an arylheteroarylamino (where the aryl has a carbon number of 6 to 12, and the heteroaryl has a carbon number of 2 to 15), and at least one hydrogen in the compound represented by the formula (iii) may be substituted with a cyano, a halogen or a deuterium.

[3] The organic electroluminescent device according to any one of [1] and [2], wherein the light-emitting layer contains, as the first component, at least one compound represented by any of the following formulae (1), (2) and (3):

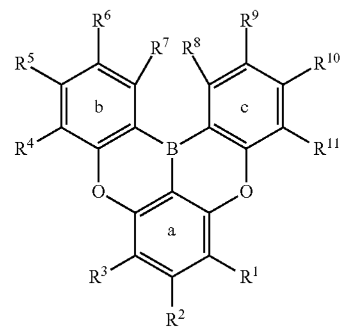

(1)

wherein:

$R^1$, $R^2$, $R^3$, $R^4$, $R^5$, $R^6$, $R^7$, $R^8$, $R^9$, $R^{10}$ and $R^{11}$ each are independently a hydrogen, an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl, and at least one hydrogen in the compound and the structure represented by the formula (1) may be substituted with a cyano, a halogen or a deuterium;

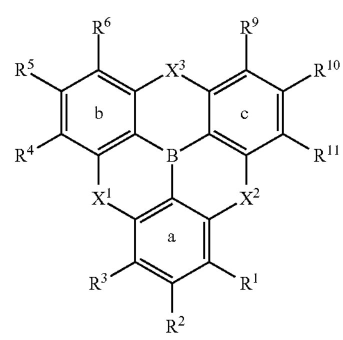

(2)

wherein:

$R^1$, $R^2$, $R^3$, $R^4$, $R^5$, $R^6$, $R^9$, $R^{10}$ and $R^{11}$ each are independently a hydrogen, an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl, $X^1$, $X^2$ and $X^3$ each are independently >O, >N—R, >S, or >$CR_2$, at least two of $X^1$, $X^2$ and $X^3$ are >O, R in N—R and R in >$CR_2$ each are an aryl, a heteroaryl, or an alkyl, and these may be further substituted with at least one selected from an aryl, a heteroaryl and an alkyl, provided that $X^1$, $X^2$ and $X^3$ are not >$CR_2$ at the same time, and at least one hydrogen in the compound and the structure represented by the formula (2) may be substituted with a cyano, a halogen or a deuterium;

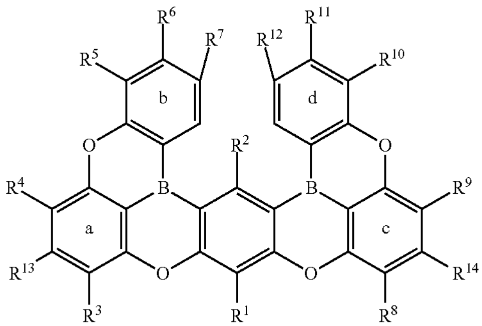
(3)

wherein:

$R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ each are independently a hydrogen, an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl, and at least one hydrogen in these may be substituted with an aryl, a heteroaryl or an alkyl, among $R^5$ to $R^7$ and $R^{10}$ to $R^{12}$, neighboring groups may bond to each other to form an aryl ring or a heteroaryl ring along with the ring b or the ring d, at least one hydrogen in the formed ring may be substituted with an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl, at least one hydrogen in these may be substituted with an aryl, a heteroaryl or an alkyl, and at least one hydrogen in the compound represented by the formula (3) may be substituted with a cyano, a halogen or a deuterium.

[4] The organic electroluminescent device according to any one of [1] to [3], wherein the host compound as the first component is a compound containing a structure represented by the following formula (1-1), (2-1), (2-2) or (3-1):

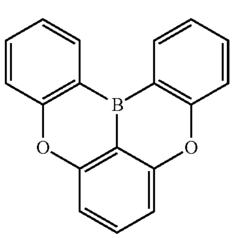
(1-1)

-continued

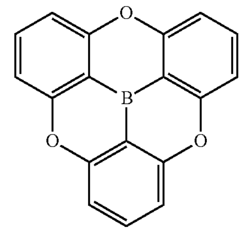
(2-1)

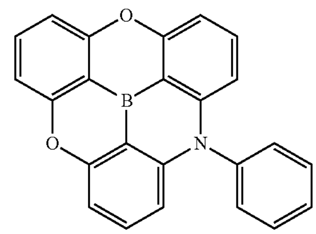
(2-2)

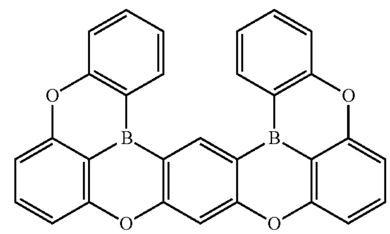
(3-1)

wherein:

the hydrogen each independently may be substituted with an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl.

[5] The organic electroluminescent device according to [3] or [4], wherein the compound represented by any of the formulae (1) to (3) contains at least one structure selected from the following partial structure group A:

Partial Structure Group A:

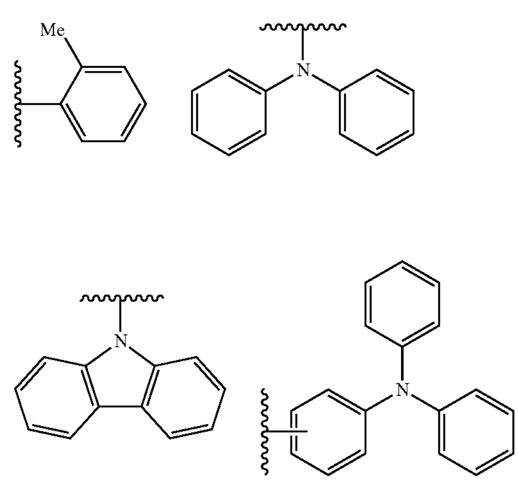

-continued

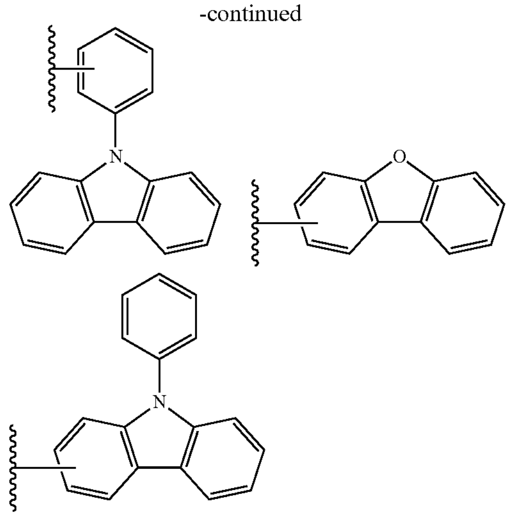

wherein:

Me represents a methyl, the wavy line represents a bonding position, provided that the hydrogen in the above partial structures each independently may be substituted with an aryl, a heteroaryl, a diarylamino, a diheteroarylamino, an arylheteroarylamino, an alkyl, an alkoxy or an aryloxy, the hydrogen in the aryl may be further substituted with an aryl, a heteroaryl or an alkyl, the hydrogen in the heteroaryl may be further substituted with an aryl, a heteroaryl or an alkyl, the hydrogen in the diarylamino may be further substituted with an aryl, a heteroaryl or an alkyl, the hydrogen in the diheteroarylamino may be further substituted with an aryl, a heteroaryl or an alkyl, and the hydrogen in the arylheteroarylamino may be further substituted with an aryl, a heteroaryl or an alkyl.

[6] The organic electroluminescent device according to any one of [1] to [5], wherein the first component, the second component and the third component satisfy at least any of the following formulae (a) to (c):

$$|Ip(1)| \geq |Ip(2)| \quad \text{Formula (a)}$$

wherein Ip(1) represents an ionization potential of the first component, and Ip(2) represents an ionization potential of the second component;

$$|Eg(2)| \geq |Eg(3)| \quad \text{Formula (b)}$$

wherein Eg(2) represents an energy difference between the ionization potential and the electron affinity of the second component, and Eg(3) represents an energy difference between the ionization potential and the electron affinity of the third component;

$$\Delta EST(1) \geq \Delta EST(2) \quad \text{Formula (c)}$$

wherein ΔEST(1) represents an energy difference between the excited singlet energy level and the excited triplet energy level of the first component, and ΔEST(2) represents an energy difference between the excited singlet energy level and the excited triplet energy level of the second component.

[7] The organic electroluminescent device according to any one of [1] to [6], wherein the full width at half maximum FWHM of the fluorescence peak of the third component is 35 nm or less.

[8] The organic electroluminescent device according to any one of [1] to [7], wherein the third component is a compound containing a structure represented by the following formula (ED11), (ED12), (ED13), (ED14), (ED15), (ED16), (ED17), (ED18), (ED19), (ED21), (ED22), (ED23), (ED24), (ED25), (ED26), (ED27), (ED211), (ED212), (ED221), (ED222), (ED223), (ED231), (ED241), (ED242), (ED261) or (ED271):

(ED11)

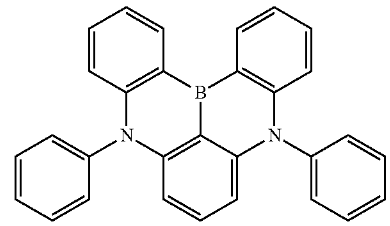

(ED12)

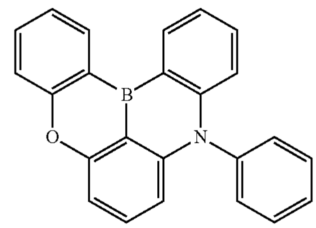

(ED13)

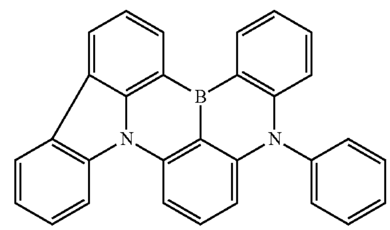

(ED14)

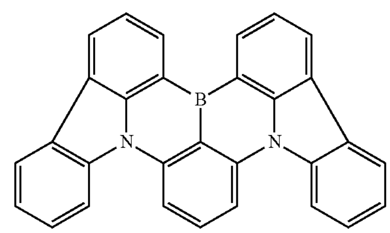

(ED15)

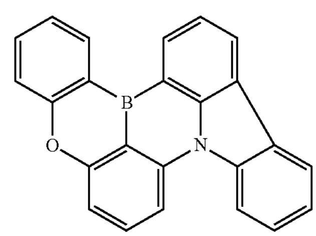

(ED16)

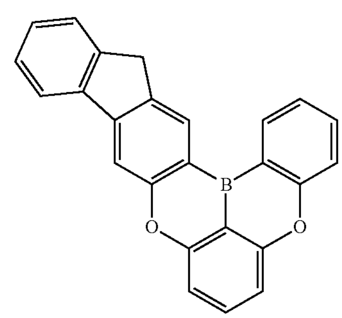

-continued
(ED17)
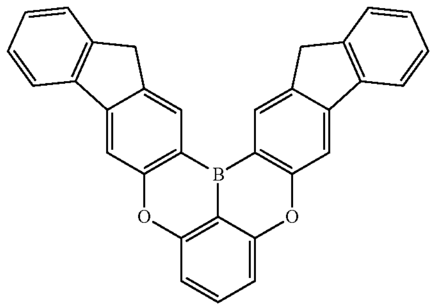
(ED18)
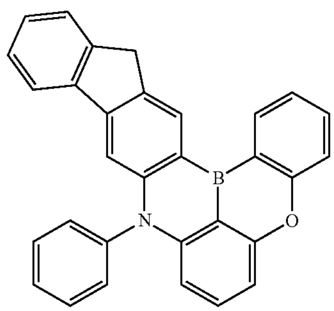
(ED19)
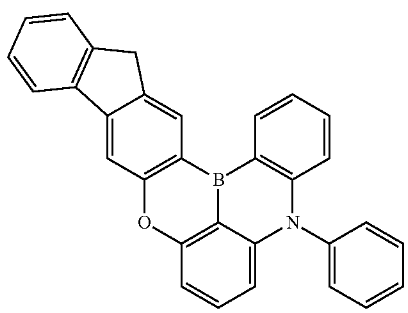
(ED21)
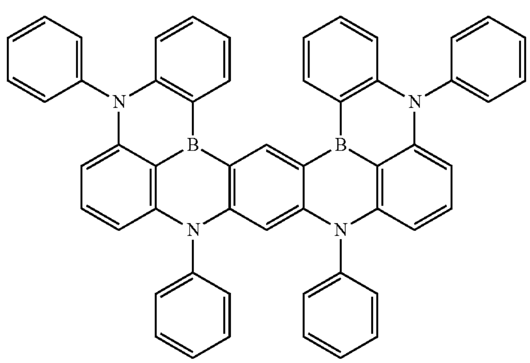
-continued
(ED22)
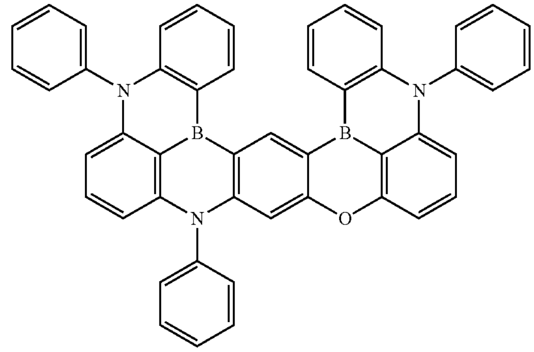
(ED23)
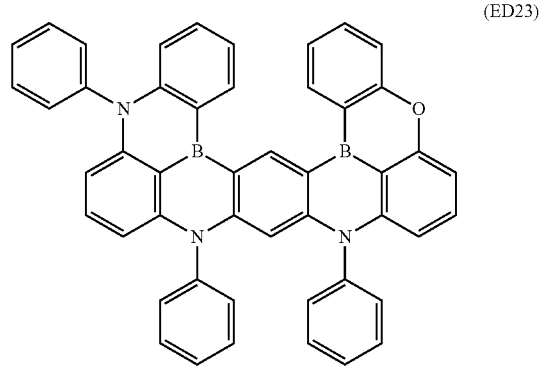
(ED24)
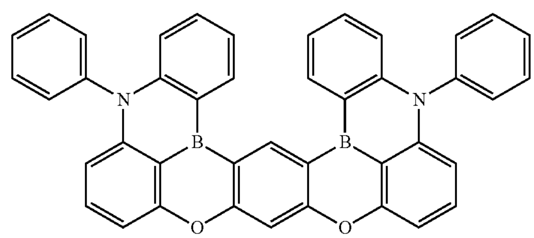
(ED25)
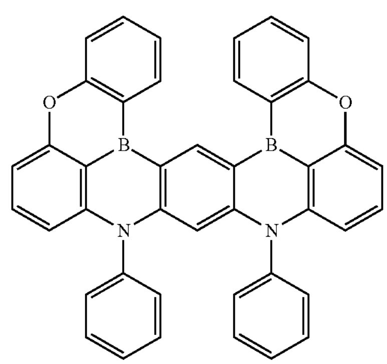

-continued
(ED26)
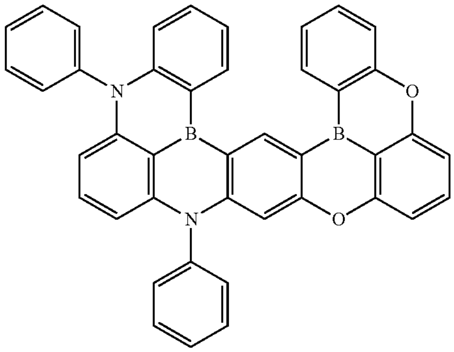
(ED27)
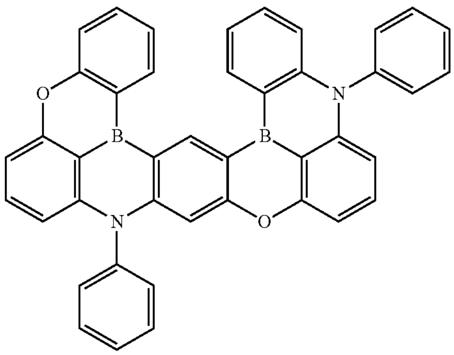
(ED211)
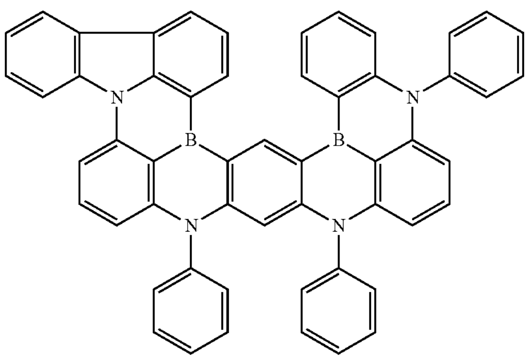
(ED212)
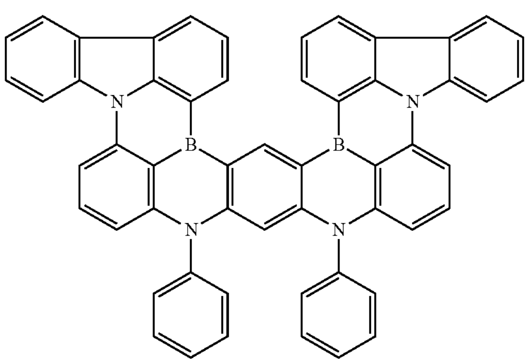
-continued
(ED221)
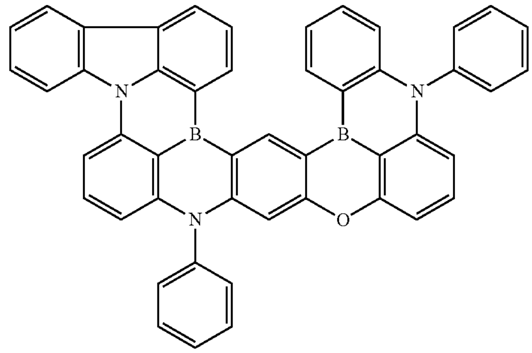
(ED222)
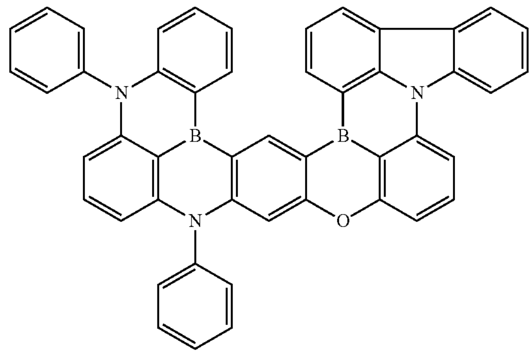
(ED223)
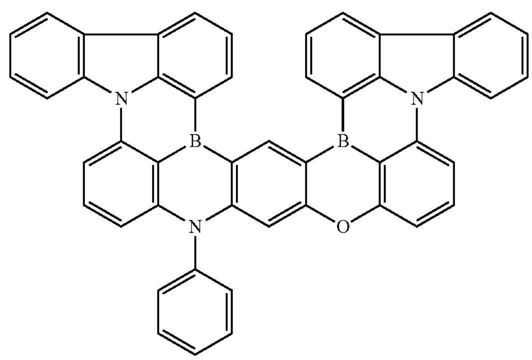
(ED231
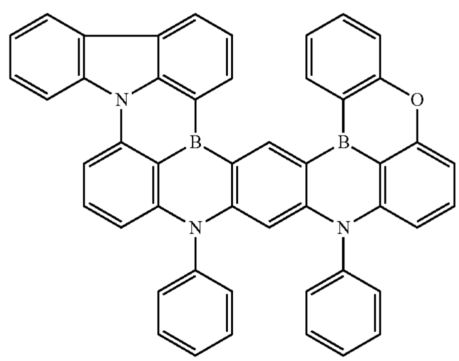

-continued (ED241)

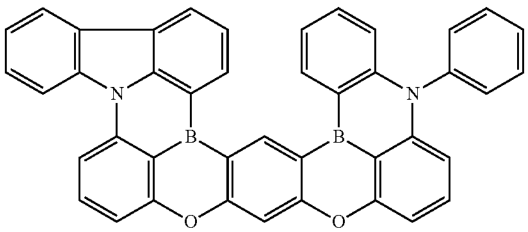

(ED242)

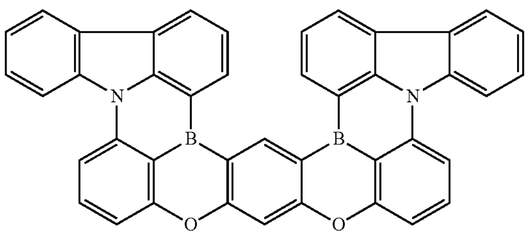

(ED261)

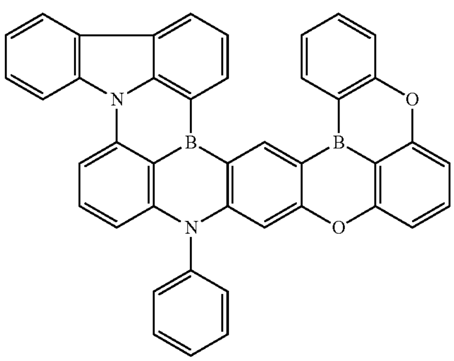

(ED271)

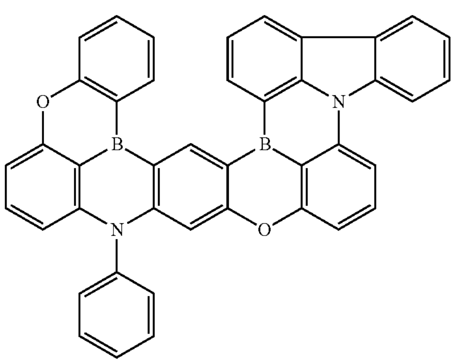

wherein:

the hydrogen each may be independently substituted with at least one selected from an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl.

[9] The organic electroluminescent device according to any one of [1] to [8], wherein the second component is a compound containing a structure represented by the following formula (AD11), (AD12), (AD13), (AD21) or (AD22):

(AD11)

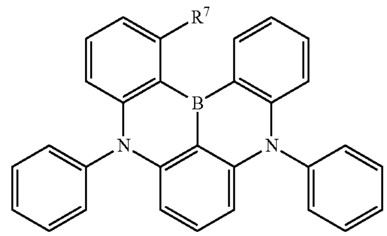

(AD12)

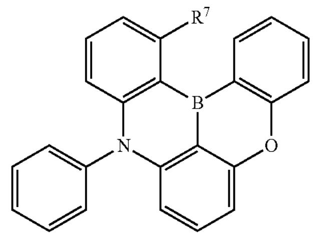

(AD13)

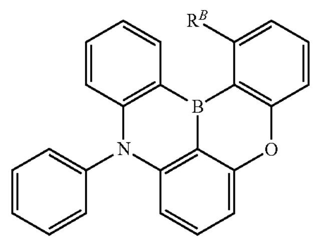

(AD21)

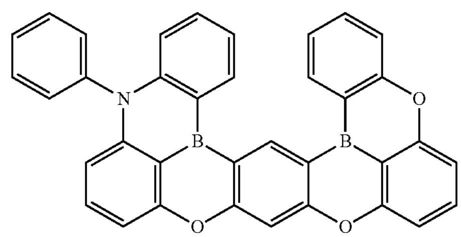

(AD22)

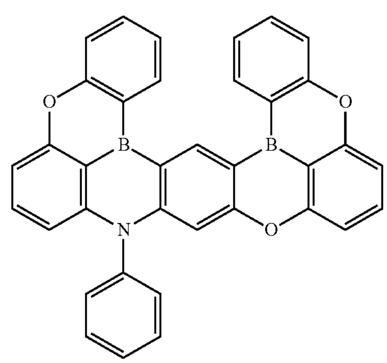

wherein:

$R^7$ or $R^8$ is an alkyl having a carbon number of 1 to 6, the hydrogen each may be independently substituted with an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl.

[10] The organic electroluminescent device according to any one of [1] to [9], wherein the second component contains, as the thermally assisting delayed fluorescent material, at least one compound represented by the following formula (AD31):

(AD31)

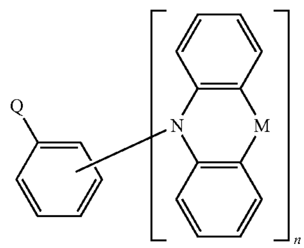

wherein:

M each is independently at least one of a single bond, —O—, >N—Ar and >$CAr_2$, Ar in >N—Ar and >$CAr_2$ is an aryl, Q is a group represented by any of the following partial structural formulae (Q1) to (Q26), n is an integer of 1 to 5, the hydrogen in the above formula each may be independently substituted with an aryl having a carbon number of 6 to 18, a heteroaryl having a carbon number of 6 to 18, an alkyl having a carbon number of 1 to 6 and a cycloalkyl having a carbon number of 3 to 12, and at least one hydrogen atom in the compound represented by the above formula may be substituted with a halogen or a deuterium:

(Q1)

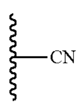

(Q2)

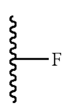

(Q3)

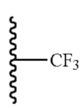

(Q4)

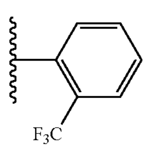

(Q5)

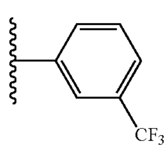

(Q6)

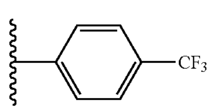

(Q7)

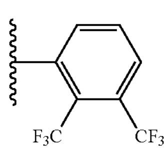

-continued (Q8)

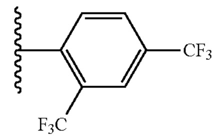

(Q9)

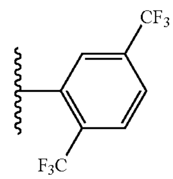

(Q10)

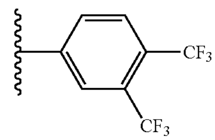

(Q11)

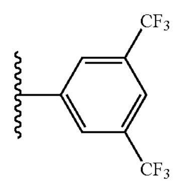

(Q12)

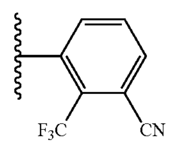

(Q13)

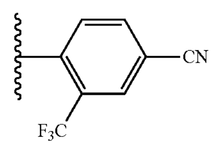

(Q14)

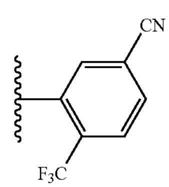

(Q15)

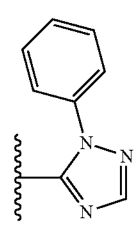

(Q16)

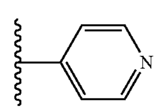

(Q17)

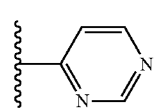

-continued
(Q18)
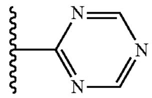
(Q19)
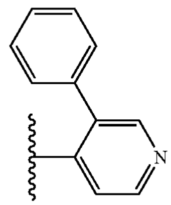
(Q20)
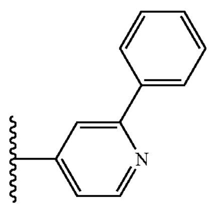
(Q21)
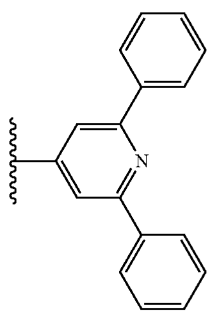
(Q22)
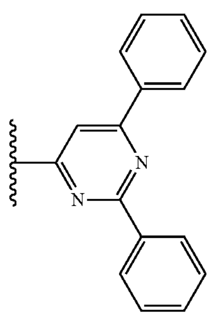
(Q23)
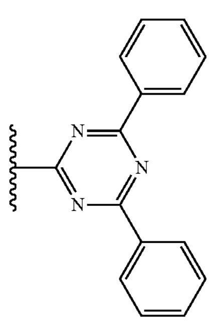
-continued
(Q24)
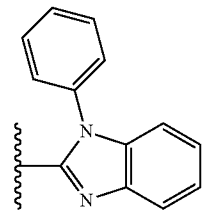
(Q25)
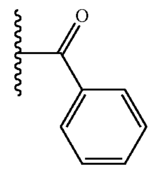
(Q26)
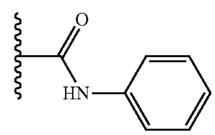
[11] The organic electroluminescent device according to any one of [1] to [10], wherein the second component contains, as the thermally assisting delayed fluorescent material, at least one compound having a structure represented by any of the following formulae (AD3101) to (AD3118):
(AD3101)
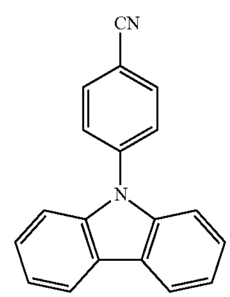
(AD3102)
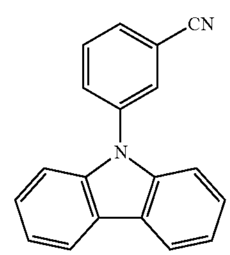
(AD3103)
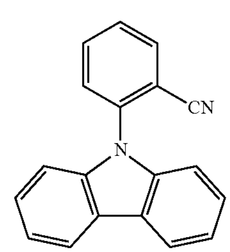

-continued
(AD3104)
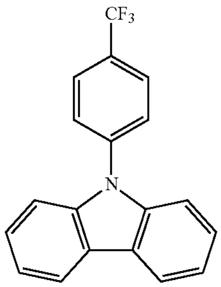
(AD3105)
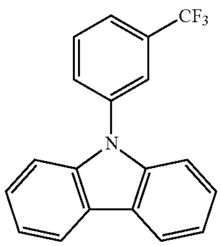
(AD3106)
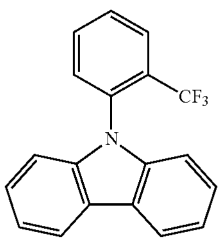
(AD3107)
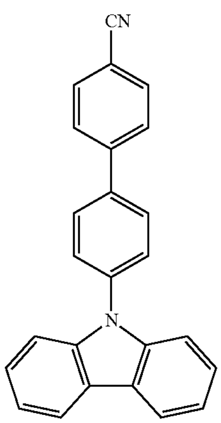
(AD3108)
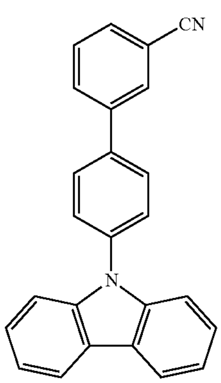
-continued
(AD3109)
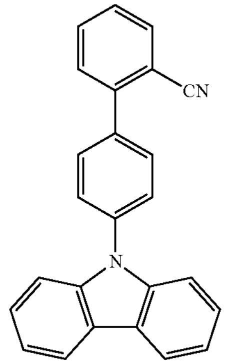
(AD3110)
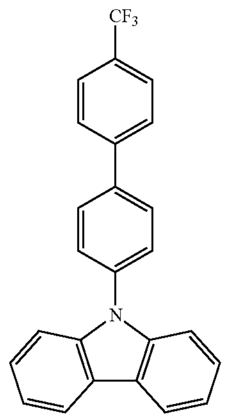
(AD3111)
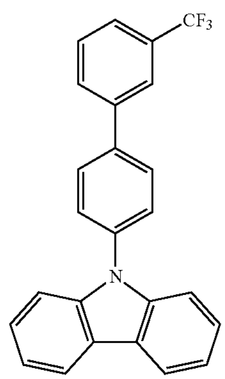
(AD3112)
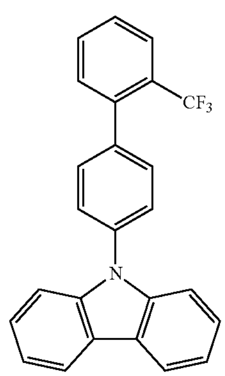

-continued
(AD3113)
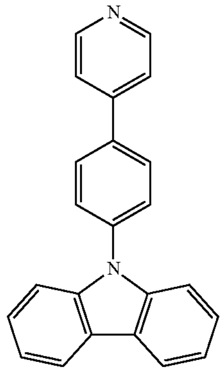
(AD3114)
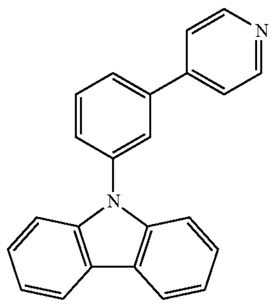
(AD3115)
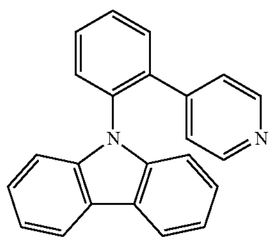
(AD3116)
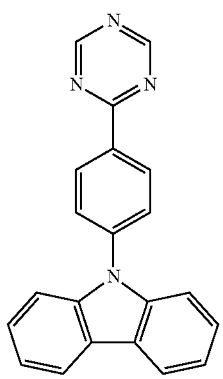
(AD3117)
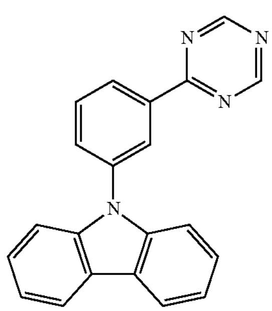
-continued
(AD3118)
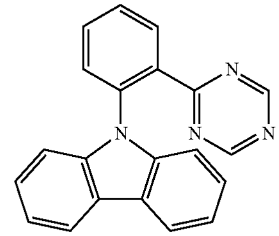
[12] The organic electroluminescent device according to any one of [1] to [11], wherein the third component contains, as the fluorescent material, a compound having at least one structure selected from the following partial structure group B:
Partial Structure Group B:
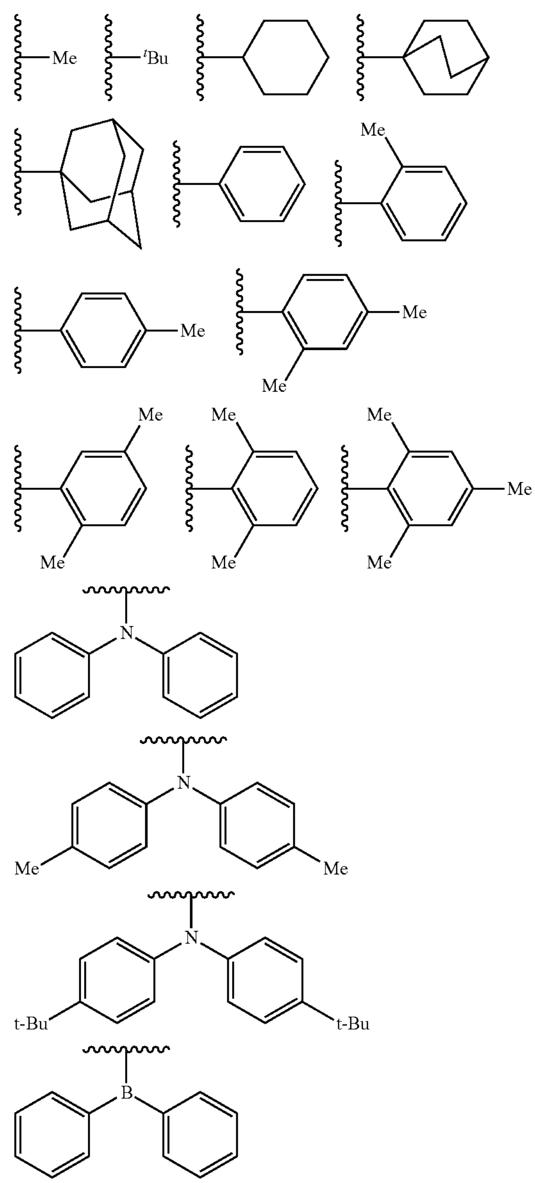

-continued

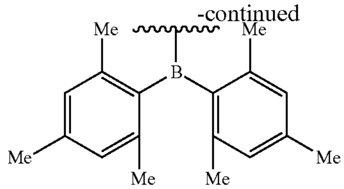

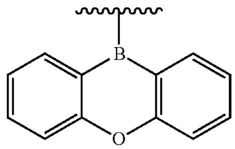

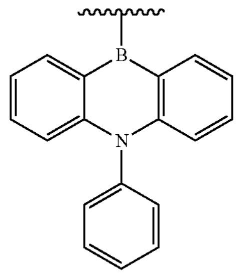

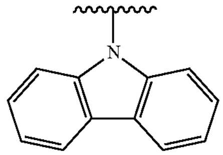

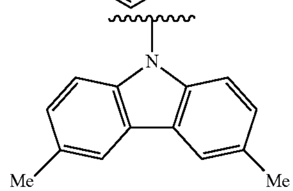

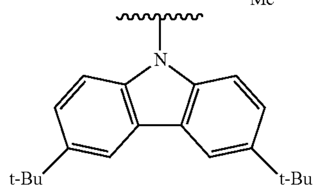

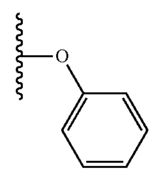

wherein:

Me represents a methyl, $^{t}$Bu and t-Bu each represent a t-butyl, and the wavy line represents a bonding position;

provided that the hydrogen in the above partial structures each may be independently substituted with an aryl, a heteroaryl, a diarylamino, a diheteroarylamino, an arylheteroarylamino, an alkyl, an alkoxy or an aryloxy, the hydrogen in the aryl may be further substituted with an aryl, a heteroaryl or an alkyl, the hydrogen in the heteroaryl may be further substituted with an aryl, a heteroaryl or an alkyl, the hydrogen in the diarylamino may be further substituted with an aryl, a heteroaryl or an alkyl, the hydrogen in the diheteroarylamino may be further substituted with an aryl, a heteroaryl or an alkyl, and the hydrogen in the arylheteroarylamino may be further substituted with an aryl, a heteroaryl or an alkyl.

[13] A display device equipped with the organic electroluminescent device of any one of [1] to [12].

[14] A lighting device equipped with the organic electroluminescent device of any one of [1] to [12].

Advantageous Effects of Invention

The organic electroluminescent device of the present invention contains three components of a host compound, a thermally assisting delayed fluorescent material and a fluorescent material in the light-emitting layer thereof, in which the host compound is a compound containing a boron atom and an oxygen atom in the molecule, and which therefore realizes a high light emission efficiency.

BRIEF DESCRIPTION OF DRAWING

FIG. 1 This is a schematic cross-sectional view showing an organic EL device of the present embodiment.

DESCRIPTION OF EMBODIMENTS

The present invention will be described in detail below. The constitutional elements may be described below with reference to representative embodiments and specific examples of the invention, but the invention is not limited to such embodiments. In the description herein, a numerical range expressed as "to" means a range that includes the numerical values described before and after "to" as the upper limit and the lower limit.

(Organic Electroluminescent Device)

The organic electroluminescent device of the present invention is an organic electroluminescent device in which the light-emitting layer contains a first component to a third component, and in which a host compound containing a boron atom and an oxygen atom in the molecule is used as the first component, a thermally assisting delayed fluorescent material such that the energy difference ΔEST(2) between the lowest excited singlet level and the lowest excited triplet level is 0.20 eV or less is used as a second component, and a fluorescent material is used as the third component. Here, the excited triplet energy level and the excited singlet energy level for ΔEST(2) is the excited triplet energy level and the excited singlet energy level before and after reverse intersystem crossing. For example, these may be a lowest excited triplet energy level and a lowest excited singlet energy level, or may be a higher excited triplet energy level and a lowest excited singlet energy level, or may be a higher excited triplet energy level and a higher excited singlet energy level. Here, the higher excited triplet energy level and the higher excited singlet energy level each mean an excited triplet energy level and an excited singlet energy level, respectively, having a higher energy than the lowest excited triplet energy level and the lowest excited singlet energy level, respectively. The lowest excited singlet energy level and the lowest excited triplet energy level can be derived from the peak top on the short wavelength side of a fluorescence spectrum and a phosphorescence spectrum, as described below. The higher excited triplet energy level and the higher excited singlet energy level can be estimated, using a partial structure according to the method described by Noda, Nakanoya, Adachi, et al of Kyushu University (Nature Materials, 18, 2019, 1084-1090). Alternatively, these can be calculated according to Sato, et al of Kyoto University (Scientific Reports, 7: 4820, DOI:10.1038/s41598-017-05007-7).

"Host compound" in the present invention means a compound such that the excited singlet energy level thereof derived from the shoulder of a peak on the short wavelength side of a fluorescence spectrum is higher than that of the thermally assisting delayed fluorescent material as the second component and that of the fluorescent material as the third component.

"Thermally assisting delayed fluorescent material" means a compound that absorbs heat energy to cause reverse intersystem crossing from an excited triplet state to an excited singlet state, and emits delayed fluorescence through radiative deactivation from the excited singlet state. Here, "thermally assisting delayed fluorescent material" includes those that may take a higher triplet in an excitation process from an excited triplet state to an excited singlet state. The light emission mechanism to emit fluorescence via a higher triplet is referred to as FvHT (fluorescence via higher triplet) mechanism, and this is described, for example, by Monkamn, et al of Durham University (NATURE COMMUNICATIONS, 7:13680, DOI: 10.1038/ncomms 13680), by Hosogai, et al of the National Institute of Advanced Industrial Science and Technology, Japan, by Sato, et al of Kyoto University (Scientific Reports, 7: 4820, DOI:10.1038/s41598-017-05007-7), and by Sato, et al of Kyoto University in a conference presentation (98th Spring Annual Meeting, Announcement No. 2I4-15, Mechanism of High-Efficiency Light Emission in Organic EL using DABNA as light-emitting molecule, by the Graduate School of Engineering of Kyoto University). In the present invention, a sample containing a target compound is analyzed to measure the fluorescence lifetime at 300K, and when the sample gives a delayed fluorescence component, the target compound therein is judged to be a "thermally assisting delayed fluorescent material". Here, "delayed fluorescence component" means one having a fluorescence lifetime of 0.1 μseconds or more. As opposed to this, fluorescence to be emitted from the excited singlet state having occurred through direct transition from a ground singlet state generally has a fluorescence lifetime of 0.1 nanoseconds or less. In the following description, fluorescence having a lifetime of 0.1 nsec or less is referred to as "fast fluorescence component". The fluorescence to be emitted by the "thermally assisting delayed fluorescent material" for use in the present invention may include a fast fluorescence component along with a delayed fluorescence component.

For measurement of fluorescence lifetime, for example, a fluorescence lifetime measuring device (by Hamamatsu Photonics, C11367-01) can be used.

ΔEST(2) of the second component means an energy difference calculated by subtracting the excited triplet energy level E (2, T, PT) derived from the peak top on the short wavelength side of the phosphorescence spectrum thereof, from the excited singlet energy level E (2, S, PT) derived from the peak top on the short wavelength side of the phosphorescence spectrum thereof, that is, a value calculated by E (2, S, PT)−E (2, T, PT). ΔEST(2) is 0.20 eV or less, preferably 0.15 eV or less, more preferably 0.10 eV or less.

"Fluorescent material" means a compound capable of emitting fluorescence through radiative deactivation from an excited singlet state. The fluorescent material may be an ordinary fluorescent material, which, when the fluorescence lifetime thereof is measured at 300 K, provides a fast fluorescent component, or may also be a delayed fluorescent material which provides both a fast fluorescent component and a delayed fluorescent component. The fluorescent material is preferably such that the excited singlet energy level thereof derived from the shoulder of the peak on the short wavelength side of the fluorescence spectrum is lower than that of the host compound of the first component and the thermally assisting delayed fluorescent material of the second component.

In the present invention, the "fluorescent material" can be made to function as an emitting dopant, and the "thermally assisting delayed fluorescent material" can be made to function as an assisting dopant that assists emission of the fluorescent material. In the following description, the organic electroluminescent device that uses the thermally assisting delayed fluorescent material as an assisting dopant may be referred to as a "TAF device" (TADF assisting fluorescent device). In the TAF device, excited triplet energy is converted into excited singlet energy through reverse intersystem crossing to occur in the thermally assisting delayed fluorescent material, and therefore the excited singlet energy can be efficiently supplied to the fluorescent material to assist light emission from the device. With that, the device of the type realizes a high light emission efficiency.

In addition, especially in the present invention, the light-emitting layer contains a host compound having a boron atom and an oxygen atom in the molecule, and therefore, as compared with a three-component system using a conventional host compound, the device of the present invention can attain a remarkably higher light emission efficiency. This is considered to be because of the following reasons.

Specifically, a host compound (first component) such as mCBP used in an ordinary TAF device has a higher hole transport ability than an electron transport ability. Consequently, in a conventional TAF device, a large amount of an assisting dopant (second component) that is a thermally assisting delayed fluorescent material is added to the light-emitting layer to compensate for the electron transport ability. As opposed to this, the host compound having a boron atom and an oxygen atom in the molecule that is used in the present invention is characterized in that the electron transport ability thereof is high since the boron atom therein is rich in electron acceptability and since the oxygen atom therein has high electric negativity. Consequently, it is presumed that, using the host compound having a boron atom and an oxygen atom, the load of electron transportation to be given to the assisting dopant can be reduced and in addition, the emission site can be controlled so that the light emission efficiency and the device lifetime can be thereby improved.

Preferably, the energy level of the first component, the second component and the third component for use in the present invention can satisfy at least any of the following formulae (a) to (c), more preferably satisfy all the requirements.

$$|Ip(1)| \geq |Ip(2)| \qquad \text{Formula (a)}$$

In the formula (a), Ip(1) represents an ionization potential of the host compound of the first component, and Ip(2) represents an ionization potential of the thermally assisting delayed fluorescent material of the second component.

$$|Eg(2)| \geq |Eg(3)| \qquad \text{Formula (b)}$$

In the formula (b), Eg(2) represents an energy difference between the ionization potential and the electron affinity of the thermally assisting delayed fluorescent material of the second component, and Eg(3) represents an energy difference between the ionization potential and the electron affinity of the fluorescent material of the third component.

$$\Delta EST(1) \geq \Delta EST(2) \qquad \text{Formula (c)}$$

In the formula (c), ΔEST(1) represents an energy difference between the excited singlet energy level and the excited triplet energy level of the host compound of the first component, and ΔEST(2) represents an energy difference between the excited singlet energy level and the excited triplet energy level of the thermally assisting delayed fluorescent material of the second component. Here, the excited singlet energy level is the excited singlet energy level E (1, S, PT) or E (2, S, PT) derived from the peak top on the short wavelength side of the fluorescence spectrum of the compound, and the excited triplet energy level is the excited singlet energy level E (1, T, PT) or E (2, T, PT) derived from the peak top on the short wavelength side of the phosphorescence spectrum thereof. These meanings will be described below.

When the first component and the second component satisfy the formula (a), the holes that the first component transports can be efficiently transferred to the second component. When the second component and the third component satisfy the formula (b), large excitation energy is generated in carrier recombination in the second component, and the resultant excited singlet energy, and also the excited singlet energy generated through reverse intersystem crossing from the excited triplet state to the excited singlet state can be efficiently supplied to the third component. Further, when the first component and the second component satisfy the formula (c), reverse intersystem crossing occurs in the second component and the excited triplet energy is converted to an excited singlet energy, and the resultant excited singlet energy is supplied to the fluorescent material. From the above, when the first component, the second component and the third component satisfy the formulae (a) to (c), excited singlet energy can be efficiently supplied to the fluorescent material and a higher light emission efficiency can be thereby attained.

Further, when the excited triplet energy level E (1, T, PT) derived from the peak top on the short wavelength side of the phosphorescence spectrum of the first component is higher than the excited triplet energy level E (2, T, PT) derived from the peak top on the short wavelength side of the phosphorescence spectrum of the second component, the excited triplet energy generated in the first component can be readily transferred to the second component and in addition, the excited triplet energy is confined in the molecule of the second component to promote the reverse intersystem crossing in the second component. As a result, excited singlet energy can be supplied more efficiently to the third component to realize a higher light emission efficiency. Specifically, E (1, T, PT) is preferably higher by 0.01 eV or more than E (2, T, PT), more preferably by 0.03 eV or more, even more preferably by 0.1 eV or more.

On the other hand, the fluorescent material of the third component preferably has an emission peak, of which the full width half maximum FWHM is 35 nm or less, in a range of 440 to 590 nm of the fluorescence spectrum thereof. For use for a blue light emitting device, more preferably, the peak falls within a range of 450 to 475 nm, even more preferably 455 to 465 nm. For use for a green light emitting device, more preferably, the peak falls within a range of 490 to 590 nm, even more preferably 510 to 555 nm. The emission peak of which the full width half maximum FWHM is 35 nm or less means that the color purity in light emission is high. Accordingly, using the fluorescent material of the type, an organic light-emitting device capable of emitting a good color tone can be realized.

In this description, the ionization potential (Ip) means an ionization potential (Ip) in photoelectron yield spectroscopy, the energy gap (Eg) means an optical band gap derived from the intersection of the tangent line to the absorption peak on the most long wavelength side of the spectrum in UV-visible light spectroscopy and the base line, and the electron affinity (Ea) means an electron affinity calculated by subtracting Eg from IP.

In this description, for the host compound of the first component, the excited singlet energy level derived from the shoulder of the peak on the short wavelength side of the fluorescence spectrum thereof is expressed as E (1, S, Sh), the excited singlet energy level derived from the peak top on the short wavelength side of the fluorescence spectrum is expressed as E (1, S, PT), the excited singlet energy level derived from the shoulder of the peak on the short wavelength side of the phosphorescence spectrum is expressed as E (1, T, Sh), and the excited triplet energy level derived from the peak top on the short wavelength side of the phosphorescence spectrum is expressed as E (1, T, PT). The energy difference calculated by E (1, S, PT)−E (1, T, PT) is expressed as ΔEST(1). For the second component and the third component, the energy level and the energy difference thereof are expressed by changing the code "1" for the first component to "2" for the second and to "3" for the third component. These E (1, S, Sh), E (2, S, Sh) and E (3, S, Sh) will be collectively called E (S, Sh); E (1, S, PT), E (2, S, PT) and E (3, S, PT) will be collectively E (S, PT); E (1, T, Sh), E (2, T, Sh) and E (3, T, Sh) will be collectively E (T, Sh); E (1, T, PT), E (2, T, PT) and E (3, T, PT) will be collectively as E (T, PT); and ΔEST(1), ΔEST(2) and ΔEST(3) will be collectively ΔEST.

In the present invention, the excited singlet energy level E (S, Sh) derived from the shoulder of the peak on the short wavelength side of the fluorescence spectrum, the excited singlet energy level E (S, PT) derived from the peak top on the short wavelength side of the fluorescence spectrum, the excited triplet energy level E (T, Sh) derived from the shoulder of the peak on the short wavelength side of the phosphorescence spectrum, the excited triplet energy level E (T, PT) derived from the peak top on the short wavelength side of the phosphorescence spectrum, the reverse intersystem crossing speed and the light emission speed are calculated as follows.

Here, "the shoulder of the peak on the short wavelength side" means an inflection point on the short wavelength side of the emission peak; and "the peak top on the short wavelength side" means a position on the peak corresponding to the emission maximum value on the most short wavelength side among the emission maximum values of the emission peaks.

Regarding the test samples for measurement of each energy level, in the case where the target compound is a host compound or an assisting dopant, a neat film of the target compound formed on a glass substrate (neat film, thickness: 50 nm) is used; and in the case where the target compound is an emitting dopant, a polymethyl methacrylate film in which the target compound is dispersed on a glass substrate (thickness: 10 μm, concentration of the target compound: 1% by weight) is used. The thickness of the polymethyl methacrylate film in which the target compound is dispersed may be a thickness that secures a strength enough to measure absorption spectrum, the fluorescence spectrum and the phosphorescence spectrum. When the strength is not enough, the thickness may be increased, but when the strength is too high, the thickness may be decreased. The excitation light to be used may have a wavelength of the absorption peak appearing in the absorption spectrum. Among the emission peaks appearing in the fluorescence spectrum or the phosphorescence spectrum, the data derived from the emission peak appearing within a range of 400 to 500 nm for flue emission, within a range of 480 to 600 nm for green emission, and within a range of 580 to 700 nm for red emission are employed to calculate each energy level. In the case where the absorption peak and the emission peak are close to each other so that the excitation light may mix with the emission peak, an absorption peak or an absorption shoulder on a more short wavelength side may be employed.

[1] Excited Singlet Energy Level E (S, Sh) Derived from the Shoulder of the Peak on the Short Wavelength Side of Fluorescence Spectrum A test sample containing a target compound is irradiated with an excitation light at 77 K to observe the fluorescence spectrum thereof. Relative to the emission peak appearing on the fluorescence spectrum, a tangent line running through the inflection point (shoulder) on the short wavelength side is drawn, and from the wavelength ($B_{sh}$) (nm) at the intersection between the tangent line and the base line, the excited singlet energy level E (S, Sh) is calculated according to the following expression.

$$E(S,Sh)\ [\text{eV}]=1240/B_{Sh}$$

[2] Excited Singlet Energy Level E (S, PT) Derived from the Peak Top on the Short Wavelength Side of Fluorescence Spectrum A test sample containing a target compound is irradiated with an excitation light at 77 K to observe the fluorescence spectrum thereof. From the wavelength (emission maximum wavelength, $B_{PT}$) [nm] corresponding to the peak top on the most short wavelength side of the emission peak appearing on the fluorescence spectrum, the excited singlet energy level E (S, PT) is calculated according to the following expression.

$$E(S,PT)\ [\text{eV}]=1240/B_{PT}$$

[3] Excited Singlet Energy Level E (T, Sh) Derived from the Shoulder of the Peak on the Short Wavelength Side of Phosphorescence Spectrum A test sample containing a target compound is irradiated with an excitation light at 77 K to observe the phosphorescence spectrum thereof. Relative to the emission peak appearing on the phosphorescence spectrum, a tangent line running through the inflection point (shoulder) on the short wavelength side is drawn, and from the wavelength ($C_{sh}$) (nm) at the intersection between the tangent line and the base line, the excited triplet energy level E (T, Sh) is calculated according to the following expression.

$$E(T,Sh)\ [\text{eV}]=1240/C_{sh}$$

[4] Excited Triplet Energy Level E (T, PT) Derived from the Peak Top on the Short Wavelength Side of Phosphorescence Spectrum A test sample containing a target compound is irradiated with an excitation light at 77 K to observe the phosphorescence spectrum thereof. From the wavelength (emission maximum wavelength, $C_{PT}$) [nm] corresponding to the peak top on the most short wavelength side of the emission peak appearing on the phosphorescence spectrum, the excited triplet energy level E (T, PT) is calculated according to the following expression.

$$E(T,PT)\ [\text{eV}]=1240/C_{PT}$$

Here, between a D-A (donor-acceptor)-type TADF material and an MRE (multi-resonance effect)-type compound, the emission width of the fluorescence and phosphorescence spectra differs depending on the toughness of the molecule, and therefore, even when the maximum emission wavelength is the same between the two, it is considered that the D-A-type TADF compound can have a broader energy width of the molecule thereof than the MRE-type compound molecule. In a TAF device, it is necessary to accurately estimate the energy transfer between the components and to plan the configuration, and therefore, the excited singlet energy level and the excited triplet energy level are estimated from the shoulder on the short wavelength side of the spectrum. In general, an intersection between the tangent line running through the inflection point of the short wavelength side of the spectrum and the base line is referred to as the energy to be derived from the shoulder on the short wavelength side.

The excited singlet energy level E (S, PT) and the excited triplet energy level E (T, PT) derived from the peak top are employed for calculation and discussion of ΔEST. The excited singlet energy level E (S, Sh) and the excited triplet energy level E (T, Sh) derived from the shoulder on the short wavelength side of the spectrum are employed for discussion about energy confinement and transfer between the host compound of the first component and an assisting dopant, and energy confinement and transfer between the assisting dopant and an emitting dopant.

(5) Reverse Intersystem Crossing Speed

The reverse intersystem crossing speed indicates a speed of reverse intersystem crossing from an excited triplet to an excited singlet. The reverse intersystem crossing speed of an assisting dopant and an emitting dopant can be calculated through transient fluorescence spectroscopy using the method described in Nat. Commun. 2015, 6, 8476 or Organic Electronics 2013, 14, 2721-2726. Specifically, the reverse intersystem crossing speed of an assisting dopant is $10^7\ s^{-1}$, preferably 108 $s^{-1}$.

(6) Light Emission Speed

The light emission speed indicates a transient speed from an excited singlet to a ground state via fluorescence emission not via a TADF process. The light emission speed of an assisting dopant and an emitting dopant can be calculated using the method described in Nat. Commun. 2015, 6, 8476 or Organic Electronics 2013, 14, 2721-2726, like the reverse intersystem crossing speed. Specifically, the reverse intersystem crossing speed of an emitting dopant is $10^7\ s^{-1}$, preferably 108 $s^{-1}$.

Hereinunder the layers and the materials constituting the light-emitting device of the present invention are described.

1. Light-Emitting Layer

The light-emitting layer contains a host compound as a first component, a thermally assisting delayed fluorescent material as a second component, and a fluorescent material as a third component. Here, the host compound is a compound having a boron atom and an oxygen atom, the thermally assisting delayed fluorescent material is such that the energy difference ΔEST(2) between the excited singlet energy level and the excited triplet energy level is 0.20 eV or less. Here, the compounds to constitute the first component to the third component each may be one kind alone or two or more kinds.

In this description, the thermally assisting delayed fluorescent material as the second component may be referred to as "assisting dopant" (compound), and the fluorescent material as the third component may be referred to as "emitting dopant" (compound).

The light-emitting layer may be formed of a single layer or multiple layers. The host compound, the thermally assisting delayed fluorescent material and the fluorescent material can be contained in one and the same layer, or at least one component of these may be separately contained in multiple layers. The host compound, the thermally assisting delayed fluorescent material and the fluorescent material that the light-emitting layer contains each may be either one kind alone or multiple kinds as combined. The assisting dopant and the emitting dopant may be wholly contained in the host compound as a matrix, or may be partially contained therein. The light-emitting layer doped with an assisting dopant and an emitting dopant can be formed according to a film formation method of a three-dimensional co-evaporation method with a host compound, an assisting dopant and an emitting dopant, or a method of previously mixing a host compound, an assisting dopant and an emitting dopant and simultaneously evaporating them at a time, or a wet-process film formation method of preparing a coating material by dissolving a host compound, an assisting dopant and an emitting dopant in an organic solvent and applying the resultant coating material.

The amount to be used of the host compound of the first component may vary depending on the kind of the host compound and the kind of the second component, and can be determined in accordance with the combination thereof. From the viewpoint of electron transportability improvement and an optimum carrier balance, the amount of the first component is preferably larger, and the amount of the host material to be used is, as a rough standard, preferably 40 to 99.999% by weight of the total amount of the light-emitting layer material, more preferably 50 to 99.99% by weight, even more preferably 60 to 99.9% by weight. The range is preferred from the viewpoint of efficient charge transportation and efficient energy transfer to dopant.

The amount to be used of the assisting dopant (thermally assisting delayed fluorescent material) of the second component may vary depending on the kind of the assisting dopant, and can be determined in accordance with the characteristics of the assisting dopant. From the viewpoint of efficient recombination to occur on the compound, the amount of the second component is preferably larger, and the amount of the assisting dopant to be used is, as a rough standard, preferably 1 to 60% by weight of the total amount of the light-emitting layer material, more preferably 2 to 50% by weight, even more preferably 5 to 30% by weight. Falling within the range, for example, the assisting dopant can efficiently induce recombination, and therefore, energy can be favorably transferred to an emitting dopant. Here, in the present invention, the host compound has high electron transportability and therefore does not require compensation for electron transportation by an assisting dopant. Consequently, an advantage of the invention is that the amount of the thermally assisting delayed fluorescent material to be used can be selected in an increased concern with the function thereof as an assisting dopant.

The amount to be used of the emitting dopant (fluorescent material) as the third component may vary depending on the kind of the emitting dopant, and can be determined in accordance with the characteristics of the emitting dopant. The amount of the emitting dopant to be used is, as a rough standard, preferably 0.001 to 30% by weight of the total amount of the light-emitting layer material, more preferably 0.01 to 20% by weight, even more preferably 0.1 to 10% by weight. In general, a molecule having high planarity and a molecule utilizing a multiple resonance effect may readily aggregate, and therefore, the amount to be used of the compound of the type is preferably smaller. Also, from the viewpoint of causing efficient recombination on the second component, the amount to be used is preferably smaller. On the other hand, from the viewpoint of easiness in the process operation, the amount to be used may be preferably larger since the process margin can be large. The above range is preferred, for example, from the viewpoint of providing a controllable process, preventing concentration quenching, and attaining efficient recombination on the second component.

From the viewpoint of the efficiency of the thermally assisting delayed fluorescence mechanism of an assisting dopant, the amount to be used of the emitting dopant is preferably smaller than the amount to be used of the assisting dopant.

1-1. Host Compound

In the present invention, a host compound having a boron atom and an oxygen atom in the molecule is used as the first component of the light-emitting layer.

The host compound having a boron atom and an oxygen atom in the molecule is preferably a polycyclic aromatic compound having a structure such that three aromatic rings bond to the boron atom, in which at least one aromatic ring links to the other aromatic rings via a linking group, and at least one linking group is oxy (—O—) (hereinafter referred to as "a polycyclic aromatic compound having a boron atom and an oxygen atom").

The polycyclic aromatic compound having a boron atom and an oxygen atom has a large HOMO-LUMO gap and a high excited triplet energy level ($E_T$). This may be presumed because of the reasons that the hetero element-containing aromatic ring has low aromaticity and therefore HOMO-LUMO gap reduction accompanied by conjugated system expansion can be suppressed and that two SOMOs (single occupied molecular orbitals), that is, SOMO1 and SOMO2 both in an excited triplet state (T1) can be localized owing to the electronic perturbation of the hetero atoms. The polycyclic aromatic compound having a boron atom and an oxygen atom has a high excited triplet energy level and therefore can be especially preferably used as a host to confine excited triplet energy in the molecule of a thermally assisting delayed fluorescent material.

Further, the structure of the host compound of the first component is preferably selected in consideration of the following points.

Specifically, from the viewpoint of lowering interaction to attain high excited triplet energy, the first component preferably has a structure to lower aggregability. Specifically, the molecular structure of the first component is preferably an asymmetric structure, and preferably has a large dihedral angle in the molecule, or has a steric hindrance in the molecule. From the viewpoint of improving charge transportability and energy transferability, the orbitals participating in charge transportation are close to each other. Also, from the viewpoint of stability of the device properties in device driving, the glass transition temperature (Tg) of the first component is preferably high, and for this, a structure capable of inducing intermolecular interaction is preferably introduced into the compound.

For suppressing aggregation between components, compounds that poorly aggregate may be used both as the first component and the second component, or as any one of the components, a compound that poorly aggregates may be used. Aggregation performance can be estimated from the degree of red shift in a spectrum of a low-concentration homogeneous dispersion state and that of a single component vapor-deposition film, or from the degree of red shift in a spectrum of a co-evaporation film of the first component and the second component and a spectrum of the second component in a low-concentration homogeneous dispersion state.

The host compound having a boron atom and an oxygen atom in the molecule includes compounds represented by any of the following formulae (i), (ii) and (iii).

1-1-1. Compound Represented by Formula (i)

(i)

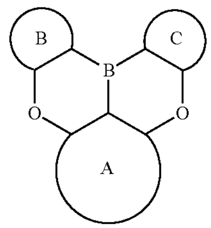

In the formula (i), the ring A, the ring B and the ring C each are independently an aryl ring or a heteroaryl ring, and at least one hydrogen in these rings may be substituted. Regarding the description, the preferred range and the specific examples of the substituent with which the hydrogen in the ring A, the ring B and the ring C may be substituted, reference may be made to the description, the preferred range and the specific examples of the substituent of $R^1$ to $R^{11}$ in the formula (1).

Further, at least one hydrogen in the compound or the structure represented by the formula (i) may be substituted with a cyano, a halogen or a deuterium, in addition to the above-mentioned substituent.

"Aryl ring" or "heteroaryl ring" is a non-valent aryl or heteroaryl ring. The carbon number of the aryl ring or the heteroaryl ring includes a carbon number of the ring before condensation.

The compound represented by the formula (i) is preferably a compound represented by the following formula (1).

(1)

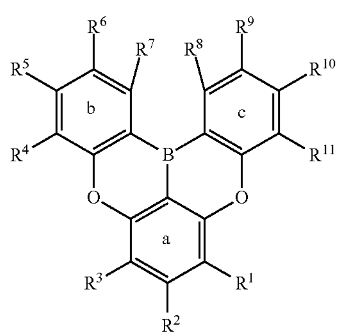

In the formula (1), $R^1$ to $R^{11}$ each independently represent a hydrogen or a substituent. The number of the substituents among $R^1$ to $R^{11}$ is not specifically limited, and one or two or more of $R^1$ to $R^{11}$ may be substituents, or all are unsubstituted (that is, hydrogen atoms). In the case where 2 or more of $R^1$ to $R^{11}$ are substituents, these substituents may be the same or different. Here, since steric hindrance hardly increases, various substituents can be introduced into $R^1$, $R^2$, $R^3$, $R^4$, $R^5$, $R^6$, $R^7$, $R^8$, $R^9$, $R^{10}$ and $R^{11}$ with no limitation. On the other hand, from the viewpoint of HOMO level and LUMO level control, at least one of $R^1$, $R^3$, $R^4$, $R^6$, $R^9$ and $R^{11}$ is preferably an electron-accepting substituent for deepening the HOMO level, but on the contrary, at least one of $R^1$, $R^3$, $R^4$, $R^6$, $R^9$ and $R^{11}$ is preferably an electron-donating substituent for shallowing the HOMO level. Further, for deepening the LUMO level, at least one of $R^2$, $R^5$ and $R^{10}$ is preferably an electron-accepting substituent, but on the contrary, for shallowing the LUMO level, at least one of $R^2$, $R^5$ and $R^{10}$ is preferably an electron-donating substituent.

Also preferably, by the dihedral angle between the plane of the aromatic ring formed by the ring a to the ring c and the boron atom and the oxygen atom, and the plane of the substituent of $R^1$ to $R^{11}$, the intermolecular interaction is controlled. Specifically, the compound represented by the formula (1), as well as the compound represented by (AD11), (AD12), (AD13), (AD21) or (AD22) as an example of the second component to be mentioned hereinunder has a high planarity, and therefore, by employing the structure to increase the above-mentioned dihedral angle, aggregation caused by planarity and intermolecular interaction between the host molecules and between the host molecule-dopant molecule can be effectively reduced. As a result, the red shift and the widening of the emission spectrum can be suppressed, and emission of blue light having a high color purity can be thereby realized. The dihedral angle of a molecule can be determined by molecular orbital calculation such as semi-empirical molecular orbital calculation MOPAC.

In the formula (1), preferably, $R^1$ to $R^{11}$ each are independently a hydrogen, an aryl, a heteroaryl, a diarylamino, a diheteroarylamino, an arylheteroarylamino, an alkyl, a cycloalkyl, an alkoxy or an aryloxy. Here, the groups except hydrogen are the substituents that are substituted with the hydrogen of the benzene ring corresponding to the ring a to the ring c. In the following description, these substituents are referred to as "the first substituent". Among the first substituent, at least one hydrogen in an aryl, a heteroaryl, a diarylamino, a diheteroarylamino and an arylheteroarylamino may be substituted with an aryl, a heteroaryl, an alkyl or a cycloalkyl. In the following description, the substituent that is substituted with the hydrogen of the first substituent is referred to as "the second substituent".

The "aryl" as the first substituent may be a single ring, or may be a condensed ring formed by condensation of 2 or more aromatic hydrocarbon rings, or may be a linked ring formed by linking 2 or more aromatic hydrocarbon rings. In the case where 2 or more aromatic hydrocarbon rings are linked, they may be linked linearly, or may be linked in a branched manner. The "aryl" as the first substituent is, for example, an aryl having a carbon number of 6 to 30, and is preferably an aryl having a carbon number of 6 to 24, more preferably an aryl having a carbon number of 6 to 20, even more preferably an aryl having a carbon number of 6 to 16, further more preferably an aryl having a carbon number of 6 to 12, and most preferably an aryl having a carbon number of 6 to 10.

Specific examples of the aryl include a monocyclic aryl of a phenyl, a dicyclic aryl of a biphenylyl (2-biphenylyl, 3-biphenylyl, 4-biphenylyl), a condensed bicyclic aryl of a naphthyl (1-naphthyl, 2-naphthyl), a tricyclic aryl of a terphenyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl-p-terphenyl-3-yl, p-terphenyl-4-yl), a condensed tricyclic aryl of an acenaphthylenyl (acenaphthylene-1-yl, acenaphthylene-3-yl, acenaphthylene-4-yl, acenaphthylene-5-yl), a fluorenyl (fluoren-1-yl, fluoren-2-yl, fluoren-3-yl, fluoren-4-yl, fluoren-9-yl), a phenalenyl (phenalen-1-yl, phenalen-2-yl), a phenanthryl (1-phenanthryl, 2-phenanthryl, 3-phenanthryl, 4-phenanthryl, 9-phenanthryl), a tetracyclic aryl of a quaterphenylyl (5'-phenyl-m-terphenyl-2-yl, 5'-phenyl-m-terphenyl-3-yl, 5'-phenyl-m-terphenyl-4-yl, m-quaterphenylyl), a condensed tetracyclic aryl of a triphenylene (triphenylen-1-yl, triphenylen-2-yl), a pyrenyl (pyren-1-yl, pyren-2-yl, pyren-4-yl), a naphthacenyl (naphthacen-1-yl, naphthacen-2-yl, naphthacen-5-yl), and a condensed pentacyclic aryl of a perylenyl (perylen-1-yl, perylen-2-yl, perylen-3-yl), and a pentacenyl (pentacen-1-yl, pentacen-2-yl, pentacen-5-yl, pentacen-6-yl).

Regarding the description and the preferred range, and the specific examples of "aryl" in the diarylamino, "aryl" in the arylheteroarylamino, and "aryl" in the aryloxy as the first substituent, and "aryl" as the second substituent, reference may be made to the description and the preferred range, and the specific examples of "aryl" as the first substituent mentioned above.

"Heteroaryl" as the first substituent may be a single ring, or may be a condensed ring formed by condensation of one or more hetero ring with one or more hetero ring or one or more aromatic hydrocarbon ring, or may be a linked ring formed by linking 2 or more hetero rings. In the case where 2 or more hetero ring are linked, they may be linked linear, or may be linked in a branched manner. "Heteroaryl" as the first substituent is, for example, a heteroaryl having a carbon number of 2 to 30, and is preferably a heteroaryl having a carbon number of 2 to 25, more preferably a heteroaryl having a carbon number of 2 to 20, even more preferably a heteroaryl having a carbon number of 2 to 15, and especially preferably a heteroaryl having a carbon number of 2 to 10. The hetero atom in the heteroaryl includes, though not specifically limited thereto, an oxygen, a sulfur and a nitrogen. Preferably, the heteroaryl is formed of a hetero ring having 1 to 5 hetero atoms.

Specific examples of the heteroaryl include a furyl, a thienyl, a pyrrolyl, an oxazolyl, an isoxazolyl, a thiazolyl, an isothiazolyl, an imidazolyl, a pyrazolyl, an oxadiazolyl, a furazanyl, a thiadiazolyl, a triazolyl, a tetrazolyl, a pyridyl, a pyrimidyl, a pyridazinyl, a pyrazinyl, a triazinyl, a benzofuranyl, an isobenzofuranyl, a dibenzofuranyl, a benzo[b]thienyl, a dibenzothiophenyl, an indolyl, an isoindolyl, a 1H-indazolyl, a benzimidazolyl, a benzoxazolyl, a benzothiazolyl, a 1H-benzotriazolyl, a quinolyl, an isoquinolyl, a cinnolyl, a quinazolyl, a quinoxalinyl, a phthalazinyl, a naphthyridinyl, a purinyl, a pteridinyl, a carbazolyl, an acridinyl, a phenoxazinyl, a phenothiazinyl, a phenazinyl, a phenoxathiinyl, a thianthrenyl, and an indolidinyl.

Regarding the description and the preferred range, and the specific examples of "heteroaryl" in the diheteroarylamino, and "heteroaryl" in the arylheteroarylamino as the first substituent, and "heteroaryl" as the second substituent, reference may be made to the description and the preferred range, and the specific examples of "heteroaryl" as the first substituent mentioned above. "Heteroaryl" as the second substituent includes a substituted heteroaryl such that at least one hydrogen of the heteroaryl is substituted with an aryl such as a phenyl or an alkyl such as a methyl. Regarding the description and the preferred range, and the specific examples of the aryl to be a substituent for "heteroaryl" as the second substituent, reference may be made to the description and the preferred range, and the specific examples of "aryl" as the first substituent. Regarding the description and the preferred range, and the specific examples of the alkyl group to be a substituent for "heteroaryl" as the second substituent, reference may be made to the description and the preferred range, and the specific examples of "alkyl group" as the first substituent to be mentioned hereinunder. Examples of the substituted heteroaryl as the second substituent include a carbazolyl group in which at least the 9-positioned hydrogen is substituted with an aryl such as a phenyl or an alkyl such as a methyl.

"Alkyl" as the first substituent may be a linear alkyl or a branched alkyl. The alkyl as the first substituent is, for example, an alkyl having a carbon number of 1 to 24, and is preferably an alkyl having a carbon number of 1 to 18, more preferably an alkyl having a carbon number of 1 to 12, even more preferably an alkyl having a carbon number of 1 to 6, especially more preferably an alkyl having a carbon number of 1 to 4, and most preferably a methyl. In the case where the alkyl as the first substituent is a branched alkyl, the branched alkyl is, for example, a branched alkyl having a carbon number of 3 to 24, and is preferably a branched alkyl having a carbon number of 3 to 18, more preferably a branched alkyl having a carbon number of 3 to 12, even more preferably a branched alkyl having a carbon number of 3 to 6, and especially more preferably a branched alkyl having a carbon number of 3 to 4.

Specific examples of the alkyl include a methyl, an ethyl, an n-propyl, an isopropyl, an n-butyl, an isobutyl, an s-butyl, a t-butyl, an n-pentyl, an isopentyl, a neopentyl, a t-pentyl, an n-hexyl, a 1-methylpentyl, a 4-methyl-2-pentyl, a 3,3-dimethylbutyl, a 2-ethylbutyl, an n-heptyl, a 1-methylhexyl, an n-octyl, a t-octyl, a 1-methylheptyl, a 2-ethylhexyl, a 2-propylpentyl, an n-nonyl, a 2,2-dimethylheptyl, a 2,6-dimethyl-4-heptyl, a 3,5,5-trimethylhexyl, an n-decyl, an n-undecyl, a 1-methyldecyl, an n-dodecyl, an n-tridecyl, a 1-hexylheptyl, an n-tetradecyl, an n-pentadecyl, an n-hexadecyl, an n-heptadecyl, an n-octadecyl, and an n-eicosyl.

Regarding the description and the preferred range, and the specific examples of "alkyl" as the second substituent, reference may be made to the description and the preferred range, and the specific examples of "alkyl" as the first substituent. In the first substituent, the position of the alkyl as the second substituent is, though not specifically limited thereto, preferably a 2- or 3-position, more preferably a 2-position based on the bonding position (1-position) of the first substituent to the ring a, the ring b and the ring c.

"Cycloalkyl" as the first substituent may be any of a cycloalkyl of one ring, a cycloalkyl of multiple rings, a cycloalkyl containing a double bond not conjugated in the ring, and a cycloalkyl having a branch outside the ring. "Cycloalkyl" as the first substituent is, for example, a cycloalkyl having a carbon number of 3 to 12, and is preferably a cycloalkyl having a carbon number of 5 to 10, more preferably a cycloalkyl having a carbon number of 6 to 10.

Specific examples of the cycloalkyl include a cyclopropyl, a cyclobutyl, a cyclopentyl, a cyclohexyl, a cycloheptyl, a cyclooctyl, a bicyclo[2.2.1]heptyl, a bicyclo[2.2.2]octyl, a decahydronaphthyl, and an adamantyl.

Regarding the description and the preferred range, and the specific examples of "cycloalkyl" as the second substituent, reference may be made to the description and the preferred range, and the specific examples of "cycloalkyl" as the first substituent.

"Alkoxy" as the first substituent may be linear or branched. "Alkoxy" as the first substituent is, for example, an alkoxy having a carbon number of 1 to 24, and is preferably an alkoxy having a carbon number of 1 to 18, more preferably an alkoxy having a carbon number of 1 to 12, even more preferably an alkoxy having a carbon number of 1 to 6, especially more preferably an alkoxy having a carbon number of 1 to 4. In the case where the alkoxy as the first substituent is branched, the branched alkoxy is, for example, a branched alkoxy having a carbon number of 3 to 24, and is preferably a branched alkoxy having a carbon number of 3 to 18, more preferably a branched alkoxy having a carbon number of 3 to 12, even more preferably a branched alkoxy having a carbon number of 3 to 6, especially more preferably a branched alkoxy having a carbon number of 3 to 4.

Specific examples of the alkoxy include a methoxy, an ethoxy, a propoxy, an isopropoxy, a butoxy, an isobutoxy, an s-butoxy, a t-butoxy, a pentyloxy, a hexyloxy, a heptyloxy and an octyloxy.

The compound represented by the formula (1) preferably contains at least one structure selected from the following partial structure group A, in the molecule. The number of the structures selected from the partial structure group A, which the compound represented by the formula (1) contains, may be 1, or may be 2 or more.

Partial Structure Group A:

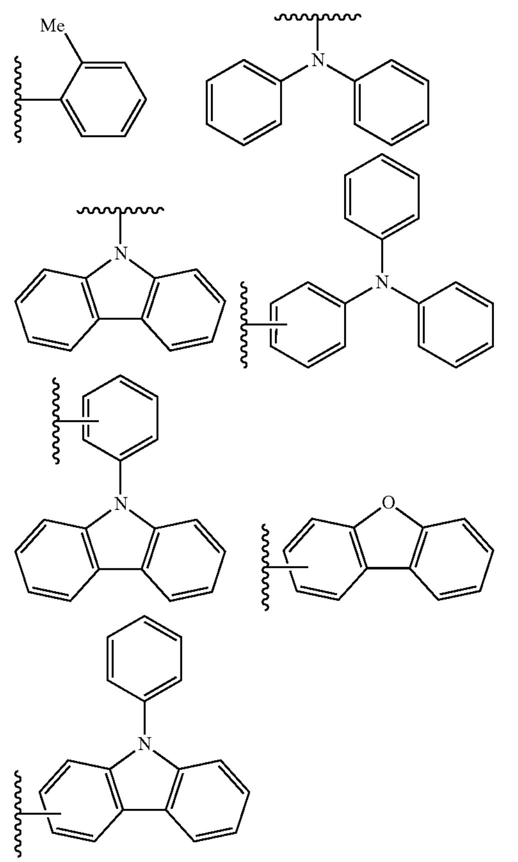

In each partial structure, Me represents a methyl group, and the wavy line indicates a bonding position. The bonding position indicated by the wavy line is any of the substitutable positions of the benzene ring (including the benzene ring constituting a condensed ring) for the chemical bond. At least one hydrogen atom in each partial structure may be each independently substituted with an aryl, a heteroaryl, a diarylamino, a diheteroarylamino, an arylheteroarylamino, an alkyl, an alkoxy or an aryloxy, and among these, at least one hydrogen atom in the aryl, the heteroaryl, the diarylamino, the diheteroarylamino and the arylheteroarylamino may be further substituted with an aryl, a heteroaryl or an alkyl. Regarding the description and the preferred range, and the specific examples of the aryl, the heteroaryl, the diarylamino, the diheteroarylamino, the arylheteroarylamino the alkyl, the alkoxy and the aryloxy, reference may be made to the corresponding description of $R^1$ to $R^{11}$ in the formula (1).

In the formula (1), at least one of $R^1$ to $R^{11}$ is preferably a group represented by any of the following formulae (1-a) to (1-n), more preferably a group represented by the following formula (1-d).

(1-a)

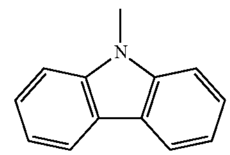

(1-b)

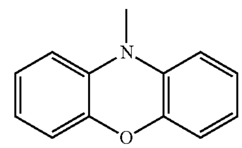

(1-c)

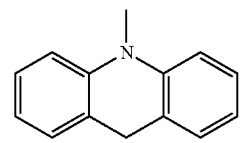

(1-d)

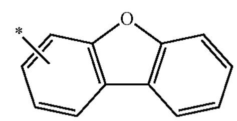

(1-e)

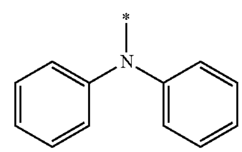

(1-f)

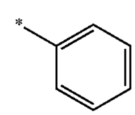

(1-g)

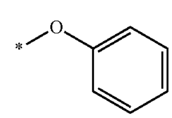

(1-h)

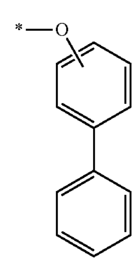

-continued (1-i)

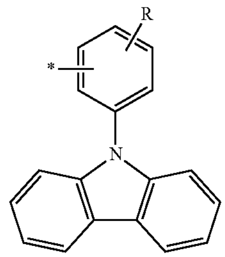

(1-j)

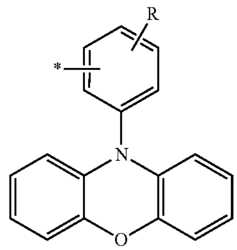

(1-k)

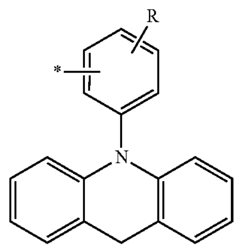

(1-l)

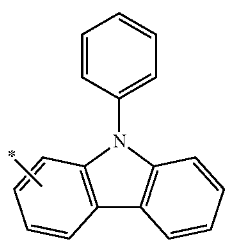

(1-m)

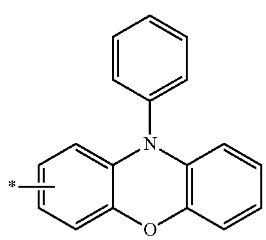

(1-n)

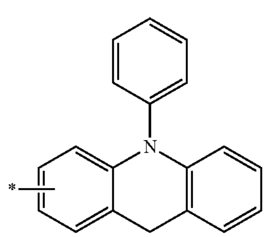

In the formulae (1-a) to (1-n), * indicates a bonding position. In the formulae (1-d), and (1-i) to (1-n), the bonding position indicated by * is any of the substitutable positions of the benzene ring (including the benzene ring constituting a condensed ring) for the chemical bond. In the formula (1-h), the group represented by *—O— bonds to the substitutable position of the benzene ring for the chemical bond.

The hydrogen in the formula (1-a) to the formula (1-h) may be substituted with an aryl having a carbon number of 6 to 30, a heteroaryl having a carbon number of 2 to 30, an alkyl having a carbon number of 1 to 24 or a cycloalkyl having a carbon number of 3 to 12, as the "second substituent" in $R^1$ to $R^{11}$ mentioned above.

R in the formula (1-i), the formula (1-j) and the formula (1-k) each independently represents a hydrogen, or an aryl having a carbon number of 6 to 30, a heteroaryl having a carbon number of 2 to 30, an alkyl having a carbon number of 1 to 24, or a cycloalkyl having a carbon number of 3 to 12, as the "second substituent" in $R^1$ to $R^{11}$ mentioned above. The position at which R bonds is any of the substitutable positions of the benzene ring (including the benzene ring constituting a condensed ring) for the chemical bond.

In the case where the group represented by any of the formulae (1-a) to (1-n) is employed as $R^1$ to $R^{11}$, the number and the position thereof are, though not specifically limited thereto, preferably such that at least one of $R^1$, $R^2$, $R^3$, $R^4$, $R^5$, $R^6$, $R^9$, $R^{10}$ and $R^{11}$ is a group represented by any of the formulae (1-a) to (1-n). For deepening the HOMO level, preferably, at least one of $R^1$, $R^3$, $R^4$, $R^6$, $R^9$ and $R^{11}$ is a group represented by any of the formulae (1-a) to (1-n), and for deepening LUMO, preferably, at least one of $R^2$, $R^5$ and $R^{10}$ is a group represented by any of the formulae (1-a) to (1-n).

More specific embodiments of the group represented by the formulae (1-a) to (1-n) include the following. In the formulae, * indicates a bonding position, Me represents a methyl, and tBu represents a t-butyl.

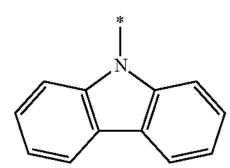

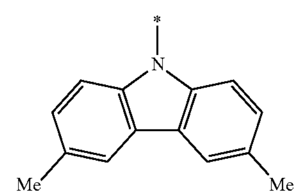

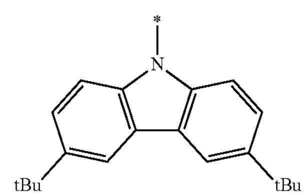

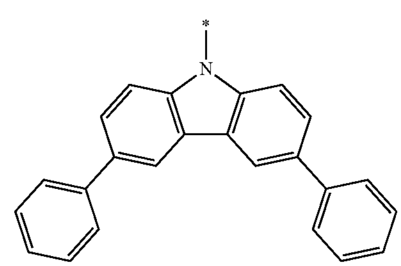

-continued
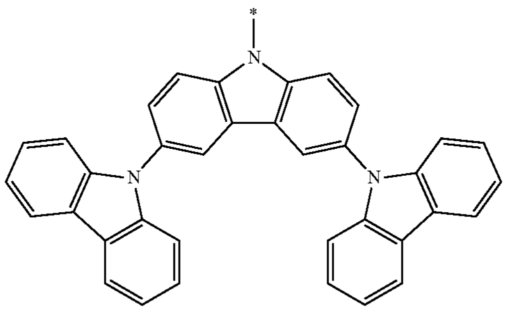
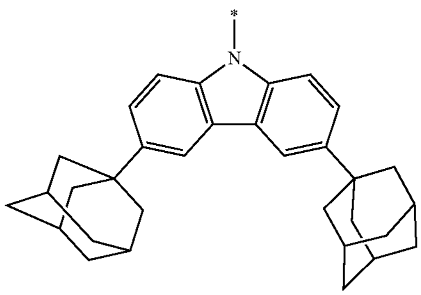
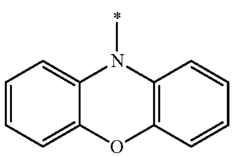
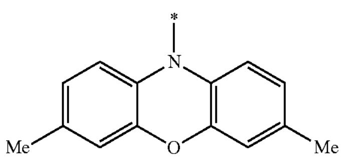
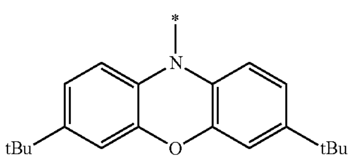
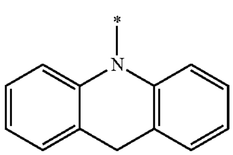
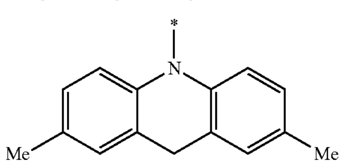
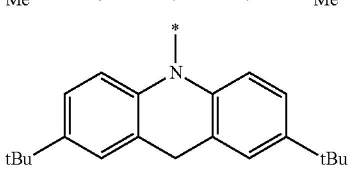
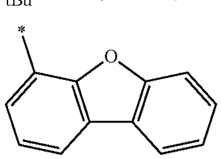
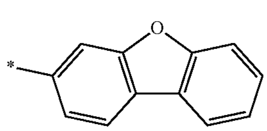
-continued
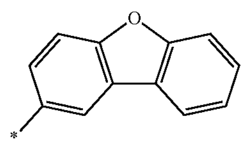
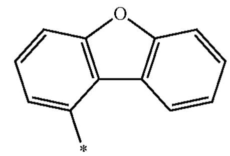
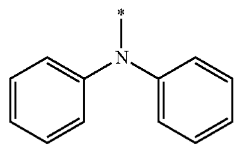
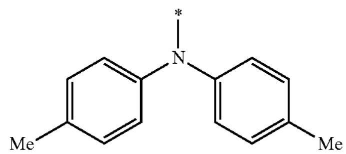
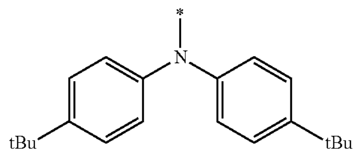
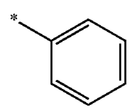
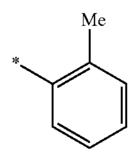
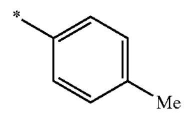
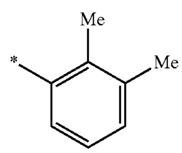
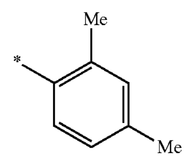
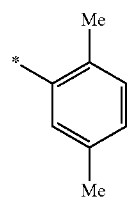
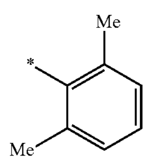
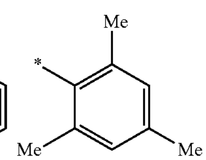
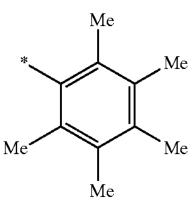
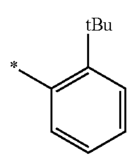
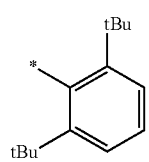
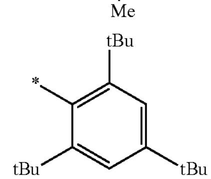
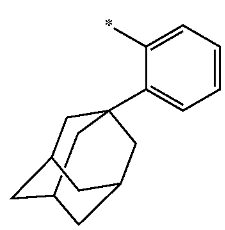
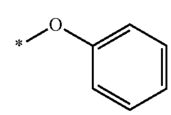
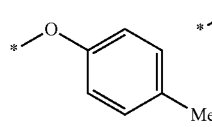
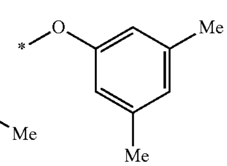

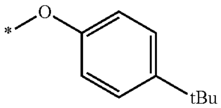
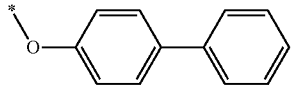
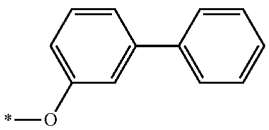
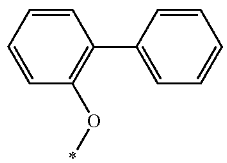
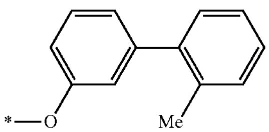
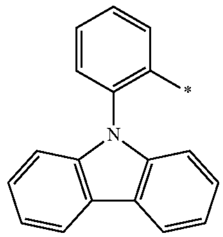
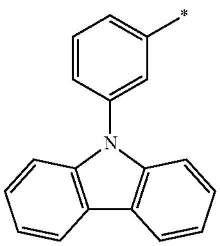
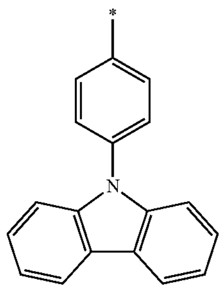
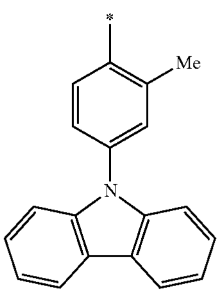
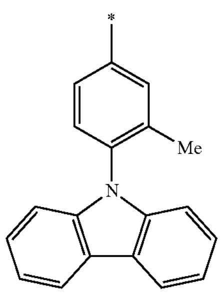
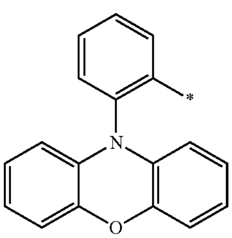
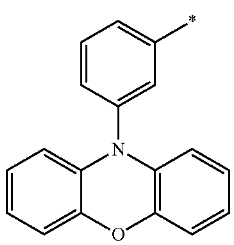
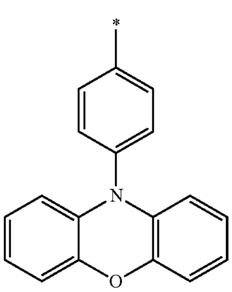
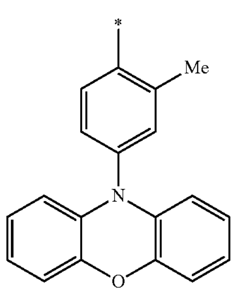
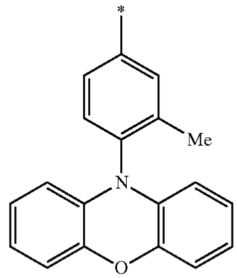
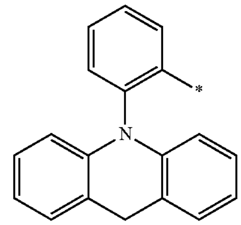
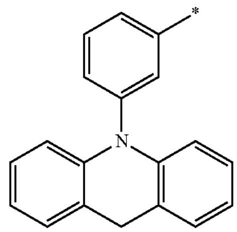
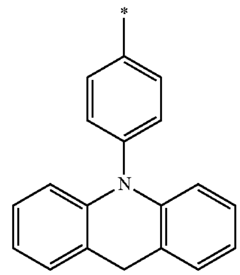
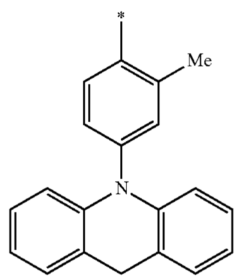
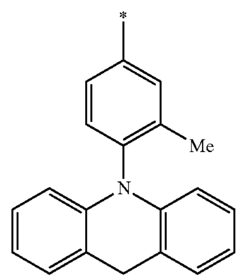
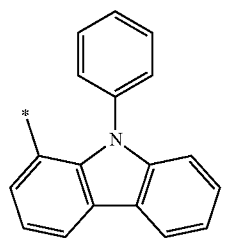
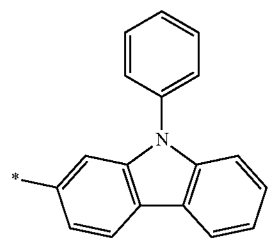
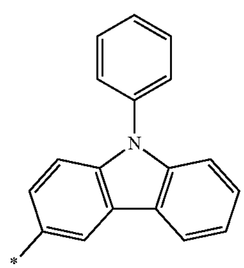
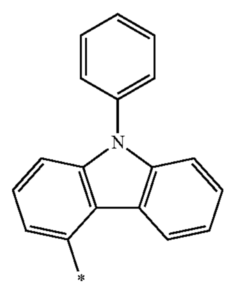
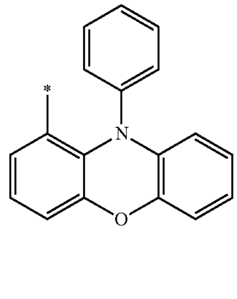
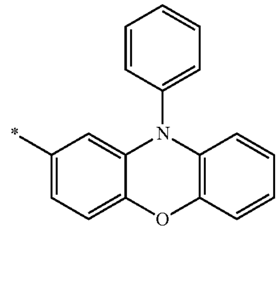

-continued

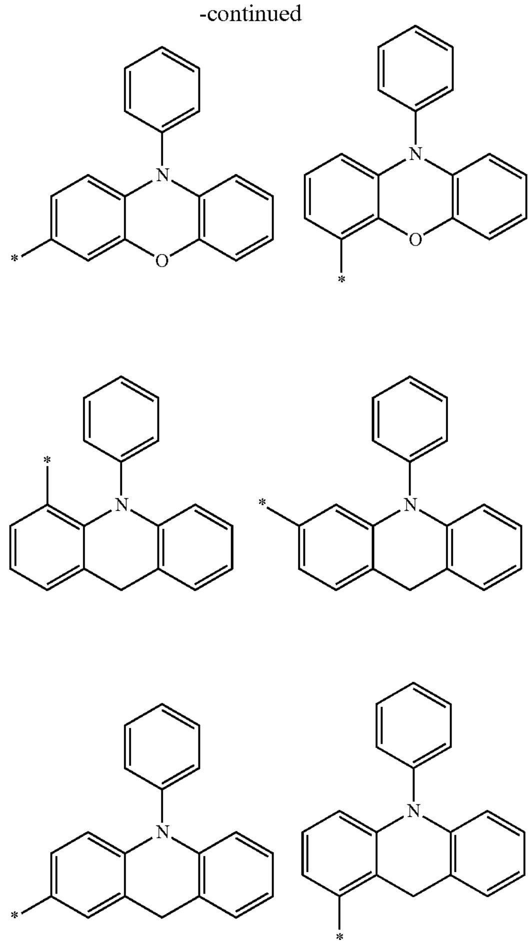

In the formula (1), the number of the first substituents among $R^1$ to $R^{11}$ is not specifically limited, and one or two or more of $R^1$ to $R^{11}$ may be the first substituents, or all may be unsubstituted (that is, hydrogen atoms). Here, the total carbon number of the substituents of $R^1$ to $R^{11}$ is preferably 36 or less. In the case where 2 or more of $R^1$ to $R^{11}$ are the first substituents, these first substituents may be the same as or different from each other in point of the kind of the substituent, the presence or absence and the kind of the second substituent. In the case where 2 or more of the ring a, the ring b and the ring c have a first substituent, the substituting number, the substituting position and the kind of the first substituent, and the presence or absence and the kind of the second substituent in the first substituent may be the same or may differ among the rings. In the case where the first substituents are introduced into two or more of $R^1$ to $R^{11}$, the substituting positions are preferably so selected as to reduce the steric hindrance from the viewpoint of facilitating the synthesis of the compounds. Specifically, in the case where the first substituents are introduced into different rings, or where the first substituents are introduced into the same ring, preferably, the first substituents are introduced into the meta-position to each other or into the para-position to each other. On the other hand, in the case where the first substituents are introduced into the ortho-position to each other, preferably, groups whose steric hindrance is low are selected as the first substituent and the second substituent. The group whose steric hindrance is low includes a linear alkyl, a linear alkoxy, a fluorine an a cyano.

In addition, especially in the case where the compound represented by the formula (1) is synthesized according to a synthesis method of introducing a boron in a final stage, preferably, a substituent is introduced in a line-symmetric position relative to the bonding of the ring a to B, from the viewpoint of easiness in synthesis. On the other hand, from the viewpoint of lowering the crystallinity and the aggregation potential, preferably, a substituent is introduced in a line-asymmetric position relative to the bonding of the ring a to B.

Also, in the above formula (1), neighboring groups of $R^1$ to $R^{11}$ may bond to each other to form an aryl ring or a heteroaryl ring along with the ring a, the ring b or the ring c. However, $R^3$ of the ring a and $R^4$ of the ring c, $R^7$ of the ring c and $R^8$ of the ring b, and $R^{11}$ of the ring b and $R^1$ of the ring a do not correspond to "neighboring groups" as referred to herein, and therefore these do not bond to form a cyclic structure. Specifically, "neighboring groups" are groups that exist on the same ring and neighbor to each other. In the ring that the neighboring groups bond to each other to form along with the ring a, the ring b or the ring c, at least one hydrogen may be substituted with an aryl, a heteroaryl, a diarylamino, a diheteroarylamino, an arylheteroarylamino, an alkyl, a cycloalkyl, an alkoxy or an aryloxy. In the following description, the substituent that substitutes for the hydrogen in the formed ring is referred to as "the first substituent". At least one hydrogen in the first substituent may be substituted with an aryl, a heteroaryl, an alkyl or a cycloalkyl. In the following description, the substituents that substitutes for the hydrogen in the first substituent is referred to as "the second substituent". Regarding the description and the preferred range, and the specific examples of the first substituent and the second substituent, reference may be made to the description and the preferred range, and the specific examples of the first substituent and the second substituent, respectively, in $R^1$ to $R^{11}$.

Specifically, the compound represented by the formula (1) may be one whose ring structure has been changed as in the following formula (1-L1) and the formula (1-L2) by mutual bonding of the substituents in the ring a, the ring b and the ring c. In the formulae, the ring a', the ring b' and the ring c' correspond to the above-mentioned "formed ring" (the aryl ring or the heteroaryl ring that the neighboring groups among $R^1$ to $R^{11}$ bond to each other to form along with the ring a, the ring b or the ring c). The definition of $R^1$ to $R^{11}$, the ring a, the ring b and the ring c in the formula (1-L1) and the formula (1-L2) is the same as the definition of $R^1$ to $R^{11}$, the ring a, the ring b and the ring c in the formula (1).

(1-L1)

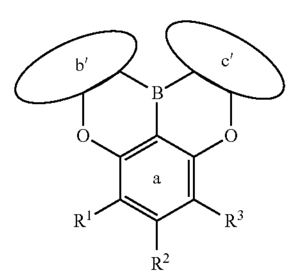

-continued (1-L2)

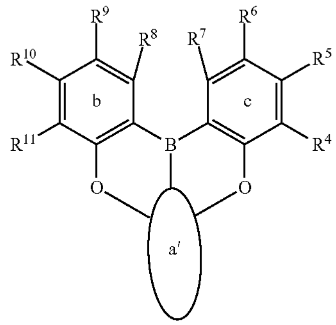

Though not illustrated by formulae, the compound represented by the formula (1) may be a compound in which all the ring a, the ring b and the ring c have been changed to the ring a', the ring b' and the ring c'2.

The compound represented by the formula (1-L1) or the formula (1-L2) is, for example, a compound having at least one of a ring a' (condensed ring a'), a ring b' (condensed ring b') and a ring c' (condensed ring c') formed by condensation of at least one benzene ring of the ring a, the ring b and the ring c with a benzene ring, an indole ring, a pyrrole ring, a benzofuran ring or a benzothiophene ring. Specific examples of the condensed ring a', the condensed ring b' and the condensed ring c' include a naphthalene ring, a carbazole ring, an indole ring, a dibenzofuran ring and a dibenzothiophene ring.

Additional examples of the ring a', the ring b' and the ring c' include an aryl ring and a heteroaryl ring to be mentioned hereinunder.

Specifically, the "aryl ring" that the ring a', the ring b' and the ring c' can take is, for example, an aryl ring having a carbon number of 9 to 30, and is preferably an aryl ring having a carbon number of 9 to 24, more preferably an aryl ring having a carbon number of 9 to 20, even more preferably an aryl ring having a carbon number of 9 to 16, especially more preferably an aryl ring having a carbon number of 9 to 12, and most preferably an aryl ring having a carbon number of 9 to 10. The lower limit of the carbon number "9" of the "aryl ring" herein corresponds to the total carbon number in the case where the benzene ring (having a carbon number of 6) constituting the ring a (or the ring b or the ring c) is condensed with a 5-membered ring.

Specifically, examples of the "aryl ring" include a condensed bicyclic ring of a naphthalene ring, a condensed tricyclic ring of an acenaphthylene ring, a fluorene ring, a phenalene ring or a phenanthrene ring, a condensed tetracyclic ring of a triphenylene ring, a pyren ring or a naphthacene ring, and a condensed pentacyclic ring of a perylene ring or a pentacene ring.

The "heteroaryl ring" that the ring a', the ring b' and the ring c' can take is, for example, a heteroaryl ring having a carbon number of 6 to 30, and is preferably a heteroaryl ring having a carbon number of 6 to 25, more preferably a heteroaryl ring having a carbon number of 6 to 20, even more preferably a heteroaryl ring having a carbon number of 6 to 15, and especially preferably a heteroaryl ring having a carbon number of 6 to 10. Though not specifically limited, the hetero ring in the "hetero aryl ring" includes an oxygen, a sulfur and a nitrogen. The "aromatic hetero ring" to constitute the ring a', the ring b' and the ring c' is preferably a hetero ring containing 1 to 5 hetero atoms. The lower limit "6" of the carbon number of the "heteroaryl ring" as referred to herein corresponds to the total carbon number 6 in the case where the benzene ring (having a carbon number of 6) to constitute the ring a (or the ring b or the ring c) is condensed with a 5-membered ring having 3 hetero atoms.

Specific examples of the "heteroaryl ring" include an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a benzofuran ring, an isobenzofuran ring, a dibenzofuran ring, a benzothiophene ring, a dibenzothiophene ring, and a thianthrene ring.

In the following, preferred examples (first embodiment to fourth embodiment) of the host compound for use as the first component in the present invention are shown. The host compound of the first embodiment is a compound represented by the formula (1), in which $R^1$ to $R^{11}$ each are independently a hydrogen, or an aryl, a heteroaryl, a diarylamino, a diheteroarylamino, an arylheteroarylamino, an alkyl, a cycloalkyl or an alkoxy (first substituent). At least one hydrogen in the aryl, the heteroaryl, the diarylamino, the diheteroarylamino and the arylheteroarylamino as the first substituent may be substituted with an aryl, a heteroaryl, an alkyl or a cycloalkyl (second substituent). Namely, the host compound of the first embodiment is a compound having, as the first substituent. a substituent except an aryloxy (for example, the group represented by the formula (1-h)).

The host compound of the second embodiment is a compound represented by the formula (1), in which at least one of $R^4$ to $R^{11}$ is a heteroaryl as the first substituent. At least one hydrogen in the heteroaryl as the first substituent may be substituted with an aryl, a heteroaryl, an alkyl or a cycloalkyl as the second substituent.

Specific examples of the host compound of the second embodiment include a compound (BO2-0431) and a compound (BO2-0520S) to be mentioned hereinunder.

In the host compound of the second embodiment represented by the formula (1), at least one of $R^4$ to $R^{11}$ is preferably a group represented by any of the above-mentioned formula (1-a), formula (1-b), formula (1-c), formula (1-d), formula (1-1), formula (1-m) and formula (1-n), more preferably a group represented by any of the formula (1-a) and the formula (1-d).

The host compound of the third embodiment is a compound represented by the formula (1), in which at least one of $R^1$ to $R^3$ is an aryl or a dibenzofuranyl as the first substituent. At least one hydrogen in the aryl and the dibenzofuranyl as the first substituent may be substituted with an aryl, a heteroaryl, an alkyl or a cycloalkyl as the second substituent.

Specific examples of the host compound of the third embodiment include a compound (BO2-0264/0511S) and a compound (BO2-0231) to be mentioned hereinunder.

In the host compound of the third embodiment, at least one of $R^1$ to $R^3$ is preferably a group represented by any of the above-mentioned formula (1-d), formula (1-f), formula (1-i), formula (1-j) and formula (1-k), more preferably a group represented by any of the formula (1-d) and the formula (1-i).

The host compound of the fourth embodiment is a compound represented by the formula (1), in which at least one of $R^1$ to $R^3$ is a heteroaryl as the first substituent, and at least one of $R^4$ to $R^{11}$ is an aryl as the first substituent. At least one hydrogen in the heteroaryl as the first substituent may be substituted with an aryl, a heteroaryl, an alkyl or a cycloalkyl as the second substituent, and at least one hydrogen in the aryl as the first substituent may be substituted with an aryl, a heteroaryl, an alkyl or a cycloalkyl as the second substituent.

Specific examples of the host compound of the fourth embodiment include a compound (BO2-0220/0510S) and a compound (BO2-0220/05115) to be mentioned hereinunder.

In the host compound of the fourth embodiment, at least one of $R^1$ to $R^3$ is preferably a group represented by any of the above-mentioned formula (1-a), formula (1-b), formula (1-c), formula (1-d), formula (1-1), formula (1-m) and formula (1-n), and at least one of $R^4$ to $R^{11}$ is a group represented by any of the above-mentioned formula (1-f), formula (1-i), formula (1-j) and formula (1-k).

At least one hydrogen in the compound represented by the formula (1) may be substituted with a cyano, a halogen or a deuterium, in addition to the above-mentioned substituents. The halogen includes a fluorine, a chlorine, a bromine and an iodine, and is preferably a fluorine, a chlorine or a bromine, more preferably a fluorine.

The compound represented by the formula (1) for use as the host compound is, for example, preferably a compound represented by any of the following formulae. In the formulae, any hydrogen may be substituted with an alkyl having a carbon number of 1 to 4 (for example, methyl or t-butyl). However, in the present invention, the compound represented by the formula (1) for use as the host compound should not be limitatively interpreted by these examples. In the following formulae, Me represents a methyl, and t-Bu represents a t-butyl.

(BO2-0264/0511S)

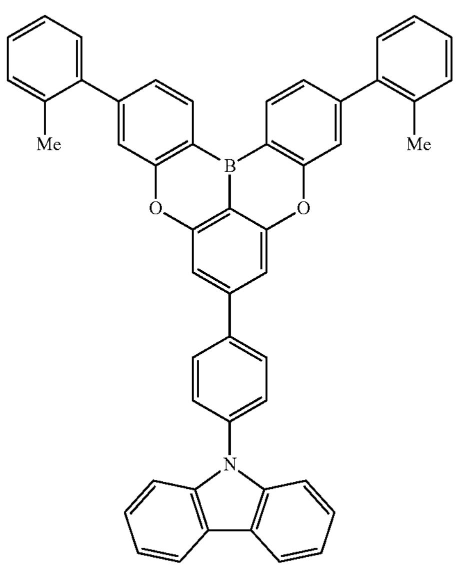

-continued (BO2-0231)

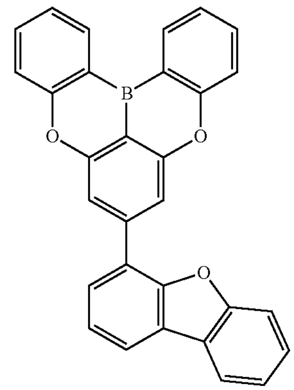

(BO2-0431)

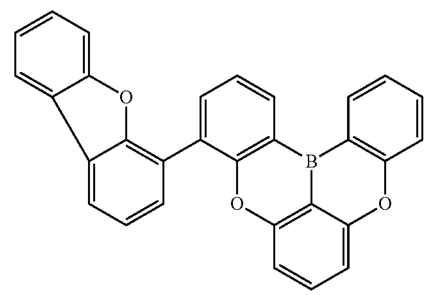

(BO2-0520S)

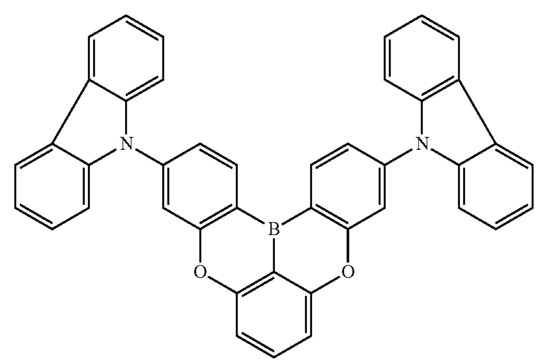

(BO2-0110)

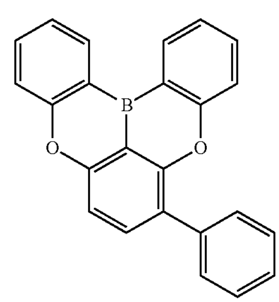

-continued
(BO2-0111)
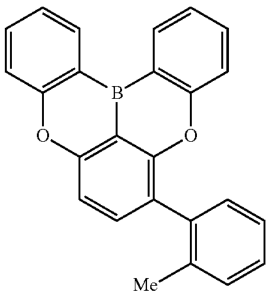
(BO2-0112)
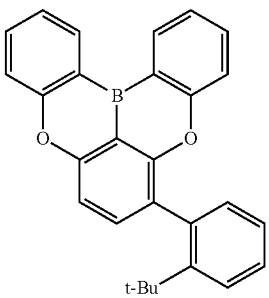
(BO2-0113)
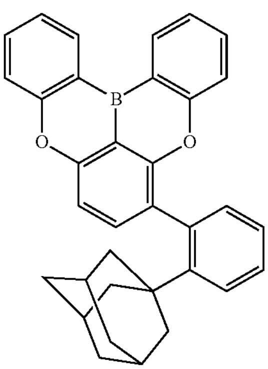
(BO2-0114)
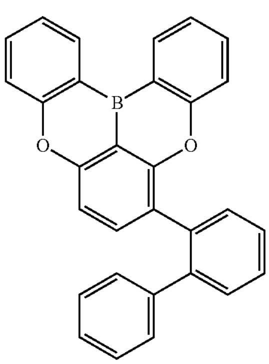
(BO2-0110-1)
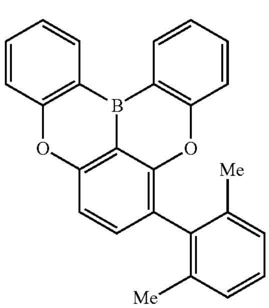
-continued
(BO2-0110-2)
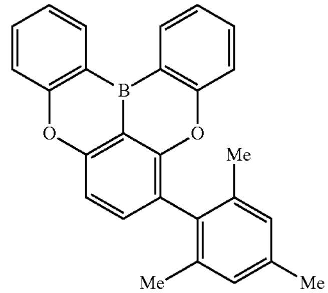
(BO2-0120)
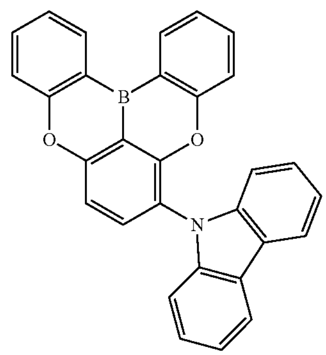
(BO2-0121)
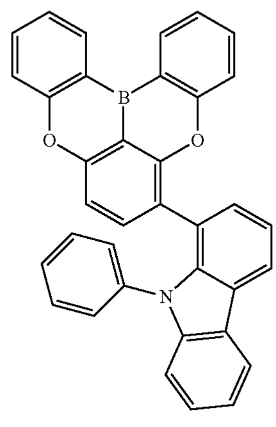
(BO2-0122)
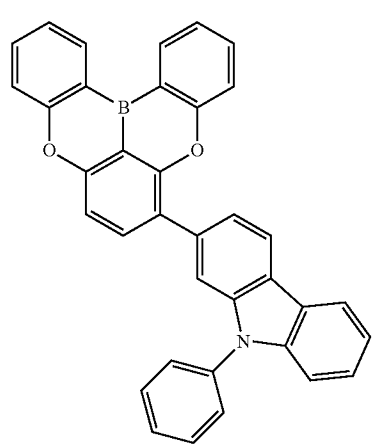

-continued
(BO2-0123)
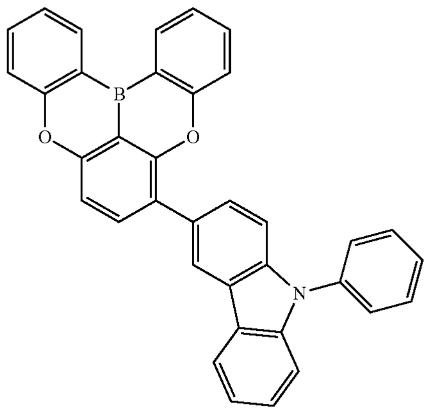
(BO2-0124)
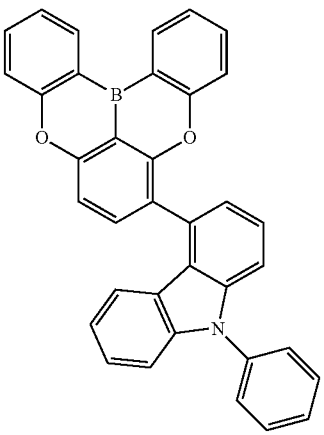
(BO2-0131)
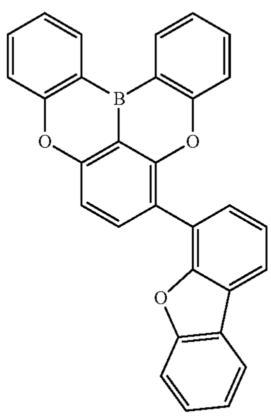
(BO2-0132)
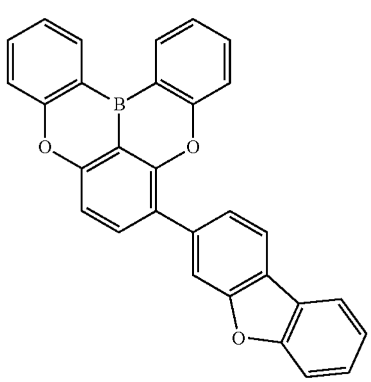
-continued
(BO2-0133)
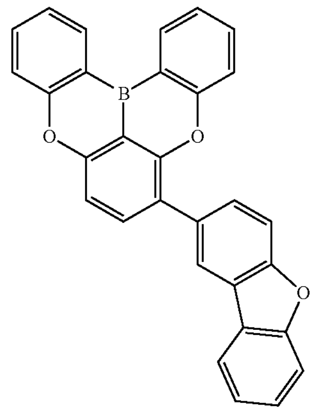
(BO2-0134)
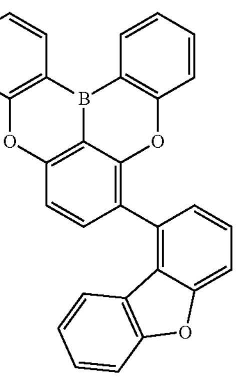
(BO2-0140)
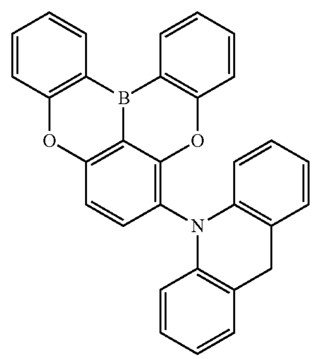
(BO2-0141)
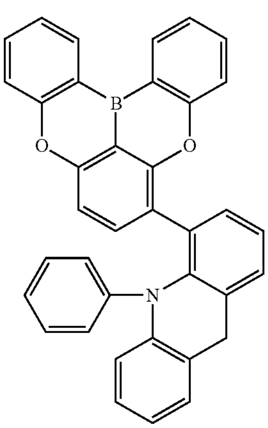

-continued
(BO2-0142)
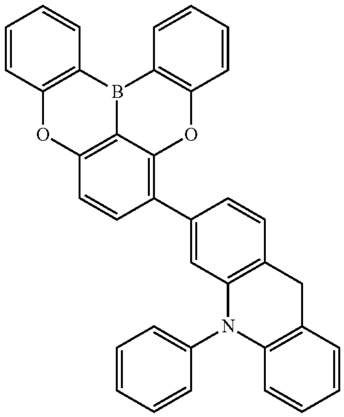
(BO2-0143)
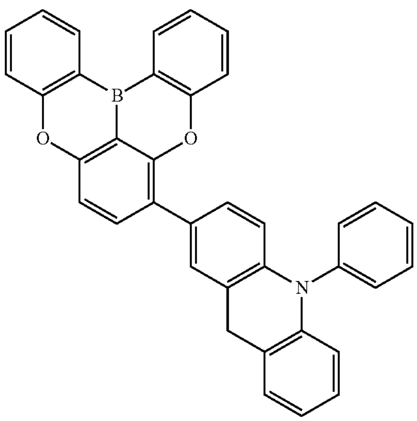
(BO2-0144)
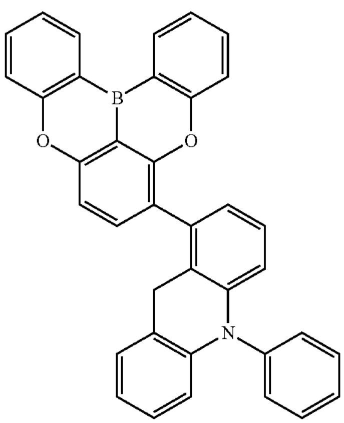
(BO2-0150)
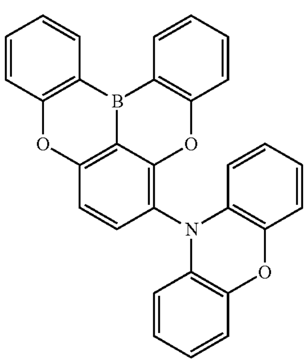
-continued
(BO2-0151)
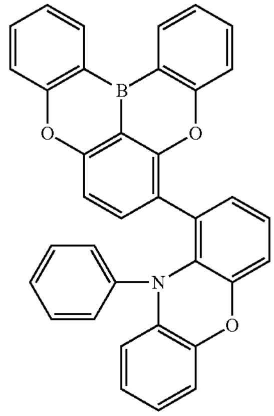
(BO2-0152)
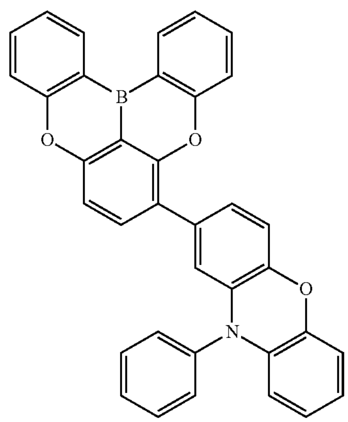
(BO2-0153)
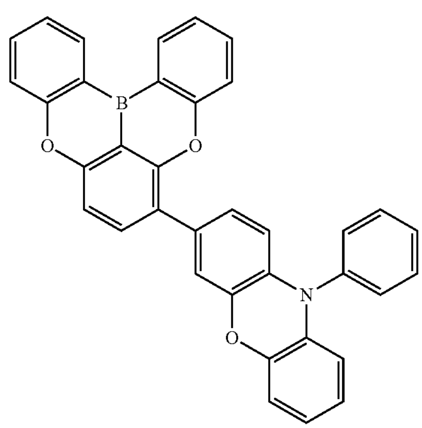

(BO2-0154)
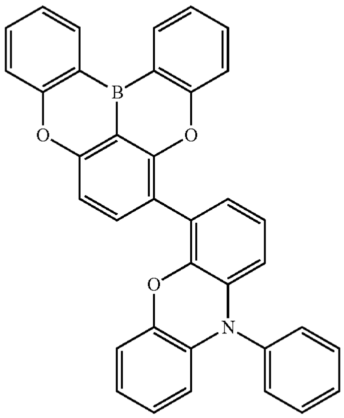
(BO2-0162)
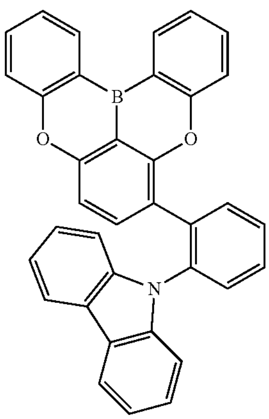
(BO2-0163)
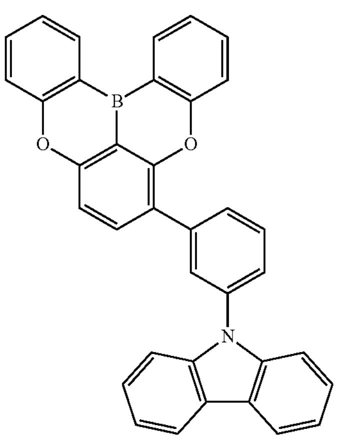
(BO2-0144)
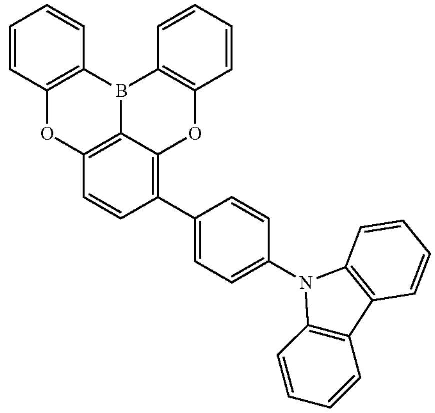
(BO2-0170)
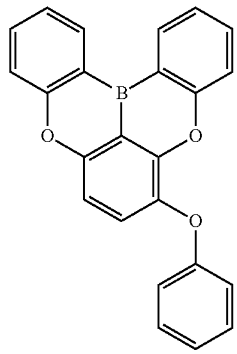
(BO2-0171)
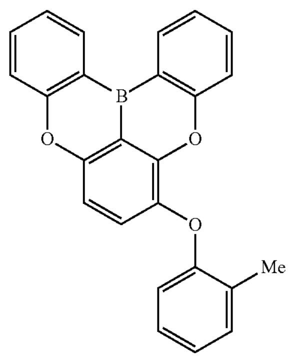
(BO2-0175)
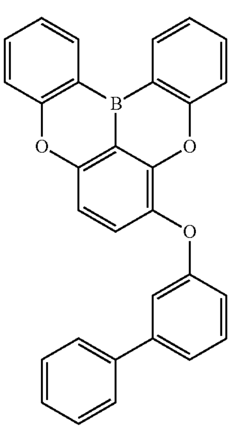

-continued
(BO2-0176)
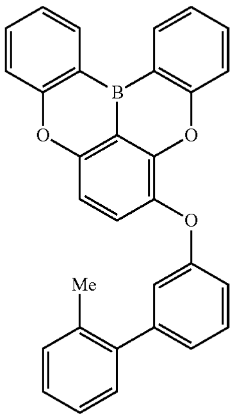
(BO2-0180)
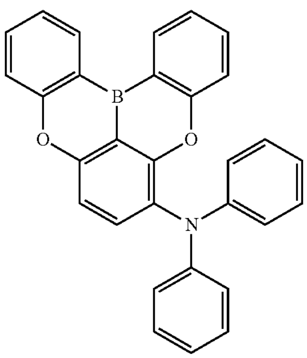
(BO2-0210)
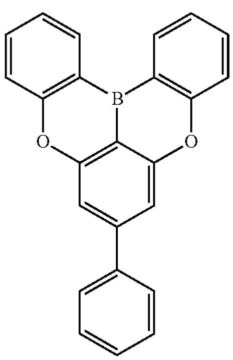
(BO2-0211)
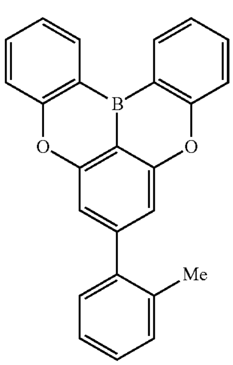
-continued
(BO2-0212)
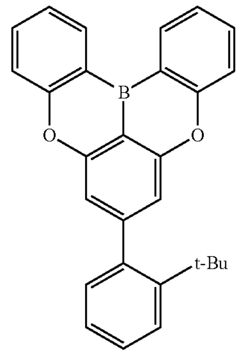
(BO2-0213)
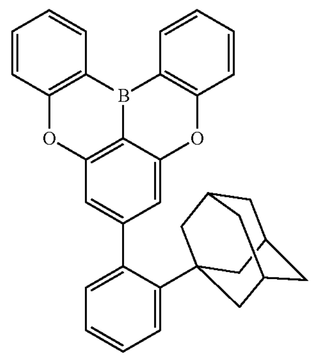
(BO2-0214)
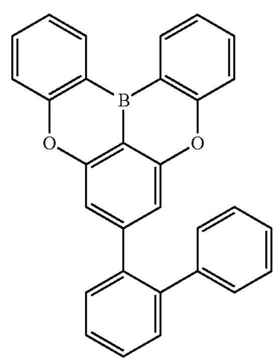
(BO2-0210-1)
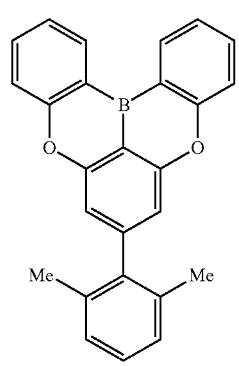

-continued
(BO2-0210-2)
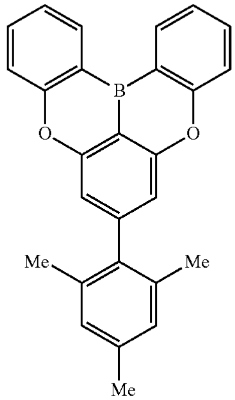
(BO2-0220)
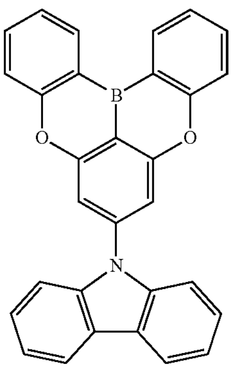
(BO2-0221)
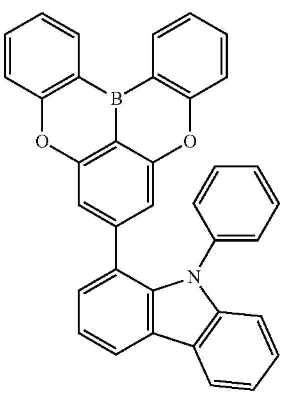
(BO2-0222)
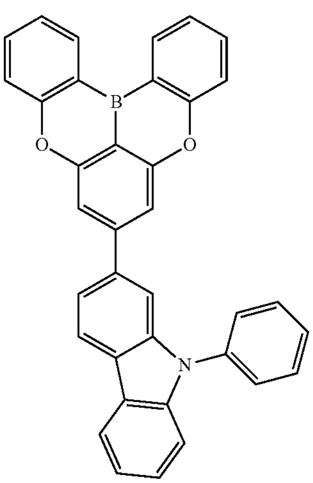
-continued
(BO2-0223)
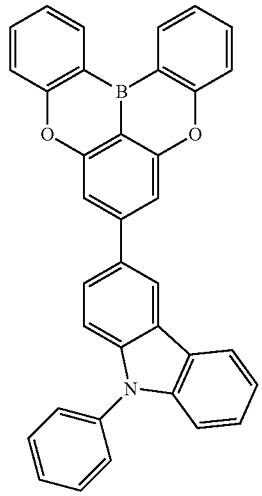
(BO2-0224)
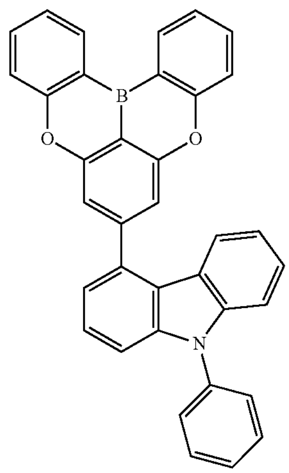
(BO2-0220-1)
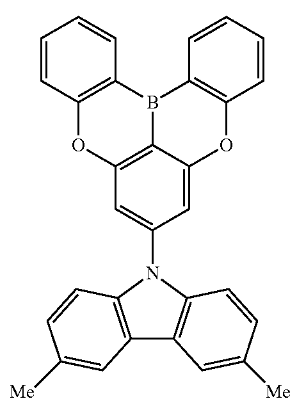

-continued
(BO2-0220-2)
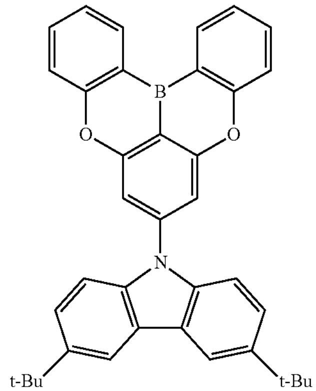
(BO2-0220-3)
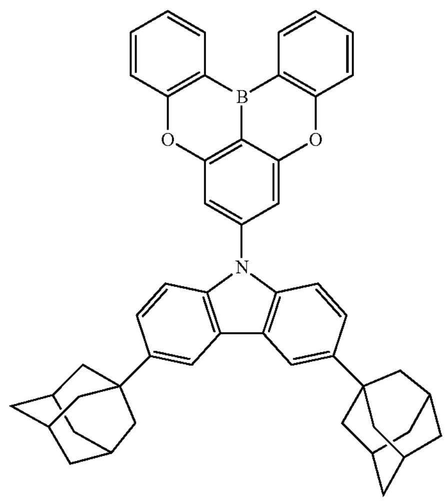
(BO2-0220-4)
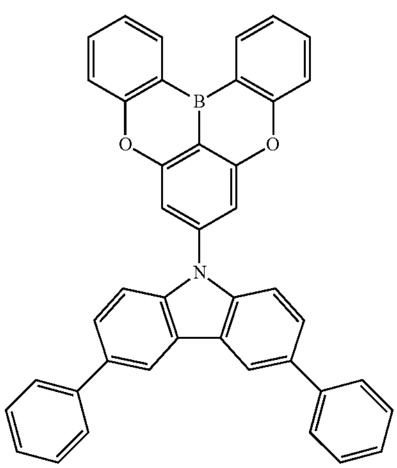
-continued
(BO2-0220-5)
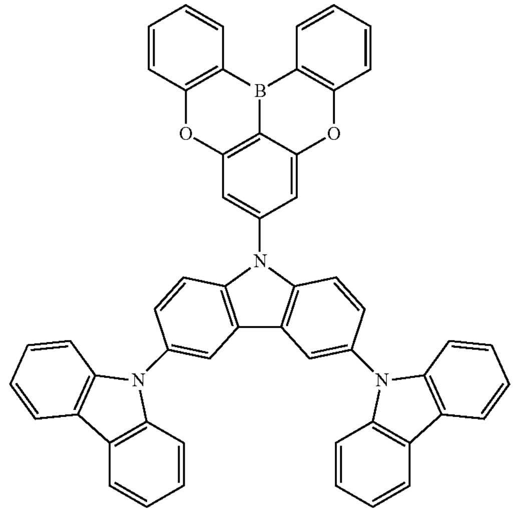
(BO2-0231)
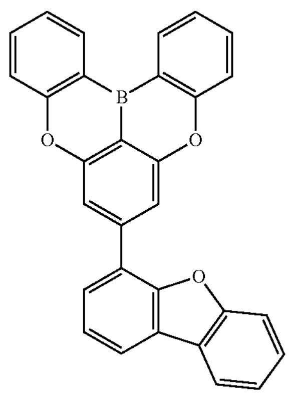
(BO2-0232)
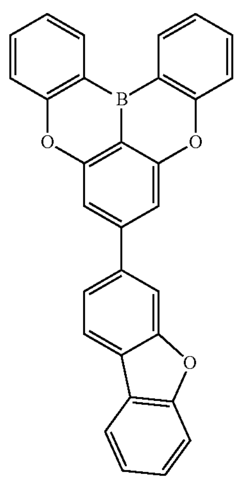

-continued
(BO2-0233)
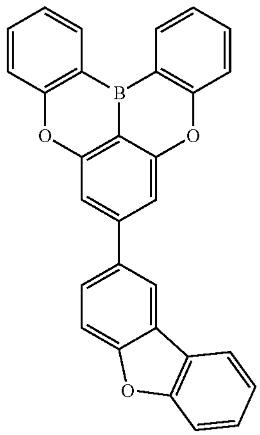
(BO2-0234)
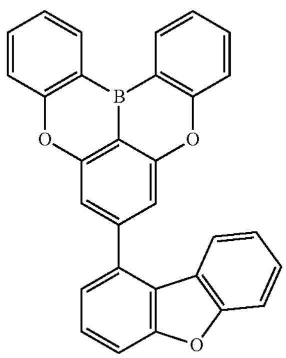
(BO2-0240)
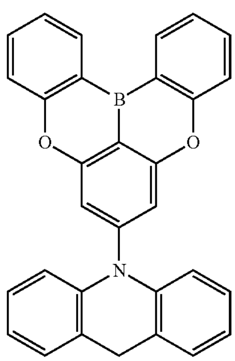
(BO2-0241)
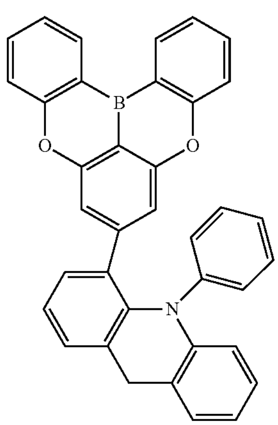
-continued
(BO2-0242)
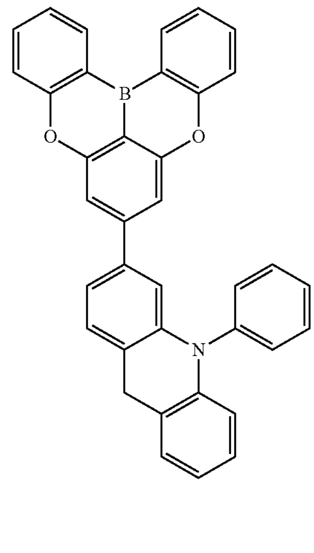
(BO2-0243)
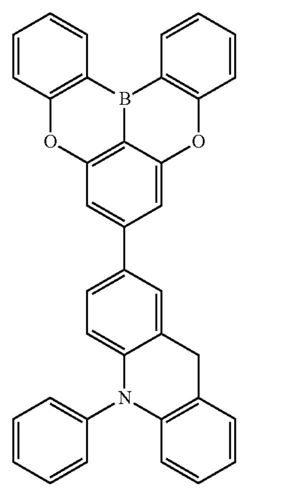
(BO2-0244)
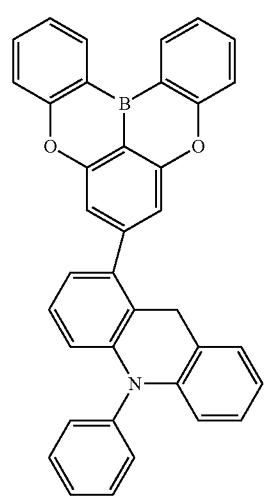

(BO2-0250)
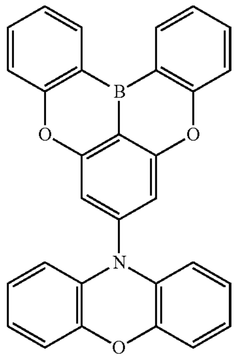
(BO2-0251)
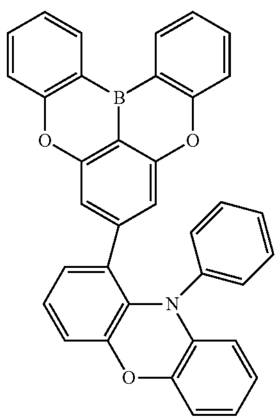
(BO2-0252)
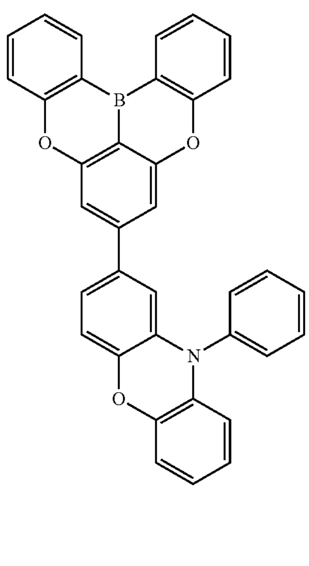
(BO2-0253)
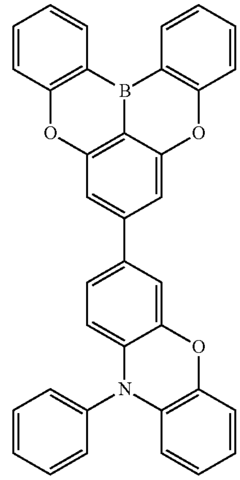
(BO2-0254)
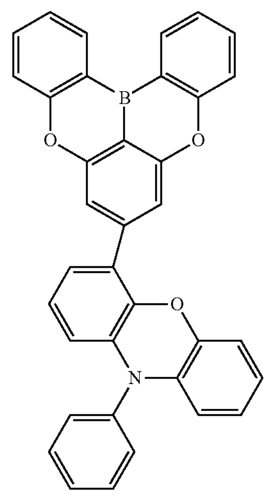
(BO2-0262)
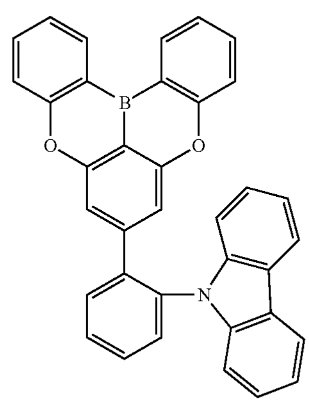

-continued
(BO2-0263)
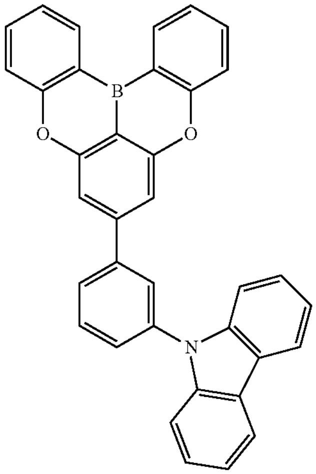
(BO2-0264)
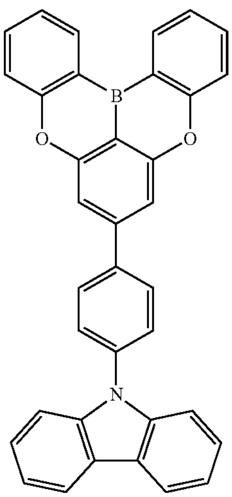
(BO2-0264-1)
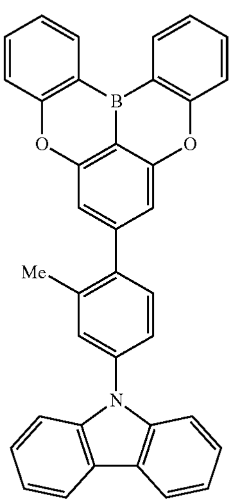
-continued
(BO2-0264-2)
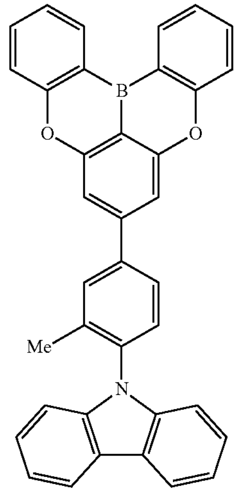
(BO2-0270)
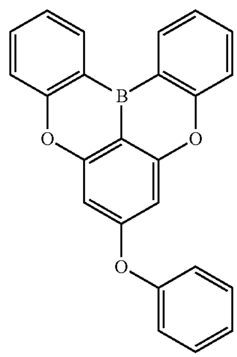
(BO2-0271)
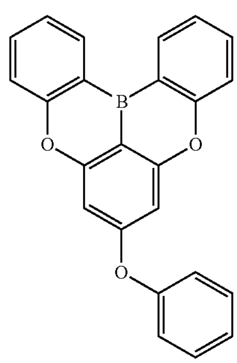

-continued
(BO2-0275)
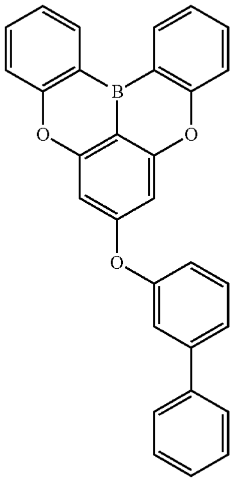
(BO2-0276)
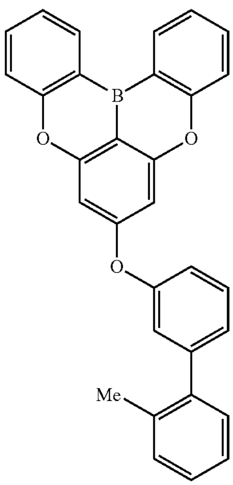
(BO2-0280)
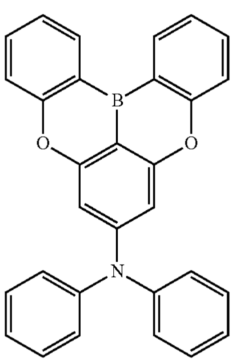
(BO2-0410)
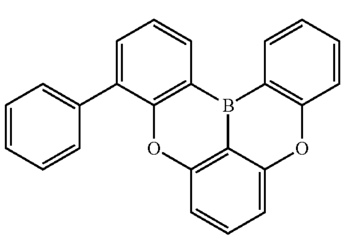
-continued
(BO2-0411)
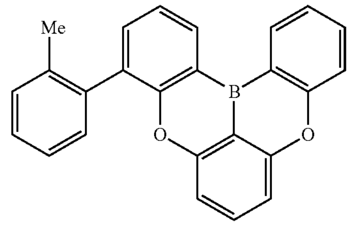
(BO2-0412)
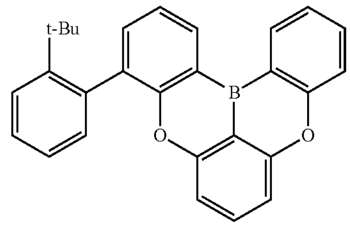
(BO2-0413)
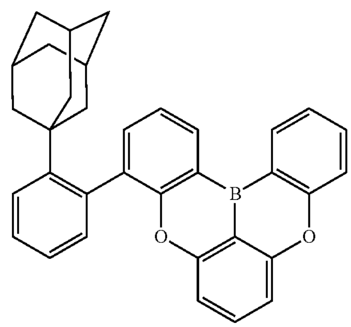
(BO2-0414)
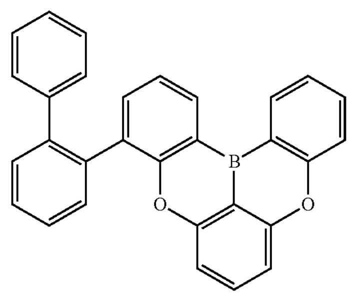
(BO2-0420)
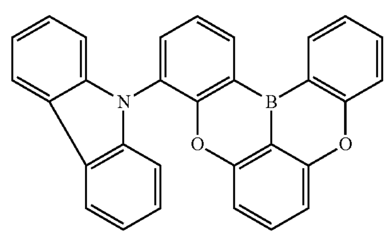
(BO2-0421)
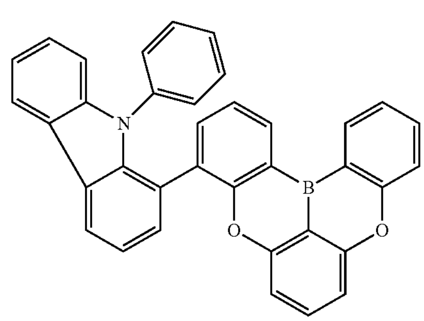

-continued
(BO2-0422)
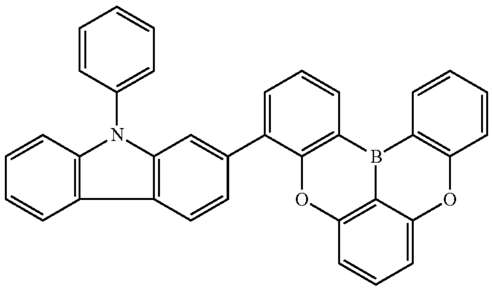
(BO2-0423)
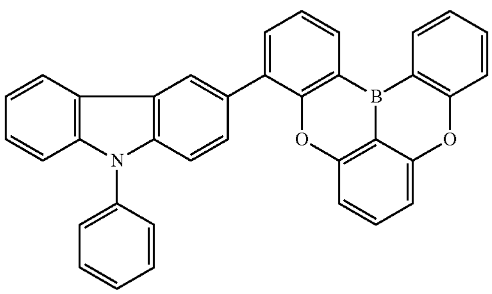
(BO2-0424)
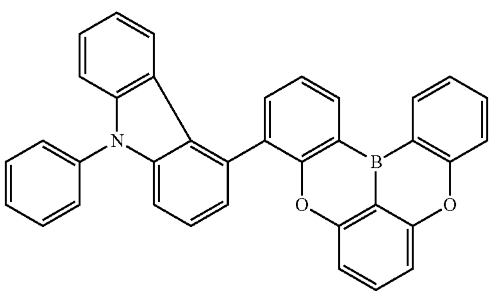
(BO2-0431)
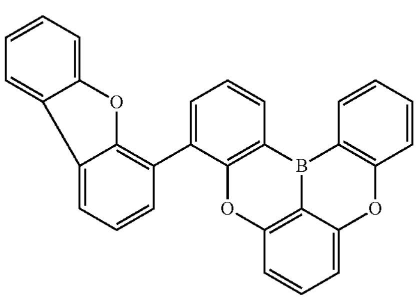
(BO2-0432)
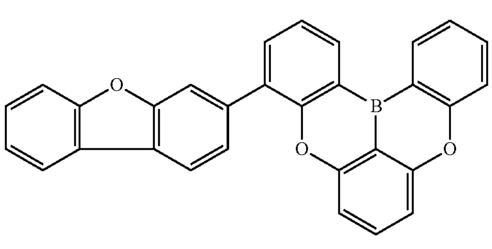
-continued
(BO2-0433)
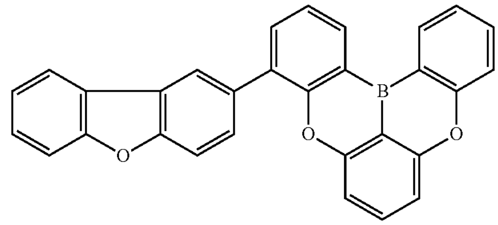
(BO2-0434)
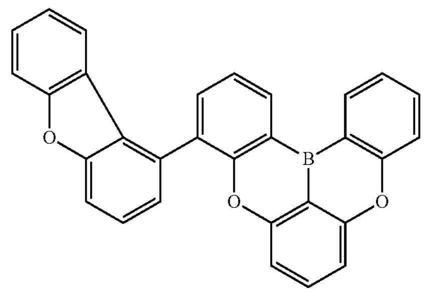
(BO2-0440)
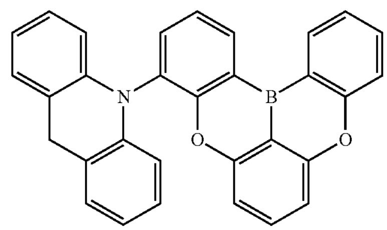
(BO2-0441)
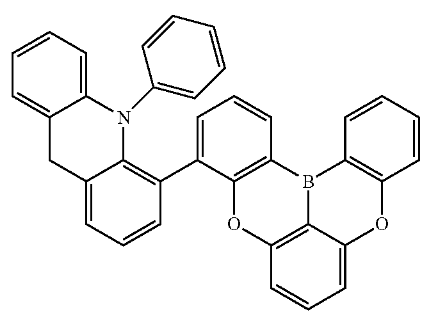
(BO2-0442)
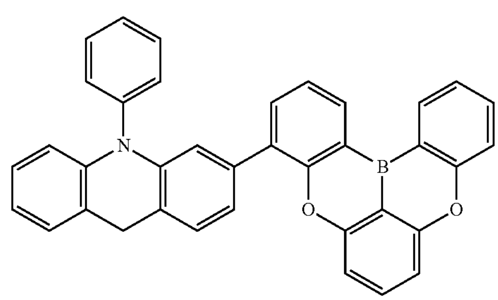

(BO2-0443)
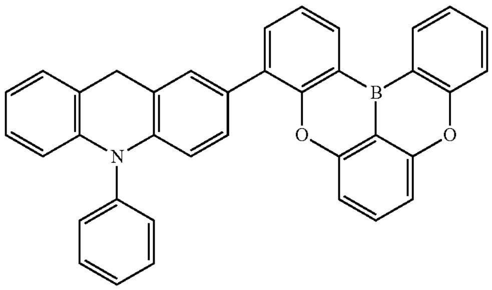
(BO2-0444)
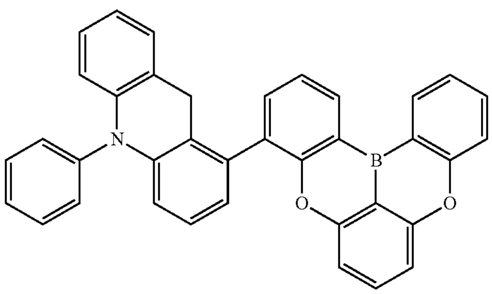
(BO2-0450)
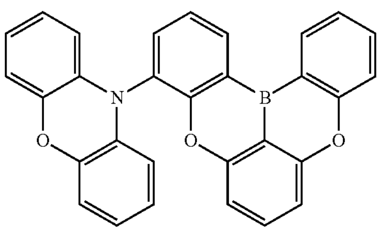
(BO2-0451)
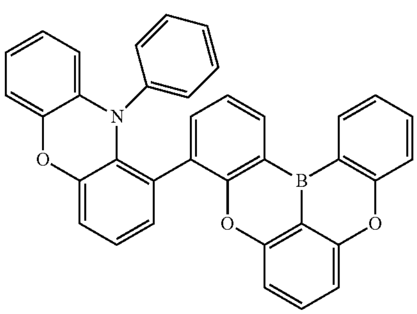
(BO2-0452)
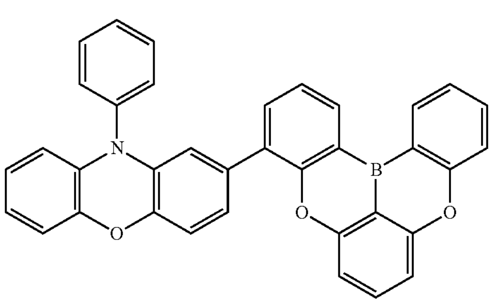
(BO2-0453)
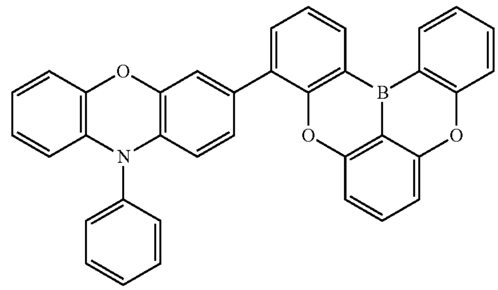
(BO2-0454)
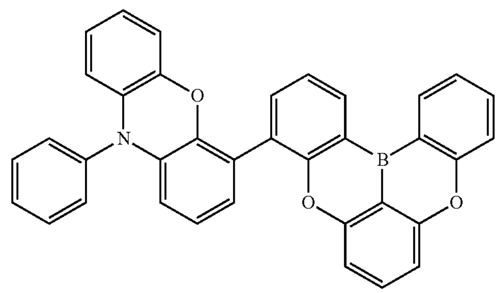
(BO2-0462)
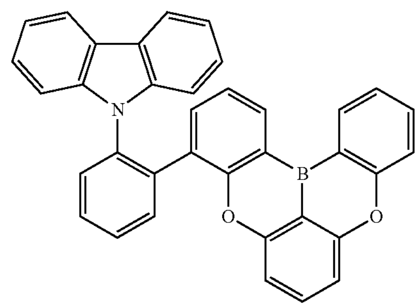
(BO2-0463)
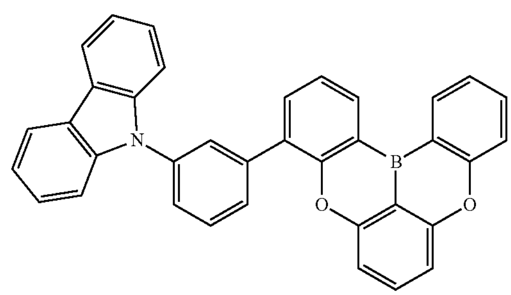
(BO2-0464)
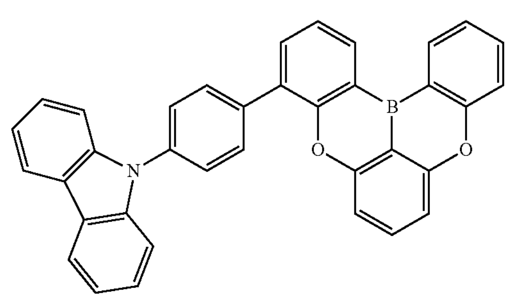

(BO2-0470)
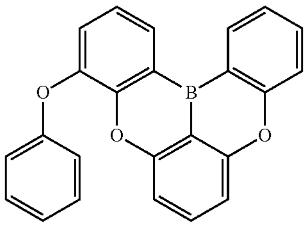
(BO2-0471)
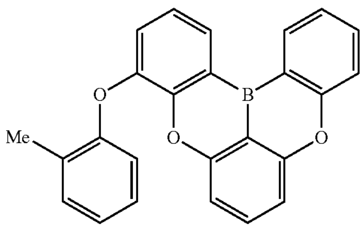
(BO2-0475)
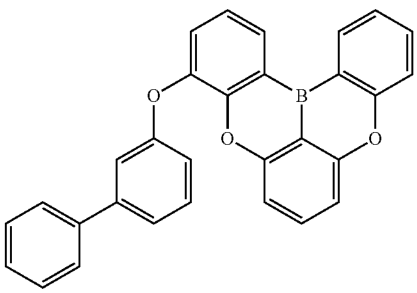
(BO2-0476)
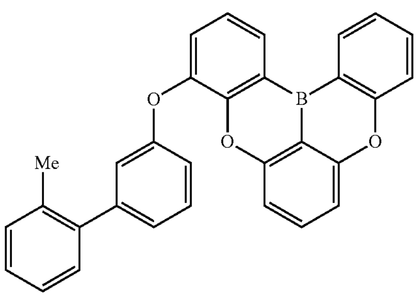
(BO2-0480)
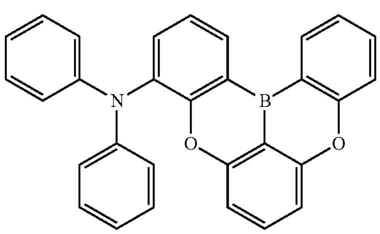
(BO2-0510)
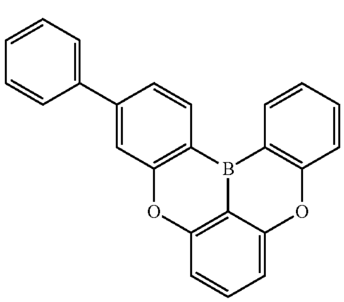
(BO2-0511)
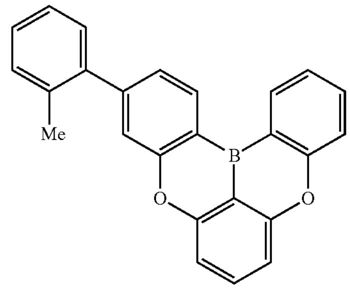
(BO2-0512)
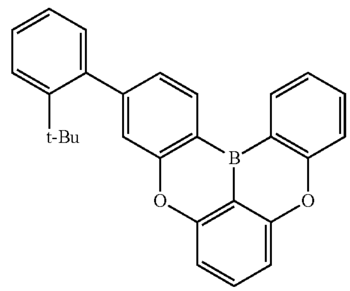
(BO2-0513)
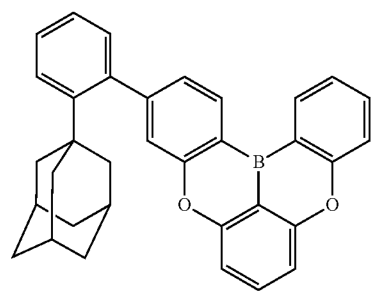
(BO2-0514)
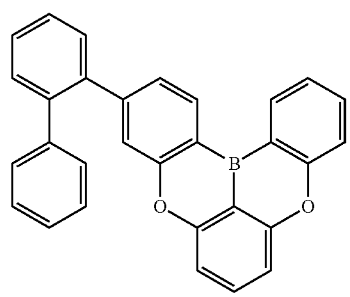
(BO2-0520)
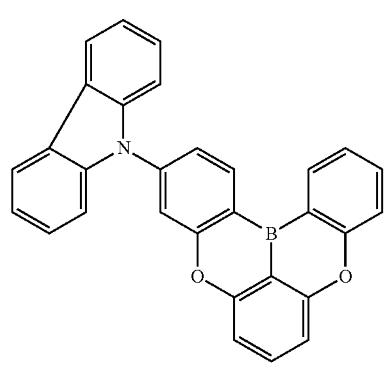

-continued
(BO2-0521)
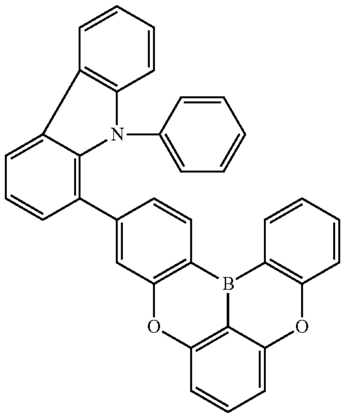
(BO2-0522)
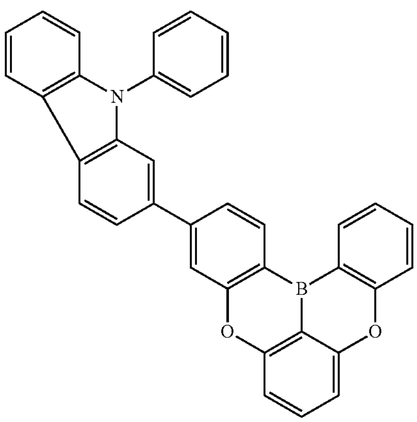
(BO2-0523)
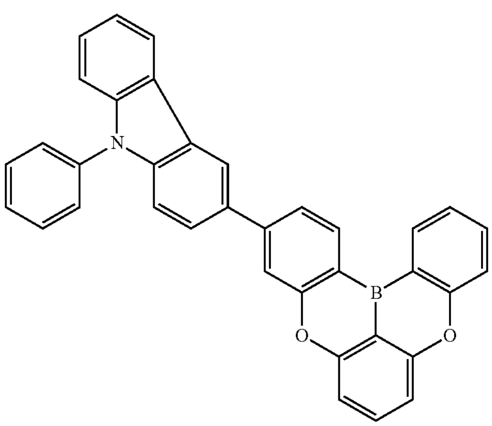
-continued
(BO2-0524)
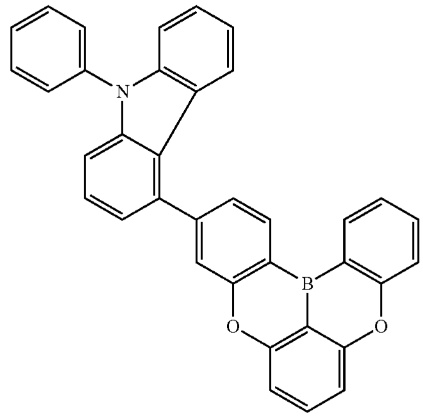
(BO2-0531)
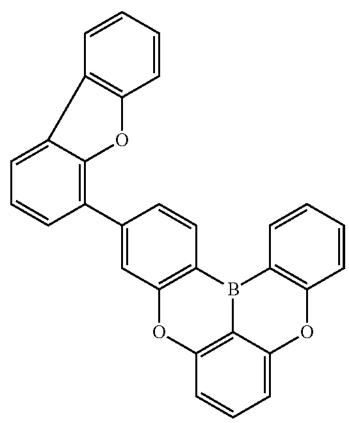
(BO2-0532)
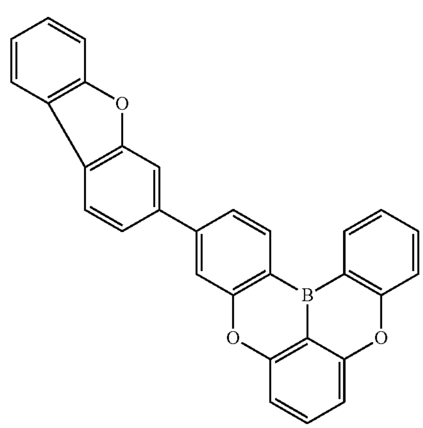

-continued
(BO2-0533)
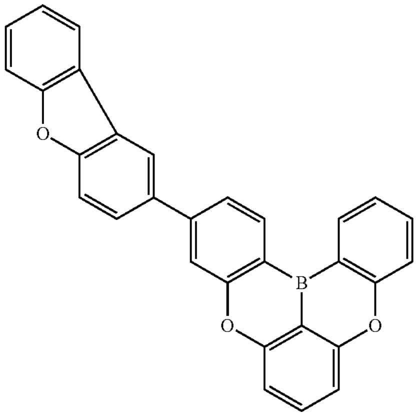
(BO2-0534)
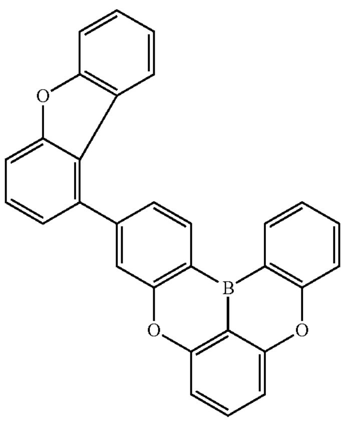
(BO2-0540)
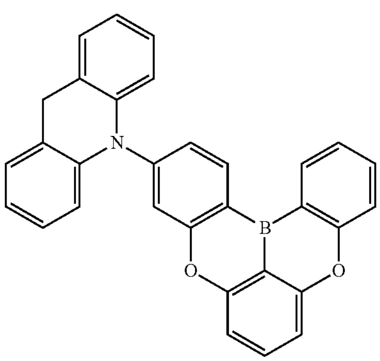
(BO2-0541)
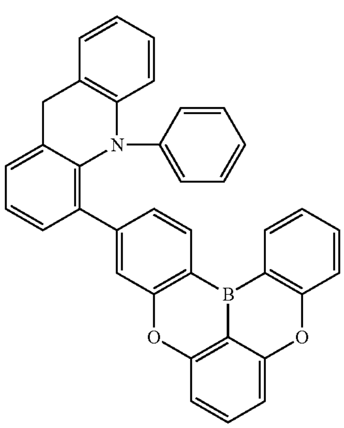
-continued
(BO2-0542)
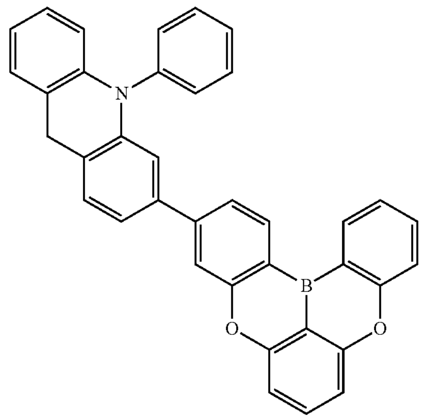
(BO2-0543)
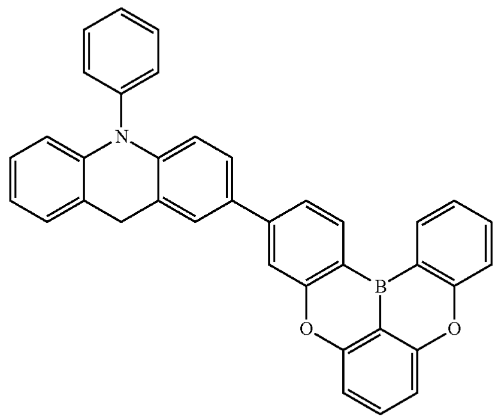
(BO2-0544)
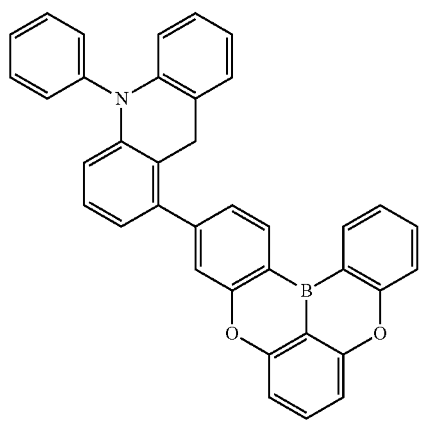
(BO2-0550)
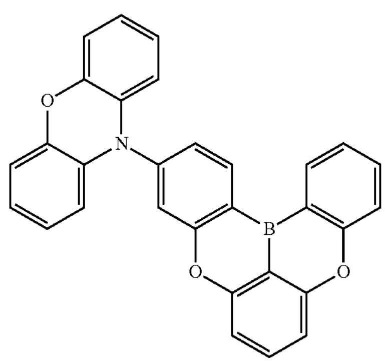

(BO2-0551)
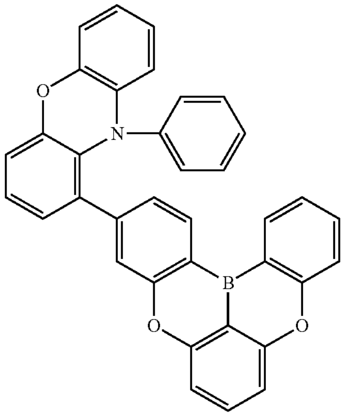
(BO2-0552)
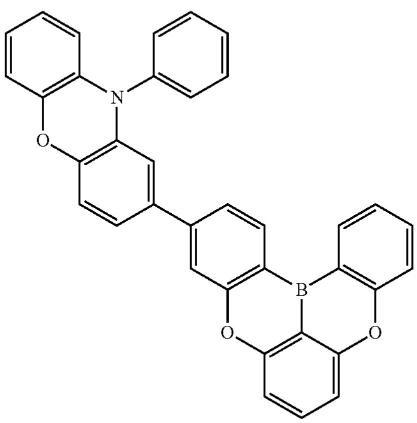
(BO2-0553)
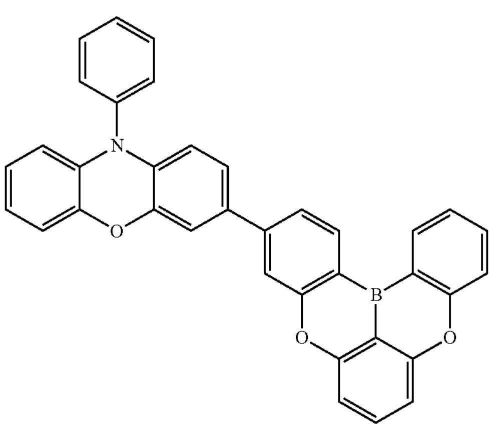
(BO2-0554)
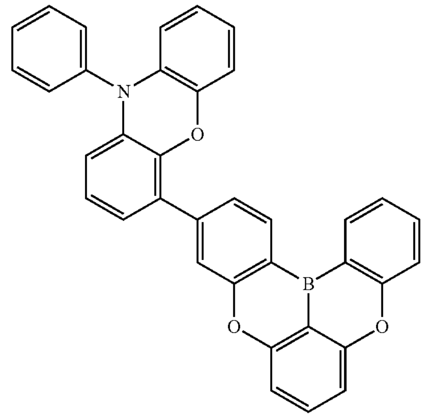
(BO2-0562)
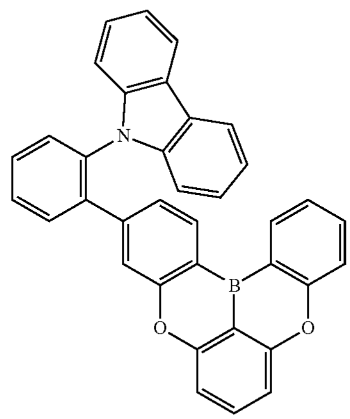
(BO2-0563)
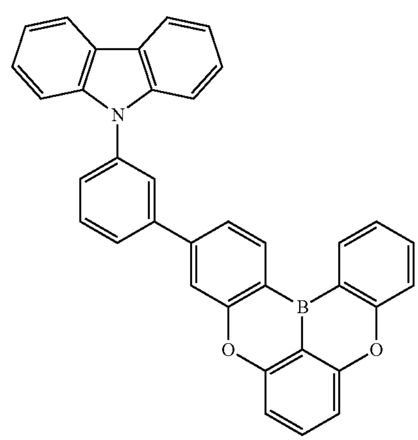

-continued
(BO2-0564)
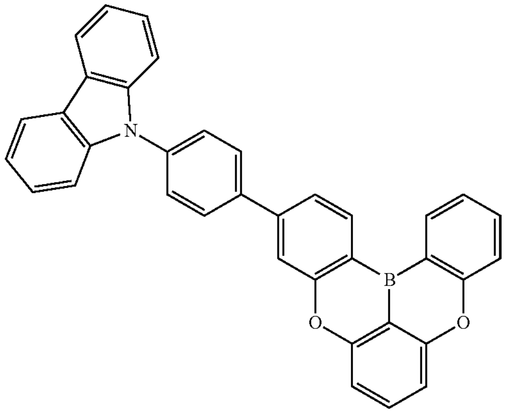
(BO2-0570)
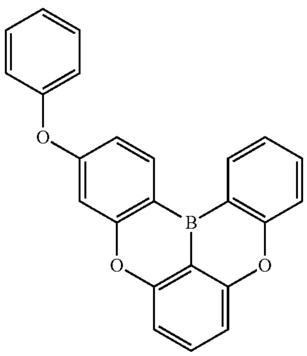
(BO2-0571)
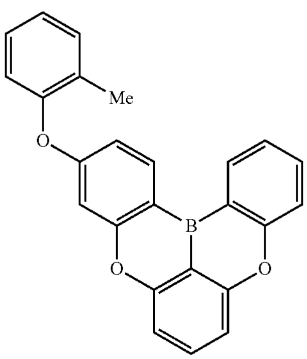
(BO2-0575)
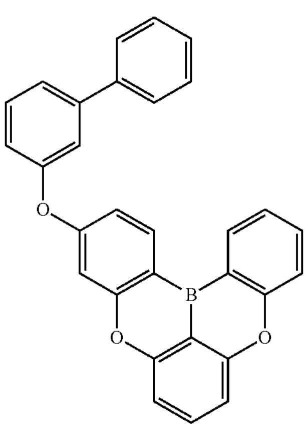
-continued
(BO2-0576)
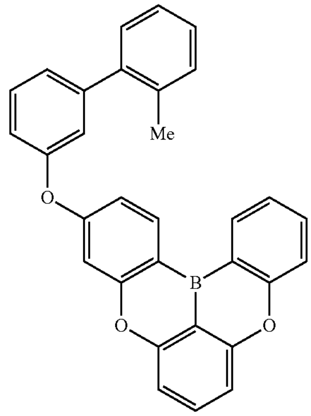
(BO2-0580)
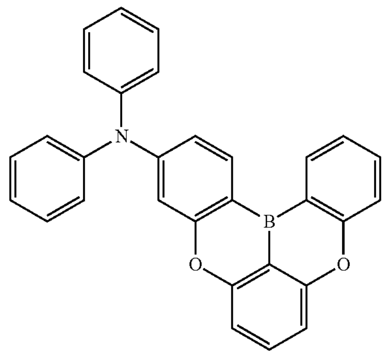
(BO2-0610)
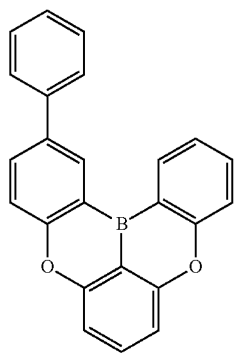
(BO2-0611)
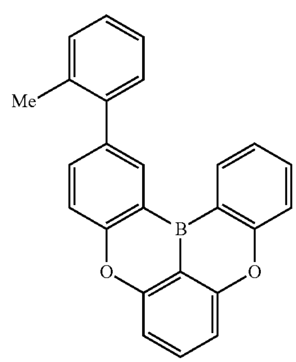

-continued
(BO2-0612)
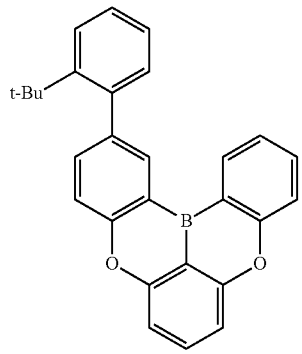
(BO2-0613)
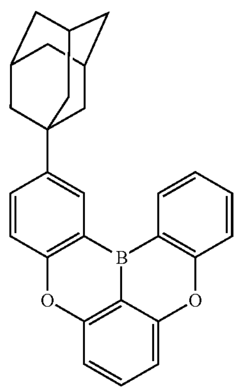
(BO2-0614)
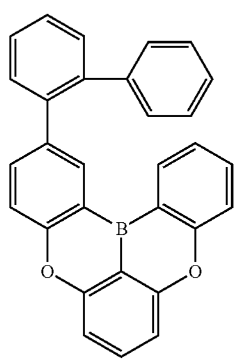
(BO2-0620)
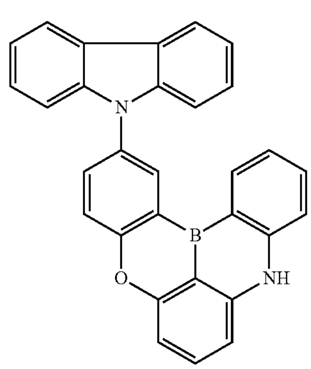
-continued
(BO2-0621)
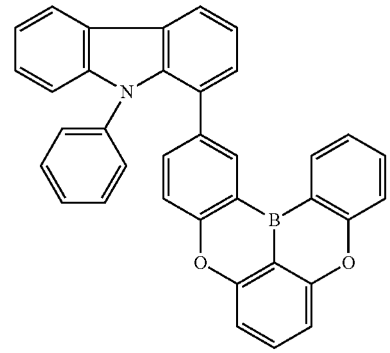
(BO2-0622)
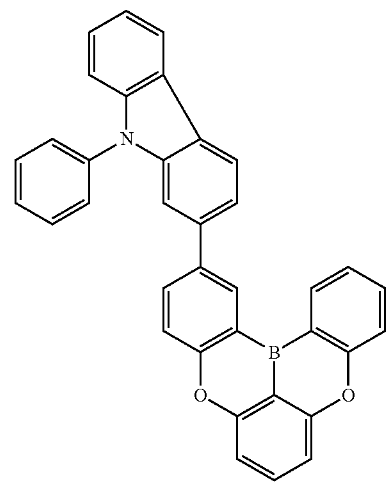
(BO2-0623)
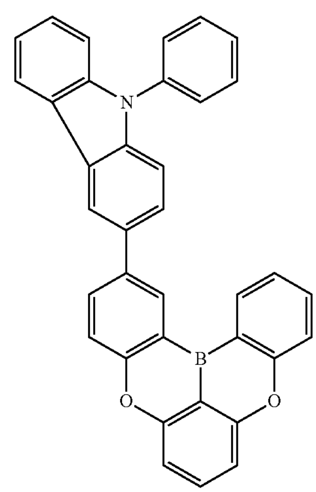

-continued
(BO2-0624)
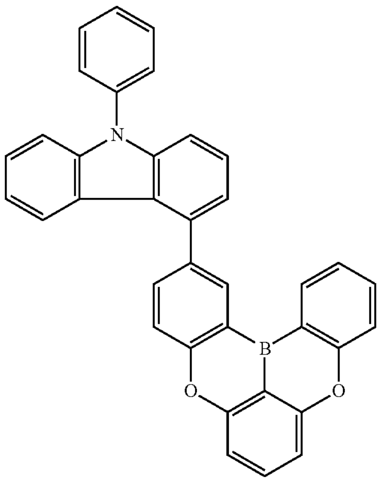
(BO2-0631)
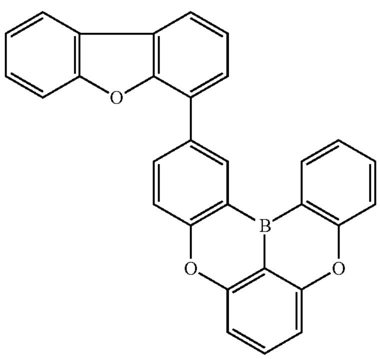
(BO2-0632)
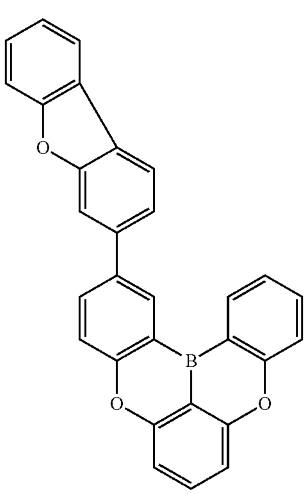
-continued
(BO2-0633)
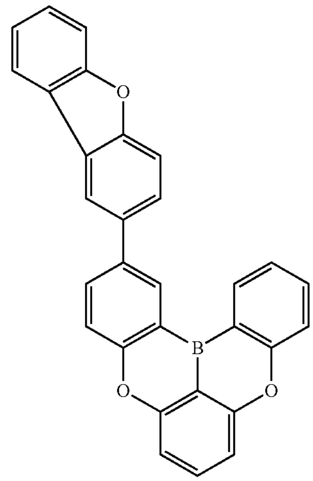
(BO2-0634)
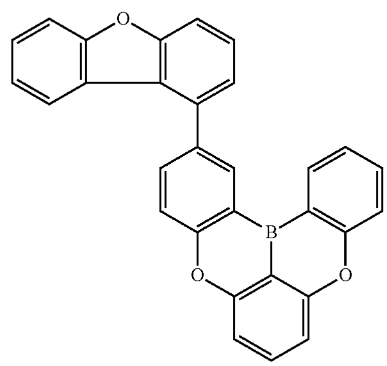
(BO2-0640)
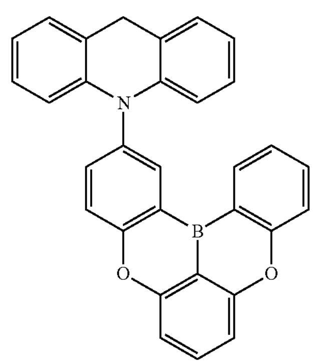
(BO2-0641)
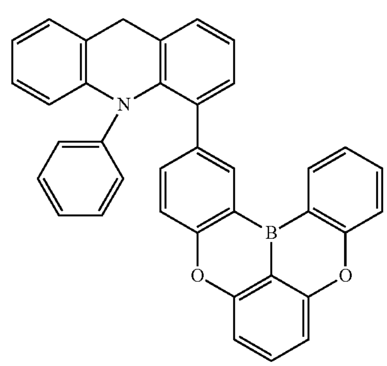

-continued
(BO2-0642)
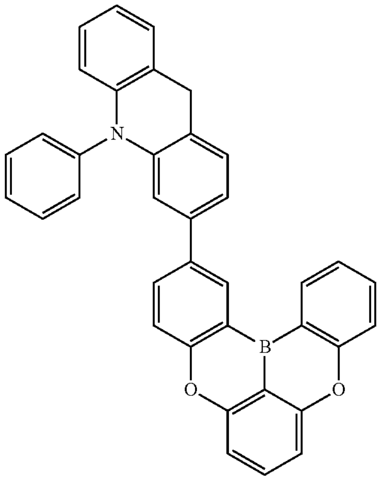
(BO2-0643)
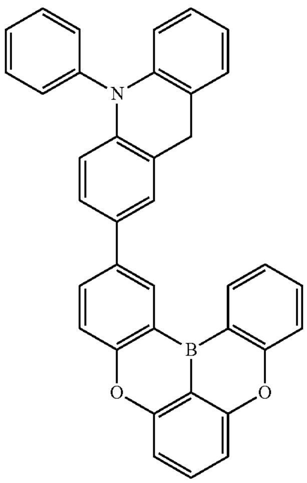
(BO2-0644)
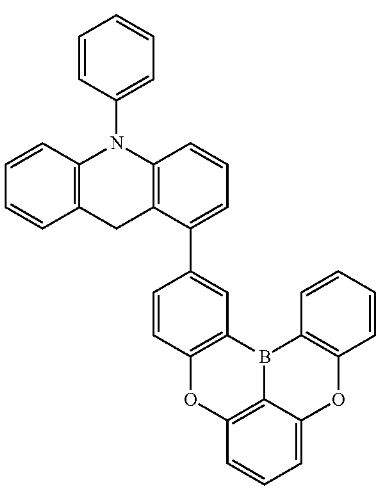
-continued
(BO2-0650)
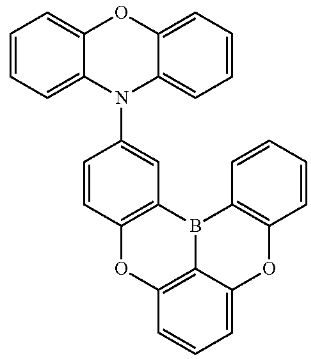
(BO2-0651)
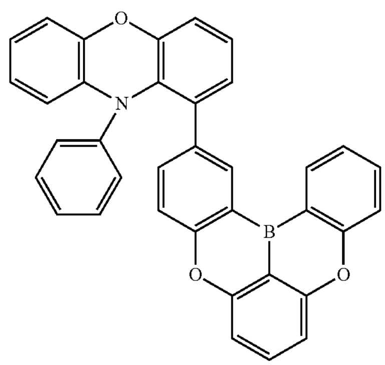
(BO2-0652)
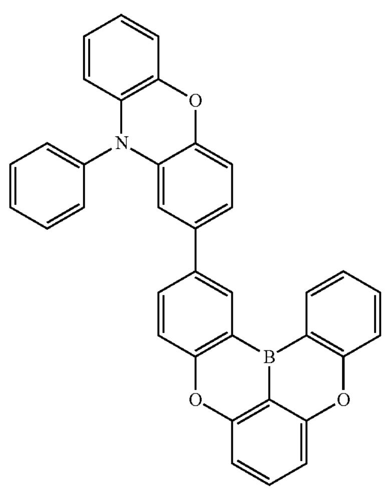

(BO2-0653)
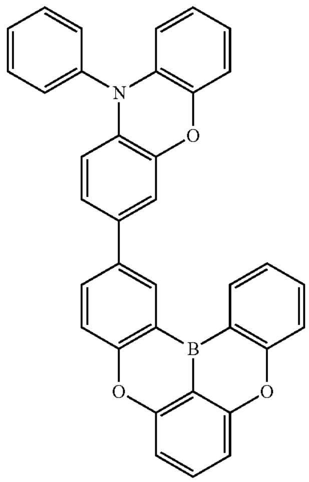
(BO2-0654)
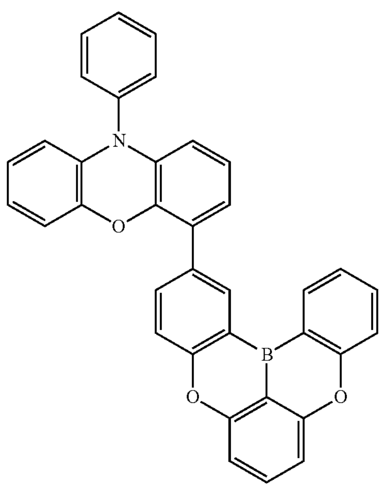
(BO2-0662)
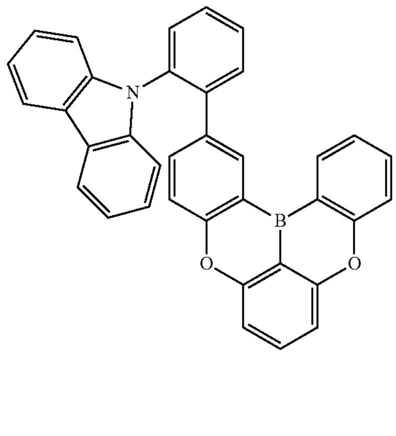
(BO2-0663)
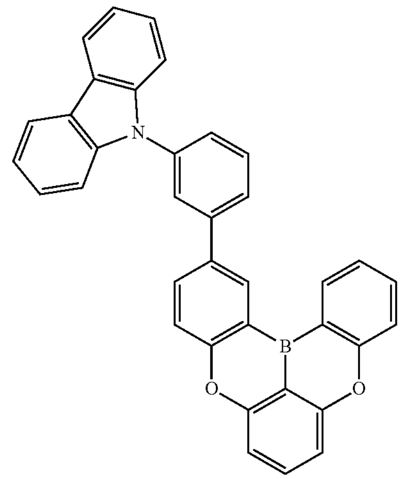
(BO2-0664)
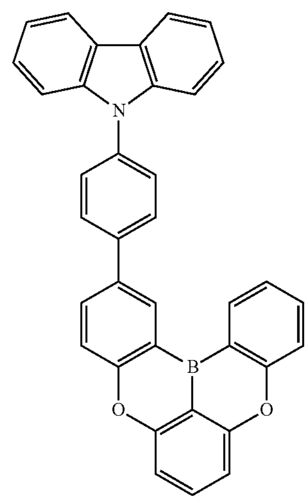
(BO2-0670)
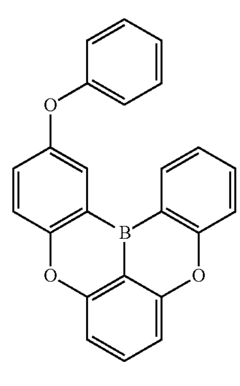

-continued
(BO2-0671)
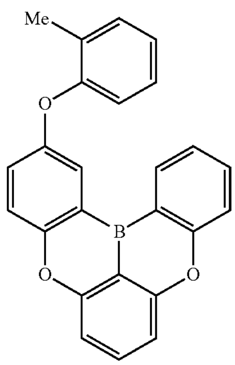
(BO2-0675)
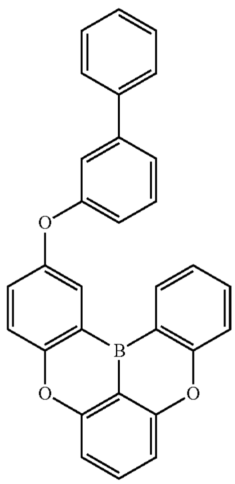
(BO2-0676)
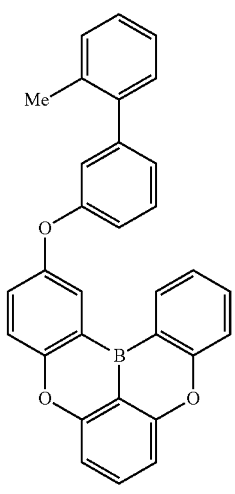
-continued
(BO2-0680)
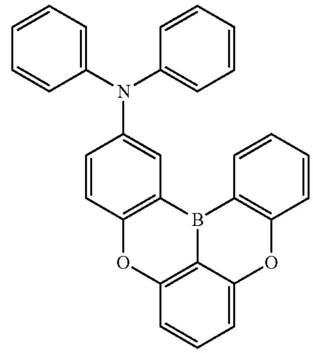
(BO2-0110/0310)=(BO2-0110S)
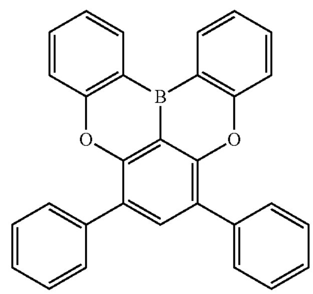
(BO2-0111/0311)=(BO2-0111S)
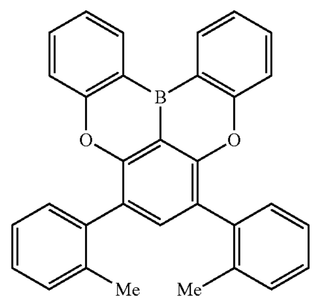
(BO2-0110S/0410S)
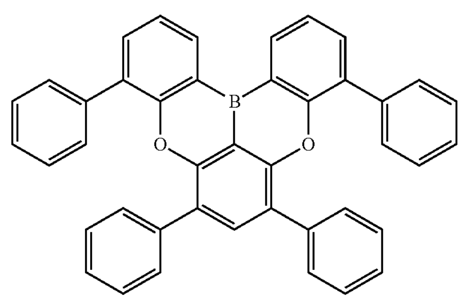
(BO2-0111S/0411S)
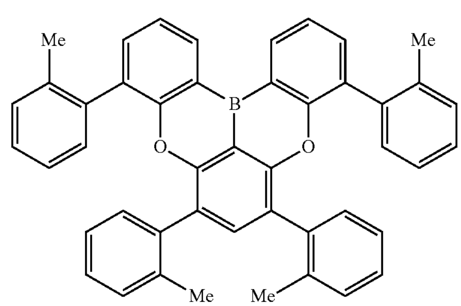

-continued
(BO2-0110S/0510S)
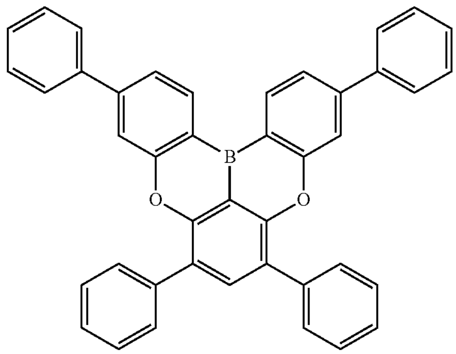
(BO2-0111S/0511S)
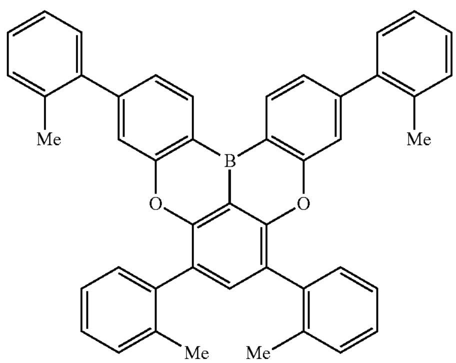
(BO2-0120S)
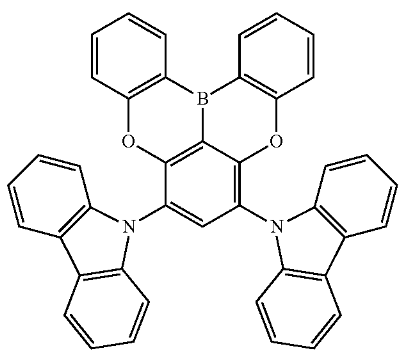
(BO2-0120S/0510S)
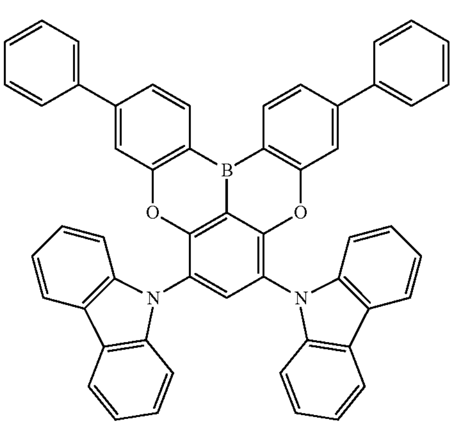
-continued
(BO2-0120S/0511S)
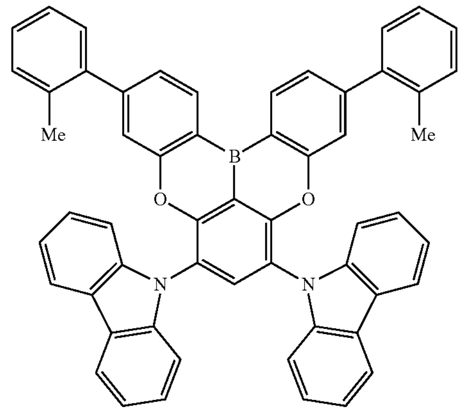
(BO2-0180S)
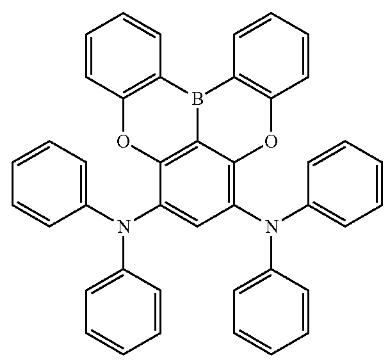
(BO2-0180S/0510S)
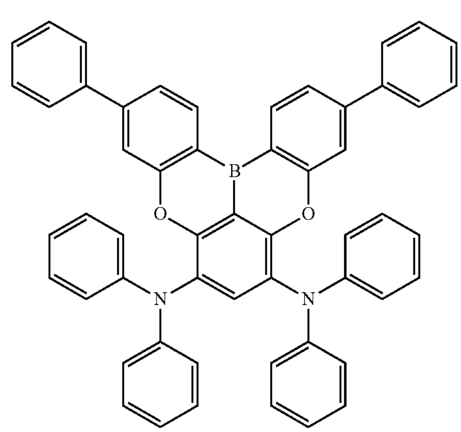

(BO2-0180S/0511S)
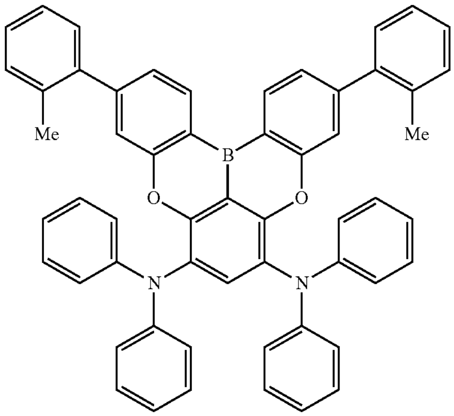
(BO2-0220/0510S)
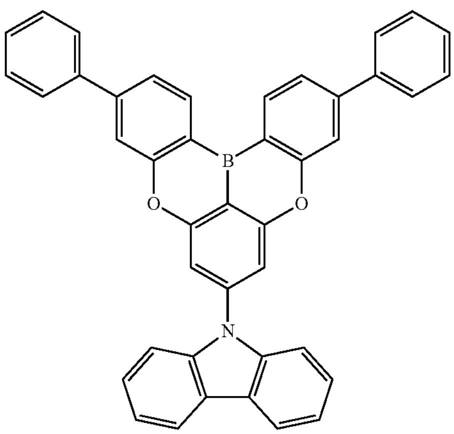
(BO2-0220/0511S)
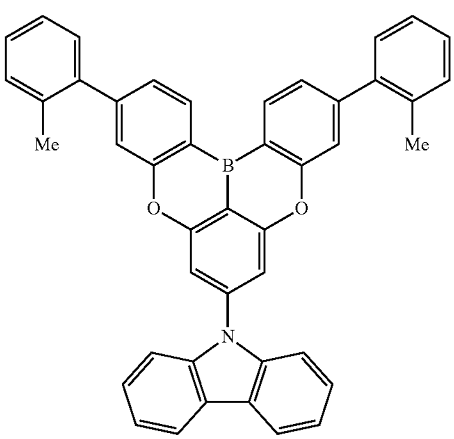
(BO2-0264/0511S)
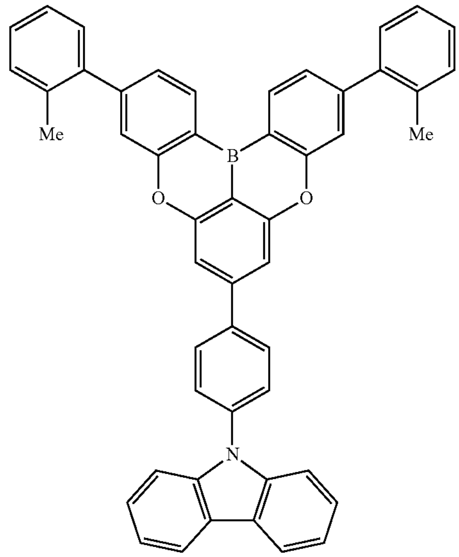
(BO2-0275/0510S)
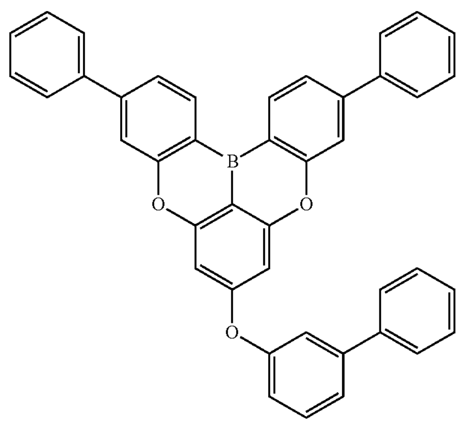
(BO2-0276/0511S)
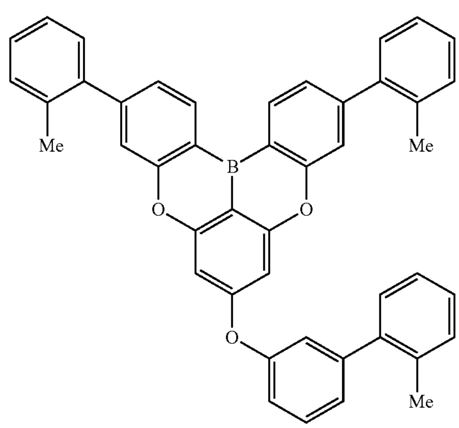

-continued
(BO2-0280/0510S)
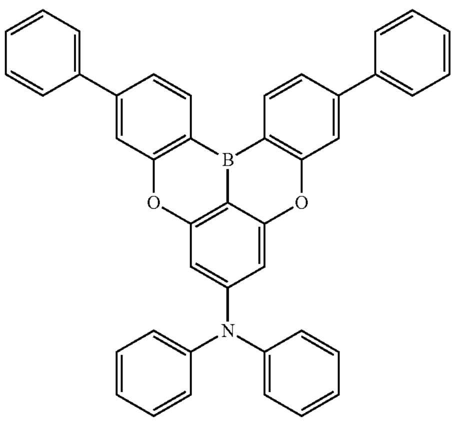
(BO2-0280/0511S)
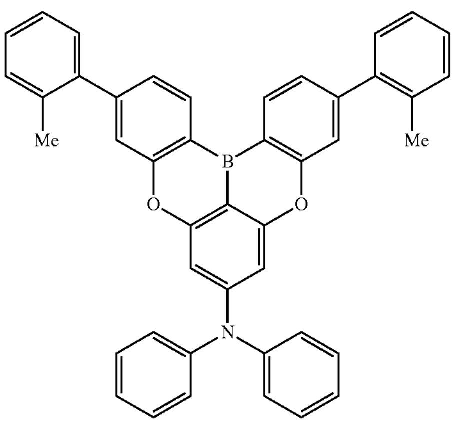
(BO2-0410S)
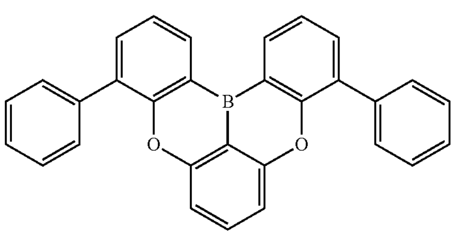
(BO2-0411S)
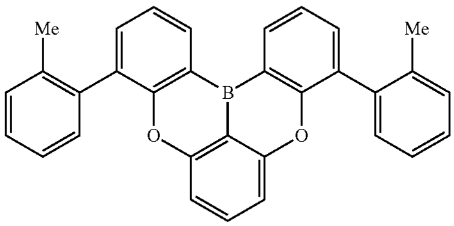
(BO2-0420S)
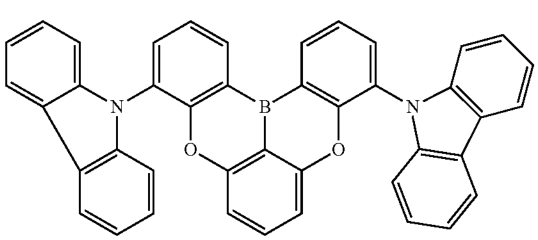
-continued
(BO2-0510S)
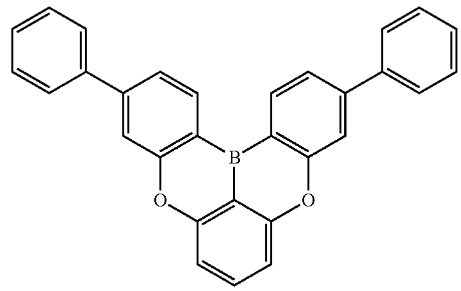
(BO2-0511S)
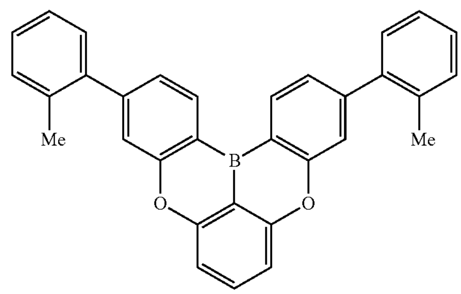
(BO2-0520S)
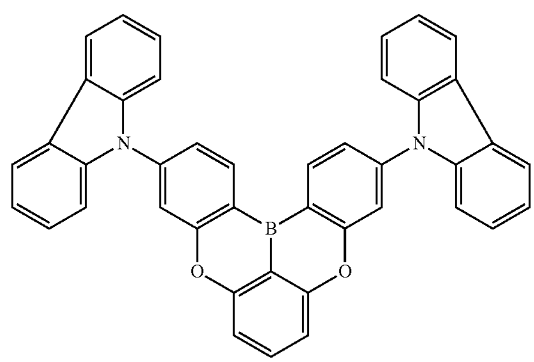
(BO2-0580S)
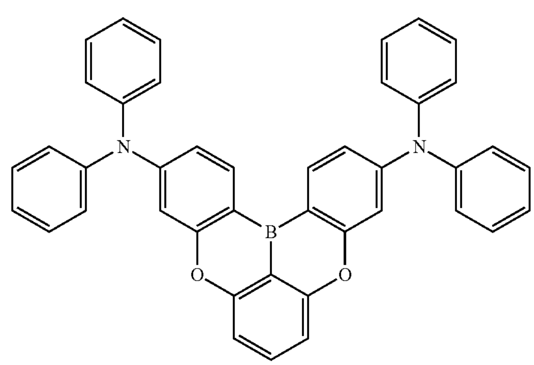

-continued (BO2-0610S)

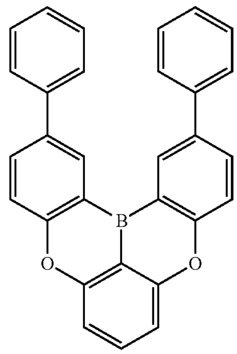

(BO2-0611S)

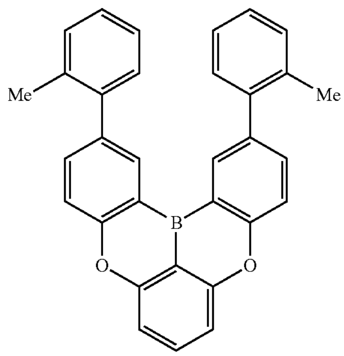

(BO2-0620S)

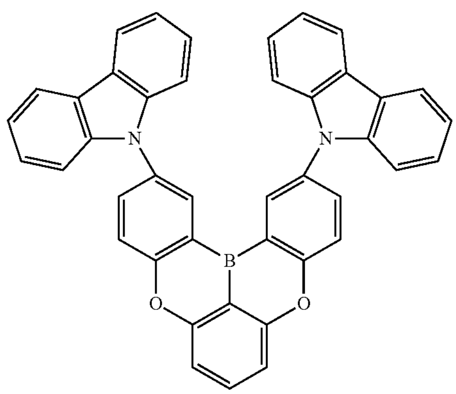

(BO2-0680S)

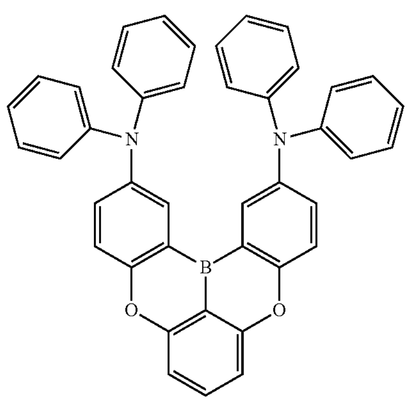

Production Method for Compound Represented by Formula (1)

The compound represented by the formula (1) is produced as follows. First, the rings a to c are bonded via a bonding group (—O—) to produce an intermediate (first reaction), and thereafter the rings a to c are bonded via a bonding group (group containing B) to produce a final product (second reaction). In the first reaction, for example, an ordinary etherification reaction such as a nucleophilic substitution reaction or an Ullmann reaction can be used. In the second reaction, a tandem hetero-Friedel-Crafts reaction (continuous aromatic electrophilic substitution reaction—the same shall apply hereinunder) can be used. Regarding the details of the first and second reactions, reference may be made to the description given in WO2015/102118.

The second reaction is a reaction of introducing B (boron) to bond the ring a, the ring b and the ring c, as shown in the following scheme (1). First, the hydrogen between the two O's is ortho-metalized with n-butyl lithium, sec-butyl lithium or t-butyl lithium. Next, boron trifluoride or boron tribromide is added for lithium-boron metal interchange, and then a Broensted base such as N,N-diisopropylethylamine is added for a tandem hetero-Friedel-Crafts reaction to give an intended product. In the second reaction, a Lewis acid such as aluminium trichloride may be added for promoting the reaction.

Scheme (1)

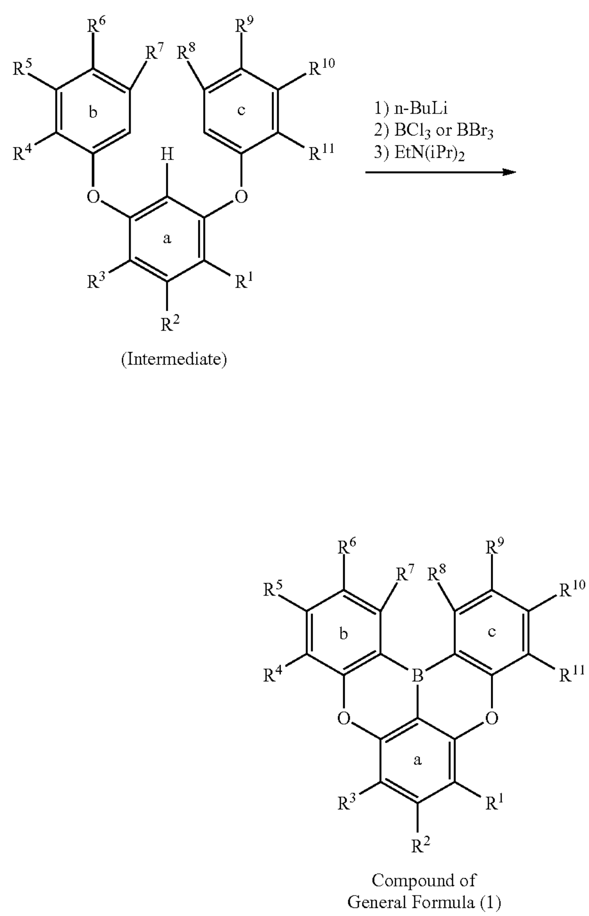

In the above scheme, a lithium is introduced into a desired position through ortho-metallization, but as in the following scheme (2), a bromine atom may be introduced into the position into which a lithium is desired to be introduced, and thereafter a lithium may be introduced into the desired position by halogen-metal interchange.

Scheme (2)

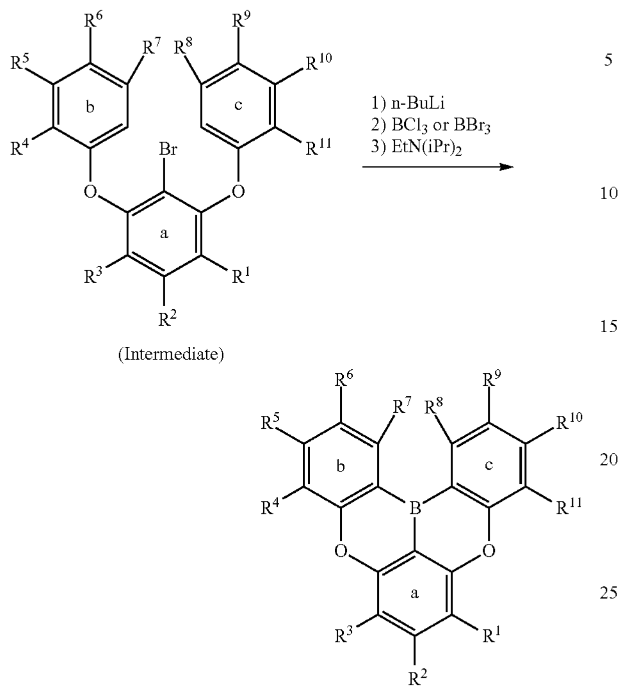

(Intermediate)

Compound of General Formula (1)

For obtaining a compound substituted with a halogen or a deuterium, the group may be previously introduced into the intermediate, or the group may be introduced after the second reaction.

Appropriately selecting the above-mentioned synthesis methods, and also appropriately selecting the raw materials to be used, a compound represented by the formula (1) having a substituent at the desired position can be synthesized.

1-1-2. Compound Represented by Formula (ii)

As the host compound having a boron atom and an oxygen atom in the molecule, a compound represented by the following formula (ii) can also be used.

(ii)

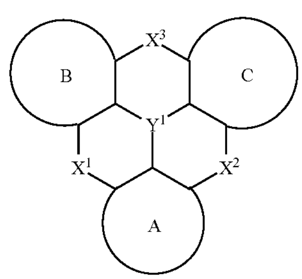

In the formula (ii), the ring A, the ring B and the ring C each are independently an aryl ring or a heteroaryl ring, and at least one hydrogen in these rings may be substituted. Regarding the description and the preferred range, and the specific examples of the substituent with which the hydrogen in the ring A, the ring B and the ring C may be substituted, reference may be made to the description and the preferred range, and specific examples of the substituent in $R^1$ to $R^{11}$ in the formula (1).

$Y^1$ is B, $X^1$, $X^2$ and $X^3$ each are independently >O, >N—R, >$CR_2$, or >S, at least two of $X^1$ to $X^3$ are >O. R in N—R and R in >$CR_2$ each are an optionally substituted aryl, an optionally substituted heteroaryl, or an alkyl, R in >N—R may bond to at least one of the ring A, the ring B and the ring C via a linking group or a single bond.

At least one hydrogen in the compound or the structure represented by the formula (ii) may be substituted with a cyano, a halogen or a deuterium, in addition to the above-mentioned substituents.

The compound represented by the formula (ii) is preferably a compound represented by the following formula (2).

(2)

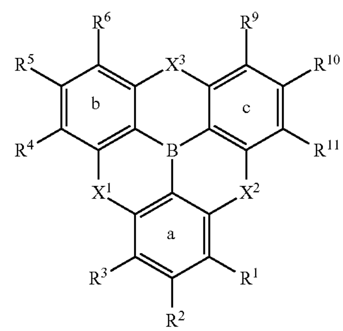

In the formula (2), $R^1$ to $R^6$, and $R^9$ to $R^{11}$ each are independently a hydrogen, an aryl, a heteroaryl, a diarylamino, a diheteroarylamino, an arylheteroarylamino, an alkyl, a cycloalkyl, an alkoxy or an aryloxy. These groups except hydrogen are substituents to be substituted for the hydrogen in the benzene ring corresponding to the ring a to the ring c, and correspond to the above-mentioned "first substituent". At least one hydrogen of the first substituent may be substituted with an aryl, a heteroaryl or an alkyl as the second substituent. Regarding the description and the preferred range, and the specific examples of the first substituent and the second substituent, reference may be made to the corresponding description relating to the first substituent and the second substituent in $R^1$ to $R^6$, and $R^9$ to $R^{11}$ in the formula (1).

In the formula (2), neighboring groups among $R^1$ to $R^6$, and $R^9$ to $R^{11}$ may bond to each other to form an aryl ring or a heteroaryl ring along with the ring a, the ring b or the ring c. Regarding the description and the preferred range, and the specific examples of the aryl ring or the heteroaryl ring that is formed by neighboring groups to bond to each other along with the ring a, the ring b or the ring c, and the substituents with which the hydrogen in these groups may be substituted, reference may be made to the corresponding description relating to the formula (1).

$X^1$ to $X^3$ each are independently >O, >N—R, >S, or >$CR_2$, at least two of X $X^1$ to $X^3$ are >O. Among $X^1$ to $X^3$, 2 or 3 may be >O, but preferably 3 are >O. Specifically, all $X^1$ to $X^3$ are preferably >O.

R in N—R and R in >$CR_2$ each are an aryl, a heteroaryl, or an alkyl, and at least one hydrogen in these groups may be further substituted with an aryl, a heteroaryl and an alkyl. Regarding the preferred range and the specific examples of the aryl, the heteroaryl and the alkyl in R, reference may be made to the corresponding description relating to $R^1$ to $R^{11}$ in the formula (1). When the compound represented by the formula (2) has 2 or more R's in the molecule, the multiple R's may be the same as or different from each other.

Preferably, the compound represented by the formula (2) contains at least one structure selected from the above-mentioned partial structure group A in the molecule, and also preferably, at least one of $R^1$ to $R^{11}$ is a group represented by any of the formulae (1-a) to (1-n). Regarding the description and the preferred range, and the specific examples of the partial structure group A, and the formulae (1-a) to (1-n), reference may be made to the description and the preferred range and the specific examples of the partial structure group A the formulae (1-a) to (1-n) in the formula (1).

At least one hydrogen in the compound represented by the formula (2) may be substituted with a cyano, a halogen or a deuterium, in addition to the above-mentioned substituents. The halogen is a fluorine, a chlorine, a bromine or an iodine, preferably a fluorine, a chlorine or a bromine, more preferably a fluorine.

Specific structures of the formula (2) are shown below.

(TOBPP1)

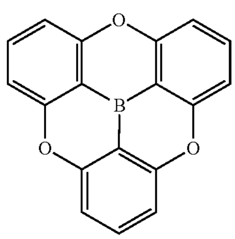

(1-161)

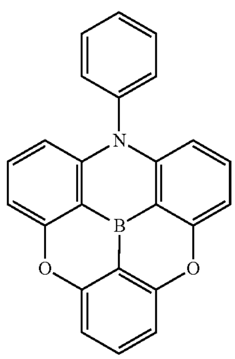

(1-187)

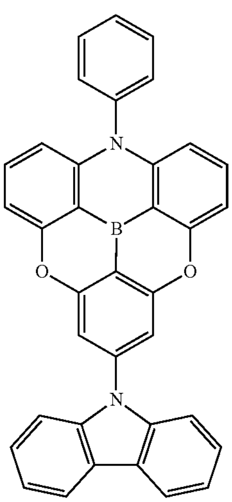

-continued (1-188)

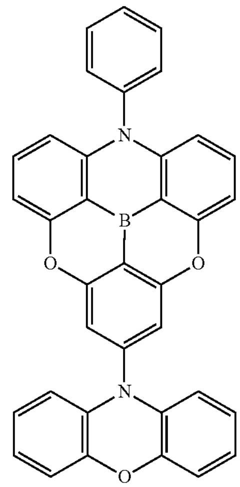

(1-189)

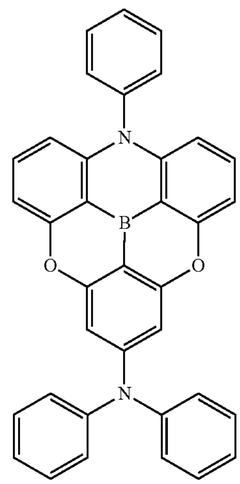

1-1-3. Compound Represented by Formula (iii)

As the host compound having a boron atom and an oxygen atom in the molecule, a compound represented by the following formula (iii) can also be used.

(iii)

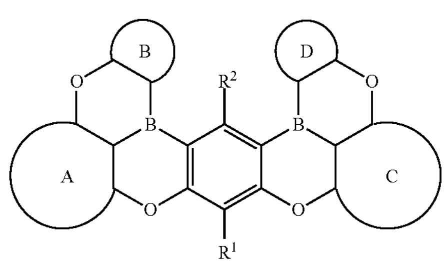

In the formula (iii), the ring A, the ring B, the ring C and the ring D each are independently an aryl ring or a heteroaryl ring, and at least one hydrogen in these rings may be substituted. Regarding the description and the preferred range, and the specific examples of the substituent with which the hydrogen in the ring A, the ring B, the ring C and the ring D may be substituted, reference may be made to the description and the preferred range, and the specific examples of the substituent in $R^1$ to $R^{11}$ in the formula (1).

$R^1$ and $R^2$ each are independently a hydrogen, an alkyl having a carbon number of 1 to 6, an aryl having a carbon number of 6 to 12, a heteroaryl having a carbon number of 2 to 15, a diarylamino (where the aryl has a carbon number of 6 to 12), a diheteroarylamino (where the heteroaryl has a carbon number of 2 to 15), or an arylheteroarylamino (where the aryl has a carbon number of 6 to 12, and the heteroaryl has a carbon number of 2 to 15).

At least one hydrogen in the compound represented by the formula (iii) may be substituted with a cyano, a halogen or a deuterium, in addition to the above-mentioned substituents.

The compound represented by the formula (iii) is preferably a compound represented by the following formula (3).

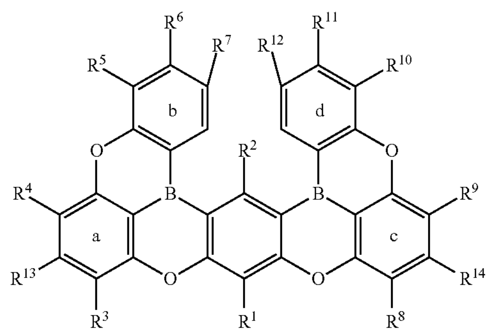

(3)

In the formula (3), $R^1$ to $R^{14}$ each are independently a hydrogen, an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl. Except hydrogen, these groups are substituents that are substitutable for the hydrogen of the benzene ring corresponding to the ring a to the ring d, and correspond to the above-mentioned "first substituent". At least one hydrogen in the first substituent may be substituted with an aryl, a heteroaryl or an alkyl as the second substituent.

In the formula (3), neighboring groups among $R^5$ to $R^7$ and $R^{10}$ to $R^{12}$ may bond to each other to form an aryl ring or a heteroaryl ring along with the ring b or the ring d. Regarding the description of the neighboring groups, and regarding the description and the preferred range, and the specific examples of the aryl ring or the heteroaryl ring that the neighboring groups bond to each other to form along with the ring b or the ring d, reference may be made to the corresponding description relating to the formula (1).

At least one hydrogen atom in the ring that the neighboring groups bond to each other to form along with the ring b or the ring d may be substituted with an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl. These groups are substituents that are substitutable for the hydrogen of the formed ring, and correspond to the above-mentioned "first substituent". At least one hydrogen in the first substituent may be substituted with an aryl, a heteroaryl or an alkyl as the second substituent.

Regarding the description and the preferred range, and the specific examples of the aryl as the first substituent, as well as the aryl in the diarylamino, the arylheteroarylamino, the aryloxy and the arylthio, reference may be made to the description and the preferred range, and the specific examples of the aryl as the first substituent in $R^1$ to $R^{11}$ in the formula (1); and regarding the description and the preferred range, and the specific examples of the aryl as the second substituent, reference may be made to the description and the preferred range, and the specific examples of the aryl as the second substituent in $R^1$ to $R^{11}$ in the formula (1). Regarding the description and the preferred range, and the specific examples of the heteroaryl as the first substituent, as well as the heteroaryl in the diheteroarylamino, the arylheteroarylamino, the heteroaryloxy and the heteroarylthio, reference may be made to the description and the preferred range, and the specific examples of the heteroaryl as the first substituent in $R^1$ to $R^{11}$ in the formula (1); and regarding the description and the preferred range, and the specific examples of the heteroaryl as the second substituent, reference may be made to the description and the preferred range, and the specific examples of the heteroaryl as the second substituent in $R^1$ to $R^{11}$ in the formula (1). Regarding the description and the preferred range, and the specific examples of the alkyl and the cycloalkyl as the first substituent, as well as the alkyl in the alkyl-substituted silyl, reference may be made to the description and the preferred range, and the specific examples of the alkyl and the cycloalkyl as the first substituent in $R^1$ to $R^{11}$ in the formula (1); and regarding the description and the preferred range, and the specific examples of the alkyl as the second substituent, reference may be made to the description and the preferred range, and the specific examples of the alkyl as the second substituent in $R^1$ to $R^{11}$ in the formula (1). Regarding the description and the preferred range, and the specific examples of the alkoxy as the first substituent, reference may be made to the description and the preferred range, and the specific examples of the alkoxy as the first substituent in $R^1$ to $R^{11}$ in the formula (1).

Preferably, the compound represented by the formula (3) contains at least one structure selected from the partial structure group A, in the molecule, and also preferably, at least one of $R^1$ to $R^{14}$ is a group represented by any of the above-mentioned formulae (1-a) to (1-n). Regarding the description and the preferred range, and the specific examples of the partial structure group A, and the formulae (1-a) to (1-n), reference may be made to the description and the preferred range, and the specific examples of the partial structure group A and the formulae (1-a) to (1-n) in the formula (1).

At least one hydrogen in the compound represented by the formula (3) may be substituted with a cyano, a halogen or a deuterium, in addition to the above-mentioned substituents. The halogen is a fluorine, a chlorine, a bromine or an iodine, preferably a fluorine, a chlorine or a bromine, more preferably a fluorine.

Specific examples of the compound represented by the formula (3) are shown below. In the following formulae, Me represents a methyl, $^t$Bu represents a t-butyl, and Ph represents a phenyl.

(3-1001A)
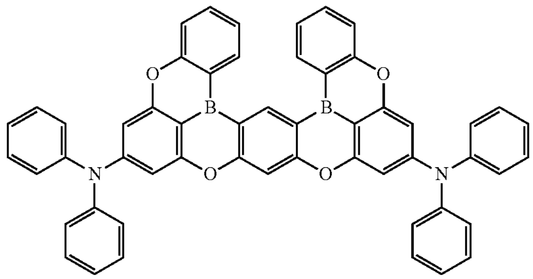
(3-1001A-Cz1)
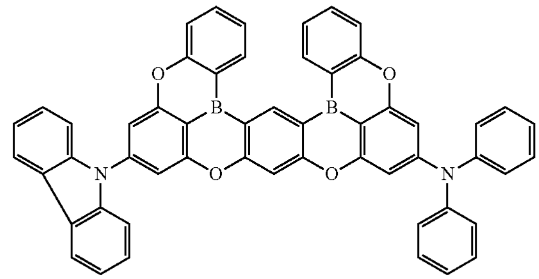
(3-1001A-Cz2)
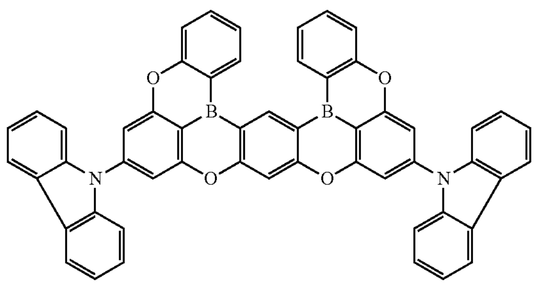
(3-1401A)
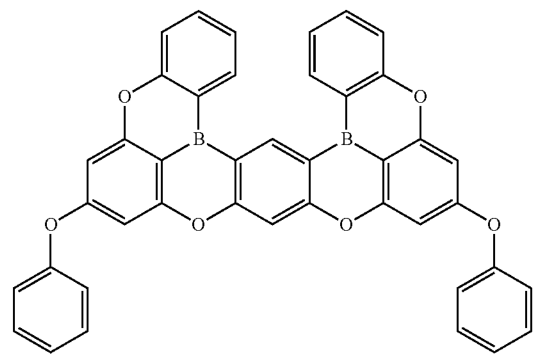
(3-1001)
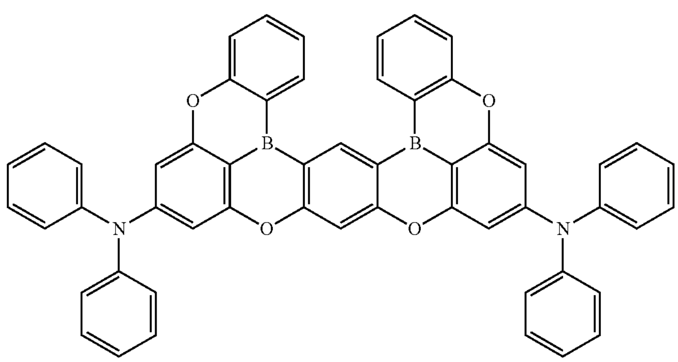
(3-1002)
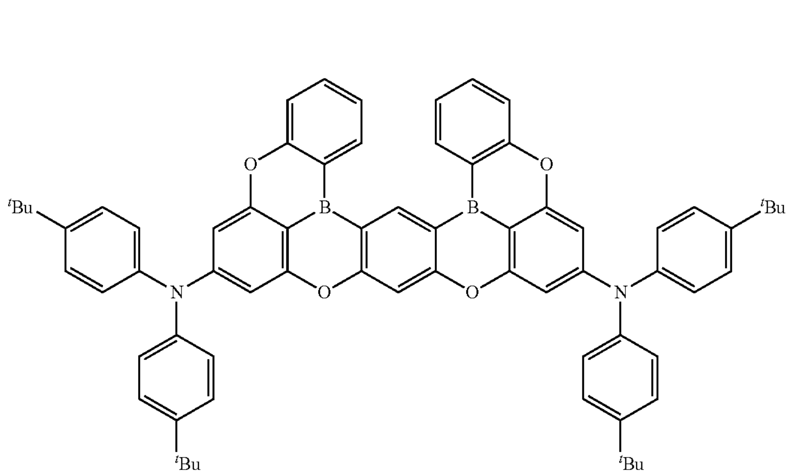

-continued
(3-1003)
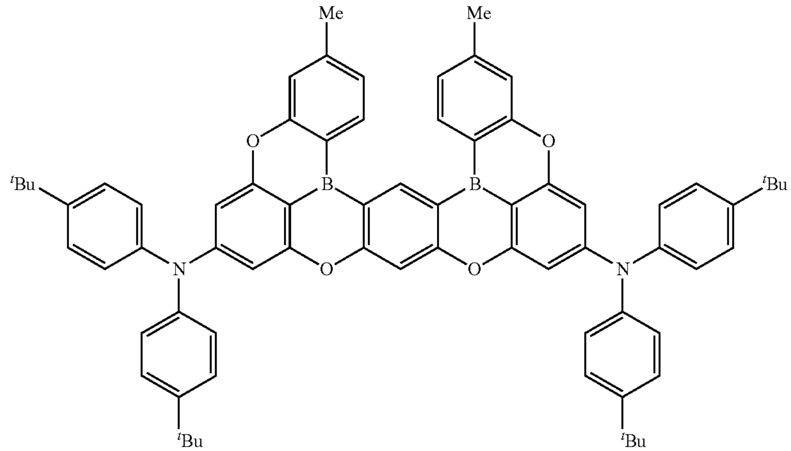
(3-1004)
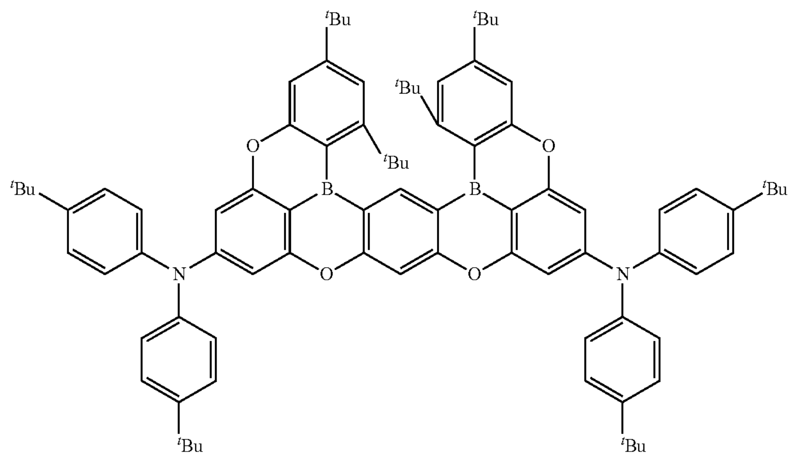
(3-1005)
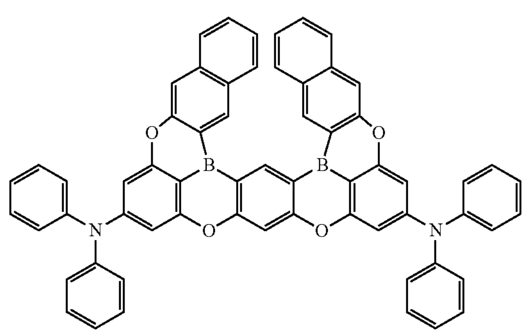
(3-1006)
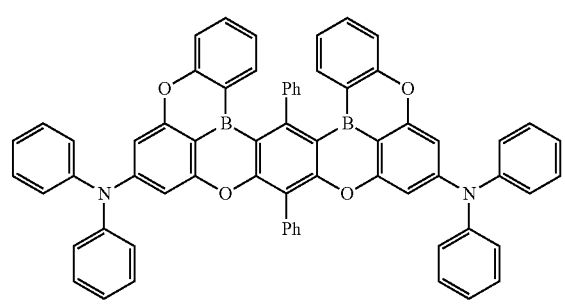
(3-1007)
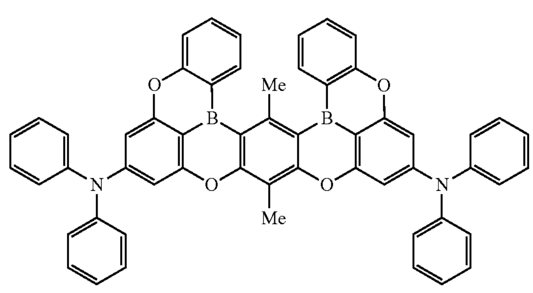
(3-1008)
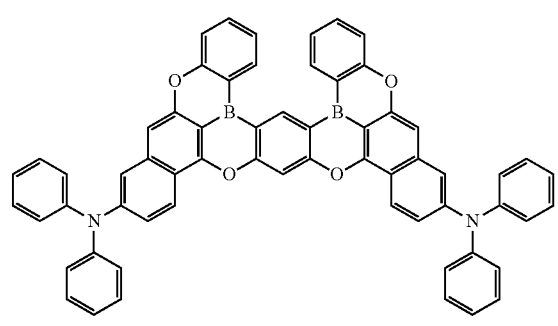

-continued
(3-1009)
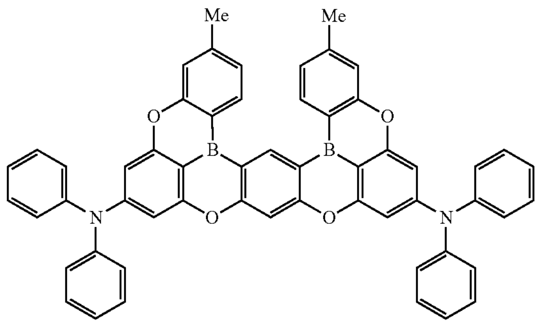
(3-1010)
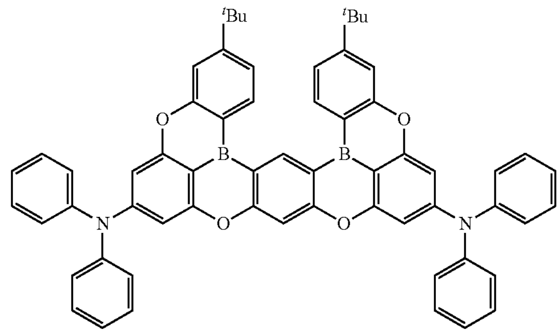
(3-1011)
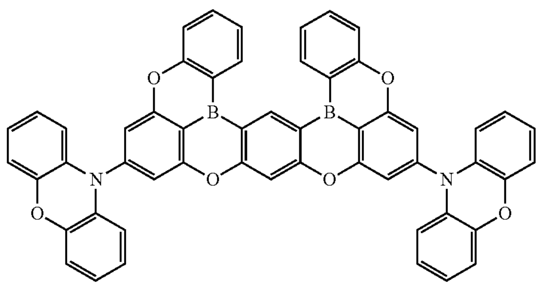
(3-1012)
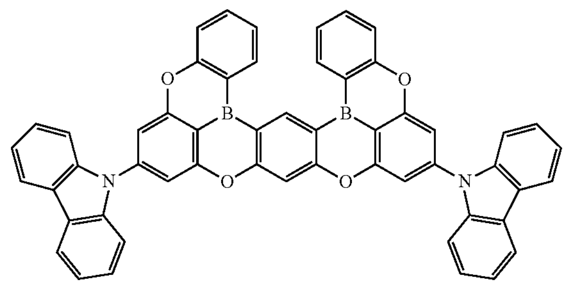
(3-1013)
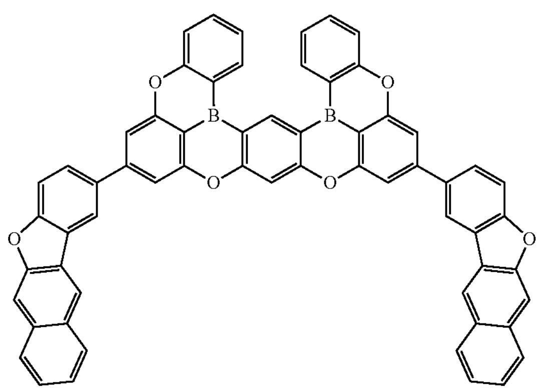
(3-1014)
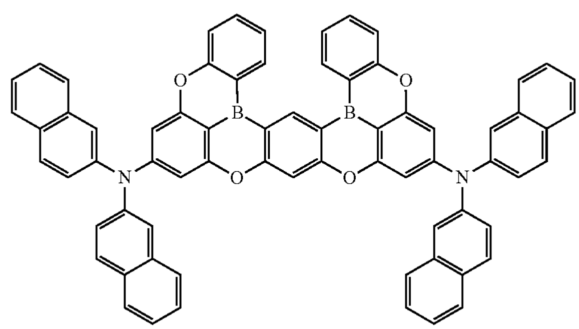
(3-1015)
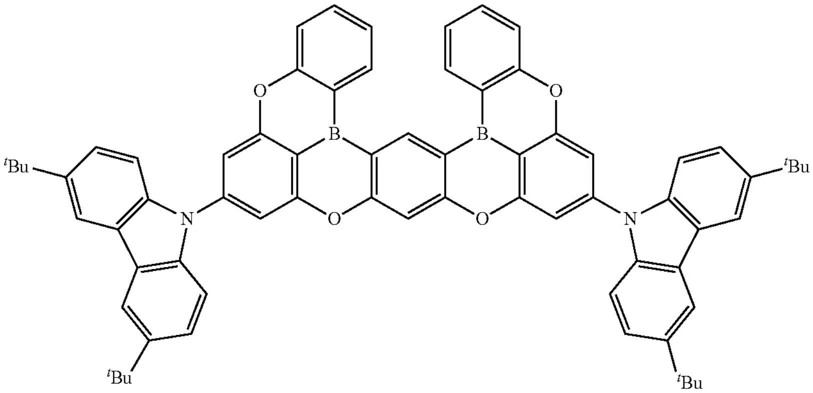

-continued
(3-1016)
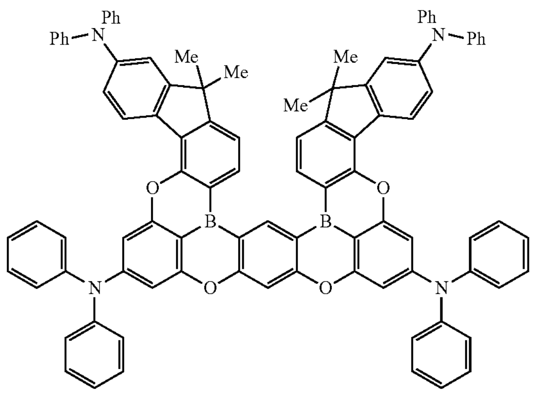
(3-1017)
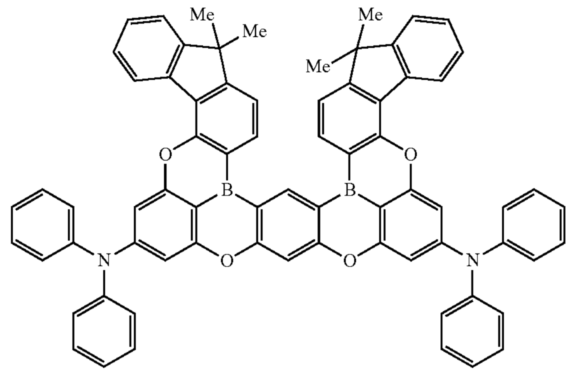
(3-1018)
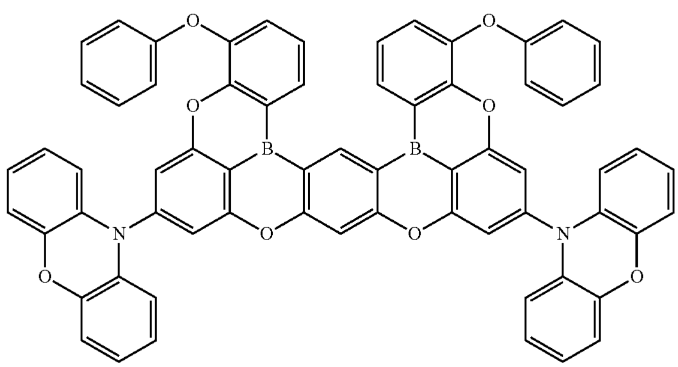
(3-1019)
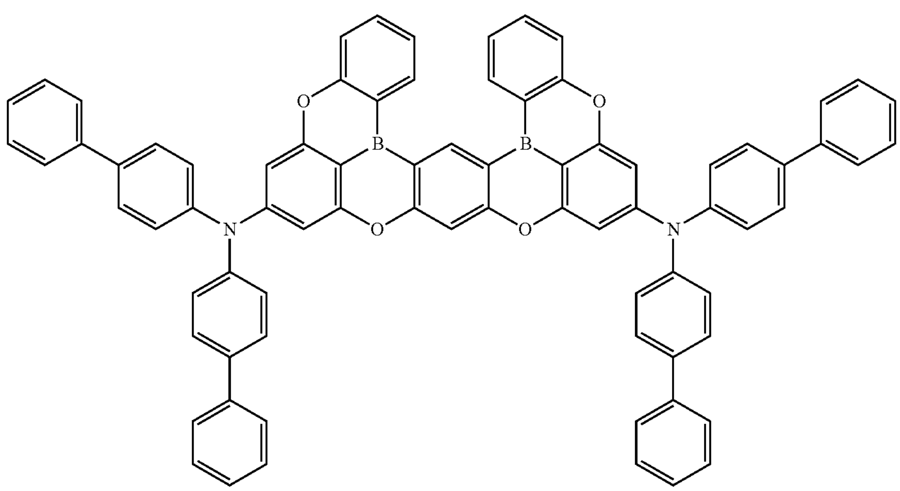

-continued
(3-1020)
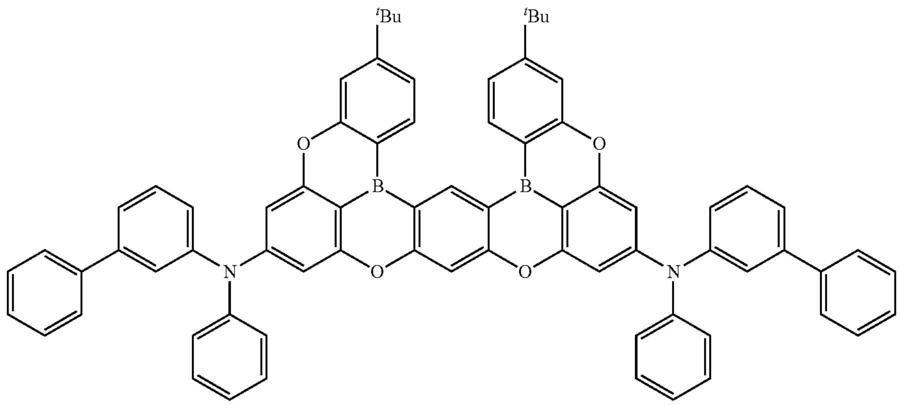
(3-1021)
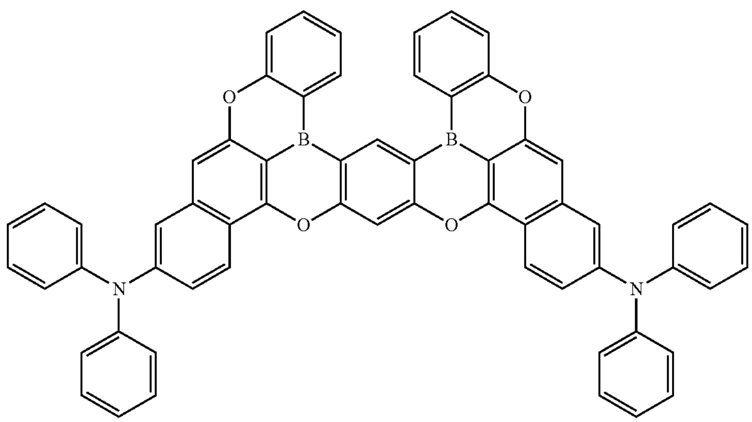
(3-1022)
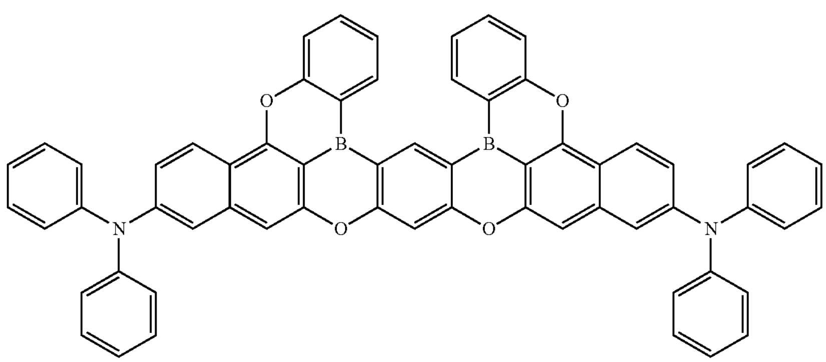
(3-1023)
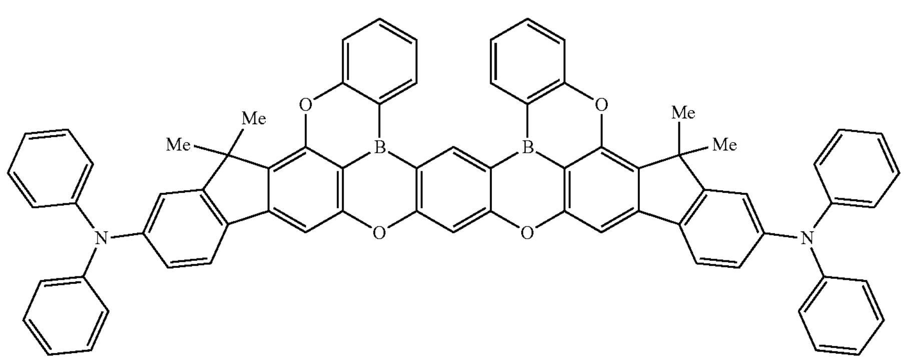

-continued
(3-1024)
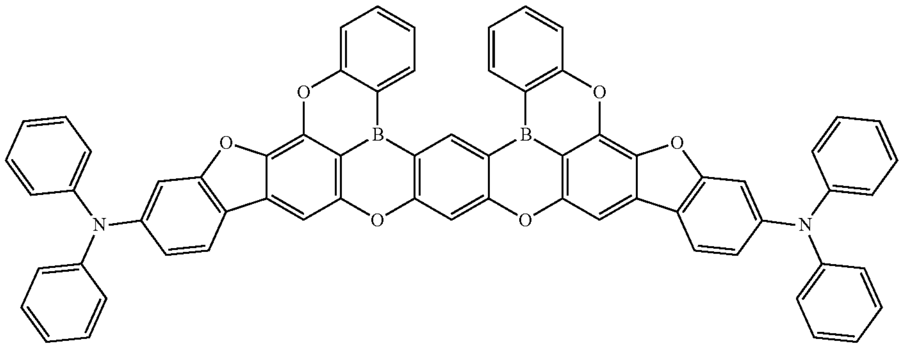
(3-1025)
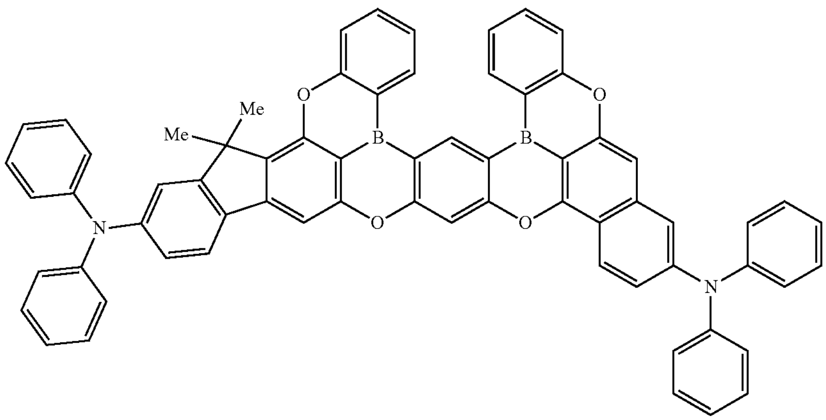
(3-1026)
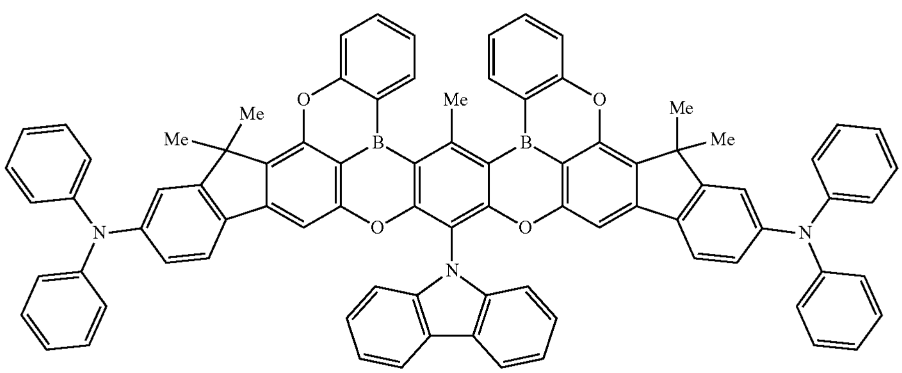
(3-1027)
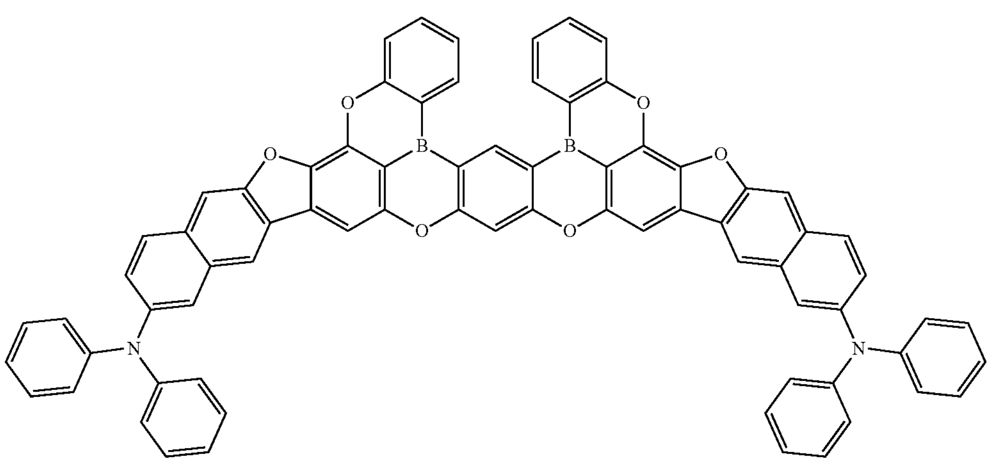

-continued
(3-1028)
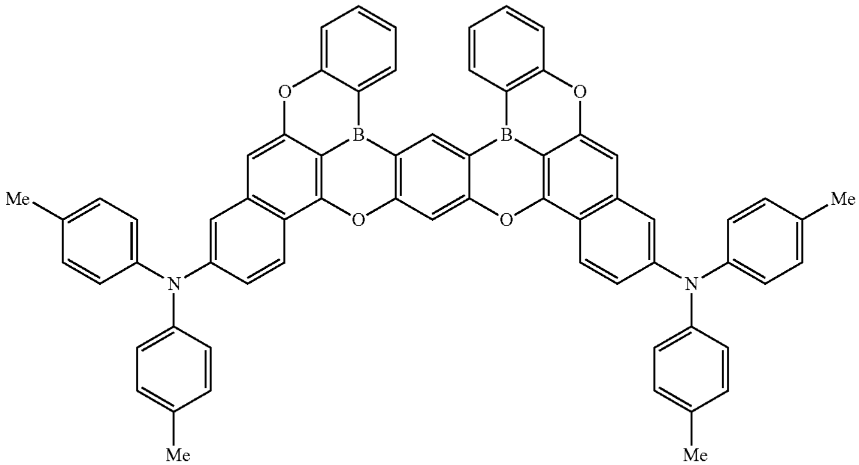
(3-1029)
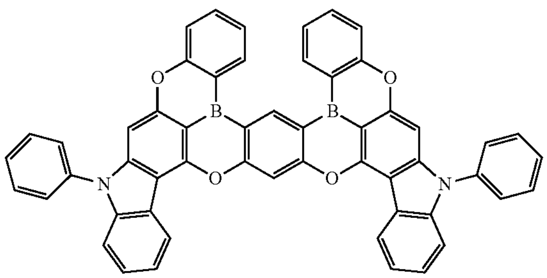
(3-1030)
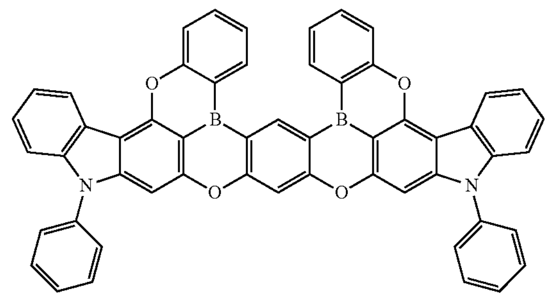
(3-1401)
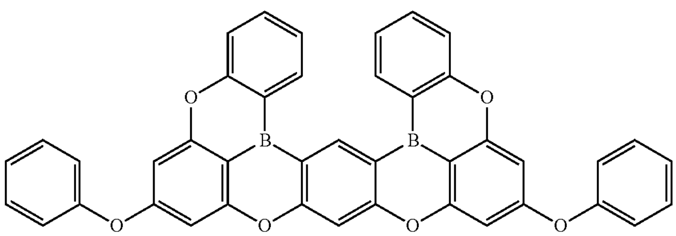
(3-1402)
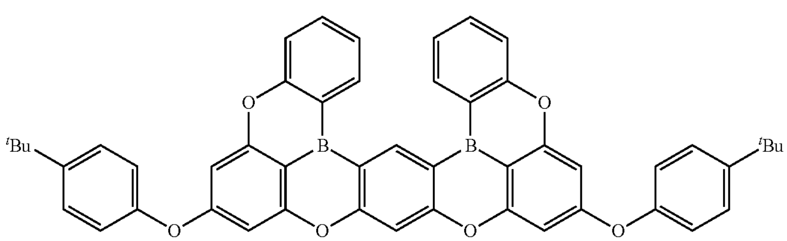
(3-1403)
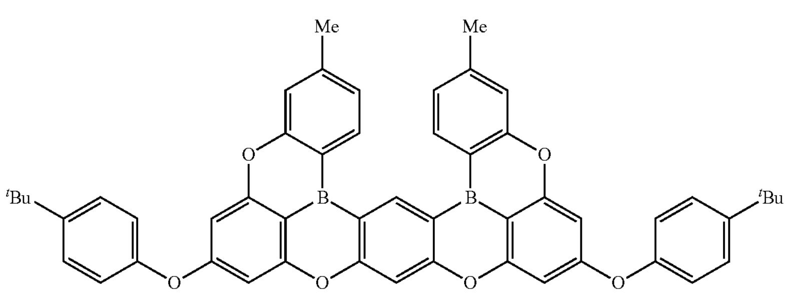

-continued
(3-1404)
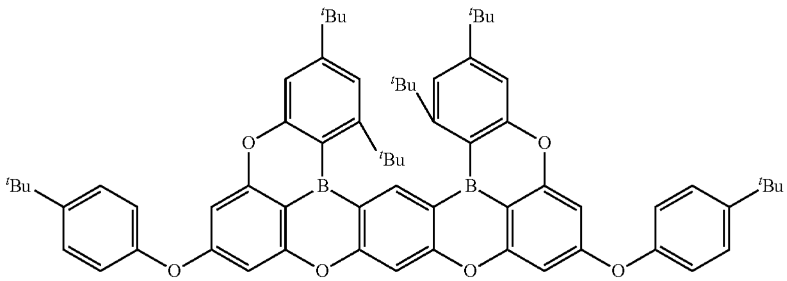
(3-1405)
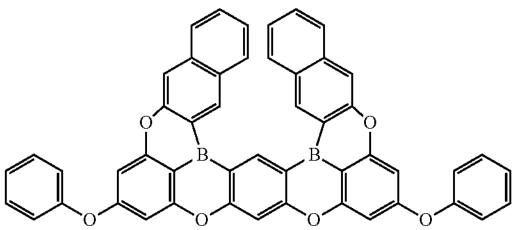
(3-1406)
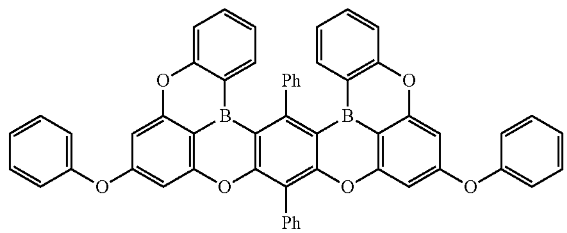
(3-1407)
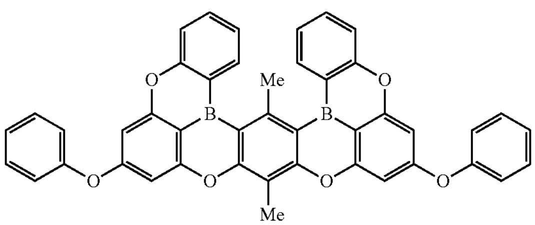
(3-1408)
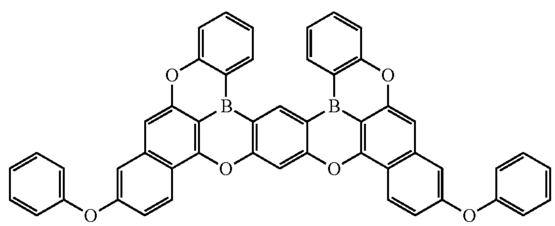
(3-1409)
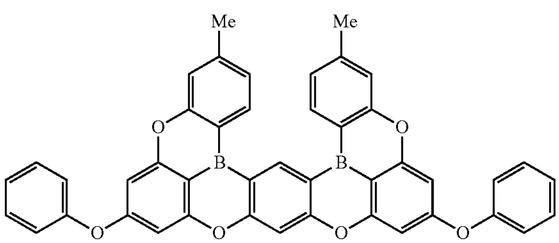
(3-1410)
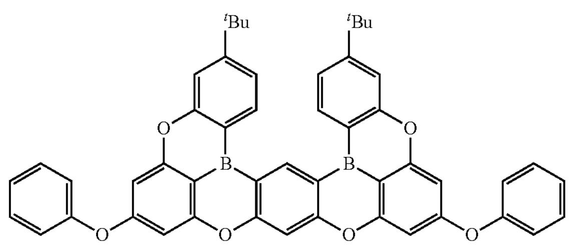
(3-1411)
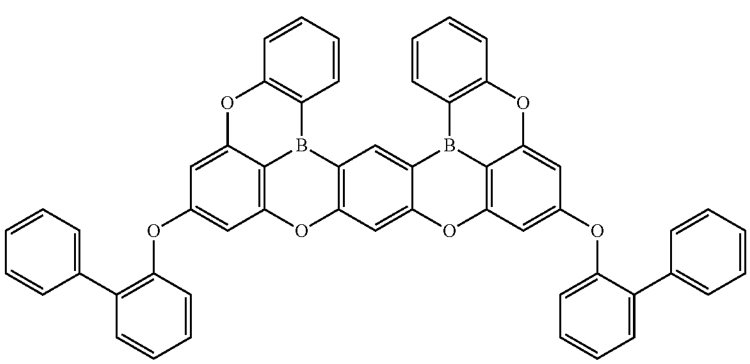

-continued
(3-1412)
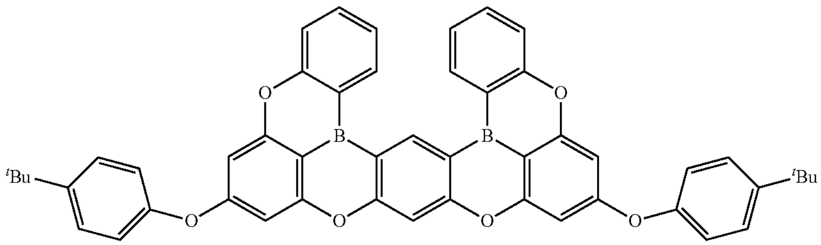
(3-1413)
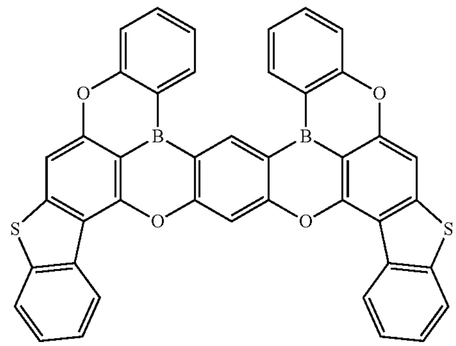
(3-1414)
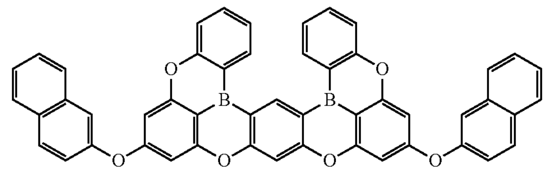
(3-1415)
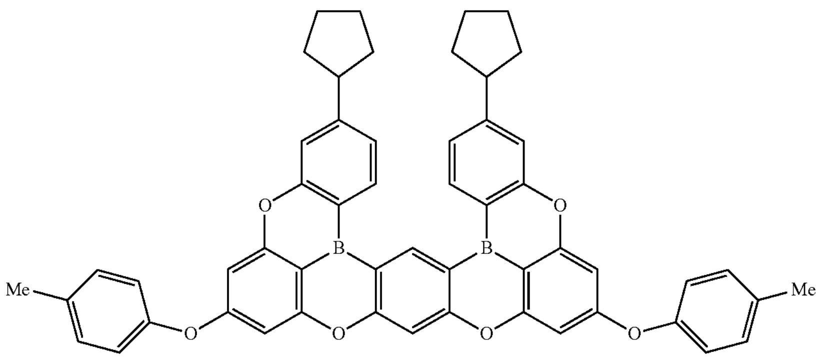
(3-1416)
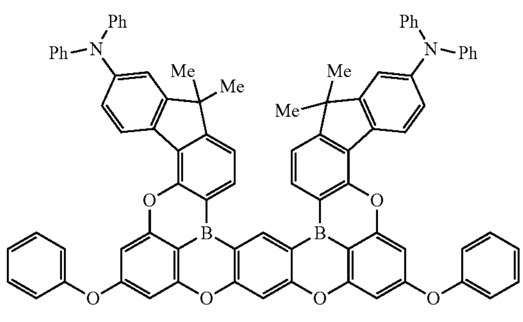
(3-1417)
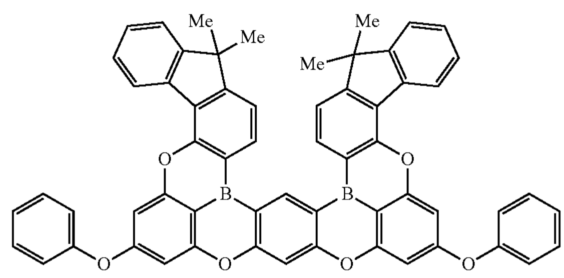
(3-1418)
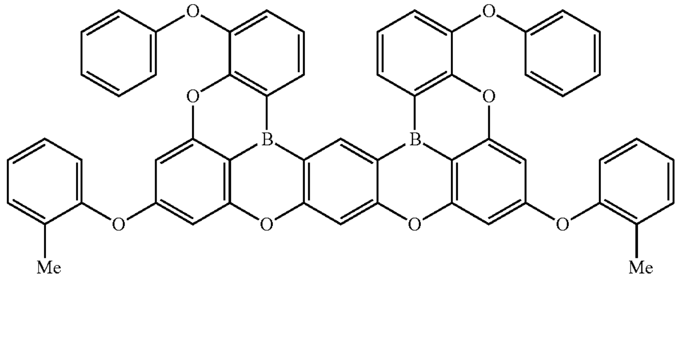

-continued
(3-1419)
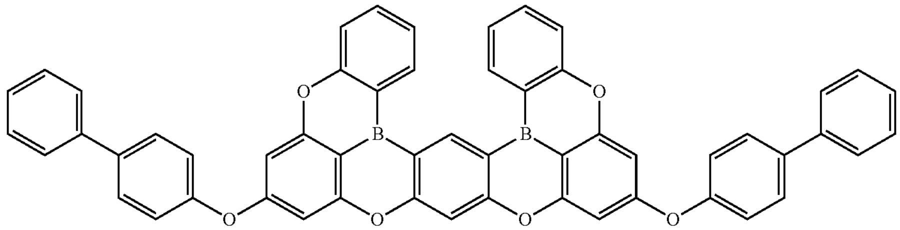
(3-1420)
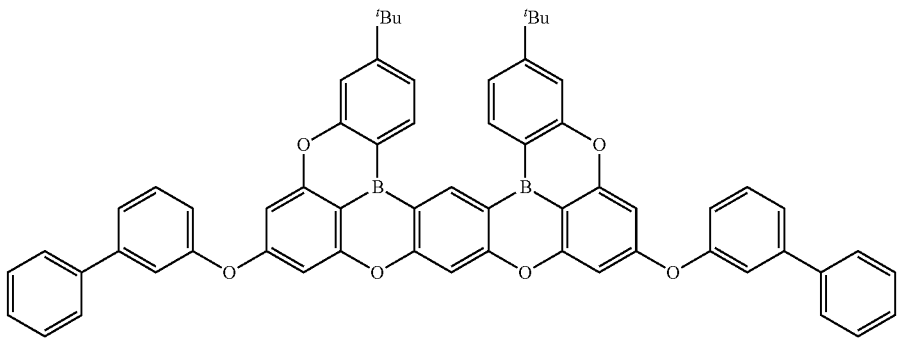
(3-1421)
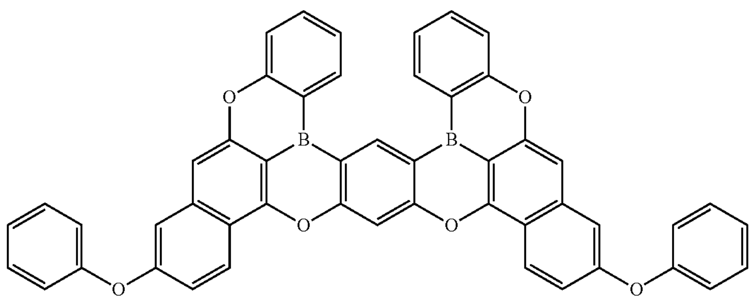
(3-1422)
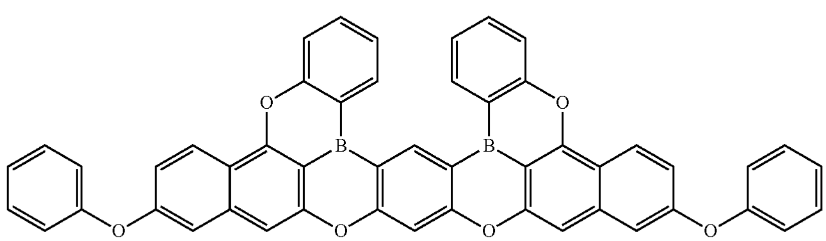
(3-1423)
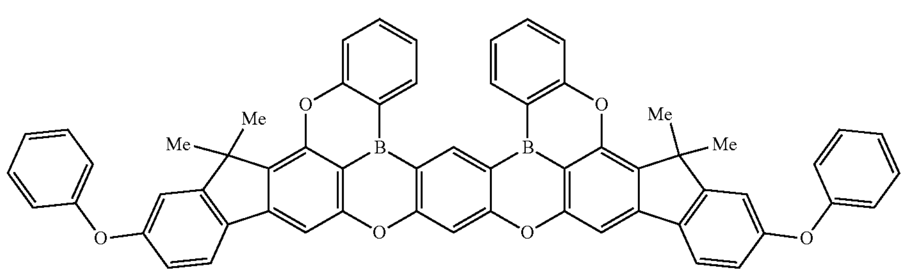

-continued
(3-1424)
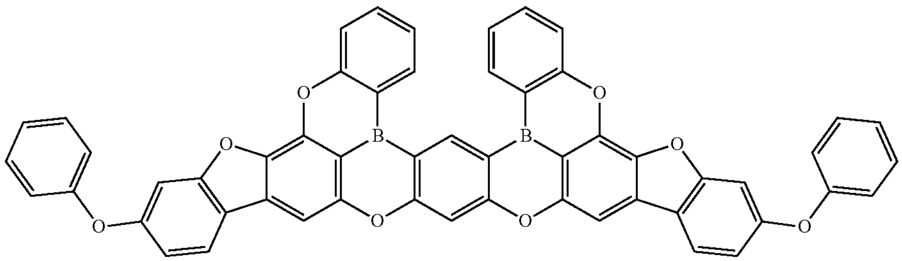
(3-1425)
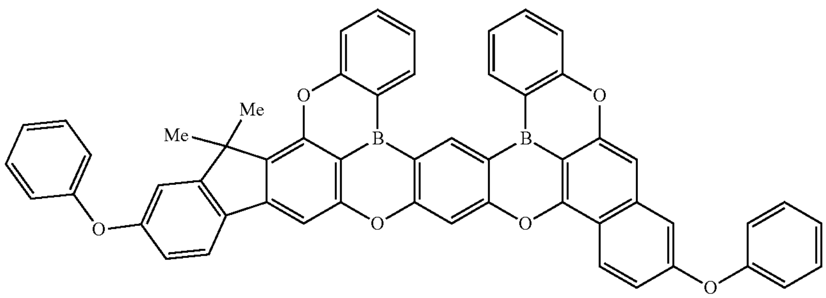
(3-1426)
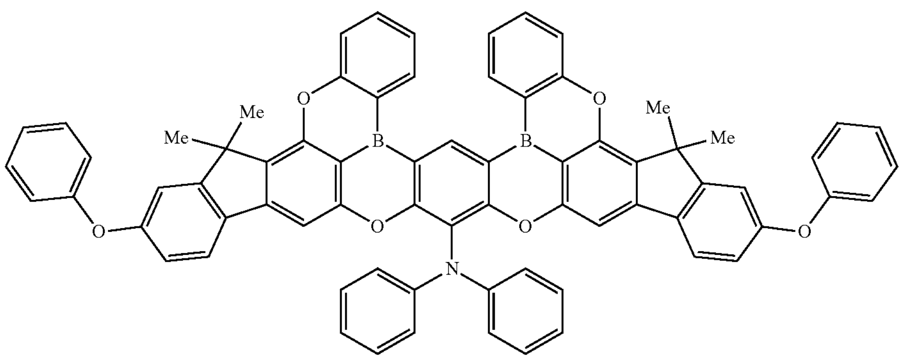
(3-1427)
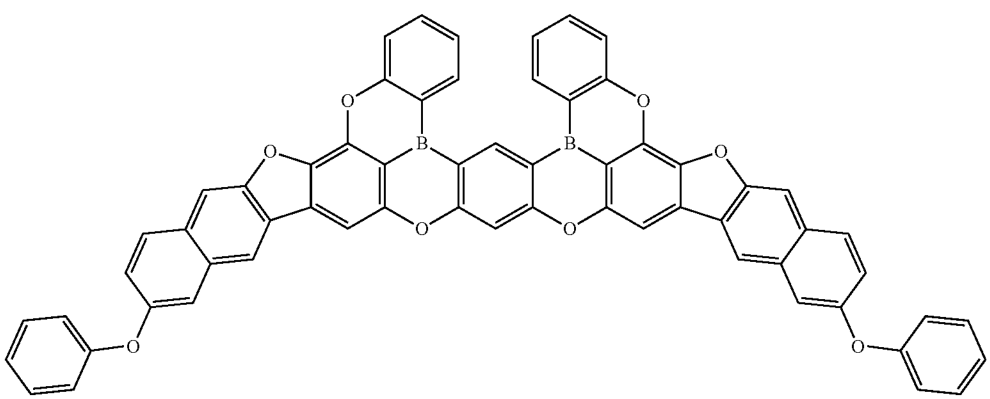
(3-1428)
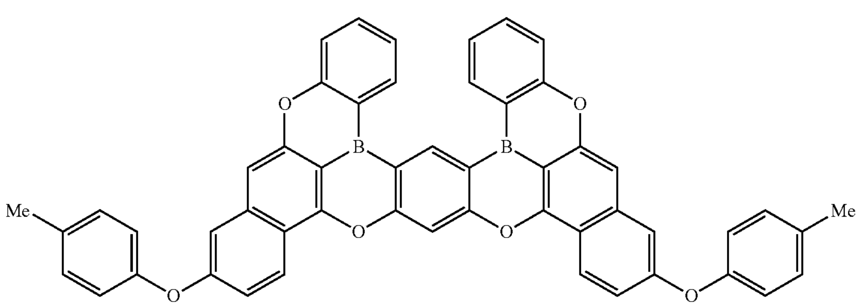

-continued (1-1429)

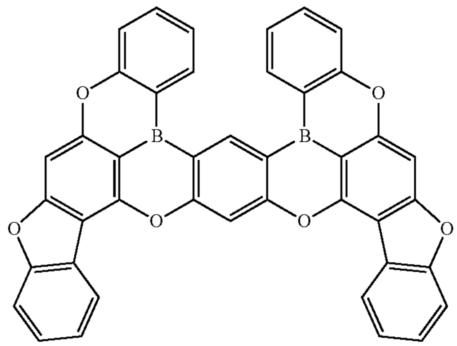

(1-1430)

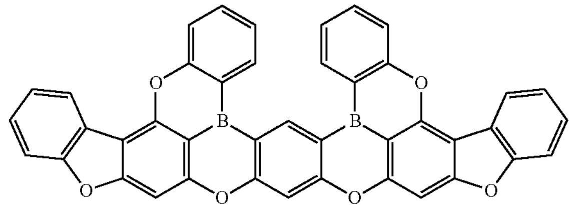

Also preferably, the host compound for use as the first component is a compound containing a structure represented by the following formula (1-1), (2-1), (2-2) or (3-1).

(1-1)

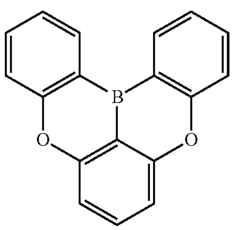

(2-1)

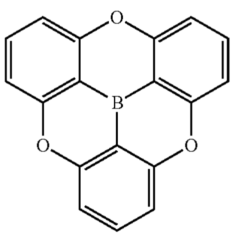

(2-2)

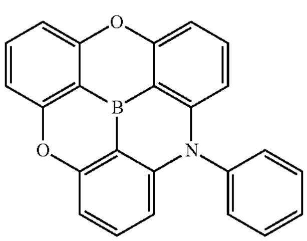

(3-1)

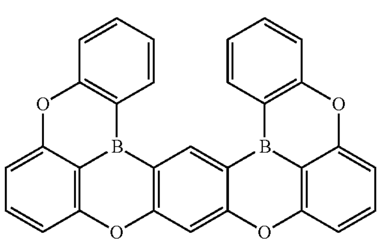

At least one hydrogen in the structure represented by the formula (1-1), (2-1), (2-2) or (3-1) may be each independently substituted with an aryl, a heteroaryl, a diarylamino, a diheteroarylamino, an arylheteroarylamino, an alkyl, a cycloalkyl, an alkoxy or an aryloxy. Except hydrogen, these groups are substituents substitutable for the hydrogen in each structure, and correspond to the above-mentioned "first substituent". At least one hydrogen in these first substituents may be substituted with an aryl, a heteroaryl or an alkyl as the second substituent. Regarding the description and the preferred range, and the specific examples of the first substituent and the second substituent, reference may be made to the corresponding description of the first substituent and the second substituent in $R^1$ to $R^{11}$ in the formula (1).

1-2. Thermally Assisting Delayed Fluorescent Material (Assisting Dopant)

In the present invention, a thermally assisting delayed fluorescent material (TADF compound) is used as the second component in the light-emitting layer.

The thermally assisting delayed fluorescent material preferably a multi-resonance effect (MRE)-type TADF compound, which is so designed that, utilizing the multi-resonance effect of boron (electron-donating) and nitrogen (electron-accepting), HOMO is localized in the three carbons on the benzene ring formed of 6 carbons and LUMO is localized in the remaining three carbons to induce efficient reverse intersystem crossing, and is more preferably an MRE-type TADF compound such that substituents are introduced thereinto to reduce the planarity of the compound.

The MRE-type TADF compound includes compounds containing a structure represented by the following formula (AD11), (AD12), (AD13), (AD21) or (AD22).

(AD11)

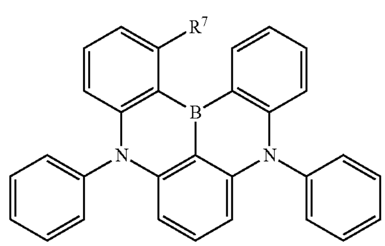

(AD12)

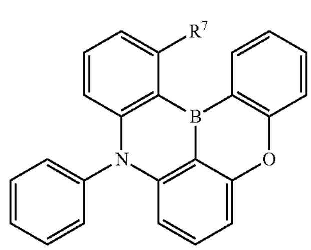

-continued (AD13)

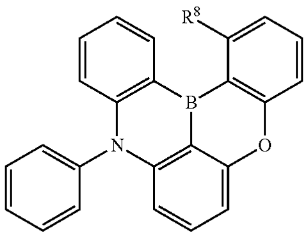

(AD21)

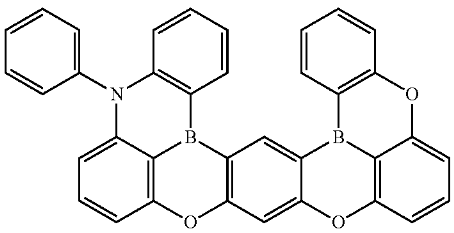

(AD22)

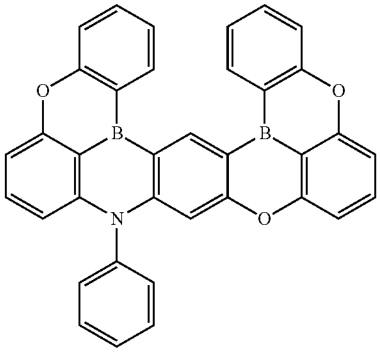

In the formulae (AD11), (AD12) and (AD13), $R^7$ and $R^8$ each are an alkyl having a carbon number of 1 to 6. The alkyl having a carbon number of 1 to 6 in $R^7$ may be linear, branched or cyclic.

At least one hydrogen in the structure represented by the formula (AD11), (AD12), (AD13), (AD21) or (AD22) each independently may be substituted with an aryl, a heteroaryl, a diarylamino, a diheteroarylamino, an arylheteroarylamino, an alkyl, a cycloalkyl, an alkoxy or an aryloxy, and these may be further substituted with an aryl, a heteroaryl or an alkyl. Regarding the preferred range and the specific examples of the aryl, the heteroaryl, the diarylamino, the diheteroarylamino, the arylheteroarylamino, the alkyl, the cycloalkyl, the alkoxy or the aryloxy, reference may be made to the corresponding description of $R^1$ to $R^{11}$ in the formula (1).

Regarding the formulae (AD11), (AD12) and (AD13) for use as the second component in the light-emitting layer, the compounds have realized a short delayed fluorescence lifetime by appropriately combining two approaches of (i) introducing an element for controlling the multi-resonance effect into an appropriate position and (ii) introducing a substituent into an appropriate position for warping the molecule to reduce planarity of the compound. In particular, regarding the approach (ii), specifically, by introducing a specific substituent into $Z^1$ or $R^8$, the molecule is warped and with that, the singlet and triplet orbitals are both warped. The orbital warpage leads to a larger spin orbit interaction. Specifically, the compound of the type includes those having any of the following structural formulae. In the following formulae, Me represents a methyl, and t-Bu represents a t-butyl.

(BN2p-12m-0001)

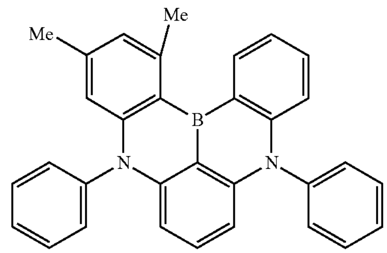

(BN2p-12m-0001-1)

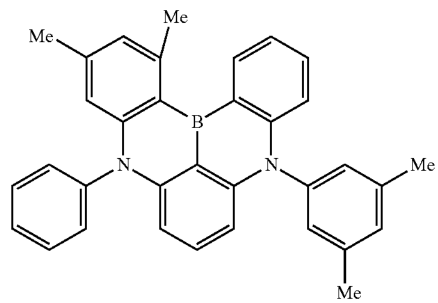

(BN2p-12m-0001-2)

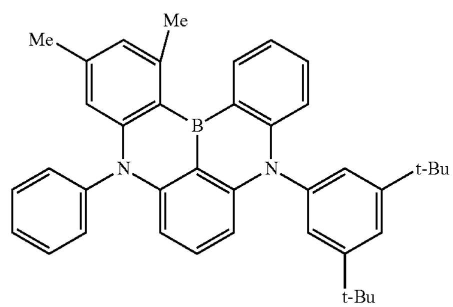

(BN2p-12m-0210)

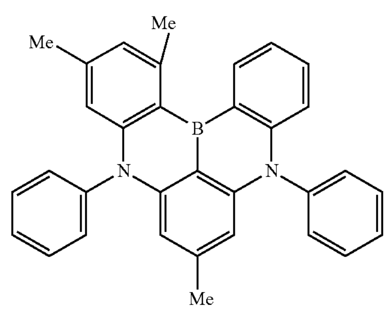

(BN2p-12m-0211)

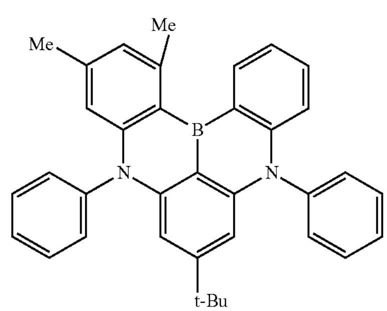

-continued
(BN2p-12m-0213)
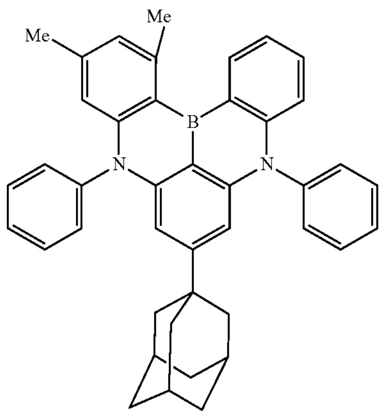
(BN2p-12m-0220)
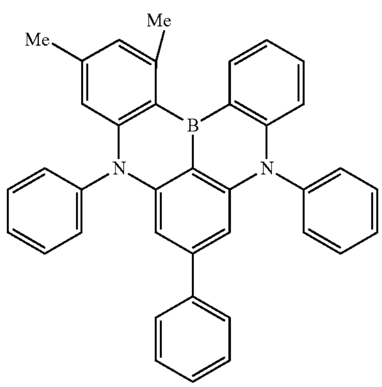
(BN2p-12m-0220-1)
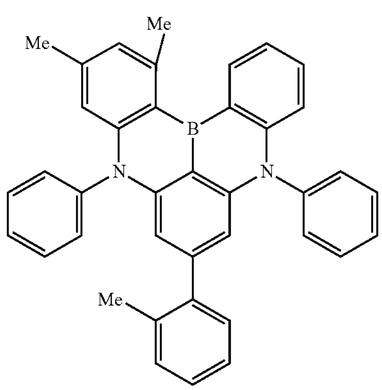
(BN2p-12m-0220-2)
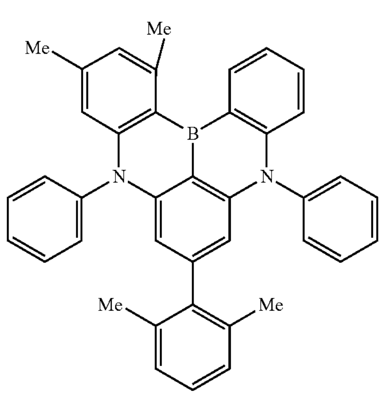
-continued
(BN2p-12m-0220-3)
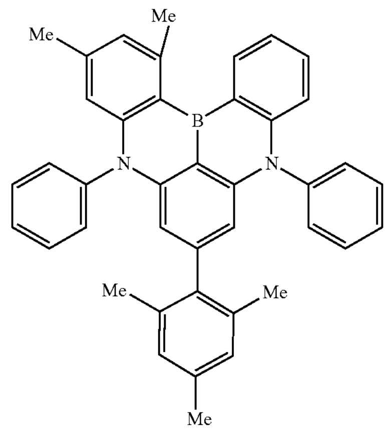
(BN2p-12m-0230)
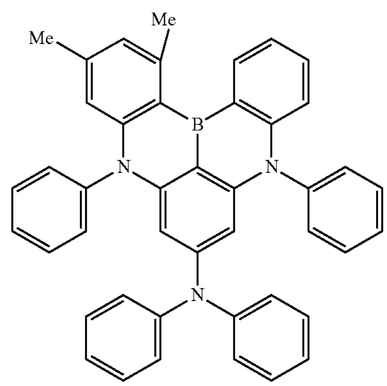
(BN2p-12m-0231)
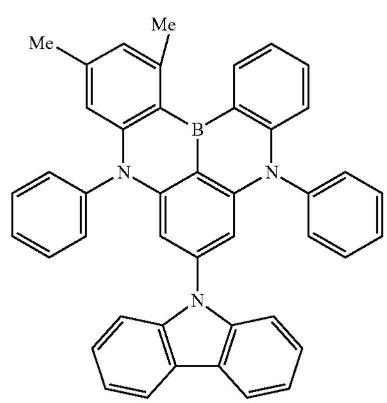

-continued
(BN2p-12m-0230-1)
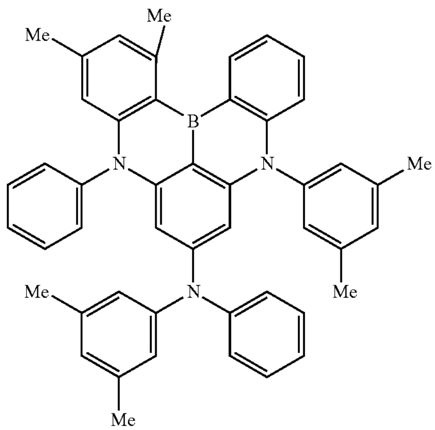
(BN2p-12m-0231-1)
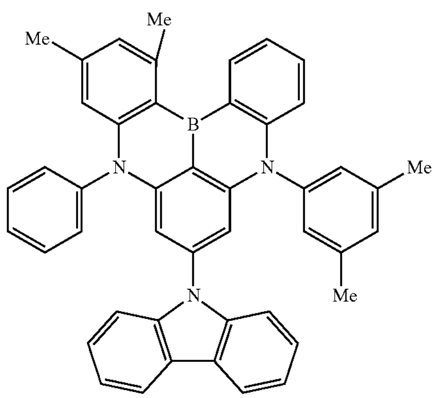
(BN2p-12mS-0001)
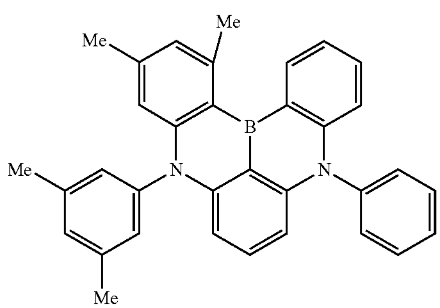
(BN2p-12mS-0001-1)
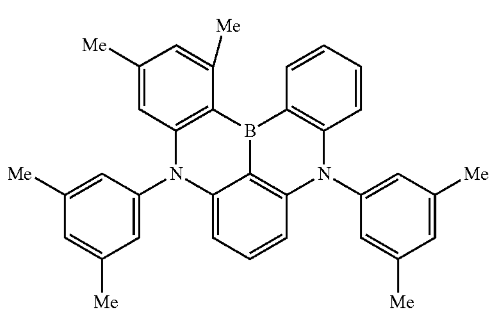
-continued
(BN2p-12mS-0001-2)
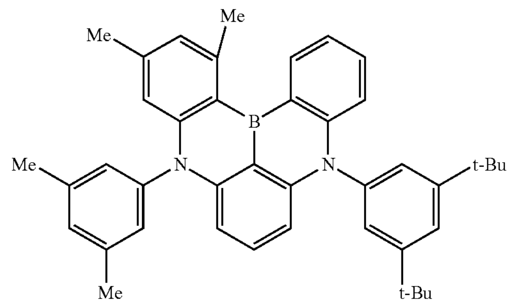
(BN2p-12mS-0210)
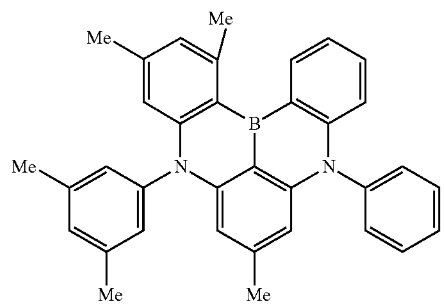
(BN2p-12mS-0211)
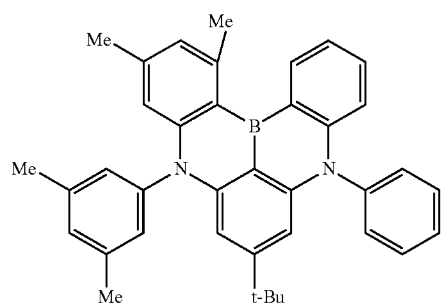
(BN2p-12mS-0213)
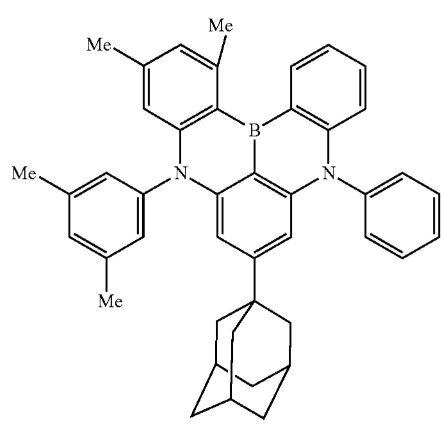

-continued
(BN2p-12mS-0220)
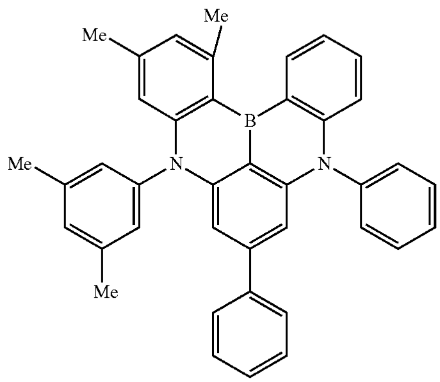
(BN2p-12mS-0220-1)
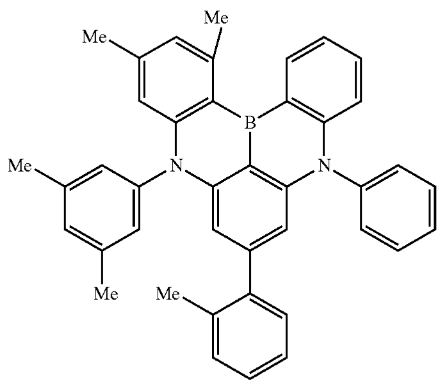
(BN2p-12mS-0220-2)
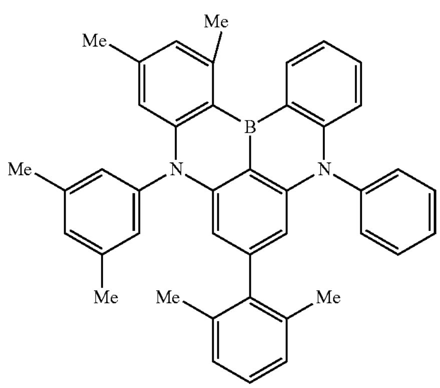
(BN2p-12mS-0220-3)
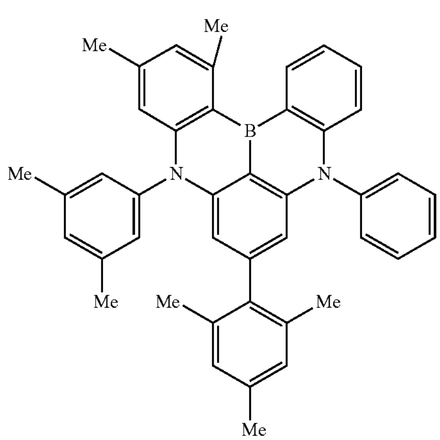
-continued
(BN2p-12mS-0230)
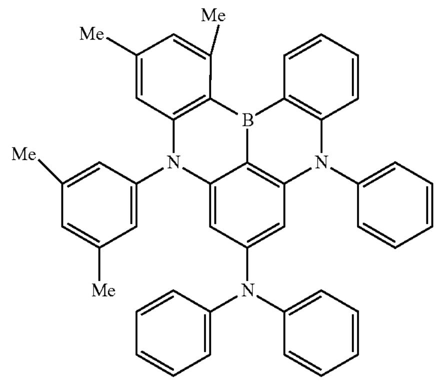
(BN2p-12mS-0231)
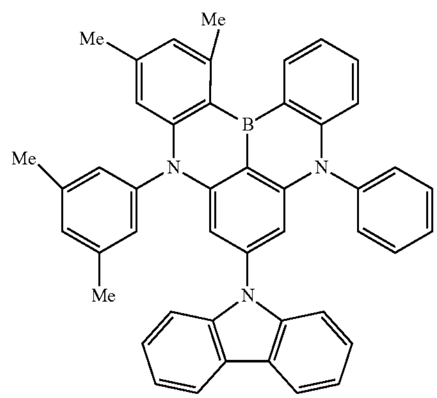
(BN2p-12mS-0230-1)
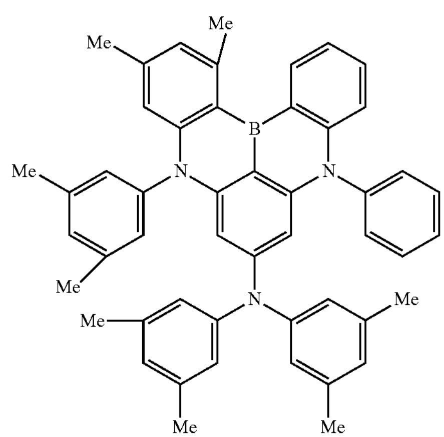
(BN2p-12mS-0001-1)
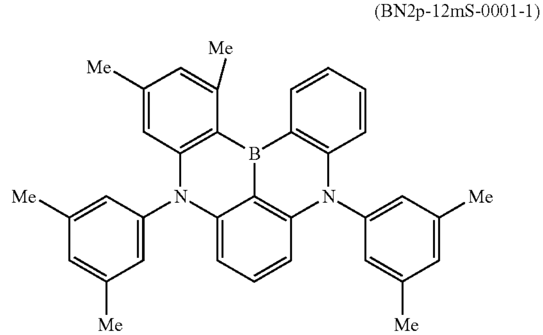

-continued
(BN2p-12mS-0210-1)
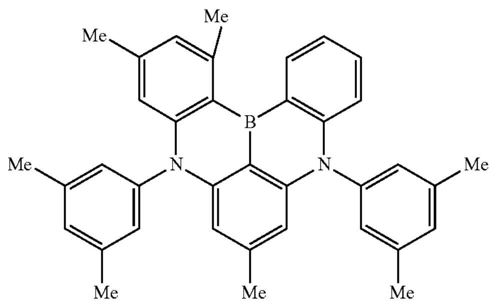
(BN2p-12mS-0211-1)
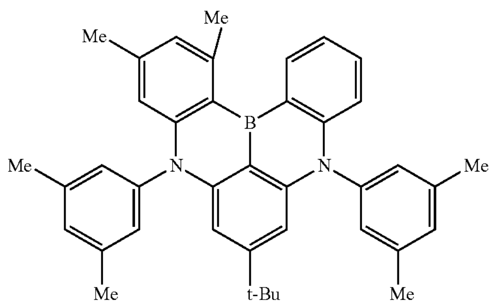
(BN2p-12mS-0220-1)
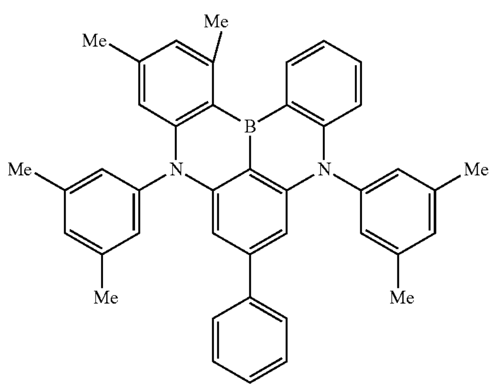
(BN2p-12mS-0220-2)
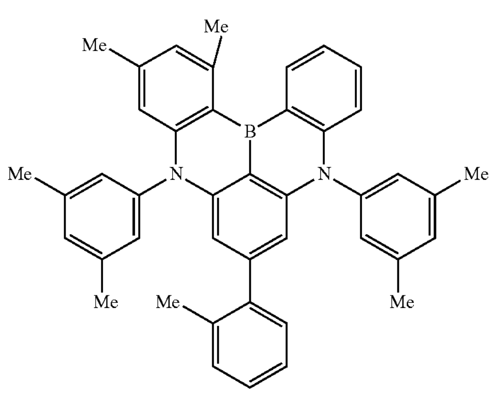
-continued
(BN2p-12mS-0220-3)
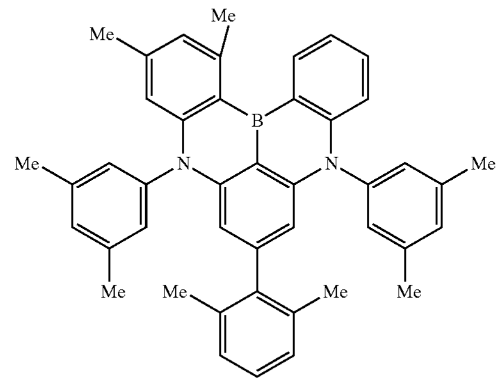
(BN2p-12mS-0220-4)
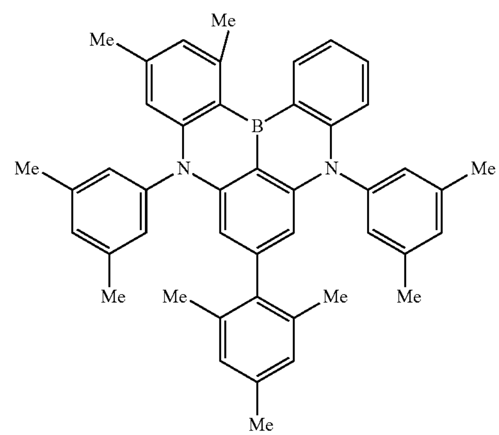
(BN2p-12mS-0230-1)
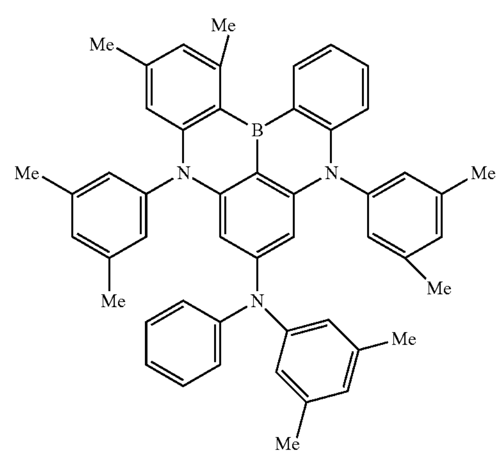

-continued
(BN2p-12mS-0230-2)
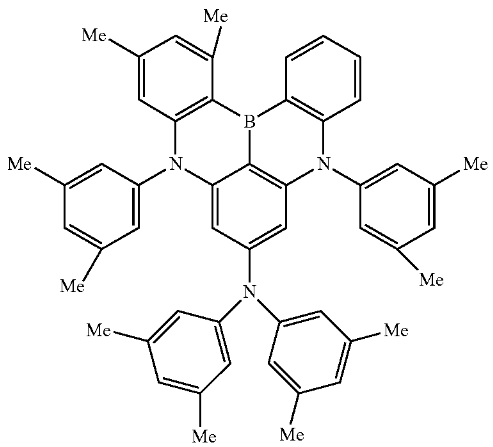
(BN2p-12m-0231-1)
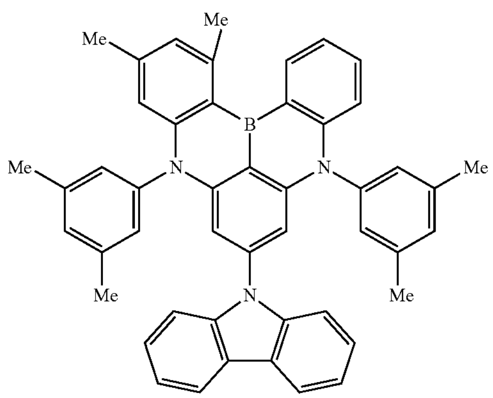
(BN2p-m5p-0231-2)
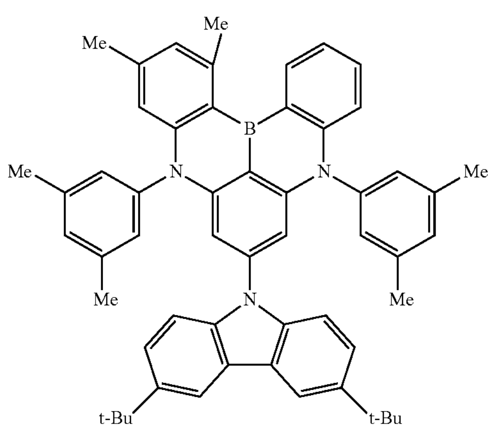
(BN2p-7m-0510) = (BN2p-12m-0001)
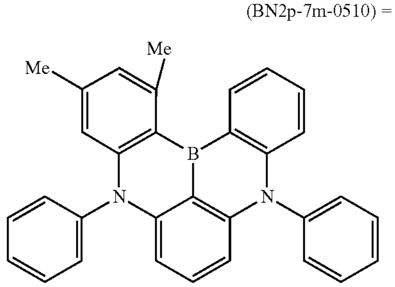
-continued
(BN2p-7m-0511)
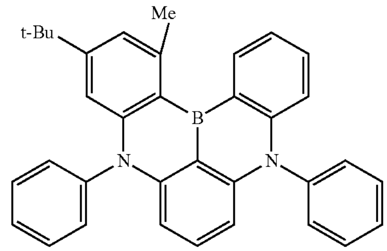
(BN2p-7m-0513)
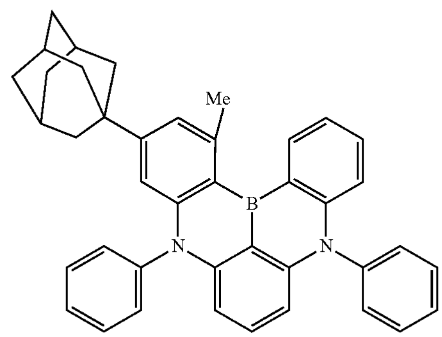
(BN2p-7m-0520)
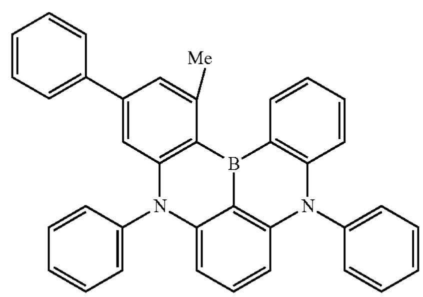
(BN2p-7m-0530)
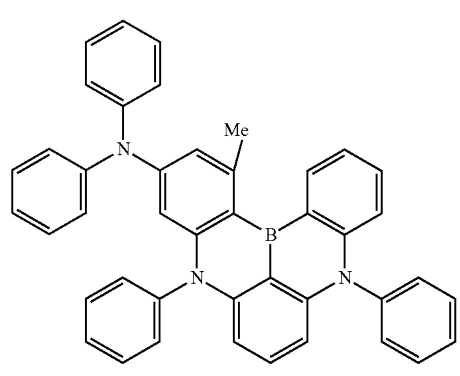

-continued
(BN2p-7m-0531)
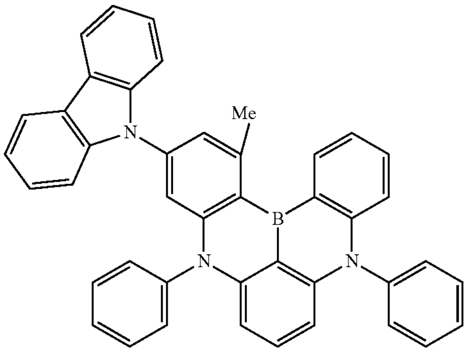
(BN2p-7mS-0512S)
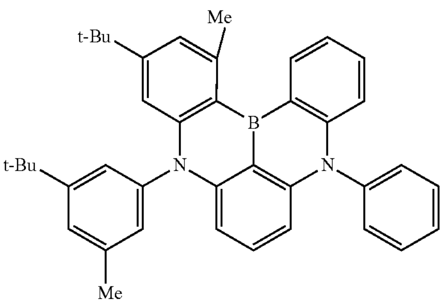
(BN2p-7mS-0520S)
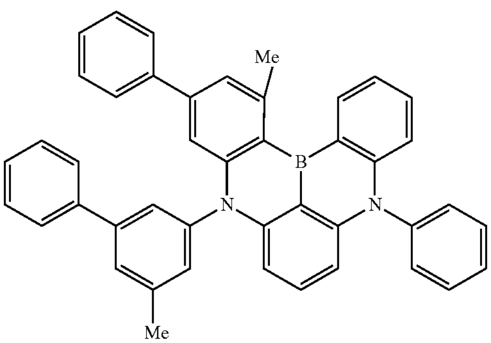
(BN2p-7mS-0530S)
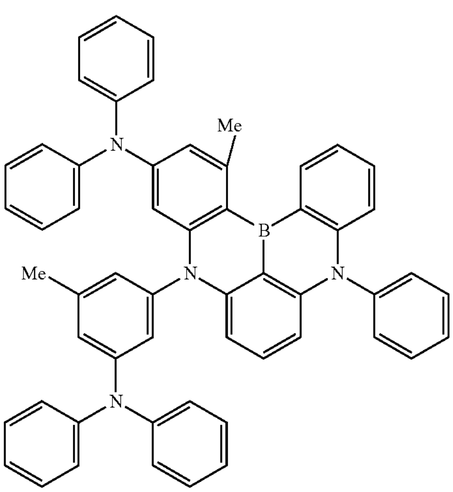
-continued
(BN2p-7mS-0531S)
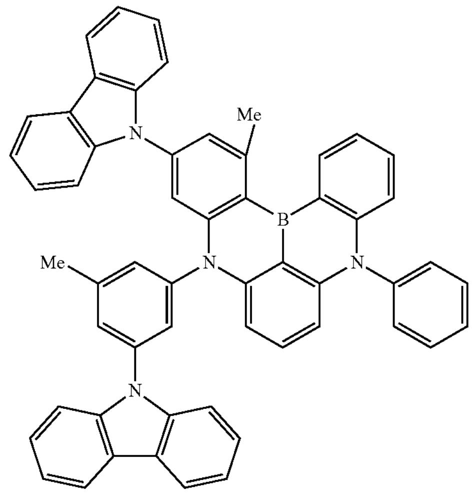
(BN2p-12mS-0910)
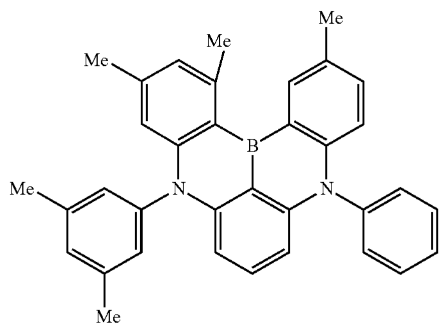
(BN2p-12mS-0912)
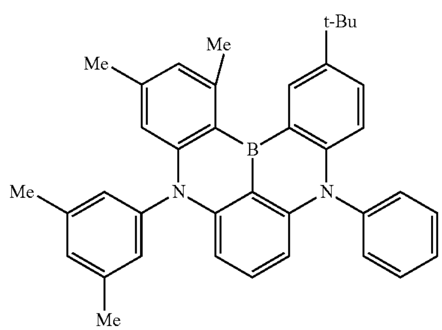
(BN2p-12mS-0920)
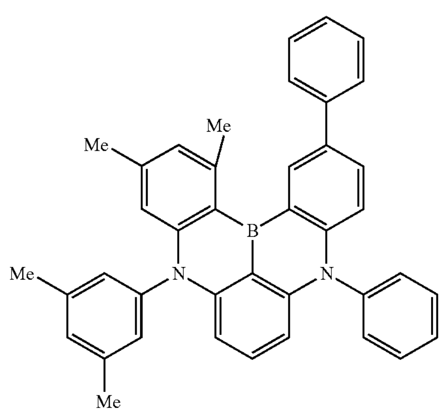

-continued
(BN2p-12mS-0930)
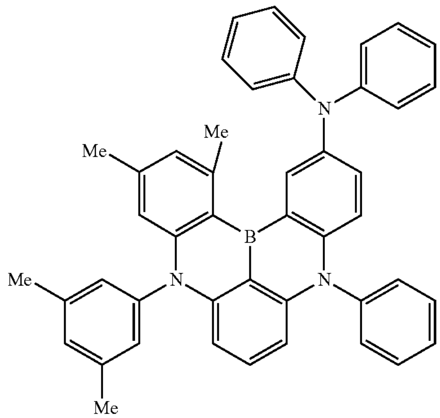
(BN2p-12mS-0931)
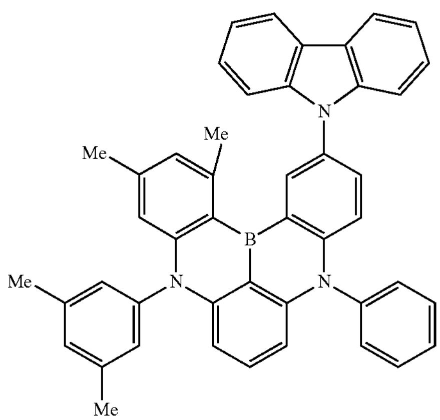
(BN2p-12mS-0913)
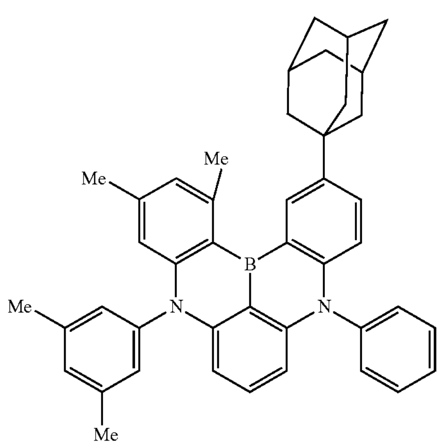
-continued
(BN2p-12mS-0910S)
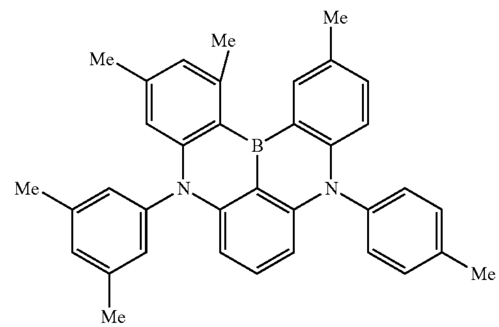
(BN2p-12mS-0911S)
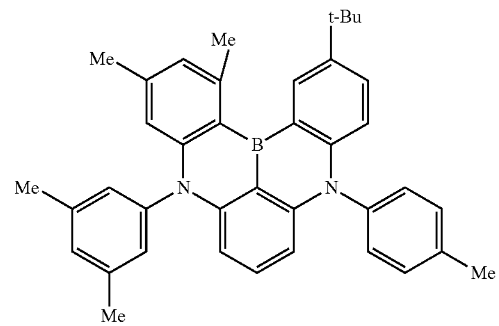
(BN2p-12mS-0920S)
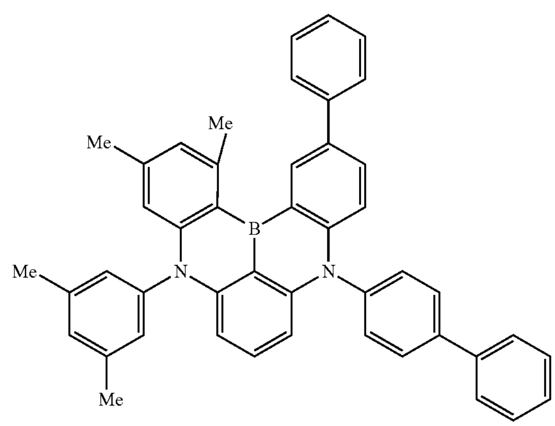
(BN2p-12mS-1010)
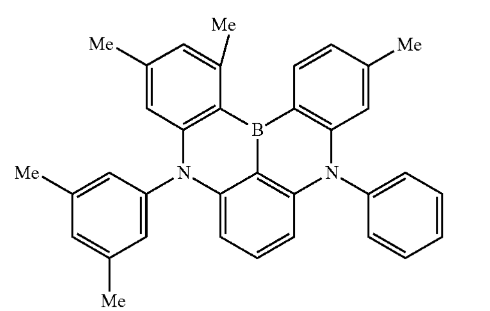

-continued
(BN2p-12mS-1011)
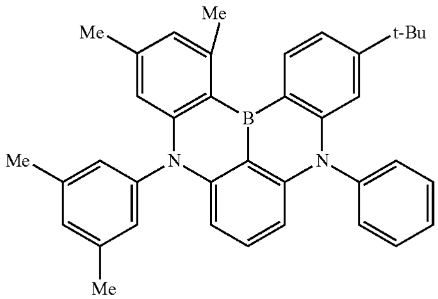
(BN2p-12mS-1013)
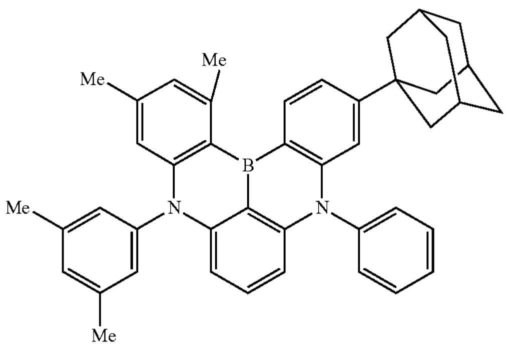
(BN2p-12mS-1020)
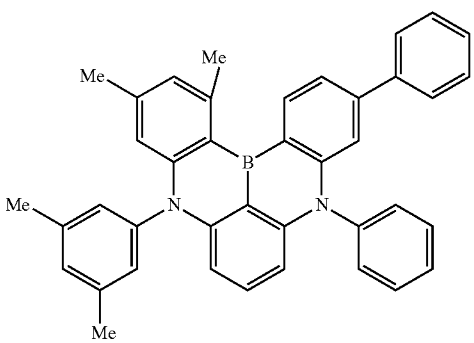
(BN2p-12mS-1030)
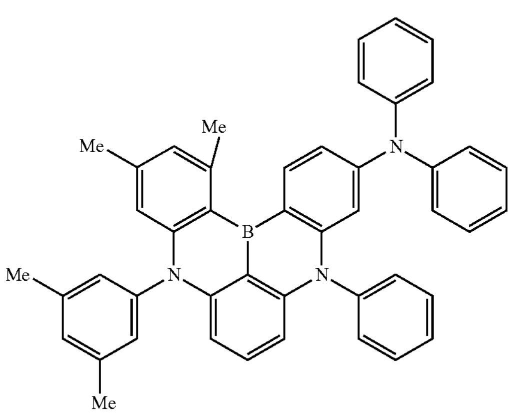
-continued
(BN2p-12mS-1031)
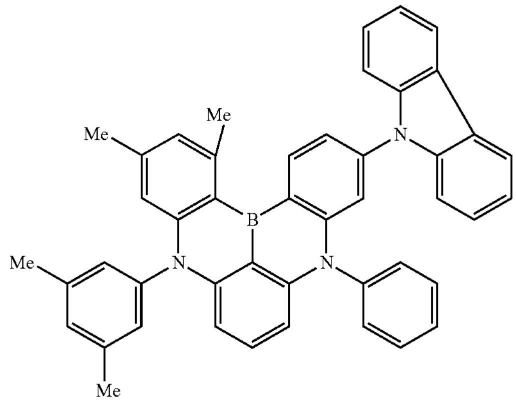
(BN2p-12mS-1010S)
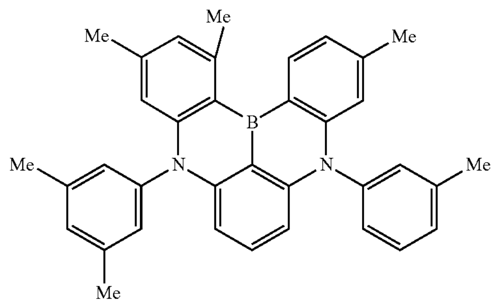
(BN2p-12mS-1011S)
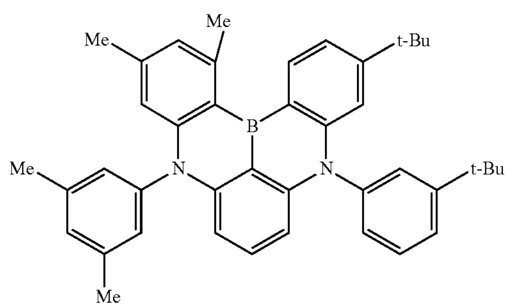
(BN2p-12mS-1020S)
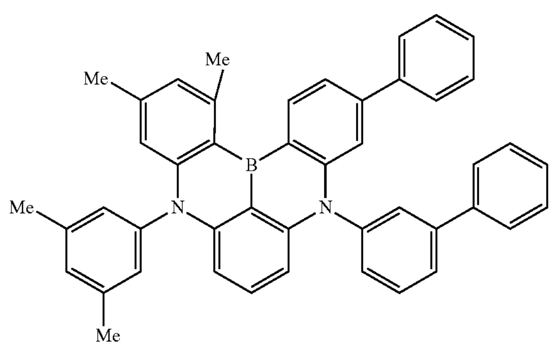

-continued
(BN2p-12mS-1010S-1)
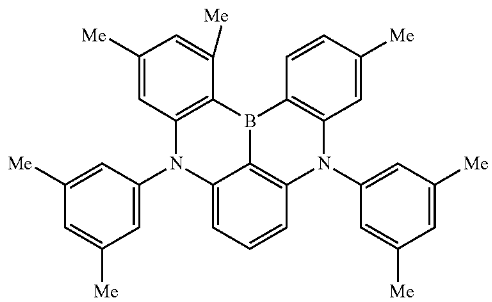
(BN2p-12mS-1011S-1)
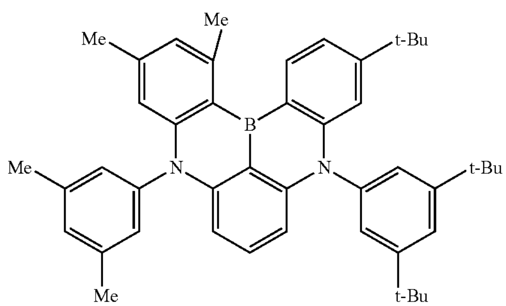
(BN2p-12mS-1020-1)
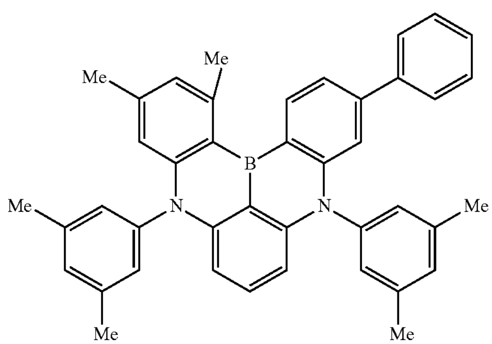
(BN2p-30mS-0001)
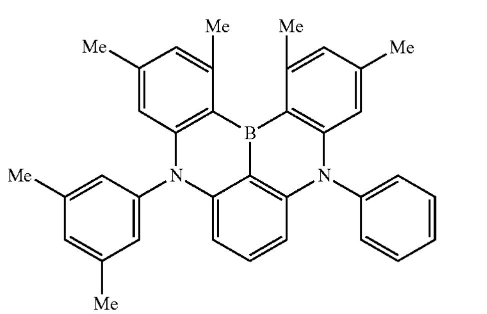
-continued
(BN2p-30mS-0001-1) = (BN2p-30mS/S-0001)
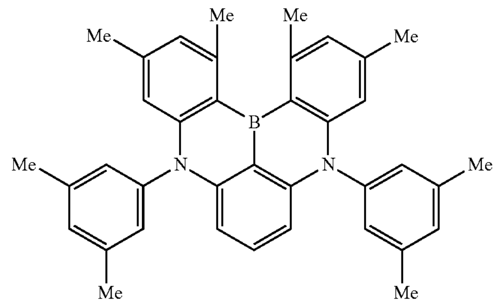
(BN2p-30mS-0001-2)
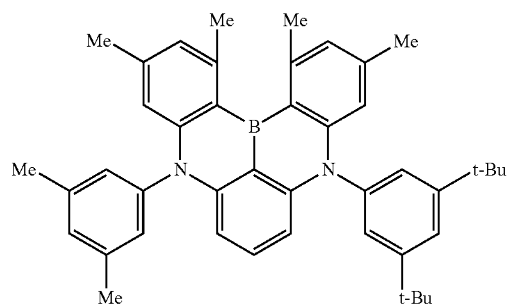
(BN2p-30mS/S-0210)
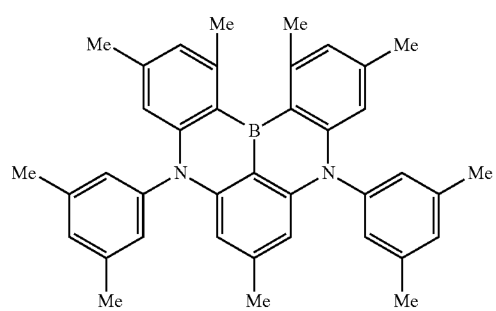
(BN2p-30mS/S-0211)
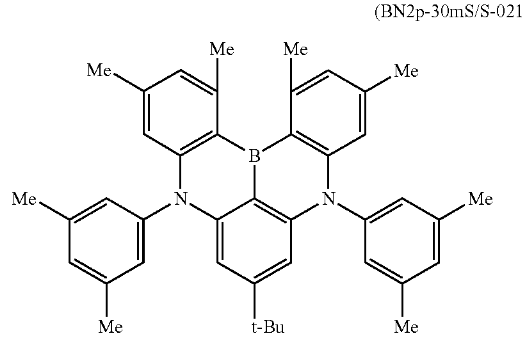

-continued
(BN2p-30mS/S-0213)
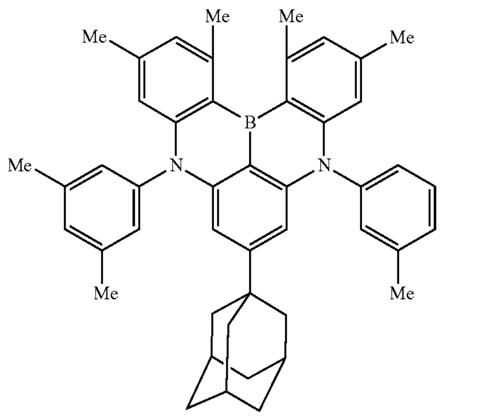
(BN2p-30mS/S-0220)
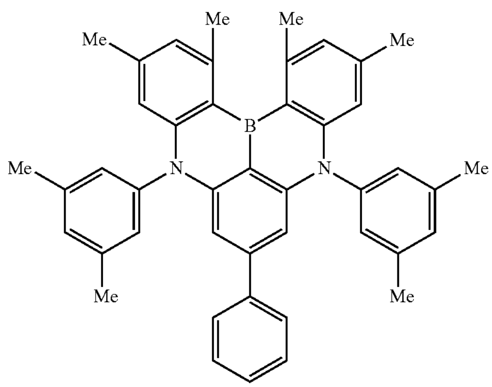
(BN2p-30mS/S-0220-1)
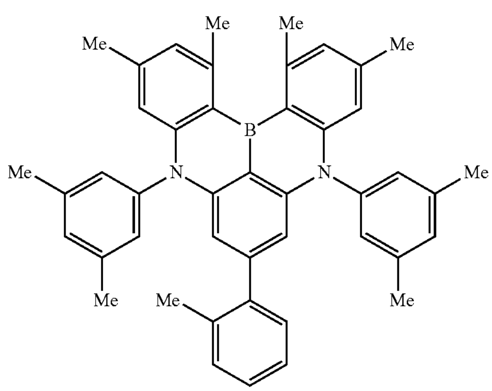
(BN2p-30mS/S-0220-2)
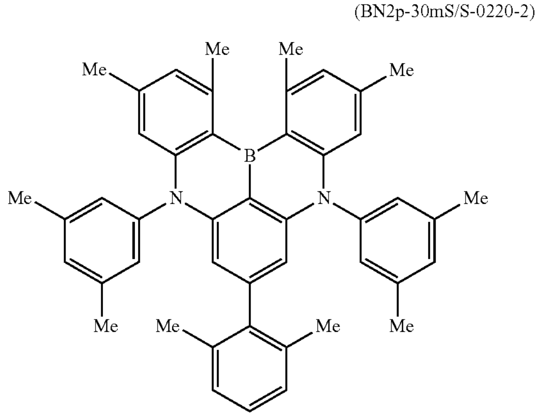
-continued
(BN2p-30mS/S-0220-3)
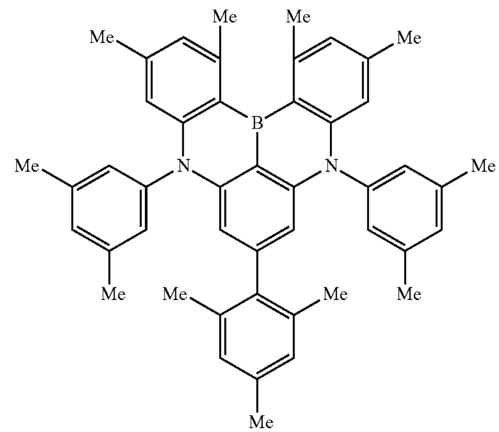
(BN2p-30mS/S-0230)
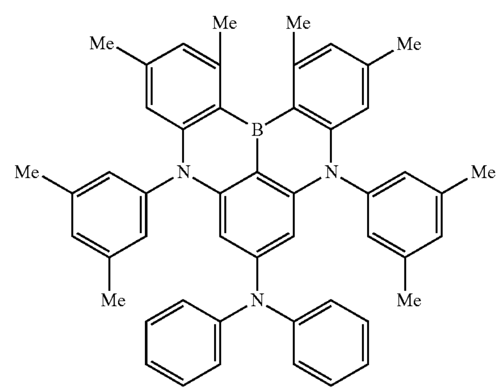
(BN2p-30mS/S-0231)
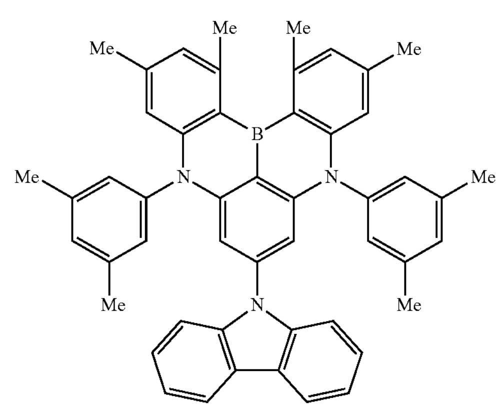

-continued
(BN2p-30mS/S-0230-1)
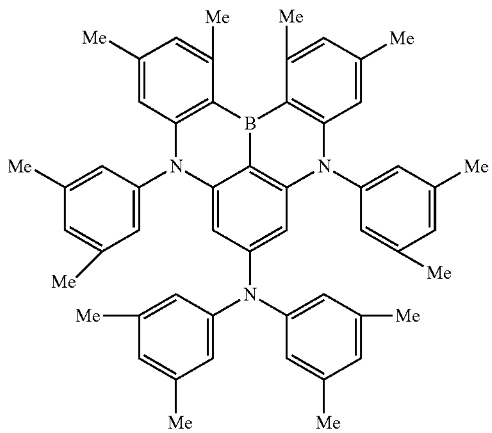
(BONp-12m-0210)
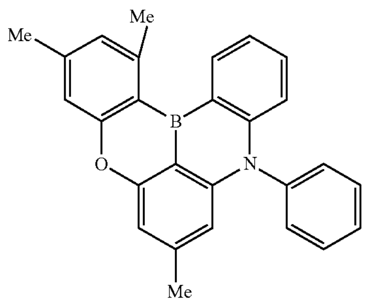
(BONp-12m-0211)
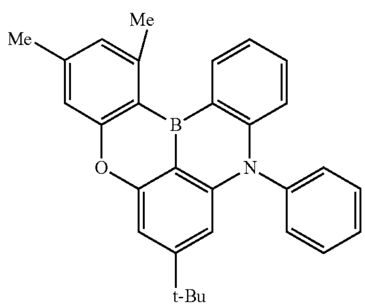
(BONp-12m-0220)
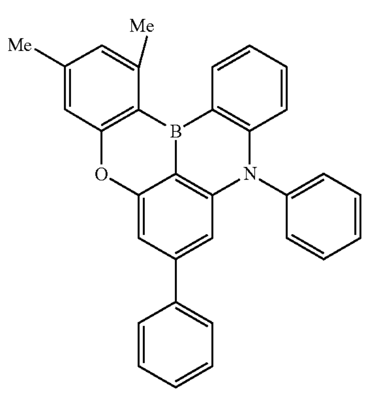
-continued
(BONp-12m-0230)
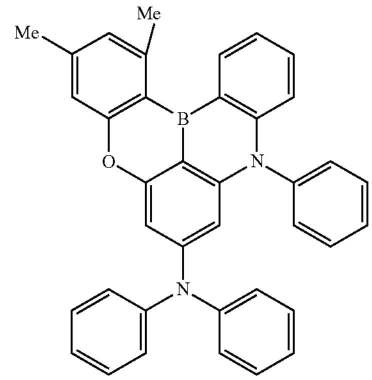
(BONp-12m-0231)
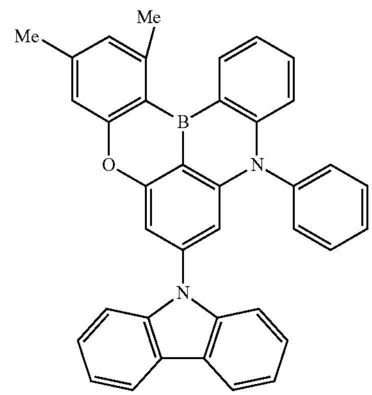
(BONp-12m-0220-1)
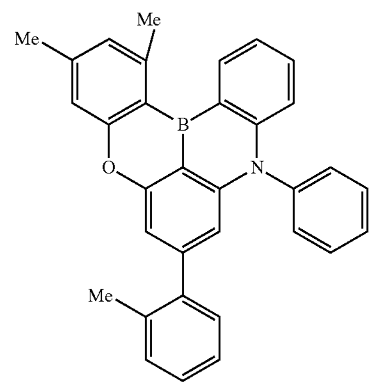
(BONp-12m-0220-2)
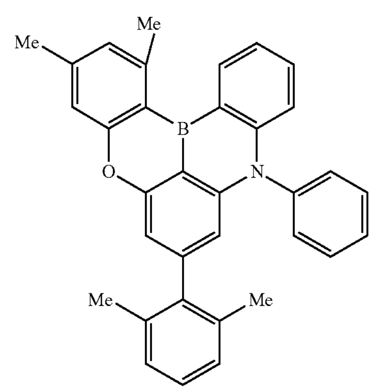

-continued
(BONp-12m-0220-3)
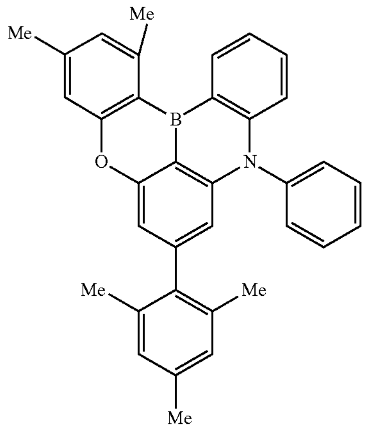
(BONp-12m-0310)
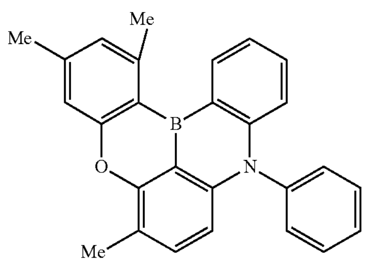
(BONp-12m-0311)
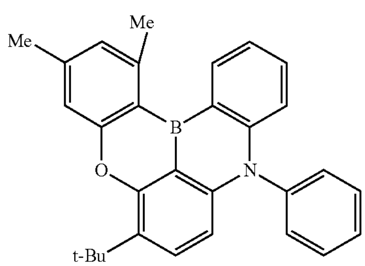
(BONp-12m-0320)
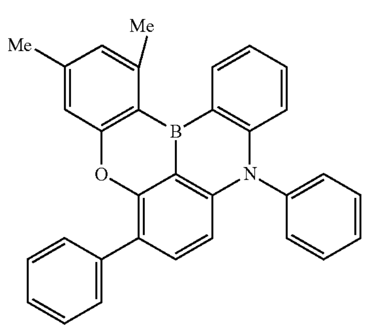
-continued
(BONp-12m-0321)
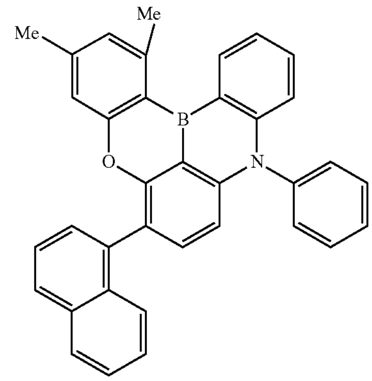
(BONp-12m-0322)
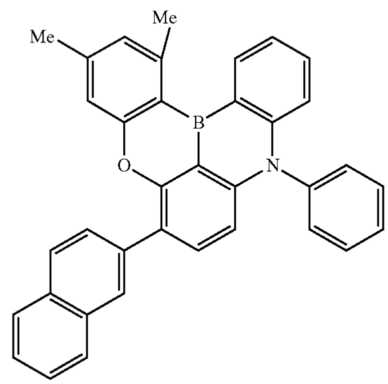
(BONp-12m-0320-1)
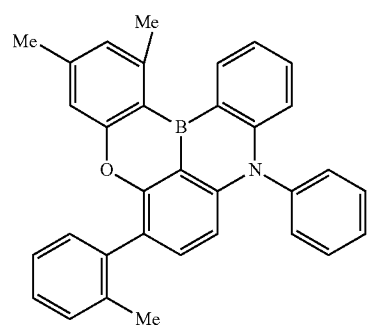
(BONp-12m-0320-2)
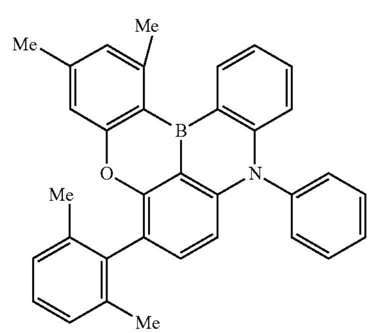

-continued
(BONp-12m-0320-3)
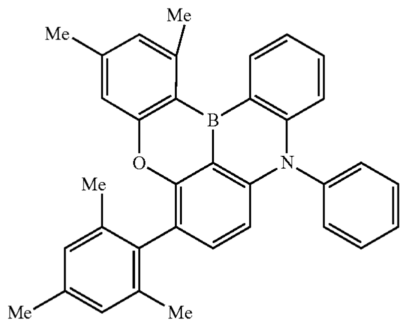
(BONp-12m-0330)
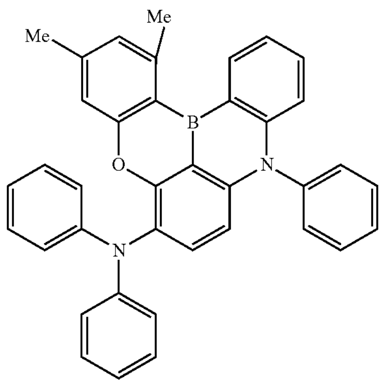
(BONp-12m-0331)
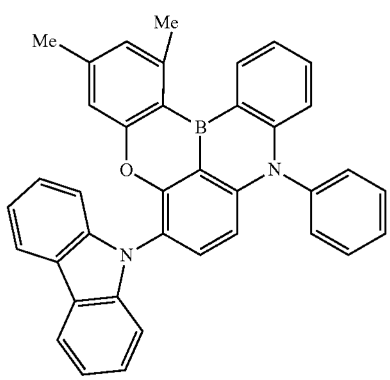
(BONp-7m-0510) = (BONp-12m-0001)
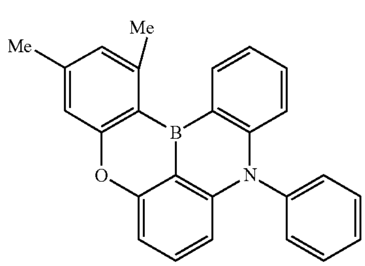
-continued
(BONp-7m-0511)
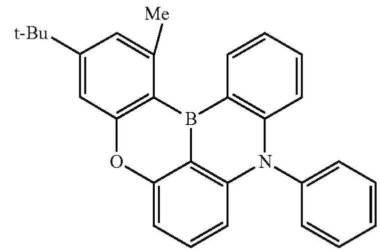
(BONp-7m-0520)
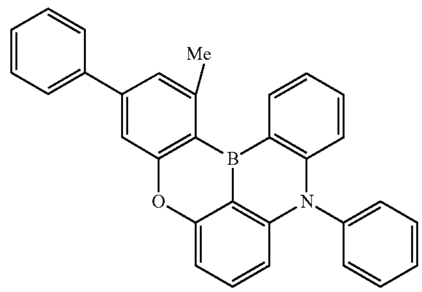
(BONp-7m-0530)
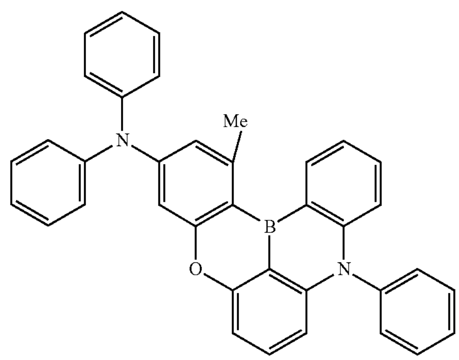
(BONp-7m-0531)
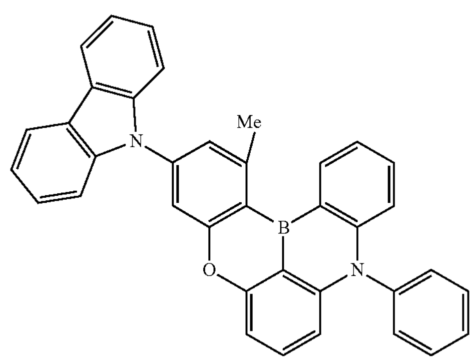
(BONp-12m-0910)
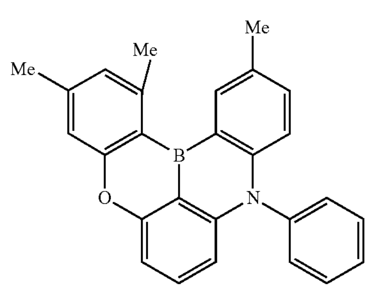

-continued
(BONp-12m-0911)
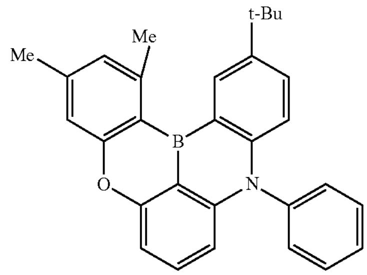
(BONp-12m-0920)
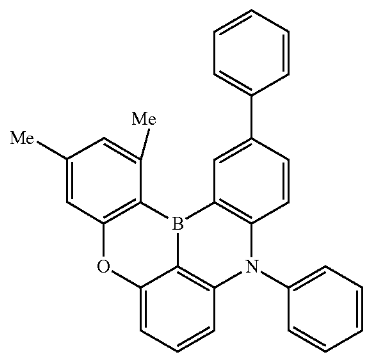
(BONp-12m-0930)
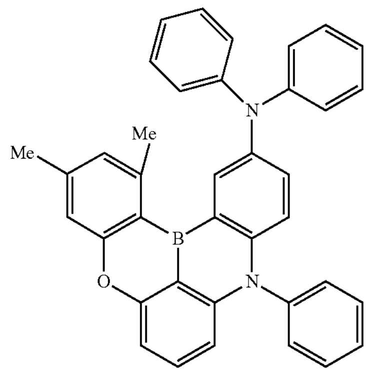
(BONp-12m-0931)
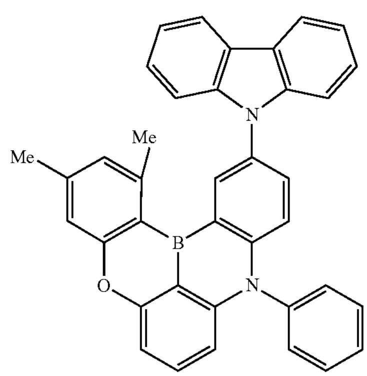
(BONp-12m-1010)
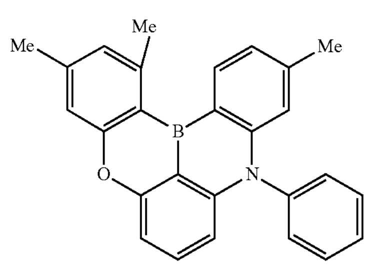
-continued
(BONp-12m-1020)
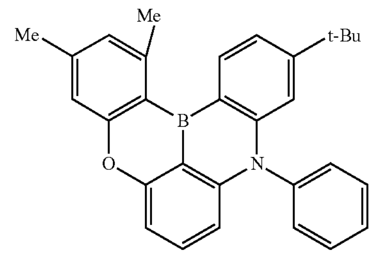
(BONp-12m-1021)
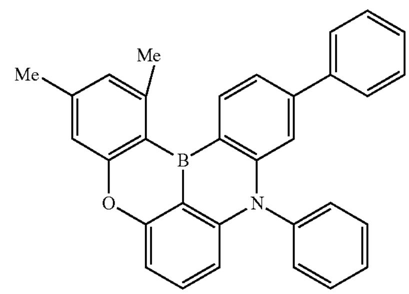
(BONp-12m-1030)
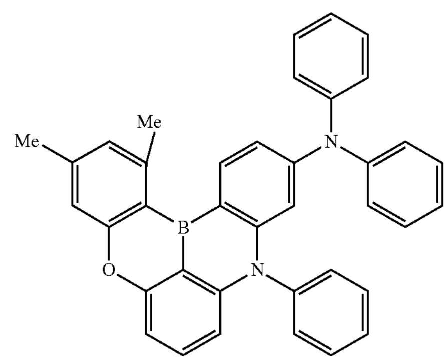
(BONp-12m-1031)
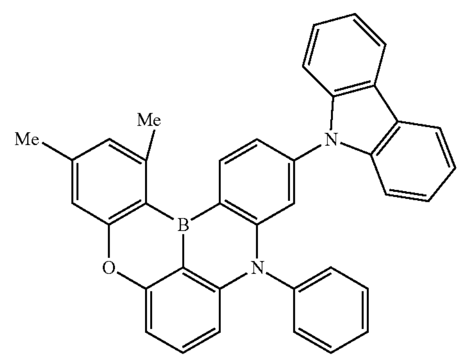
(BNpO-12m-0110)
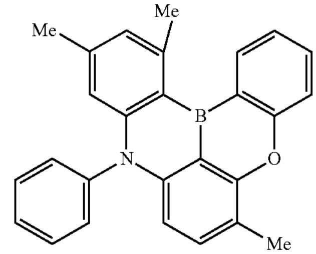

-continued
(BNpO-12m-0111)
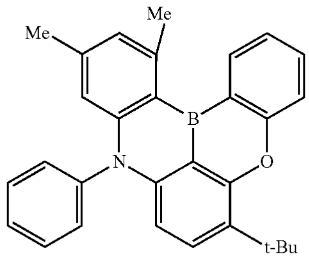
(BNpO-12m-0120)
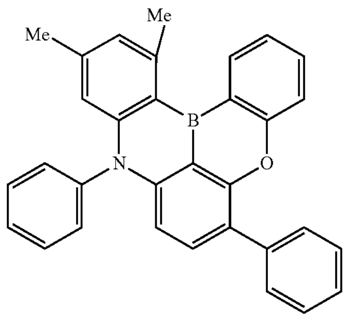
(BNpO-12m-0130)
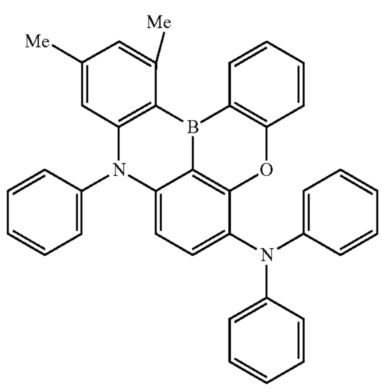
(BNpO-12m-0131)
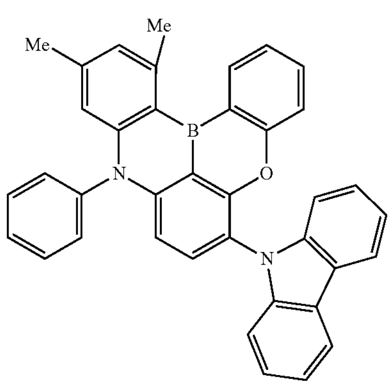
-continued
(BNpO-12m-0120-1)
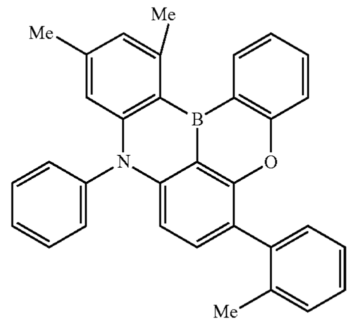
(BNpO-12m-0120-2)
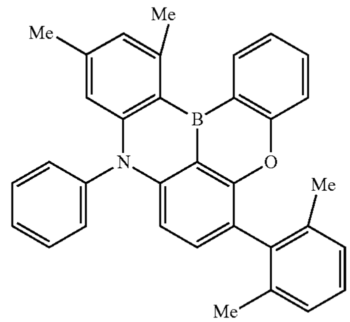
(BNpO-12m-0120-3)
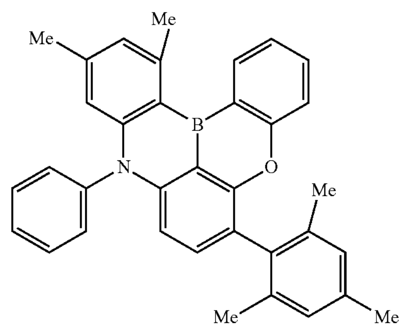
(BNpO-12m-0210)
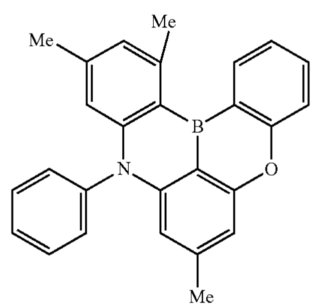
(BNpO-12m-0211)
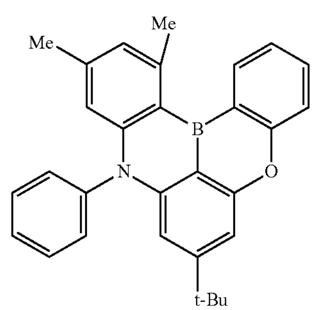

(BNpO-12m-0220)
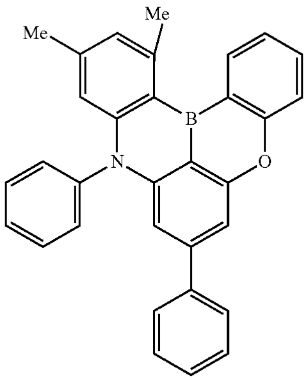
(BNpO-12m-0230)
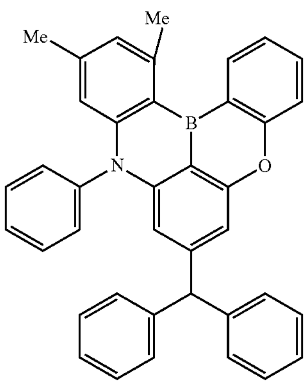
(BNpO-12m-0231)
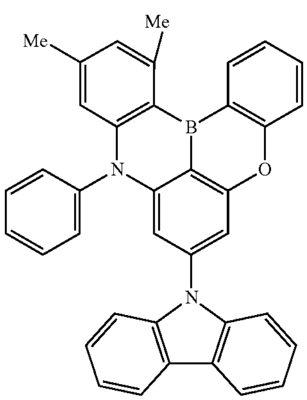
(BNpO-12m-0220-1)
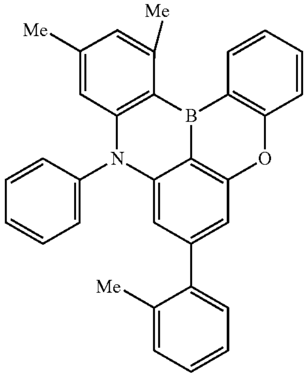
(BNpO-12m-0220-2)
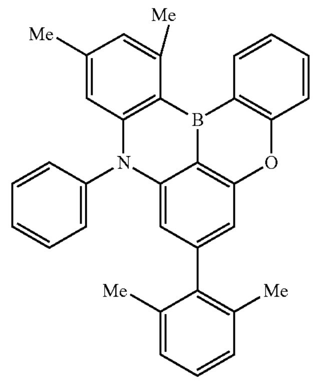
(BNpO-12m-0220-3)
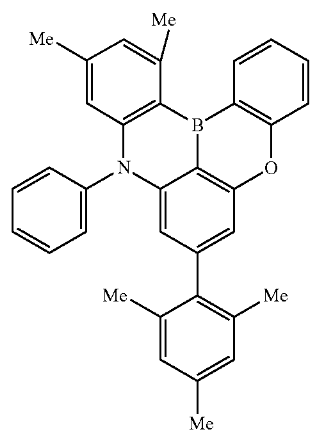
(BNpO-12m-0230-1)
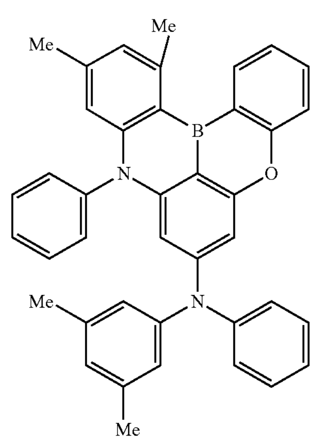

-continued
(BNpO-12m-0230-2)
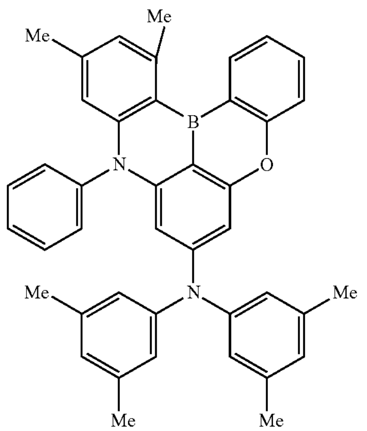
(BNpO-7m-0510) = (BNpO-12m-0001)
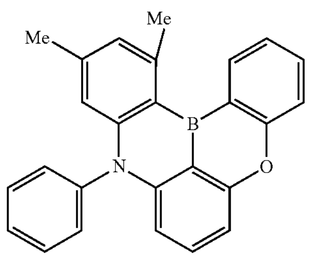
(BNpO-7m-0511)
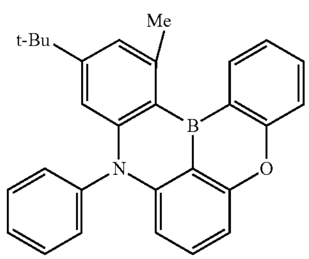
(BNpO-7m-0520)
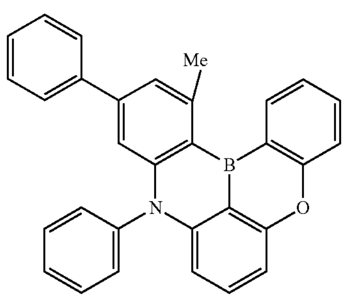
(BNpO-7m-0530)
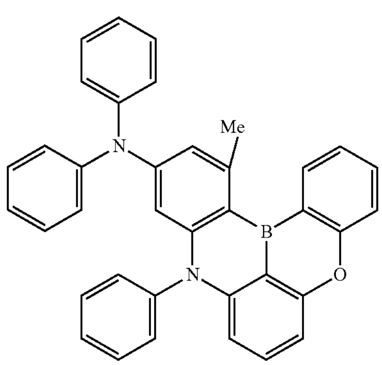
-continued
(BNpO-7m-0531)
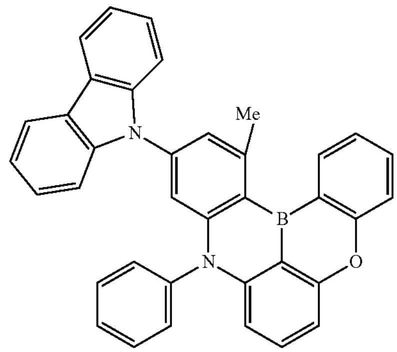
(BNpO-12m-0910)
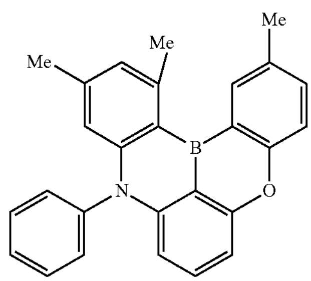
(BNpO-12m-0911)
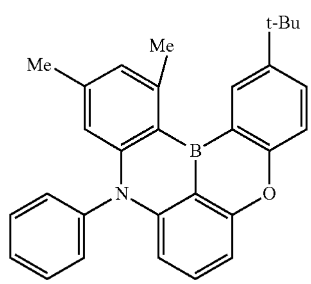
(BNpO-12m-0920)
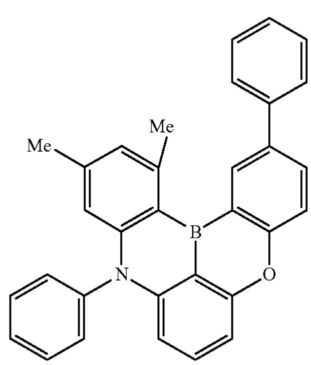

(BNpO-12m-0930)
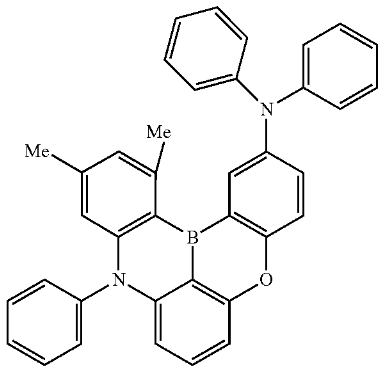
(BNpO-12m-0931)
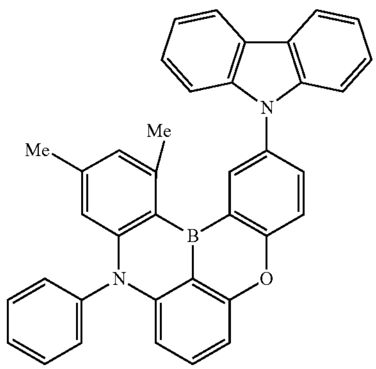
(BNpO-12m-1010)
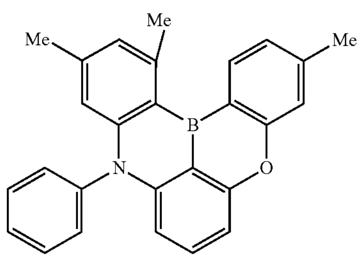
(BNpO-12m-1011)
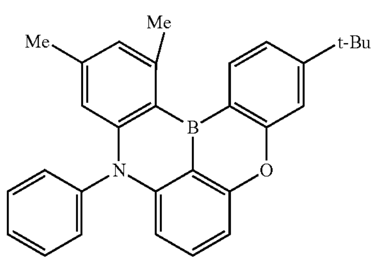
(BNpO-12m-1020)
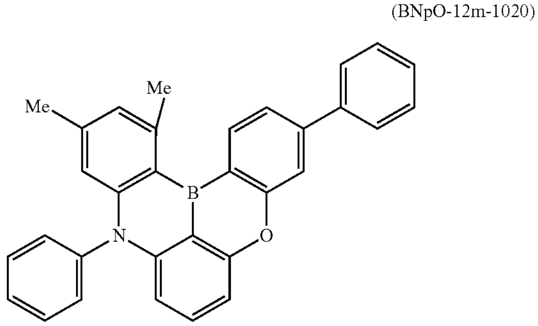
(BNpO-12m-1030)
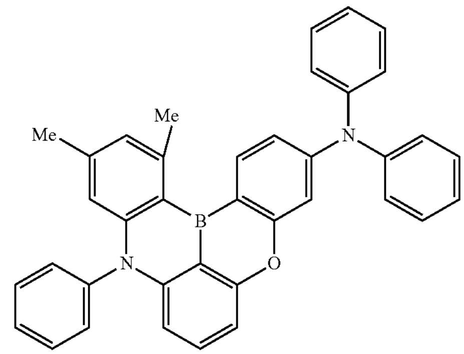
(BNpO-12m-1031)
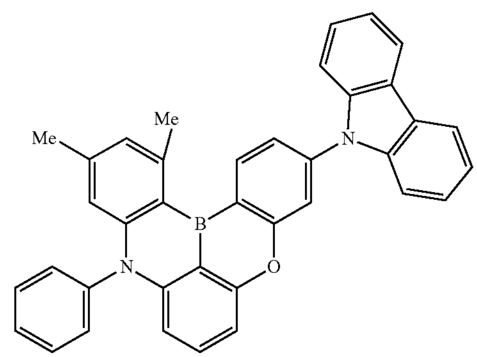
(BNpO-12mS-0210)
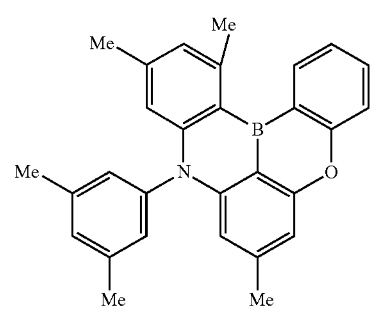
(BNpO-12mS-0211)
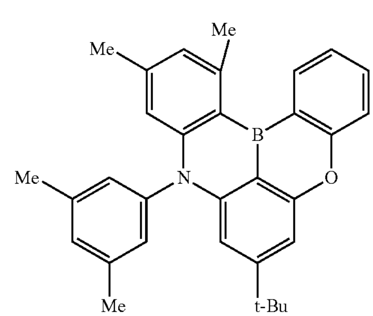

-continued
(BNpO-12mS-0220)
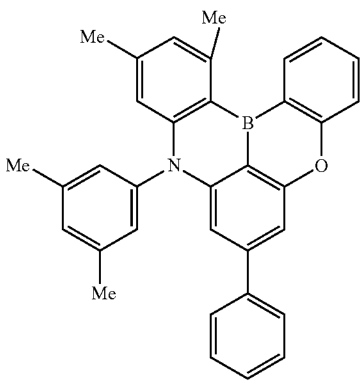
(BNpO-12mS-0230)
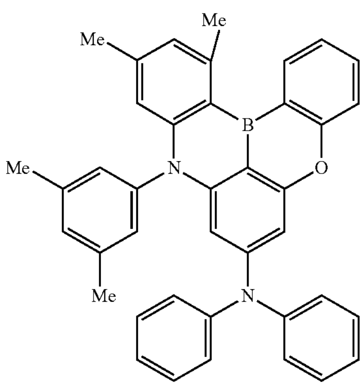
(BNpO-12mS-0231)
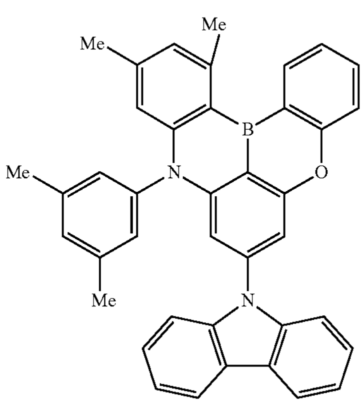
(BNpO-12mS-0220-1)
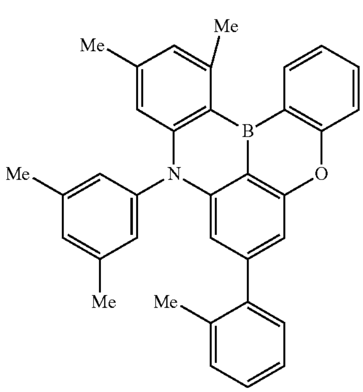
-continued
(BNpO-12mS-0220-2)
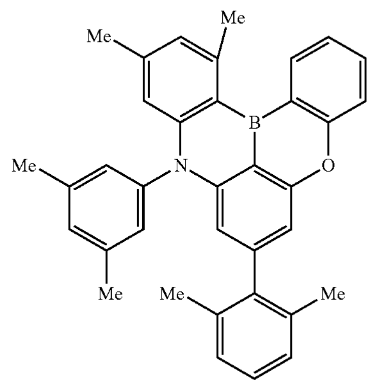
(BNpO-12mS-0220-3)
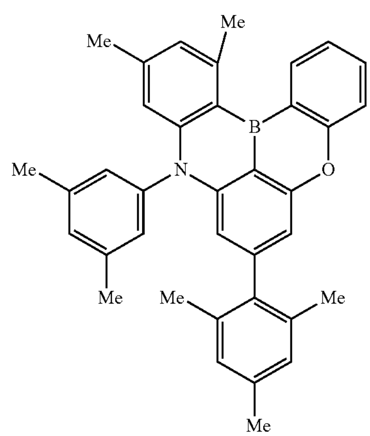
(BNpO-12mS-0230-1)
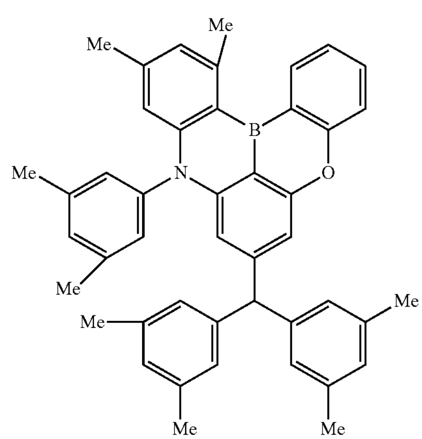
(BNpO-7mS-0510S) = (BNpO-12mS-0001)
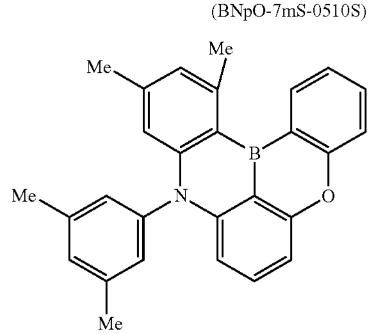

-continued
(BNpO-7mS-0511S)
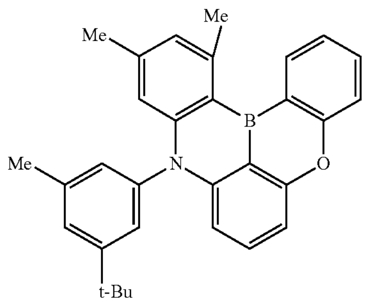
(BNpO-7mS-0520S)
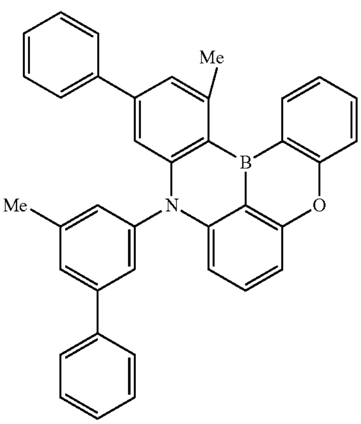
(BNpO-7mS-0531S)
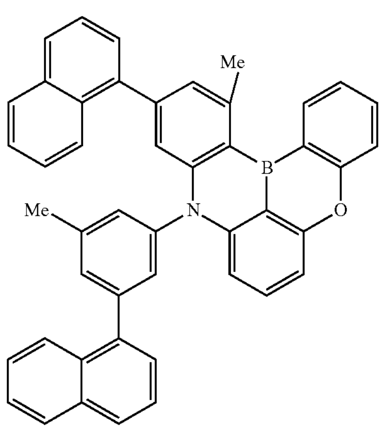
-continued
(BNpO-7mS-0532S)
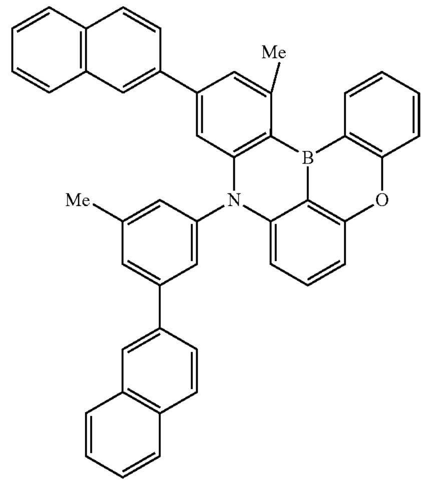
(BNpO-12mS-0910)
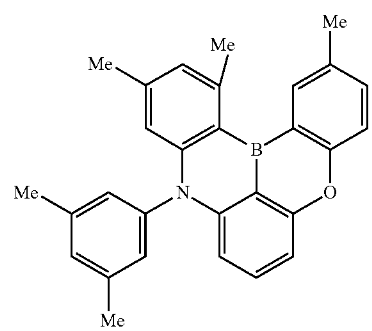
(BNpO-12mS-0911)
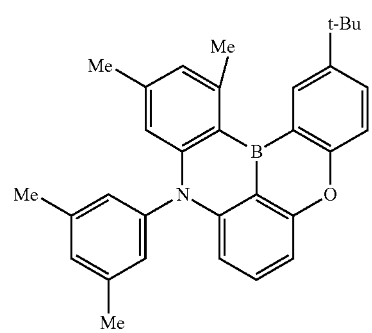
(BNpO-12mS-0920)
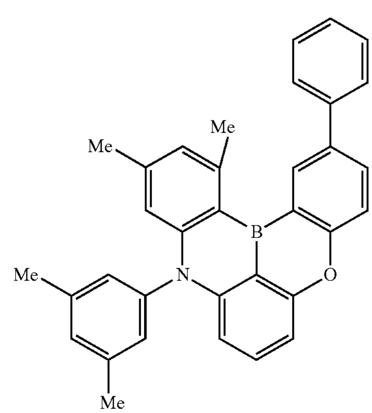

(BNpO-12mS-0930)
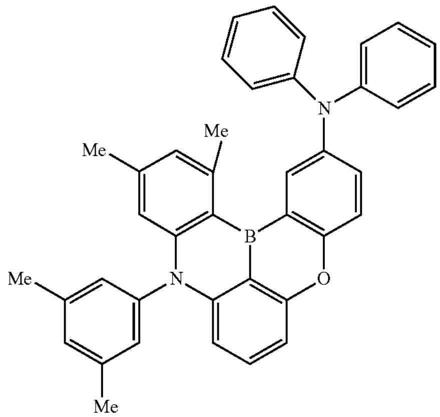
(BNpO-12mS-0931)
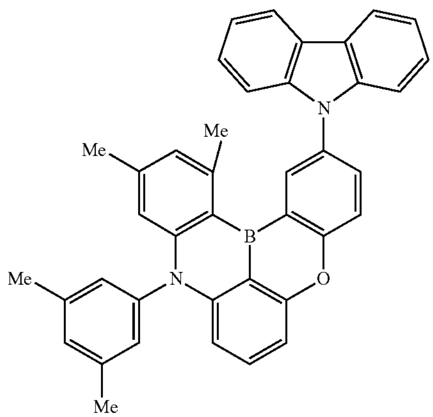
(BNpO-12mS-1010)
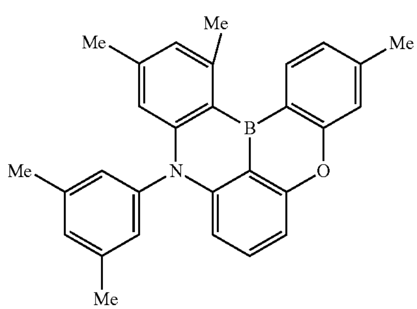
(BNpO-12mS-1011)
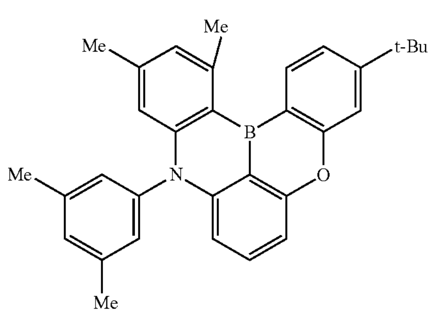
(BNpO-12mS-1020)
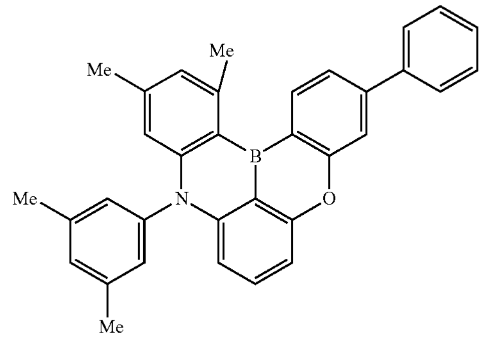
(BNpO-12mS-1030)
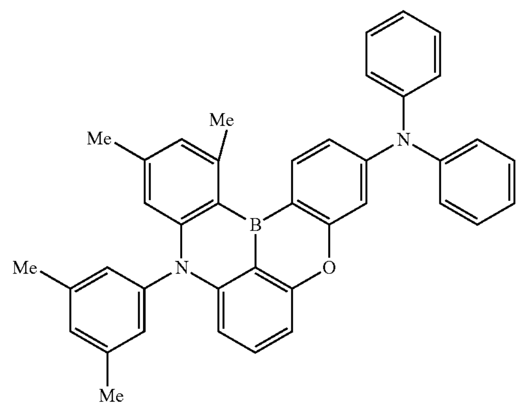
(BNpO-12mS-1031)
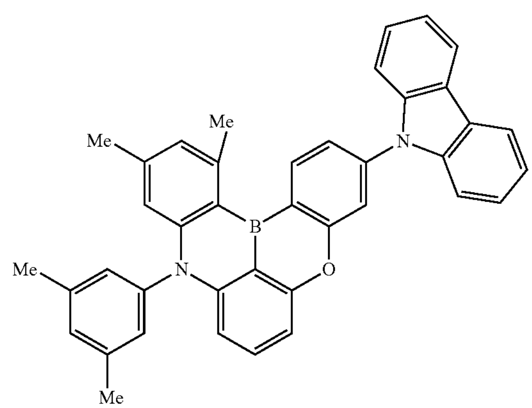
(BN2p-30mS-0001)
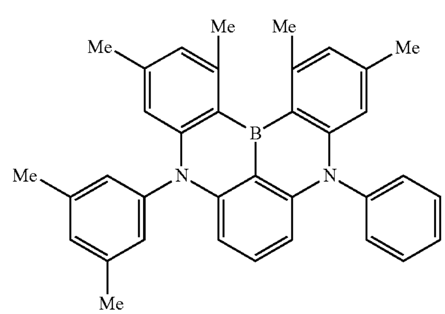

-continued (BN2p-30mS-0210)

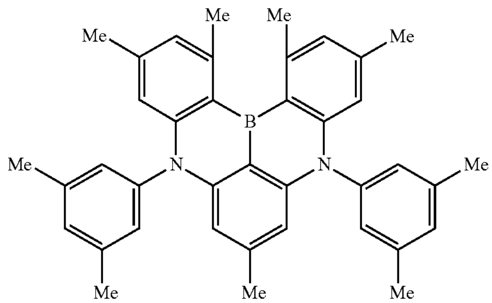

(BN2p-30mS-0230)

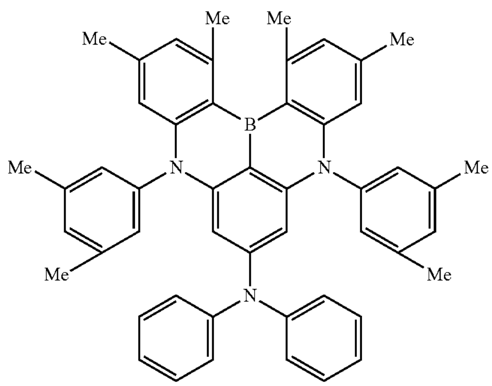

(BN2p-30mS-0231)

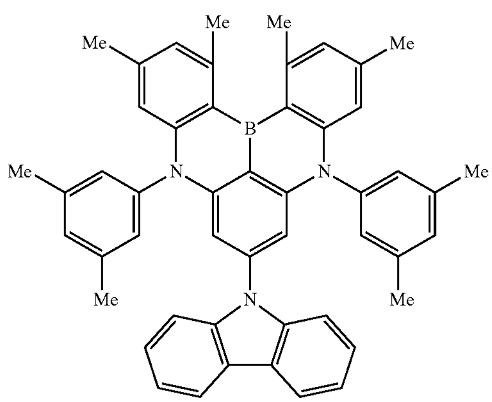

(BN2p-30mS-0230-1)

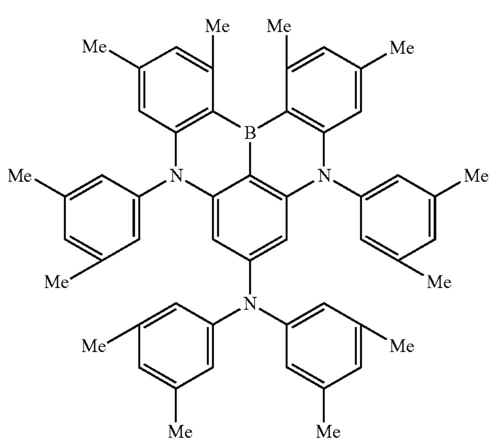

-continued (BN2p-30mS-0231-1)

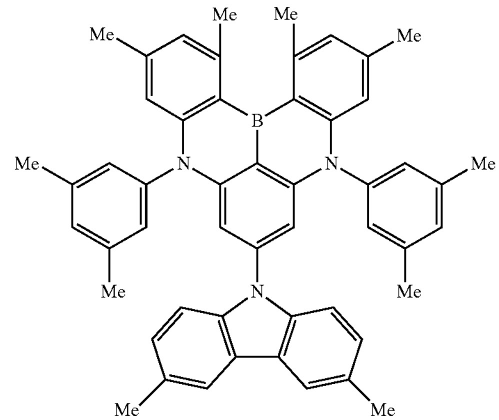

(BN2p-30mS-0231-2)

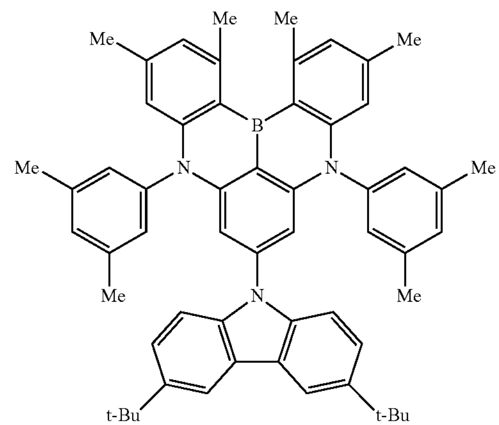

Regarding the formulae (AD21) and (AD22) for use as the second component in the light-emitting layer, the compounds have realized a short delayed fluorescence lifetime by (i) introducing an element for controlling the multi-resonance effect into an appropriate position. Regarding this (i), the polycyclic aromatic compounds represented by the general formulae (AD21) and (AD22) in the present invention can have some influence on the multi-resonance effect of the molecule by appropriate introduction of >O and >N—R into the compounds. Specifically, the compounds of the type include those having any of the following structural formulae. In the following formulae, Me represents a methyl, and t-Bu represents a t-butyl.

(1-8000-R100)

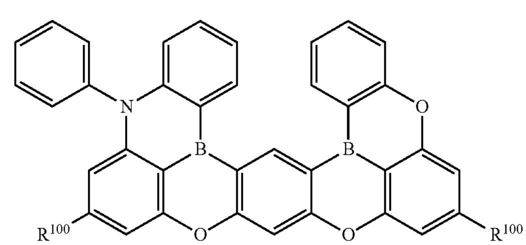

-continued (1-8100-R100)

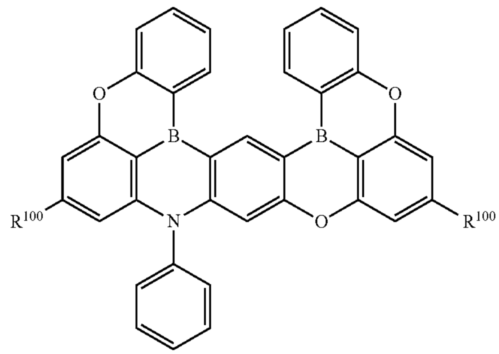

(1-8010-R100)

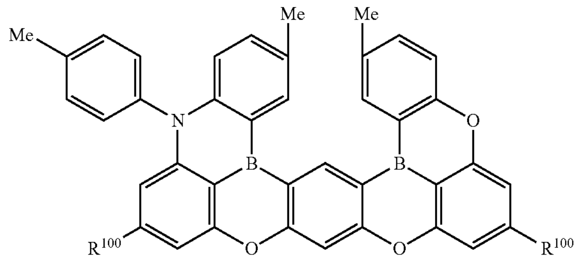

(1-8110-R100)

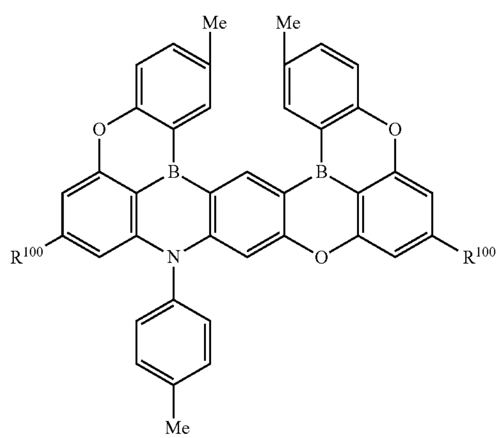

(1-8020-R100)

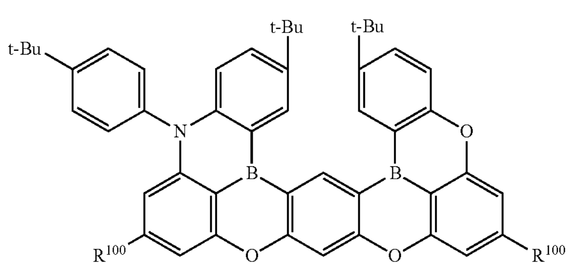

-continued (1-8120-R100)

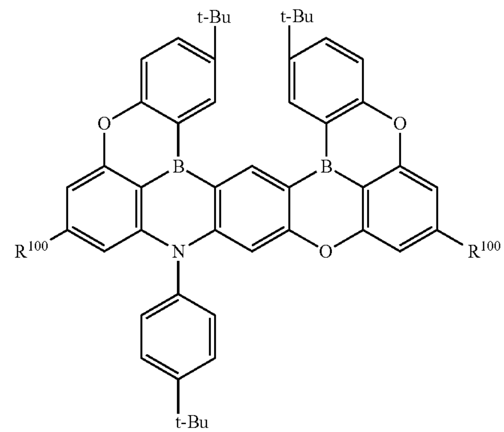

At least one hydrogen in the compounds represented by the above formulae may be substituted with an alkyl having a carbon number of 1 to 6, a cyano, a halogen or a deuterium, and $R^{100}$ in the formulae each are independently an aryl having a carbon number of 6 to 10, a carbazolyl, a diarylamino (where the aryl has a carbon number of 6 to 10), a diheteroarylamino (where the heteroaryl has a carbon number of 2 to 15), an arylheteroarylamino (where the aryl has a carbon number of 6 to 12, and the heteroaryl has a carbon number of 2 to 15), an alkyl having a carbon number of 1 to 6, a cycloalkyl having a carbon number of 3 to 10, or an aryloxy having a carbon number of 6 to 10, the aryl may be substituted with an alkyl having a carbon number of 1 to 6, and the carbazolyl may be substituted with an aryl having a carbon number of 6 to 10 or an alkyl having a carbon number of 1 to 6.

Depending on the steric hindrance, the electron-donating performance and the electron-accepting performance of the structure of $R^{100}$, light emission wavelength can be controlled. Preferably, the group is represented by the following formula, and is more preferably a methyl, a t-butyl, a phenyl, an o-tolyl, a p-tolyl, a 2,4-xylyl, a 2,5-xylyl, a 2,6-xylyl, a 2,4,6-mesityl, a diphenylamino, a di-p-tolylamino, a bis(p-(t-butyl)phenyl)amino, a carbazolyl, a 3,6-dimethylcarbazolyl, a 3,6-di-t-butylcarbazolyl and a phenoxy, even more preferably a methyl, a t-butyl, a phenyl, an o-tolyl, 2,6-xylyl, a 2,4,6-mesityl, a diphenylamino, a di-p-tolylamino, a bis(p-(t-butyl)phenyl)amino, a carbazolyl, a 3,6-dimethylcarbazolyl and a 3,6-di-t-butylcarbazolyl. From the viewpoint of easiness in synthesis, a group having a larger steric hindrance is preferred for selective synthesis, and specifically, a t-butyl, an o-tolyl, a p-tolyl, a 2,4-xylyl, a 2,5-xylyl, a 2,6-xylyl, a 2,4,6-mesityl, a di-p-tolylamino, a bis(p-(t-butyl)phenyl)amino, a 3,6-dimethylcarbazolyl and a 3,6-di-t-butylcarbazolyl are preferred.

Also preferably, the thermally assisting delayed fluorescent material (TADF compound) for use in the present invention is a donor-acceptor-type TADF compound (D-A-type TADF compound) that is so designed that, using an electron-donating substituent called a donor and an electron-accepting substituent called an acceptor, HOMO (highest occupied molecular orbital) and LUMO (lowest unoccupied molecular orbital) in the molecule are localized to induce efficient reverse intersystem crossing.

Here, in the present description, "electron-donating substituent" (donor) means a substituent and a partial structure in which HOMO is localized in the TADF compound molecule, and "electron-accepting substituent" (acceptor) means a substituent and a partial structure in which LUMO is localized in the TADF compound molecule.

In general, a TADF compound using a donor and an acceptor has a large spin orbit coupling (SOC) owing to the structure thereof and has a small interaction between HOMO and LUMO to have a small ΔE(ST), and therefore the compound can have an extremely high reverse intersystem crossing speed. On the other hand, a TADF compound using a donor and an acceptor may experience large structure relaxation in an excited state (in some molecules, the ground state and the excited state differ in the stable structure and therefore once the compound has undergone conversion from a ground state to an excited state owing to some external stimuli, the structure thereafter changes to a stable structure in an excited state), and gives a broad emission spectrum, and therefore, when used as a light-emitting material, there is a possibility that the compound may lower the color purity.

In the present invention, for example, a D-A-type TADF compound in which a donor and an acceptor bond via a spacer can be used as the thermally assisting delayed fluorescent material (TADF compound). The D-A-type TADF compound includes compounds represented by the following formula (AD31). In the formula (AD31), the parenthesized structure corresponds to a donor, the group represented by Q corresponds to an acceptor, and the phenylene group that links the parenthesized structure and Q corresponds to a spacer.

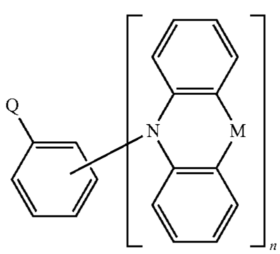

(AD31)

In the formula (AD31), M each is independently at least one of a single bond —O—, >N—Ar and >$CAr_2$, Ar is an aryl. Regarding the preferred range and the specific examples of the aryl, reference may be made to the preferred range and the specific examples of the aryl of $R^1$ to $R^{11}$ in the formula (1). The chemical bond of N bonds to a substitutable position of the phenylene group.

Q is a group represented by any of the following formulae (Q1) to (Q26).

n is an integer of 1 to 5, and is preferably an integer of 2 to 5, more preferably an integer of 4 to 5.

The hydrogen in the formula (AD31) each independently may be substituted with any of an aryl having a carbon number of 6 to 18, a heteroaryl having a carbon number of 6 to 18, an alkyl having a carbon number of 1 to 6 and a cycloalkyl having a carbon number of 3 to 12. Regarding the preferred range and the specific examples of the aryl, the heteroaryl, the alkyl and the cycloalkyl, reference may be made to the corresponding description relating to $R^1$ to $R^{11}$ in the formula (1).

At least one hydrogen in the compound represented by the formula (AD31) may be substituted with a halogen or a deuterium in addition to the above-mentioned substituents.

(Q1)

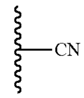

(Q2)

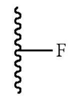

(Q3)

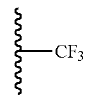

(Q4)

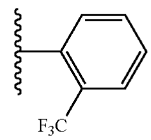

(Q5)

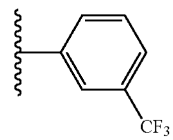

(Q6)

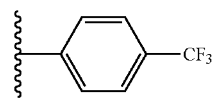

(Q7)

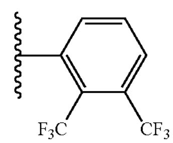

(Q8)

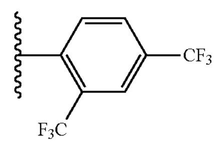

(Q9)

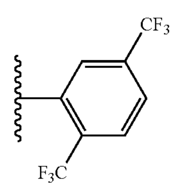

(Q10)

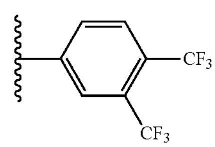

(Q11)

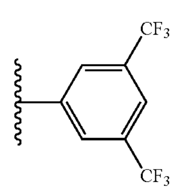

-continued
(Q12)
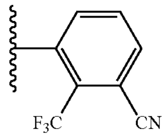
(Q13)
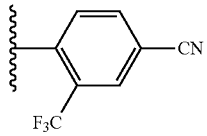
(Q14)
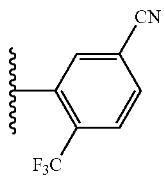
(Q15)
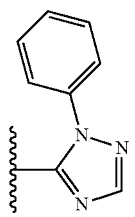
(Q16)
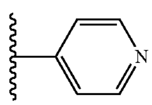
(Q17)
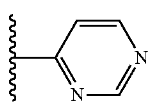
(Q18)
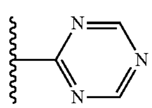
(Q19)
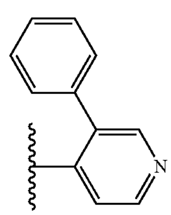
(Q20)
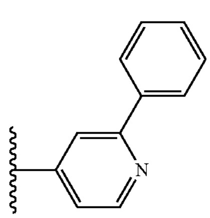
-continued
(Q21)
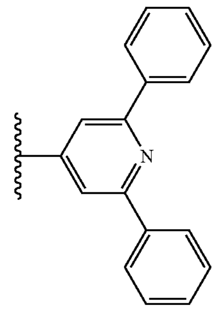
(Q22)
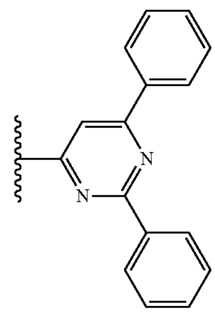
(Q23)
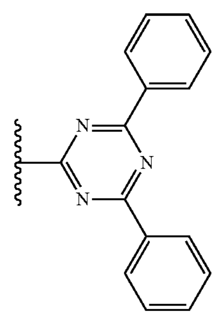
(Q24)
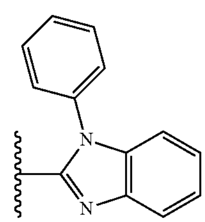
(Q25)
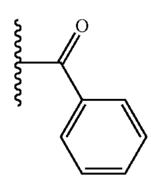
(Q26)
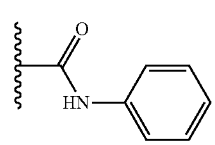
In the formulae (Q1) to (Q26), the wavy line indicates a bonding position.
The D-A-type TADF compound for use as the second component also includes compounds having a structure of any of the following formulae (AD3101) to (AD3118).

-continued
(AD3101)
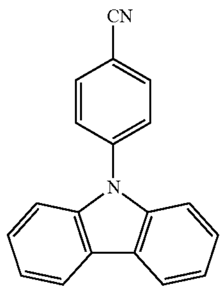
(AD3102)
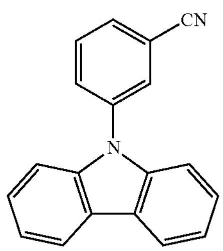
(AD3103)
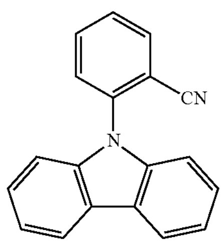
(AD3104)
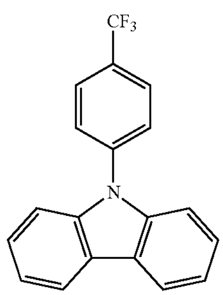
(AD3105)
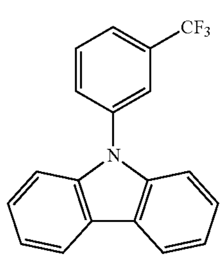
(AD3106)
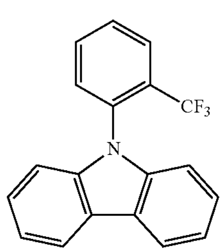
(AD3107)
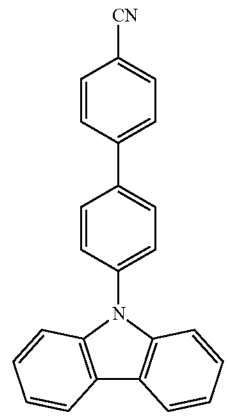
(AD3108)
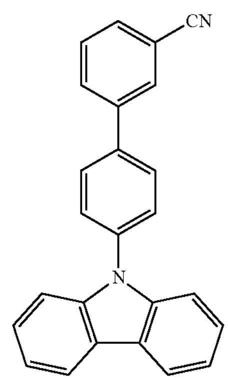
(AD3109)
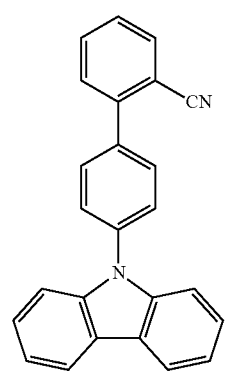
(AD3110)
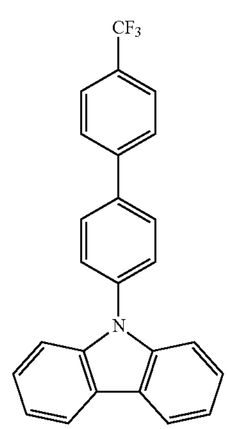

-continued (AD3111)

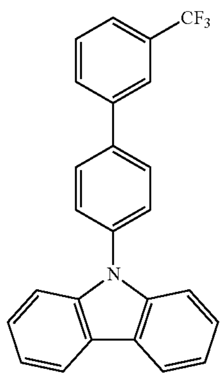

(AD3112)

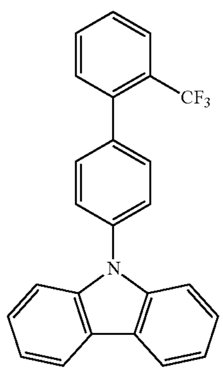

(AD3113)

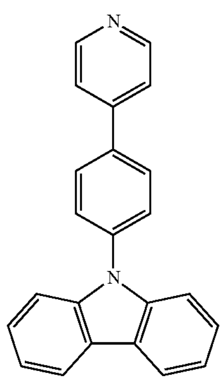

(AD3114)

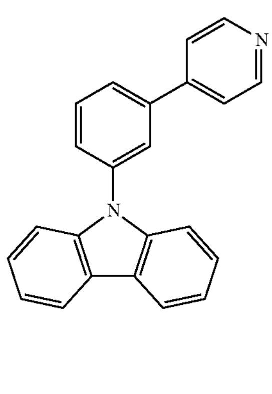

-continued (AD3115)

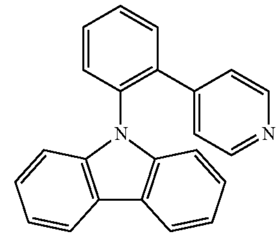

(AD3116)

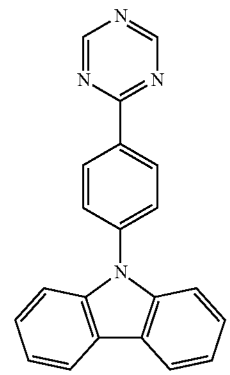

(AD3117)

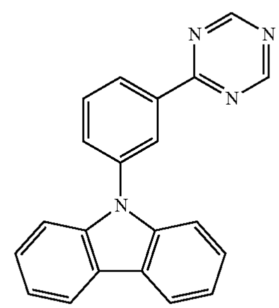

(AD3118)

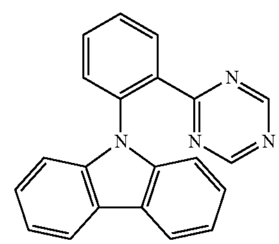

At least one hydrogen in the structure represented by the formulae (AD3101) to (AD3118) each may be independently substituted with an aryl having a carbon number of 6 to 18, a heteroaryl having a carbon number of 6 to 18, an alkyl having a carbon number of to 6, and a cycloalkyl having a carbon number of 3 to 12. Regarding the preferred range and the specific examples of the aryl, the heteroaryl, the alkyl and the cycloalkyl, reference may be made to the corresponding description of $R^1$ to $R^{11}$ in the formula (1).

Further, as the donor-type structure and the acceptor-like structure for use in the thermally assisting delayed fluorescent material in the present invention, for example, the structures described in Chemistry of Materials, 2017, 29, 1946-1963 are also usable. The donor-type structure includes carbazole, dimethylcarbazole, di-tert-butylcarbazole, dimethoxycarbazole, tetramethylcarbazole, benzofluorocarbazole, benzothienocarbazole, phenyldihydroindolocarbazole, phenylbicarbazole, bicarbazole, tercarbazole, diphenylcarbazolylamine, tetraphenylcarbazolyldiamine, phenoxazine, dihydrophenazine, phenothiazine, dimethyldihydroacridine, diphenylamine, bis(tert-butyl)phenyl)amine, (diphenylamino)phenyl)diphenylbenzenediamine, dimethyltetraphenyldihydroacridinediamine, tetramethyl-dihydroindenoacridine and diphenyl-dihydrodibenzazaserine. The acceptor-type structure includes sulfonyldibenzene, benzophenone, phenylenebis(phenylmethanone), benzonitrile, isonicotinonitrile, phthalonitrile, isophthalonitrile, paraphthalonitrile, benzenetricarbonitrile, triazole, oxazole, thiadiazole, benzothiazole, benzobis(thiazole), benzoxazole, benzobis(oxazole), quinoline, benzimidazole, dibenzoquinoxaline, heptaazaphenalene, thioxanthone dioxide, dimethylanthrazene, anthracenedione, cycloheptabipyridine, fluorenedicarbonitrile, triphenyltriazine, pyrazinecarbonitrile, pyrimidine, phenylpyrimidine, methylpyrimidine, pyridinedicarbonitrile, dibenzoquinoxalinedicarbonitrile, bis(phenylsulfonyl)benzene, dimethylthioxanthone dioxide, thianthrene tetroxide and tris(dimethylphenyl)borane. In particular, the thermally assisting delayed fluorescent compound in the present invention is preferably a compound having, as a partial structure, at least one of carbazole, phenoxazine, acridine, triazine, pyrimidine, pyrazine, thioxanthene, benzonitrile, phthalonitrile, isophthalonitrile, diphenyl sulfone, triazole, oxadiazole, thiadiazole and benzophenone.

Compounds usable as the second component (thermally assisting delayed fluorescent material) are exemplified below. In the following formulae, Me represents a methyl, t-Bu represents a t-butyl, Ph represents a phenyl, and the wavy line indicates a bonding position.

PIC-TRZ

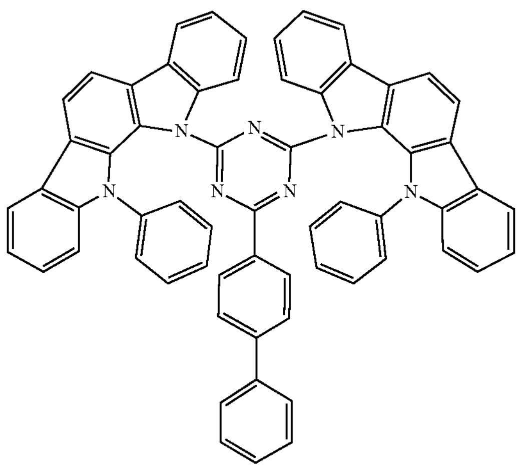

DTC-DPS

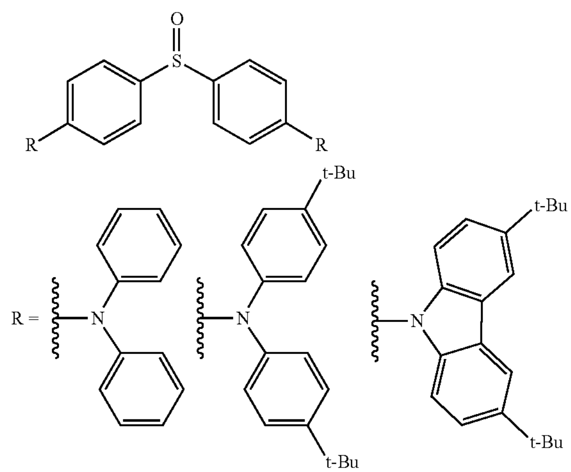

DMOC-DPS

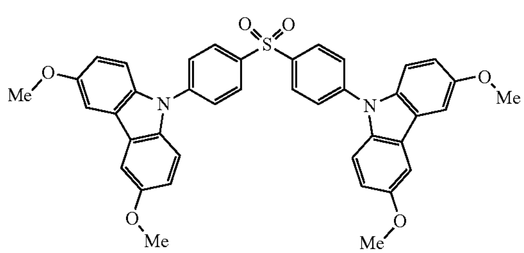

DMAC-DPS

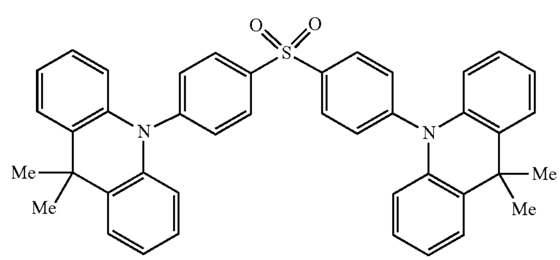

DMTDAc

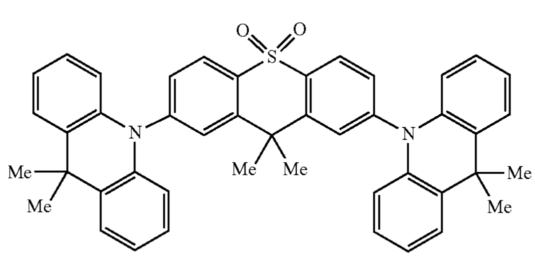

DMAC-BP

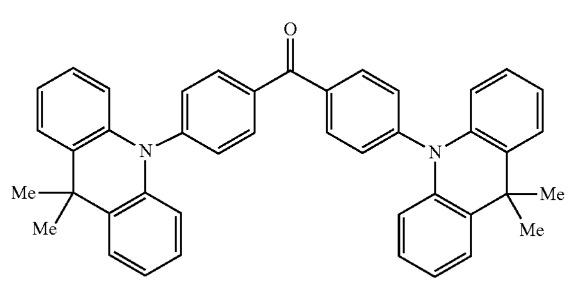

-continued
DTC-pBPSB
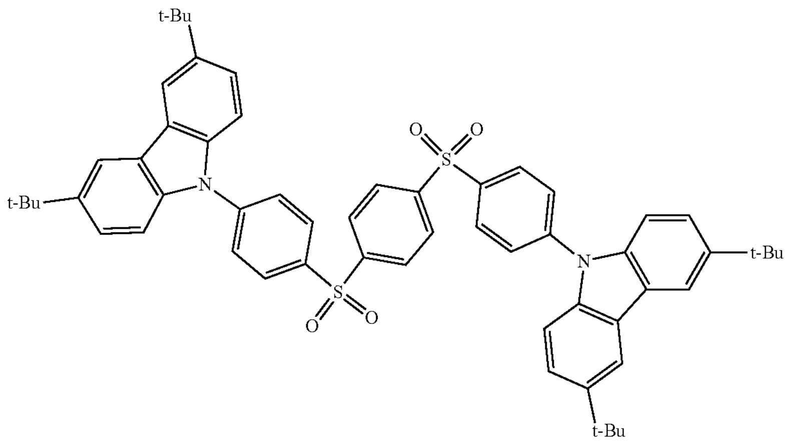
DTC-mBPSB
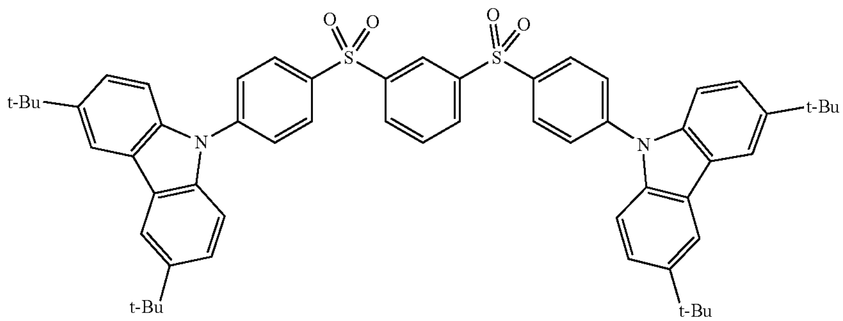
TXO-TPA
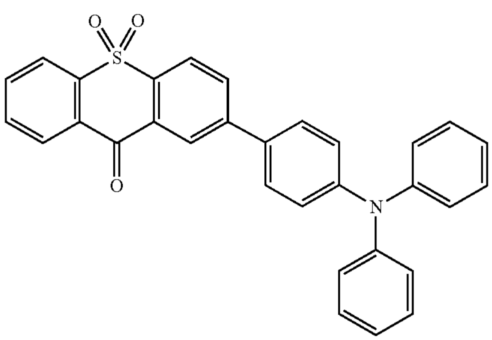
TXO-PhCz
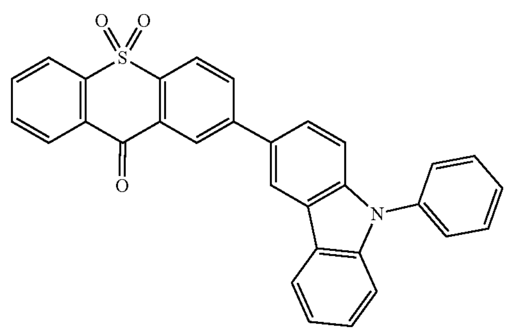
PXZD SO2
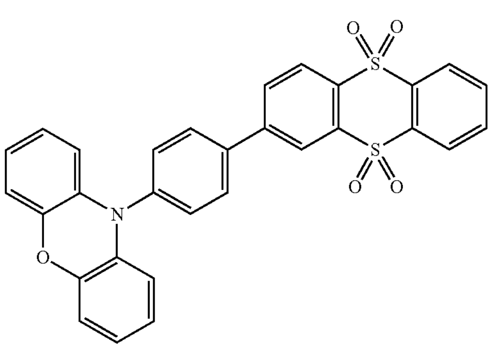
ACRD SO2
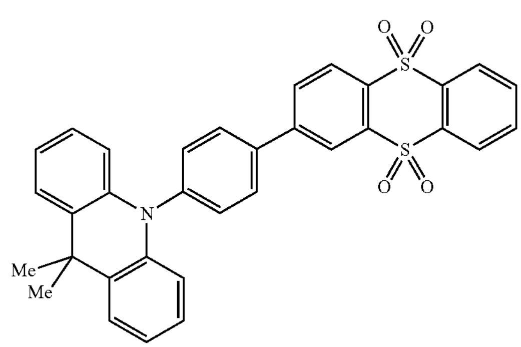

-continued
DTC-DBT
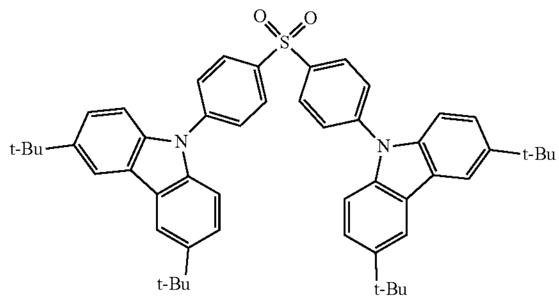
DTAO
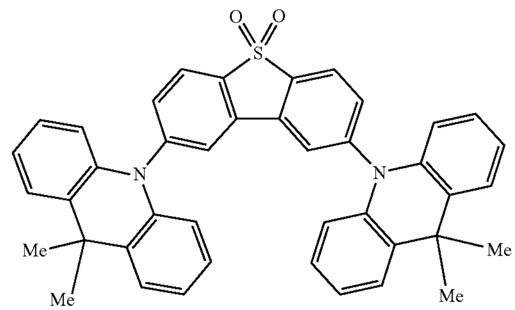
Cz2BP
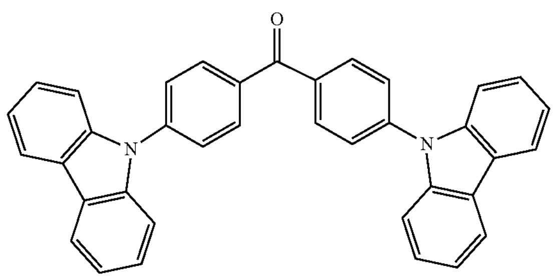
CC2BP
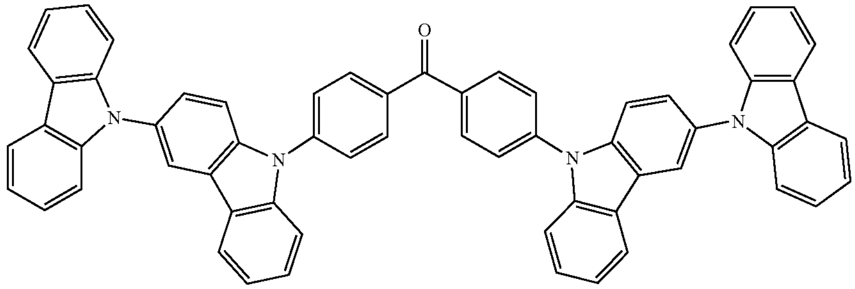
DCBPy
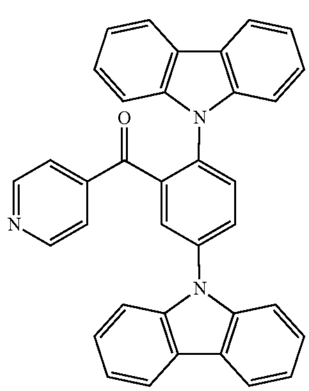
DTCBPy
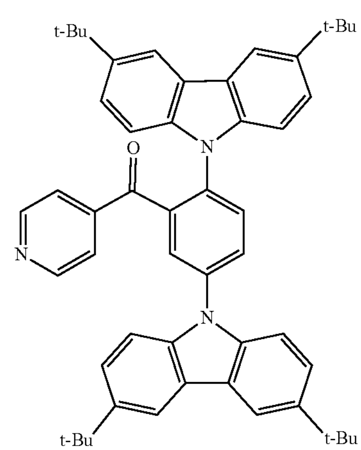

-continued
CzT
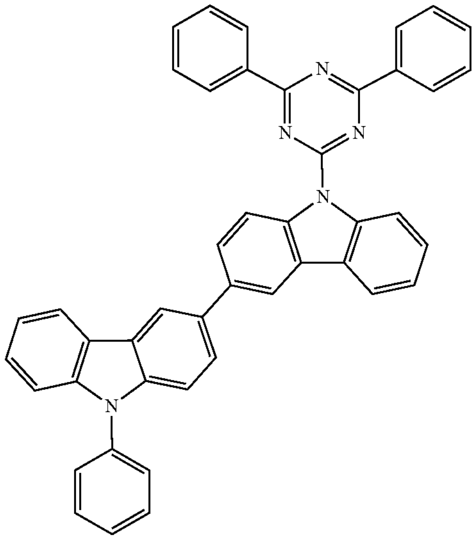
CC2TA
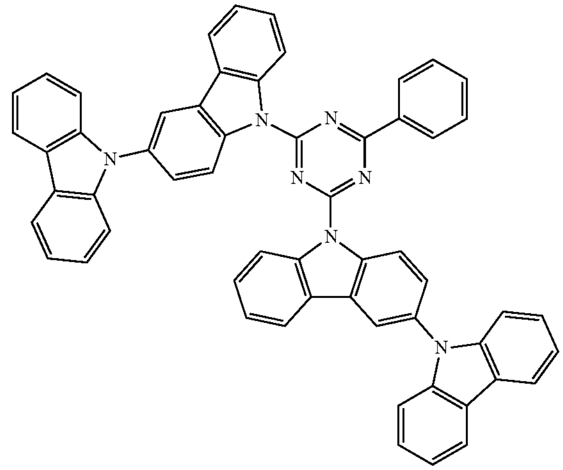
BCzT
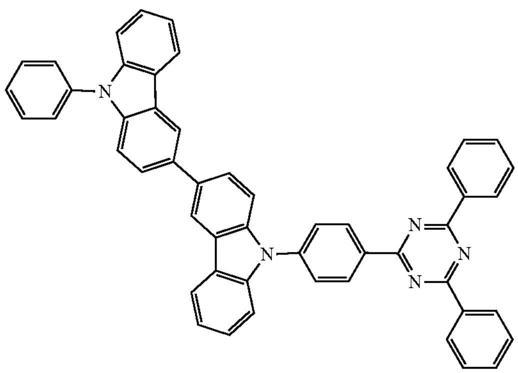
DTPDDA
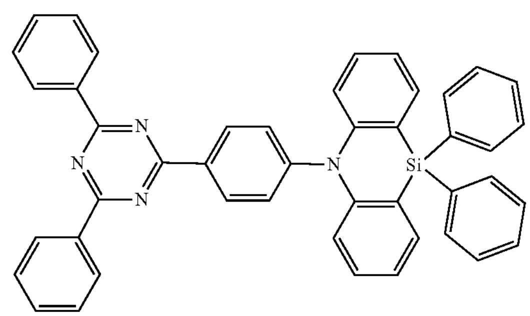
DMAC-TRZ
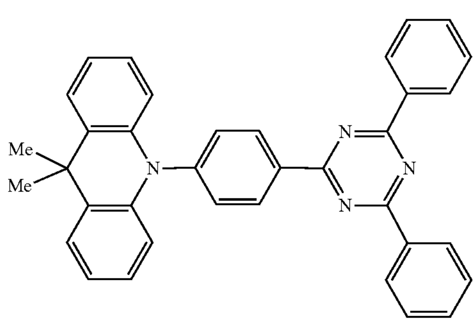
DCzTrz
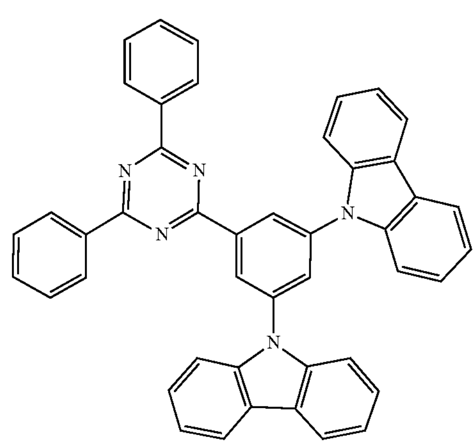

-continued
DDCzTrz
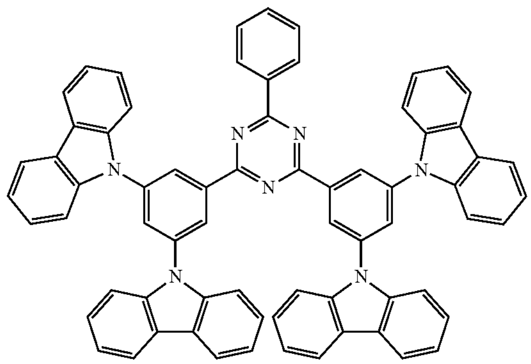
spiroAC-TRZ
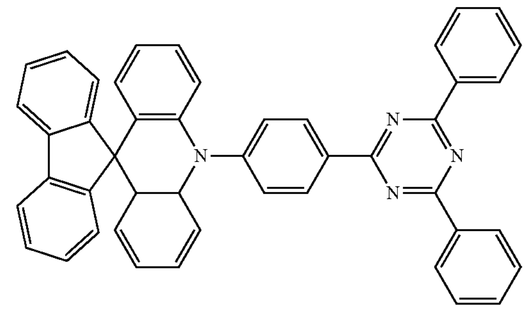
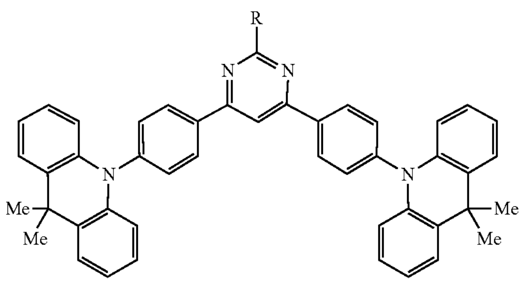
R = H, Ac—HPM
R = Ph, Ac—PPM
R = Me Ac—MPM
TCzTrz
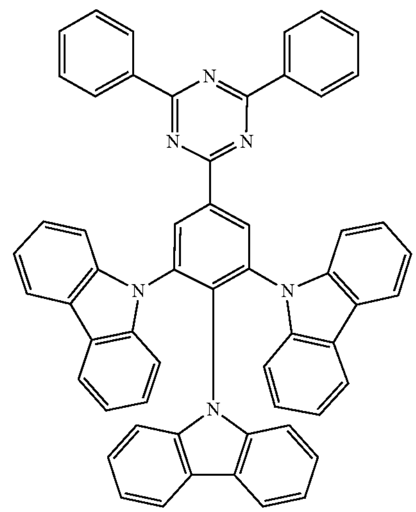
TmCzTrz
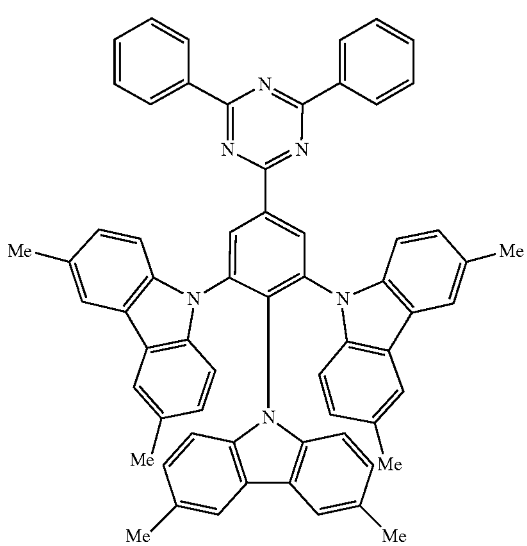
DCzmCzTrz
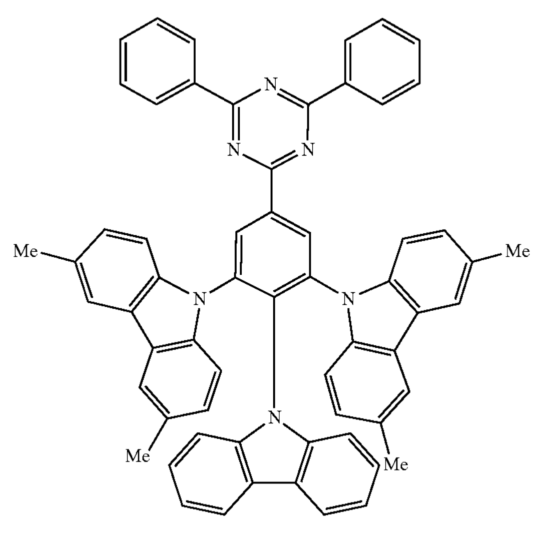

-continued
ATP-PXZ
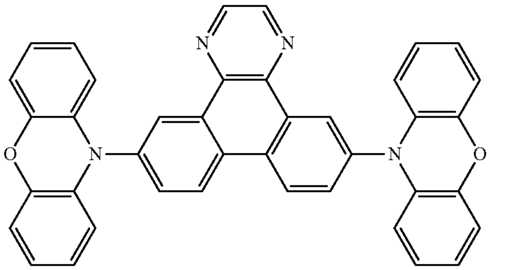
ATP-ACR
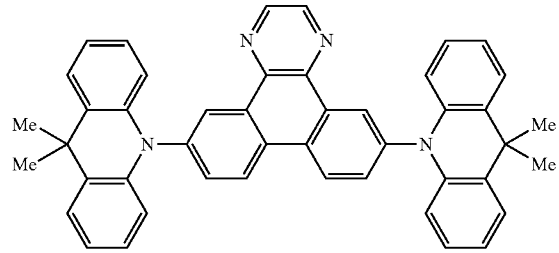
m-ATP-PXZ
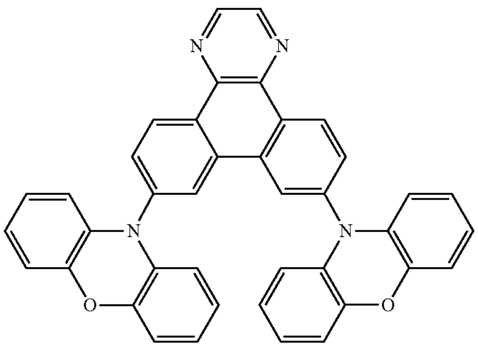
m-ATP-ACR
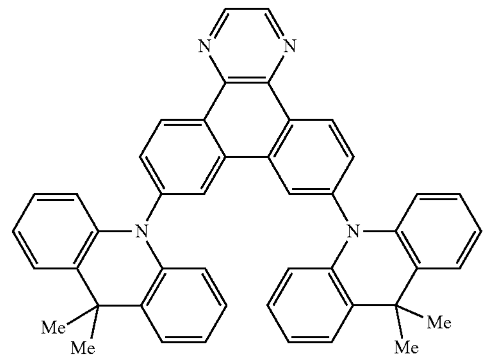
m-ATP-CDP
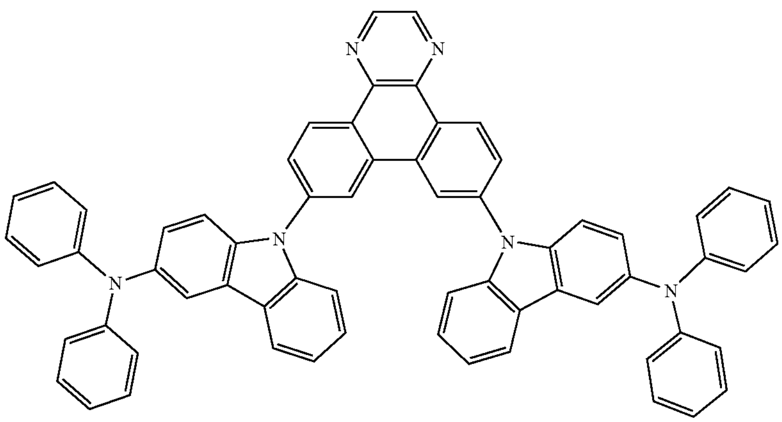
2CzPN
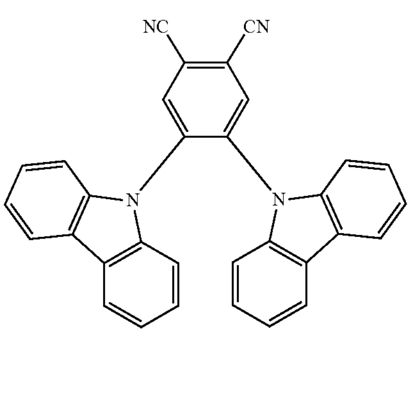
BFCz-2CN
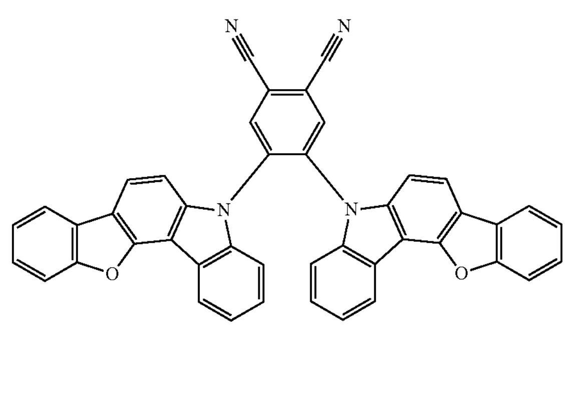

-continued
BTCz-2CN
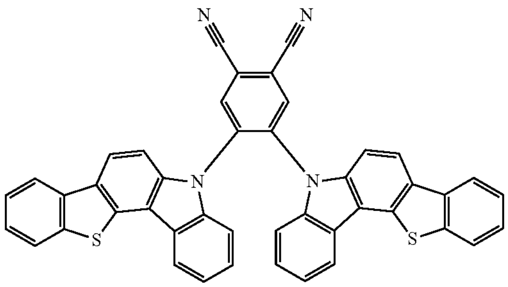
35IPNDCz
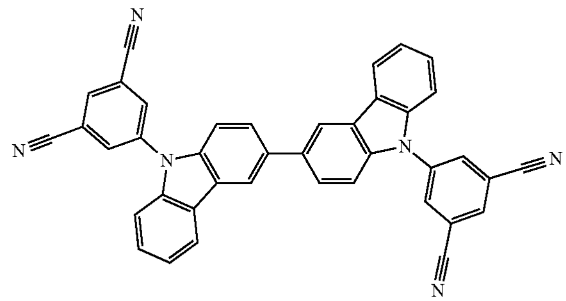
26IPNDCz
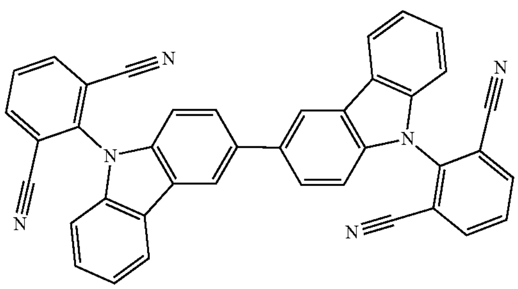
CPC
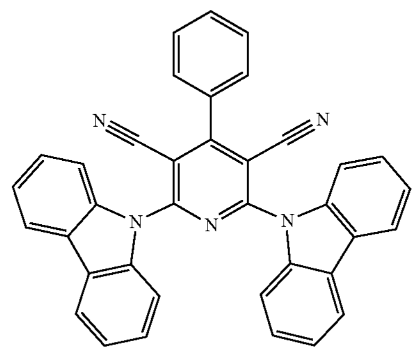
3CzFCN
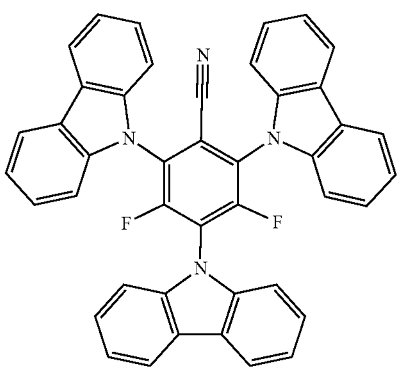
4CzFCN
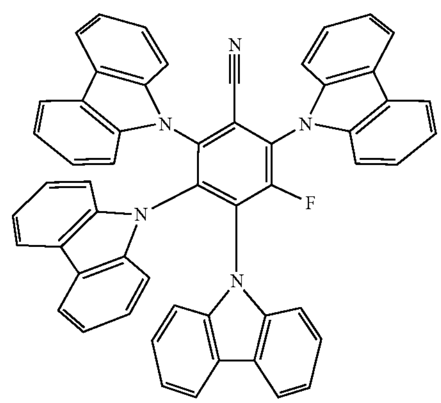
DCN1
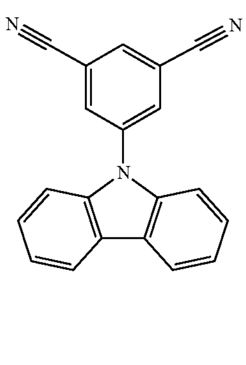
DCN2
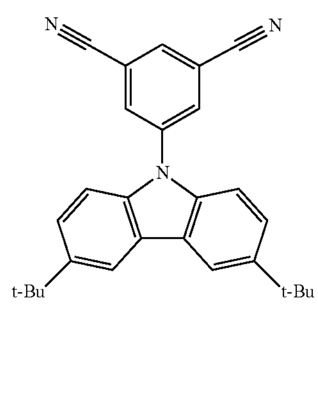

-continued
DCN3
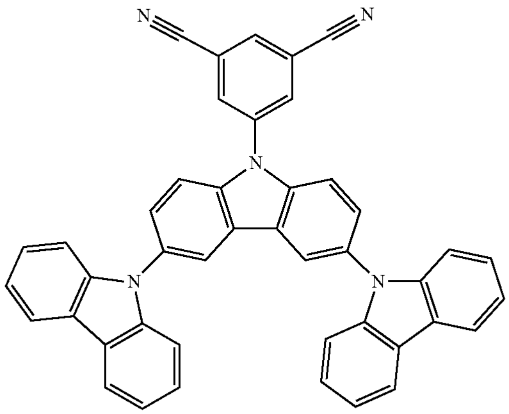
CZQ
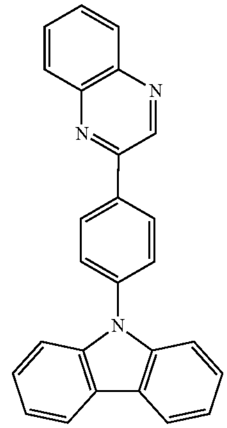
DACQ
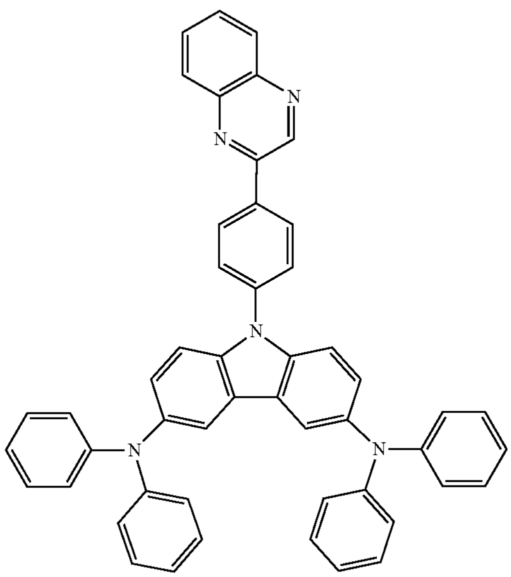
CNBPCz
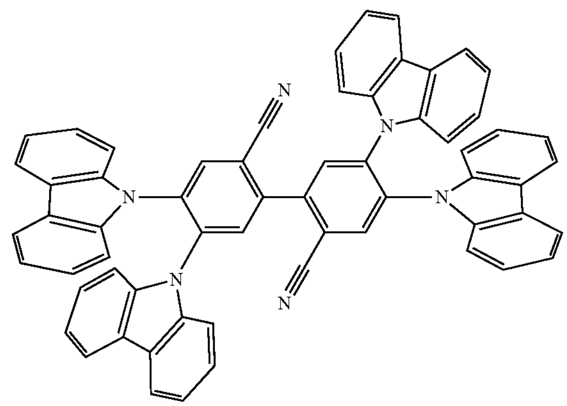
CzBPCN
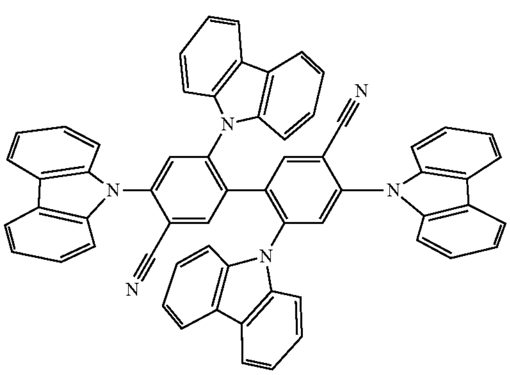
ACRFLCN
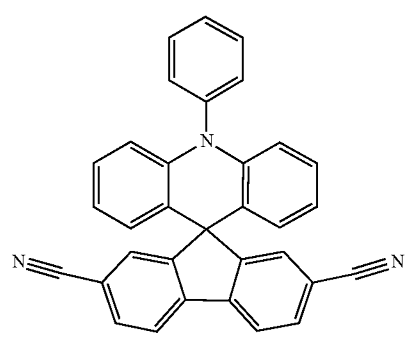

-continued
PXZ-TRZ
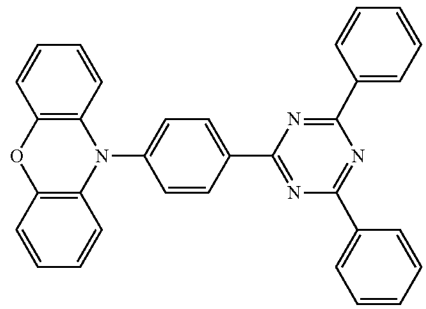
DMAC-PXB
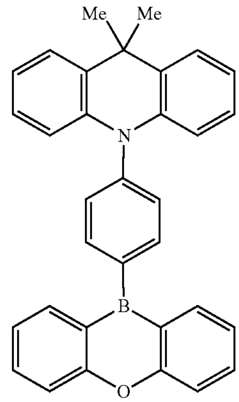
PXZ-PXB
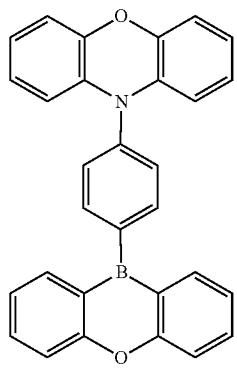
PXZ-Mes$_3$B
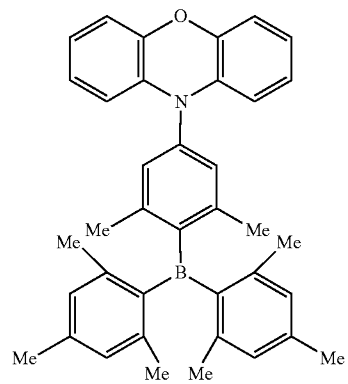
2DAC-Mes$_3$B
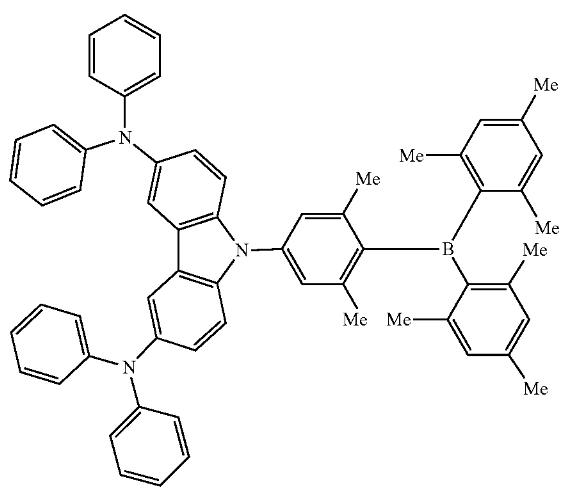
DAC-Mes$_3$B
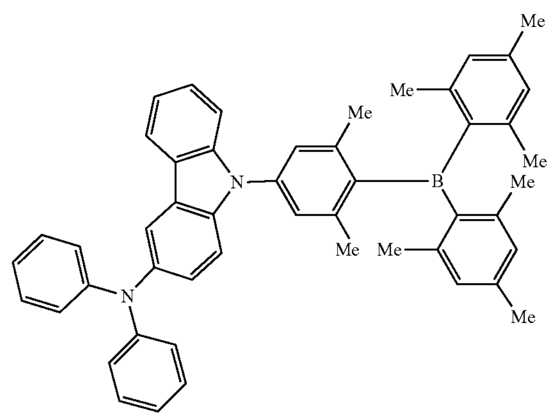
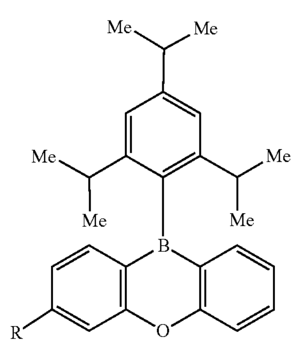

-continued
R = 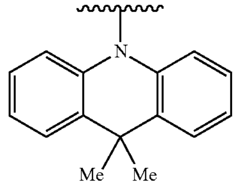 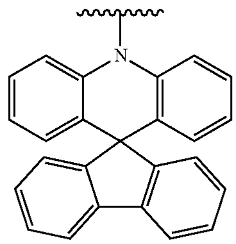 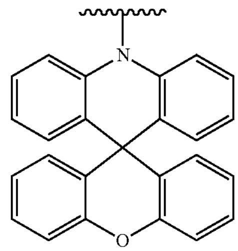 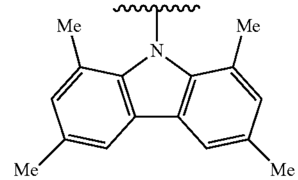
ACRPOB SFDPAPOB SXDPAPOB TMCPOB
PXZPO
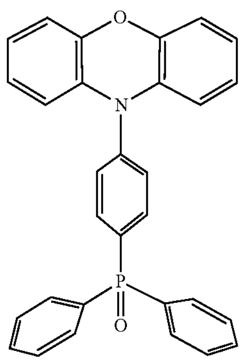
DPXZPO
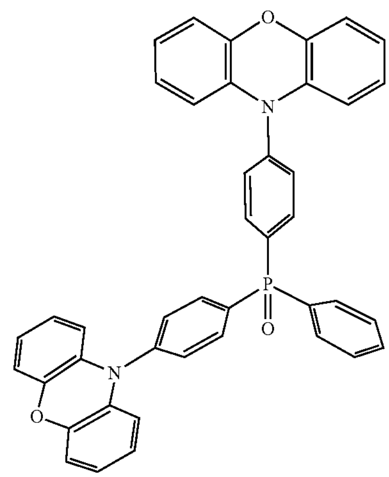
TPXZPO
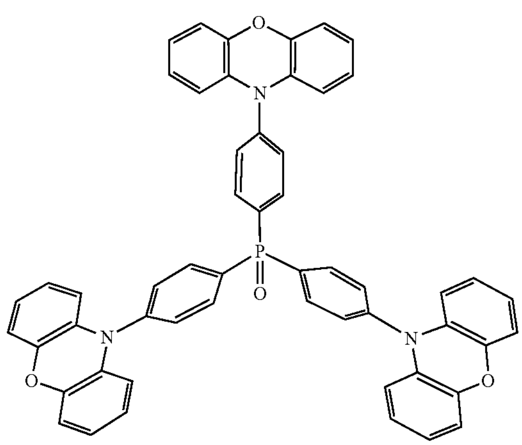
DPAA-AF
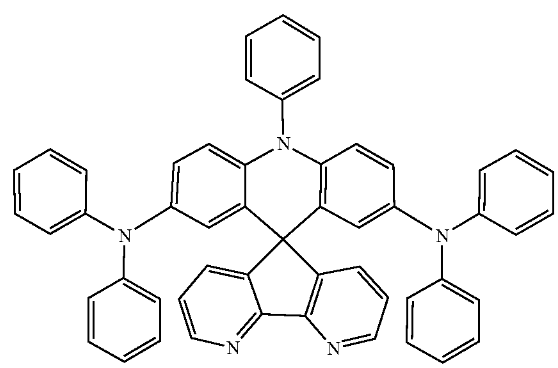
ACRSA
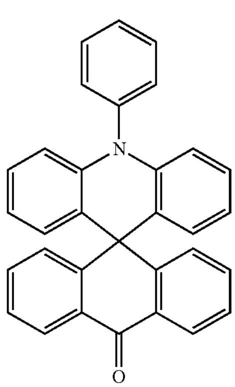
$4CzCF_3Ph$
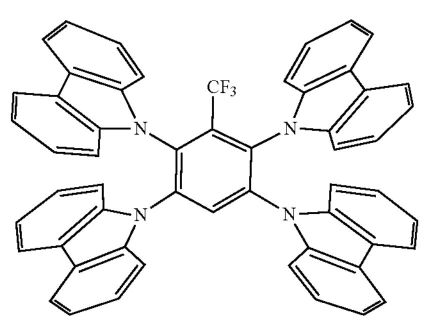

-continued
5CzCF3Ph
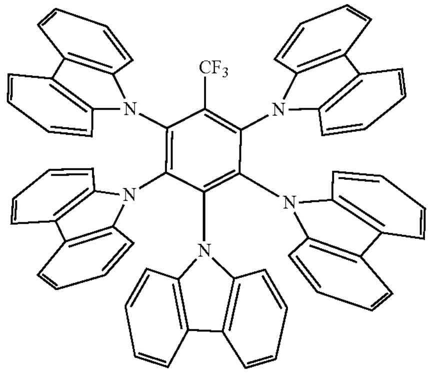
2PXZ-TAZ
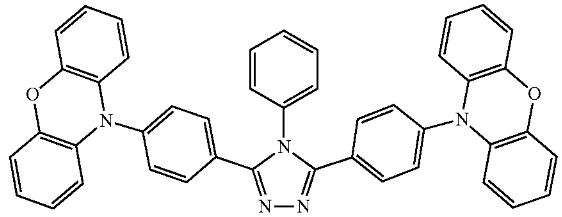
BDPCC-TPTA
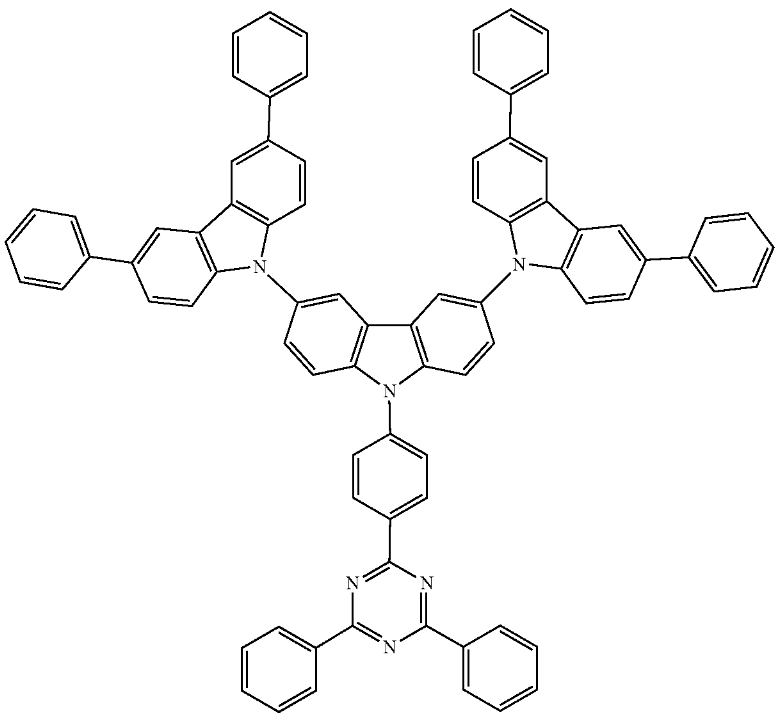
Cz-TRZ3
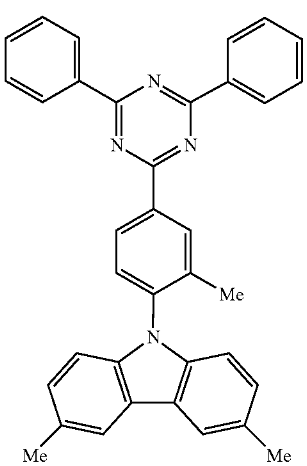
4CzBN
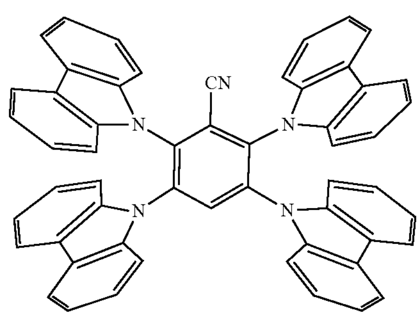

-continued
4CzBN-Ph
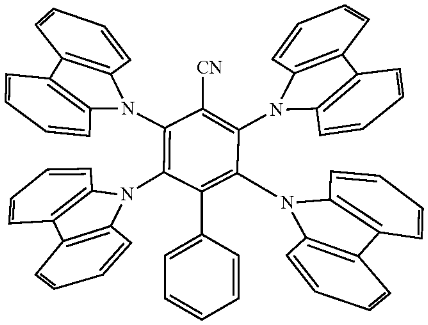
5CzBN
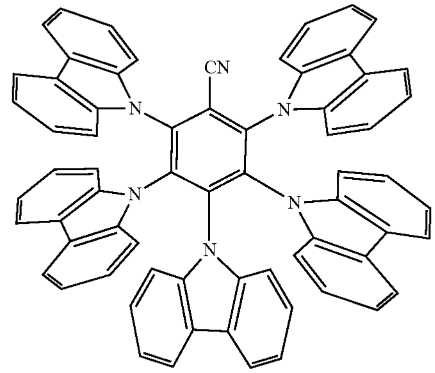
3Cz2DPhCzBN
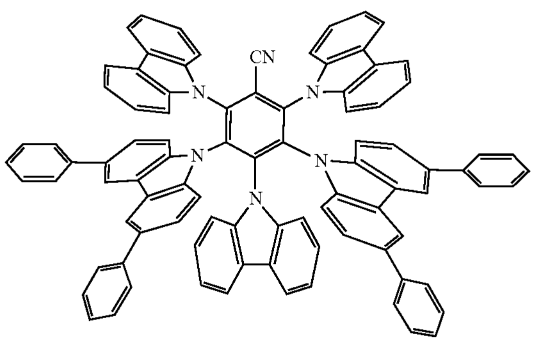
4CzIPN
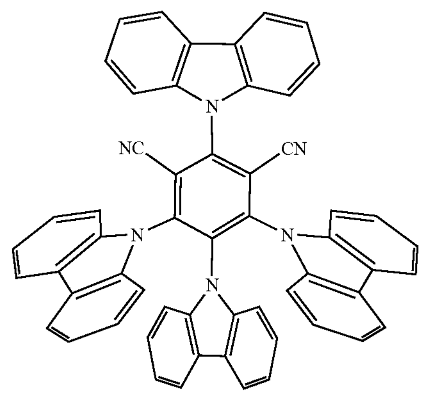
MA-TA
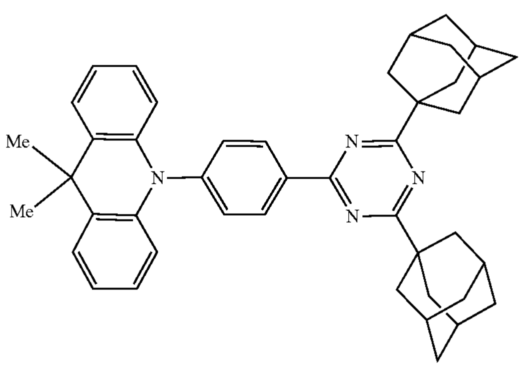
PA-TA
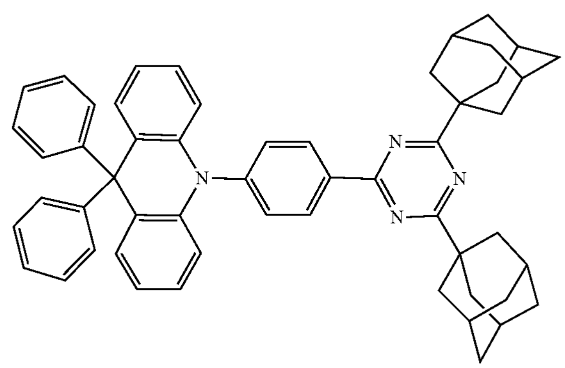

-continued
FA-TA
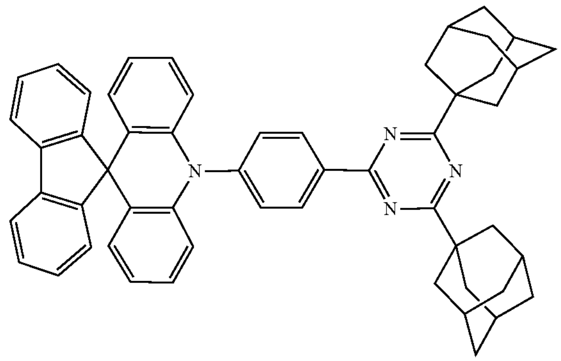
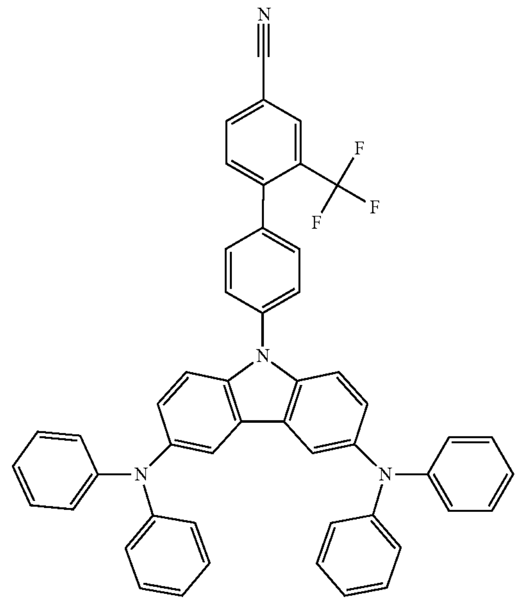
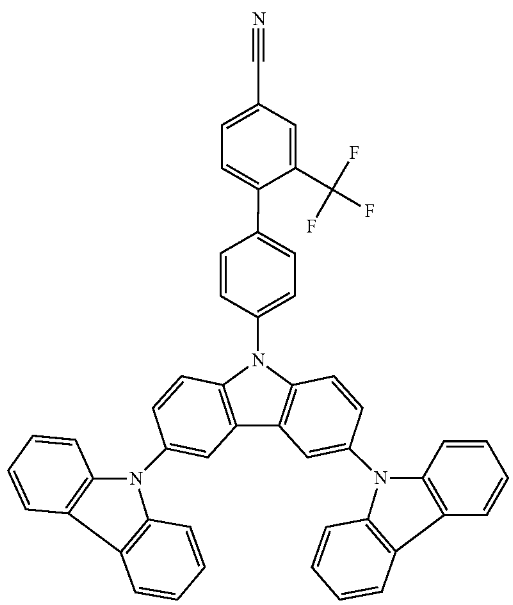
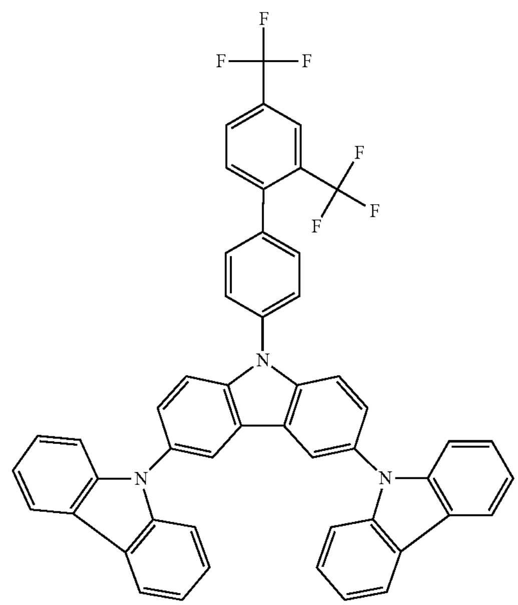
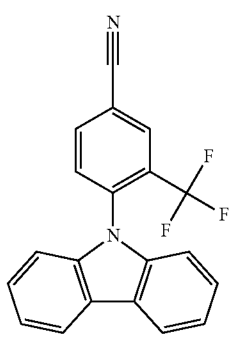
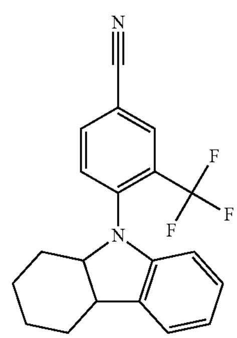

-continued
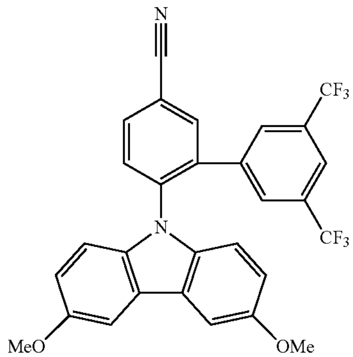
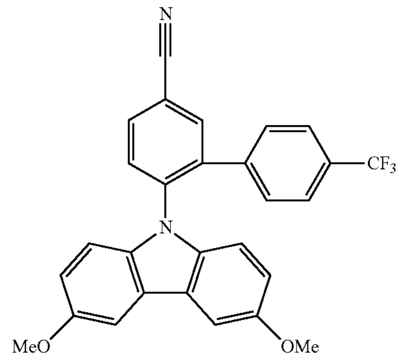
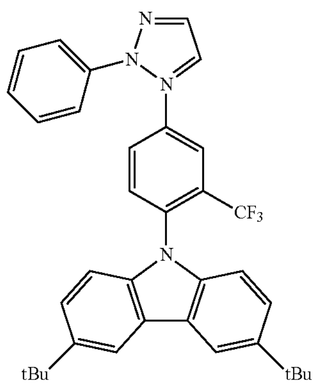
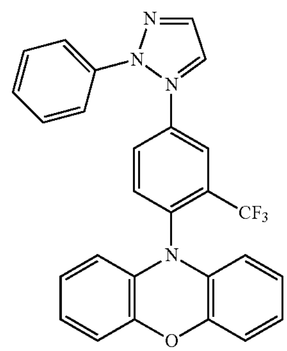
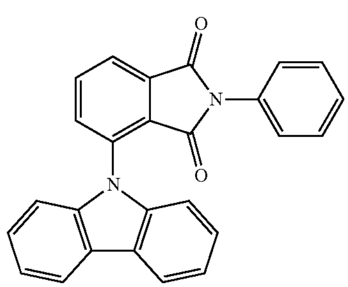
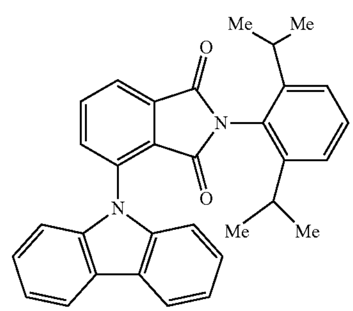
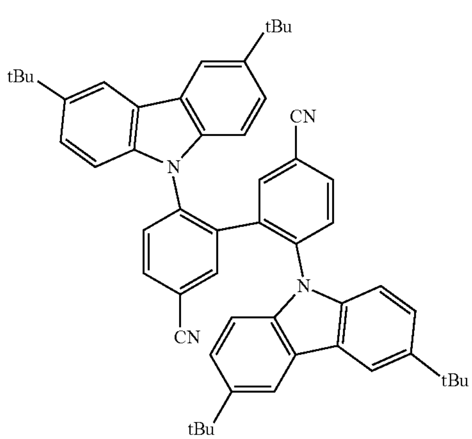
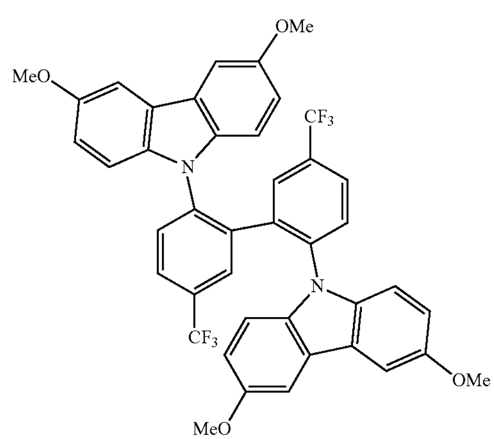

-continued
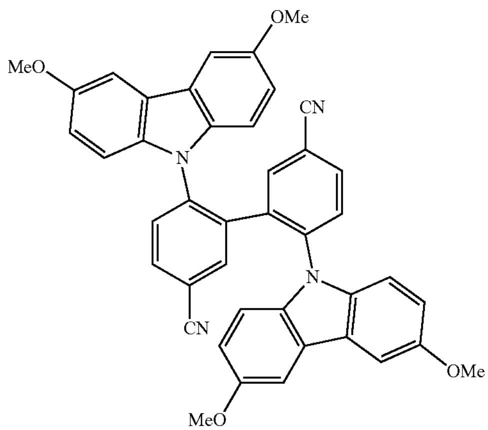
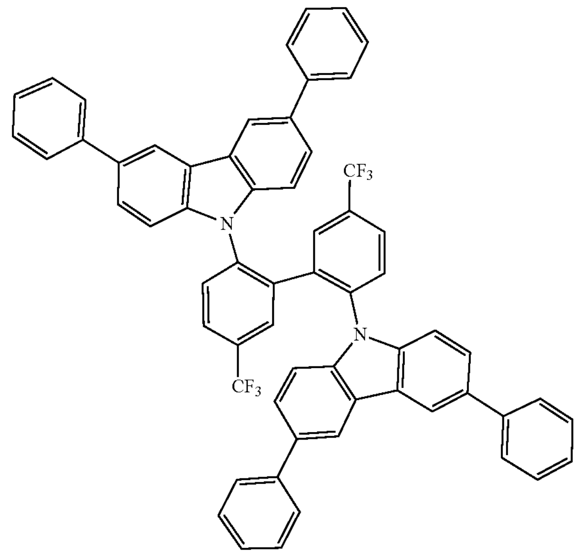
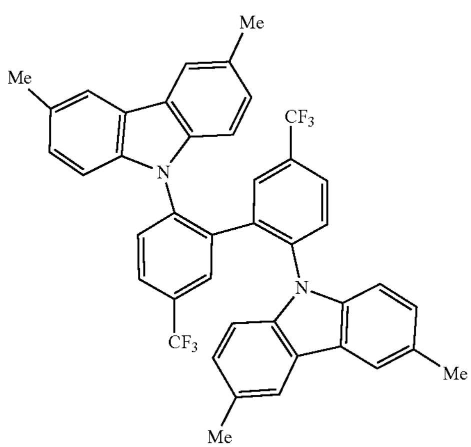
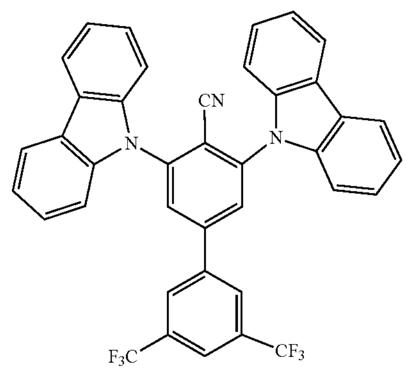
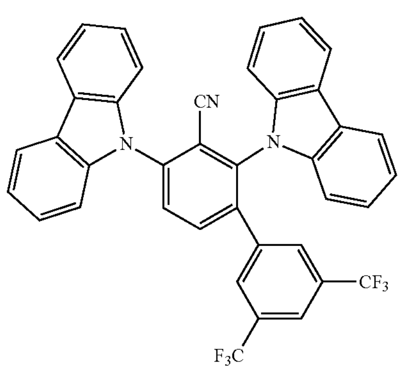
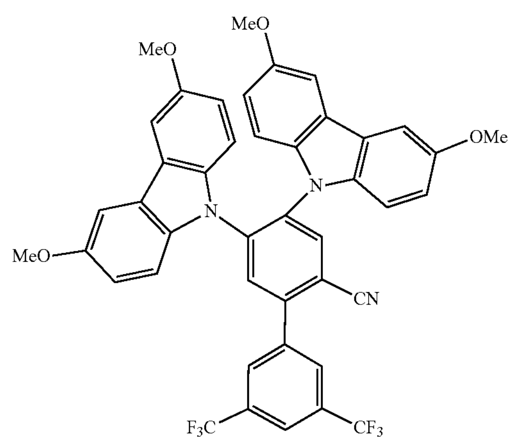

-continued
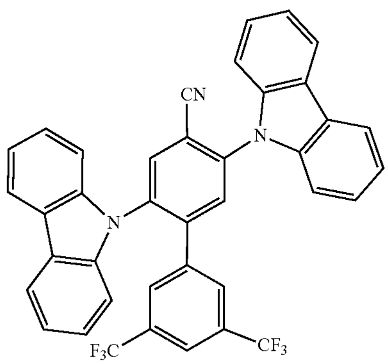
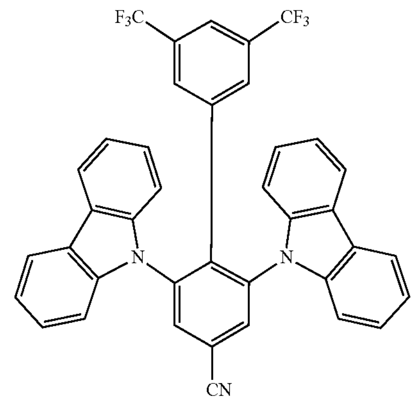
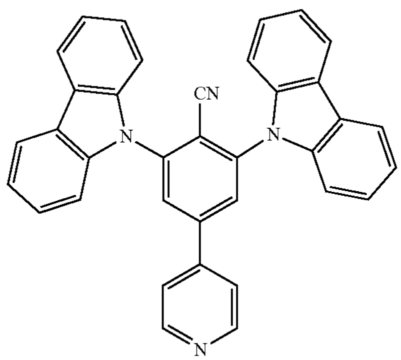
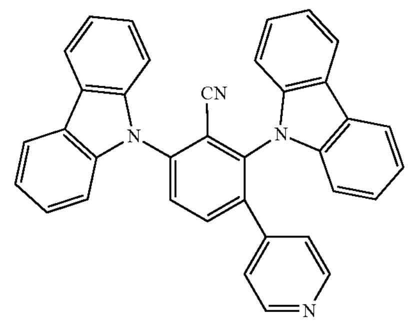
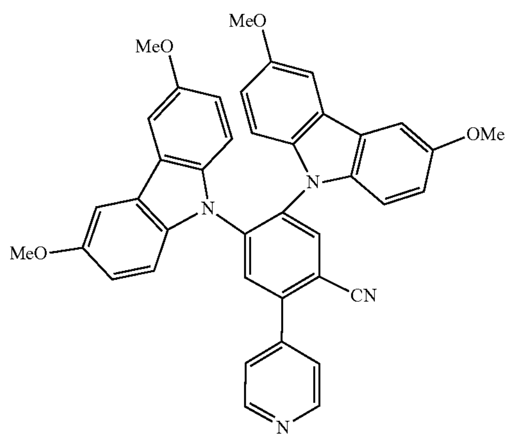
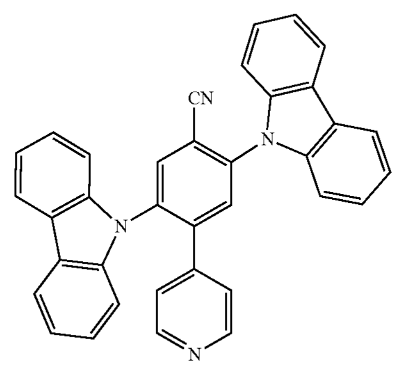
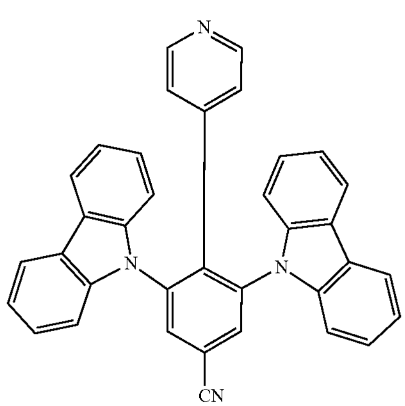
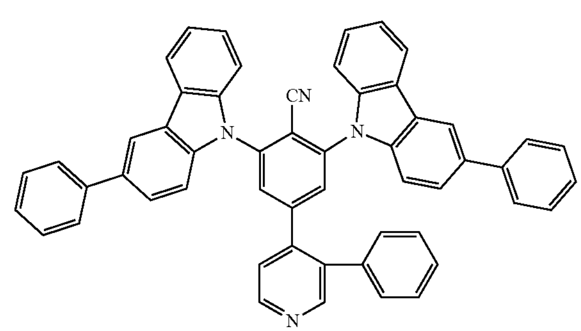

-continued
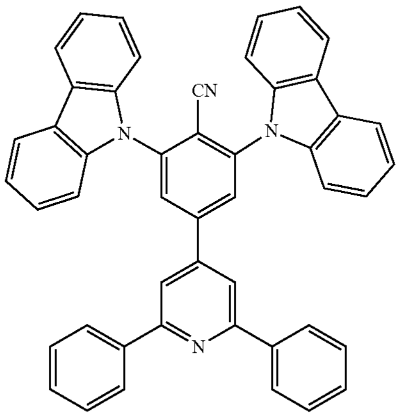
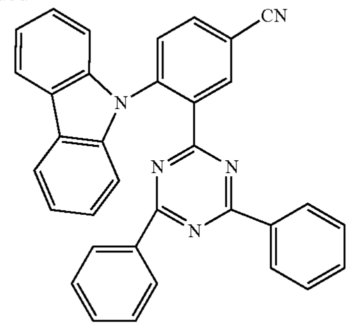
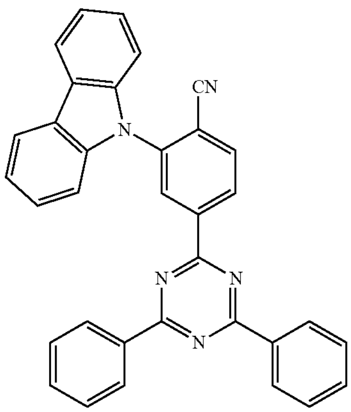
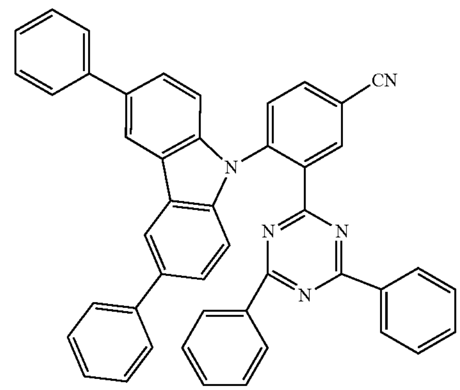
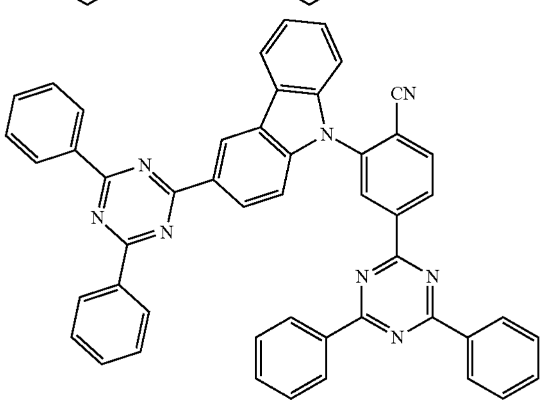
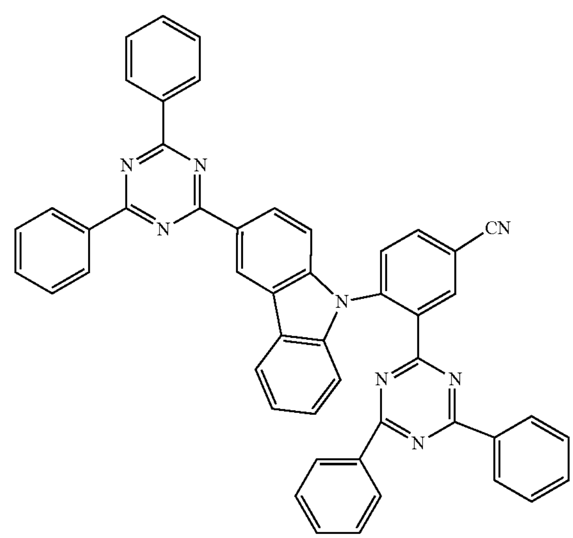
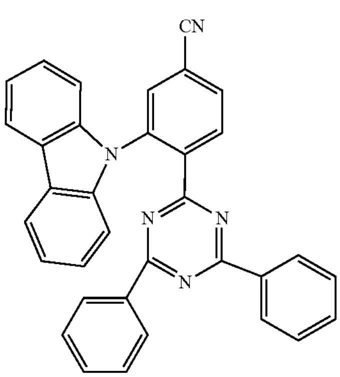
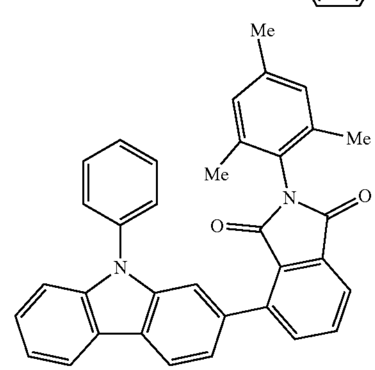

-continued
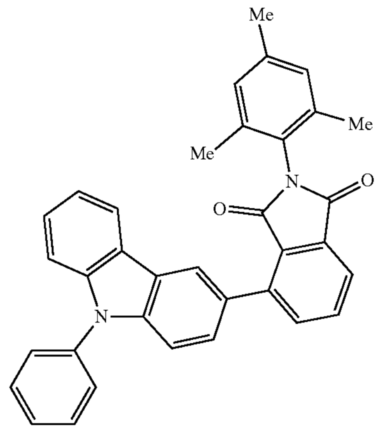
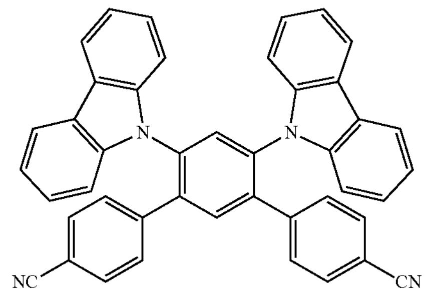
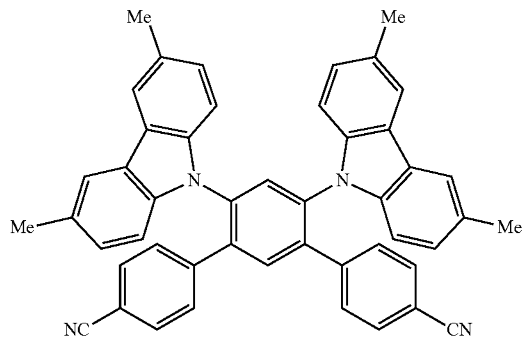
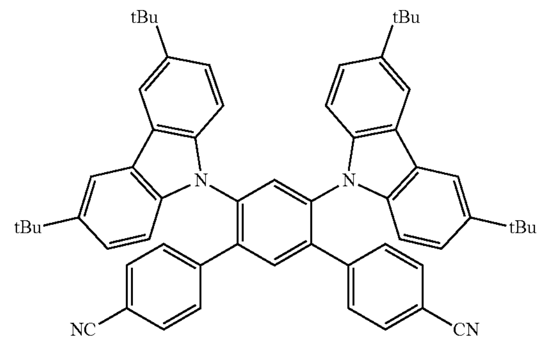
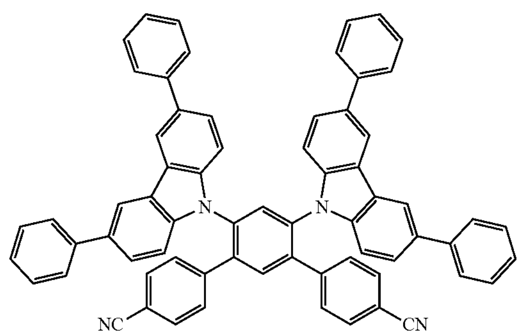
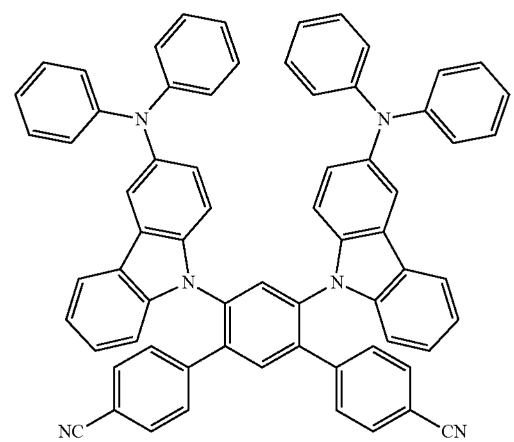
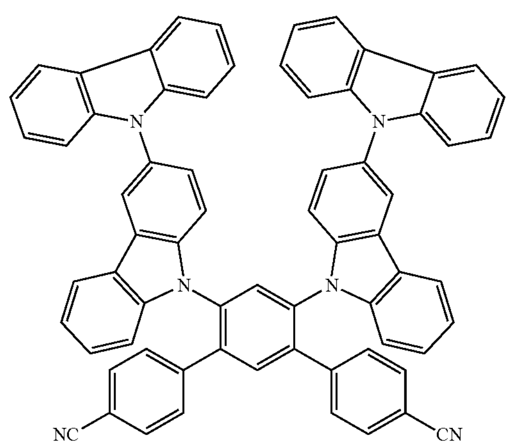
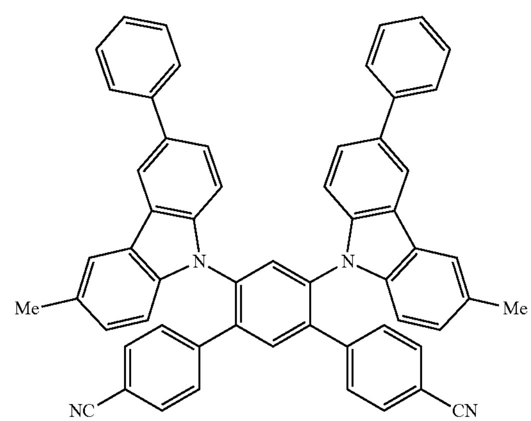

-continued
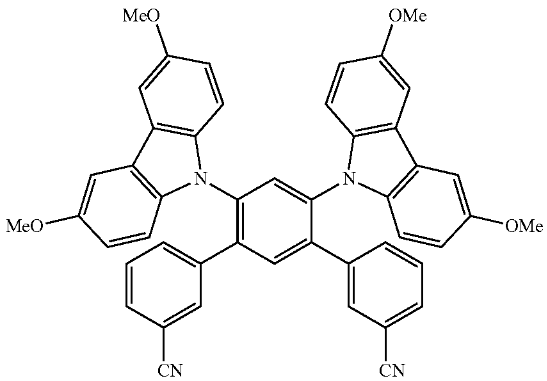
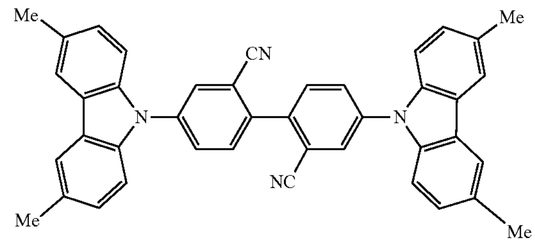
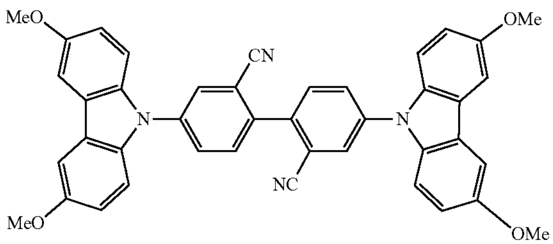
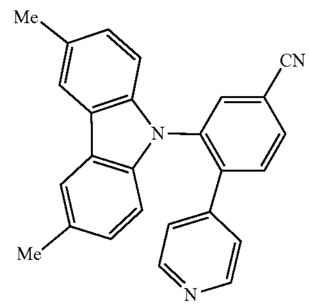
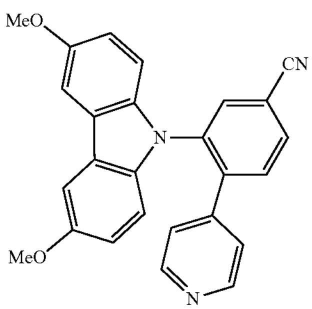
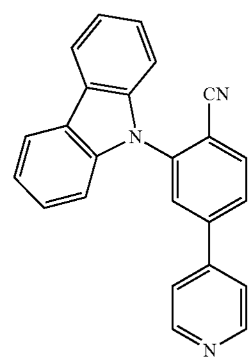
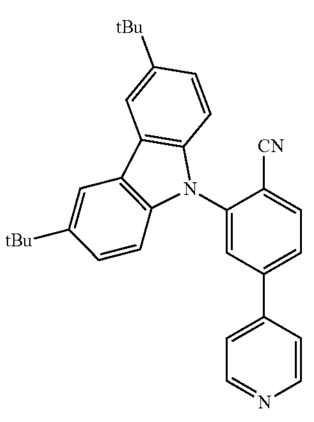
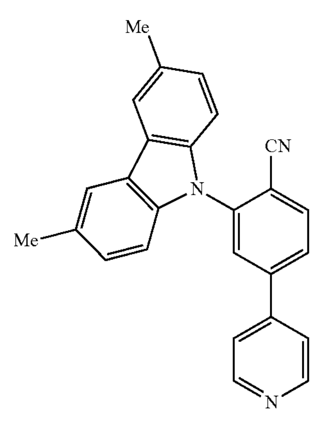

-continued
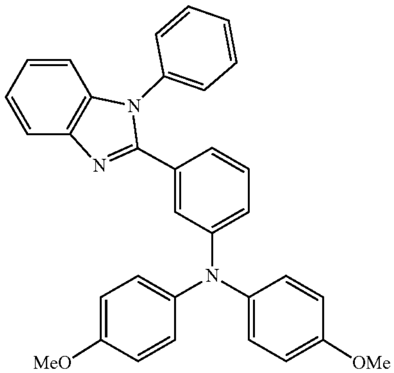
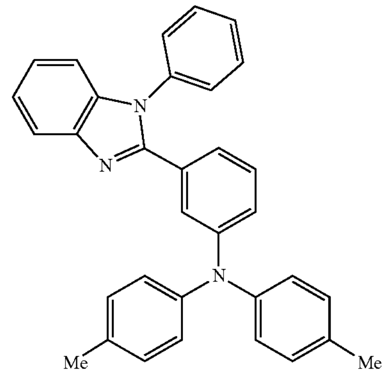
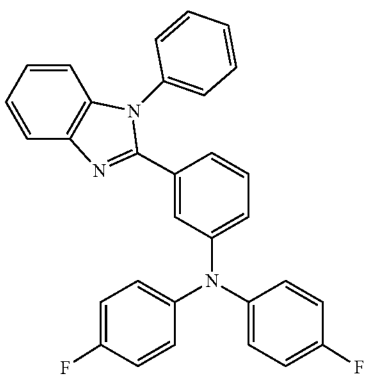
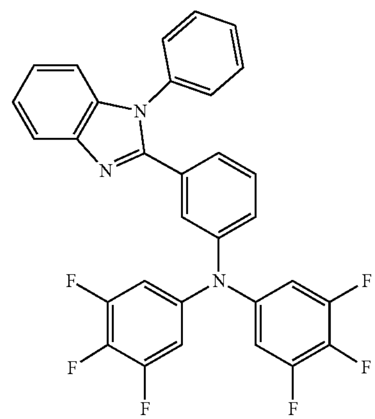
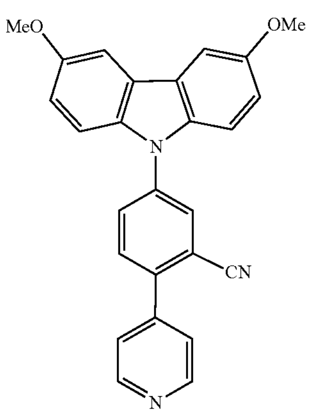
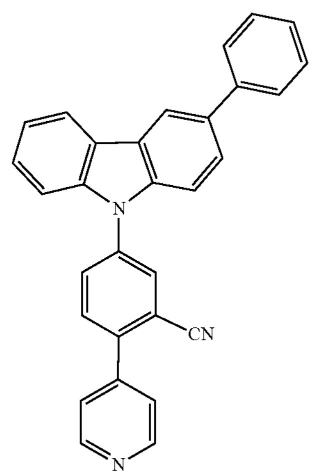

-continued
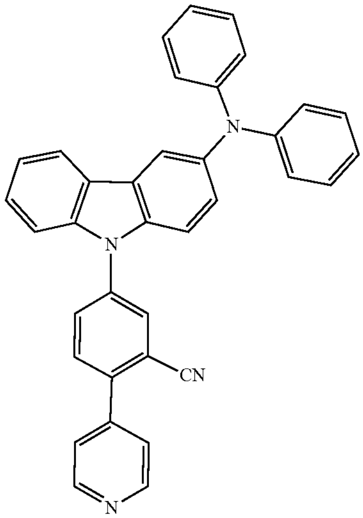
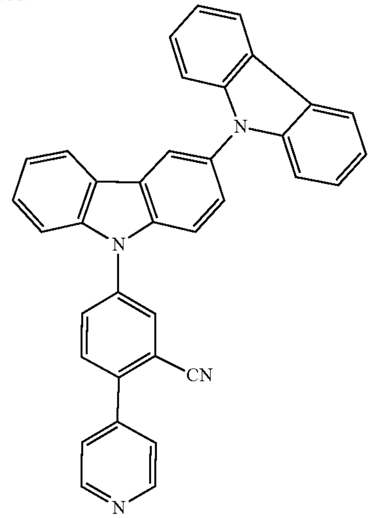
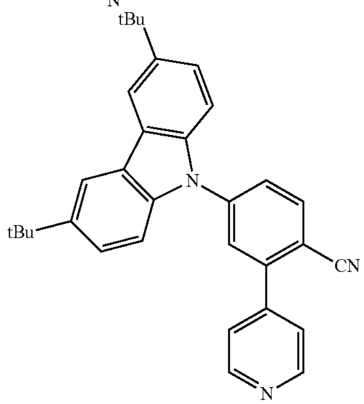
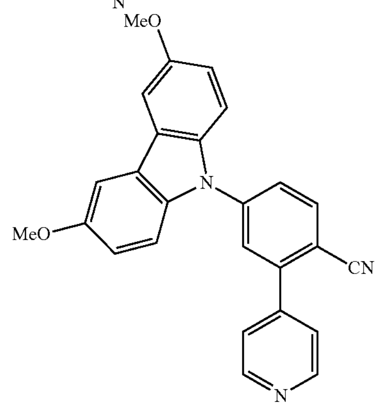
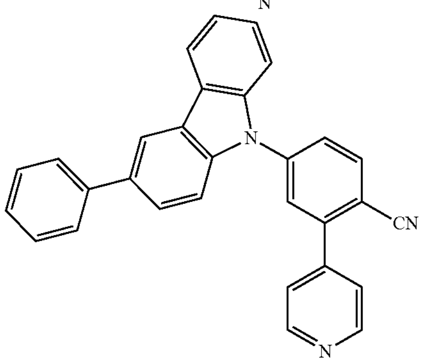
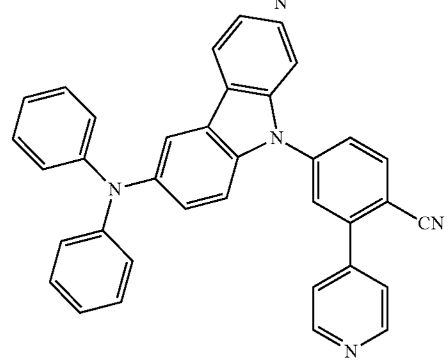
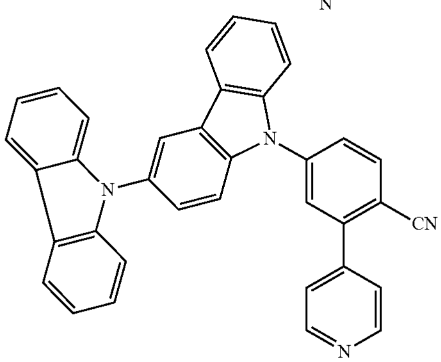
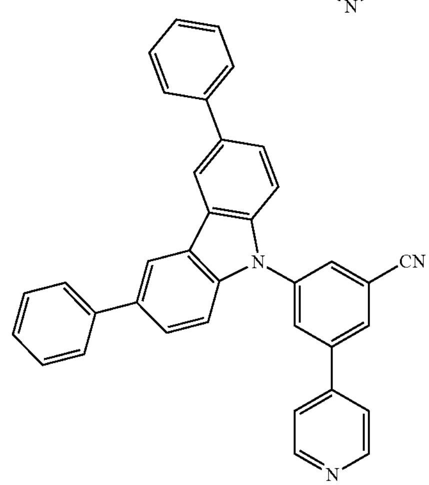

-continued
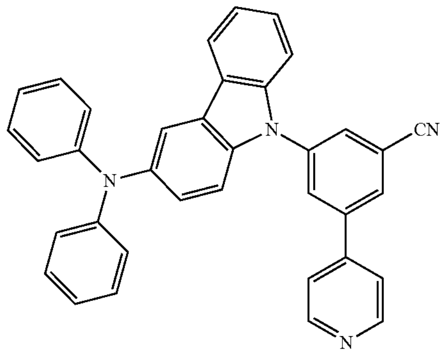
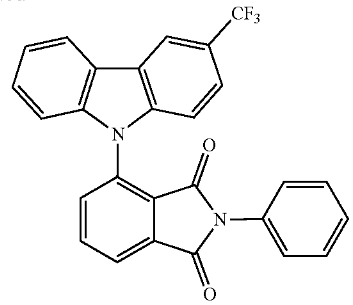
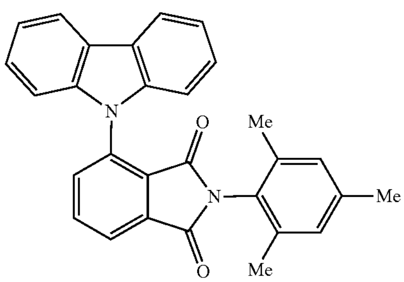
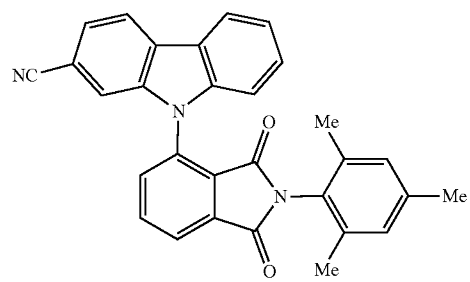
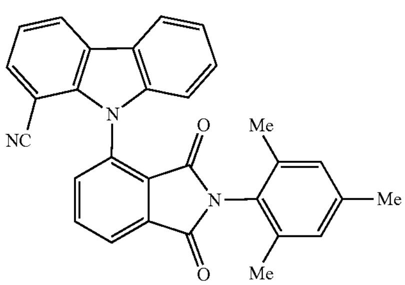
Further, as the thermally assisting delayed fluorescent material, compounds represented by any of the following formulae (AD1), (AD2) and (AD3) are also usable.
(AD1)
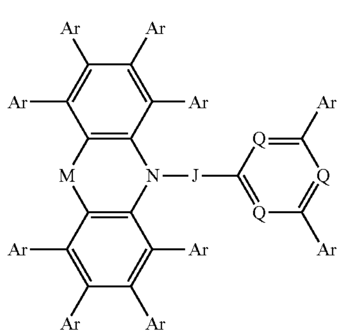
-continued
(AD2)
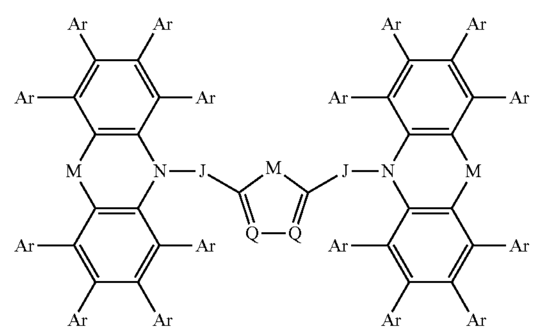

-continued (AD3)

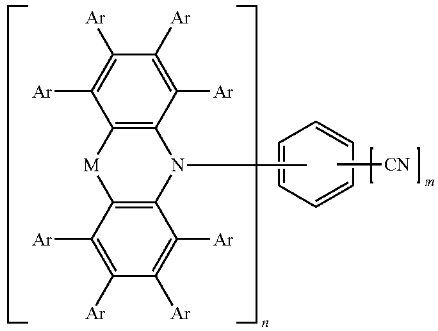

In the formulae (AD-1) to (AD-3):

M is each independently a single bond, —O—, >N—Ar or >$CAr_2$, and is, from the viewpoint of the depth of HOMO of the formed partial structure and the height of the excited singlet energy level and the excited triplet energy level thereof, preferably a single bond, —O— or >N—Ar. J is a spacer structure to space the donor-type partial structure and the acceptor-type partial structure from each other, and each is independently an arylene having a carbon number of 6 to 18, and is, from the viewpoint of the size of the conjugation to run out from the donor-type partial structure and the acceptor-type partial structure, preferably an arylene having a carbon number of 6 to 12. More specifically, J includes a phenylene, a methylphenylene and a dimethylphenylene. Q is each independently =C(—H)— or =N—, and is, from the viewpoint of the shallowness of LUMO of the formed partial structure and the height of the excited singlet energy level and the excited triplet energy level thereof, preferably =N—. Ar is each independently a hydrogen, an aryl having a carbon number of 6 to 24, a heteroaryl having a carbon number of 2 to 24, an alkyl having a carbon number of 1 to 12, or a cycloalkyl having a carbon number of 3 to 18, and is, from the viewpoint of the depth of HOMO of the formed structure and the height of the excited singlet energy level and the excited triplet energy level thereof, preferably a hydrogen, an aryl having a carbon number of 6 to 12, a heteroaryl having a carbon number of 2 to 14, an alkyl having a carbon number of 1 to 4, or a cycloalkyl having a carbon number of 6 to 10, more preferably a hydrogen, a phenyl, a tolyl, a xylyl, a mesityl, a biphenyl, a pyridyl, a bipyridyl, a triazyl, a carbazolyl, a dimethylcarbazolyl, a di-tert-butylcarbazolyl, a benzimidazole or a phenylbenzimidazole, even more preferably a hydrogen, a phenyl or a carbazolyl. m is 1 or 2. n is an integer of 2 to (6-m), and is, from the viewpoint of steric hindrance, preferably a number of 4 to (6-m). At least one hydrogen in the compounds represented by any of the above formulae may be substituted with a halogen or a deuterium.

More specifically speaking, the compound for use as the second component tin the light-emitting layer in the present invention is preferably any of 4CzBN, 4CzBN-Ph, 5CzBN, 3Cz2DPhCzBN, 4CzIPN, 2PXZ-TAZ, Cz-TRZ3, BDPCC-TPTA, MA-TA, PA-TA, FA-TA, PXZ-TRZ, DMAC-TRZ, BCzT, DCzTrz, DDCzTRz, spiro-AC-TRZ, Ac-HPM, Ac-PPM, Ac-MPM, TCzTrz, TmCzTrz and DCzmCzTrz.

Also preferably, the compound for use as the second component in the light-emitting layer in the present invention is a thermally assisting delayed fluorescent material that is a compound whose emission spectrum overlaps at least partly with the absorption peak of an emitting dopant.

The compound for use as the second component in the light-emitting layer of the present invention is, from the viewpoint rapid reverse intersystem crossing from triplet to singlet, preferably a D-A-type TADF compound rather than an MRE-type TADF compound.

1-3. Fluorescent Material (Emitting Dopant)

In the present invention, a fluorescent material is used as the third component in the light-emitting layer.

Not specifically limited, the third compound in the present invention may be any known compound, and can be selected from various materials depending on the desired emission color. Specific examples of the compound include a condensed ring derivative such as phenanthrene, anthracene, pyrene, tetracene, pentacene, perylene, naphthopyrene, dibenzopyrene, rubrene and chrysene, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative (JP 1-245087 A) and a bisstyrylarylene derivative (JP 2-247278 A) such as a bisstyrylanthracene derivative and a distyrylbenzene derivative, a diazaindacene derivative, a furan derivative, a benzofuran derivative, an isobenzofurane derivative such as phenylisobenzofuran, dimesitylisobenzofuran, di(2-methylphenyl)isobenzofuran, di(2-trifluoromethylphenyl)isobenzofuran and phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative and a 3-benzoxazolylcoumarin derivative, a dicyanomethylenepyran derivative, a dicyanomethylenethiopyran derivative, a polymethine derivative, a cyanine derivative, an oxobenzanthracene derivative, an xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, furopyridine derivative, a 1,2,5-thiadiazolopyrene derivative, a pyrromethene derivative, a perinone derivative, a pyrrolopyrrole derivative, squarylium derivative, a violanthrone derivative, a phenazine derivative, an acridone derivative, a deazaflavin derivative, a fluorene derivative and a benzofluorene derivative.

The materials are exemplified separately according to emission color. The blue to blue green dopant material includes an aromatic hydrocarbon compound and a derivative thereof such as naphthalene, anthracene, phenanthrene, pyrene, triphenylene, perylene, fluorene, indene and chrysene, an aromatic heterocyclic compound and a derivative thereof such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine and thioxanthene, a distyrylbenzene derivative, a tetraphenylbutadiene derivative, a stilbene derivative, an aldazine derivative, a coumarin derivative, an azole derivative and a metal complex thereof such as imidazole, thiazole, thiadiazole, carbazole, oxazole, oxadiazole and triazole, and an aromatic amine derivative such as typically N,N'-diphenyl-N,N'-di(3-methylphenyl)-4,4'-diphenyl-1,1'-diamine.

The green to yellow dopant material includes a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. In addition, compounds synthesized by introducing a substituent for wavelength prolongation, such as an aryl, a heteroaryl, an arylvinyl, and amino or a cyano, into the compounds exemplified hereinabove for the blue to blue green dopant material are also preferred examples.

The orange to red dopant material includes a naphthalimide derivative such as bis(diisopropylphenyl)perylenetetracarboxylic acid imide, a perinone derivative, a rare earth complex such as an Eu complex with acetylacetone, benzoylacetone and phenanthroline as a complex, 4-(Dicyanomethylene)-2-methyl-6-(p-dimethylaminostyryl)-4H-pyran and an analog thereof, a metal phthalocyanine derivative such as magnesium phthalocyanine and aluminum chlorophthalocyanine, a rhodamine compound, a deazaflavin derivative, a coumarin derivative, a quinacridone derivative, a phenoxazine derivative, an oxazine derivative, a quinazoline derivative, a pyrrolopyridine derivative, a squalilium derivative, a violanthrone derivative, a phenazine derivative, a phenoxazine derivative and a thiadiazolopyrene derivative. In addition, compounds synthesized by introducing a substituent for wavelength prolongation, such as an aryl, a heteroaryl, an arylvinyl, and amino or a cyano, into the compounds exemplified hereinabove for the blue to blue green dopant material and the green to yellow dopant material are also preferred examples.

In addition, as the third component, any one appropriately selected from the compounds described in Chemical Engineering, July 2004, p. 13, and in the references cited therein can be used here.

The stilbene structure-having amine is, for example, represented by the following formula.

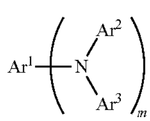

In the formula, $Ar^1$ is an m-valent group derived from an aryl having a carbon number of 6 to 30, $Ar^2$ and $Ar^3$ each are independently an aryl having a carbon number of 6 to 30, and at least one of $Ar^1$ to $Ar^3$ has a stilbene structure, and $Ar^1$ to $Ar^3$ may be substituted, and m is an integer of 1 to 4.

The stilbene structure-having amine is more preferably a diaminostilbene represented by the following formula.

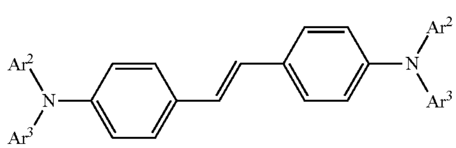

In the formula, $Ar^2$ and $Ar^3$ each are an aryl having a carbon number of 6 to 30, and $Ar^2$ and $Ar^3$ may be substituted.

Specific examples of the aryl having a carbon number of 6 to 30 include a benzene, a naphthacene, an acenaphthylene, a fluorene, a phenarene, a phenanthrene, an anthracene, a fluoranthene, a triphenylene, a pyren, a chrysene, a naphthacene, a perylene, a stilbene, a distyrylbenzene, a distyrylbiphenyl and a distyrylfluorene.

Specific examples of the stilbene structure-having amine include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N,N',N'-di(2-naphthyl)-N,N'-diphenyl-4,4'-diaminostilbene, N,N,N',N'-di(9-phenanthryl)-N,N'-diphenyl-4,4'-diaminostilbene, 4,4'-bis[4"-bis(diphenylamino)styryl]-biphenyl, 1,4-bis[4'-bis(diphenylamino)styryl]-benzene. 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

In addition, the stilbene structure-having amines described in JP 2003-347056 A and JP 2001-307884 A are also usable.

Examples of the perylene derivative include 3,10-bis(2,6-dimethylphenyl)perylene, 3,10-bis(2,4,6-trimethylphenyl)perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di-(t-butyl)perylene, 3-(9'-anthryl)-8,11-di(t-butyl)perylene, and 3,3'-bis(8,11-di(t-butyl)perylenyl).

In addition, the perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, and JP 2001-217077 A are also usable.

In addition, a boron atom-containing compound is also usable as the third component in the present invention, and examples thereof include a borane derivative, a dioxaboranaphthoanthracene (DOBNA) derivative and a multimer thereof, a diazaboranaphthoanthracene (DABNA) derivative and a multimer thereof, an oxazaboranaphthoanthracene (OABNA) derivative and a multimer thereof, an oxaboranaphthoanthracene (OBNA) derivative and a multimer thereof, an azaboranaphthoanthracene (ABNA) derivative and a multimer thereof, a trioxaboradibenzopyrene derivative and a multimer thereof, a dioxazaborabenzopyrene derivative and a multimer thereof, and an oxadiazaborabenzopyrene derivative and a multimer thereof.

Examples of the borane derivative include 1,8-diphenyl-10-(dimesitylboryl)anthracene, 9-phenyl-10-(dimesitylboryl)anthracene, 4-(9'-anthryl)dimesitylborylnaphthalene, 4-(10'-phenyl-9'-anthryl)dimesitylborylnaphthalene, 9-(dimesitylboryl)anthracene, 9-(4'-biphenylyl)-10-(dimesitylboryl)anthracene, and 9-(4'-(N-carbazolyl)phenyl)-10-(dimesitylboryl)anthracene.

In addition, the borane derivatives described in WO2000/40586 are also usable.

The aromatic amine derivative is, for example, represented by the following formula.

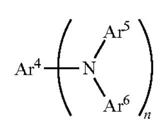

In the formula, $Ar^4$ is an n-valent group derived from an aryl having a carbon number of 6 to 30, $Ar^5$ and $Ar^6$ each are independently an aryl having a carbon number of 6 to 30, $Ar^4$ to $Ar^6$ may be substituted, and n is an integer of 1 to 4.

The aromatic amine derivative is especially preferably such that $Ar^4$ is a divalent group derived from anthracene, chrysene, fluorene, benzofluorene or pyrene, $Ar^5$ and $Ar^6$ each are independently an aryl having a carbon number of 6 to 30, $Ar^4$ to $Ar^6$ may be substituted, and n is 2

Specific examples of the aryl having a carbon number of 6 to 30 include a benzene, a naphthalene, an acenaphthene, a fluorenephenalene, a phenanthrene, an anthracene, a fluoranthene, a triphenylene, a pyrene, a chrysene, a naphthacene, a perylene, and a pentacene.

Examples of the aromatic amine derivative are described. Examples of chrysene-type derivatives include N,N,N',N'-tetraphenylchrysene-6,12-diamine, N,N,N',N'-tetra(p-tolyl) chrysene-6,12-diamine, N,N,N',N'-tetra(m-tolyl)chrysene-6,12-diamine, N,N,N',N'-tetrakis(4-isopropylphenyl) chrysene-6,12-diamine, N,N,N',N'-tetra(naphthalen-2-yl) chrysene-6,12-diamine, N,N'-diphenyl-N,N'-di(o-tolyl) chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Examples of pyrene-type derivatives include N,N,N',N'-tetraphenylpyrene-1,6-diamine, N,N,N',N'-tetra(p-tolyl) pyrene-1,6-diamine, N,N,N',N'-tetra(m-tolyl)pyrene-1,6-diamine, N,N,N',N'-tetrakis(4-isopropylphenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N'-diphenyl-N,N'-bis(4-iso propylphenyl)pyrene-1,6-diamine, N,N'-diphenyl-N,N'-bis(4-t-butylphenyl) pyrene-1,6-diamine, N,N'-bis(4-isopropylphenyl)-N,N'-di (p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1$,$N^6$-diphenyl-$N^1$,$N^6$-bis-(4-trimethylsilanyl-phenyl)-1H,8H-pyrene-1,6-diamine.

Specific examples include formulae (PYR1), (PYR2), (PYR3) and (PYR4).

(PYR1)

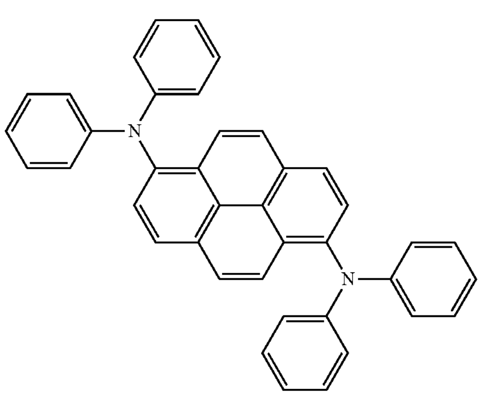

-continued (PYR2)

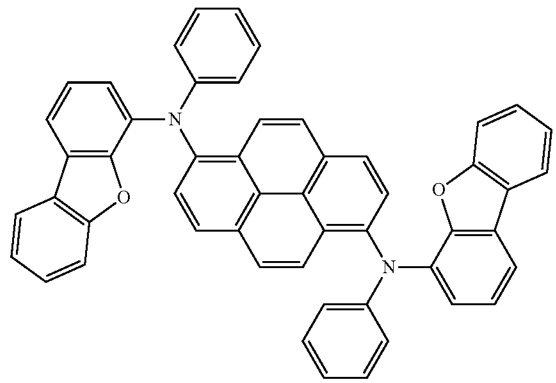

(PYR3)

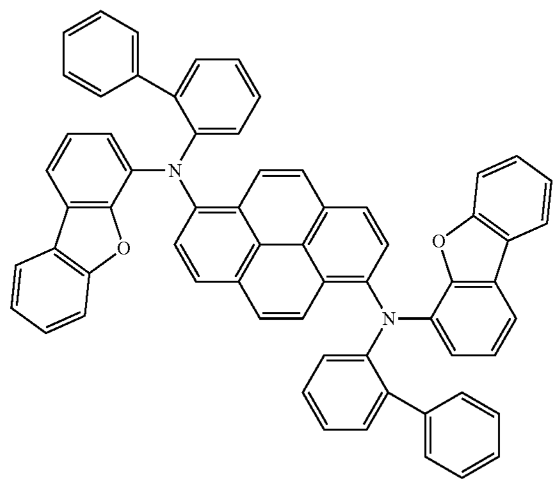

(PYR4)

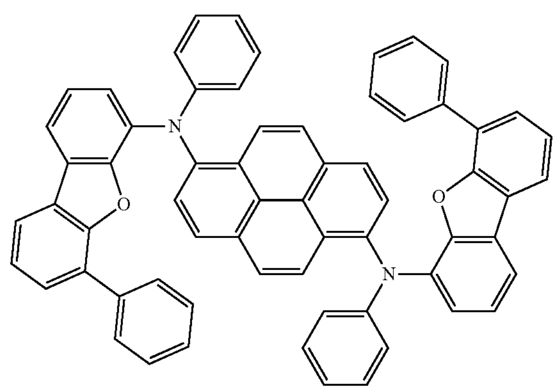

Examples of anthracene-type derivatives include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl) anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl- N,N'-diphenyl-N,N'-bis(4-isopropylphenyl)anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,1 0-diamine, 9,10-bis(4-diphenylamino-phenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl)anthracene.

In addition, also mentioned are [4-(4-diphenylamino-phenyl)naphthalen-1-yl]-diphenylamine, [6-(4-diphenylamino-phenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, 4,4"-bis[6-diphenylaminonaphthalen-2-yl]-p-terphenyl, and an indolocarbazole derivative.

Further, the aromatic amine derivatives described in JP 2006-156888 A are also usable.

The indolocarbazole derivative is a compound represented by the following general formula (IDC1). Specifically, the derivative includes compounds having any of the following partial structures (IDC11), (IDC12) and (IDC13). In the following general formula (IDC1), Z each is independently $CR_A$ or N, π1 and π2 each are independently a substituted or unsubstituted aromatic hydrocarbon having a ring carbon number of 6 to 50, or a substituted or unsubstituted aromatic hetero ring having a ring carbon number of 5 to 50, $R_A$, $R_B$ and $R_C$ each are a hydrogen or an arbitrary substituent, n and m each are independently an integer of 1 to 4, neighboring two $R_A$, $R_B$ and $R_C$ may bond to each other to form a substituted or unsubstituted ring structure. More specifically, the compound includes formulae (IDC121), (IDC131), (IDC132), (IDC133) and (IDC134).

Partial Structure of Indelocarbazole Compound (IDC1)

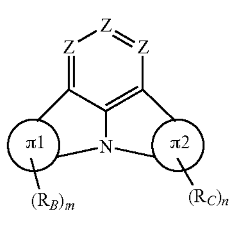

(IDC11)

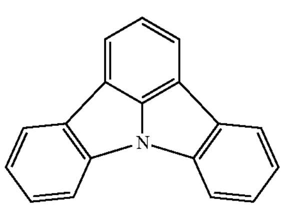

-continued (IDC12)

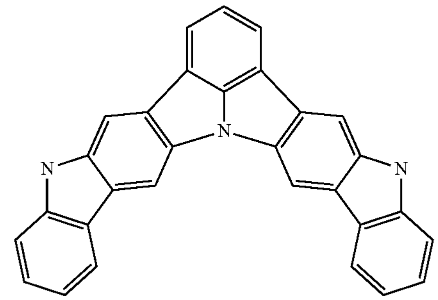

(IDC13)

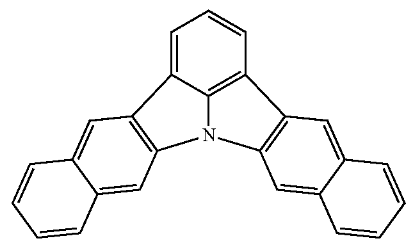

Examples of Indelocarbazole Compound (IDC131)

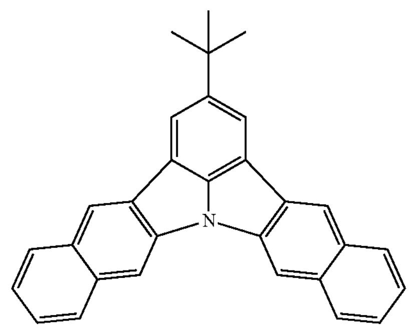

(IDC132)

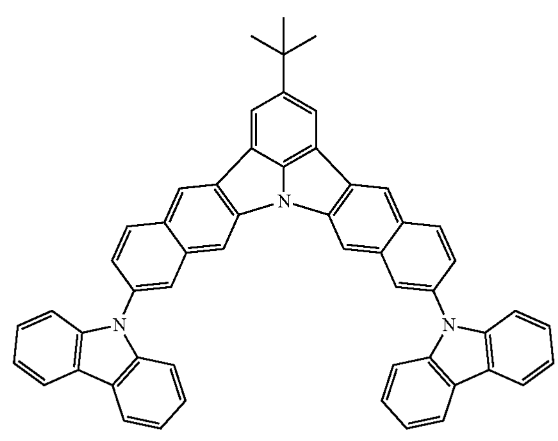

-continued (IDC133)

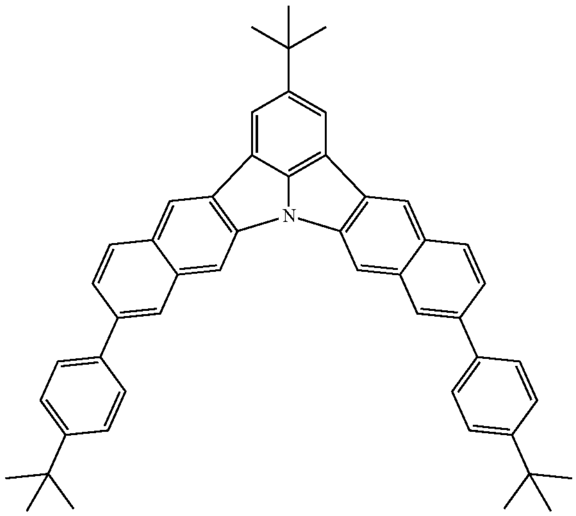

(IDC134)

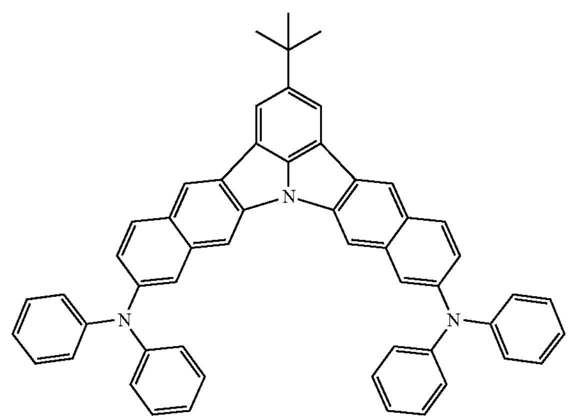

(IDC121)

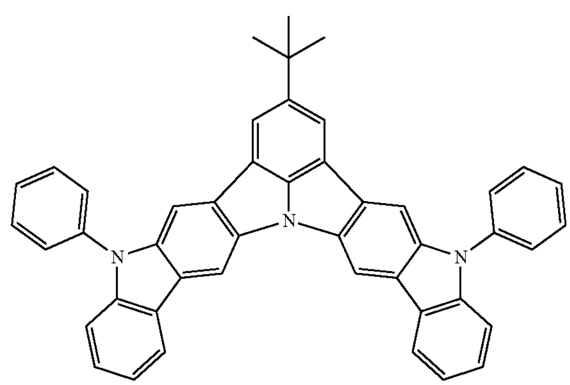

The coumarin derivative includes coumarin-6 and coumarin-334.

In addition, the coumarin derivatives described in JP 2004-43646 A, JP 2001-76876 A, and JP 6-298758 A are also usable.

The pyran derivative includes the following DCM and DCJTB.

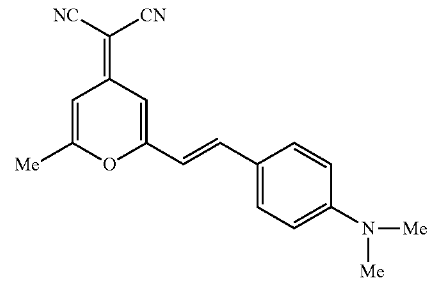

DCM

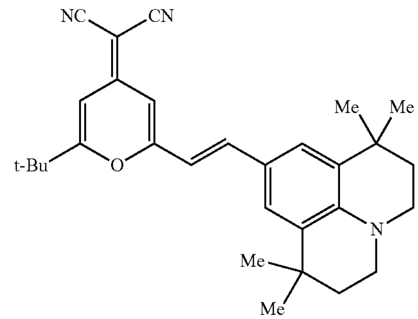

DCJTB

In addition, the pyran derivatives described in JP 2005-126399 A, JP 2005-097283 A, JP 2002-234892 A, JP 2001-220577 A, JP 2001-081090 A, and JP 2001-052869 A are also usable.

The fluorescent material for use in the present invention is preferably a boron atom-having compound. The boron atom-having compound usable as the fluorescent material include a dioxaboranaphthoanthracene (DOBNA) derivative and a multimer thereof, a diazaboranaphthoanthracene (DABNA) derivative and a multimer thereof, an oxazaboranaphthoanthracene (OABNA) derivative and a multimer thereof, an oxaboranaphthoanthracene (OBNA) derivative and a multimer thereof, an azaboranaphthoanthracene (ABNA) derivative and a multimer thereof.

Also preferably, the organic electroluminescent device of the present invention contains at least one compound represented by any of the following general formulae (ED1), (ED1') and (ED2) as the third component.

(ED1)

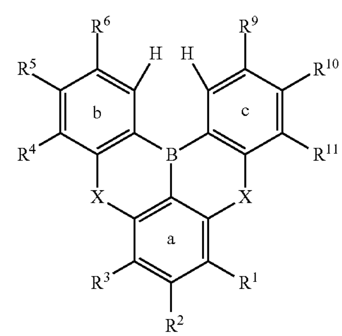

In the general formula (ED1):

$R^1$, $R^2$, $R^3$, $R^4$, $R^5$, $R^6$, $R^9$, $R^{10}$ and $R^{11}$ each are independently a hydrogen, an aryl, a heteroaryl, a diarylamino, a diheteroarylamino, an arylheteroarylamino, an alkyl, a cycloalkyl, an alkoxy or an aryloxy, and these may be further substituted with an aryl, a heteroaryl or an alkyl, and among $R^1$ to $R^3$, $R^4$ to $R^6$ and $R^9$ to $R^{11}$, neighboring groups may bond to each other to form an aryl ring or a heteroaryl ring along with the ring a, the ring b or the ring c, the formed ring may be substituted with an aryl, a heteroaryl, a diarylamino, a diheteroarylamino, an arylheteroarylamino, an alkyl, a cycloalkyl, an alkoxy or an aryloxy, and these may be further substituted with an aryl, a heteroaryl or an alkyl, X is each independently >O or >N—R, R in >N—R is an aryl, a heteroaryl, a cycloalkyl or an alkyl, and these may be substituted with an aryl, a heteroaryl, a cycloalkyl or an alkyl, when X is an amino group, $R^2$ is not an amino group, and at least one hydrogen in the compound and the structure represented by the general formula (ED1) may be substituted with a cyano, a halogen or a deuterium.

(ED1')

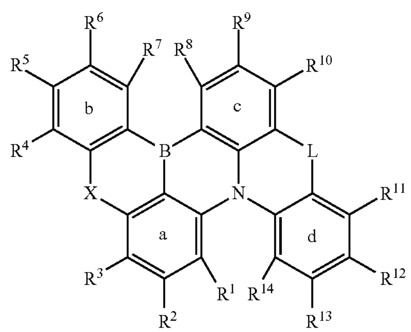

In the general formula (ED1'):

$R^1$, $R^2$, $R^3$, $R^4$, $R_5$, $R^6$, $R^7$, $R^8$, $R^9$, $R^{10}$, $R^{11}$, $R^{12}$, $R^{13}$ and $R^{14}$ each are independently a hydrogen, an aryl, a heteroaryl, a diarylamino, a diheteroarylamino, an arylheteroarylamino, an alkyl, a cycloalkyl, an alkoxy or an aryloxy, and these may be further substituted with an aryl, a heteroaryl or an alkyl, and among $R^1$ to $R^3$, $R^4$ to $R^7$, $R^8$ to $R^{10}$ and $R^{11}$ to $R^{14}$, neighboring groups may bond to each other to form an aryl ring or a heteroaryl ring along with the ring a, the ring b or the ring c, the formed ring may be substituted with an aryl, a heteroaryl, a diarylamino, a diheteroarylamino, an arylheteroarylamino, an alkyl, a cycloalkyl, an alkoxy or an aryloxy, and these may be further substituted with an aryl, a heteroaryl or an alkyl, X is >O or >N—R, R in >N—R is an aryl, a heteroaryl, or an alkyl, and these may be substituted with an aryl, a heteroaryl, or an alkyl, L is a single bond, $>CR_2$, >O, >S or >N—R, R in $>CR_2$ and >N—R each is independently a hydrogen, an aryl, a heteroaryl, a diarylamino, a diheteroarylamino, an arylheteroarylamino, an alkyl, an alkoxy or an aryloxy, and these may be further substituted with an aryl, a heteroaryl, or an alkyl, and at least one hydrogen in the compound and the structure represented by the general formula (ED1') may be substituted with a cyano, a halogen or a deuterium.

(ED2)

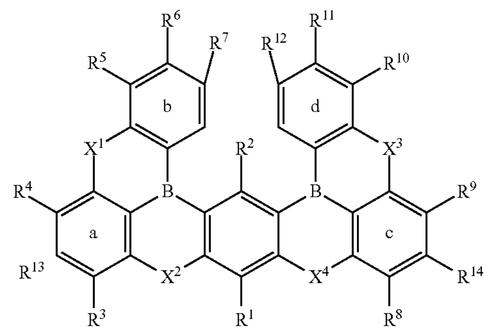

In the general formula (ED2):

$R^1$, $R^2$, $R^3$, $R^4$, $R_5$, $R^6$, $R^7$, $R_8$, $R^9$, $R^{10}$, $R^{11}$, $R^{12}$, $R^{13}$ and $R^{14}$ each are independently a hydrogen, an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio, or an alkyl-substituted silyl, and at least one hydrogen in these may be substituted with an aryl, a heteroaryl or an alkyl, and among $R^5$ to $R^7$ and $R^{10}$ to $R^{12}$, neighboring groups may bond to each other to form an aryl ring or a heteroaryl ring along with the ring b or the ring d, at least one hydrogen in the formed ring may be substituted with an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl, and at least one hydrogen in these may be substituted with an aryl, a heteroaryl or an alkyl, $X^1$, $X^2$, $X^3$ and $X^4$ each are independently >0, >N—R or $>CR_2$, R in >N—R and R in $>CR_2$ each are an aryl having a carbon number of 6 to 12, a heteroaryl having a carbon number of 2 to 15, a cycloalkyl having a carbon number of 3 to 12, or an alkyl having a carbon number of 1 to 6, and R in >N—R and R in $>CR_2$ may bond to at least one of the ring a, the ring b, the ring c and the ring d via —O—, —S—, $—C(—R)_2—$ or a single bond, R in $—C(—R)_2—$ is a hydrogen or an alkyl having a carbon number of 1 to 6, provided that, among $X^1$, $X^2$, $X^3$ and $X^4$, the number of the groups representing >O is two or less, and at least one hydrogen in the compound represented by the general formula (ED2) may be substituted with a cyano, a halogen or a deuterium.

More specifically, there are mentioned compounds having a structure represented by any of the following formulae (ED11) to (ED19), (ED21) to (ED27), (ED211), (ED212), (ED221) to (ED223), (ED231), (ED241), (ED242), (ED261) and (ED271).

(ED11)

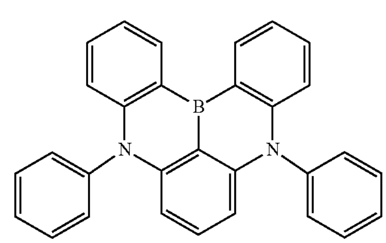

-continued
(ED12)
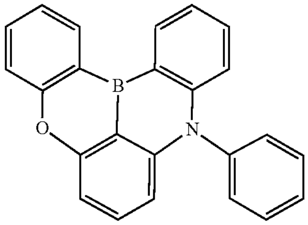
(ED13)
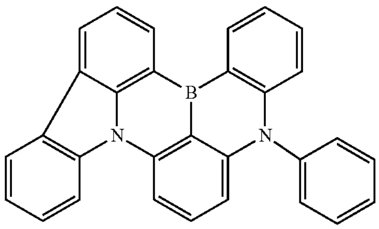
(ED14)
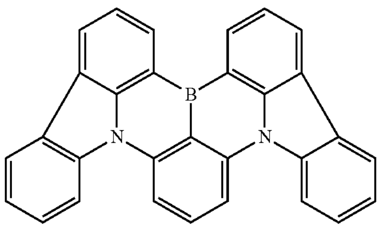
(ED15)
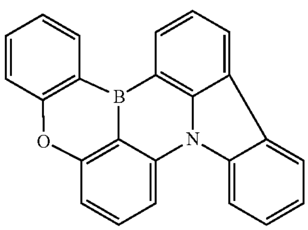
(ED16)
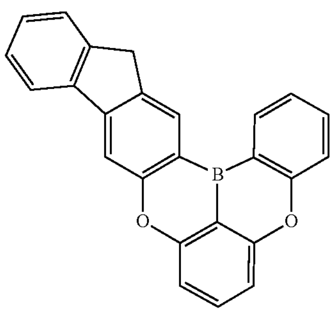
(ED17)
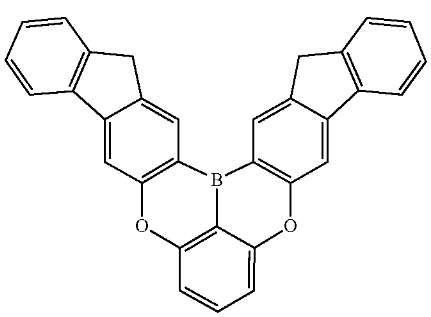
-continued
(ED18)
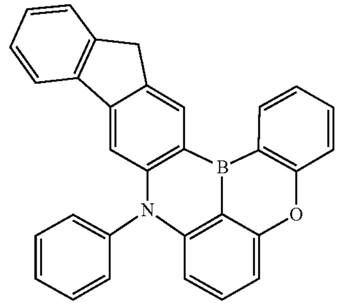
(ED19)
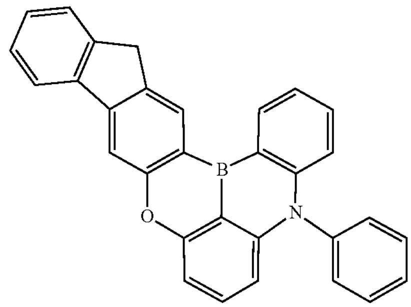
(ED21)
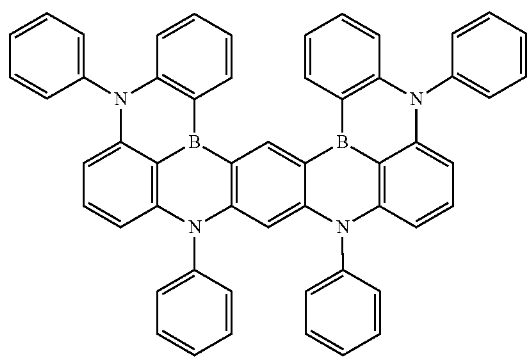
(ED22)
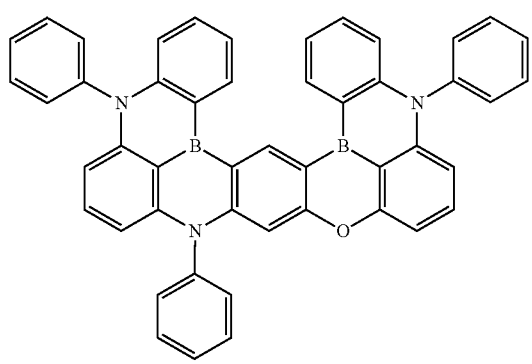

-continued
(ED23)
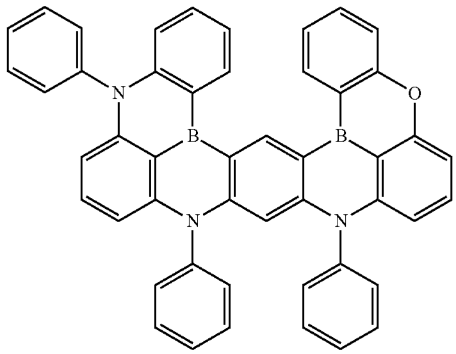
(ED24)
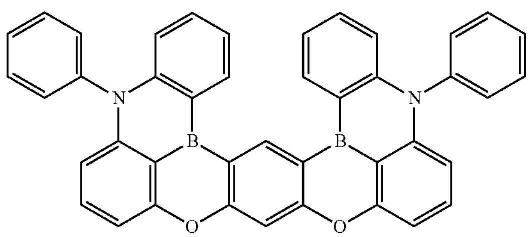
(ED25)
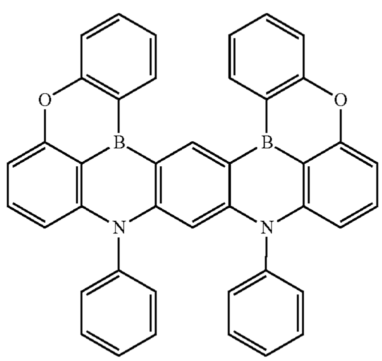
(ED26)
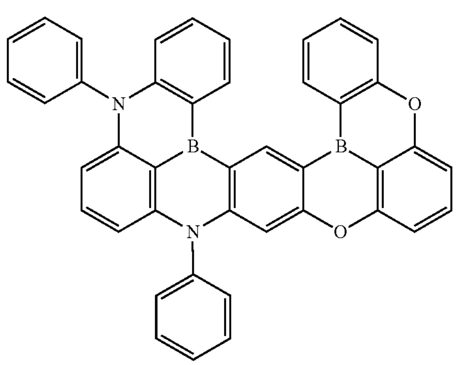
-continued
(ED27)
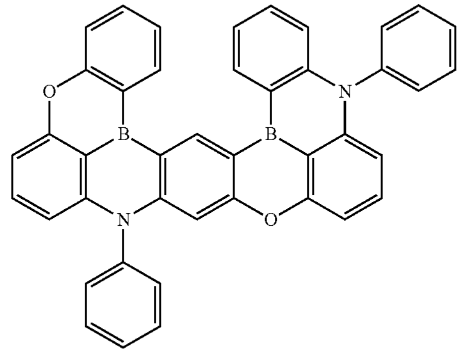
(ED211)
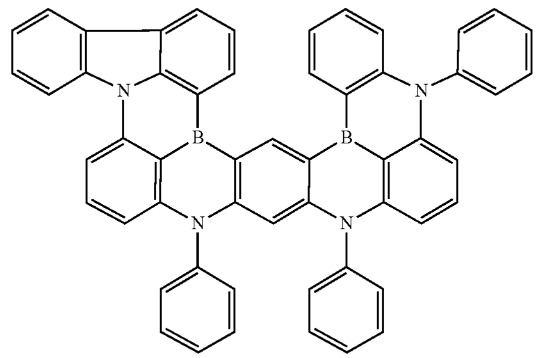
(ED212)
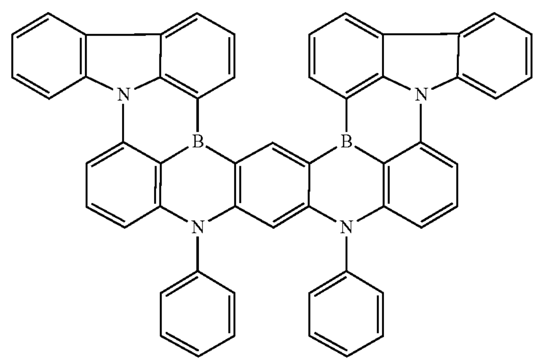
(ED221)
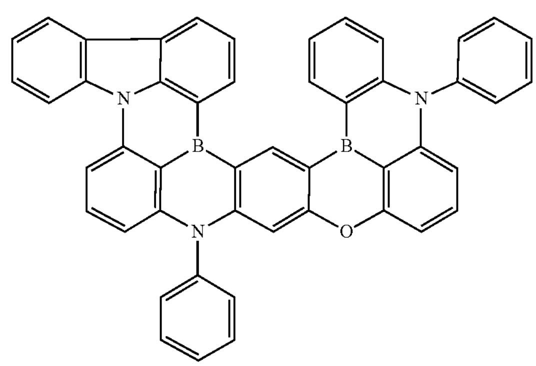

-continued (ED222)

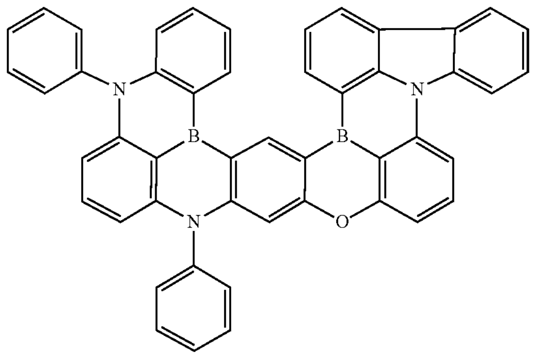

(ED223)

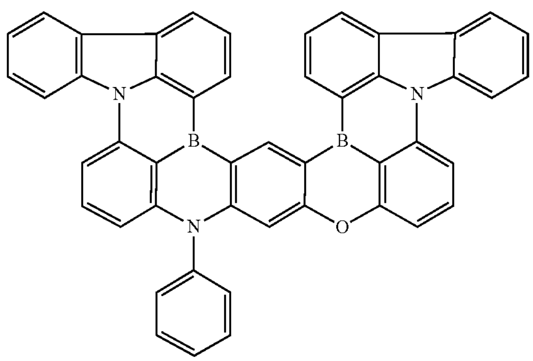

(ED231)

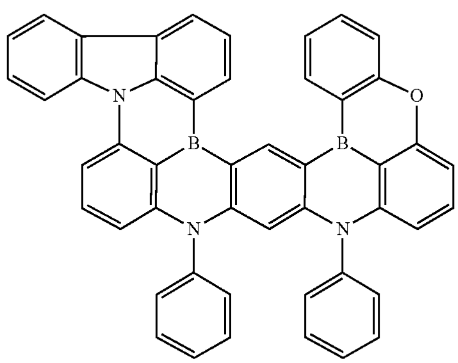

(ED241)

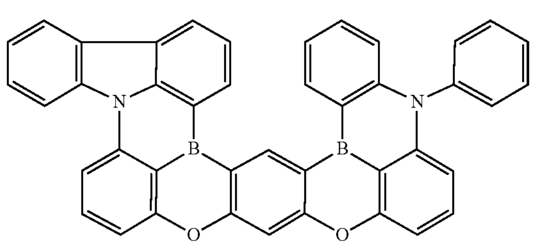

(ED242)

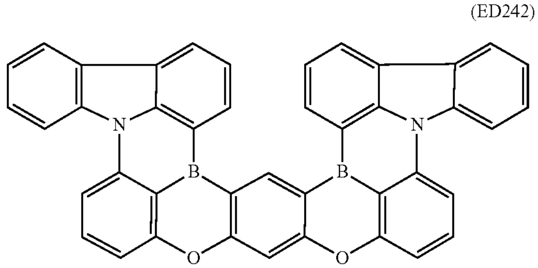

-continued (ED261)

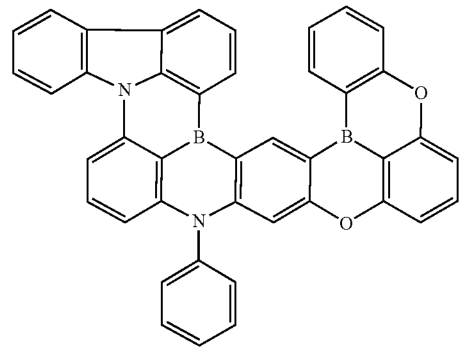

(ED271)

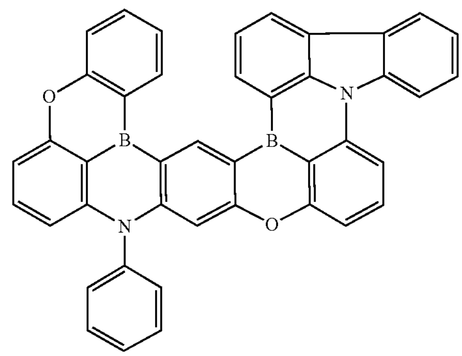

At least one hydrogen in the structure represented by any of the formulae (ED11) to (ED19), (ED21) to (ED27), (ED211), (ED212), (ED221) to (ED223), (ED231), (ED241), (ED242), (ED261) and (ED271) each may be independently substituted with an aryl, a heteroaryl, a diarylamino, a diheteroarylamino, an arylheteroarylamino, an alkyl, a cycloalkyl, an alkoxy or an aryloxy, and these may be further substituted with an aryl, a heteroaryl or an alkyl. Regarding the preferred range and the specific examples of the aryl, the heteroaryl, the diarylamino, the diheteroarylamino, the arylheteroarylamino, the alkyl, the cycloalkyl, the alkoxy and the aryloxy, reference may be made to the corresponding description of $R^1$ to $R^{11}$ in the formula (1). In formulae (ED11) and (ED12), the hydrogen bonding to the ortho-position of the carbon bonding to B of the benzene ring is not substituted with an alkyl, and is preferably unsubstituted.

The fluorescent material to be the third component is preferably a compound having at least one structure selected from the following partial structure group B, and more preferably a compound having a structure represented by any of the formulae (ED11) to (ED19), (ED21) to (ED27), (ED211), (ED212), (ED221) to (ED223), (ED231), (ED241), (ED242), (ED261) and (ED271) and having at least one structure selected from the partial structure group B and bonding to the benzene ring (including the benzene ring constituting a condensed ring) in the structure.

Partial Structure Group B:

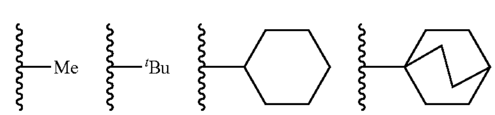

-continued

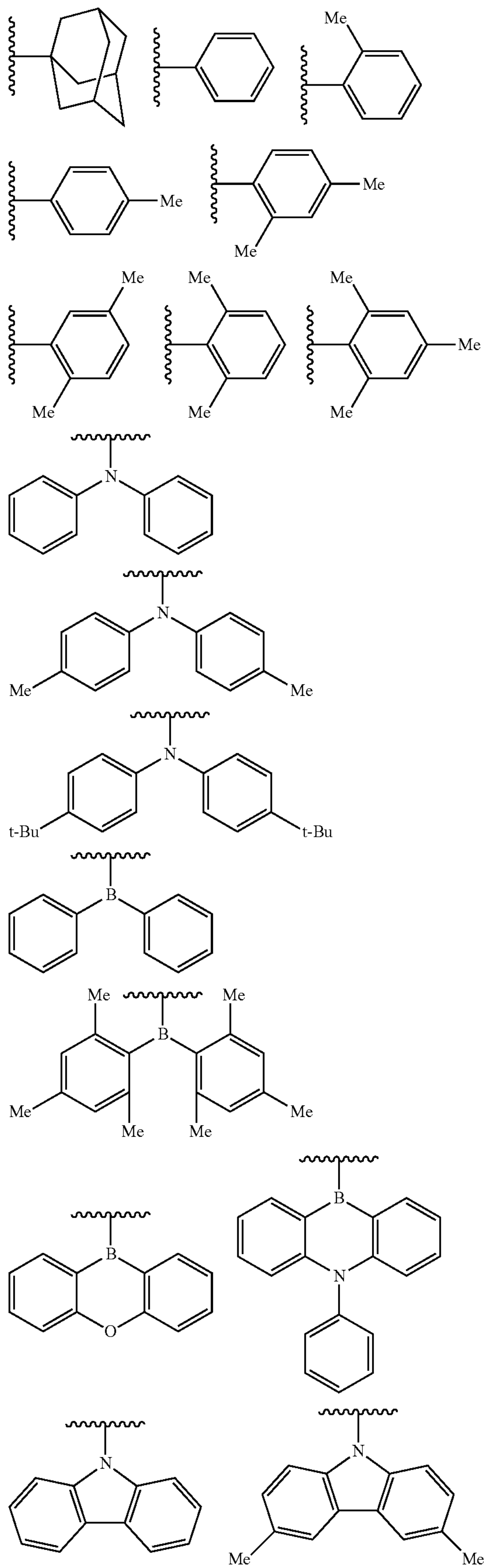

-continued

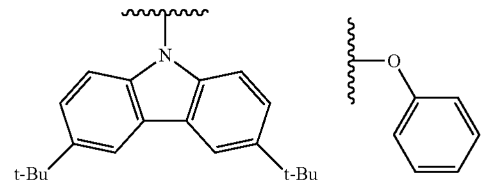

In the partial structures, Me represents a methyl, $^t$Bu and t-Bu represent a t-butyl, and the wavy line indicates a bonding position.

At least one hydrogen in the partial structure each may be independently substituted with an aryl, a heteroaryl, a diarylamino, a diheteroarylamino, an arylheteroarylamino, an alkyl, an alkoxy or an aryloxy, and among these, the hydrogen in the aryl, the heteroaryl, the diarylamino, the diheteroarylamino, and the arylheteroarylamino may be further substituted with an aryl, a heteroaryl or an alkyl. Regarding the preferred range and the specific examples of the aryl, the heteroaryl, the diarylamino, the diheteroarylamino, the arylheteroarylamino, the alkyl, the alkoxy and the aryloxy, reference may be made to the corresponding description of $R^1$ to $R^{11}$ in the formula (1).

Specifically, the compound for use as the third component in the present invention includes compounds represented by the following formulae.

(1-1151)

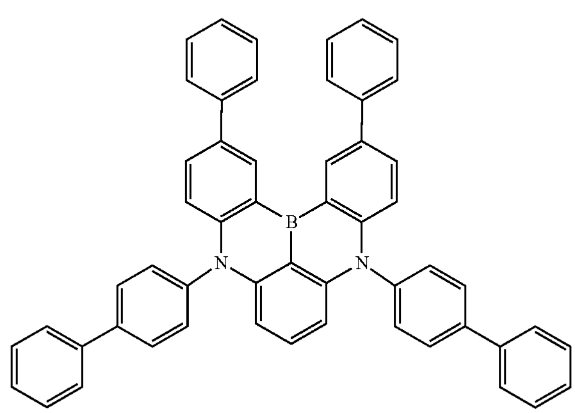

(1-1152)

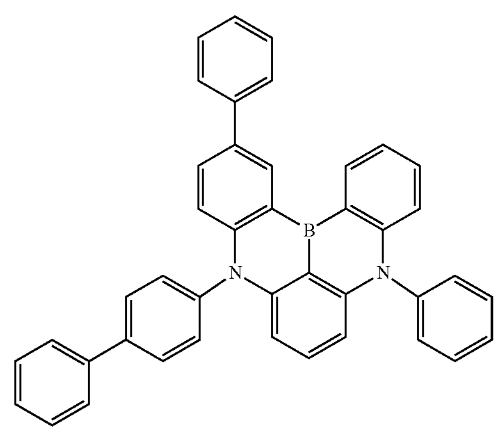

(1-1153)
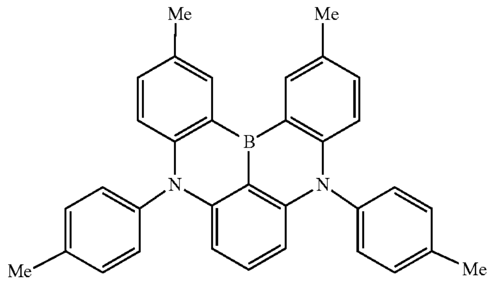
(1-1154)
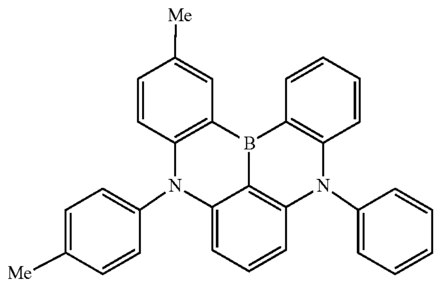
(1-1155)
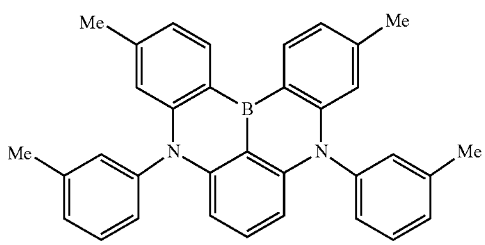
(1-1156)
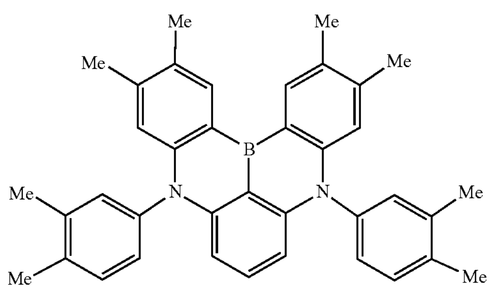
(1-1157)
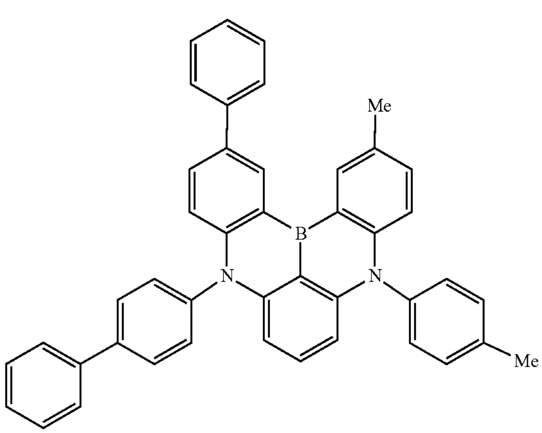
(1-1158)
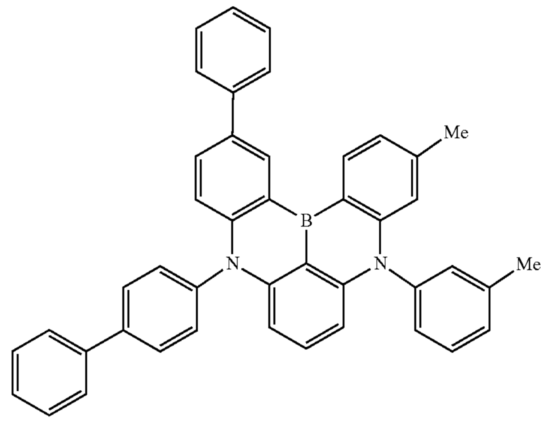
(1-1159)
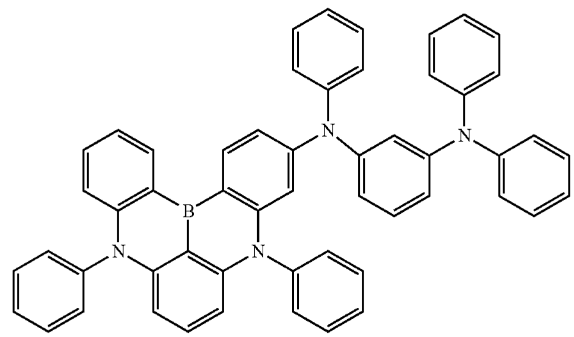
(1-2621)
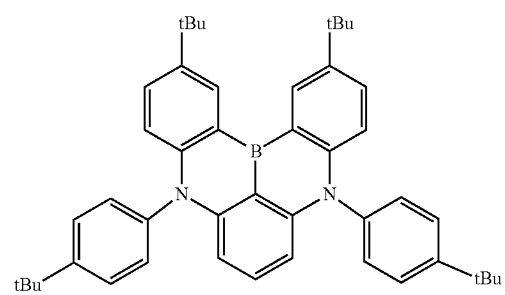
(1-2622)
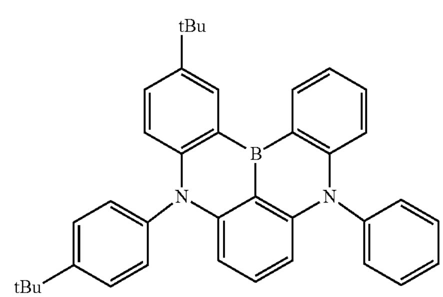

-continued
(1-2623)
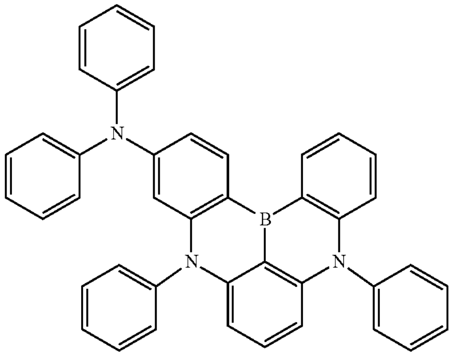
(1-2626)
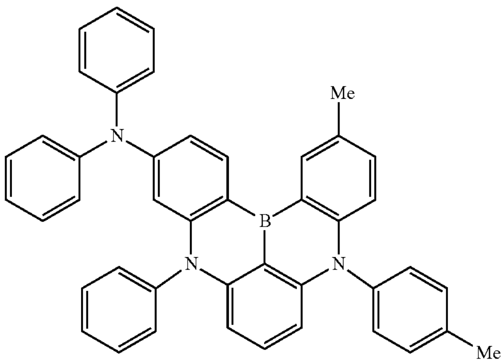
(1-2621-Me)
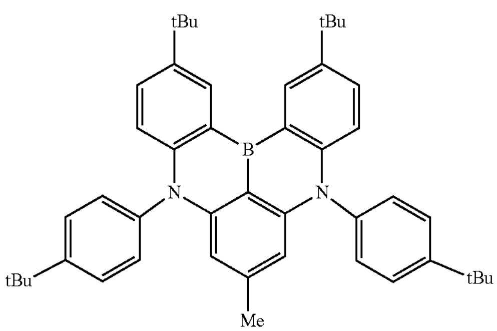
(1-2621-tBu)
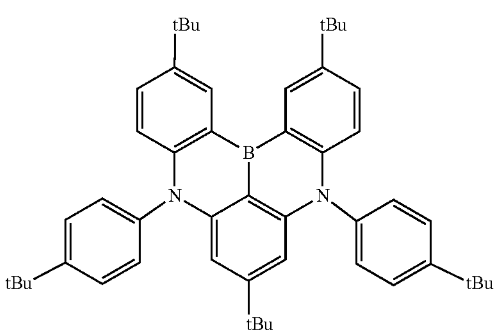
-continued
(1-2621-Ad)
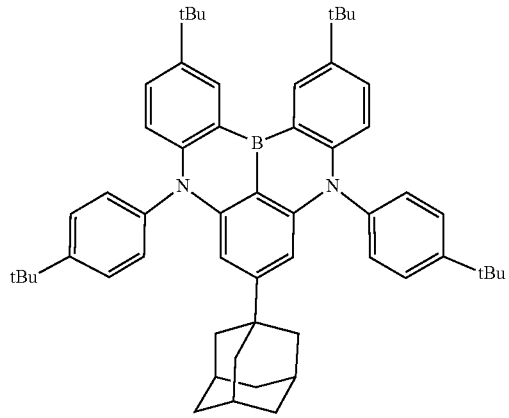
(1-2653)
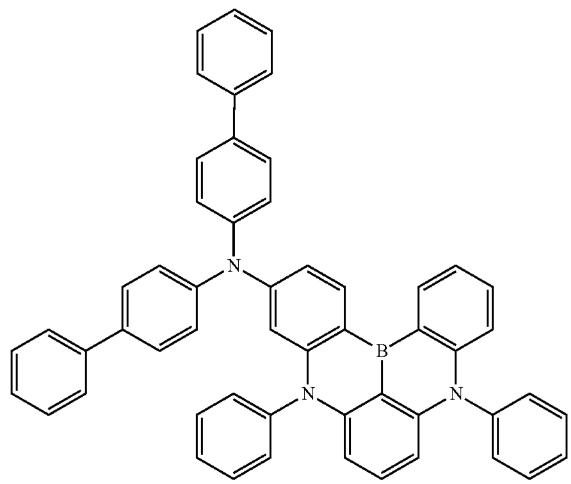
(1-2654)
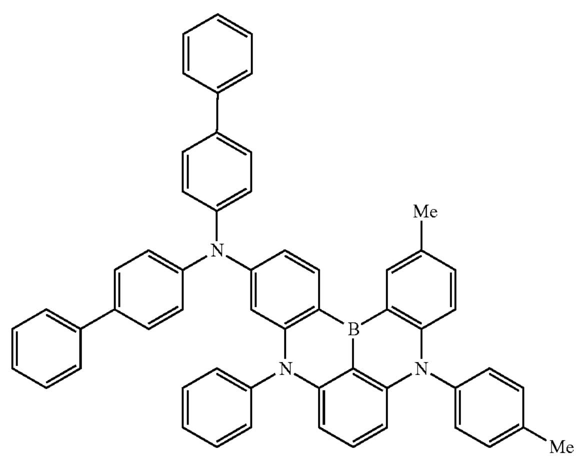

-continued
(1-2655)
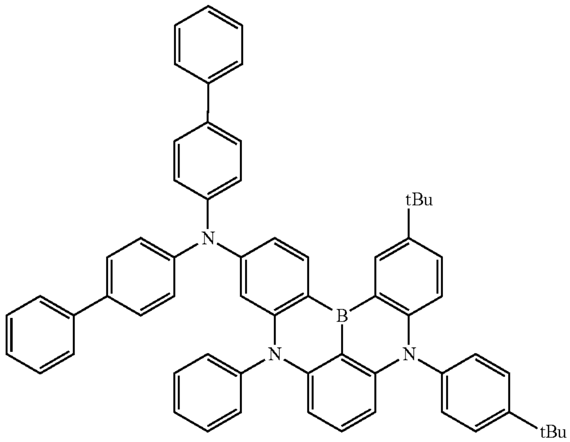
(1-2656)
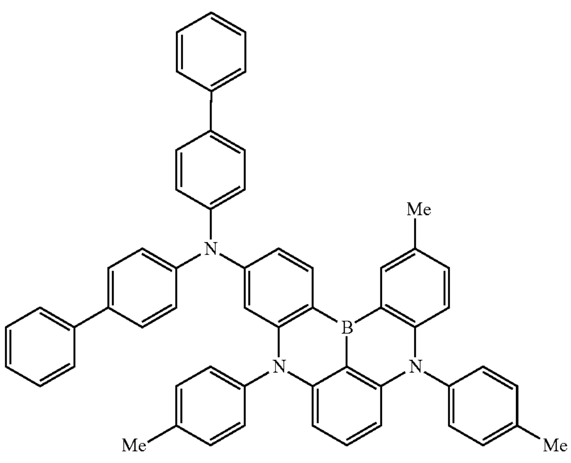
(1-2658)
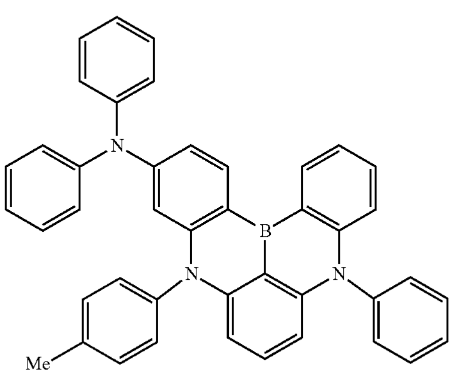
-continued
(1-2659)
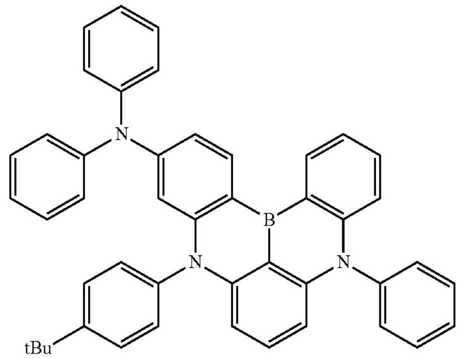
(1-2662)
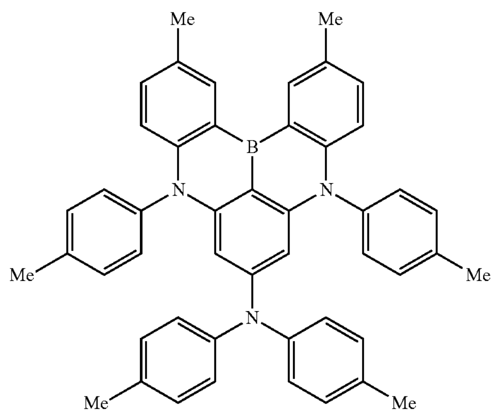
(1-2663)
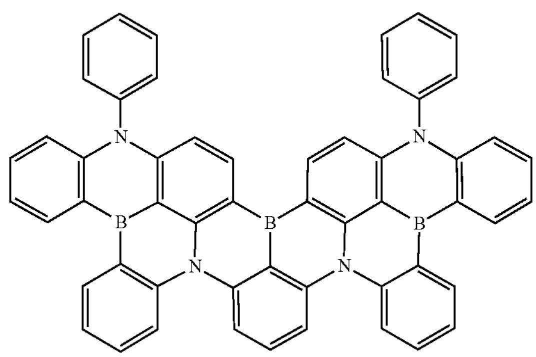
(1-2664)
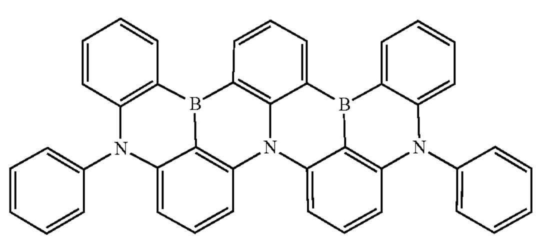

-continued
(1-2665)
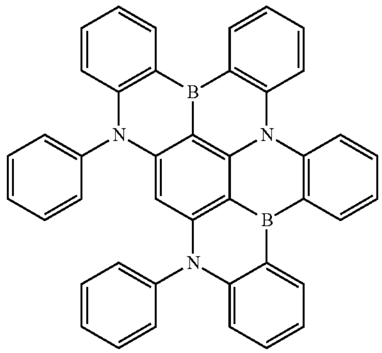
(1-2666)
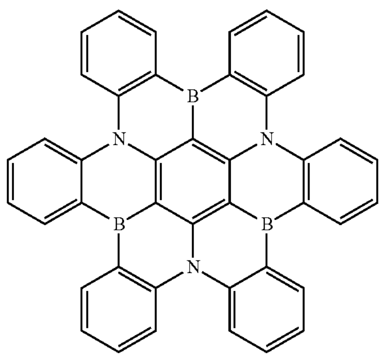
(1-2667)
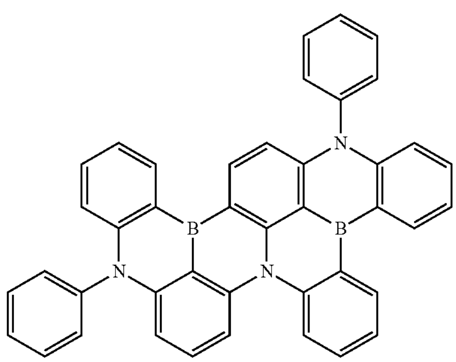
(1-2672)
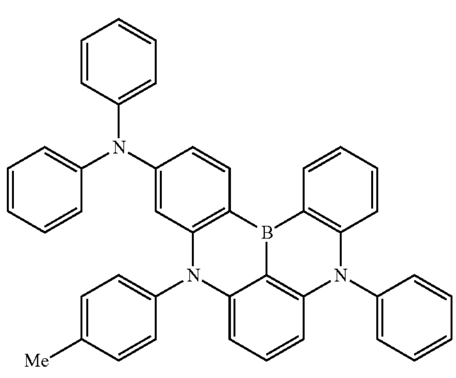
-continued
(1-2673)
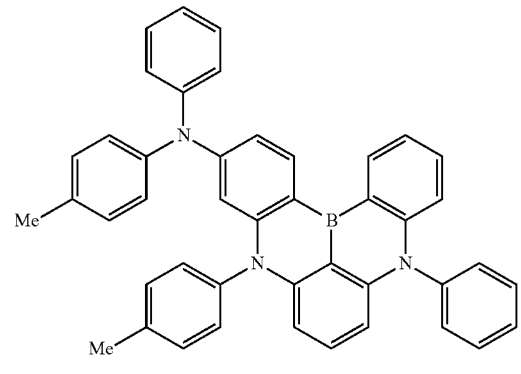
(1-2674)
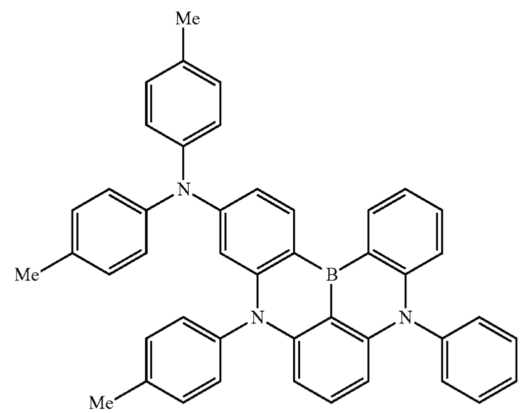
(1-2675)
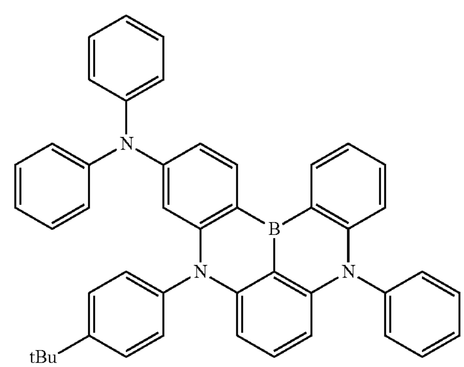
(1-2676)
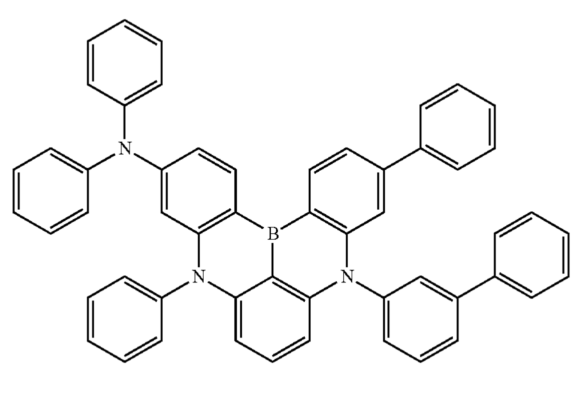

-continued
(1-2677)
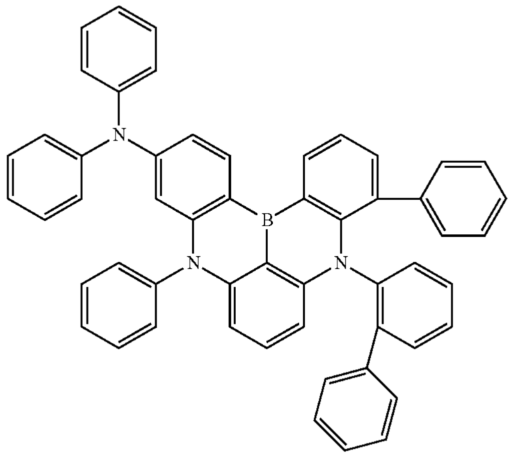
(1-2678)
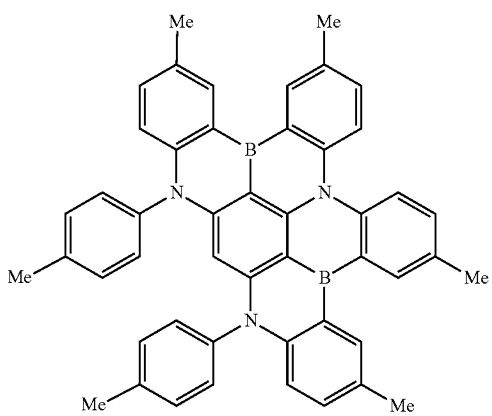
(1-2679)
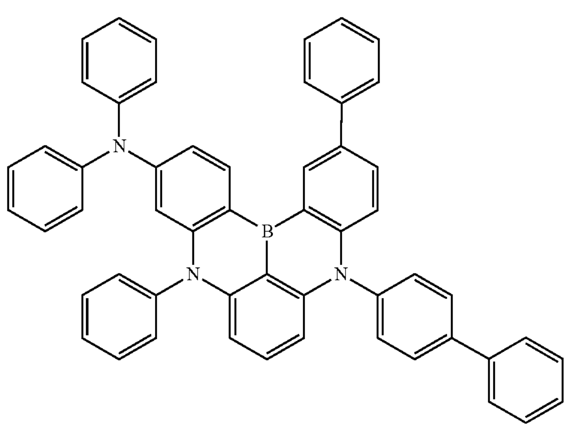
-continued
(1-2680)
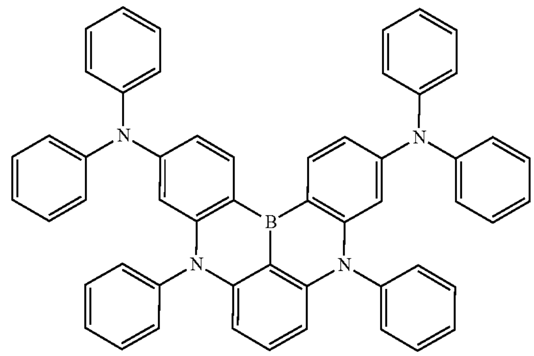
(1-2683)
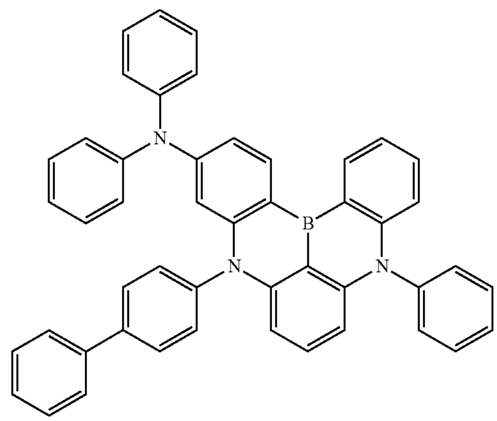
(1-2685)
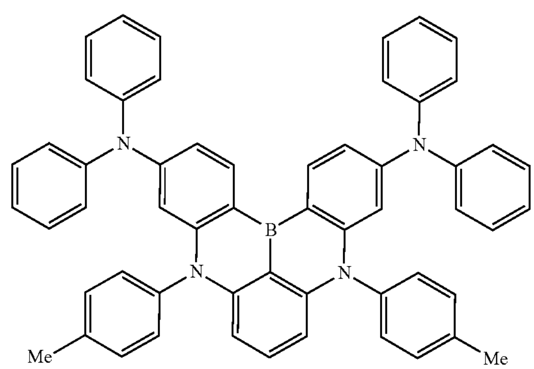
(1-2691)
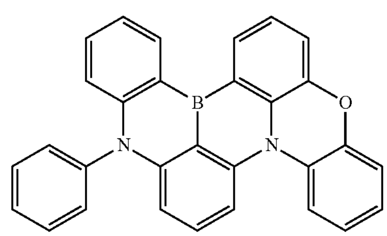

-continued
(1-2692)
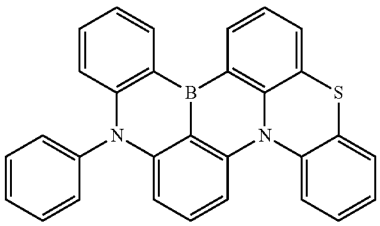
(1-2693)
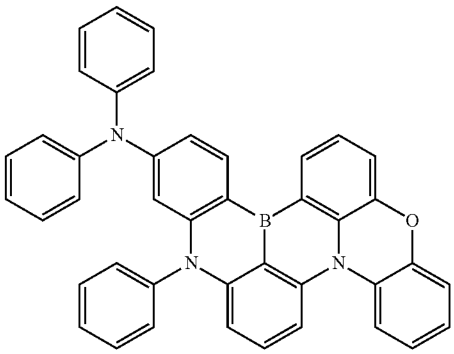
(1-2700)
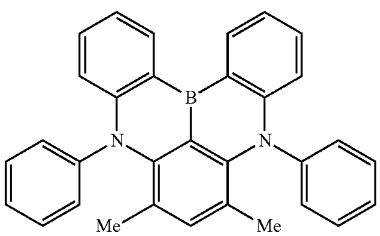
(1-2701)
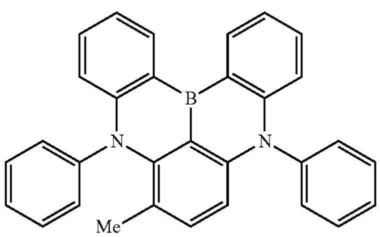
(1-2702)
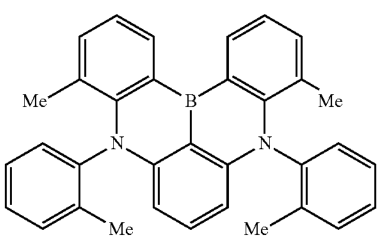
(1-2703)
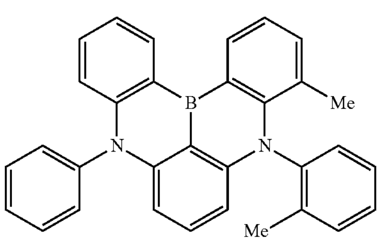
-continued
(1-2704)
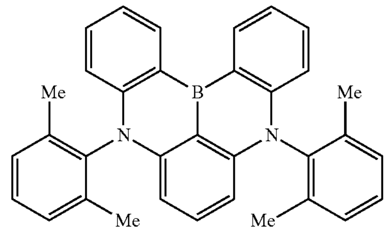
(1-2705)
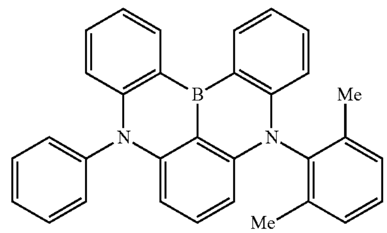
(BN2-0001)
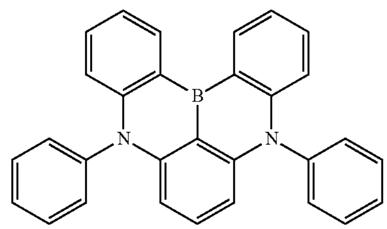
(BN2-0210)
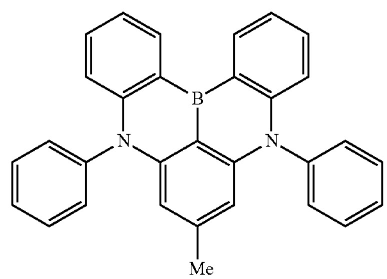
(BN2-0211)
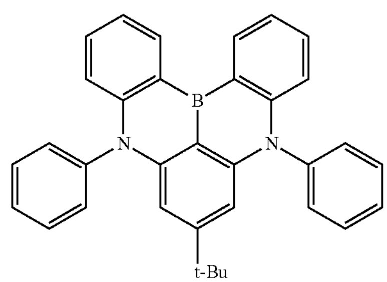
(BN2-0210/0510S/1010S)
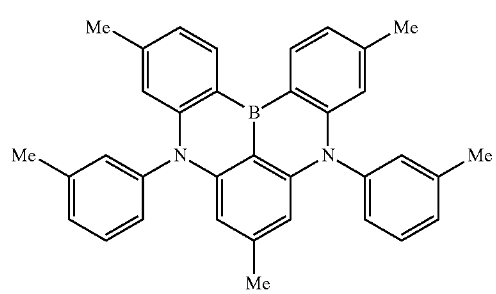

(BN2-0210/0511S/1011S)
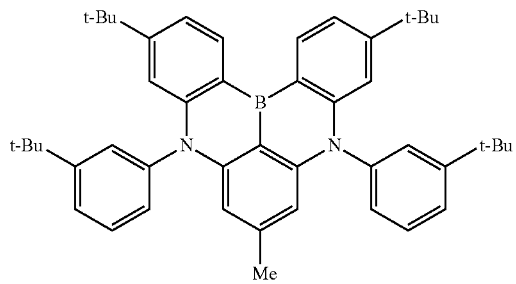
(BN2-0211/0511S/1011S)
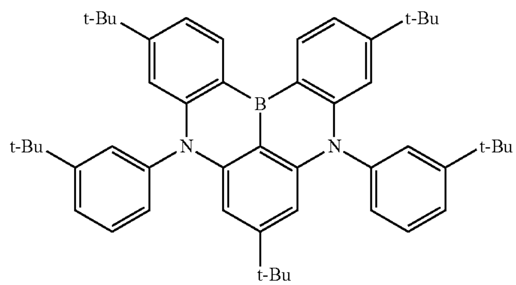
(BN2-0210/0510S/1010S-1)
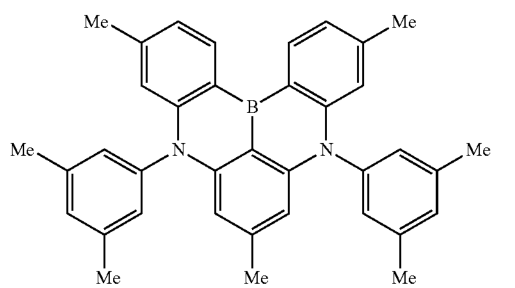
(BN2-0210/0511S/1011S-1)
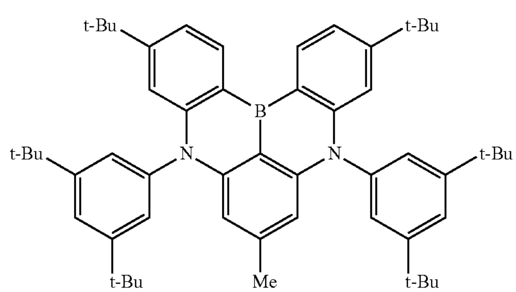
(BN2-0211/0511S/1011S-1)
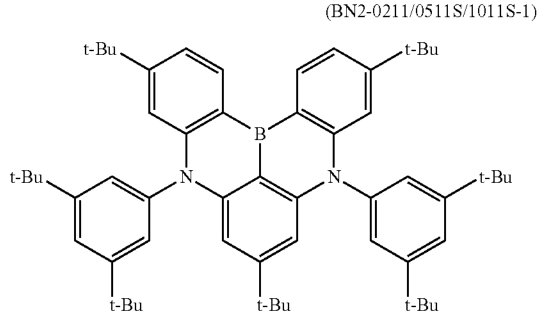
(BN2-0210/0610S/0910S)
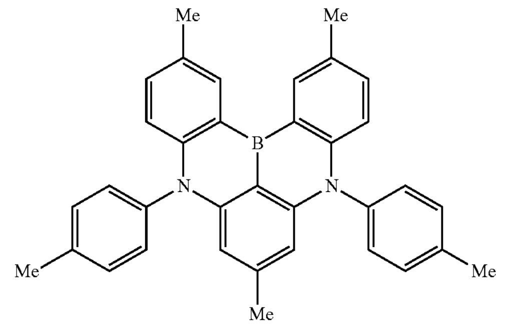
(BN2-0210/0611S/0911S)
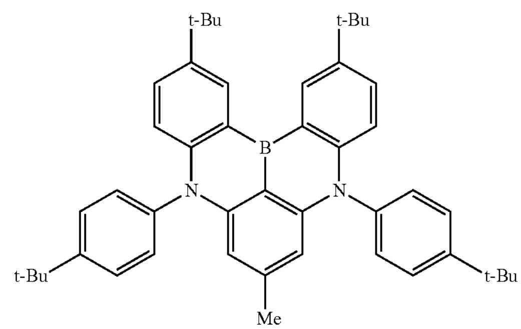
(BN2-0211/0611S/0911S)
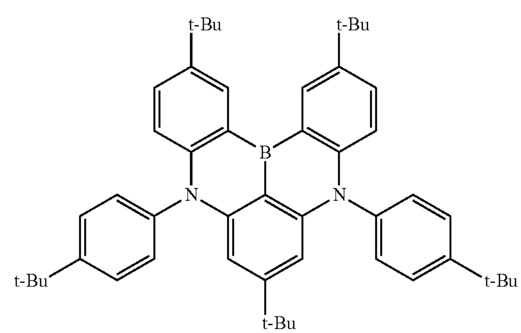
(BN2-0230)
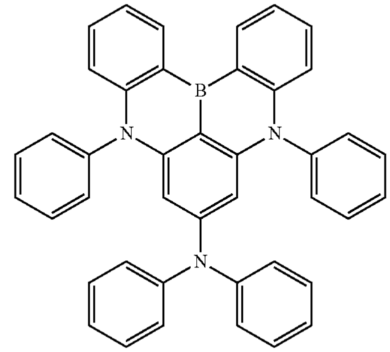

-continued
(BN2-0230/0610S/0910S)
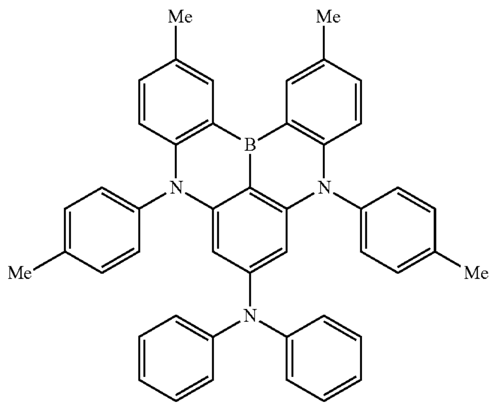
(BN2-0230/0611S/0911S)
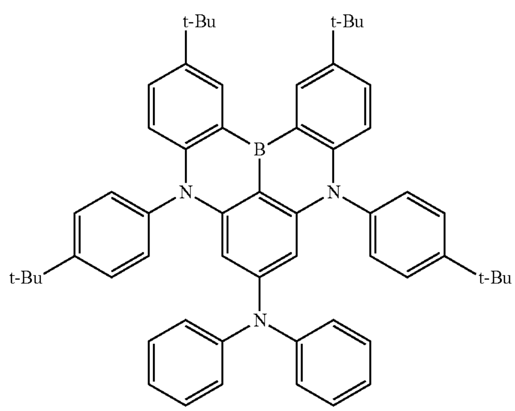
(BN2-0230/0610S/0910S-1)
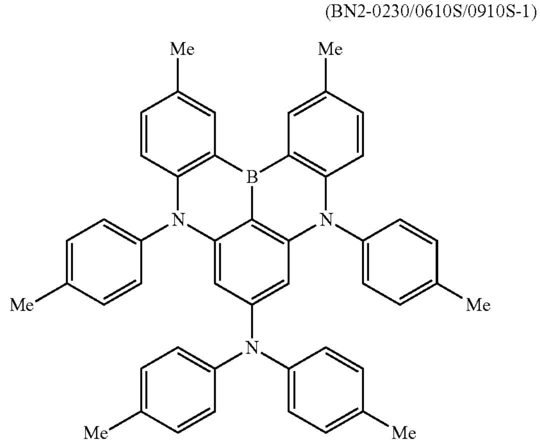
-continued
(BN2-0230/0611S/0911S-1)
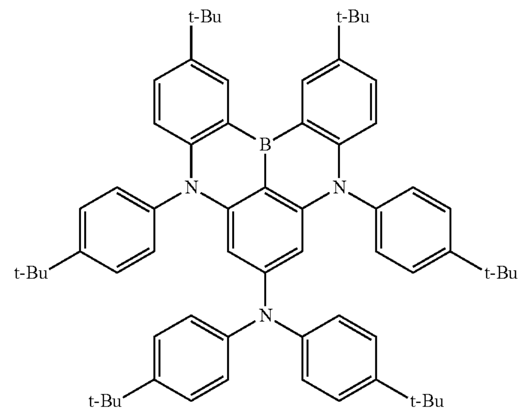
(BN2-0231)
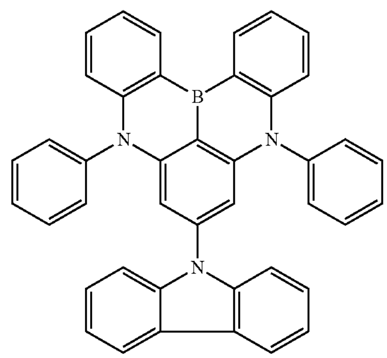
(BN2-0231/0610S/0910S)
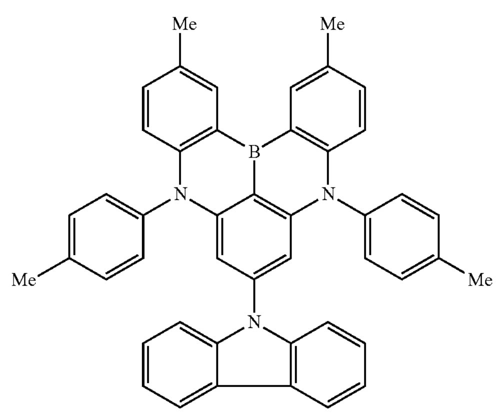
(BN2-0231/0611S/0911S)
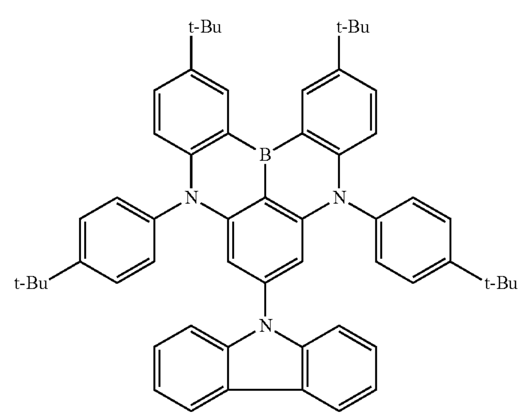

-continued
(BN2-0231/0610S/0910S-1)
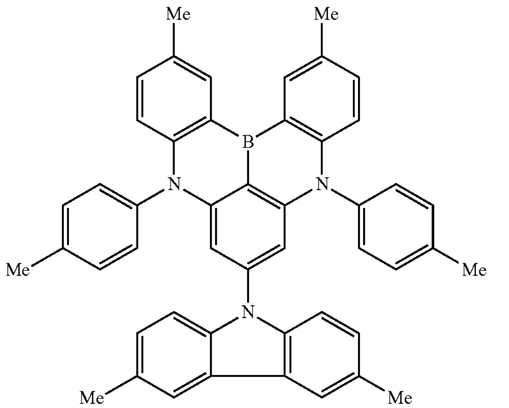
(BN2-0231/0611S/0911S-1)
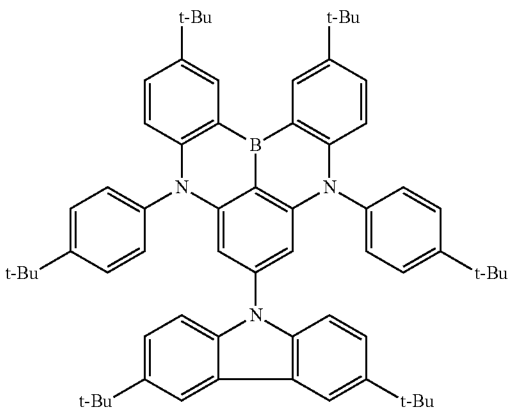
(1-1201)
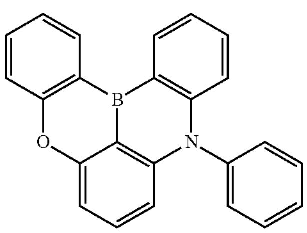
(1-1202)
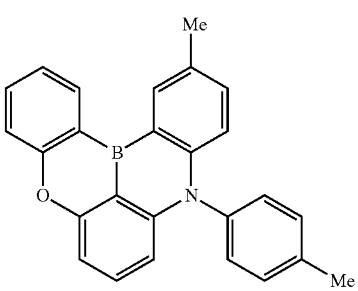
-continued
(1-1203)
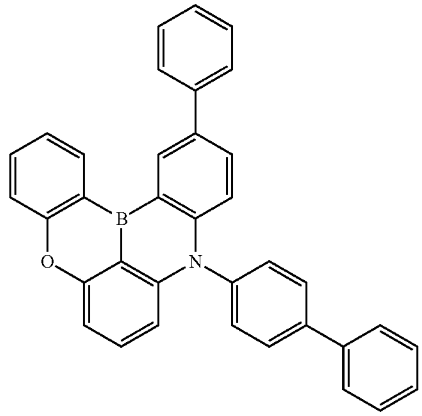
(1-1204)
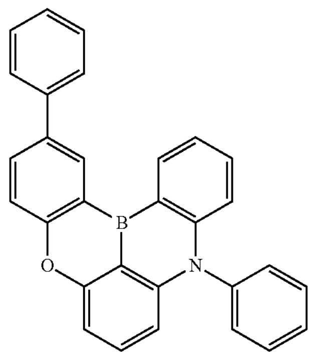
(1-1205)
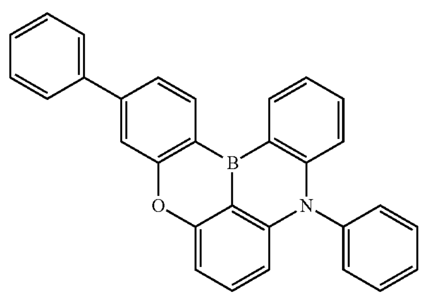
(1-1206)
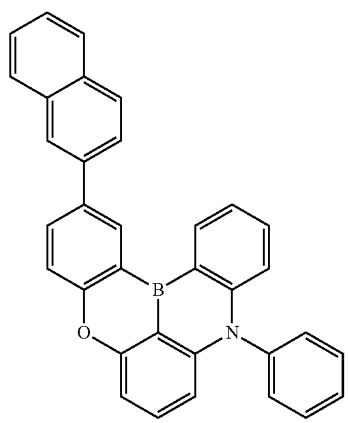

(1-1207)
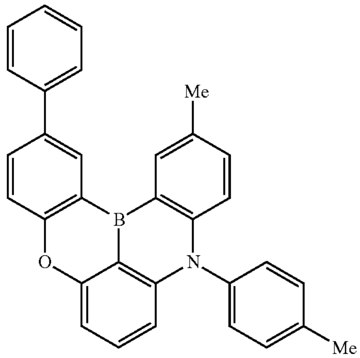
(1-1208)
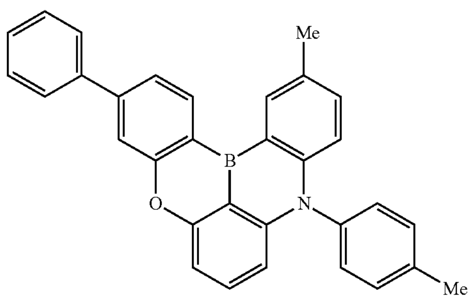
(1-1209)
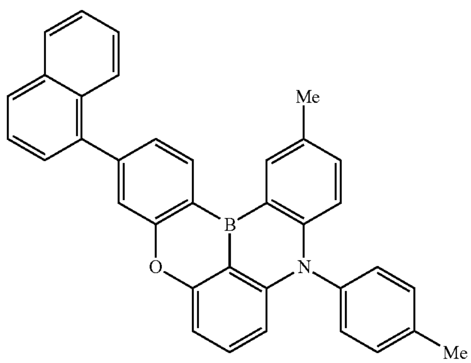
(1-1210)
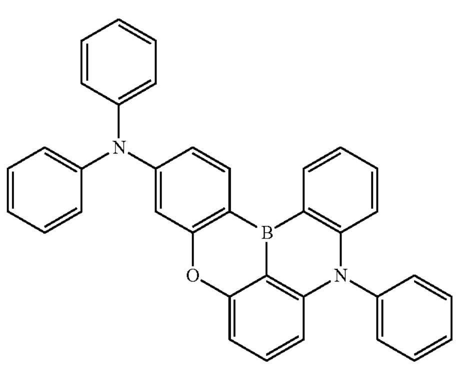
(1-1211)
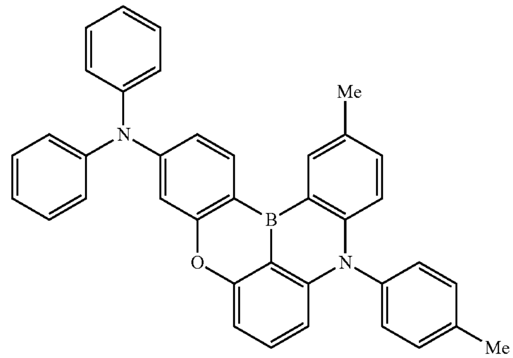
(1-3831)
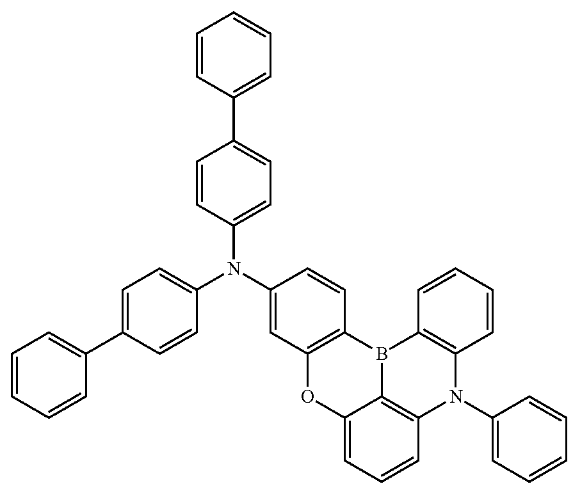
(1-3832)
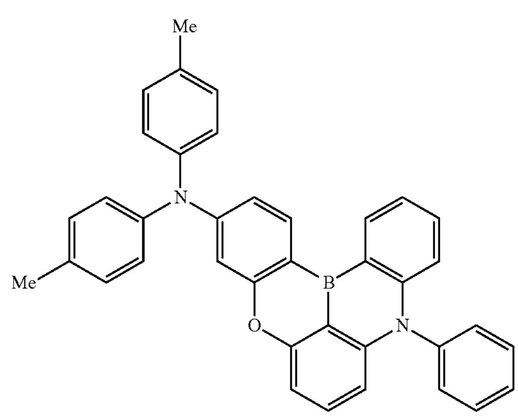

(1-3834)
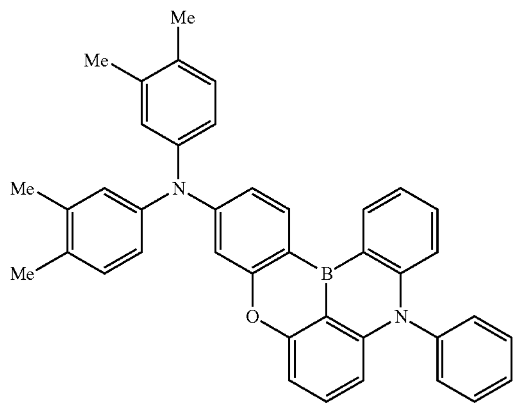
(1-3831)
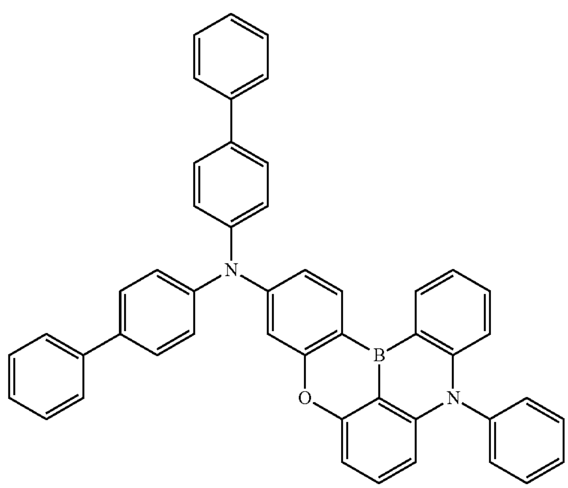
(1-3832)
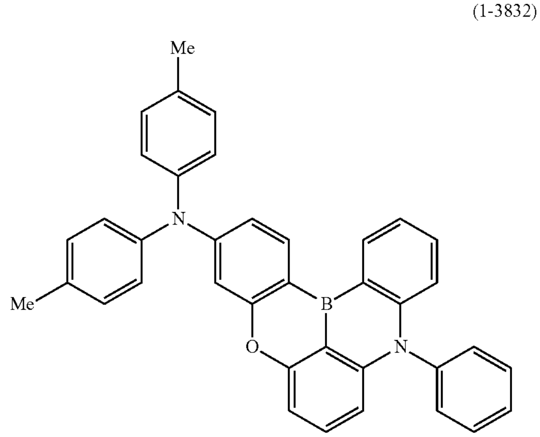
(1-3834)
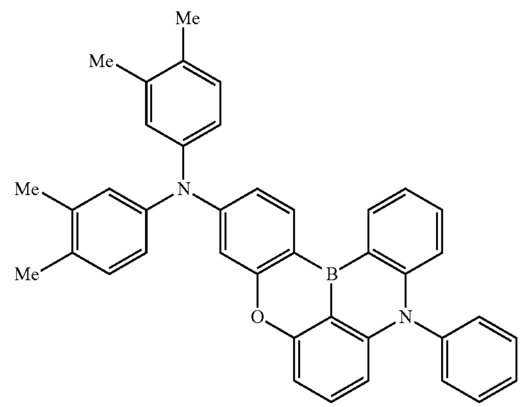
(1-3961)
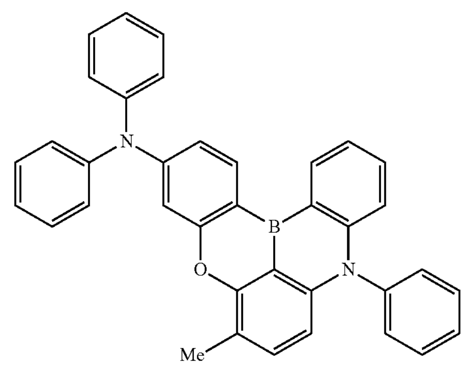
(1-3962)
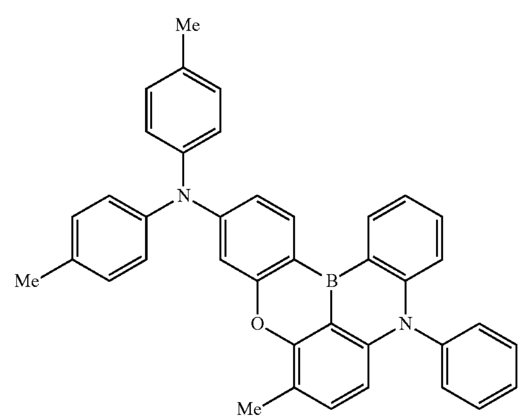

-continued
(1-3964)
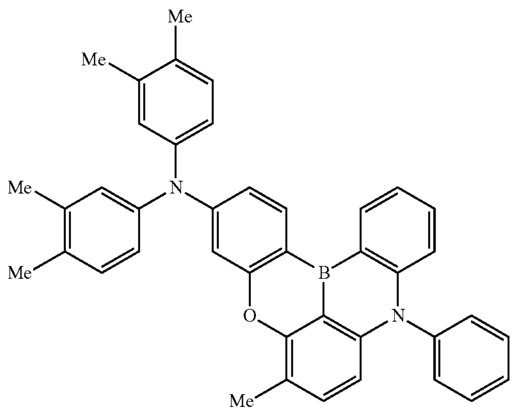
(1-3971)
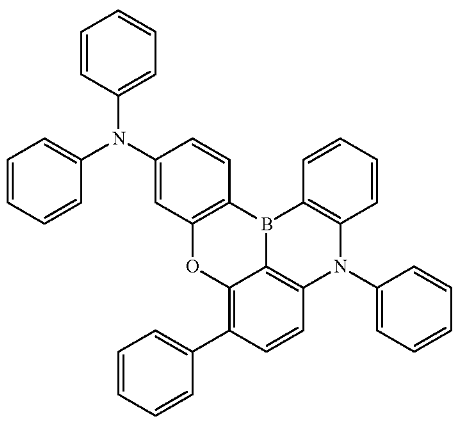
(1-3972)
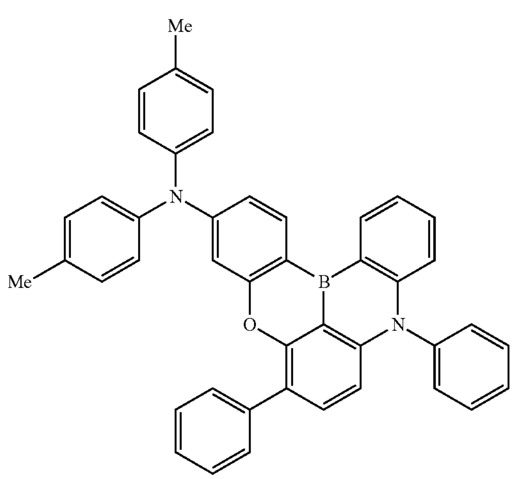
-continued
(1-3973)
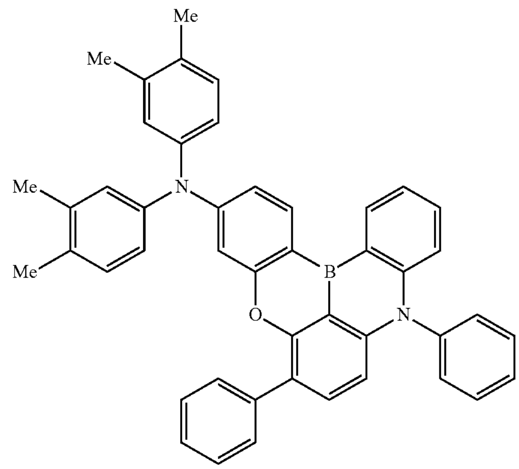
(1-3981)
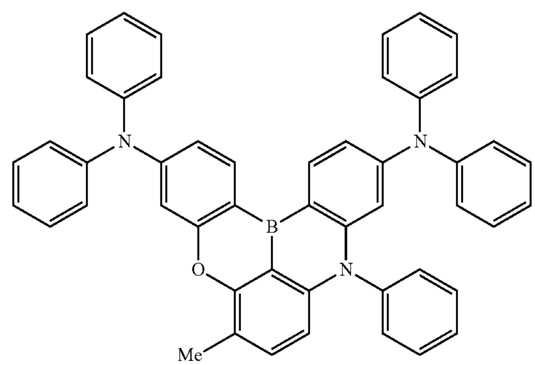
(1-3982)
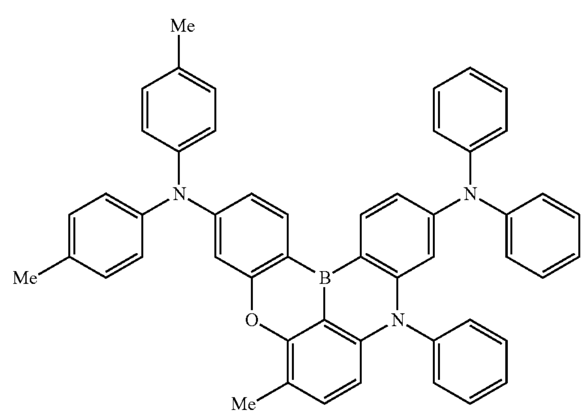

-continued
(1-3984)
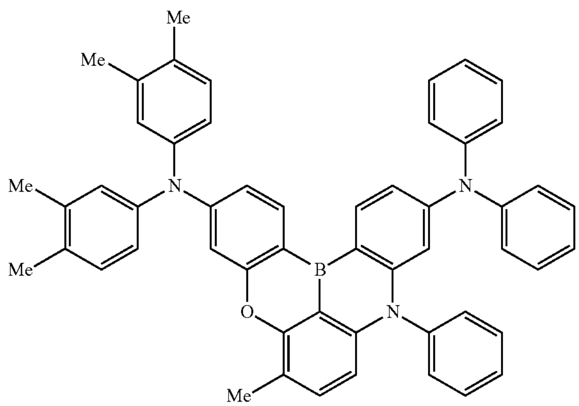
(1-3991)
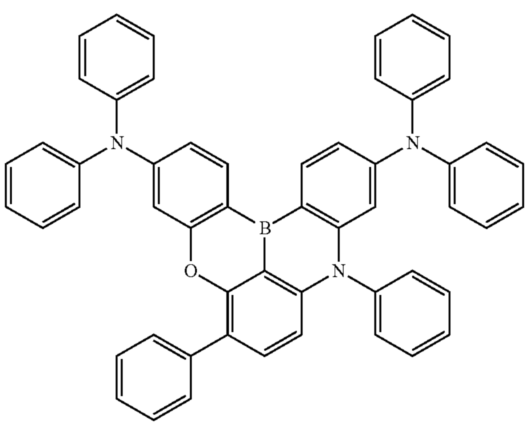
(1-3992)
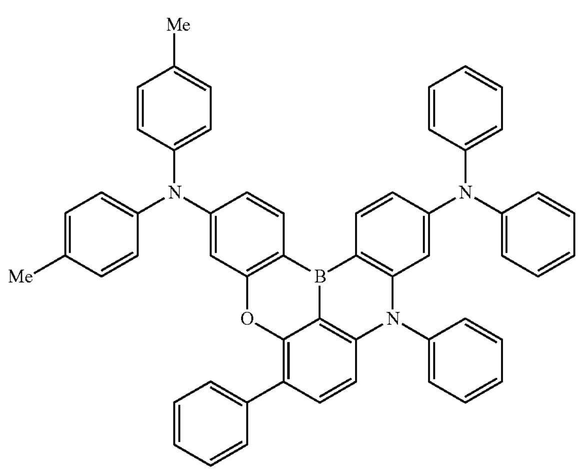
-continued
(1-3993)
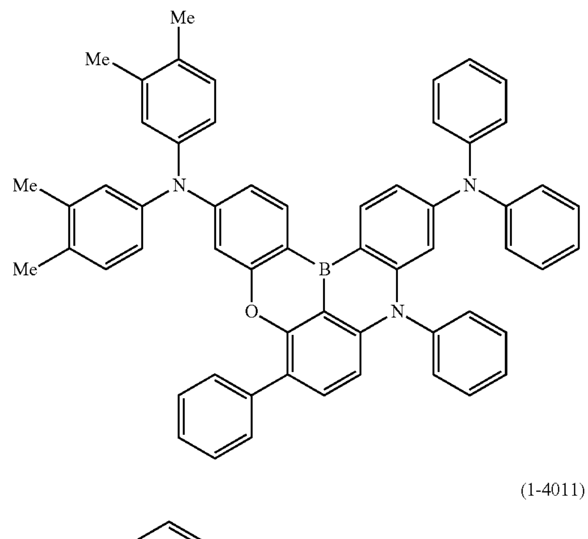
(1-4011)
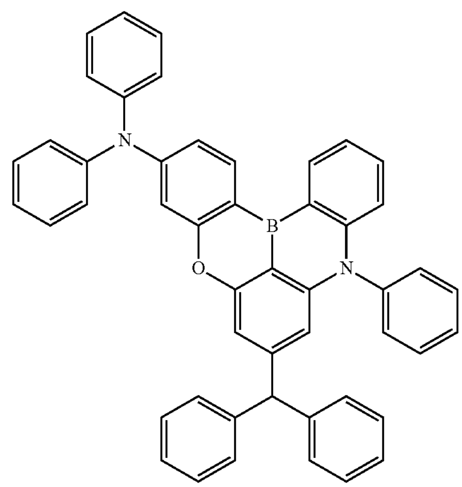
(1-4014)
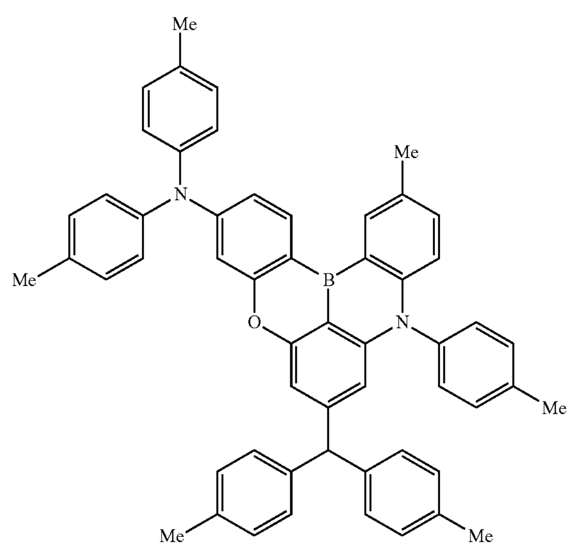

-continued
(1-4022)
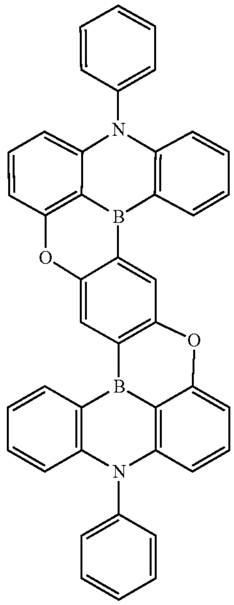
(1-4023)
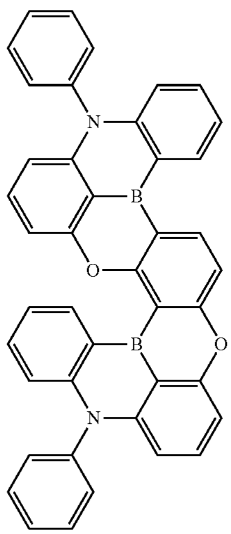
(1-4024)
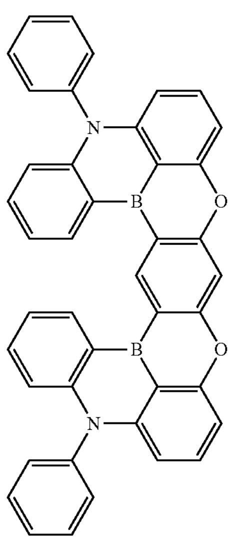
-continued
(1-4025)
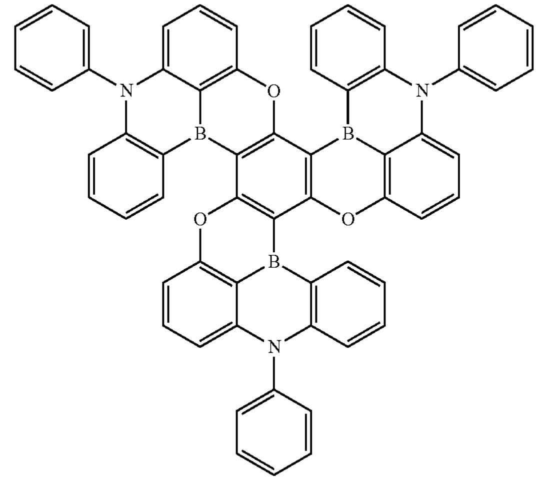
(1-4028)
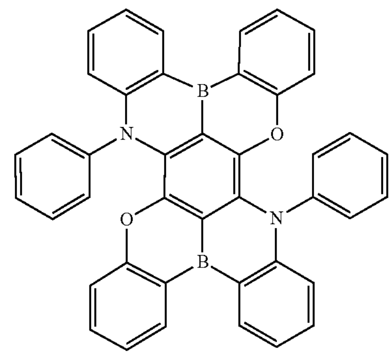
(1-4029)
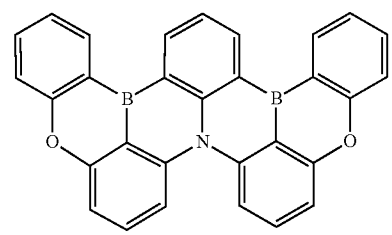
(1A-1)
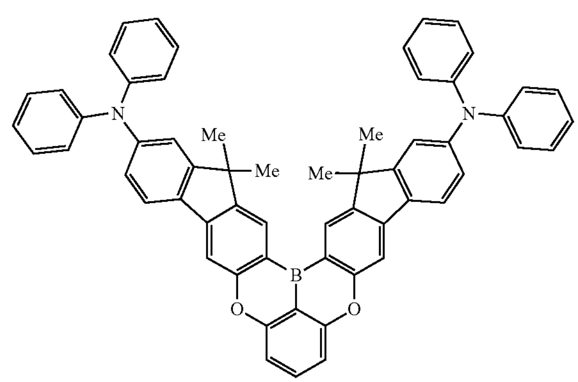

-continued
(1A-19)
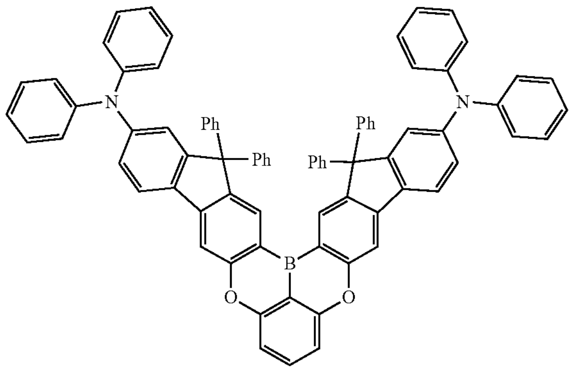
(1A-25)
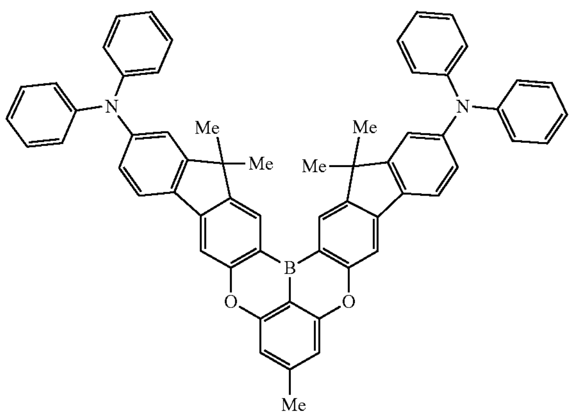
(1A-26)
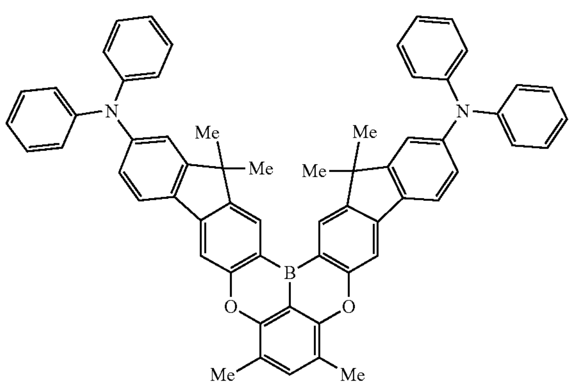
-continued
(1A-27)
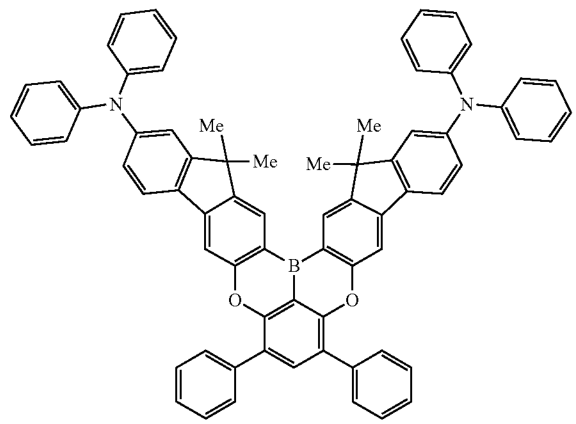
(1A-28)
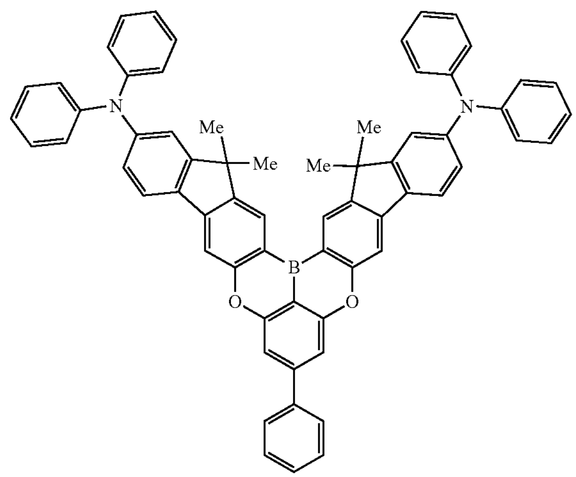
(1B-1)
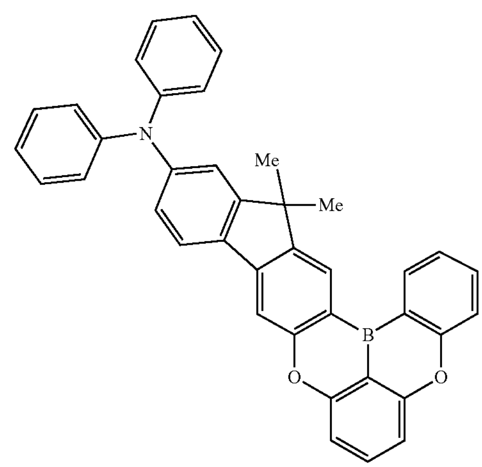

-continued
(1B-3)
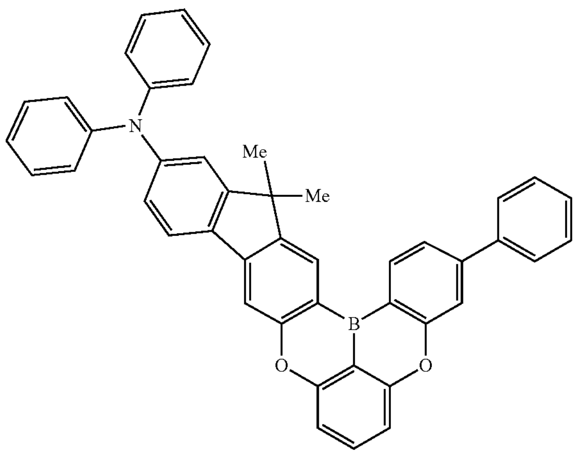
(1B-5)
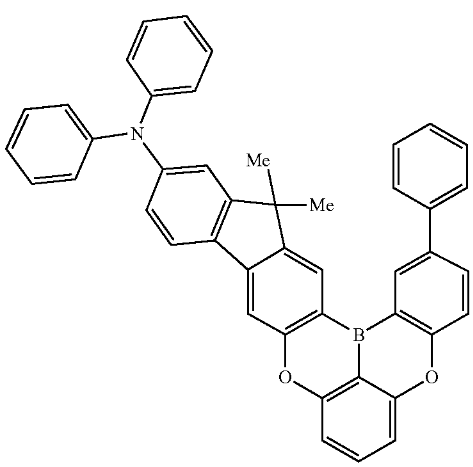
(1B-6)
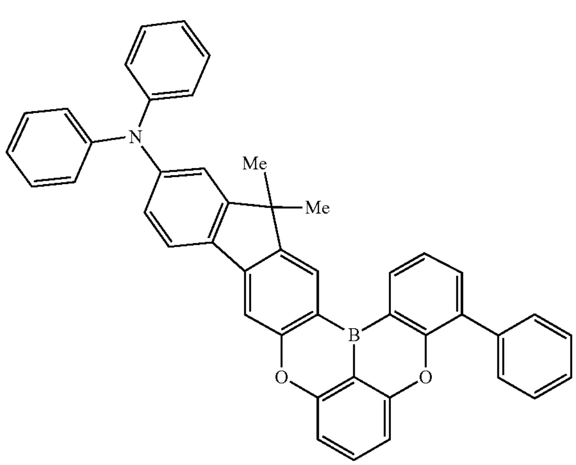
-continued
(1B-7)
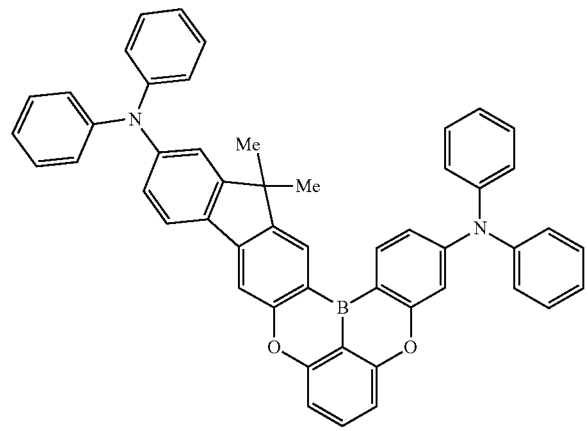
(1B-8)
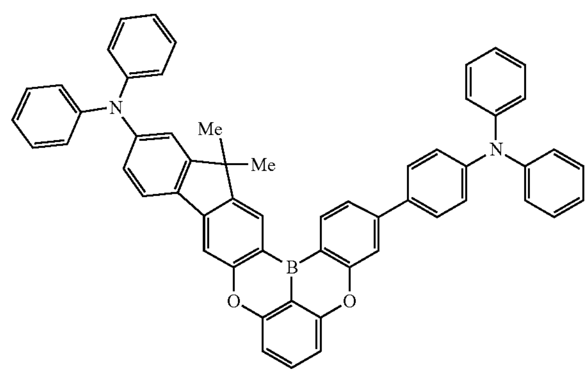
(1B-9)
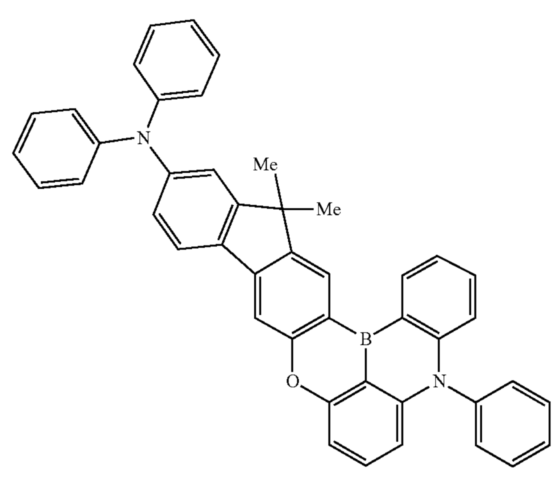

-continued
(1B-10)
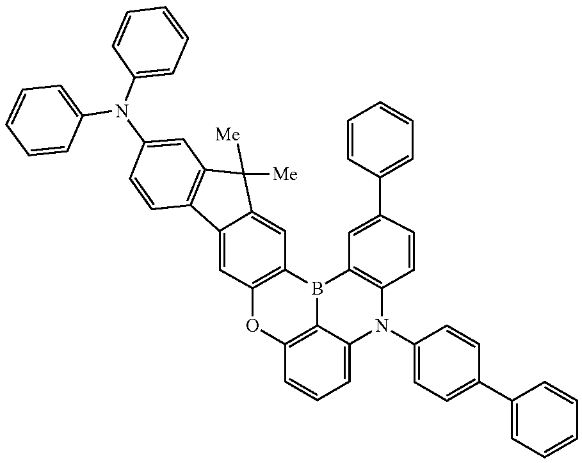
(1B-11)
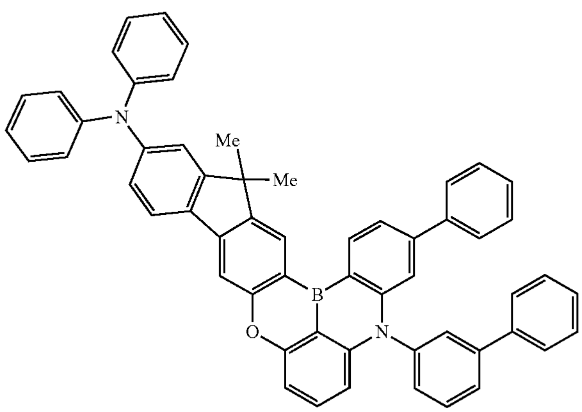
(1B-13)
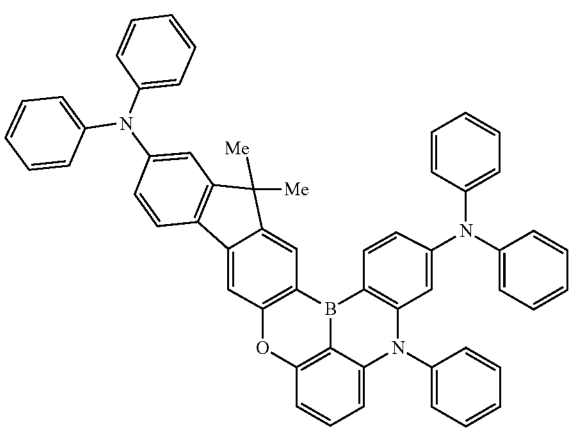
-continued
(1B-14)
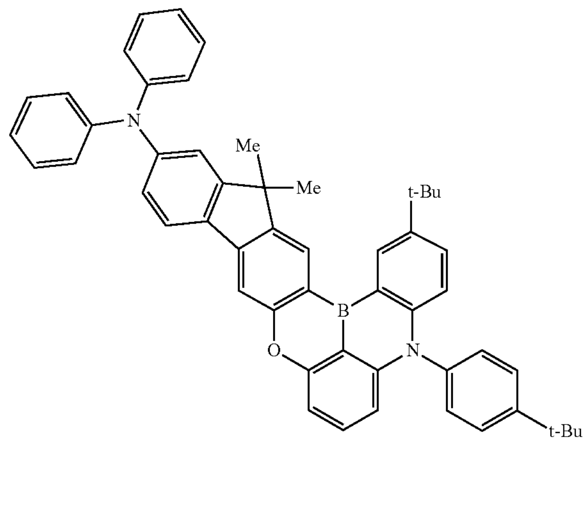
(1B-15)
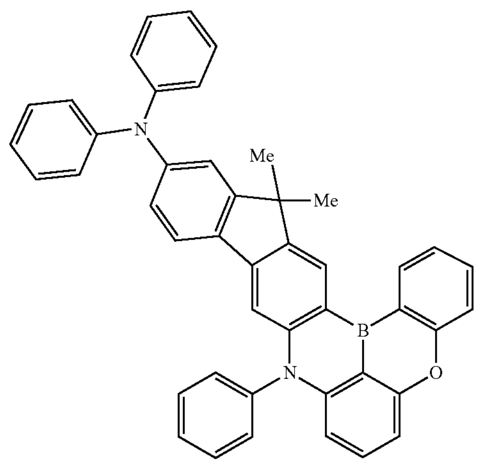
(1B-16)
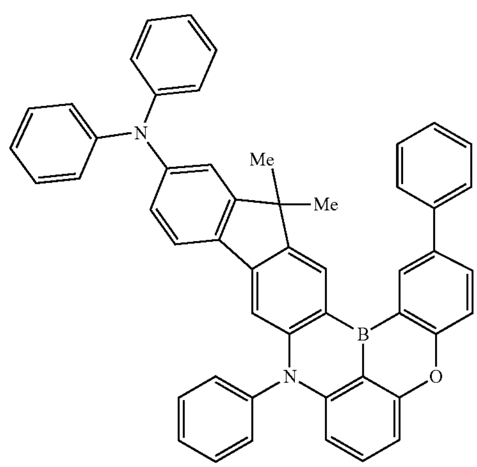

-continued
(1B-17)
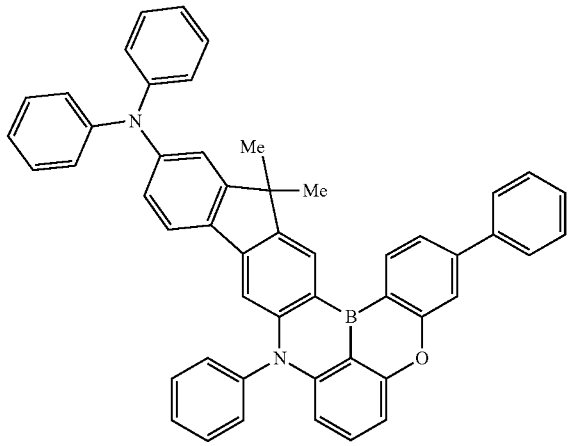
-continued
(1B-19)
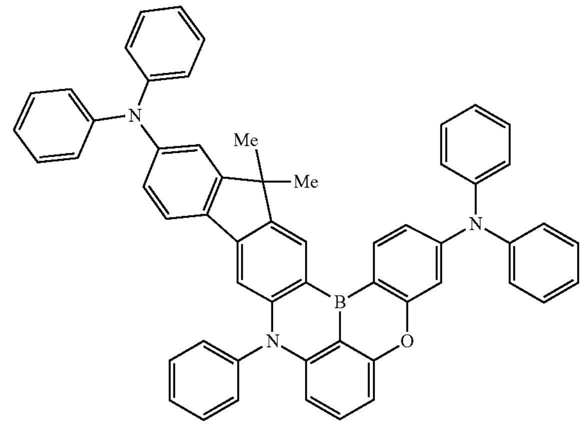
(1-1A)
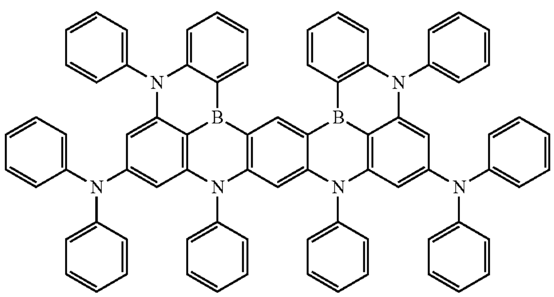
(1-1A-Cz1)
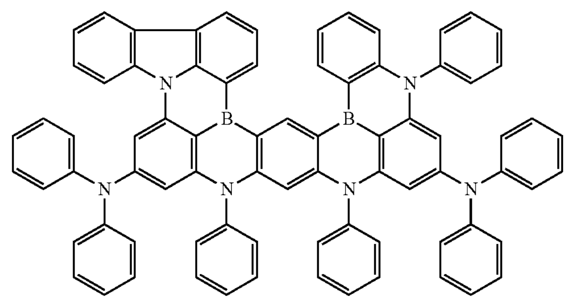
(1-1A-Cz2)
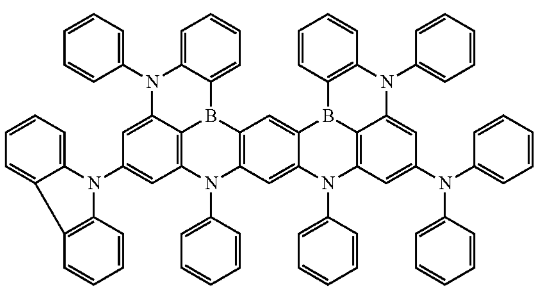
(1-1A-Cz3)
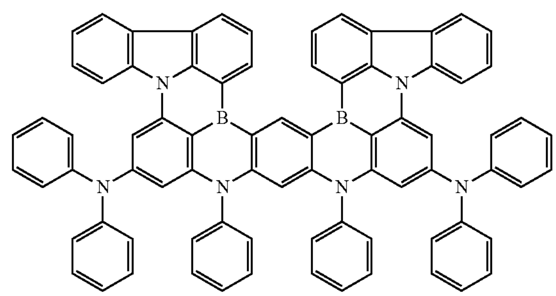
(1-1A-Cz4)
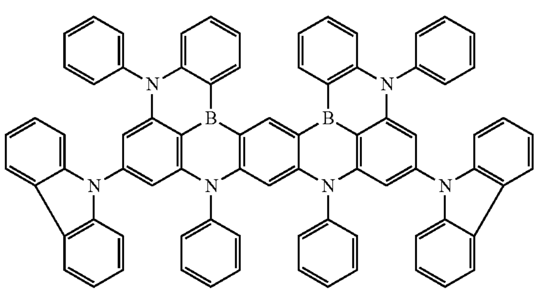
(1-1A-Cz5)
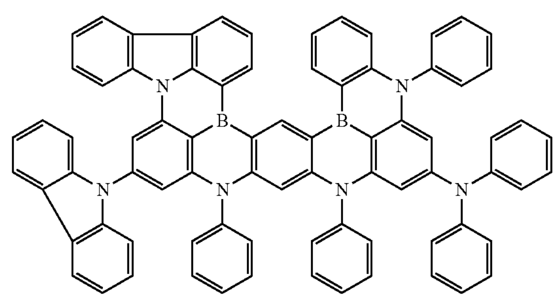

-continued
(1-1A-Cz6)
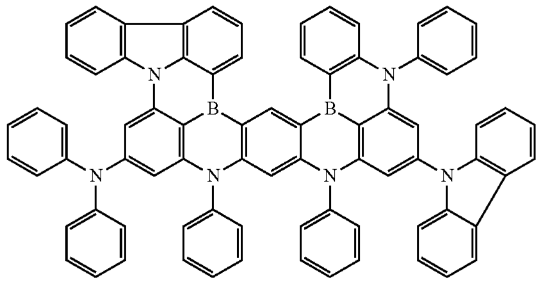
(1-1A-Cz7)
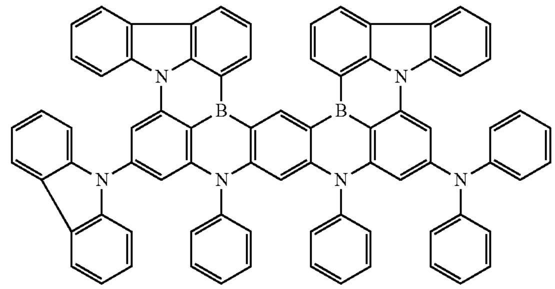
(1-1A-Cz8)
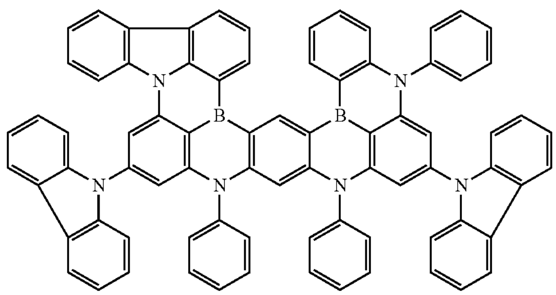
(1-1A-Cz9)
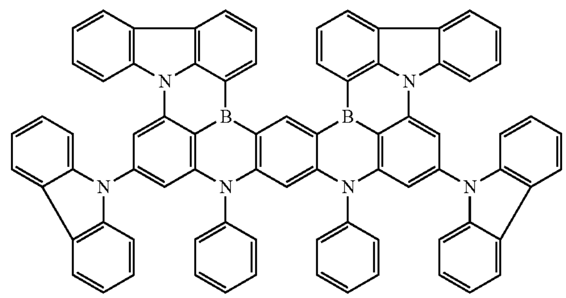
(1-201A)
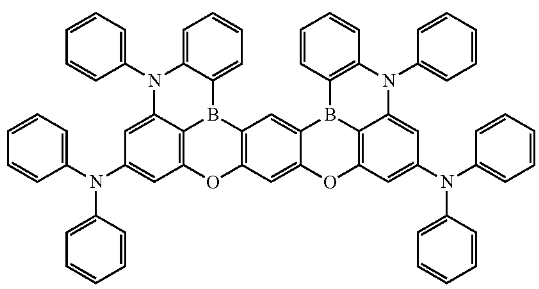
(1-201A-Cz1)
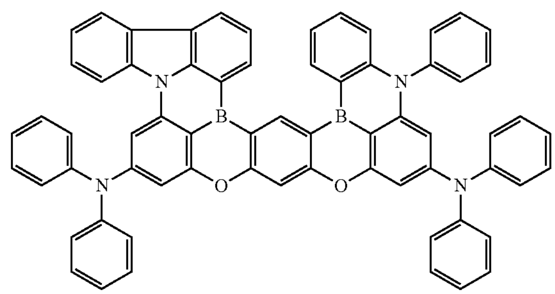
(1-201A-Cz2)
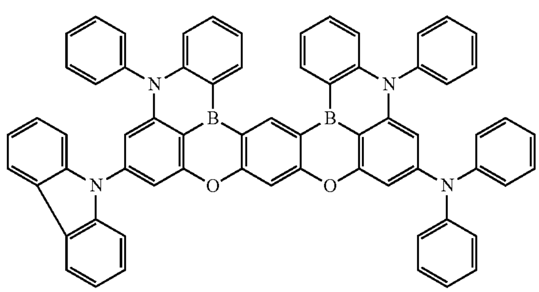
(1-201A-Cz3)
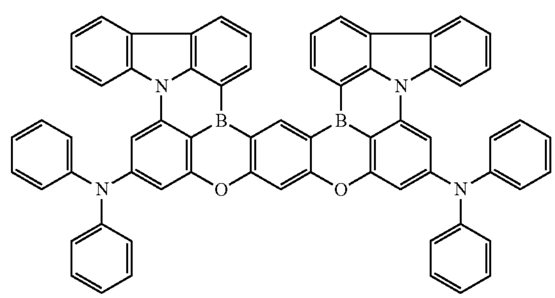
(1-201A-Cz4)
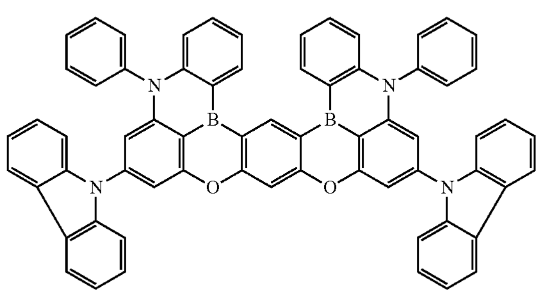
(1-201A-Cz5)
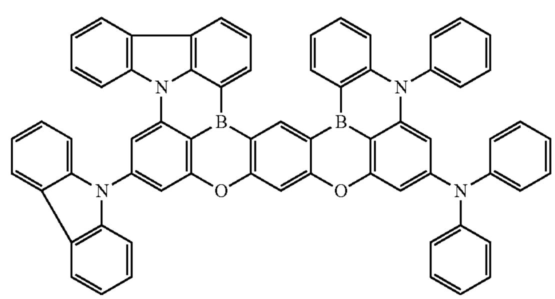

-continued
(1-201A-Cz6)
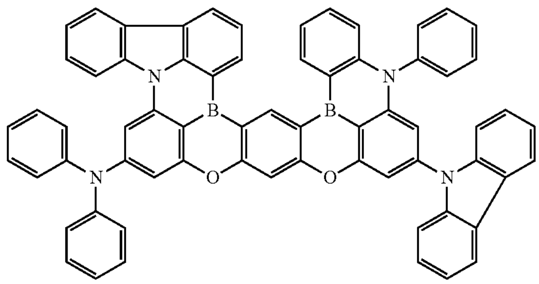
(1-201A-Cz7)
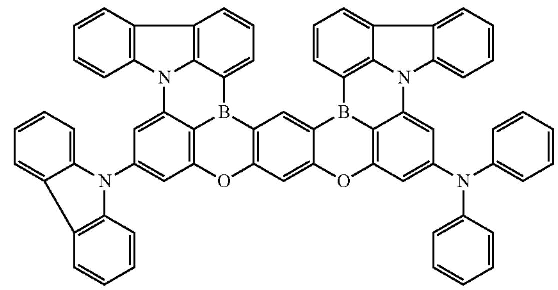
(1-201A-Cz8)
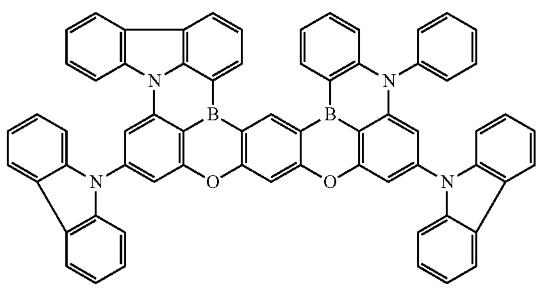
(1-201A-Cz9)
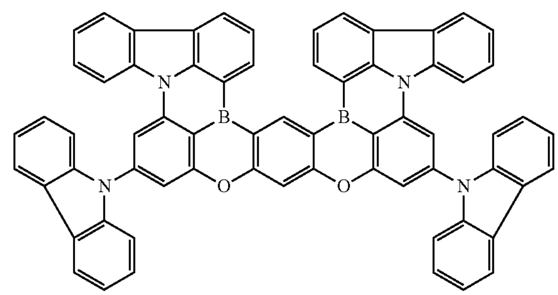
(1-601A)
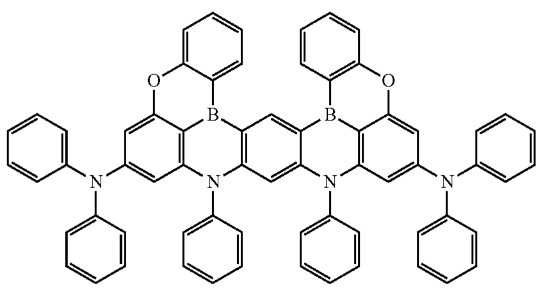
(1-601A-Cz1)
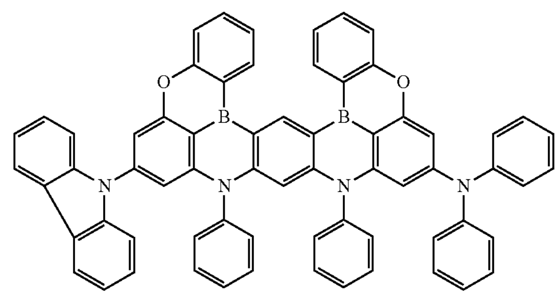
(1-601A-Cz2)
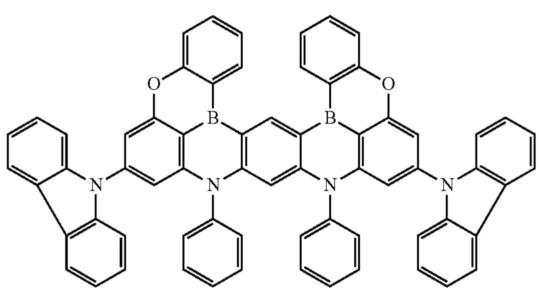
(1-2001A)
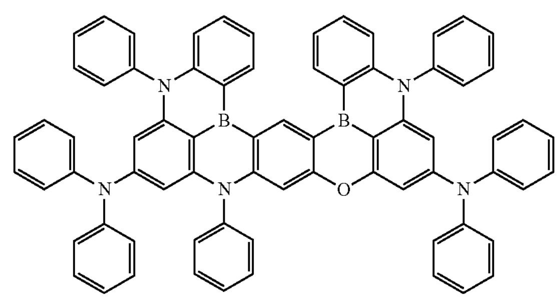
(1-2001A-Cz1)
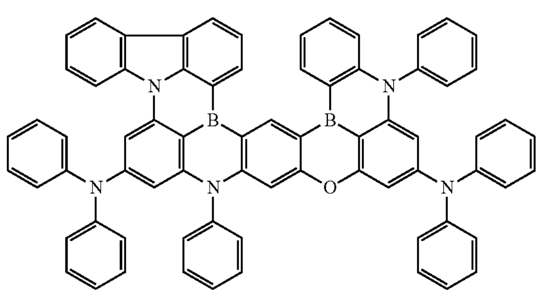
(1-2001A-Cz2)
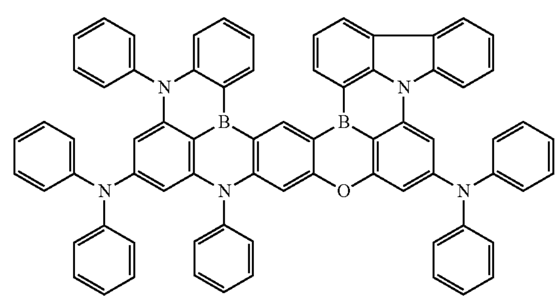

-continued
(1-2001A-Cz3)
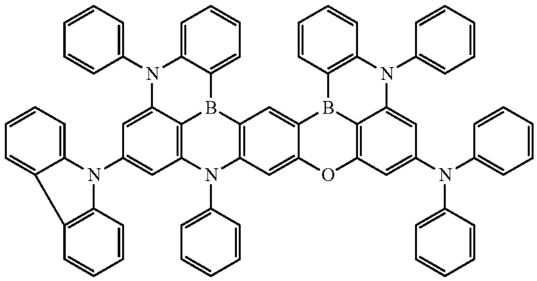
(1-2001A-Cz4)
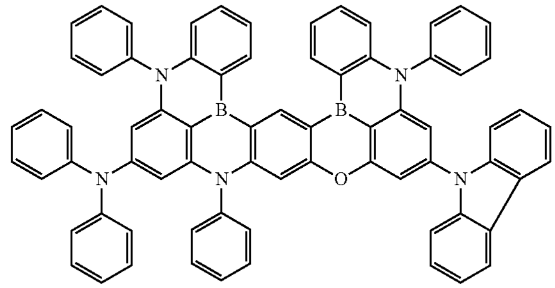
(1-2001A-Cz5)
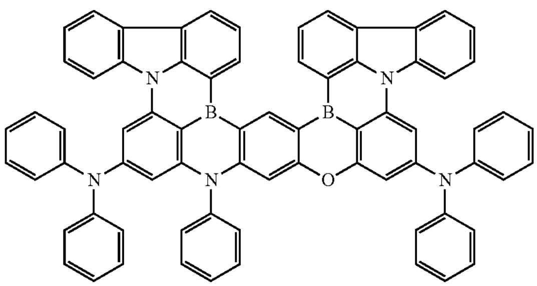
(1-2001A-Cz6)
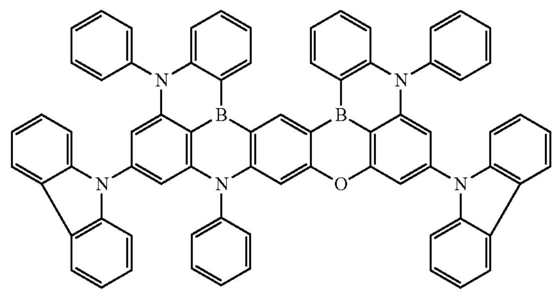
(1-2001A-Cz7)
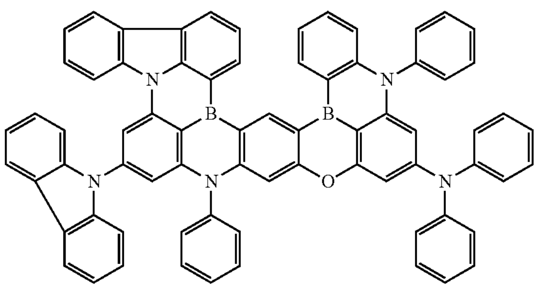
(1-2001A-Cz8)
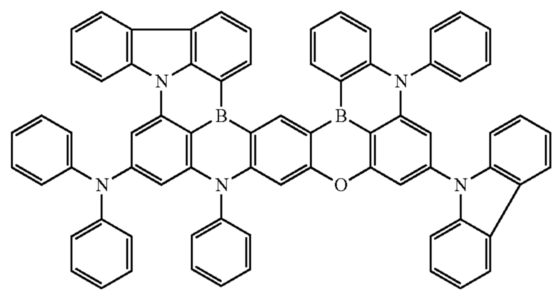
(1-2001A-Cz9)
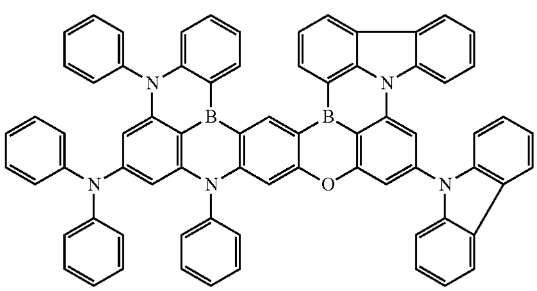
(1-2001A-Cz10)
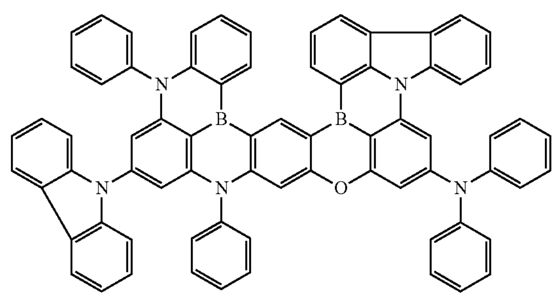
(1-2001A-Cz11)
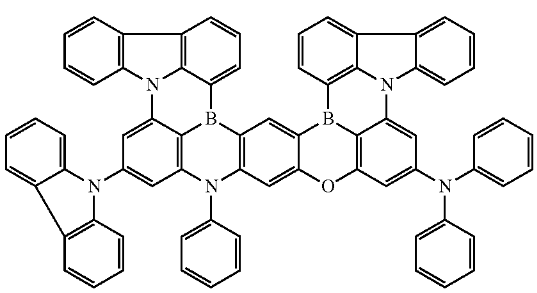
(1-2001A-Cz12)
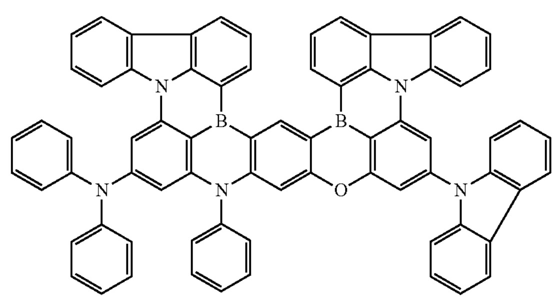

-continued
(1-2001A-Cz13)
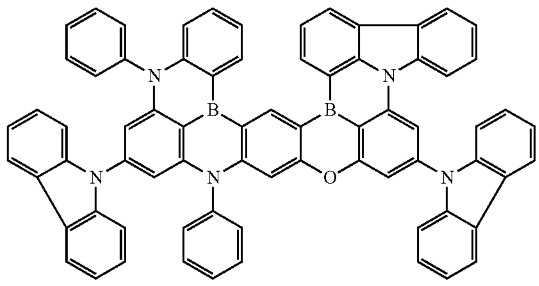
(1-2001A-Cz14)
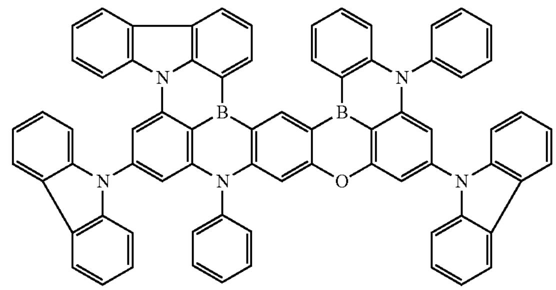
(1-2001A-Cz15)
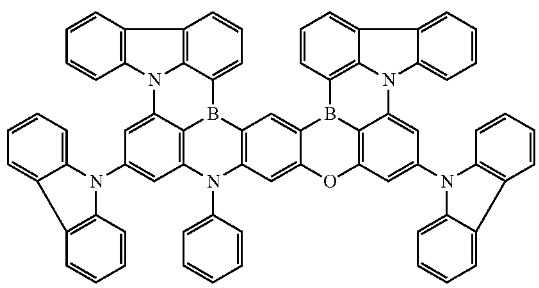
(1-2201A)
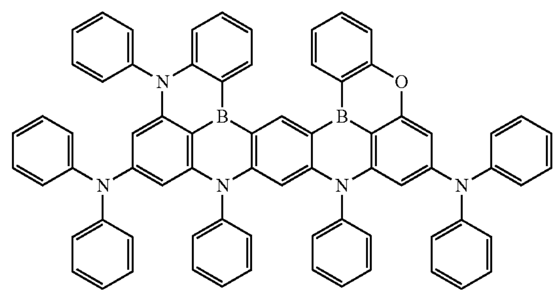
(1-2201A-Cz1)
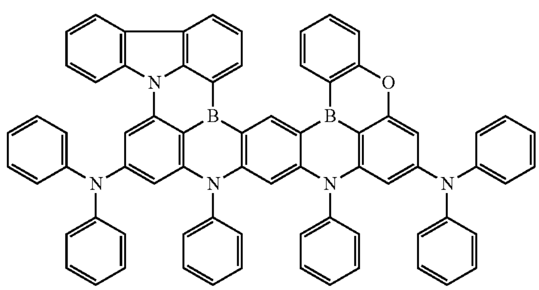
(1-2201A-Cz2)
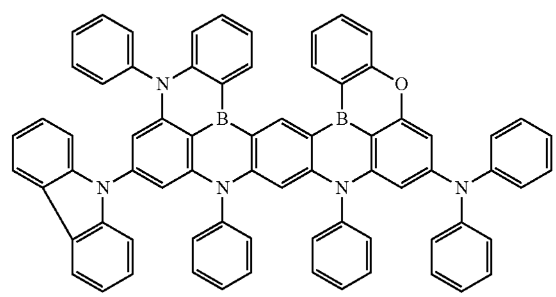
(1-2201A-Cz3)
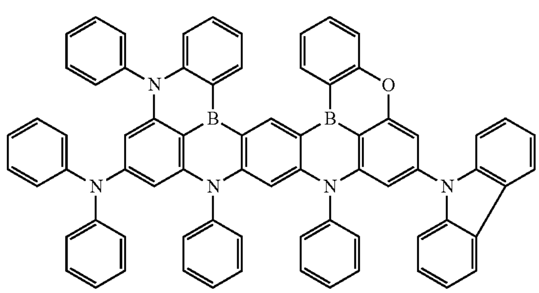
(1-2201A-Cz4)
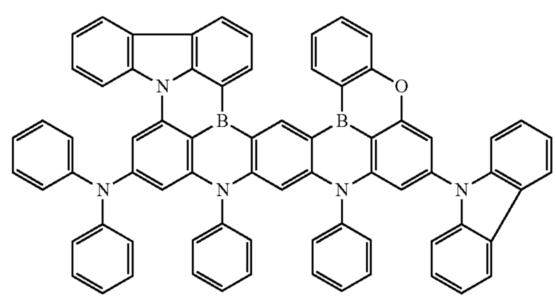
(1-2201A-Cz5)
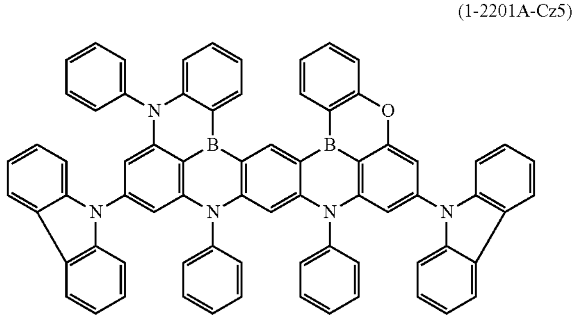
(1-2201A-Cz6)
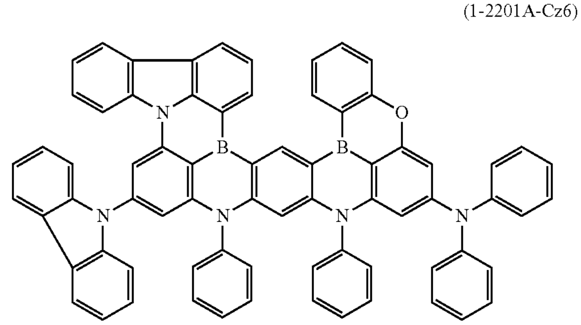

-continued
(1-2201A-Cz7)
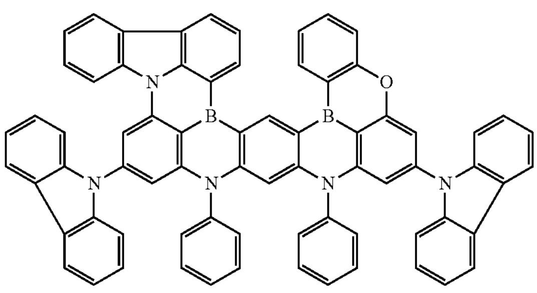
(1-2401A)
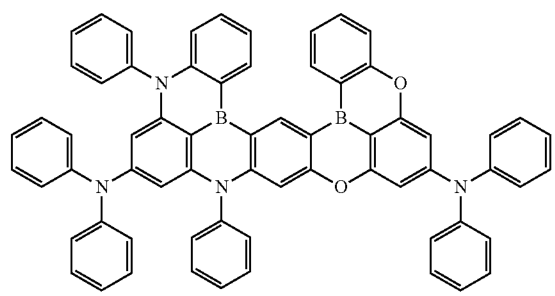
(1-2401A-Cz1)
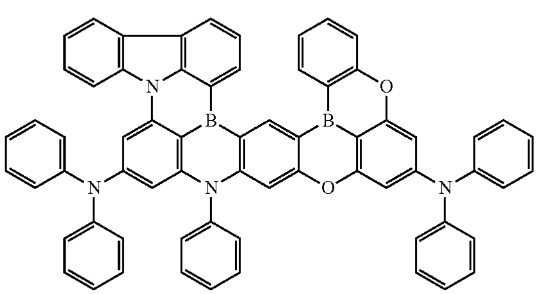
(1-2401A-Cz2)
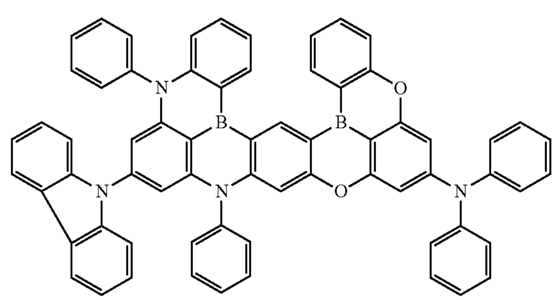
(1-2401A-Cz3)
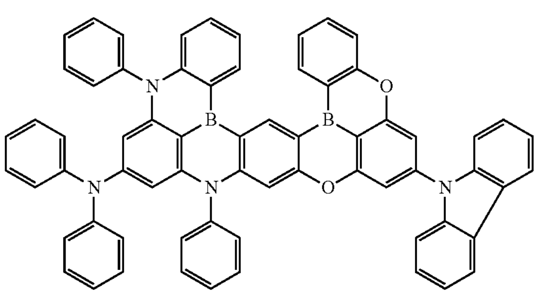
(1-2401A-Cz4)
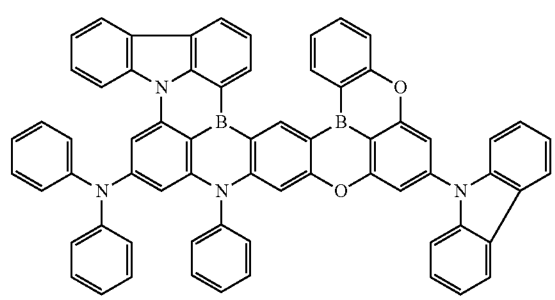
(1-2401A-Cz5)
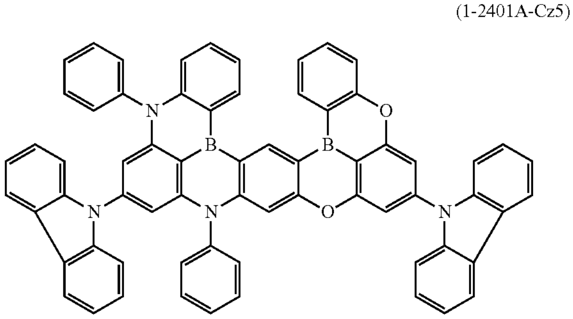
(1-2401A-Cz6)
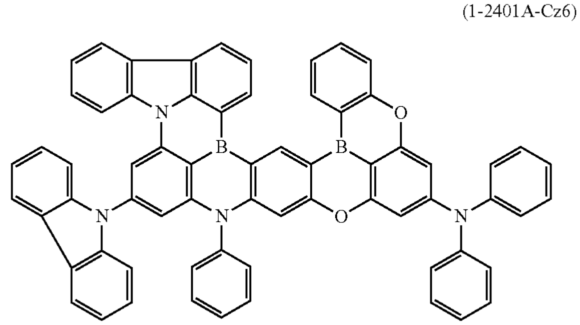
(1-2401A-Cz7)
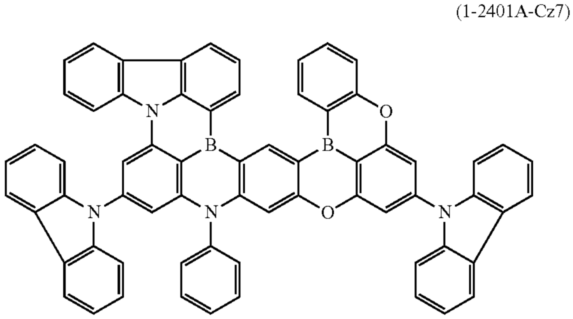
(1-4051R)
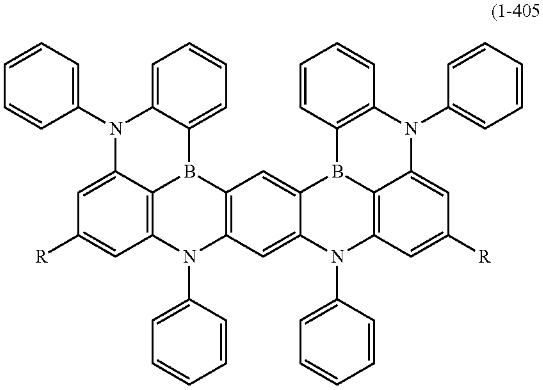

-continued
(1-4061R)
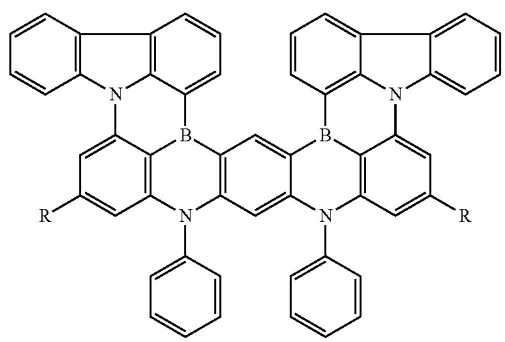
(1-4151-R)
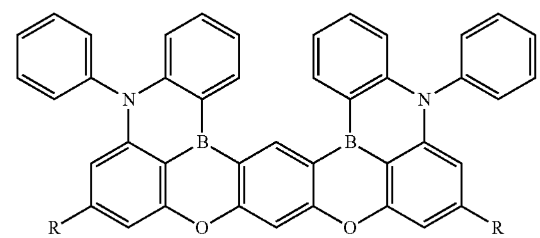
(1-4251-R)
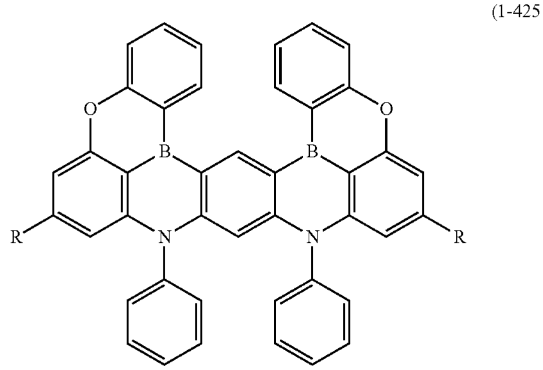
(1-4351-R)
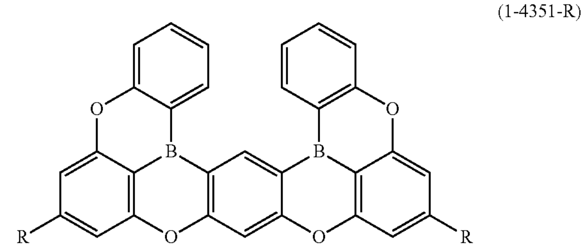
(1-4451R)
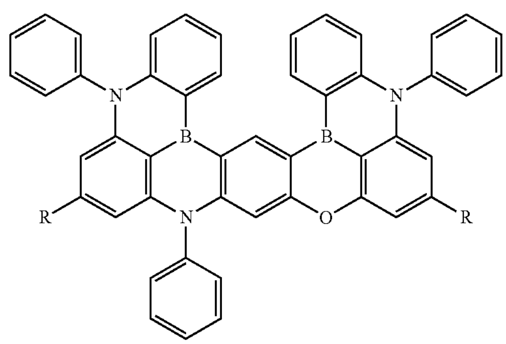
(1-1)
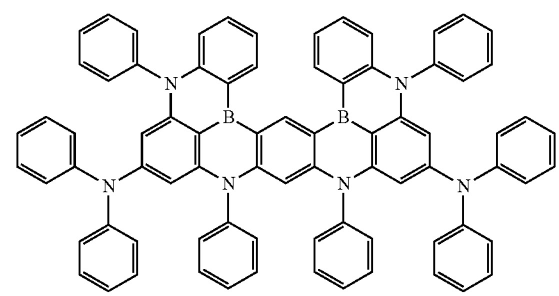
(1-2)
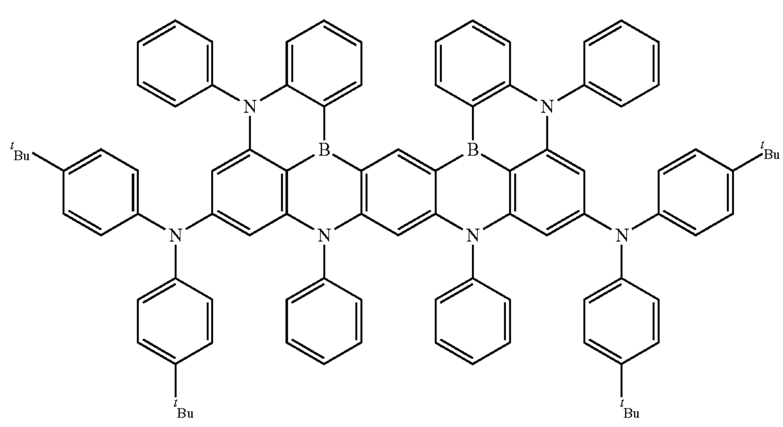

-continued
(1-3)
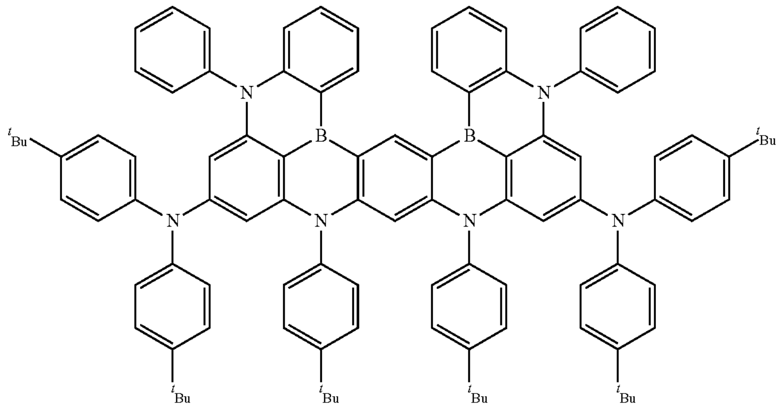
(1-4)
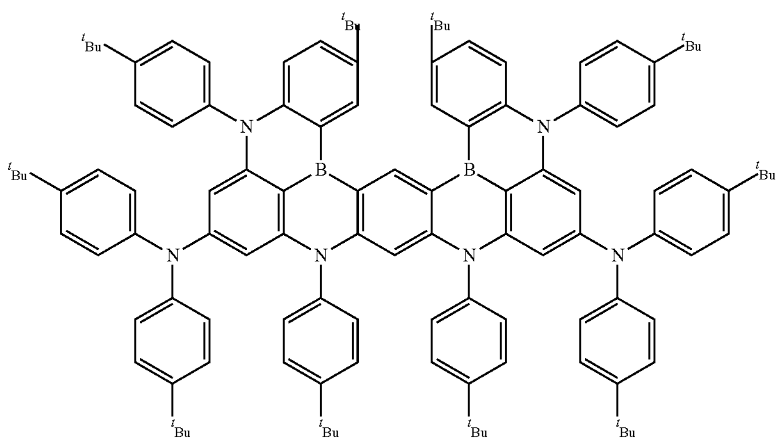
(1-9)
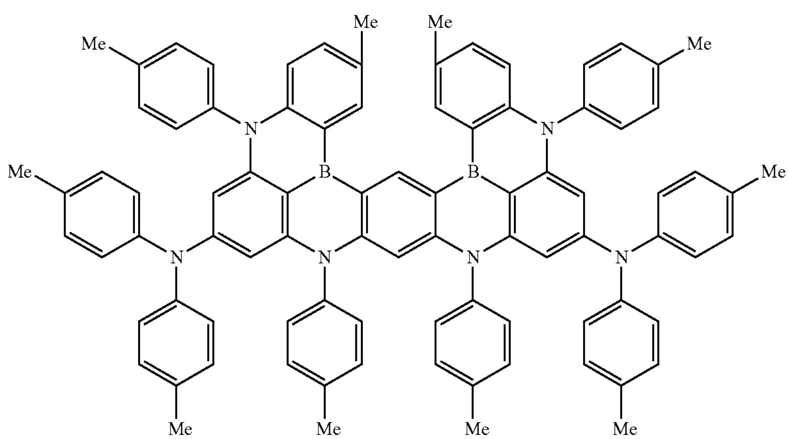
(1-11)
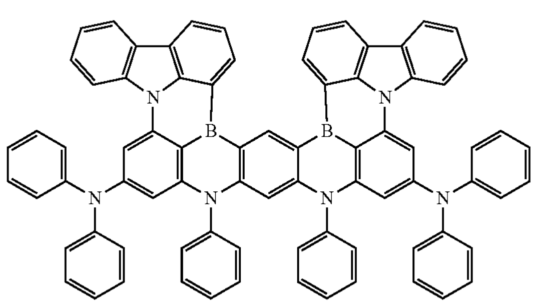
(1-12)
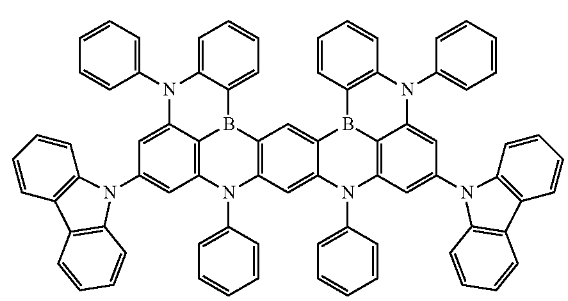

-continued
(1-15)
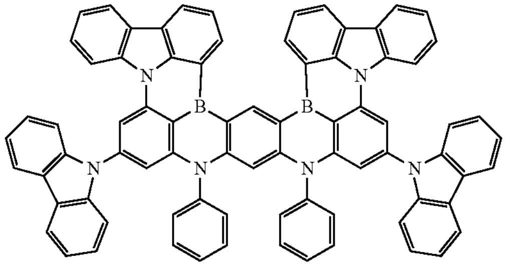
(1-18)
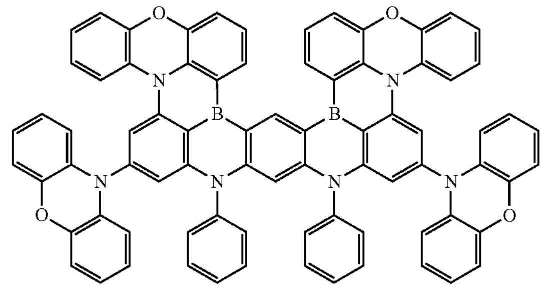
(1-31)
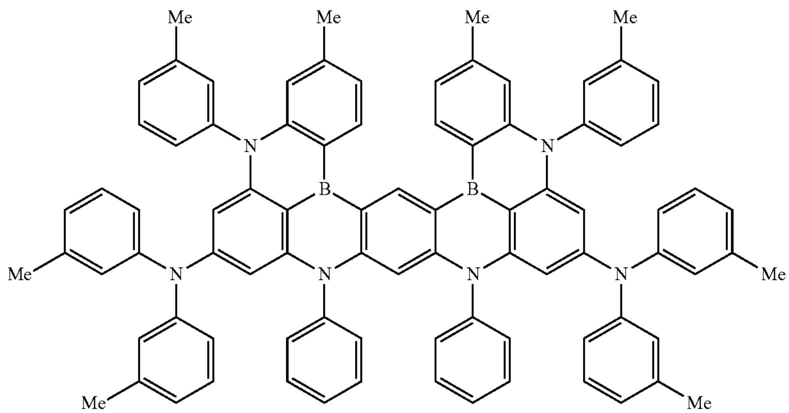
(1-32)
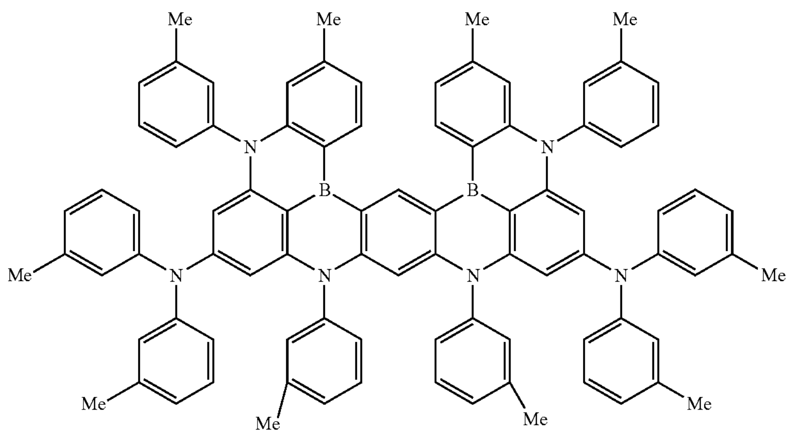
(1-33)
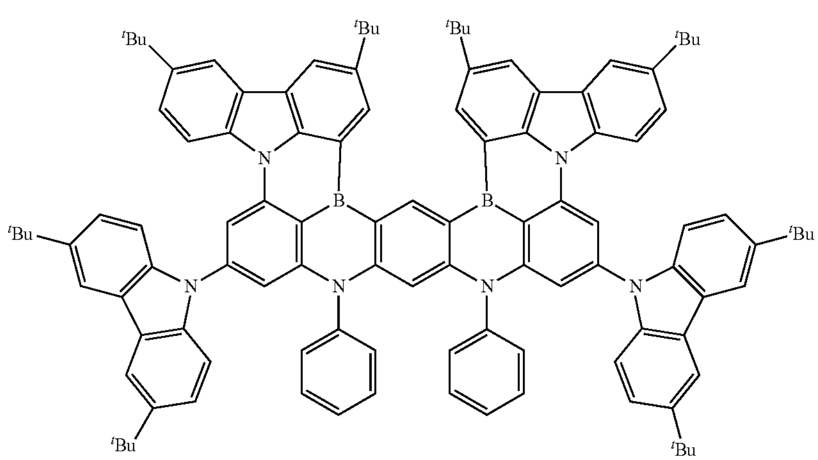

-continued
(1-34)
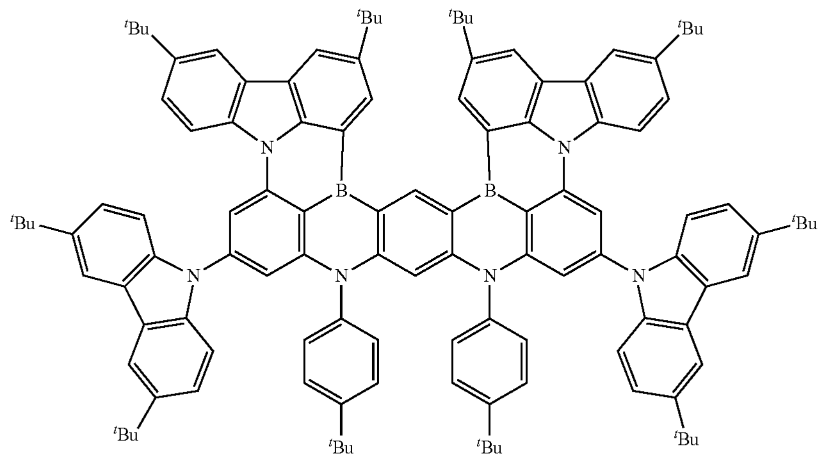
(1-35)
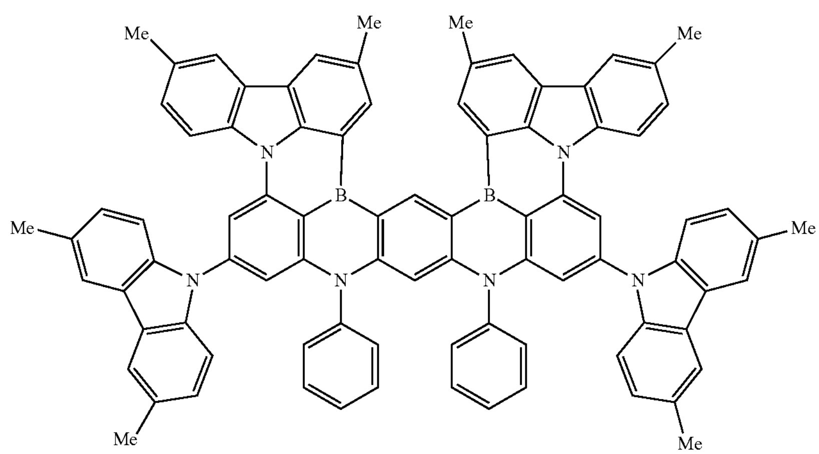
(1-36)
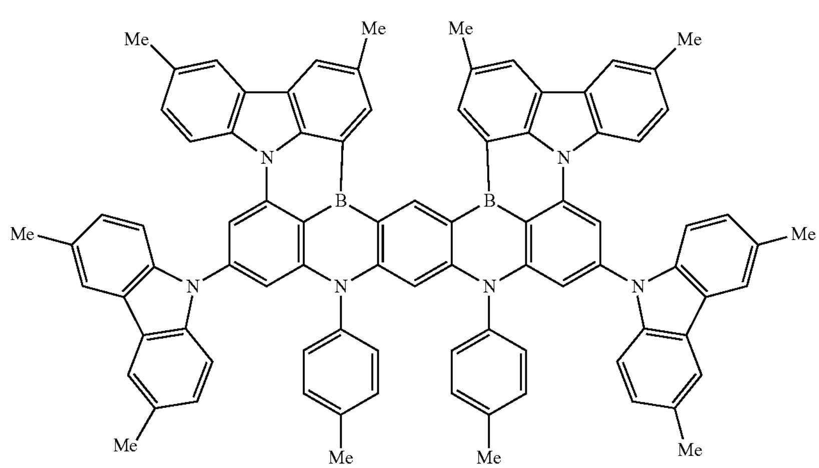

-continued
(1-101)
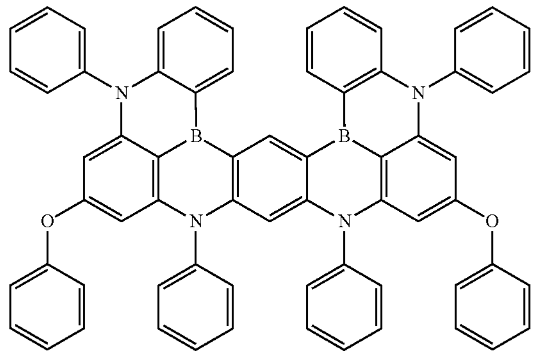
(1-102)
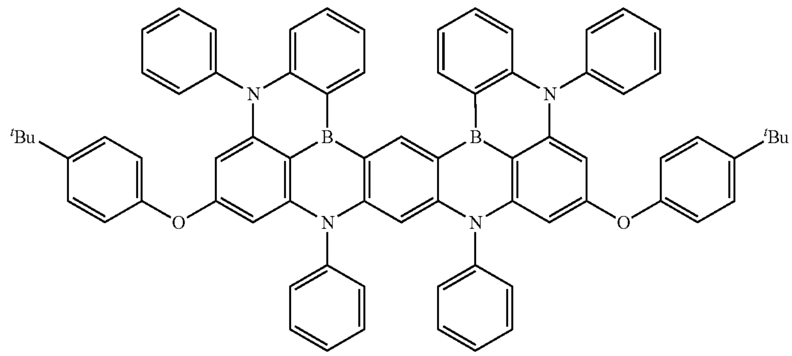
(1-103)
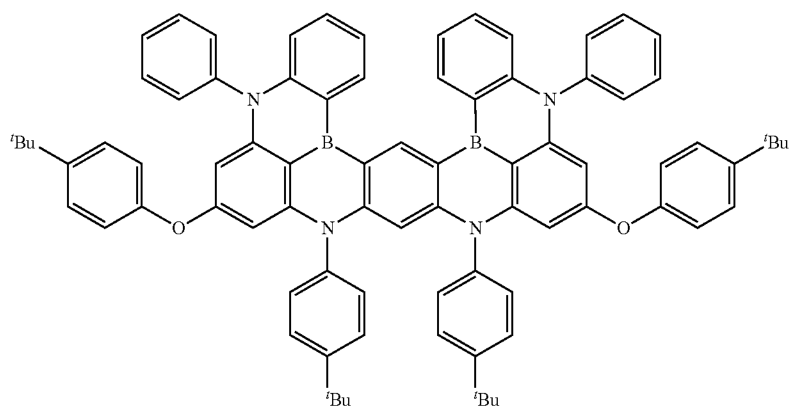
(1-111)
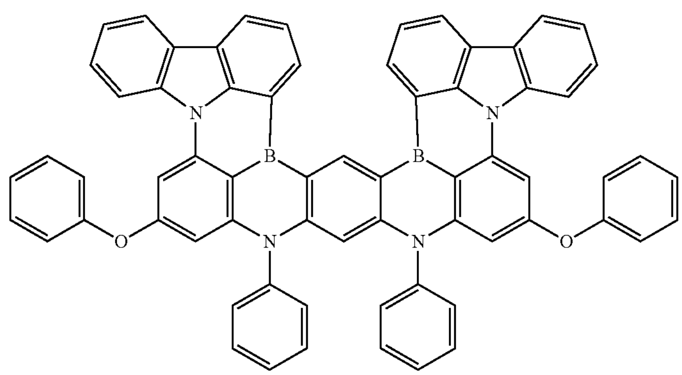

-continued
(1-115)
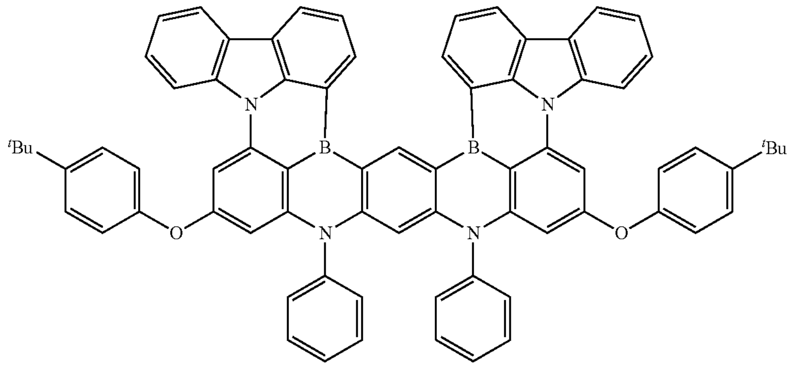
(1-201)
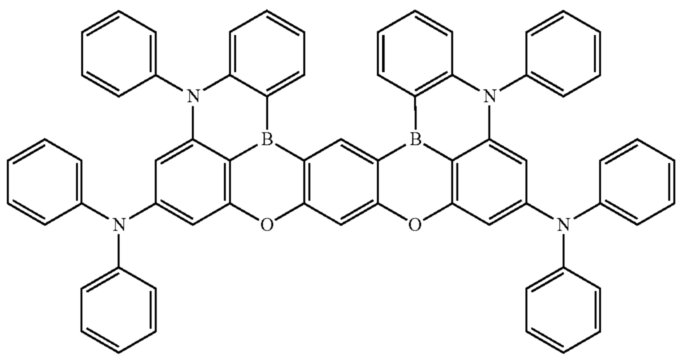
(1-202)
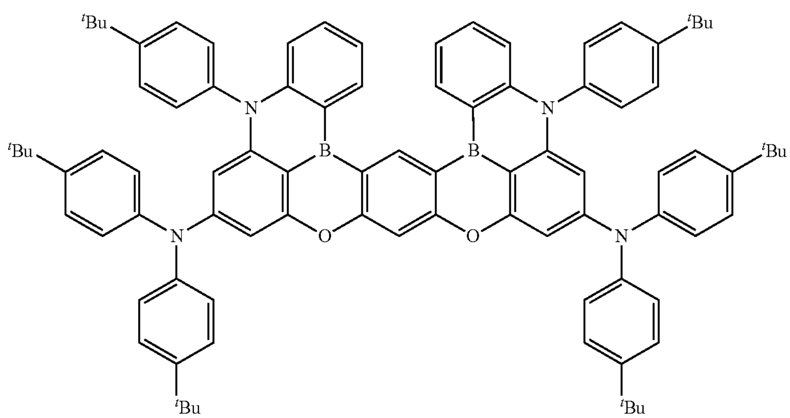
(1-203)
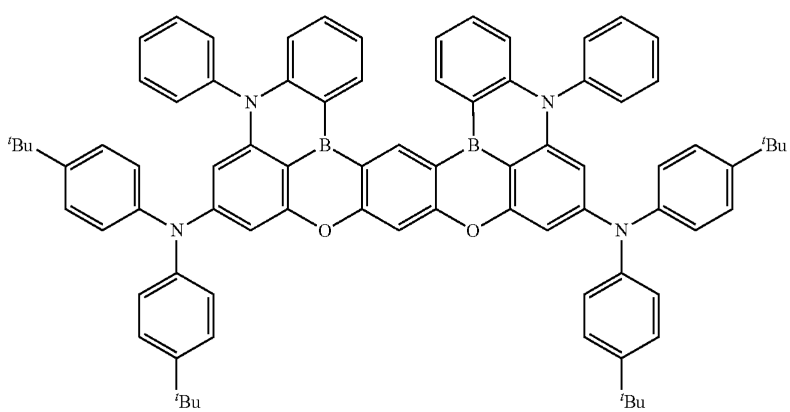

-continued
(1-207)
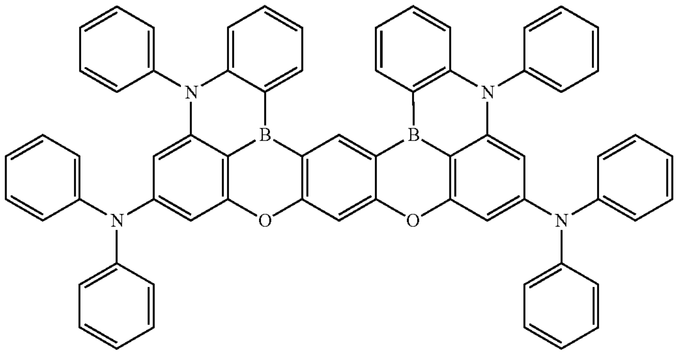
(1-208)
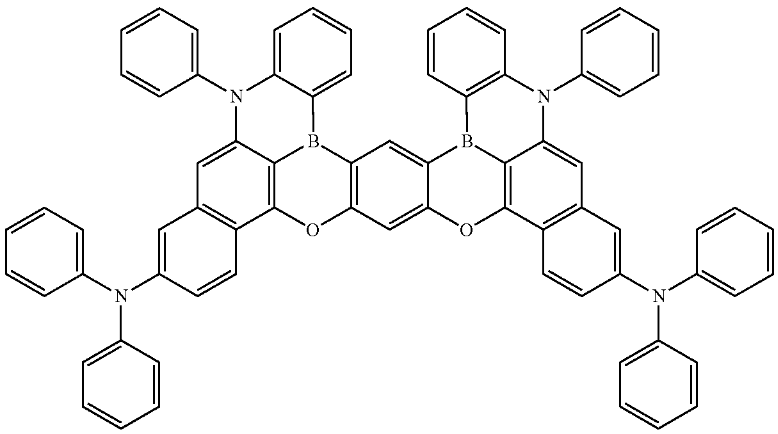
(1-209)
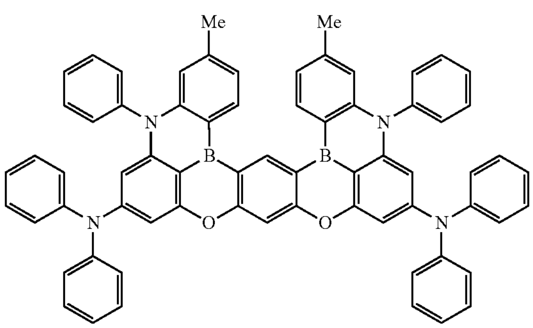
(1-211)
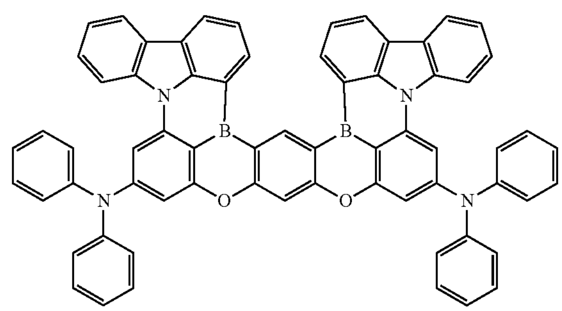
(1-212)
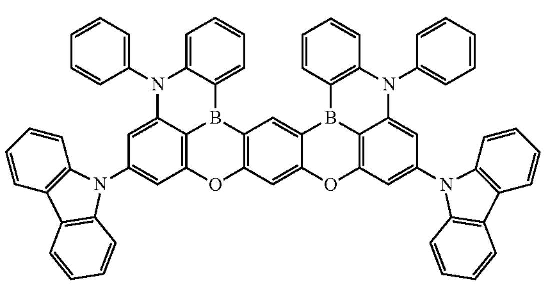
(1-215)
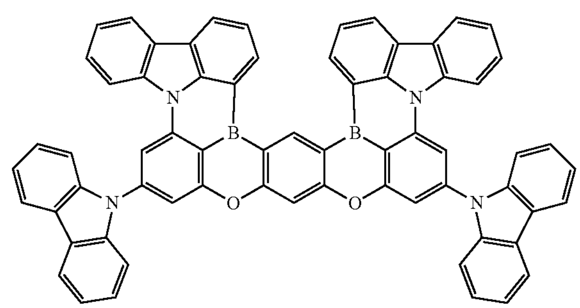

-continued
(1-214)
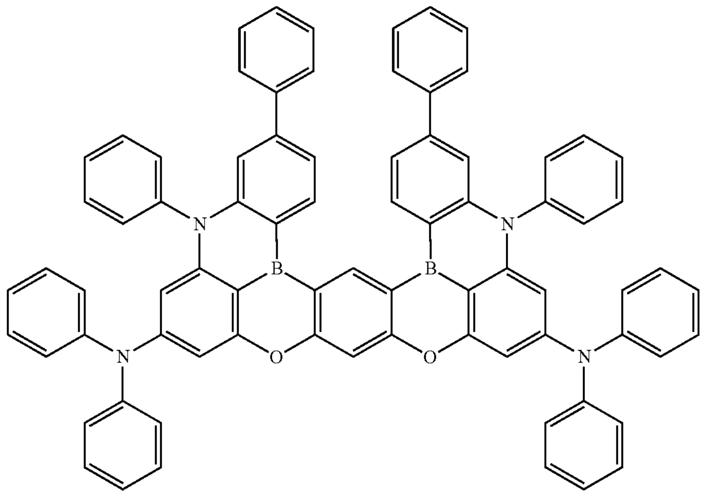
(1-218)
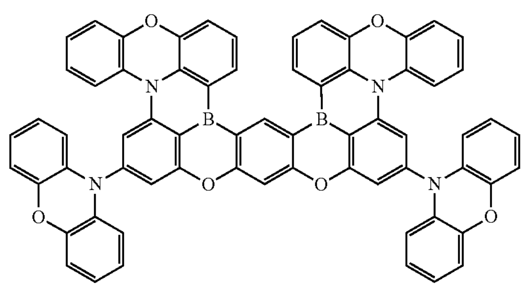
(1-401)
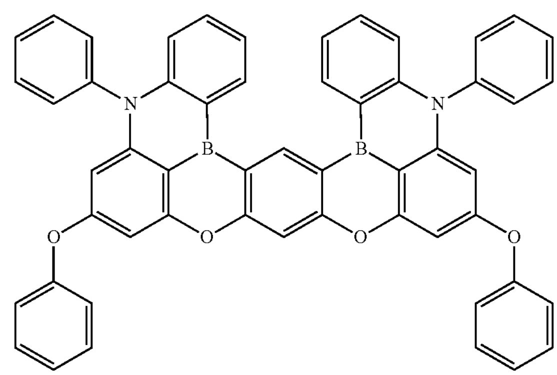
(1-402)
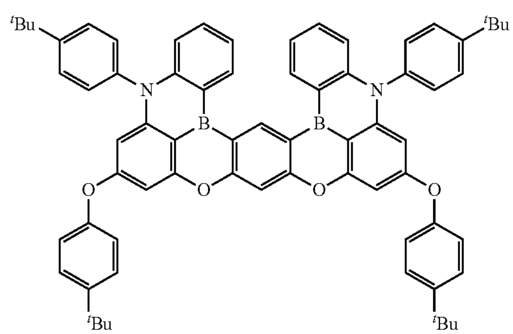
(1-403)
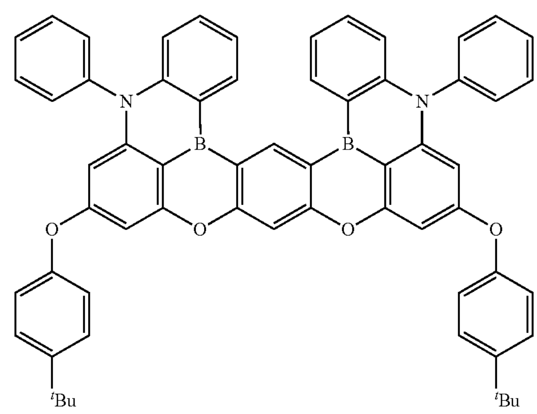
(1-407)
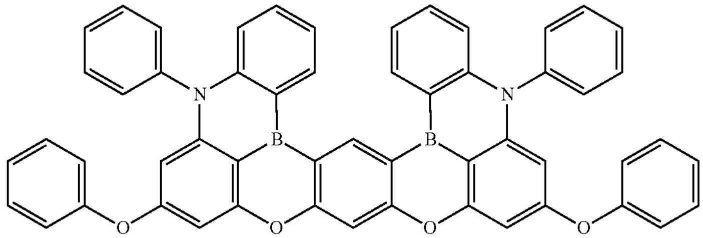

-continued
(1-408)
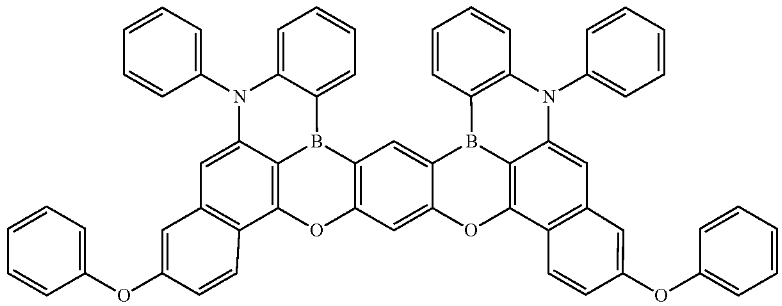
(1-409)
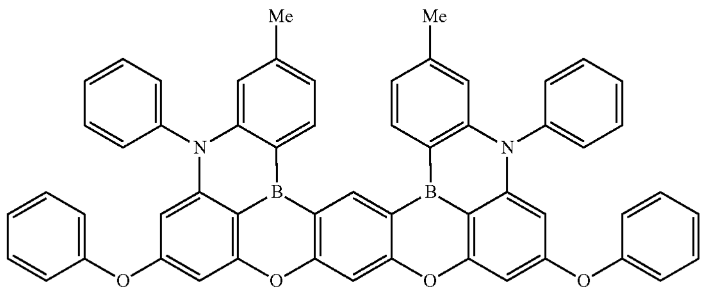
(1-411)
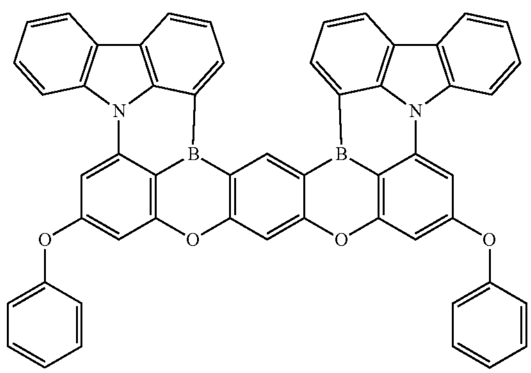
(1-416)
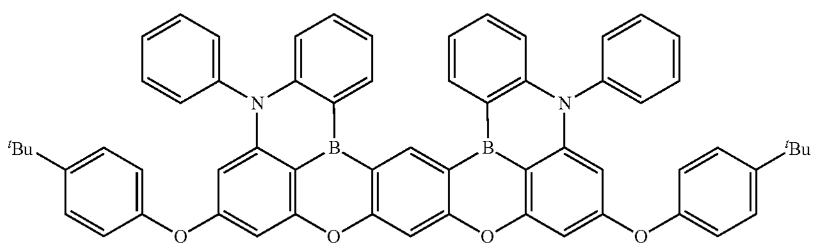
(1-418)
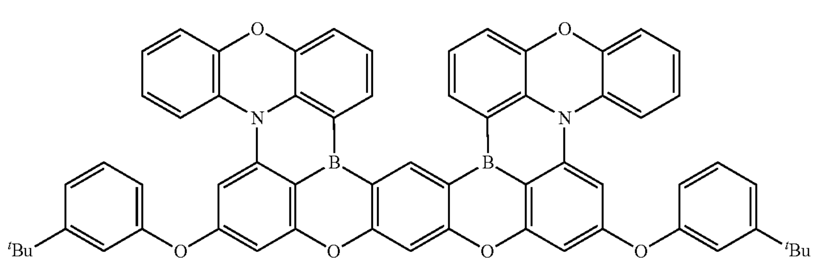

-continued
(1-601)
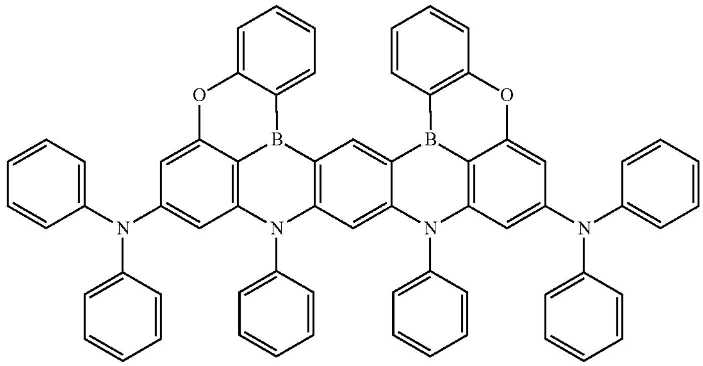
(1-602)
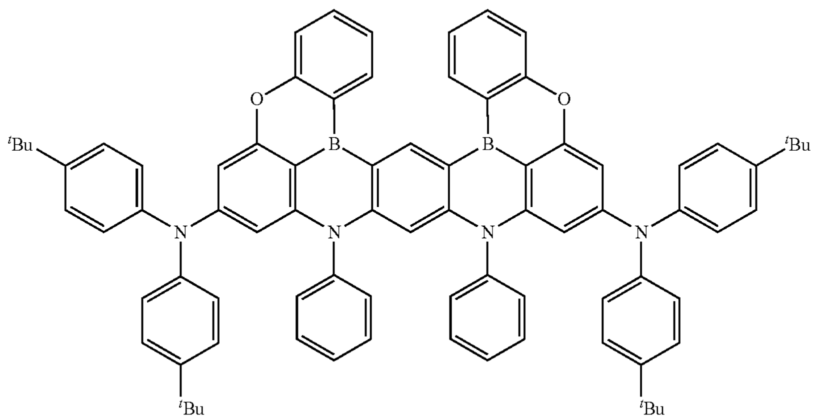
(1-603)
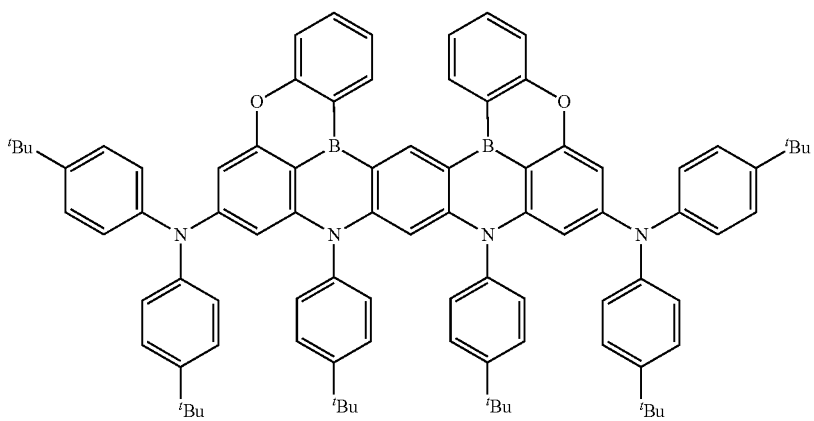
(1-605)
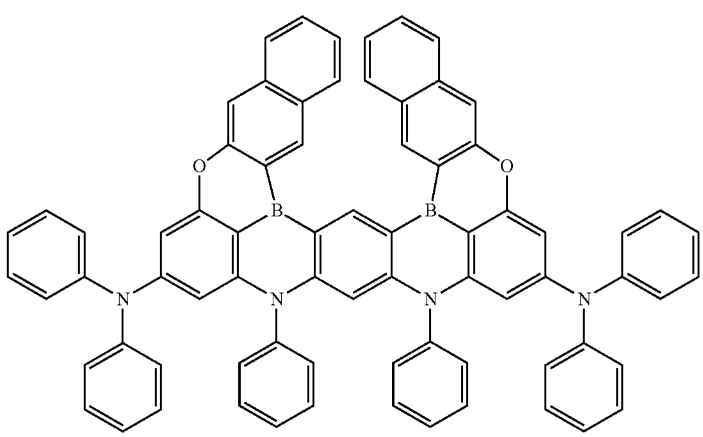

-continued
(1-608)
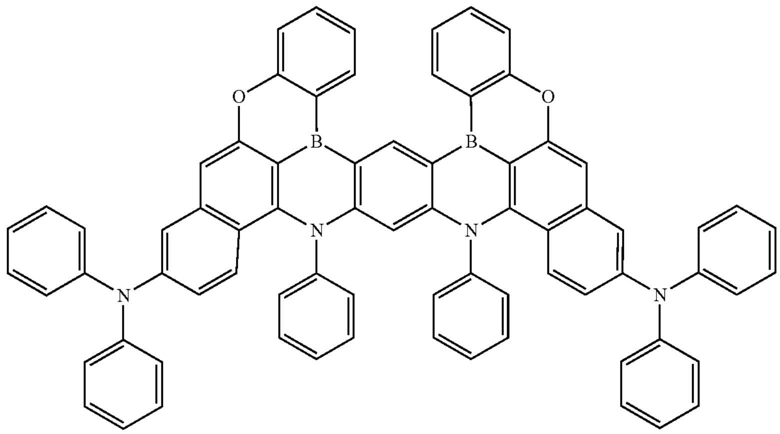
(1-609)
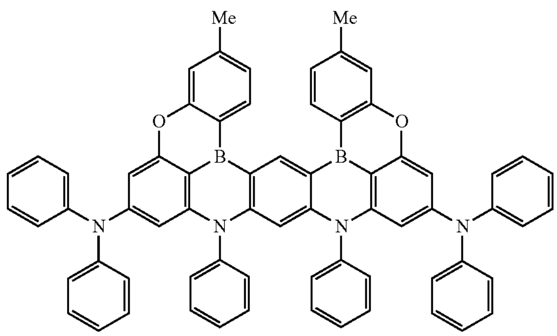
(1-611)
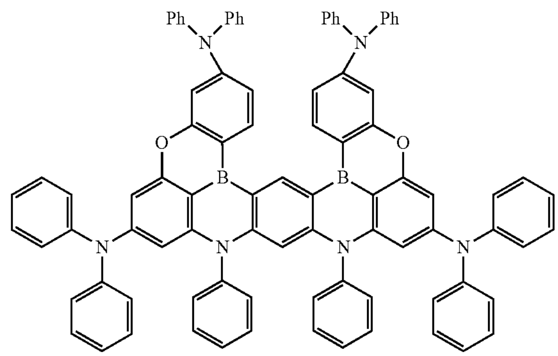
(1-612)
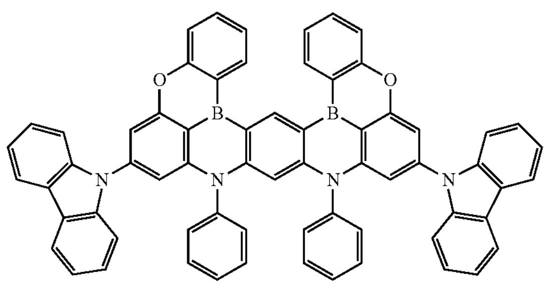
(1-615)
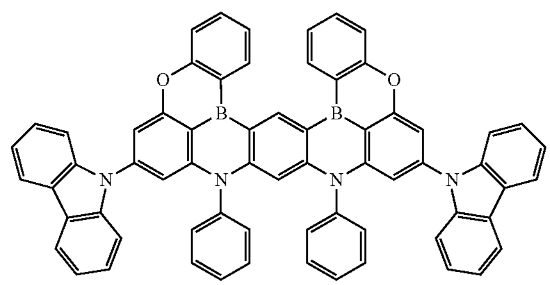
(1-618)
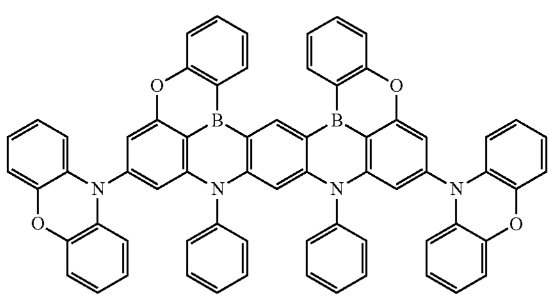
(1-801)
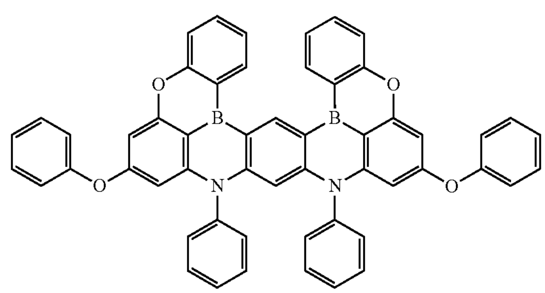

-continued
(1-802)
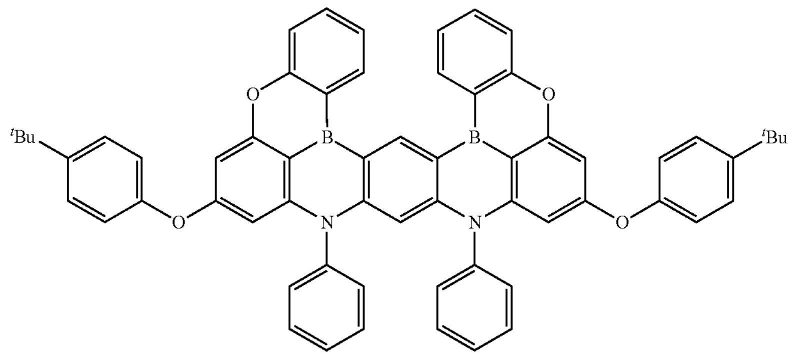
(1-803)
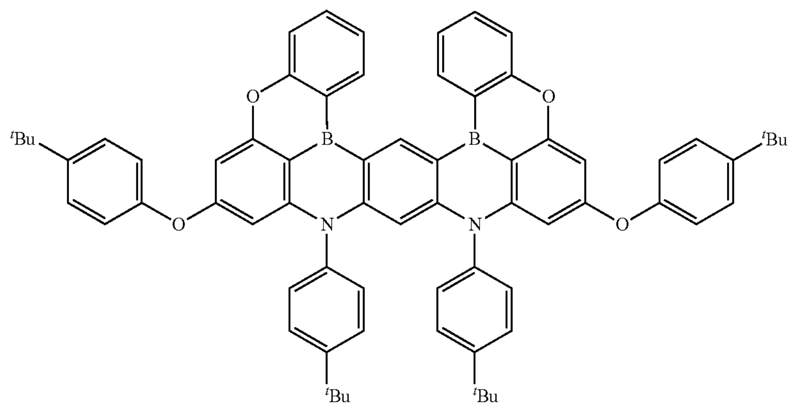
(1-807)
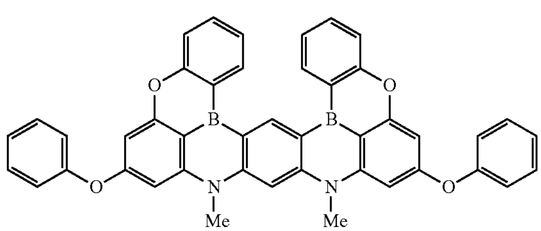
(1-809)
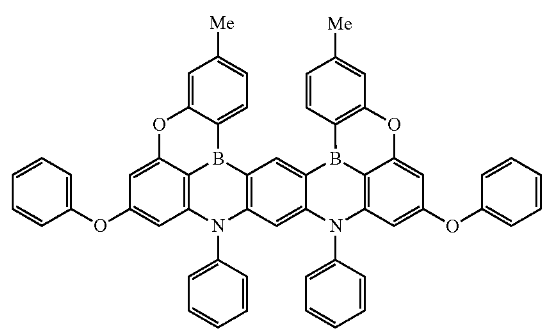
(BOCz-0001)
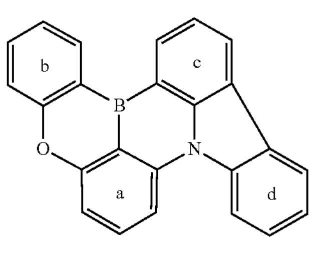
(BOCz-0210)
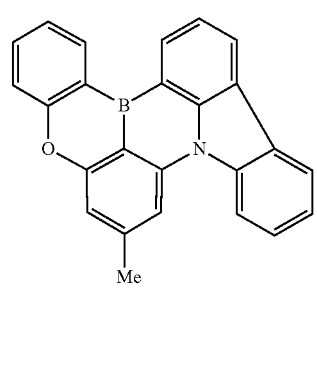

-continued
(BOCz-0211)
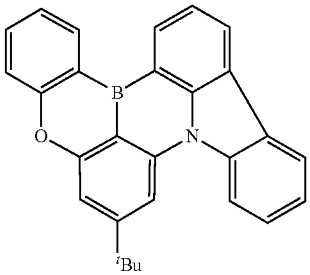
(BOCz-0212)
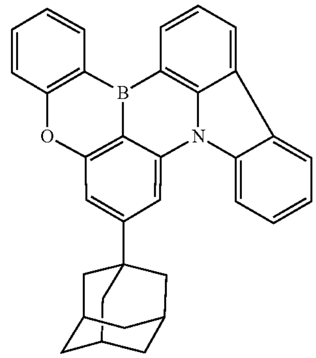
(BOCz-0220)
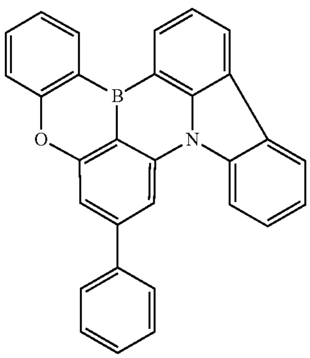
(BOCz-0230)
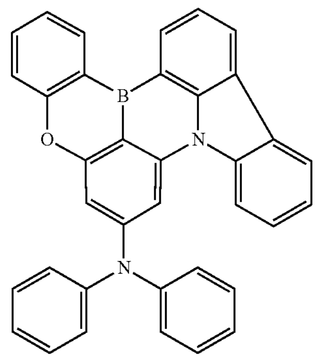
(BOCz-0231)
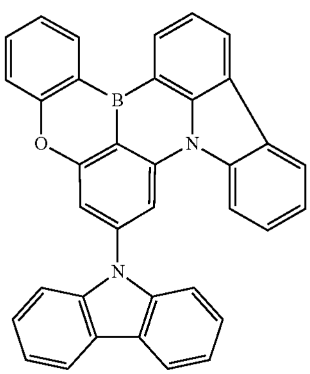
(BOCz-0232)
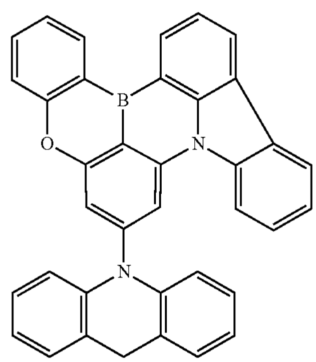
(BOCz-0233)
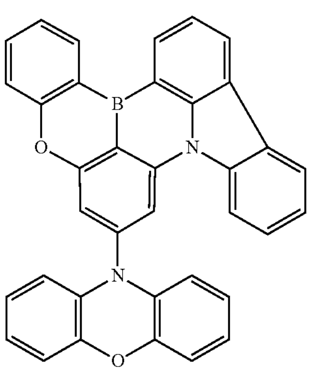
(BOCz-0310)
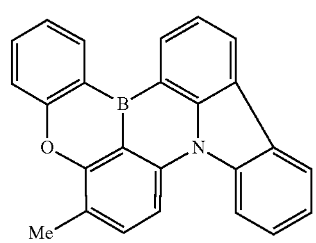

-continued
(BOCz-0311)
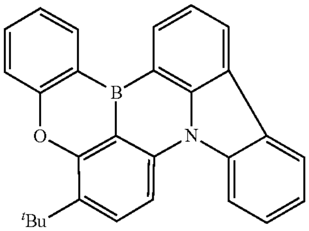
(BOCz-0312)
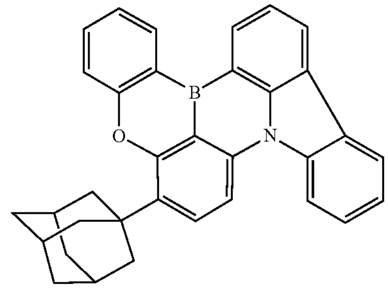
(BOCz-0320)
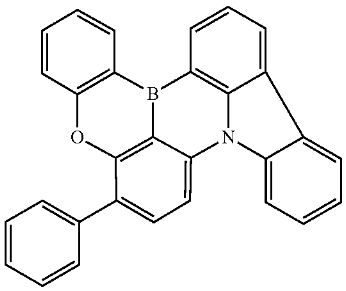
(BOCz-0330)
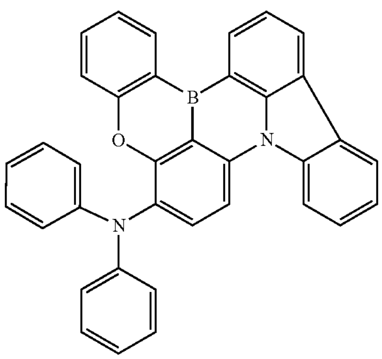
(BOCz-0331)
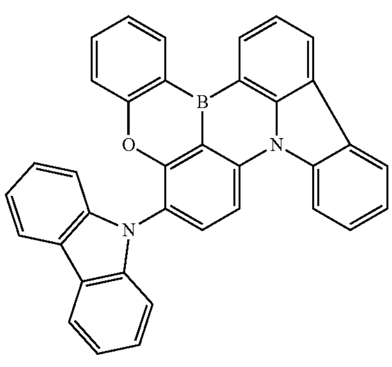
-continued
(BOCz-0332)
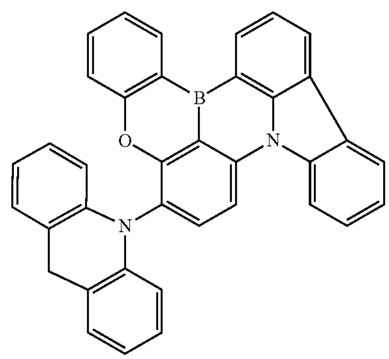
(BOCz-0333)
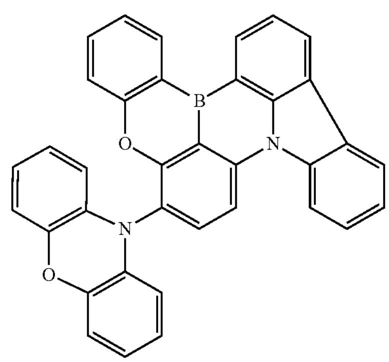
(BOCz-0410)
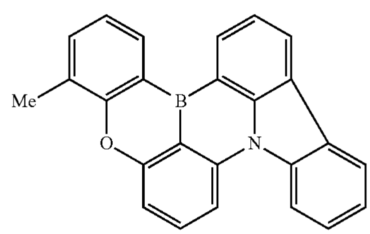

-continued
(BOCz-0411)
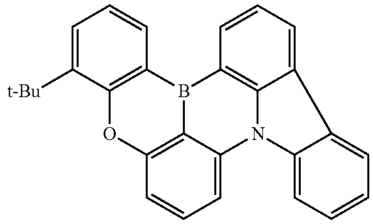
(BOCz-0412)
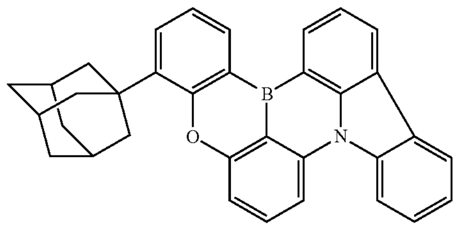
(BOCz-0420)
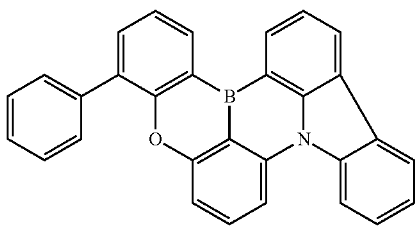
(BOCz-0430)
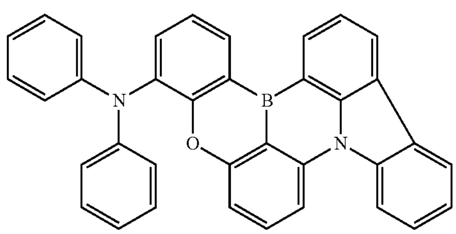
(BOCz-0431)
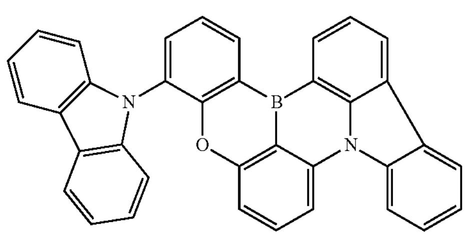
(BOCz-0432)
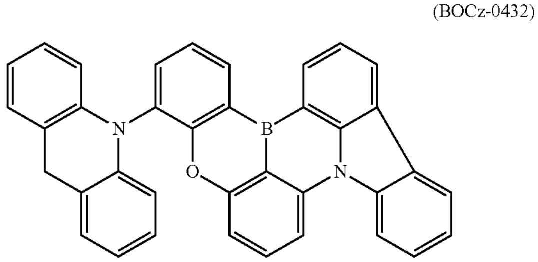
-continued
(BOCz-0433)
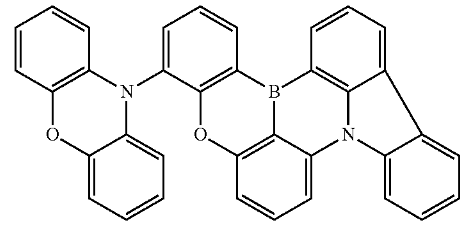
(BOCz-0510)
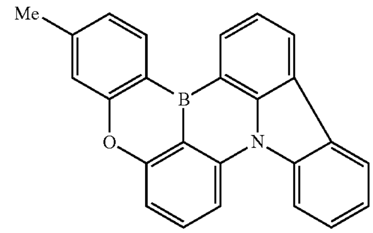
(BOCz-0511)
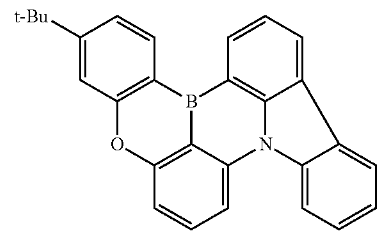
(BOCz-0512)
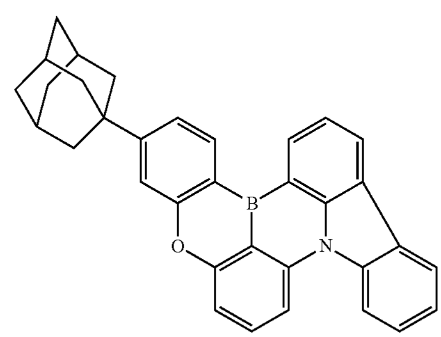
(BOCz-0520)
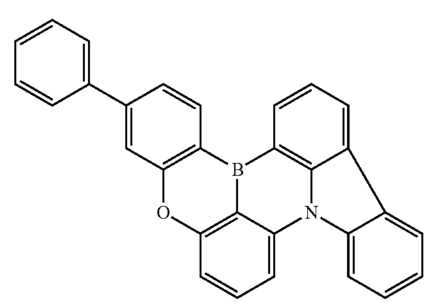

-continued
(BOCz-0530)
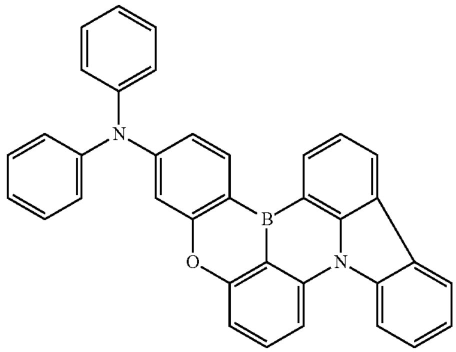
(BOCz-0531)
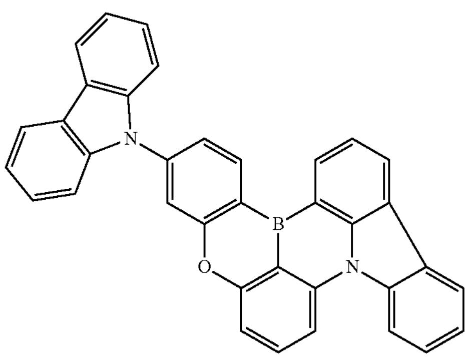
(BOCz-0532)
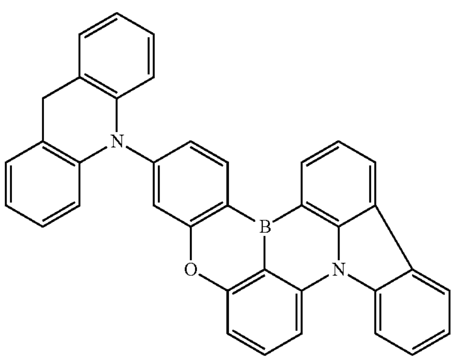
(BOCz-0533)
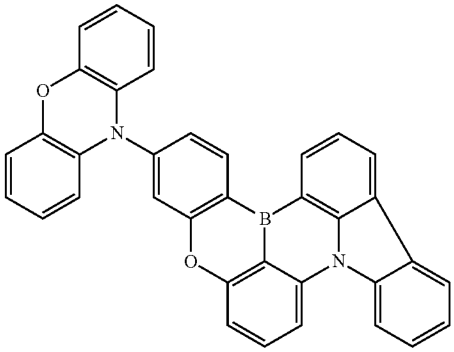
-continued
(BOCz-0610)
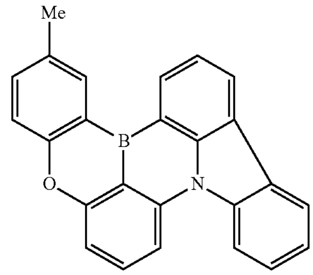
(BOCz-0611)
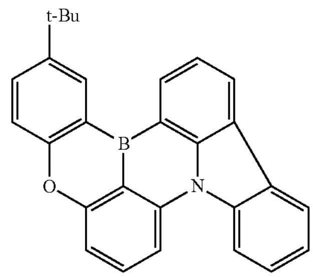
(BOCz-0612)
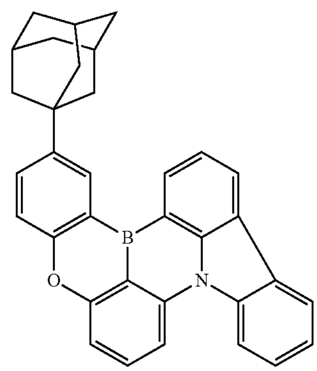
(BOCz-0620)
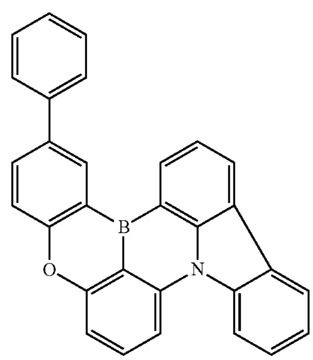
(BOCz-0630)
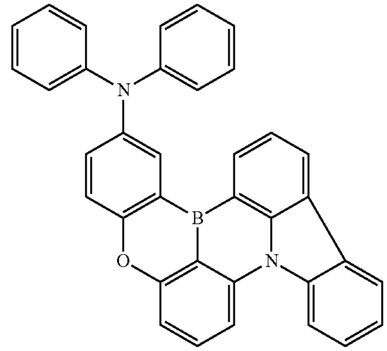

-continued
(BOCz-0631)
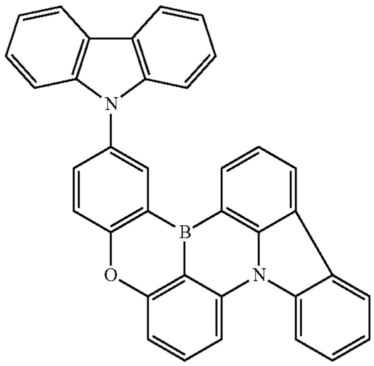
(BOCz-0632)
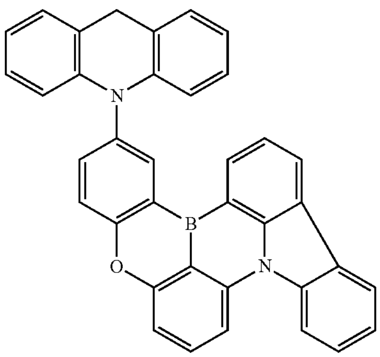
(BOCz-0633)
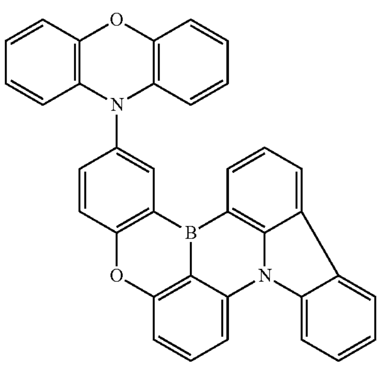
(BOCz-0910S)
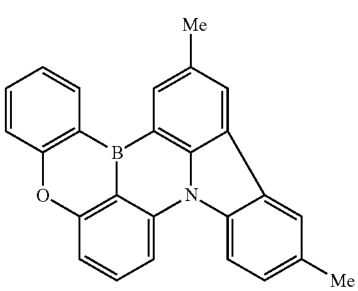
-continued
(BOCz-0911S)
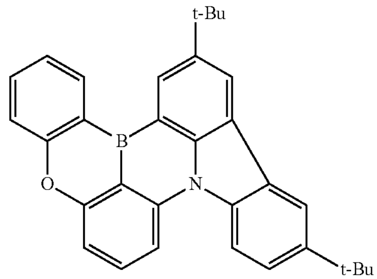
(BOCz-0912S)
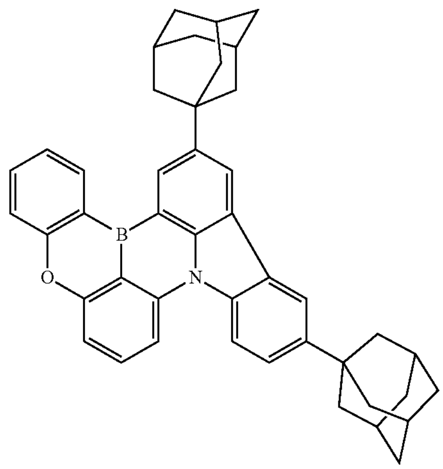
(BOCz-0920S)
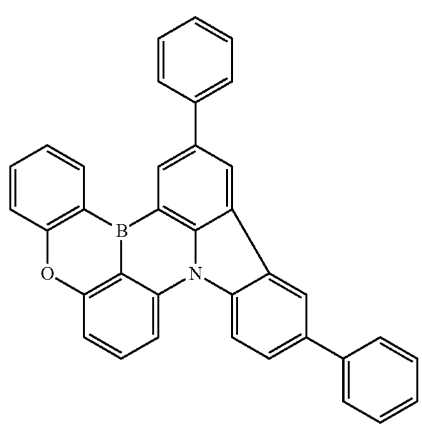

-continued
(BOCz-0930S)
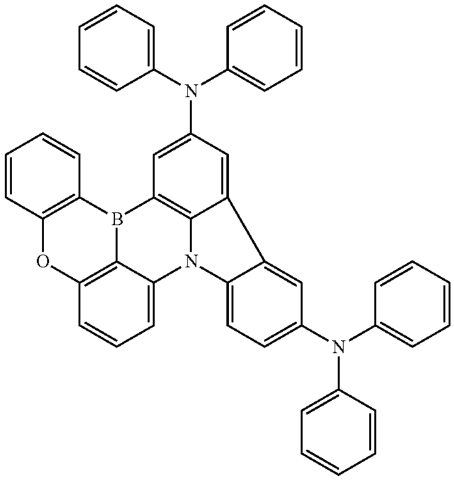
(BOCz-0931S)
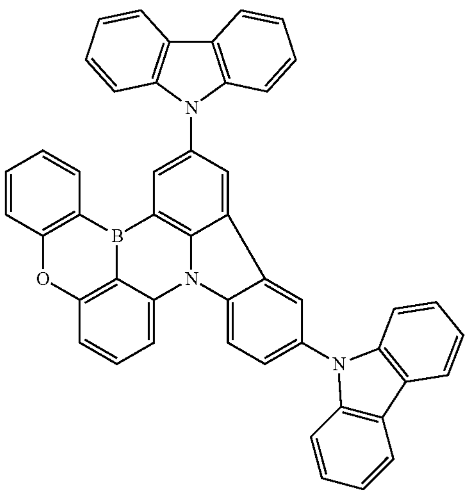
(BOCz-0932S)
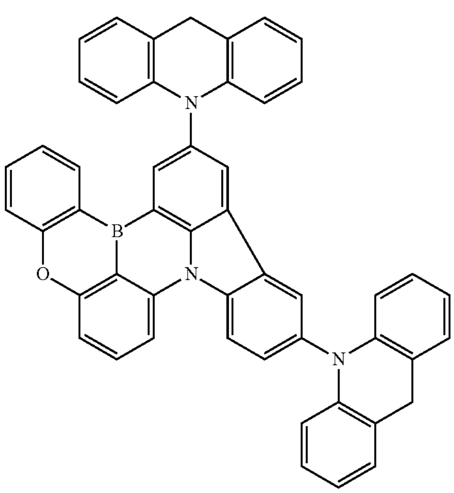
-continued
(BOCz-0933S)
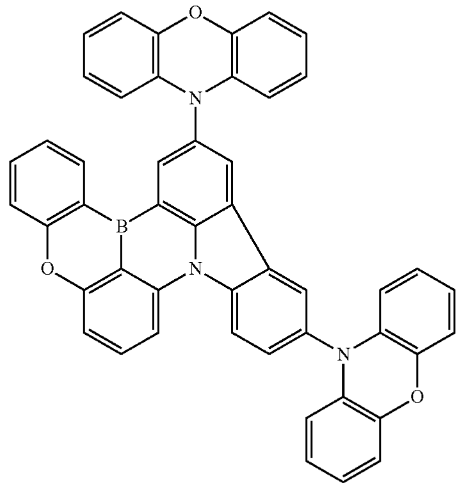
(BNpCz-0001)
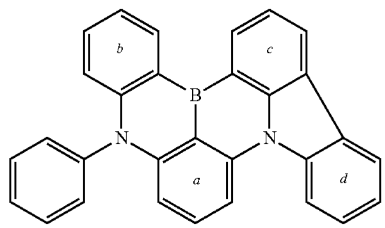
(BNpCz-0210)
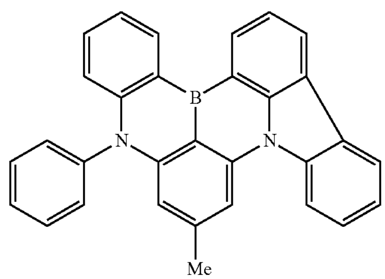
(BNpCz-0211)
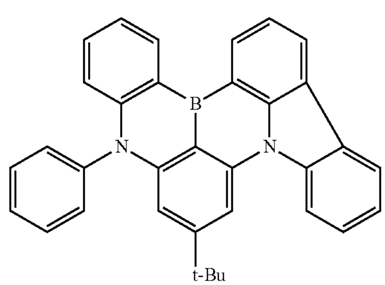

-continued
(BNpCz-0212)
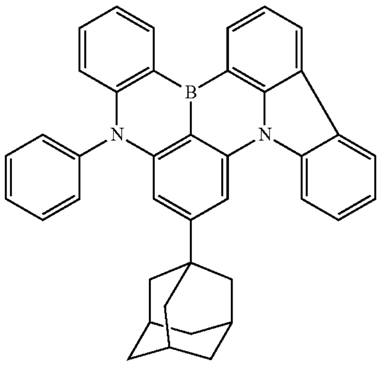
(BNpCz-0220)
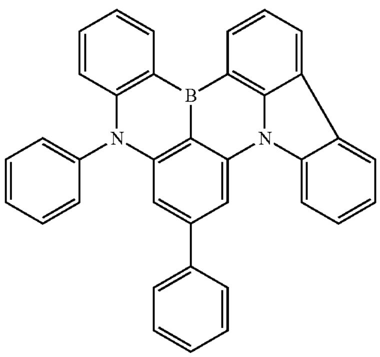
(BNpCz-0220-1)
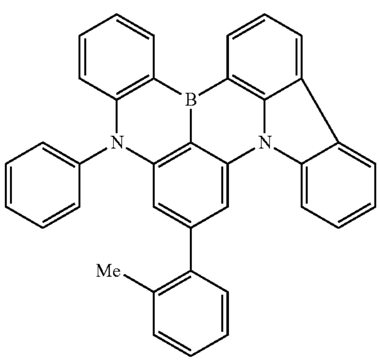
(BNpCz-0220-2)
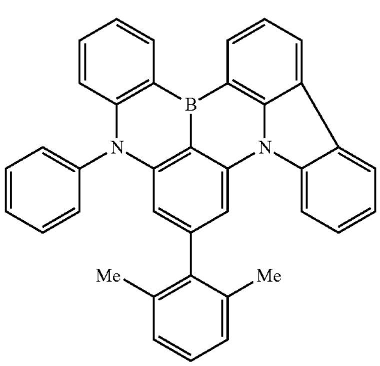
-continued
(BNpCz-0220-3)
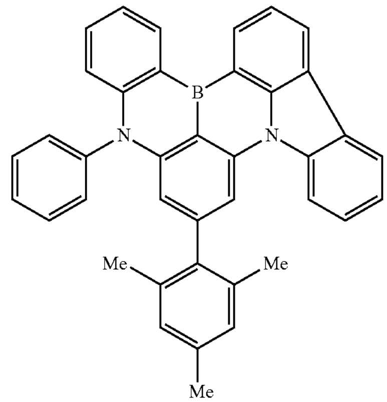
(BNpCz-0230)
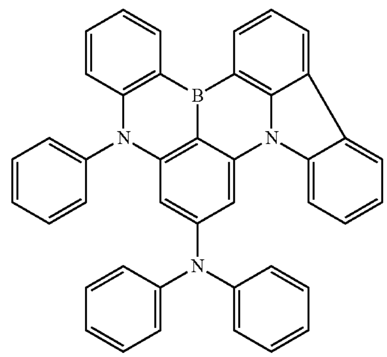
(BNpCz-0231)
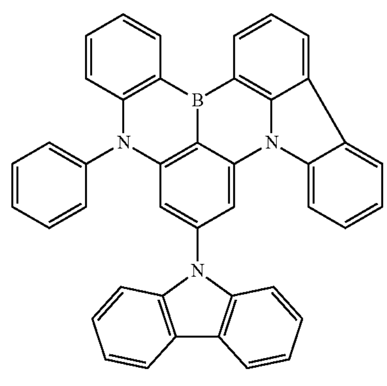
(BNpCz-0232)
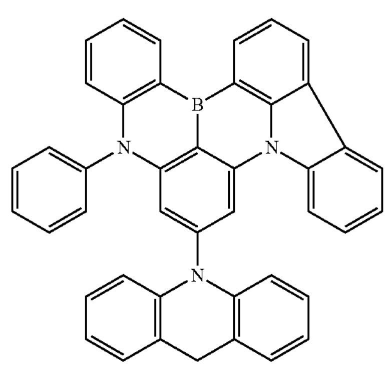

-continued
(BNpCz-0233)
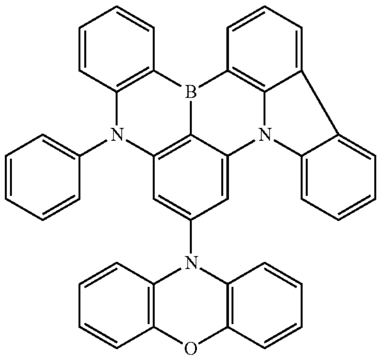
(BNpCz-0510)
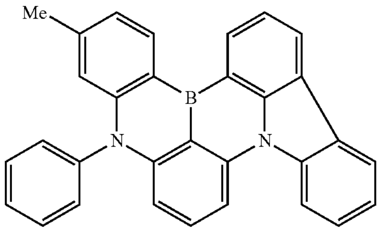
(BNpCz-0511)
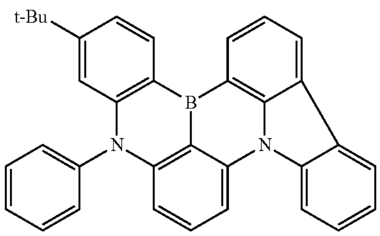
(BNpCz-0512)
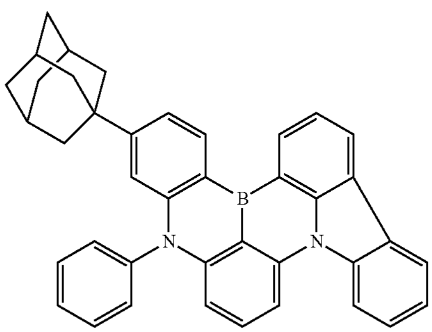
(BNpCz-0520)
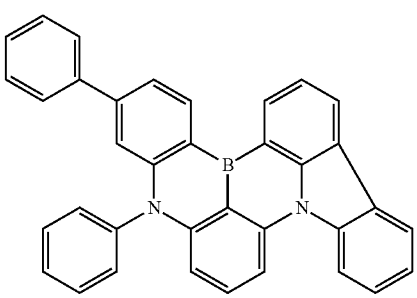
-continued
(BNpCz-0530)
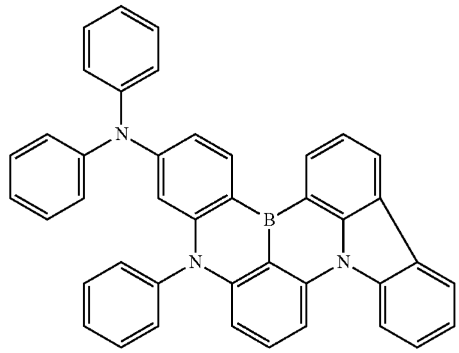
(BNpCz-0531)
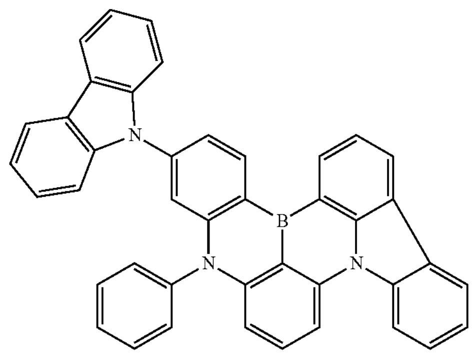
(BNpCz-0532)
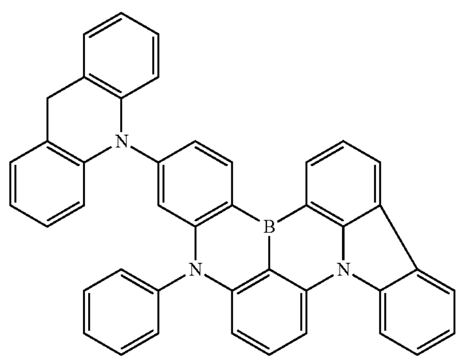
(BNpCz-0533)
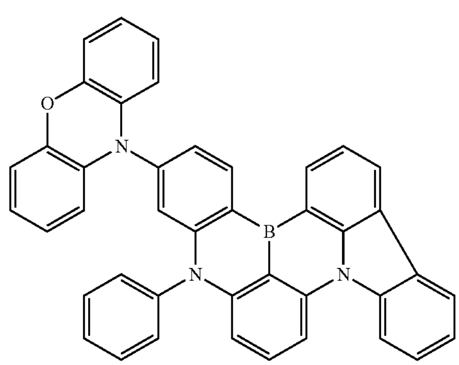

-continued
(BNpCz-0610)
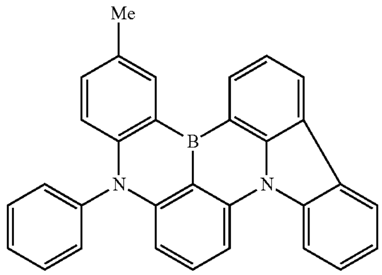
(BNpCz-0611)
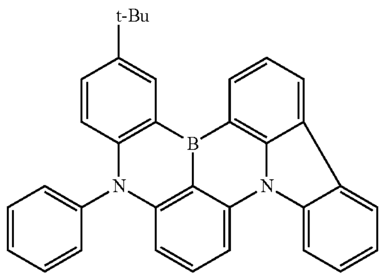
(BNpCz-0612)
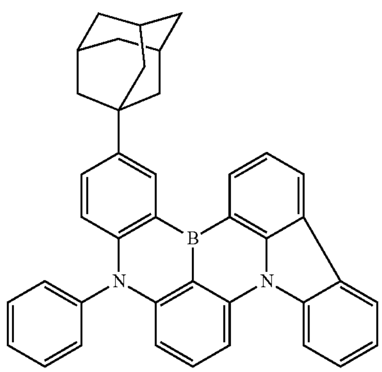
(BNpCz-0620)
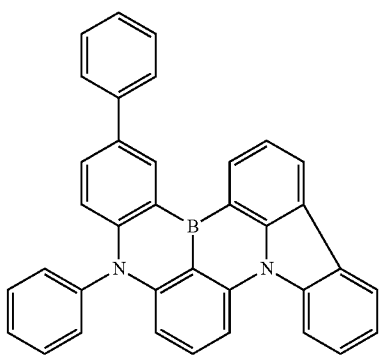
(BNpCz-0630)
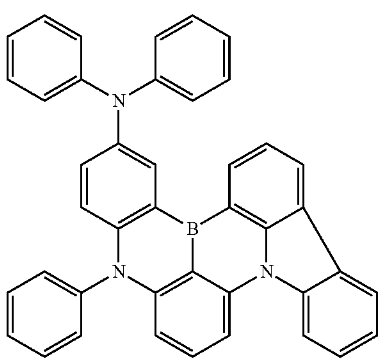
-continued
(BNpCz-0631)
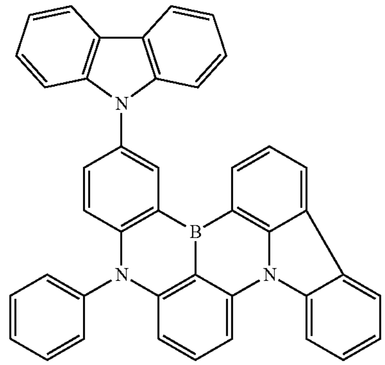
(BNpCz-0632)
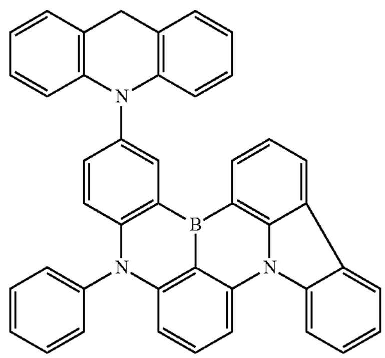
(BNpCz-0633)
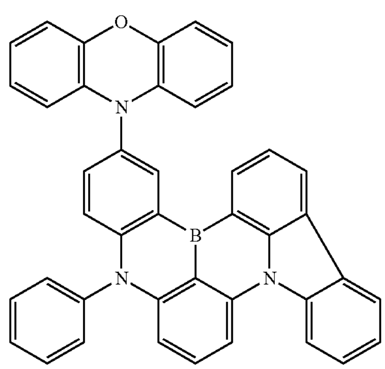
(BNpCz-0210/0910S)
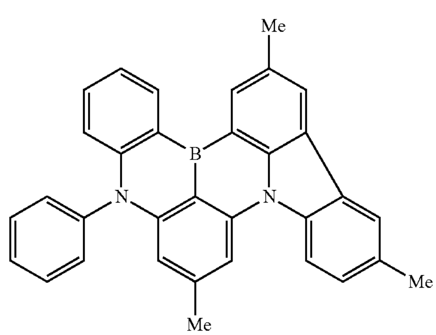

-continued
(BNpCz-0210/0911S)
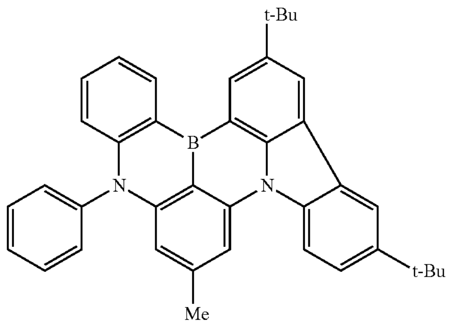
(BNpCz-0210/0920S)
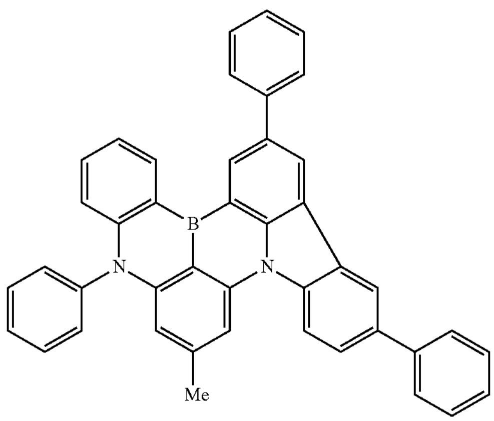
(BNpCz-0210/0930S)
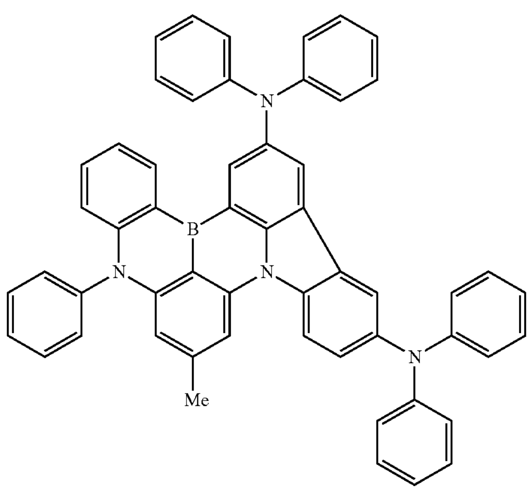
-continued
(BNpCz-0210/0931S)
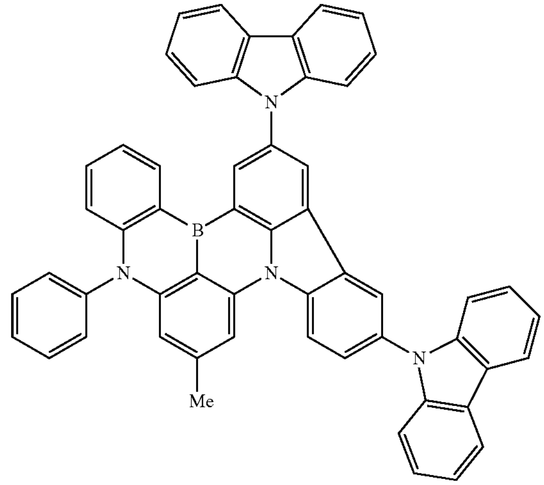
(BNpCz-0210/0932S)
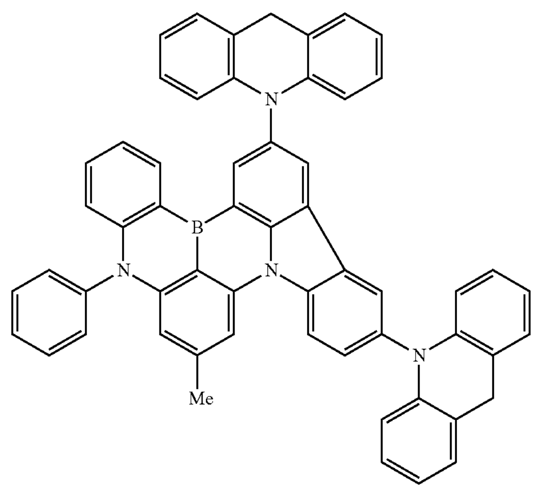
(BNpCz-0210/0933S)
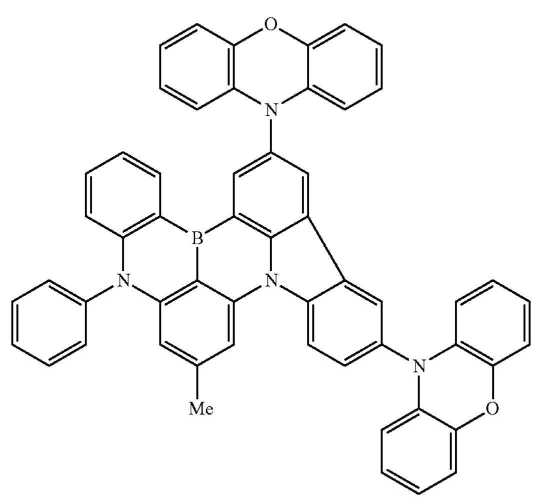

-continued (22BNpCz-0001)

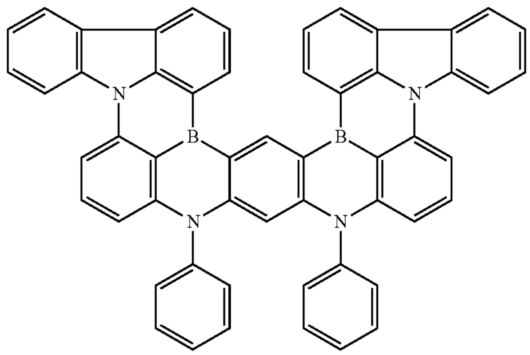

(22BNpCz-0910S/S)

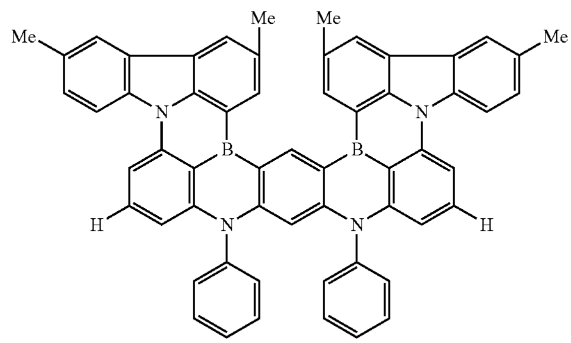

(22BNpCz-0910S/S)

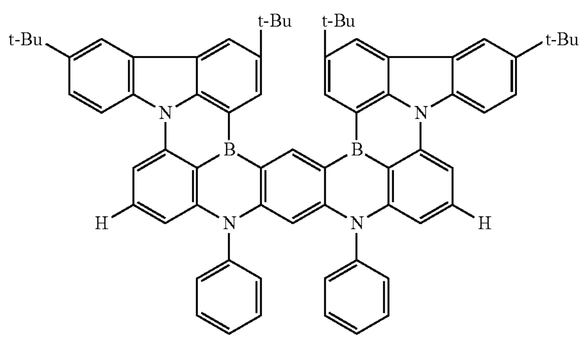

(22BOCz/NpCz-0001)

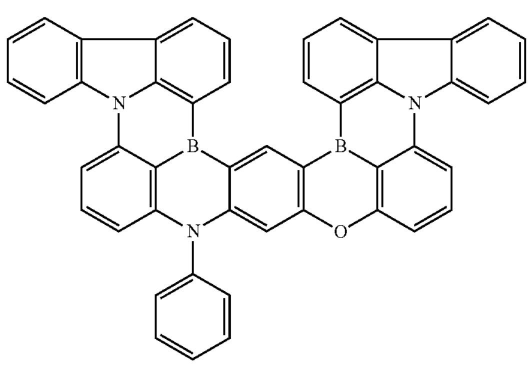

-continued (22BOCz-0001)

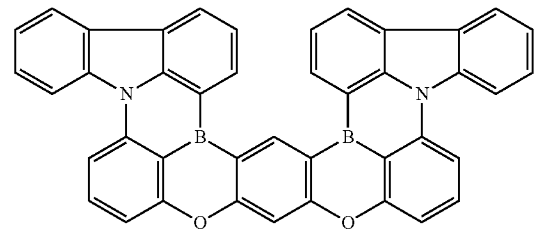

(Other Organic Layers)

The organic electroluminescent device of the present invention may have one or more organic layers in addition to the light-emitting layer. Examples of the organic layers include an electron transport layer, a hole transport layer, an electron injection layer and a hole injection layer. In addition to these, the organic electroluminescent device may have any other organic layers.

FIG. 1 shows an example of a layer configuration of an organic EL device provided with these organic layers. In FIG. 1, 101 is a substrate, 102 is an anode, 103 is a hole injection layer, 104 is a hole transport layer, 105 is a light-emitting layer, 106 is an electron transport layer, 107 is an electron injection layer, and 108 is a cathode.

In the following, the other organic layers than the light-emitting layer, as well as the cathode, anode and the substrate of the organic electroluminescent device are described.

2. Electron Injection Layer and Electron Transport Layer in Organic Electroluminescent Device The electron injection layer 107 plays a role of efficiently injecting the electrons having been transferred from the cathode 108 into the light-emitting layer 105 or the electron transport layer 106. The electron transport layer 106 plays a role of efficiently transporting the electrons injected from the cathode 108 or the electrons injected from the cathode 108 via the electron injection layer 107, to the light-emitting layer 105. The electron transport layer 106 and the electron injection layer 107 each are formed by laminating or mixing one or more kinds of electron transport/injection materials.

The electron injection/transport layer is a layer into which electrons are injected from the cathode and which controls electron transportation, and is preferably a layer having a high electron injection efficiency and capable of efficiently transporting the injected electrons. For this, preferably, the layer is formed of a substance having a high electron affinity and additionally having a high electron mobility, and further excellent in stability and hardly producing impurities that may be traps during production and use. However, in consideration of the balance of transportation of holes and electrons, in the case where the layer is desired to principally play a role of efficiently trapping a flow of holes from the anode to a cathode side without recombination, the layer can attain an effect of improving light emission efficiency on the same level as that of a material having a high electron transport ability, even though the electron transportation performance thereof is not so high. Consequently, the electron injection/transport layer in the present embodiment can have a function of a layer that may efficiently block hole transfer.

As the material (electron transporting material) for forming the electron transport layer 106 or the electron injection layer 107, any one can be appropriately selected from compounds heretofore generally used as an electron transfer compound in a photoconductive material, and other known compounds used in an electron injection layer and an electron transport layer in an organic EL device.

Preferably, the material for the electron transport layer or the electron injection layer includes at least one selected from aromatic cyclic or heteroaromatic cyclic compounds composed of one or more atoms selected from carbon, hydrogen, oxygen, sulfur, silicon and phosphorus, as well as pyrrole derivatives and condensed ring derivatives thereof, and electron-accepting nitrogen-having metal complexes. Specifically, the material includes a condensed ring-type aromatic cyclic derivative such as naphthalene and anthracene, a styryl-type aromatic cyclic derivative such as typically 4,4'-bis(diphenylethenyl)biphenyl, a perinone derivative, a coumarin derivative, a naphthalimide derivative, a quinone derivative such as anthraquinone and diphenylquinone, a phosphorus oxide derivative, a carbazole derivative, and an indole derivative. Examples of the electron-accepting nitrogen-having metal complex include a hydroxyazole complex such as a hydroxyphenyloxazole complex, as well as an azomethine complex, a tropolone metal complex, a flavonol metal complex, and a benzoquinoline metal complex. These materials can be used singly, or different materials can be used as a mixture.

Specific examples of the other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (e.g., 1,3-bis[(4-t-butylphenyl)-1,3,4-oxadiazolyl]phenylene), a thiophene derivative, a triazole derivative (e.g., N-naphthyl-2,5-diphenyl-1,3,5-triazole), a thiadiazole derivative, an oxine derivative metal complex, a quinolinol metal complex, a quinoxaline derivative, a quinoxaline derivative polymer, a benzazole compound, a gallium complex, a pyrazole derivative, a perfluorinated phenylene derivative, a triazine derivative, a pyrazine derivative, a benzoquinoline derivative (e.g., 2,2'-bis(benzo[h]quinolin-2-yl)-9,9'-spirobifluorene), an imidazopyridine derivative, a borane derivative, a benzimidazole derivative (e.g., tris(N-phenylbenzimidazol-2-yl)benzene), a benzoxazole derivative, a benzothiazole derivative, a quinoline derivative, an oligopyridine derivative such as terpyridine, a bipyridine derivative, a terpyridine derivative (e.g., 1,3-bis(4'-(2,2':6',2"-terpyridinyl)benzene), a naphthyridine derivative (e.g., bis(1-naphthyl)-4-(1,8-naphthyridin-2-yl)phenylphosphine oxide), an aldazine derivative, a carbazole derivative, an indole derivative, a phosphorus oxide derivative, and a bisstyryl derivative.

In addition, an electron-accepting nitrogen-having metal complex can also be used, and examples thereof include a quinolinol metal complex, a hydroxyazole complex such as a hydroxyphenyloxazole complex, as well as an azomethine complex, a tropolone metal complex, a flavonol metal complex, and a benzoquinoline metal complex.

The above-mentioned materials can be used singly, or different materials can be used as a mixture.

Among the above-mentioned materials, preferred are a borane derivative, a pyridine derivative, a fluoranthene derivative, a BO-type derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol metal complex.

2-1. Pyridine Derivative

The pyridine derivative is, for example, a compound represented by the following formula (ETM-2), and is preferably a compound represented by the formula (ETM-2-1) or the formula (ETM-2-2).

(ETM-2)

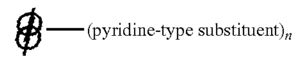

(ETM-2-1)

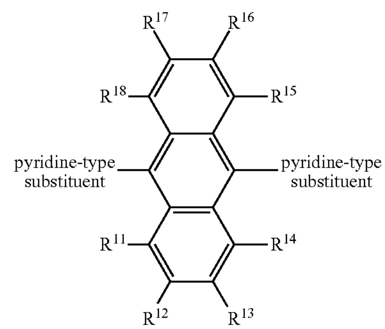

(ETM-2-2)

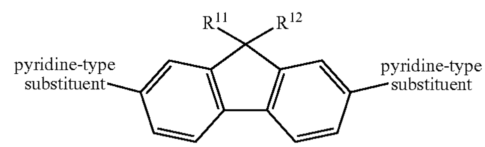

ϕ is an n-valent aryl ring (preferably an n-valent benzene ring, naphthalene ring, anthracene ring, fluorene ring, benzofluorene ring, phenalene ring, phenanthrene ring or triphenylene ring), and n is an integer of 1 to 4.

In the above formula (ETM-2-1), $R^{11}$ to $R^{18}$ each are independently a hydrogen, an alkyl (preferably an alkyl having a carbon number of 1 to 24), a cycloalkyl (preferably a cycloalkyl having a carbon number of 3 to 12) or an aryl (preferably an aryl having a carbon number of 6 to 30).

In the above formula (ETM-2-2), $R^{11}$ and $R^{12}$ each are independently a hydrogen, an alkyl (preferably an alkyl having a carbon number of 1 to 24), a cycloalkyl (preferably a cycloalkyl having a carbon number of 3 to 12) or an aryl (preferably an aryl having a carbon number of 6 to 30), and $R^{11}$ and $R^{12}$ may bond to form a ring.

In the formulae, the "pyridine-type substituent" is any of the following formulae (Py-1) to (Py-15), and the pyridine-type substituent each may be independently substituted with an alkyl having a carbon number of 1 to 4. In addition, the pyridine-type substituent may bond to b, the anthracene ring or the fluorene ring in each formula, via a phenylene group or a naphthylene group.

(Py-1)

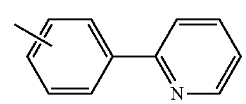

(Py-2)

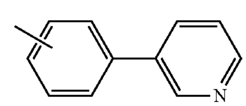

(Py-3)

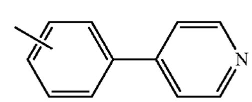

-continued
(Py-4)
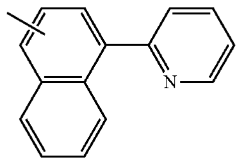
(Py-5)
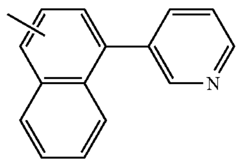
(Py-6)
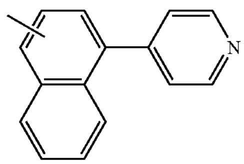
(Py-7)
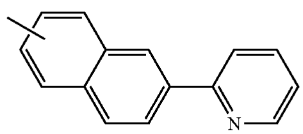
(Py-8)
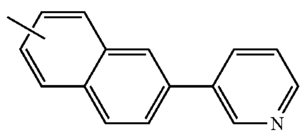
(Py-9)
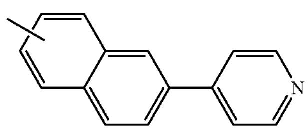
(Py-10)
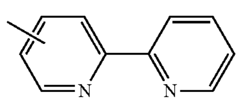
(Py-11)
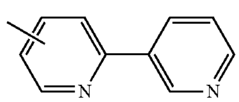
(Py-12)
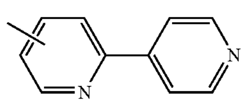
(Py-13)
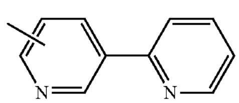
(Py-14)
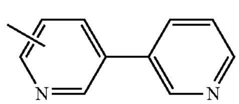
(Py-15)
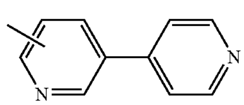
The pyridine-type substituent is any of the above formulae (Py-1) to (Py-15), and among these, the substituent is preferably any of the following formulae (Py-21) to (Py-44).
(Py-21)
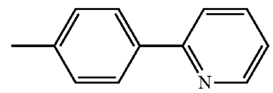
(Py-22)
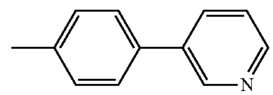
(Py-23)
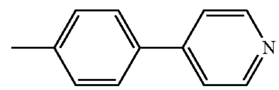
(Py-24)
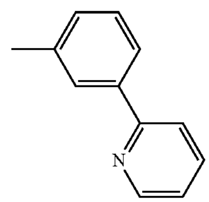
(Py-25)
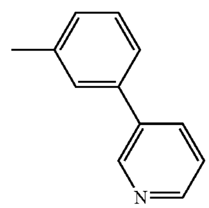
(Py-26)
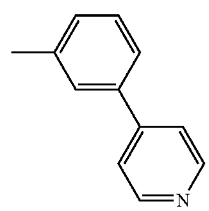
(Py-27)
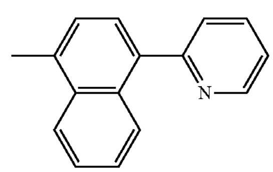
(Py-28)
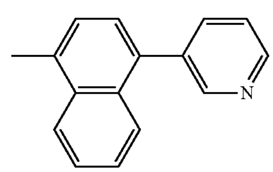
(Py-29)
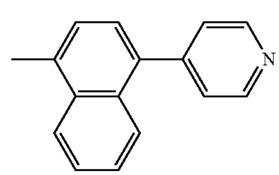

-continued (Py-30)

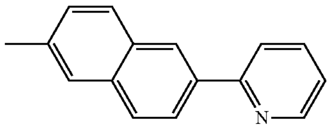

(Py-31)

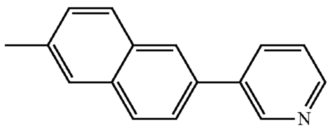

(Py-32)

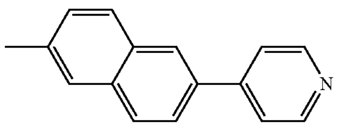

(Py-33)

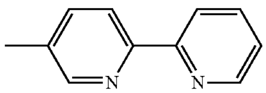

(Py-34)

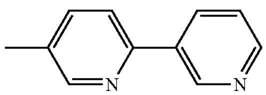

(Py-35)

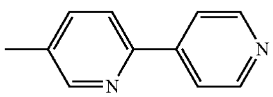

(Py-36)

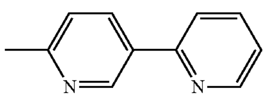

(Py-37)

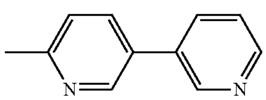

(Py-38)

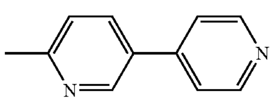

(Py-39)

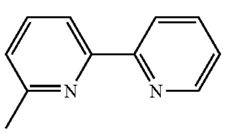

(Py-40)

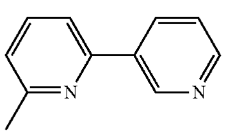

(Py-41)

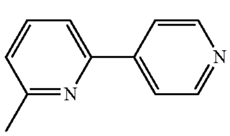

(Py-42)

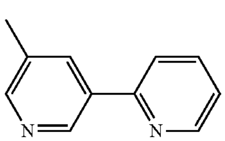

-continued (Py-43)

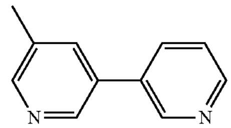

(Py-44)

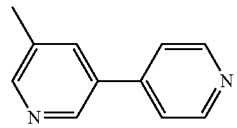

At least one hydrogen in each pyridine derivative may be substituted with a deuterium, and one of the two "pyridine-type substituents" in the above formula (ETM-2-1) and the formula (EM-2-2) may be substituted with an aryl.

"Alkyl" in $R^{11}$ to $R^{18}$ may be linear or branched, and is, for example, a linear alkyl having a carbon number of 1 to 24 or a branched alkyl having a carbon number of 3 to 24. Preferably, "alkyl" is an alkyl having a carbon number of 1 to 18 (a branched alkyl having a carbon number of 3 to 18). More preferably, "alkyl" is an alkyl having a carbon number of 1 to 12 (a branched alkyl having a carbon number of 3 to 12). Even more preferably, "alkyl" is an alkyl having a carbon number of 1 to 6 (a branched alkyl having a carbon number of 3 to 6). Especially preferably, "alkyl" is an alkyl having a carbon number of 1 to 4 (a branched alkyl having a carbon number of 3 to 4).

Specifically, "alkyl" includes a methyl, an ethyl, an n-propyl, an isopropyl, an n-butyl, an n-isobutyl, an s-butyl, a t-butyl, an n-pentyl, an isopentyl, a neopentyl, a t-pentyl, an n-hexyl, a 1-methylpentyl, a 4-methyl-2-pentyl, a 3,3-dimethylbutyl, a 2-ethylbutyl, an n-heptyl, a 1-methylhexyl, an n-octyl, a t-octyl, a 1-methylheptyl, a 2-ethylhexyl, a 2-propylpentyl, an n-nonyl, a 2,2-dimethylheptyl, a 2,6-dimethyl-4-heptyl, a 3,5,5-trimethylhexyl, an n-decyl, an n-undecyl, a 1-methyldecyl, an n-dodecyl, an n-tridecyl, a 1-hexylheptyl, an n-tetradecyl, an n-pentadecyl, an n-hexadecyl, an n-heptadecyl, an n-octadecyl and an n-eicosyl.

Regarding the alkyl having a carbon number of 1 to 4, with which the pyridine-type substituent is substituted, reference may be made to the description of the alkyl mentioned above.

"Cycloalkyl" in $R^{11}$ to $R^{18}$ is, for example, a cycloalkyl having a carbon number of 3 to 12. Preferably, "cycloalkyl" is a cycloalkyl having a carbon number of 3 to 10. More preferably, "cycloalkyl" is a cycloalkyl having a carbon number of 3 to 8. Even more preferably, "cycloalkyl" is a cycloalkyl having a carbon number of 3 to 6. Specific examples of "cycloalkyl" include a cyclopropyl, a cyclobutyl, a cyclopentyl, a cyclohexyl, a methylcyclopentyl, a cycloheptyl, a methylcyclohexyl, a cyclooctyl, and a dimethylcyclohexyl.

"Aryl" in $R^{11}$ to $R^{18}$ is preferably an aryl having a carbon number of 6 to 30, more preferably an aryl having a carbon number of 6 to 18, even more preferably an aryl having a carbon number of 6 to 14, especially preferably an aryl having a carbon number of 6 to 12.

Specifically, "aryl having a carbon number of 6 to 30" includes a phenyl of a monocyclic aryl, a (1-, 2-)naphthyl of a condensed bicyclic aryl, an acenaphthylene-(1-, 3-, 4-, 5-)yl, a fluoren-(1-, 2-, 3-, 4-, 9-)yl, a phenalen-(1-, 2-)yl or a (1-, 2-, 3-, 4-, 9-)phenanthryl of a condensed tricyclic aryl, a triphenylene-(1-, 2-)yl, a pyren-(1-, 2-, 4-)yl or a naphthacene-(1-, 2-, 5-)yl of a condensed tetracyclic aryl, and a perylene-(1-, 2-, 3-)yl or a pentacen-(1-, 2-, 5-, 6-)yl of a condensed pentacyclic aryl.

Preferably, "aryl having a carbon number of 6 to 30) is a phenyl, a naphthyl a phenanthryl, a chrysenyl or a triphenylenyl, more preferably a phenyl, a 1-naphthyl, a 2-naphthyl or a phenanthryl, even more preferably a phenyl, a 1-naphthyl or a 2-naphthyl.

$R^{11}$ and $R^{12}$ in the formula (ETM-2-) may bond to form a ring, and as a result, a cyclobutane, a cyclopentane, a cyclopentene, a cyclopentadiene, a cyclohexane, a fluorene or an indene may spiro-bond to the 5-membered ring of the fluorene skeleton.

Specific examples of the pyridine derivative of the type include the following compounds.

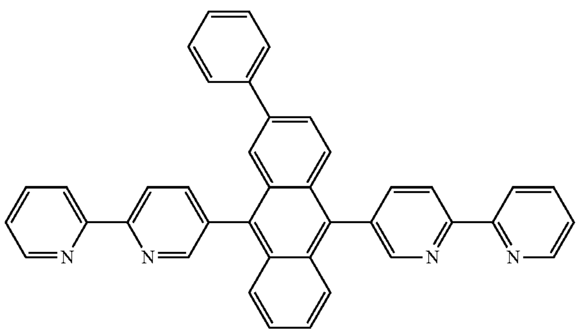

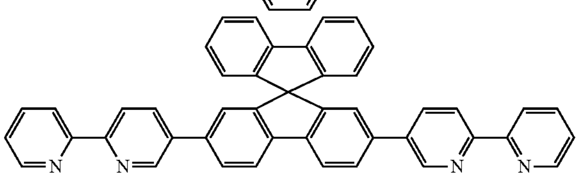

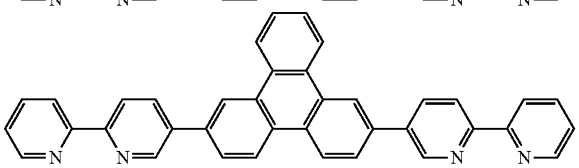

The pyridine derivative can be produced according to a known synthesis method using known raw materials.

2-2. Phosphine Oxide Derivative

The phosphine oxide derivative is, for example, a compound represented by the following formula (ETM-7-1). Details thereof are described in WO2013/079217.

(ETM-7-1)

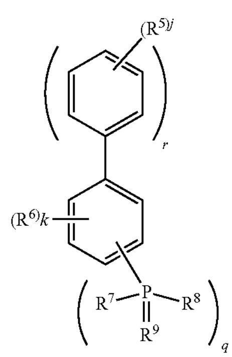

$R^5$ is a substituted or unsubstituted, alkyl having a carbon number of 1 to 20, aryl having a carbon number of 6 to 20 or heteroaryl having a carbon number of 5 to 20, $R^6$ is CN, or a substituted or unsubstituted, alkyl having a carbon number of 1 to 20, heteroalkyl having a carbon number of 1 to 20, aryl having a carbon number of 6 to 20, heteroaryl having a carbon number of 5 to 20, alkoxy having a carbon number of 1 to 20 or aryloxy having a carbon number of 6 to 20, $R^7$ and $R^8$ each are independently a substituted or unsubstituted, aryl having a carbon number of 6 to 20 or heteroaryl having a carbon number of 5 to 20, $R^9$ is an oxygen or a sulfur, j is 0 or 1, k is 0 or 1, r is an integer of 0 to 4, and q is an integer of 1 to 3.

The phosphine oxide derivative may also be a compound, for example, represented by the following formula (ETM-7-2).

(ETM-7-2)

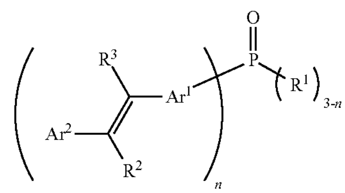

$R^1$ to $R^3$ may be the same or different, and each are selected from a hydrogen, an alkyl group, a cycloalkyl group, an aralkyl group, an alkenyl group, a cycloalkenyl group, an alkynyl group, an alkoxy group, an alkylthio group, an aryl ether group, an aryl thioether group, an aryl group, a heterocyclic group, a halogen, a cyano group, an aldehyde group, a carbonyl group, a carboxyl group, an amino group, a nitro group, a silyl group, and a condensed ring to be formed with a neighboring substituent.

$Ar^1$ may be the same or different and is an arylene group or a heteroarylene group, $Ar^2$ may be the same or different and is an aryl group or a heteroaryl group. However, at least one of $Ar^1$ and $Ar^2$ has a substituent, or forms a condensed ring with a neighboring substituent. n is an integer of 0 to 3, when n is 0, the unsaturated structure moiety is absent, and when n is 3, $R^1$ is absent.

Among these substituents, the alkyl group indicates, for example, a saturated aliphatic hydrocarbon group such as a methyl group, an ethyl group, a propyl group or a butyl group, and this may be unsubstituted or substituted. The substituent in the case where the group is substituted is not specifically limited, and examples thereof include an alkyl group, an aryl group and a heterocyclic group, and this shall apply to the following description. Though not specifically limited, the carbon number of the alkyl group is, from the viewpoint of availability and cost, generally within a range of 1 to 20.

The cycloalkyl group indicates, for example, a saturated alicyclic hydrocarbon group such as a cyclopropyl, a cyclohexyl, a norbornyl or an adamantyl, and this may be substituted or unsubstituted. Though not specifically limited, the carbon number of the alkyl group moiety is generally within a range of 3 to 20.

The aralkyl group indicates, for example, an aromatic hydrocarbon group bonding via an aliphatic hydrocarbon, such as a benzyl group or a phenylethyl group, and the aliphatic hydrocarbon and the aromatic hydrocarbon both may be unsubstituted or substituted. Not specifically limited, the carbon number of the aliphatic moiety is generally within a range of 1 to 20.

The alkenyl group indicates, for example, a double bond-containing unsaturated aliphatic hydrocarbon group such as a vinyl group, an allyl group or a butadienyl group, and this may be unsubstituted or substituted. Not specifically limited, the carbon number of the alkenyl group is generally within a range of 2 to 20.

The cycloalkenyl group indicates, for example, a double bond-containing unsaturated alicyclic hydrocarbon group such as a cyclopentenyl group, a cyclopentadienyl group or a cyclohexenyl group, and this may be unsubstituted or substituted.

The alkynyl group indicates, for example, a triple bond-containing unsaturated aliphatic hydrocarbon group such as an acetylenyl group, and this may be unsubstituted or substituted. Not specifically limited, the carbon number of the alkynyl group is generally within a range of 2 to 20.

The alkoxy group indicates, for example, an aliphatic hydrocarbon group bonding via an ether bond, such as a methoxy group, and the aliphatic hydrocarbon group may be unsubstituted or substituted. Not specifically limited, the carbon number of the alkoxy group is generally within a range of 1 to 20.

The alkylthio group is a group constructed by substituting the oxygen atom of the ether bond in the alkoxy group with a sulfur atom.

The arylether group indicates, for example, an aromatic hydrocarbon group bonding via an ether bond, such as a phenoxy group, and the aromatic hydrocarbon group may be unsubstituted or substituted. Not specifically limited, the carbon number of the arylether group is generally within a range of 6 to 40.

The arylthioether group is a group constructed by substituting the oxygen atom of the ether bond in the arylether group with a sulfur atom.

The aryl group indicates, for example, an aromatic hydrocarbon group such as a phenyl group, a naphthyl group, a biphenylyl group, a phenanthryl group, a terphenyl group or a pyrenyl group. The aryl group may be unsubstituted or substituted. Not specifically limited, the carbon number of the aryl group is generally within a range of 6 to 40.

The heterocyclic group indicates, for example, a cyclic structure group having any other atom than a carbon atom, such as a furanyl group, a thiophenyl group, an oxazolyl group, a pyridyl group, a quinolinyl group or a carbazolyl group, and this may be unsubstituted or substituted. Not specifically limited, the carbon number of the heterocyclic group is generally within a range of 2 to 30.

The halogen indicates a fluorine, a chlorine, a bromine or an iodine.

The aldehyde group, the carbonyl group and the amino group can include a group substituted with an aliphatic hydrocarbon, an alicyclic hydrocarbon, an aromatic hydrocarbon or a hetero ring.

The aliphatic hydrocarbon, the alicyclic hydrocarbon, the aromatic hydrocarbon and the hetero ring may be unsubstituted or substituted.

The silyl group indicates, for example, a silicon compound group such as a trimethylsilyl group, and this may be unsubstituted or substituted. Not specifically limited, the carbon number of the silyl group is generally within a range of 3 to 20. The number of silicon atoms in the group is generally 1 to 6.

The condensed ring to be formed between adjacent substituents is, for example, a conjugated or non-conjugated condensed ring to be formed between $Ar^1$ and $R^2$, $Ar^1$ and $R^3$, $Ar^2$ and $R^2$, $Ar^2$ and $R^3$, $R^2$ and $R^3$, $Ar^1$ and $Ar^2$. Here, when n is 1, two $R_1$'s may together form a conjugated or non-conjugated condensed ring. The condensed ring may contain a nitrogen, an oxygen or a sulfur inside the ring structure, or may be further condensed with any other ring.

Specific examples of the phosphine oxide derivative include the following compounds.

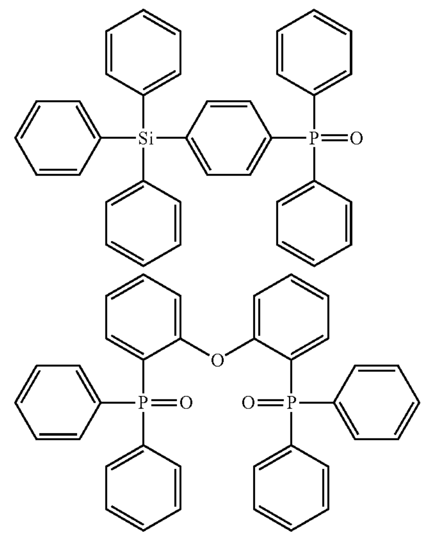

The phosphine oxide derivative can be produced according to a known synthesis method using known raw materials.

2-3. Pyrimidine Derivative

The pyrimidine derivative is, for example, a compound represented by the following formula (ETM-8), and is preferably a compound represented by the following formula (ETM-8-1). Details thereof are described in WO2011/021689.

(ETM-8)

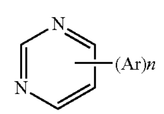

(ETM-8-1)

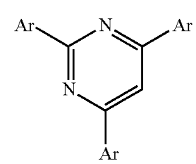

Ar is each independently an optionally-substituted aryl, or an optionally-substituted heteroaryl. n is an integer of 1 to 4, and is preferably an integer of 1 to 3, more preferably 2 or 3.

"Aryl" of "optionally-substituted aryl" is, for example, an aryl having a carbon number of 6 to 30, preferably an aryl having a carbon number of 6 to 24, more preferably an aryl having a carbon number of 6 to 20, even more preferably an aryl having a carbon number of 6 to 12.

Specific examples of "aryl" include a phenyl of a monocyclic aryl, a (2-, 3-, 4-)biphenylyl of a bicyclic aryl, a (2-, 3-, 4-)biphenyl of a bicyclic aryl, a (1-, 2-)naphthyl of a condensed bicyclic aryl, a terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) of a tricyclic aryl, an acenaphthylene-(1-, 3-, 4-, 5-)yl, a fluoren-(1-, 2-, 3-, 4-, 9-)yl, a phenalen-(1-, 2-)yl or a (1-, 2-, 3-, 4-, 9-)phenanthryl of a condensed tricyclic aryl, a quaterphenyl (5'-phenyl-m-terphenyl-2-yl, 5'-phenyl-m-terphenyl-3-yl, 5'-phenyl-m-terphenyl-4-yl, m-quaterphenyl) of a tetracyclic aryl, a triphenylene-(1-, 2-)yl, a pyren-(1-, 2-, 4-)yl or a naphthacene-(1-, 2-, 5-)yl of a condensed tetracyclic aryl, and a perylene-(1-, 2-, 3-)yl or a pentacen-(1-, 2-, 5-, 6-)yl of a condensed pentacyclic aryl.

"Heteroaryl" of "optionally-substituted heteroaryl" is, for example, a heteroaryl having a carbon number of 2 to 30, and is preferably a heteroaryl having a carbon number of 2 to 25, more preferably a heteroaryl having a carbon number of 2 to 20, even more preferably a heteroaryl having a carbon number of 2 to 15, and especially preferably a heteroaryl having a carbon number of 2 to 10. The heteroaryl includes, for example, a hetero ring having 1 to 5 hetero atoms selected from oxygen, sulfur and nitrogen in addition to carbon as the ring constituting atom.

Specific examples of the heteroaryl include a furyl, a thienyl, a pyrrolyl, an oxazolyl, an isoxazolyl, a thiazolyl, an isothiazolyl, an imidazolyl, a pyrazolyl, an oxadiazolyl, a furazanyl, a thiadiazolyl, a triazolyl, a tetrazolyl, a pyridyl, a pyrimidyl, a pyrazinyl, a pyrazinyl, a triazinyl, a benzofuranyl, an isobenzofuranyl, a benzo[b]thienyl, an indolyl, an isoindolyl, a 1H-indazolyl, a benzimidazolyl, a benzoxazolyl, a benzothiazolyl, a 1H-benzotriazolyl, a quinolyl, an isoquinolyl, a cinnolyl, a quinazolyl, a quinoxalinyl, a phthalazinyl, a naphthyridinyl, a purinyl, a pteridinyl, a carbazolyl, an acridinyl, a phenoxazinyl, a phenothiazinyl, a phenazinyl, a phenoxathiinyl, a thianthrenyl, and an indolidinyl.

The aryl and the heteroaryl may be substituted, and, for example, each may be substituted with the above-mentioned aryl or heteroaryl.

A specific example of the pyrimidine derivative is, for example, the following compound.

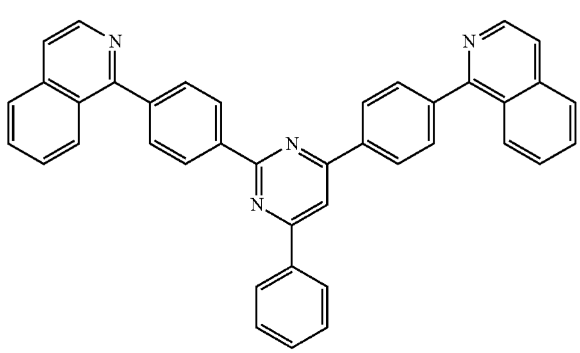 [SMILES: c1ccc(-c2cc(-c3ccc(-c4nccc5ccccc45)cc3)nc(-c3ccc(-c4nccc5ccccc45)cc3)n2)cc1]

The pyrimidine derivative can be produced according to a known synthesis using known raw materials.

2-4. Triazine Derivative

The triazine derivative is, for example, a compound represented by the following formula (ETM-10), and is preferably a compound represented by the following formula (ETM-10-1). Details thereof are described in US 2011/0156013 A.

(ETM-10)

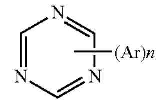

(ETM-10-1)

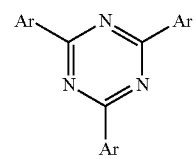

Ar is each independently an optionally-substituted aryl, or an optionally-substituted heteroaryl. n is an integer of 1 to 4, preferably an integer of 1 to 3, more preferably 2 or 3.

"Aryl" of "optionally-substituted aryl" is, for example, an aryl having a carbon number of 6 to 30, preferably an aryl having a carbon number of 6 to 24, more preferably an aryl having a carbon number of 6 to 20, even more preferably an aryl having a carbon number of 6 to 12.

Specific examples of "aryl" include a phenyl of a monocyclic aryl, a (2-, 3-, 4-)biphenylyl of a bicyclic aryl, a (2-, 3-, 4-)biphenyl of a bicyclic aryl, a (1-, 2-)naphthyl of a condensed bicyclic aryl, a terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) of a tricyclic aryl, an acenaphthylene-(1-, 3-, 4-, 5-)yl, a fluoren-(1-, 2-, 3-, 4-, 9-)yl, a phenalen-(1-, 2-)yl or a (1-, 2-, 3-, 4-, 9-)phenanthryl of a condensed tricyclic aryl, a quaterphenyl (5'-phenyl-m-terphenyl-2-yl, 5'-phenyl-m-terphenyl-3-yl, 5'-phenyl-m-terphenyl-4-yl, m-quaterphenyl) of a tetracyclic aryl, a triphenylene-(1-, 2-)yl, a pyren-(1-, 2-, 4-)yl or a naphthacene-(1-, 2-, 5-)yl of a condensed tetracyclic aryl, and a perylene-(1-, 2-, 3-)yl or a pentacen-(1-, 2-, 5-, 6-)yl of a condensed pentacyclic aryl.

"Heteroaryl" of "optionally-substituted heteroaryl" is, for example, a heteroaryl having a carbon number of 2 to 30, and is preferably a heteroaryl having a carbon number of 2 to 25, more preferably a heteroaryl having a carbon number of 2 to 20, even more preferably a heteroaryl having a carbon number of 2 to 15, and especially preferably a heteroaryl having a carbon number of 2 to 10. The heteroaryl includes, for example, a hetero ring having 1 to 5 hetero atoms selected from oxygen, sulfur and nitrogen in addition to carbon as the ring constituting atom.

Specific examples of the heteroaryl include a furyl, a thienyl, a pyrrolyl, an oxazolyl, an isoxazolyl, a thiazolyl, an isothiazolyl, an imidazolyl, a pyrazolyl, an oxadiazolyl, a furazanyl, a thiadiazolyl, a triazolyl, a tetrazolyl, a pyridyl, a pyrimidyl, a pyrazinyl, a pyrazinyl, a triazinyl, a benzofuranyl, an isobenzofuranyl, a benzo[b]thienyl, an indolyl, an isoindolyl, a 1H-indazolyl, a benzimidazolyl, a benzoxazolyl, a benzothiazolyl, a 1H-benzotriazolyl, a quinolyl, an isoquinolyl, a cinnolyl, a quinazolyl, a quinoxalinyl, a phthalazinyl, a naphthyridinyl, a purinyl, a pteridinyl, a carbazolyl, an acridinyl, a phenoxazinyl, a phenothiazinyl, a phenazinyl, a phenoxathiinyl, a thianthrenyl, and an indolidinyl.

The aryl and the heteroaryl may be substituted, and, for example, each may be substituted with the above-mentioned aryl or heteroaryl.

Specific examples of the triazine derivative include the following compounds.

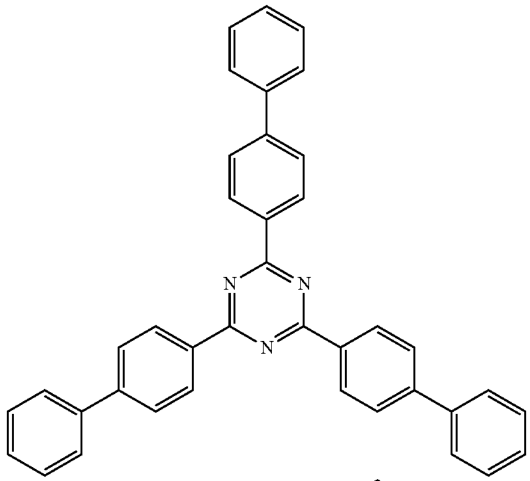

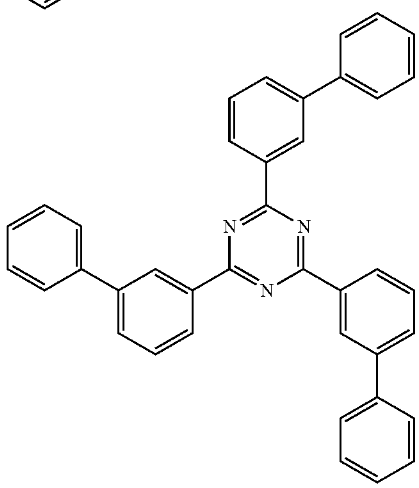

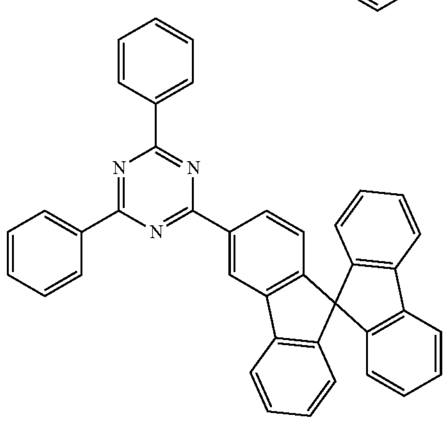

The triazine derivative can be produced according to a known synthesis using known raw materials.

2-5. Benzimidazole Derivative

The benzimidazole derivative is, for example, a compound represented by the following formula (ETM-11).

$$\phi\text{—(benzimidazole-type derivative)}_n \quad \text{(ETM-11)}$$

ϕ is an n-valent aryl ring (preferably an n-valent benzene ring, naphthalene ring, anthracene ring, fluorene ring, benzofluorene ring, phenalene ring, phenanthrene ring or triphenylene ring), n is an integer of 1 to 4, "benzimidazole-type derivative" is a substituent of the above-mentioned formula (ETM-2), formula (ETM-2-1) or formula (ETM-2-2) in which the pyridyl group in "pyridine-type substituent" is substituted with a benzimidazole group, and at least one hydrogen in the benzimidazole derivative may be substituted with a deuterium.

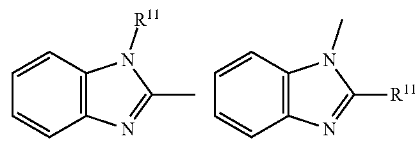

Benzimidazole Group $R^{11}$ in the benzimidazole group is a hydrogen, an alkyl having a carbon number of 1 to 24, a cycloalkyl having a carbon number of 3 to 12, or an aryl having a carbon number of 6 to 30, and for this, reference may be made to the description of $R^{11}$ in the above-mentioned formulae (ETM-2-1) and (ETM-2-2).

ϕ is preferably an anthracene ring or a fluorene ring, and regarding the structure in this case, reference may be made to the description in the formulae (ETM-2-1) and (ETM-2-2). For $R^{11}$ to $R^{18}$ in each formula, reference may be made to the description relating to the formulae (ETM-2-1) and (ETM-2-2). In the embodiments of the formula (ETM-2-1) and the formula (ETM-2-2) described above, the two pyridine-type substituents bond, and when these are replaced with benzimidazole-type substituents, both the two pyridine-type substituents may be substituted with benzimidazole-type substituents (that is, n=2), or any one pyridine-type substituent may be replaced with a benzimidazole-type substituent and the other pyridine-type substituent may be replaced with any of $R^{11}$ to $R^{18}$ (that is, n=1). Further, for example, at least one of $R^{11}$ to $R^{18}$ in the formula (ETM-2-1) may be replaced with a benzimidazole-type substituent and "pyridine-type substituent" therein may be replaced with any of $R^{11}$ to $R^{18}$.

Specific examples of the benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthalen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

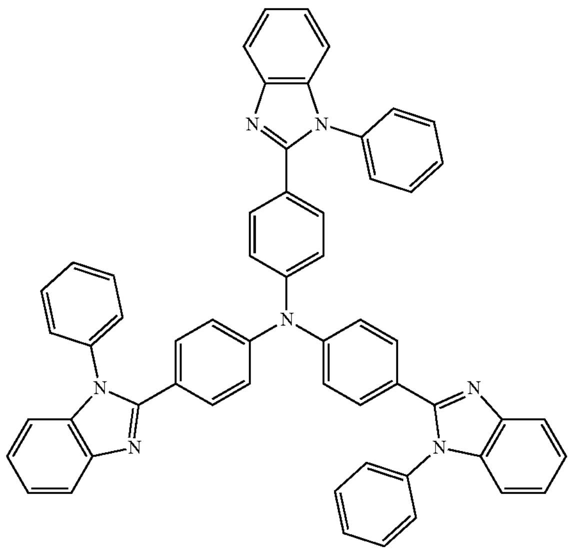 [SMILES: c1ccc(-n2c(-c3ccc(N(c4ccc(-c5nc6ccccc6n5-c5ccccc5)cc4)c4ccc(-c5nc6ccccc6n5-c5ccccc5)cc4)cc3)nc3ccccc32)cc1]

The benzimidazole derivative can be produced according to a known synthesis using known raw materials.

2-6. Phenanthroline Derivative

The phenanthroline derivative is, for example, a compound represented by the following formula (ETM-12) or formula (ETM-12-1). Details thereof are described in WO2006/021982.

(ETM-12)

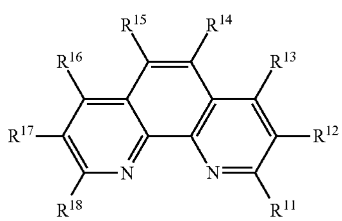

(ETM-12-1)

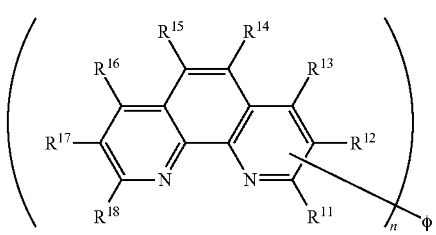

ϕ is an n-valent aryl ring (preferably an n-valent benzene ring, naphthalene ring, anthracene ring, fluorene ring, benzofluorene ring, phenalene ring, phenanthrene ring or triphenylene ring), and n is an integer of 1 to 4.

In each formula, $R^{11}$ to $R^{18}$ each are independently a hydrogen, an alkyl (preferably an alkyl having a carbon number of 1 to 24), a cycloalkyl (preferably a cycloalkyl having a carbon number of 3 to 12) or an aryl (preferably an aryl having a carbon number of 6 to 30). In the above formula (ETM-12-1), any of $R^{11}$ to $R^{18}$ bonds to the aryl ring of ϕ.

At least one hydrogen in each phenanthroline derivative may be substituted with a deuterium.

Regarding the alkyl, the cycloalkyl and the aryl in $R^{11}$ to $R^{18}$, reference may be made to the description of $R^{11}$ to $R^{18}$ in the formula (ETM-2). In addition to the above-mentioned examples, 4 further includes, for example, the following structural formulae. R in the following structural formulae is each independently a hydrogen, a methyl, an ethyl, an isopropyl, a cyclohexyl, a phenyl, a 1-naphthyl, a 2-naphthyl, a biphenyl or a terphenyl.

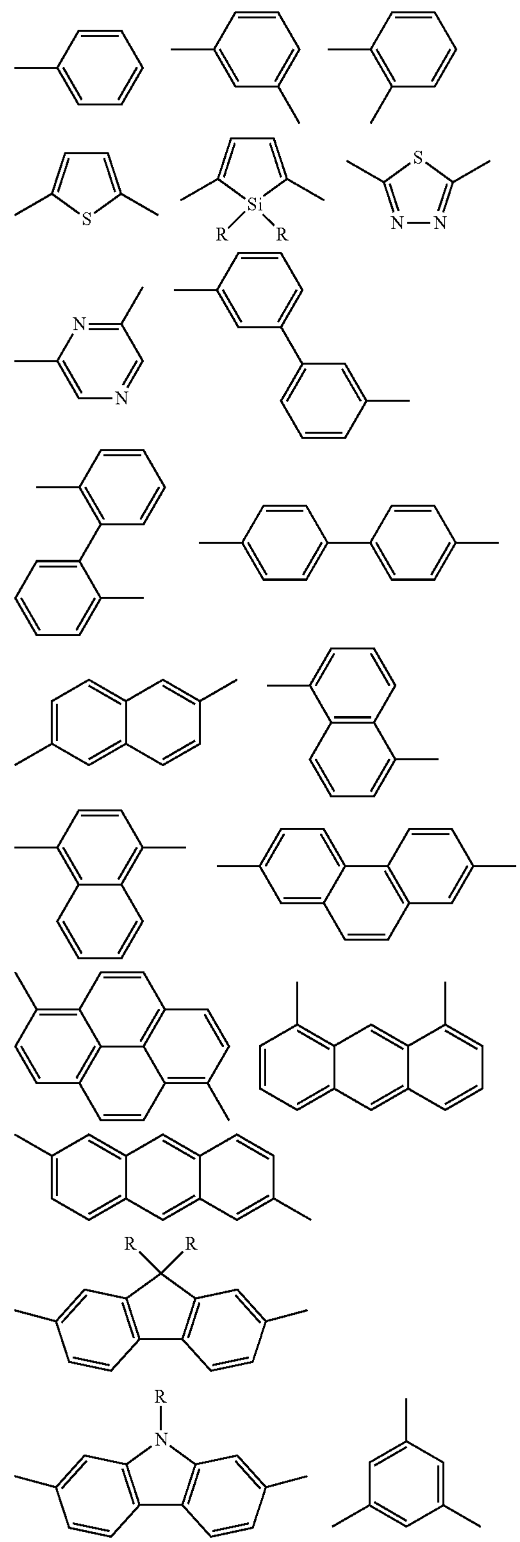

-continued

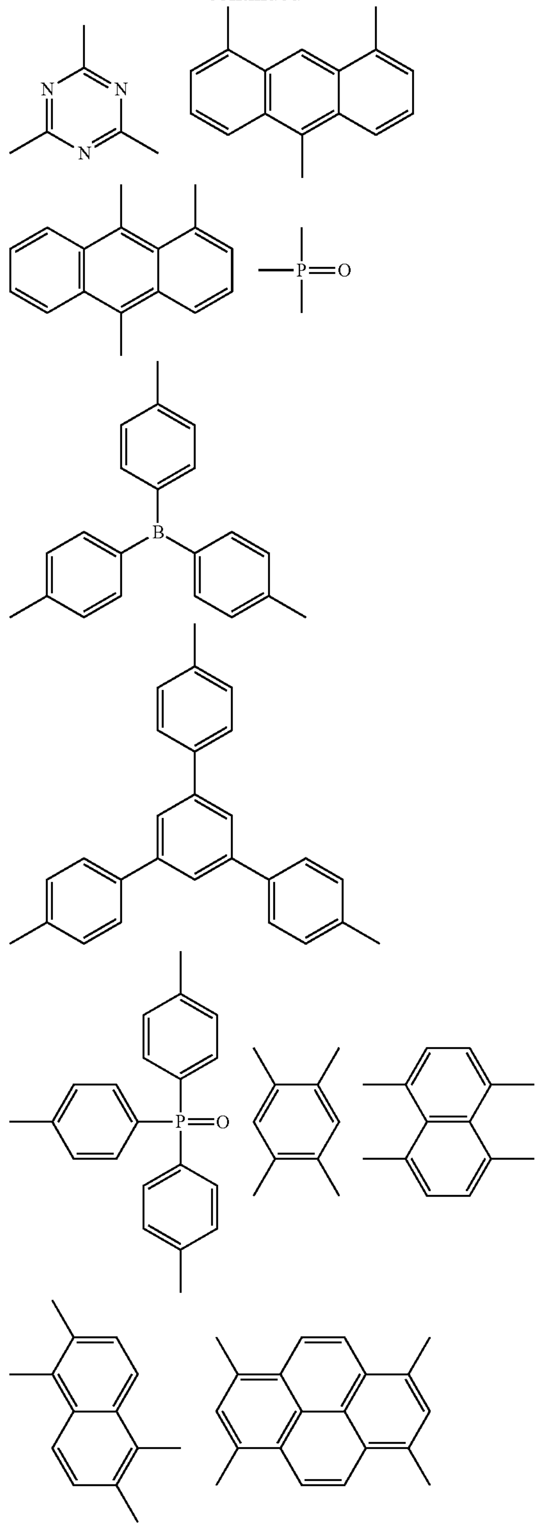

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bis(1,10-phenanthrolin-5-yl), bathocuproine, and 1,3-bis(2-phenyl-1,10-phenanthrolin-9-yl)benzene.

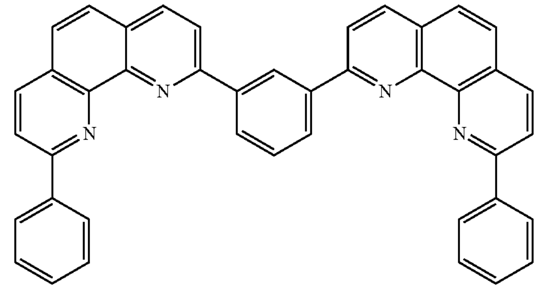 [SMILES: c1ccc(-c2ccc3ccc4ccc(-c5cccc(-c6ccc7ccc8ccc(-c9ccccc9)nc8c7n6)c5)nc4c3n2)cc1]

The phenanthroline derivative can be produced according to a known synthesis method using known raw materials.

2-7. Quinolinol-Type Metal Complex

The quinolinol-type metal complex is, for example, a compound represented by the following general formula (ETM-13).

(ETM-13)

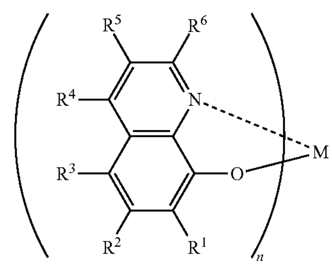

In the formula, $R^1$ to $R^6$ each are a hydrogen or a substituent, M is Li, Al, Ga, Be or Zn, n is an integer of 1 to 3.

Specific examples of the quinolinol-type metal complex include 8-quinolinol lithium, tris(8-quinolinolato) aluminum, tris(4-methyl-8-quinolinolato) aluminum, tris(5-methyl-8-quinolinolato) aluminum, tris(3,4-dimethyl-8-quinolinolato) aluminum, tris(4,5-dimethyl-8-quinolinolato) aluminum, tris(4,6-dimethyl-8-quinolinolato) aluminum, bis(2-methyl-8-quinolinolato)(phenolato) aluminum, bis(2-methyl-8-quinolinolato)(2-methylphenolato) aluminum, bis(2-methyl-8-quinolinolato)(3-methylphenolato) aluminum, bis(2-methyl-8-quinolinolato)(4-methylphenolato) aluminum, bis(2-methyl-8-quinolinolato)(2-phenylphenolato) aluminum, bis(2-methyl-8-quinolinolato)(3-phenylphenolato) aluminum, bis(2-methyl-8-quinolinolato)(4-phenylphenolato) aluminum, bis(2-methyl-8-quinolinolato)(2,3-dimethylphenolato) aluminum, bis(2-methyl-8-quinolinolato)(2,6-dimethylphenolato) aluminum, bis(2-methyl-8-quinolinolato)(3,4-dimethylphenolato) aluminum, bis(2-methyl-8-quinolinolato)(3,5-dimethylphenolato) aluminum, bis(2-methyl-8-quinolinolato)(3,5-di-t-butylphenolato) aluminum, bis(2-methyl-8-quinolinolato)(2,6-diphenylphenolato) aluminum, bis(2-methyl-8-quinolinolato)(2,4,6-triphenylphenolato) aluminum, bis(2-methyl-8-quinolinolato)(2,4,6-trimethylphenolato) aluminum, bis(2-methyl-8-quinolinolato)(2,4,5,6-tetramethylphenolato) aluminum, bis(2-methyl-8-quinolinolato)(1-naphtholato) aluminum, bis(2-methyl-8-quinolinolato)(2-naphtholato) aluminum, bis(2,4-dimethyl-8-quinolinolato)(2-phenylphenolato) aluminum, bis(2,4-dimethyl-8-quinolinolato)(3-phenylphenolato) aluminum, bis(2,4-dimethyl-8-quinolinolato)(4-phenylphenolato) aluminum, bis(2,4-dimethyl-8-quinolinolato)(3,5-dimethylphenolato) aluminum, bis(2,4- dimethyl-8-quinolinolato)(3,5-di-t-butylphenolato) aluminum, bis(2-methyl-8-quinolinolato) aluminum-p-oxo-bis(2-methyl-8-quinolinolato) aluminum, bis(2,4-dimethyl-8-quinolinolato) aluminum-p-oxo-bis(2,4-dimethyl-8-quinolinolato) aluminum, bis(2-methyl-4-ethyl-8-quinolinolato) aluminum-p-oxo-bis(2-methyl-4-ethyl-8-quinolinolato) aluminum, bis(2-methyl-4-methoxy-8-quinolinolato) aluminum-μ-oxo-bis(2-methyl-4-methoxy-8-quinolinolato) aluminum, bis(2-methyl-5-cyano-8-quinolinolato) aluminum-μ-oxo-bis(2-methyl-5-cyano-8-quinolinolato) aluminum, bis(2-methyl-5-trifluoromethyl-8-quinolinolato) aluminum-μ-oxo-bis(2-methyl-5-trifluoromethyl-8-quinolinolato) aluminum, bis(10-hydroxybenzo[h]quinoline) beryllium.

The quinolinol-type metal complex can be produced according to a known synthesis method using known raw materials.

3. Cathode in Organic Electroluminescent Device

The cathode 108 plays a role of injecting electrons into the light-emitting layer 1-5 via the electron injection layer 107 and the electron transport layer 106.

Not specifically limited, the material to form the cathode 108 may be any substance capable of efficiently injecting electrons into the organic layer, and may be the same substance as that of the material to form the anode 102. Above all, metals such as tin, indium, calcium, aluminum, silver, copper, nickel, chromium, gold, platinum, iron, zinc, lithium, sodium, potassium cesium and magnesium, and alloys thereof (e.g., magnesium-silver alloy, magnesium-indium alloy, and aluminum-lithium alloy such as lithium fluoride/aluminum) are preferred. For improving device properties by increasing electron injection efficiency, lithium, sodium, potassium, cesium, calcium, magnesium or alloys containing such metals having a low work function are effective. However, many such alloys having a low work function are generally unstable in air. For improving this point, for example, there is known a method of doping an organic layer with a minor amount of lithium, cesium or magnesium to provide a stable electrode usable for the purpose. As other dopants, inorganic salts such as lithium fluoride, cesium fluoride, lithium oxide and cesium oxide are also usable. However, the material is not limited to these.

Further, for electrode protection, a metal such as platinum, gold, silver, copper, iron, tin, aluminum and indium, or alloys using these metals, as well as inorganic substances such as silica, titania and silicon nitride, and also polyvinyl alcohol, vinyl chloride and a hydrocarbon-type polymer compound can be laminated as preferred examples. The method for producing these electrodes is not specifically limited, and any method capable of attaining electric conduction is employable, such as resistance heating, electron bean evaporation, sputtering, ion-plating and coating.

4. Hole Injection Layer, and Hole Transport Layer in Organic Electroluminescent Device The hole injection layer 103 plays a role of efficiently injecting the holes having transferred from the anode 102, into the light-emitting layer 105 or the hole transport layer 104. The hole transport layer 104 plays a role of efficiently transporting the holes injected from the anode 102 or the holes injected from the anode 102 via the hole injection layer 103, into the light-emitting layer 105. The hole injection layer 103 and the hole transport layer 104 each are formed by laminating or mixing one or more of hole injection/transport materials or are formed from a mixture of a hole injection/transport material and a polymer binder. An inorganic salt such as iron(III) chloride may be added to the hole injection/transport material to form a layer.

The hole injection/transport substance needs to efficiently inject and transport the holes from the positive electrode between electrodes given an electric field, and is one having a high hole injection efficiency and capable of efficiently transporting the injected holes. For that purpose, preferably, the substance has a small ionization potential and has a large hole mobility, and is excellent in stability and hardly generates impurities to be traps in production and during use.

The material to form the hole injection layer 103 and the hole transport layer 104 can be arbitrarily selected from compounds heretofore generally used as a charge transport material for holes in a photoconductive material, as well as p-type semiconductors and other known compounds that are used in a hole injection layer and a hole transport layer in an organic electroluminescent device. Specific examples thereof include a carbazole derivative (e.g., N-phenylcarbazole, polyvinylcarbazole), a biscarbazole derivative such as bis(N-arylcarbazole) or bis(N-alkylcarbazole), a triarylamine derivative (e.g., a polymer having an aromatic tertiary amino group in the main chain or the side chain, a triphenylamine derivative such as 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4,N^4$-diphenyl-$N^4,N^4$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, 4,4',4"-tris(3-methylphenyl(phenyl)amino)triphenylamine, a starburst amine derivative), a stilbene derivative, a phthalocyanine derivative (e.g., metal-free, or copper phthalocyanine), a pyrazoline derivative, a hydrazone compound, a benzofuran derivative, a thiophene derivative, an oxadiazole derivative, a quinoxaline derivative (e.g., 1,4,5,8,9,12-hexazatriphenylene-2,3,6,7,10,11-hexacarbonitrile), a heterocyclic compound such as a porphyrin derivative, and a polysilane. Regarding the polymer-type substances, a polycarbonate, a styrene derivative, a polyvinyl carbazole and a polysilane having the above-mentioned monomer in the side chain are preferred, but are not specifically limited so far as the compounds can form a thin film necessary for production of light-emitting devices and can inject holes from an anode and further can transport holes.

It is known that electric conductivity of organic semiconductors is strongly influenced by doping. Such organic semiconductor matrix substances are formed of compounds having good electron donating performance, or compounds having good electron acceptability. For doping with an electron-donating substance, an electron acceptor such as tetracyanoquinonedimethane (TCNQ) or 2,3,5,6-tetrafluorotetracyano-1,4-benzoquinonedimethane (F4TCNQ) is known (for example, see literature of M. Pfeiffer, A. Beyer, T. Fritz, K. Leo, Appl. Phys. Lett., 73(22), 3202-3204 (1998), and literature of J. Blochwitz, M. Pheiffer, T. Fritz, K. Leo, Appl. Phys. Lett., 73(6), 729-731 (1998)). These form so-called holes by an electron transfer process in an electron-donating base substance (hole transport substance). Depending on the number of holes and the mobility thereof, the conductivity of the base substance greatly varies. As the matrix substance having a hole transporting property, for example, there are known a benzidine compound (e.g., TPD), and a starburst amine derivative (e.g., TDATA), or a specific metal phthalocyanine (especially, zinc phthalocyanine ZnPc) (see JP 2005-167175 A).

5. Anode in Organic Electroluminescent Device

The anode 102 plays a role of injecting holes into the light-emitting layer 105. In the case where the hole injection layer 103 and/or the hole transport layer 104 are/is arranged between the anode 102 and the light-emitting layer 105, holes are injected into the light-emitting layer 105 via these.

The material to form the anode 102 includes an inorganic compound and an organic compound. Examples of the inorganic compound include metals (e.g., aluminum, gold, silver, nickel, palladium, chromium), metal oxides (e.g., indium oxide, tin oxide, indium-tin oxide (ITO), indium-zinc oxide (IZO)), metal halides (e.g., copper iodide), copper sulfide, carbon black, ITO glass and NESA glass. Examples of the organic compound include polythiophenes such as poly(3-methylthiophene, and conductive polymers such as polypyrrole and polyaniline. In addition, the material for use herein can be appropriately selected from substances that are used as an anode of an organic electroluminescent device.

The resistance of the transparent electrode is not limited so far as sufficient current for light emission from light-emitting devices can be supplied, but from the viewpoint of power consumption by light-emitting devices, the resistance is preferably low. For example, an ITO substrate with 300 Ω/square or less can function as a device electrode, but at present, a substrate with 10 Ω/square or so is available, and therefore, low-resistance substrates with, for example, 100 to 5 Ω/square, preferably 50 to 5 Ω/square are especially preferably used. The thickness of ITO can be arbitrarily selected in accordance with the resistance value thereof, and is generally within a range of 50 to 300 nm in many cases.

6. Substrate in Organic Electroluminescent Device

The substrate 101 is to be a support of the organic electroluminescent device, for which generally used are quartz, glass, metals plastics, etc. The substrate 101 is shaped in a tabular form, a filmy form or a sheet form depending on the intended use, and for example, glass plates, metal plates, metal foils, plastic films and plastic sheets are used. Above all, glass plates, and transparent synthetic resin plates of polyester, polymethacrylate, polycarbonate or polysulfone are preferred. For glass substrates, soda lime glass and alkali-free glass are usable, and the thickness may be one that is enough for securing mechanical strength, and is, for example, 0.2 mm or more. The upper limit of the thickness is, for example, 2 mm or less, preferably 1 mm or less. Regarding the glass material, alkali-free glass is preferred as releasing fewer ions. However, soda lime glass coated with a barrier coat of $SiO_2$ or the like is available on the market and can be used here. For increasing gas barrier performance, the substrate 101 may be provided with a gas barrier film of a dense silicon oxide film or the like on at least one surface thereof, and in particular, in the case where a synthetic resin plate, film or sheet having low gas barrier performance is used as the substrate 101, such a gas barrier film is preferably provided.

7. Production Method for Organic Electroluminescent Device

The layers constituting the organic electroluminescent device can be formed each as a thin film of a material to constitute each layer, according to a vapor deposition method, a low resistance vapor deposition method, an electron beam vapor deposition method, a sputtering method, a molecular lamination method, a printing method, a spin coating method, a casting method or a coating method. The thickness of each layer thus formed in the manner is not specifically limited, and can be appropriately set depending on the properties of the material. In general, the thickness falls within a range of 2 nm to 5000 nm. The film thickness can be measured generally according to a crystal oscillation-type thickness meter. In the case where a thin film is formed according to a vapor deposition method, the evaporation condition varies depending on the kind of the material, and the crystal structure and the association structure intended for the film. In general, the evaporation condition is preferably as follows. The heating temperature for the crucible for evaporation is +50 to +400° C., the vacuum degree is $10^{-6}$ to $10^{-3}$ Pa, the evaporation speed is 0.01 to 50 nm/sec, the substrate temperature is −150 to +300° C., and the film thickness is 2 nm to 5 μm.

Next, as one example of a method for producing an organic electroluminescent device, a production method for an organic electroluminescent device having a layer configuration of an anode/a hole injection layer/a hole transport layer/a light-emitting layer containing a host compound, a thermally assisting delayed fluorescent material and a boron atom-having compound/an electron transport layer/an electron injection layer/a cathode is described.

7-1. Evaporation Method

On an appropriate substrate, a thin film of an anode material is formed according to an evaporation method to be an anode, and on the anode, thin films of a hole injection layer and a hole transport layer are formed. On this, a host compound, a thermally assisting delayed fluorescent material and a boron atom-having compound are co-evaporated to form a thin film to be a light-emitting layer, then on the light-emitting layer, an electron transport layer and an electron injection layer are formed, and further a thin film of a cathode substance is formed according to an evaporation method to be a cathode, thereby providing an intended organic electroluminescent device. In production of the organic electroluminescent device, the process order may be reversed to form the layers in reverse order of a cathode, an electron injection layer, an electron transport layer, a light-emitting layer, a hole transport layer, a hole injection layer and an anode.

7-2. Wet Film Formation Method

In the case of a light-emitting layer forming composition, the layer is formed according to a wet film formation method.

In general, the wet film formation method is to form a coating film via a coating step of applying a light-emitting layer forming composition onto a support, and a drying step of removing the solvent from the applied light-emitting layer forming composition. Depending on the difference in the coating step, a method of using a spin coater is called a spin coating method, a method of using a slit coater is called a slit coating method, a method of using a printing plate is called a gravure coating method, an offset coating method, a reverse offset coating method or a flexographic printing method, a method of using an ink jet printer is called an ink jet method, and a method of spraying a composition is called a spraying method. The drying step includes a step of air drying, a step of heating, or a step drying under reduced pressure. The drying step may be carried out only once, or may be carried out more than once according to different methods under different conditions. For example, different methods may be combined, such as firing under reduced pressure.

The wet film formation method is a film formation method using a solution, and includes, for example, a certain type of a printing method (ink jet method), a spin coating method, a casting method, or a coating method. Different from a vacuum evaporation method, the wet film formation method need not to use an expensive vacuum evaporation apparatus, and can form a film in air. In addition, the wet film formation method enables continuous production of large area films, and therefore can reduce production cost.

On the other hand, as compared with a vacuum evaporation method, lamination is difficult in the wet film formation method. In the case where a laminate film is produced according to the wet film formation method, the under layer needs to be prevented from being dissolved by the composition of the upper layer, and therefore, in the case, a solubility-controlled composition, as well as underlayer crosslinking and orthogonal solvents (solvents not dissolving each other) are used appropriately. However, even though such techniques are used, the wet film formation method will be still difficult in formation of all films by coating in some cases.

Accordingly, in general, an organic EL device is produced according to a method of forming some layers in a wet film formation method, and forming the remaining layers in a vacuum evaporation method.

For example, a process of producing an organic EL device partly using a wet film formation method is described below.

(Step 1) Film formation for an anode by a vacuum evaporation method (Step 2) Film formation for a hole injection layer by a wet film formation method (Step 3) Film formation for a hole transport layer by a wet film formation method (Step 4) Film formation by a wet film formation method using a light-emitting layer forming composition containing a host compound, a thermally assisting delayed fluorescent material and a boron atom-having compound (Step 5) Film formation for an electron transport layer by a vacuum evaporation method (Step 6) Film formation for an electron injection layer by a vacuum evaporation method (Step 7) Film formation for a cathode by a vacuum evaporation method According to the process, an organic EL device composed of an anode/a hole injection layer/a hole transport layer/a light-emitting layer formed of a host material and a dopant material/an electron transport layer/an electron injection layer/cathode is produced.

8. Application for Organic Electroluminescent Device

The present invention is also applicable to a display device equipped with an organic electroluminescent device or a lighting device equipped with an organic electroluminescent device.

The display device and the lighting device equipped with an organic electroluminescent device can be produced by connecting the organic electroluminescent device of the present embodiment and a known driving device, according to a known method, and can be driven appropriately using a known driving method of direct current driving, pulse driving or alternate current driving.

Examples of the lighting device include panel displays such as color flat panel displays, and flexible displays such as flexible color organic electroluminescent (EL) displays (for example, see JP 10-335066 A, JP 2003-321546 A, JP 2004-281086 A). Examples of the display system include a matrix and/or segment system. A matrix display and a segment display may co-exist in the same panel.

In a matrix, pixels for display are two-dimensionally arranged such as in a lattice-like or mosaic-like form, and pixel aggregation displays a letter and an image. The shape and the size of pixels are determined depending on the intended use. For example, for image and letter display on personal computers, monitors and televisions, square pixels of 300 μm or less on each side are generally used, while in the case of a large-size display such as a display panel, pixels of mm order on each side are used. In the case of monochromatic display, pixels of the same color may be aligned, but in the case of color display, pixels of red, green and blue are aligned and displayed. In this case, typically, there is known a delta type and a stripe type. Regarding the driving method for the matrix, any of a line-sequential drive method or an active matrix method may be employed. A line-sequential drive method has an advantage that the structure is simple, but in consideration of operation characteristics, an active matrix may often be superior to it, as the case may be. Accordingly, the two need to be used individually depending on the intended use.

In a segment type, patterns are formed so as to display previously determined information, and a determined region is made to emit light. Examples thereof include time and temperature display in digital watches and thermometers, operating state display in audio instruments and induction cookers, and panel display in automobiles.

Examples of the lighting device include a lighting device for in-room lighting, and a backlight in liquid-crystal display devices (for example, see JP 2003-257621 A, JP 2003-277741 A, and JP 2004-119211 A). A backlight is used mainly for the purpose of improving the visibility in non-luminescent devices, and is used, for example, in liquid-crystal display devices, watches, audio instruments, automobile panels, display boards and sign boards. In particular, regarding a backlight for liquid-crystal displays, especially for personal computers whose issue is to be thinned, a conventional system uses a fluorescent lamp or a light guide plate and is therefore difficult to thin, and taking this into consideration, a backlight using the light-emitting device of the present embodiment is characterized in that it is thin and light.

EXAMPLES

Hereinunder the present invention is described specifically with reference to Examples, but the present invention is not whatsoever restricted by these Examples. Synthesis Examples for the compounds used in the following Examples are shown below.

<Evaluation Method for Fundamental Properties>

Preparation of Samples

Where absorption characteristics and light emission characteristics (fluorescence and phosphorescence) of target compounds are evaluated, a target compound for evaluation is dissolved in a solvent and evaluated in the resultant solution in one case, or a target compound is evaluated in the form of a thin film in another case. Further, in evaluation in the form of a thin film, two cases may be employed depending on the mode of using a target compound in an organic EL device, that is, a target compound alone is formed into a thin film in one case, or a target compound is dispersed in an appropriate matrix material to form a thin film in another case. Here, a thin film formed by vapor deposition of a target compound alone is referred to as "a neat film", and a thin film formed by preparing a coating liquid that contains a target compound and a matrix material followed by applying and drying the resultant coating liquid is referred to as a "coating film".

As a matrix material, commercially-available PMMA (polymethyl methacrylate) can be used. In the present Examples, PMMA and a target compound were dissolved in toluene, and then applied to a transparent supporting substrate of quartz (10 mm×10 mm) according to a spin coating method to prepare a sample.

In the case where the matrix material is a host compound, a thin film sample was prepared as follows.

A transparent supporting substrate of quartz (10 mm×10 mm×1.0 mm) was fixed on a substrate holder of a commercially-available vapor deposition device (by Choshu Industry Co., Ltd.), then a molybdenum-made evaporation boat containing a host compound put therein and a molybdenum-made evaporation boat containing a dopant material put therein were set in the device, and the vacuum chamber was depressurized down to $5\times10^{-4}$ Pa. Next, both the evaporation boat with a host compound therein and the evaporation boat with a dopant material therein were heated at the same time and co-evaporated to form a film having an appropriate thickness, thereby providing a mixed thin film (sample) of the host compound and the dopant material. Here, depending on the preset ratio by weight of the host compound to the dopant material, the evaporation speed was controlled.

Evaluation of Absorption Characteristics and Emission Characteristics

Using a UV-visible light-IR spectrophotometer (UV-2600, by Shimadzu Corporation), the absorption spectrum of the sample was measured. For measurement of the fluorescent spectrum or the phosphorescent spectrum of the sample, a fluorospectrophotometer (F-7000, by Hitachi High-Tech Corporation) was used.

In measurement of the fluorescent spectrum, the sample was excited at an appropriate excitation wavelength at room temperature to measure the photoluminescence thereof. In measurement of the phosphorescent spectrum, the sample was immersed in a liquid nitrogen (temperature 77 K) using the accompanying cooling unit. For observing the phosphorescent spectrum, the lag time from excitation light irradiation to measurement start was regulated using an optical chopper. The sample was excited at an appropriate excitation wavelength to measure the photoluminescence thereof.

Further, using an absolute PL quantum yield measuring device (C9920-02G, by Hamamatsu Photonics KK), the photoluminescence quantum yield (PLQY) was measured.

Evaluation of Fluorescence Lifetime (Delayed Fluorescence)

Using a fluorescence lifetime measuring device (C11367-01, by Hamamatsu Photonics KK), the fluorescence lifetime was measured at 300 K. Specifically, a light-emitting component having a fast fluorescence lifetime and a light-emitting component having a slow fluorescence lifetime were observed at a maximum light emission wavelength to be measured at a suitable excitation wavelength. In fluorescence lifetime measurement at room temperature for an ordinary organic EL material that emits fluorescence, a slow light emission component in which a phosphorescence-derived triplet component may participate owing to deactivation of the triplet component by heat is observed little. In the case where a slow light emission component is observed in a target compound, this indicates that the delayed fluorescence was observed by transfer of triplet energy having a long excitation lifetime to singlet energy by thermal activation.

Calculation of Energy Gap (Eg)

From the long wavelength end A (nm) of the absorption spectrum obtained according to the above-mentioned method, Eg=1240/A was calculated.

Measurement of Ionization Potential (Ip)

A transparent supporting substrate coated with ITO (indium tin oxide) by evaporation (28 mm×26 mm×0.7 mm) was fixed on a substrate holder of a commercially-available vapor deposition device (by Choshu Industry Co., Ltd.), then a molybdenum-made evaporation boat containing a target compound put therein was set in the device, and the vacuum chamber was depressurized down to $5\times10^{-4}$ Pa. Next, the evaporation boat was heated to evaporate the target compound, thereby forming a neat film of the target compound.

The resultant neat film was used as a sample, and the ionization potential of the target compound was measured with a photoelectronic spectrometer (PYS-201, by Sumitomo Heavy Industries, Ltd.).

Calculation of Electron Affinity (Ea)

From the difference between the ionization potential measured according to the above method and the energy gap calculated according to the above method, an electron affinity was estimated.

Measurement of Excited Singlet Energy Level E (S, Sh) and Excited Triplet Energy Level E (T, Sh)

A neat film of a target compound formed on a glass substrate was irradiated with excitation light at 77 K in such a manner that the fluorescence peak of the absorption spectrum could not overlap with the peak on the long wavelength side, and the fluorescence spectrum thereof was measured. From the shoulder of the peak on the short wavelength side of the fluorescence spectrum, the excited singlet energy level E (S, Sh) was derived.

Also, a neat film of a target compound formed on a glass substrate was irradiated with nm-excitation light at 77 K in such a manner that the fluorescence peak of the absorption spectrum could not overlap with the peak on the long wavelength side, and the phosphorescence spectrum thereof was measured. From the shoulder of the peak on the short wavelength side of the phosphorescence spectrum, the excited triplet energy level E (T, Sh) was derived.

[1] Evaluation of Fundamental Properties of Compound (Experimental Example 1) Evaluation of Fundamental Properties of Compound (BO2-0511S) as First Component (Host Compound)

The fundamental properties of a neat film of a compound (BO2-0511S) were evaluated. The ionization potential was 6.30 eV, the electron affinity was 3.26 eV and the energy gap was 3.04 eV In addition, the excited singlet energy level E (1, S, Sh) was 2.94 eV, and the excited triplet energy level E (1, T, Sh) was 2.74 eV.

(Comparative Experimental Example 1) Evaluation of Fundamental Properties of Comparative Compound (mCBP) as First Component (Host Compound)

The fundamental properties of a neat film of a comparative compound (mCBP) were evaluated. The ionization potential was 6.07 eV, the electron affinity was 2.55 eV and the energy gap was 3.52 eV. In addition, the excited singlet energy level E (1, S, Sh) was 4.19 eV, and the excited triplet energy level E (1, T, Sh) was 2.78 eV.

(Experimental Example 2) Evaluation of Fundamental Properties of Compound (Cz-TRZ3) as Second Component (Assisting Dopant)

The fundamental properties of a neat film of a compound (Cz-TRZ3) were evaluated. The ionization potential was 5.93 eV, the electron affinity was 2.99 eV and the energy gap was 2.94 eV In addition, the excited singlet energy level E (2, S, Sh) was 2.92 eV, and the excited triplet energy level E (2, T, Sh) was 2.69 eV Further, the excited singlet energy level at the peak top E (2, S, PT) was 2.76 eV, the excited triplet energy level at the peak top E (2, T, PT) was 2.58 eV, and ΔEST was 0.18 eV.

(Experimental Example 3) Evaluation of Fundamental Properties of Compound (ED1) as Third Component (Emitting Dopant)

A coating film containing a compound (ED1) and a matrix material of PMMA was analyzed to measure the fluorescence spectrum with 340 nm-excitation light at room temperature. Here, the concentration of the compound (ED1) in the coating film was 1% by weight. The maximum emission wavelength of the resultant fluorescence spectrum was 465 nm, and the full width at half maximum thereof was 19 nm.

[2] Production and Evaluation of Organic EL Device

In this Example, an organic EL device was produced according to the configuration described in Adv. Mater. 2016, 28, 2777-2781. The layer configuration of the produced organic EL device is shown in Table 1.

layer) having a thickness of 20 nm. Subsequently, LiF was vapor-deposited to have a thickness of 1 nm, and on this, aluminum was vapor-deposited to form a cathode having a thickness of 100 nm, thereby producing an organic EL device (device 1).

In emission at 1000 cd/m$^2$ of the formed device 1, the emission spectrum, the chromaticity and the external quantum yield were measured. As a result, in the emission spectrum, an emission peak having an emission maximum wavelength of 470 nm and a full width at half maximum of 18 nm was observed, and the device emitted deep blue light. The external quantum efficiency in emission at 1000 cd/m$^2$ of the device was 20.7%, which conformed that the device has a high quantum efficiency.

Comparative Example 1

Production and Evaluation of Comparative Device 1 using mCBP as host compound, compound (Cz-TRZ3) as assisting dopant, and compound (ED1) as emitting dopant

TABLE 1

(Configuration A of Organic EL Device)

| | Hole Injection Layer (40 nm) | Hole Transport Layer (15 nm) | Hole Blocking Layer (15 nm) | Light-Emitting Layer (20 nm) Host | Assisting Dopant | Emitting Dopant | Electron Transport Layer (10 nm) | Electron Transport Layer (20 nm) | Cathode (1 nm/ 100 nm) |
|---|---|---|---|---|---|---|---|---|---|
| Example 1 | NPD | TcTa | mCP | Compound (BO2-0511S) | Compound (Cz-TRZ3) | ED1 | 2CzBN | BPy-TP2 | LiF/Al |
| Comparative Example 1 | NPD | TcTa | mCP | mCBP | Compound (Cz-TRZ3) | ED1 | 2CzBN | BPy-TP2 | LiF/Al |

In Table 1, "NPD" is N,N'-diphenyl-N,N'-dinaphthyl-,4'-diaminobiphenyl, "TcTa" is 4,4',4"-tris(N-carbazolyl)triphenylamine, "mCP" is 1,3-bis(N-carbazolyl)benzene, "mCBP" is 3,3'-bis(N-carbazolyl)-1,1'-biphenyl, "BPy-TP2" is 2,7-di([2,2'-bipyridin]-5-yl)triphenylene, and "2CzBN" is 3,4-dicarbazolylbenzonitrile.

<Example 1> Production and Evaluation of Device 1 Using Compound (BO2-0511S) as Host Compound, Compound (Cz-TRZ3) as Assisting Dopant, and Compound (ED1) as Emitting Dopant On a glass substrate (26 mm×28 mm×0.7 mm) having, as formed thereon, an anode of ITO (indium tin oxide) having a thickness of 50 nm, thin films were laminated according to a vacuum evaporation method under a vacuum degree of 5×10-4 Pa.

First, on ITO, NPD was vapor-deposited to have a thickness of 40 nm, and on this, TcTa was vapor-deposited to have a thickness of 15 nm, thereby forming a two-layered hole injection/transport layer. Subsequently, mCP was vapor-deposited to have a thickness of 15 nm, thereby forming an electron blocking layer. Next, a compound (BO2-0511S) as a host, Cz-TRZ3 as an assisting dopant, and a compound (ED1) as an emitting dopant were co-evaporated from different evaporation sources to form a light-emitting layer having a thickness of 20 nm. At that time, the ratio by weight of the host, the assisting dopant and the emitting dopant was 90/9/1. Next, 2CzBN was vapor-deposited to form an electron transport layer having a thickness of 10 nm. Further on this, TSPO1 was vapor-deposited to form an electron transport layer (second electron transport An EL device (comparative device 1) was produced to have the same configuration according to the same process as in Example 1, except that a compound (mCBP) was used as a host in place of the compound (BO2-0511S).

In emission at 1000 cd/m$^2$ of the formed comparative device 1, the emission spectrum, the chromaticity and the external quantum yield were measured. As a result, in the emission spectrum, an emission peak having an emission maximum wavelength of 471 nm and a full width at half maximum of 18 nm was observed, and the device emitted deep blue light. However, the external quantum efficiency in emission at 1000 cd/m$^2$ of the device was 14.8%, which conformed that the quantum efficiency of the device was lower than that in Example 1.

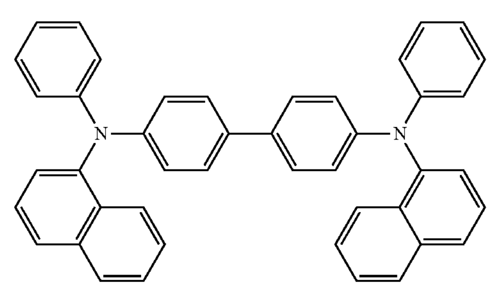

(NPD)

-continued
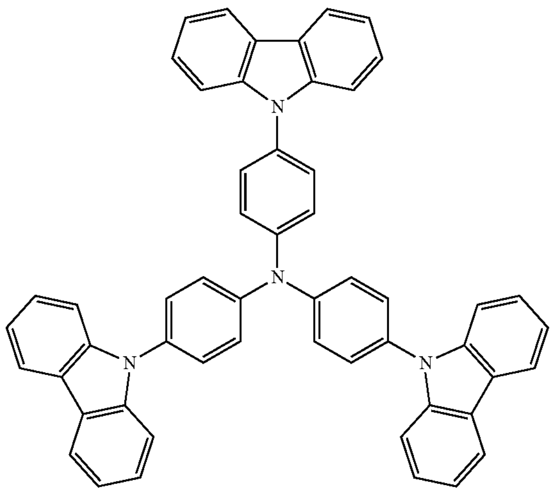
(TcTa)
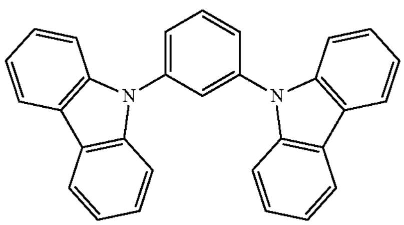
(mCP)
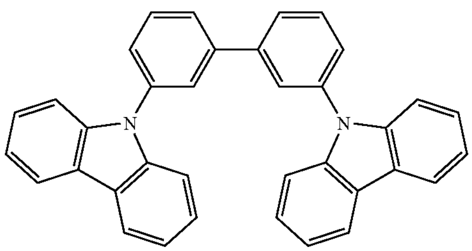
(mCBP)
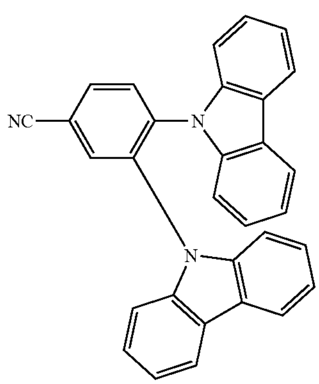
(2CzBN)
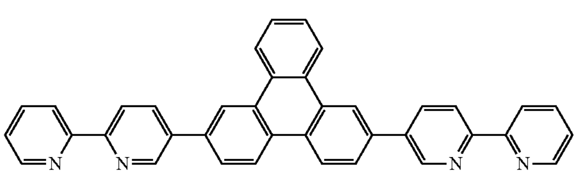
(BPy-TP2)
-continued
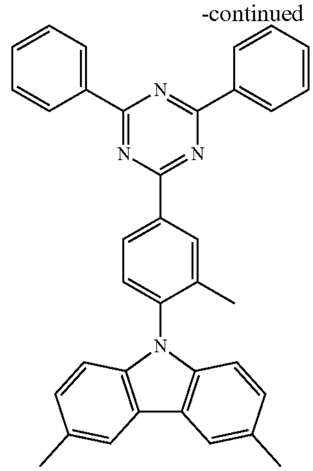
(Cz-TRZ3)
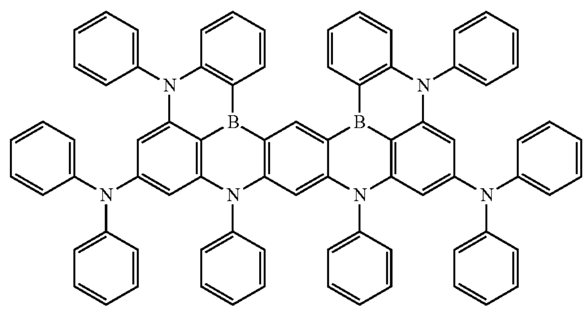
(ED1)
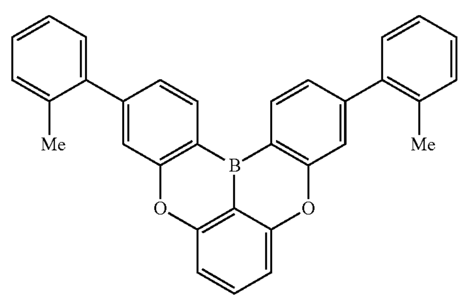
(BO2-0511S)
REFERENCE SIGNS LIST
100 Organic Electroluminescent Device
101 Substrate
102 Anode
103 Hole Injection Layer
104 Hole Transport Layer
105 Light-Emitting Layer
106 Electron Transport Layer
107 Electron Injection Layer
108 Cathode

The invention claimed is:

1. An organic electroluminescent device having a light-emitting layer, wherein the light-emitting layer contains:

a host compound having a boron atom and an oxygen atom in the molecule as a first component, a thermally assisting delayed fluorescent material such that the energy difference ΔEST between the excited singlet energy level and the excited triplet energy level is 0.20 eV or less as a second component, and a fluorescent material as a third component, wherein the full width at half maximum FWHM of the fluorescence peak of the third component is 35 nm or less.

2. The organic electroluminescent device according to claim 1, wherein the light-emitting layer contains, as the first component, at least one type of a compound represented by any of the following formulae (i), (ii) and (iii):

(i)

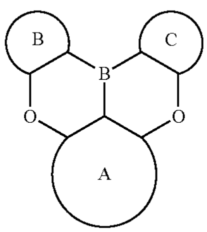

wherein:

the ring A, the ring B and the ring C each are independently an aryl ring or a heteroaryl ring, and at least one hydrogen in these rings may be substituted, and at least one hydrogen in the compound or the structure represented by the formula (i) may be substituted with a cyano, a halogen or a deuterium;

(ii)

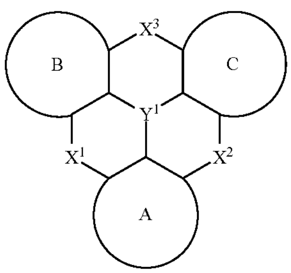

wherein:

the ring A, the ring B and the ring C each are independently an aryl ring or a heteroaryl ring, and at least one hydrogen in these rings may be substituted, $Y^1$ is B, $X^1$, $X^2$ and $X^3$ each are independently >O, >—R, >$CR_2$, or >S, at least two of $X^1$ to $X^3$ are >O, R in N—R and R in >$CR_2$ each are an optionally-substituted aryl, an optionally-substituted heteroaryl, or an alkyl, R in >N—R may bond to at least one of the ring A, the ring B and the ring C via a linking group or a single bond, and at least one hydrogen in the compound or the structure represented by the formula (ii) may be substituted with a cyano, a halogen or a deuterium;

(iii)

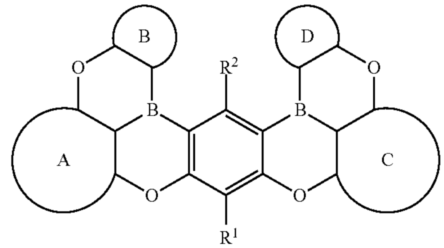

wherein:

the ring A, the ring B, the ring C and the ring D each are independently an aryl ring or a heteroaryl ring, and at least one hydrogen in these rings may be substituted, $R^1$ and $R^2$ each are independently a hydrogen, an alkyl having a carbon number of 1 to 6, an aryl having a carbon number of 6 to 12, a heteroaryl having a carbon number of 2 to 15, a diarylamino (where the aryl has a carbon number of 6 to 12), a diheteroarylamino (where the heteroaryl has a carbon number of 2 to 15), or an arylheteroarylamino (where the aryl has a carbon number of 6 to 12, and the heteroaryl has a carbon number of 2 to 15), and at least one hydrogen in the compound represented by the formula (iii) may be substituted with a cyano, a halogen or a deuterium.

3. The organic electroluminescent device according to claim 1, wherein the light-emitting layer contains, as the first component, at least one compound represented by any of the following formulae (1), (2) and (3):

(1)

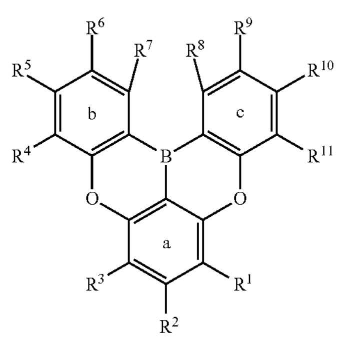

wherein:

$R^1$, $R^2$, $R^3$, $R^4$, $R^5$, $R^6$, $R^7$, $R^8$, $R^9$, $R^{10}$ and $R^{11}$ each are independently a hydrogen, an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl, and at least one hydrogen in the compound and the structure represented by the formula (1) may be substituted with a cyano, a halogen or a deuterium;

(2)

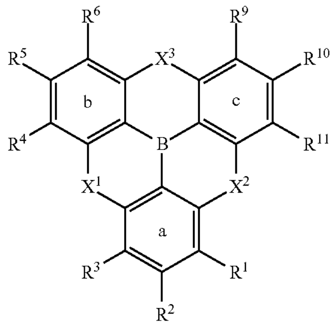

wherein:

$R^1$, $R^2$, $R^3$, $R^4$, $R^5$, $R^6$, $R^9$, $R^{10}$ and $R^{11}$ each are independently a hydrogen, an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl, $X^1$, $X^2$ and $X^3$ each are independently >O, >N—R, >S, or >$CR_2$, at least two of $X^1$, $X^2$ and $X^3$ are >O, R in N—R and R in >$CR_2$ each are an aryl, a heteroaryl, or an alkyl, and these may be further substituted with at least one selected from an aryl, a heteroaryl and an alkyl, and at least one hydrogen in the compound and the structure represented by the formula (2) may be substituted with a cyano, a halogen or a deuterium;

(3)

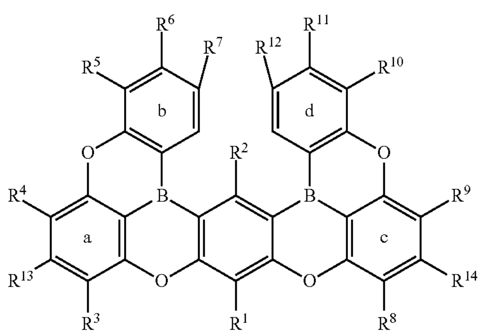

wherein:

$R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ each are independently a hydrogen, an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl, and at least one hydrogen in these may be substituted with an aryl, a heteroaryl or an alkyl, among $R^5$ to $R^7$ and $R^{10}$ to $R^{12}$, neighboring groups may bond to each other to form an aryl ring or a heteroaryl ring along with the ring b or the ring d, at least one hydrogen in the formed ring may be substituted with an aryl, a heteroaryl, a diarylamino, a diheteroarylamino, an arylheteroarylamino, an alkyl, a cycloalkyl, an alkoxy, an aryloxy, a heteroaryloxy, an arylthio, a heteroarylthio or an alkyl-substituted silyl, at least one hydrogen in these may be substituted with an aryl, a heteroaryl or an alkyl, and at least one hydrogen in the compound represented by the formula (3) may be substituted with a cyano, a halogen or a deuterium.

4. The organic electroluminescent device according to claim 1, wherein the host compound as the first component is a compound containing a structure represented by the following formula (1-1), (2-1), (2-2) or (3-1):

(1-1)

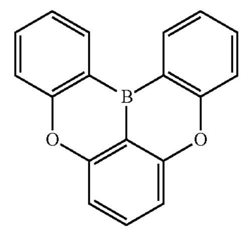

(2-1)

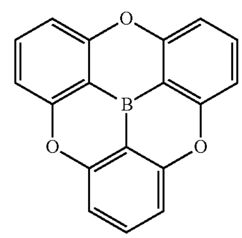

(2-2)

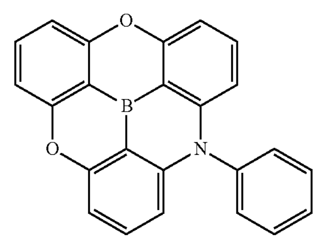

(3-1)

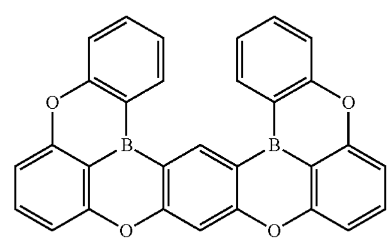

wherein:

the hydrogen each independently may be substituted with an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl.

5. The organic electroluminescent device according to claim 3, wherein the compound represented by any of the formulae (1) to (3) contains at least one structure selected from the following partial structure group A:

Partial structure group A:

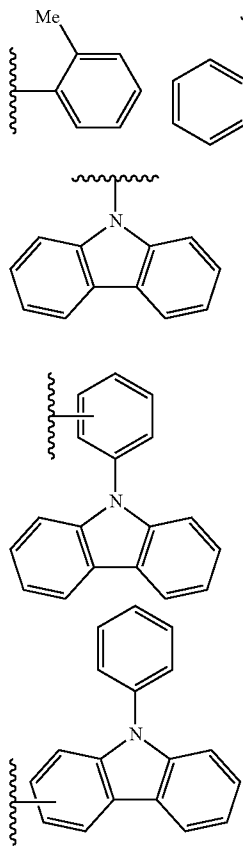

wherein:

Me represents a methyl, the wavy line represents a bonding position, provided that the hydrogen in the above partial structures each independently may be substituted with an aryl, a heteroaryl, a diarylamino, a diheteroarylamino, an arylheteroarylamino, an alkyl, an alkoxy or an aryloxy, the hydrogen in the aryl may be further substituted with an aryl, a heteroaryl or an alkyl, the hydrogen in the heteroaryl may be further substituted with an aryl, a heteroaryl or an alkyl, the hydrogen in the diarylamino, the diheteroarylamino and the arylheteroarylamino may be further substituted with an aryl, a heteroaryl or an alkyl.

6. An organic electroluminescent device having a light-emitting layer, wherein the light-emitting layer contains:

a host compound having a boron atom and an oxygen atom in the molecule as a first component, a thermally assisting delayed fluorescent material such that the energy difference ΔEST between the excited singlet energy level and the excited triplet energy level is 0.20 eV or less as a second component, and a fluorescent material as a third component, wherein the first component, the second component and the third component satisfy at least any of the following formulae (a) to (c):

$$|Ip(1)| \geq |Ip(2)| \quad \text{Formula (a)}$$

wherein Ip(1) represents an ionization potential of the first component, and Ip(2) represents an ionization potential of the second component;

$$|Eg(2)| \geq |Eg(3)| \quad \text{Formula (b)}$$

wherein Eg(2) represents an optical ban gap of the second component, and Eg(3) represents an optical band gap of the third component;

$$\Delta EST(1) \geq \Delta EST(2) \quad \text{Formula (c)}$$

wherein ΔEST(1) represents an energy difference between the excited singlet energy level and the excited triplet energy level of the first component, and ΔEST(2) represents an energy difference between the excited singlet energy level and the excited triplet energy level of the second component.

7. The organic electroluminescent device according to claim 1, wherein the third component is a compound containing a structure represented by the following formula (ED11), (ED12), (ED13), (ED14), (ED15), (ED16), (ED17), (ED18), (ED19), (ED21), (ED22), (ED23), (ED24), (ED25), (ED26), (ED27), (ED211), (ED212), (ED221), (ED222), (ED223), (ED231), (ED241), (ED242), (ED261) or (ED271):

(ED11)

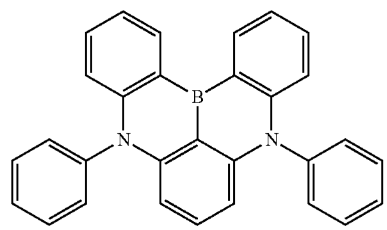

(ED12)

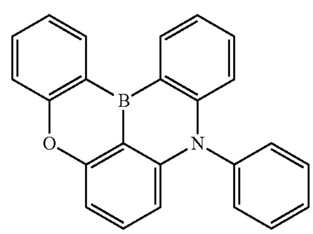

(ED13)

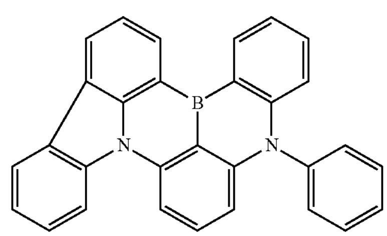

(ED14)

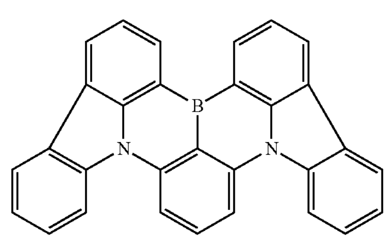

-continued
(ED15)
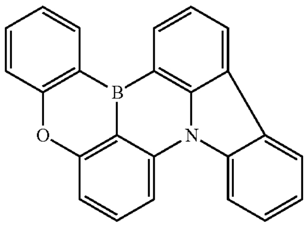
(ED16)
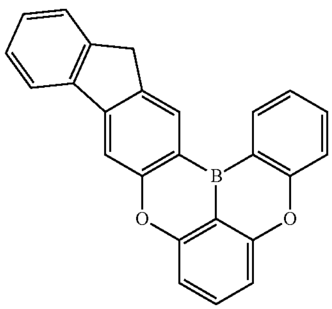
(ED17)
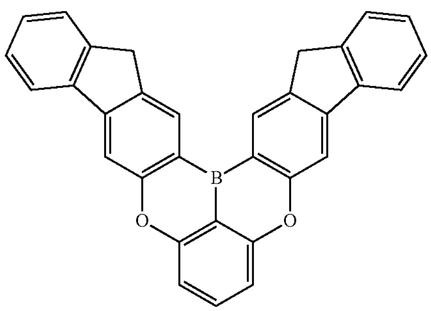
(ED18)
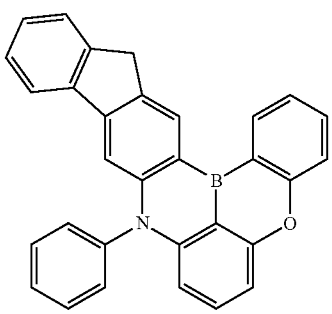
(ED19)
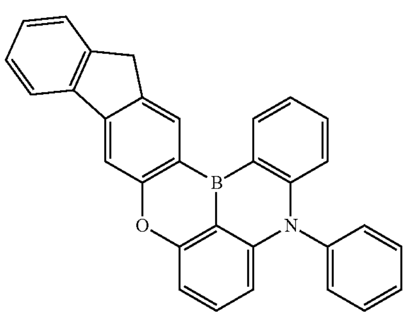
-continued
(ED21)
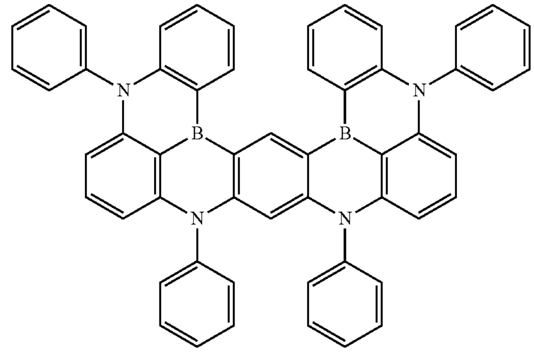
(ED22)
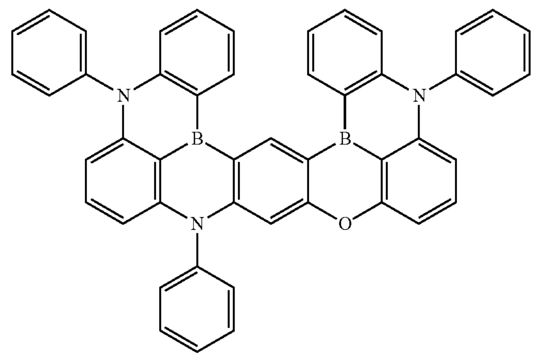
(ED23)
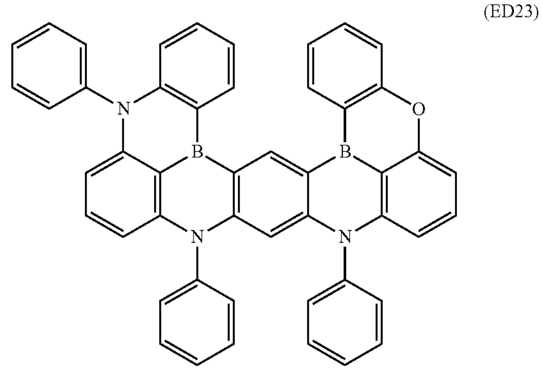
(ED24)
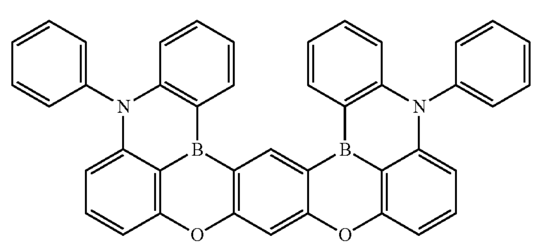

-continued
(ED25)
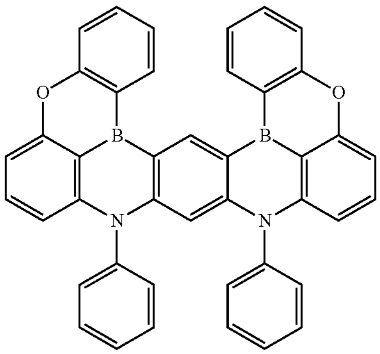
(ED26)
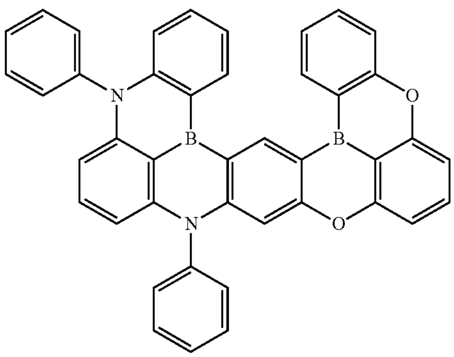
(ED27)
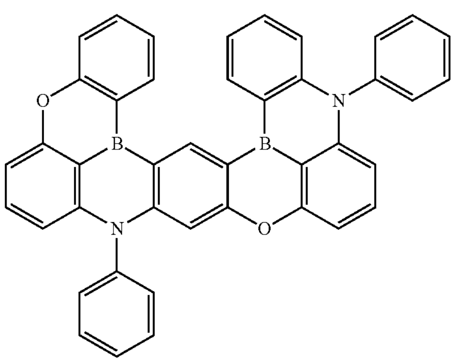
(ED211)
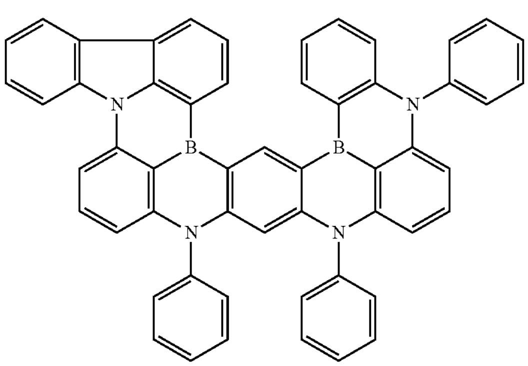
-continued
(ED212)
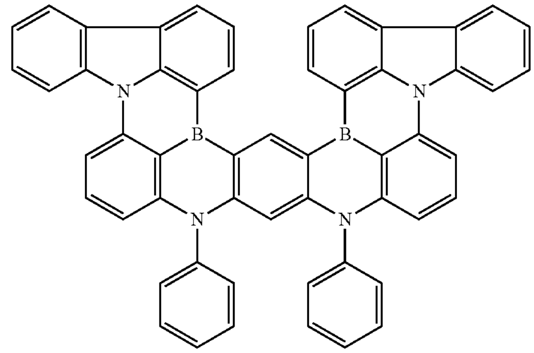
(ED221)
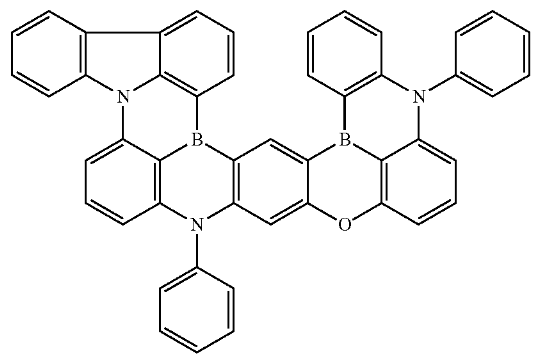
(ED222)
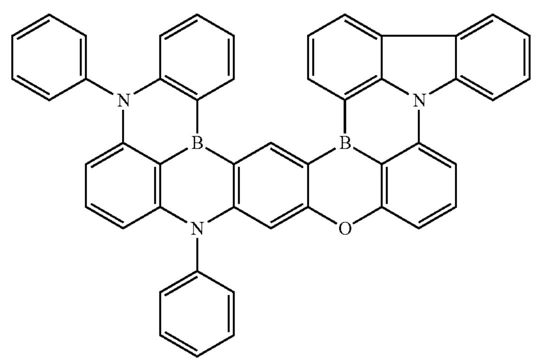
(ED223)
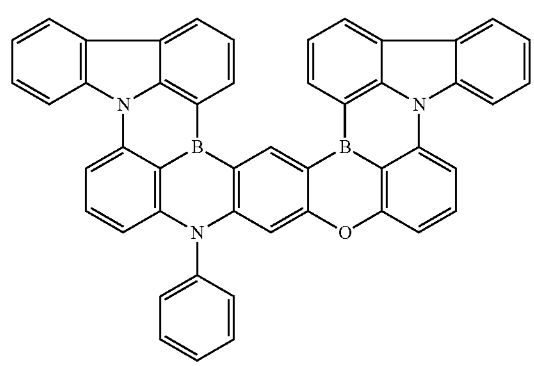

(ED231)

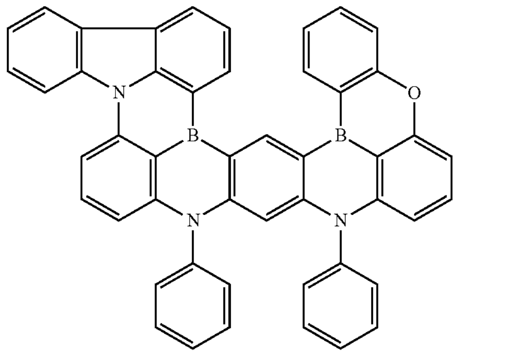

(ED241)

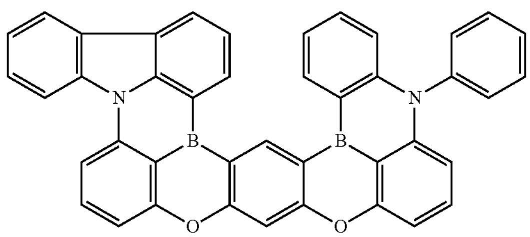

(RED242)

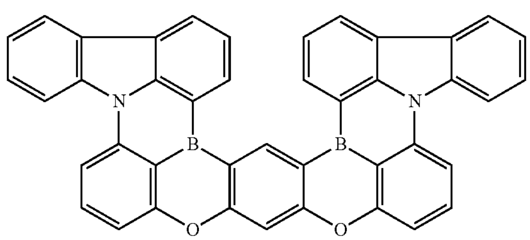

(ED261)

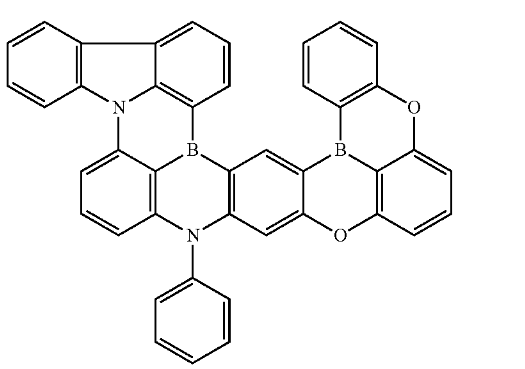

(ED271)

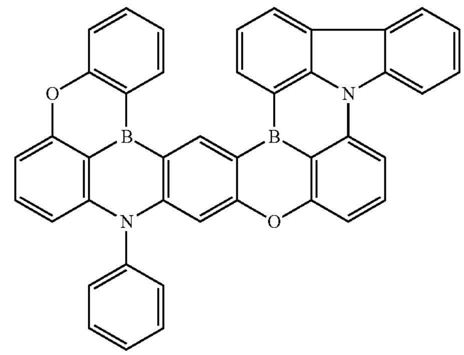

wherein:

the hydrogen each may be independently substituted with at least one selected from an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl.

8. The organic electroluminescent device according to claim 1, wherein the second component is a compound containing a structure represented by the following formula (AD11), (AD12), (AD13), (AD21) or (AD22):

(AD11)

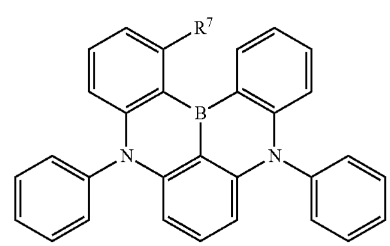

(AD12)

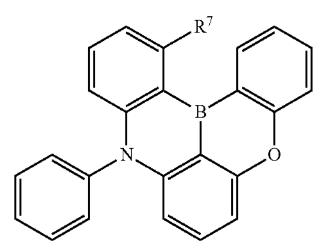

(AD13)

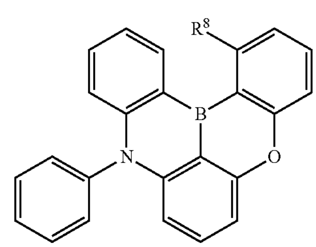

-continued (AD21)

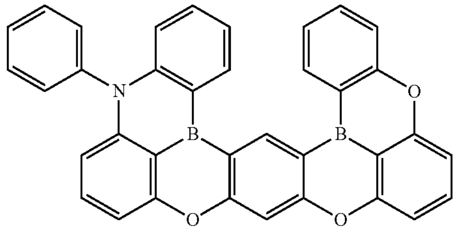

(AD22)

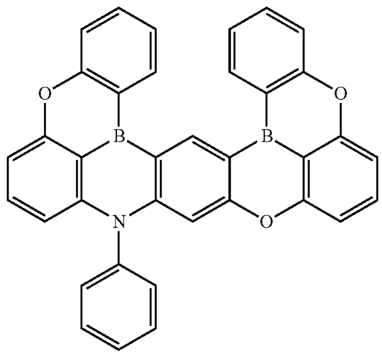

wherein:

$R^7$ or $R^8$ is an alkyl having a carbon number of 1 to 6, the hydrogen each may be independently substituted with an aryl, a heteroaryl, a diarylamino, a diheteroarylamino, an arylheteroarylamino, an alkyl, a cycloalkyl, an alkoxy or an aryloxy, and these may be further substituted with at least one selected from an aryl, a heteroaryl and an alkyl.

9. The organic electroluminescent device according to claim 1, wherein the second component contains, as the thermally assisting delayed fluorescent material, at least one compound represented by the following formula (AD31):

(AD31)

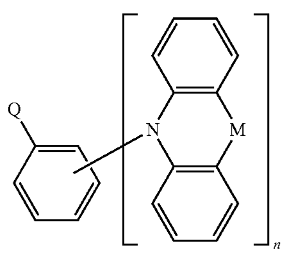

wherein:

M each is independently at least one of a single bond, —O—, >N—Ar and >$CAr_2$, Ar in >N—Ar and >$CAr_2$ is an aryl, Q is a group represented by any of the following partial structural formulae (Q1) to (Q26), n is an integer of 1 to 5, the hydrogen in the above formula each may be independently substituted with an aryl having a carbon number of 6 to 18, a heteroaryl having a carbon number of 6 to 18, an alkyl having a carbon number of 1 to 6 and a cycloalkyl having a carbon number of 3 to 12, and at least one hydrogen atom in the compound represented by the above formula may be substituted with a halogen or a deuterium:

(Q1)

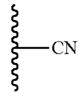

(Q2)

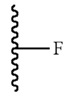

(Q3)

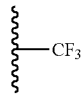

(Q4)

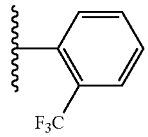

(Q5)

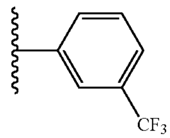

(Q6)

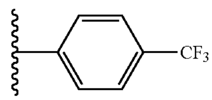

(Q7)

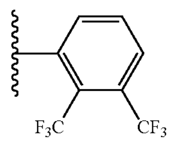

(Q8)

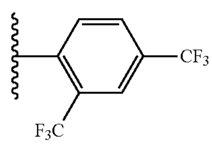

(Q9)

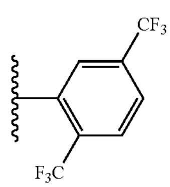

(Q10)

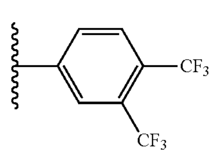

(Q11)

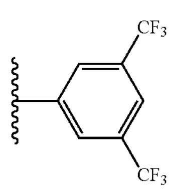

-continued
(Q12)
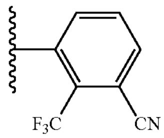
(Q13)
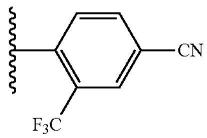
(Q14)
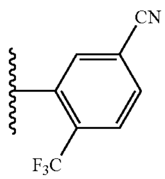
(Q15)
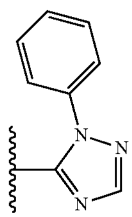
(Q16)
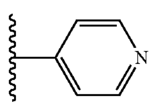
(Q17)
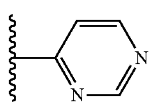
(Q18)
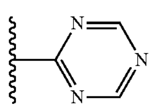
(Q19)
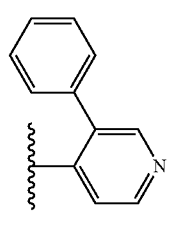
(Q20)
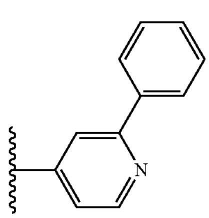
-continued
(Q21)
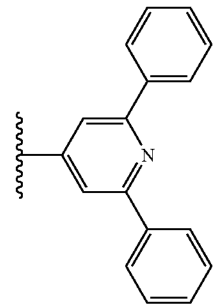
(Q22)
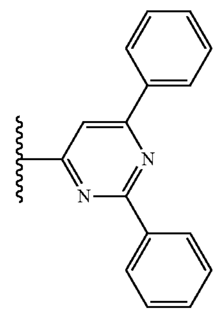
(Q23)
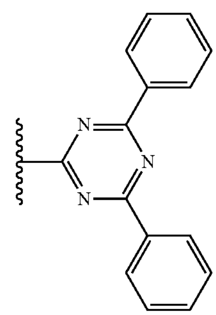
(Q24)
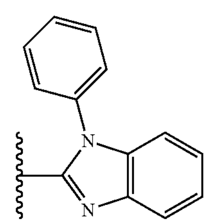
(Q25)
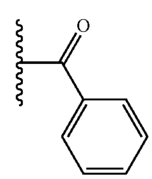
(Q26)
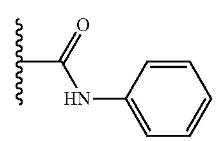
10. The organic electroluminescent device according to claim 1, wherein the second component contains, as the thermally assisting delayed fluorescent material, at least one compound having a structure represented by any of the following formulae (AD3101) to (AD3118):

-continued
(AD3101)
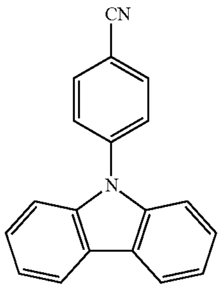
(AD3102)
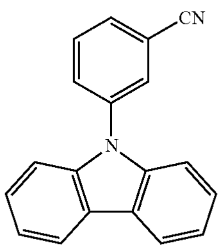
(AD3103)
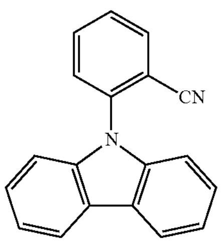
(AD3104)
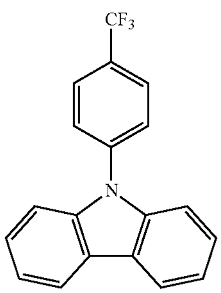
(AD3105)
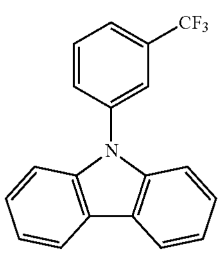
(AD3106)
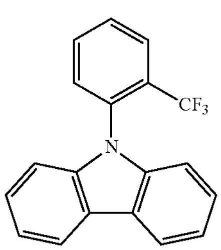
(AD3107)
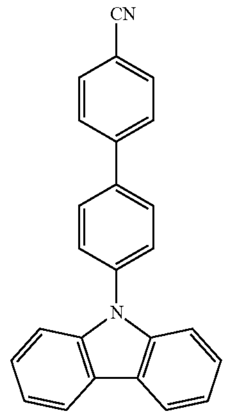
(AD3108)
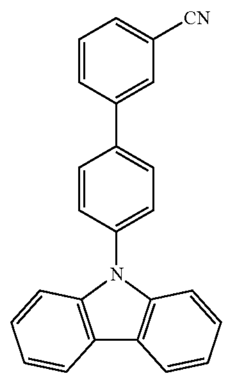
(AD3109)
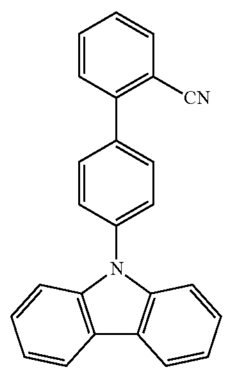
(AD3110)
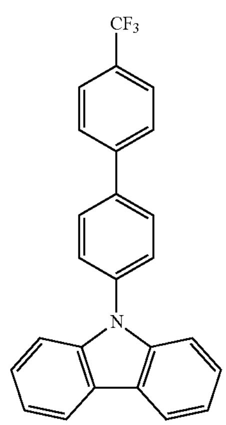

-continued
(AD3111)
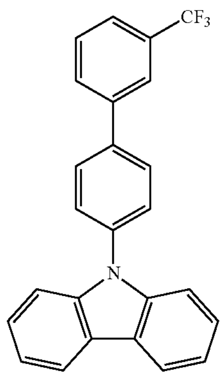
(AD3112)
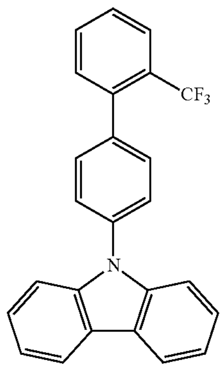
(AD3113)
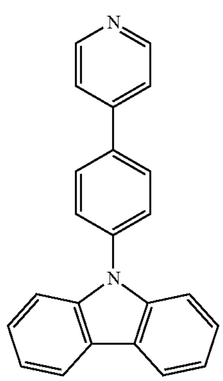
(AD3114)
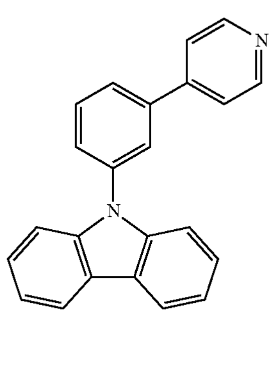
-continued
(AD3115)
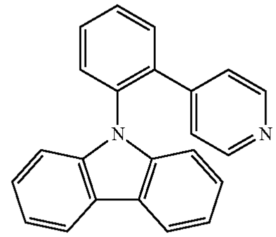
(AD3116)
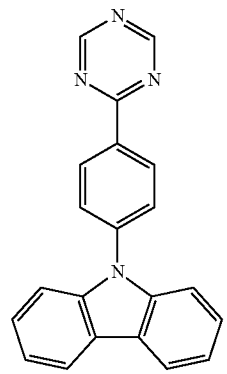
(AD3117)
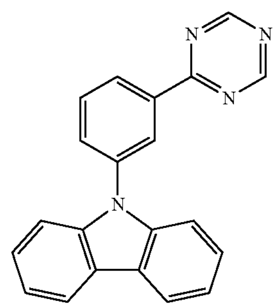
(AD3118)
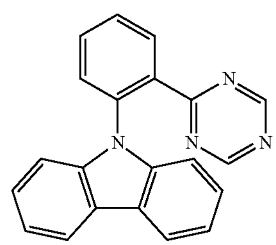
11. The organic electroluminescent device according to claim 1, wherein the third component contains, as the fluorescent material, a compound having at least one structure selected from the following partial structure group B:
Partial structure group B:
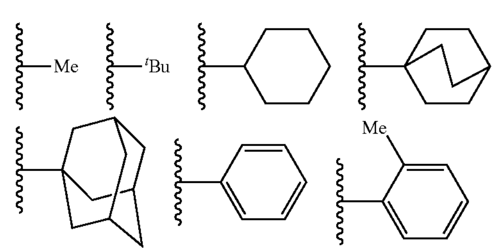

-continued

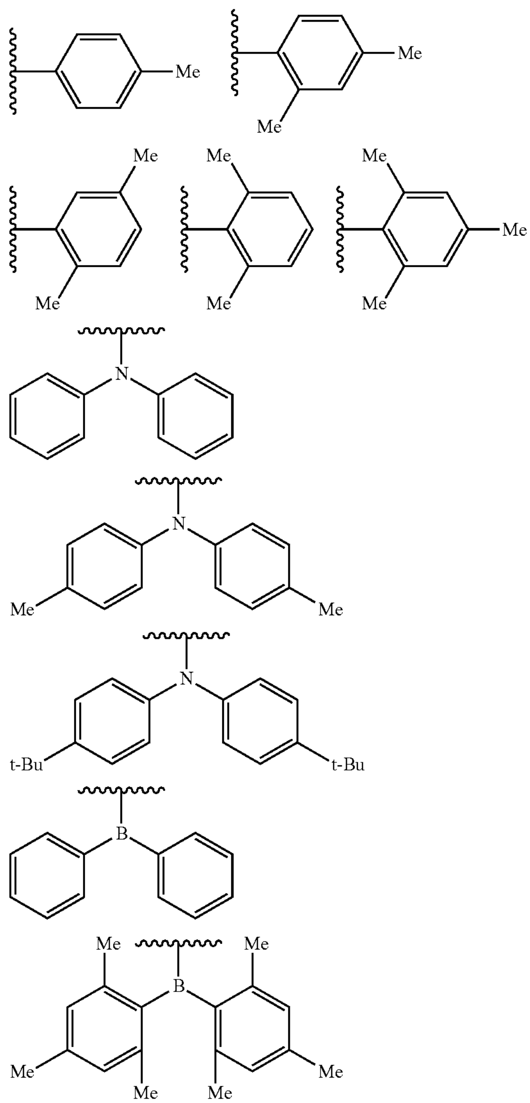

-continued

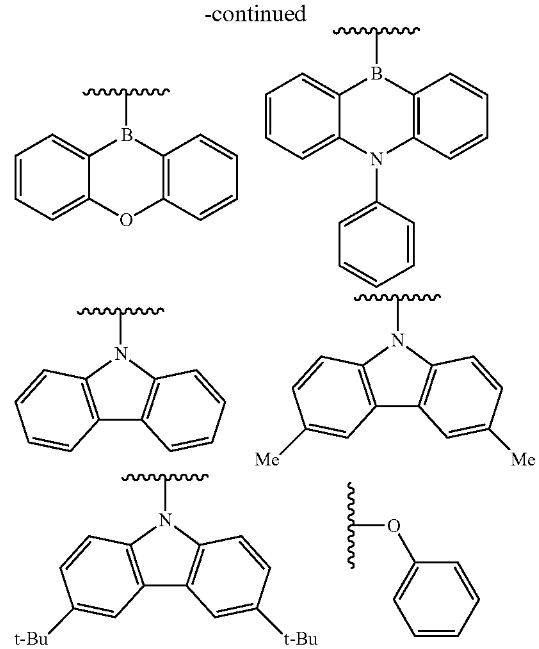

wherein:

Me represents a methyl, $^t$Bu and t-Bu each represent a t-butyl, and the wavy line represents a bonding position;

provided that the hydrogen in the above partial structures each may be independently substituted with an aryl, a heteroaryl, a diarylamino, a diheteroarylamino, an arylheteroarylamino, an alkyl, an alkoxy or an aryloxy, the hydrogen in the aryl may be further substituted with an aryl, a heteroaryl or an alkyl, the hydrogen in the heteroaryl may be further substituted with an aryl, a heteroaryl or an alkyl, and the hydrogen in the diarylamino, the diheteroarylamino and the arylheteroarylamino may be further substituted with an aryl, a heteroaryl or an alkyl.

12. A display device equipped with the organic electroluminescent device of claim 1.

13. A lighting device equipped with the organic electroluminescent device of claim 1.

* * * * *